US012082488B2

(12) United States Patent
Li et al.

(10) Patent No.: US 12,082,488 B2
(45) Date of Patent: Sep. 3, 2024

(54) METAL-ASSISTED DELAYED FLUORESCENT EMITTERS CONTAINING TRIDENTATE LIGANDS

(71) Applicant: ARIZONA BOARD OF REGENTS ON BEHALF OF ARIZONA STATE UNIVERSITY, Scottsdale, AZ (US)

(72) Inventors: Jian Li, Tempe, AZ (US); Guijie Li, Hangzhou (CN)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 146 days.

(21) Appl. No.: 17/466,353

(22) Filed: Sep. 3, 2021

(65) Prior Publication Data

US 2023/0015063 A1 Jan. 19, 2023

Related U.S. Application Data

(63) Continuation of application No. 16/993,924, filed on Aug. 14, 2020, now Pat. No. 11,145,830, which is a (Continued)

(51) Int. Cl.
*C07F 15/00* (2006.01)
*C07F 1/12* (2006.01)

(Continued)

(52) U.S. Cl.
CPC ............ *H10K 85/346* (2023.02); *C07F 1/12* (2013.01); *C07F 9/65683* (2013.01);

(Continued)

(58) Field of Classification Search
CPC . C07F 15/0033; C07F 15/0073; H01K 50/00; H01K 50/10; H10K 50/10

(Continued)

(56) References Cited

U.S. PATENT DOCUMENTS

| | | |
|---|---|---|
| 4,769,292 A | 9/1988 | Tang |
| 5,707,745 A | 1/1998 | Forrest |

(Continued)

FOREIGN PATENT DOCUMENTS

| | | |
|---|---|---|
| CN 1777663 | | 5/2006 |
| CN 1894269 | A | 1/2007 |

(Continued)

OTHER PUBLICATIONS

V. Thamilarasan et al., "Green-emitting phosphorescent iridium(III) complex: Structural, photophysical and electrochemical properties," Inorganica Chimica Acta, vol. 408, 2013, pp. 240-245.

Rui Zhu et al., "Color tuning based on a six-membered chelated iridium (III) complex with aza-aromatic ligand," Chemistry Letters, vol. 34, No. 12, 2005, pp. 1668-1669.

Wong. Challenges in organometallic research—Great opportunity for solar cells and OLEDs. Journal of Organometallic Chemistry 2009, vol. 694, pp. 2644-2647.

(Continued)

*Primary Examiner* — Charanjit Aulakh
(74) *Attorney, Agent, or Firm* — Riverside Law LLP

(57) ABSTRACT

Tridentate platinum, palladium, and gold complexes of Formulas A-I and A-II and tridentate iridium and rhodium compounds of Formulas B-I, B-II, and B-III suitable for delayed fluorescent and phosphorescent or phosphorescent emitters in display and lighting applications.

Formula A-I

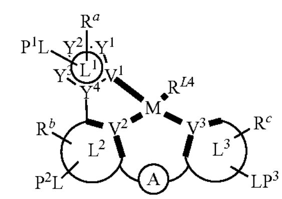

Formula A-II

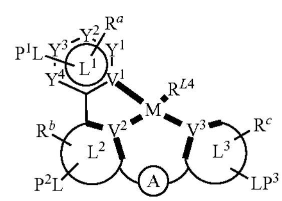

Formula B-I

Formula B-II (Continued)

-continued

Formula B-III

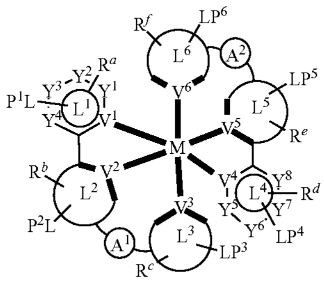

15 Claims, 3 Drawing Sheets

Related U.S. Application Data continuation of application No. 15/711,525, filed on Sep. 21, 2017, now Pat. No. 10,790,457, which is a continuation of application No. 14/809,981, filed on Jul. 27, 2015, now Pat. No. 9,818,959.

(60) Provisional application No. 62/030,235, filed on Jul. 29, 2014.

(51) Int. Cl.

| | |
|---|---|
| ***C07F 9/6568*** | (2006.01) |
| ***C09K 11/06*** | (2006.01) |
| ***H01L 51/50*** | (2006.01) |
| ***H05B 33/14*** | (2006.01) |
| ***H10K 85/30*** | (2023.01) |
| *H10K 50/11* | (2023.01) |
| *H10K 101/10* | (2023.01) |

(52) U.S. Cl.

CPC ...... *C07F 9/65685* (2013.01); *C07F 15/0033* (2013.01); *C07F 15/006* (2013.01); *C07F 15/0073* (2013.01); *C07F 15/0086* (2013.01); *C09K 11/06* (2013.01); *H05B 33/14* (2013.01); *C09K 2211/1007* (2013.01); *C09K 2211/1011* (2013.01); *C09K 2211/1014* (2013.01); *C09K 2211/1029* (2013.01); *C09K 2211/1033* (2013.01); *C09K 2211/1044* (2013.01); *C09K 2211/1048* (2013.01); *C09K 2211/1059* (2013.01); *C09K 2211/1088* (2013.01); *C09K 2211/1092* (2013.01); *C09K 2211/1096* (2013.01); *C09K 2211/185* (2013.01); *H10K 50/11* (2023.02); *H10K 2101/10* (2023.02)

(58) Field of Classification Search

USPC ..................................... 546/2; 313/498, 504

See application file for complete search history.

(56) References Cited

U.S. PATENT DOCUMENTS

| | | | |
|---|---|---|---|
| 5,844,363 | A | 12/1998 | Gu |
| 6,200,695 | B1 | 3/2001 | Arai |
| 6,303,238 | B1 | 10/2001 | Thompson |
| 6,780,528 | B2 | 8/2004 | Tsuboyama |
| 6,824,895 | B1 | 11/2004 | Sowinski |
| 7,002,013 | B1 | 2/2006 | Chi |
| 7,026,480 | B2 | 4/2006 | Che |
| 7,029,766 | B2 | 4/2006 | Huo |
| 7,037,599 | B2 | 5/2006 | Culligan |
| 7,064,228 | B1 | 6/2006 | Yu |
| 7,166,368 | B2 | 1/2007 | Lecloux |
| 7,276,617 | B2 | 10/2007 | Sotoyama |
| 7,279,704 | B2 | 10/2007 | Walters |
| 7,332,232 | B2 | 2/2008 | Ma |
| 7,442,797 | B2 | 10/2008 | Itoh |
| 7,501,190 | B2 | 3/2009 | Ise |
| 7,655,322 | B2 | 2/2010 | Forrest |
| 7,947,383 | B2 | 5/2011 | Ise |
| 8,106,199 | B2 | 1/2012 | Jabbour |
| 8,389,725 | B2 | 3/2013 | Li |
| 8,617,723 | B2 | 12/2013 | Stoessel |
| 8,669,364 | B2 | 3/2014 | Li |
| 8,816,080 | B2 | 8/2014 | Li |
| 8,846,940 | B2 | 9/2014 | Li |
| 8,871,361 | B2 | 10/2014 | Xia |
| 8,927,713 | B2 | 1/2015 | Li |
| 8,946,417 | B2 | 2/2015 | Jian |
| 9,059,412 | B2 | 6/2015 | Zeng |
| 9,076,974 | B2 | 7/2015 | Li |
| 9,082,989 | B2 | 7/2015 | Li |
| 9,203,039 | B2 | 12/2015 | Li |
| 9,221,857 | B2 | 12/2015 | Li |
| 9,224,963 | B2 | 12/2015 | Li |
| 9,238,668 | B2 | 1/2016 | Li |
| 9,312,502 | B2 | 4/2016 | Li |
| 9,312,505 | B2 | 4/2016 | Brooks |
| 9,318,725 | B2 | 4/2016 | Li |
| 9,324,957 | B2 | 4/2016 | Li |
| 9,382,273 | B2 | 7/2016 | Li |
| 9,385,329 | B2 | 7/2016 | Li |
| 9,425,415 | B2 | 8/2016 | Li |
| 9,461,254 | B2 | 10/2016 | Tsai |
| 9,502,671 | B2 | 11/2016 | Li |
| 9,550,801 | B2 | 1/2017 | Li |
| 9,598,449 | B2 | 3/2017 | Li |
| 9,617,291 | B2 | 4/2017 | Li |
| 9,673,409 | B2 | 6/2017 | Li |
| 9,698,359 | B2 | 7/2017 | Li |
| 9,711,739 | B2 | 7/2017 | Li |
| 9,711,741 | B2 | 7/2017 | Li |
| 9,711,742 | B2 | 7/2017 | Li |
| 9,755,163 | B2 | 9/2017 | Li |
| 9,818,959 | B2 | 11/2017 | Li |
| 9,865,825 | B2 | 1/2018 | Li |
| 9,879,039 | B2 | 1/2018 | Li |
| 9,882,150 | B2 | 1/2018 | Li |
| 9,899,614 | B2 | 2/2018 | Li |
| 9,920,242 | B2 | 3/2018 | Li |
| 9,923,155 | B2 | 3/2018 | Li |
| 9,941,479 | B2 | 4/2018 | Li |
| 9,947,881 | B2 | 4/2018 | Li |
| 9,985,224 | B2 | 5/2018 | Li |
| 10,020,455 | B2 | 7/2018 | Li |
| 10,033,003 | B2 | 7/2018 | Li |
| 10,056,564 | B2 | 8/2018 | Li |
| 10,056,567 | B2 | 8/2018 | Li |
| 10,158,091 | B2 | 12/2018 | Li |
| 10,177,323 | B2 | 1/2019 | Li |
| 10,211,411 | B2 | 2/2019 | Li |
| 10,211,414 | B2 | 2/2019 | Li |
| 10,263,197 | B2 | 4/2019 | Li |
| 10,294,417 | B2 | 5/2019 | Li |
| 10,392,387 | B2 | 8/2019 | Li |
| 10,411,202 | B2 | 9/2019 | Li |
| 10,414,785 | B2 | 9/2019 | Li |
| 10,516,117 | B2 | 12/2019 | Li |
| 10,566,553 | B2 | 2/2020 | Li |
| 10,566,554 | B2 | 2/2020 | Li |
| 2001/0019782 | A1 | 9/2001 | Igarashi |
| 2002/0068190 | A1 | 6/2002 | Tsuboyama |
| 2002/0189666 | A1 | 12/2002 | Forrest |
| 2003/0062519 | A1 | 4/2003 | Yamazaki |
| 2003/0186077 | A1 | 10/2003 | Chen |
| 2004/0230061 | A1 | 11/2004 | Seo |
| 2005/0170207 | A1 | 8/2005 | Ma |
| 2005/0260446 | A1 | 11/2005 | MacKenzie |
| 2006/0024522 | A1 | 2/2006 | Thompson |
| 2006/0073359 | A1 | 4/2006 | Ise |
| 2006/0093854 | A1 | 5/2006 | Sotoyama |

(56) References Cited

U.S. PATENT DOCUMENTS

| | | | |
|---|---|---|---|
| 2006/0094875 | A1 | 5/2006 | Itoh |
| 2006/0127696 | A1 | 6/2006 | Stossel |
| 2006/0182992 | A1 | 8/2006 | Nii |
| 2006/0202197 | A1 | 9/2006 | Nakayama |
| 2006/0210831 | A1 | 9/2006 | Sano |
| 2006/0255721 | A1 | 11/2006 | Igarashi |
| 2006/0263635 | A1 | 11/2006 | Ise |
| 2006/0286406 | A1 | 12/2006 | Igarashi |
| 2007/0057630 | A1 | 3/2007 | Nishita |
| 2007/0059551 | A1 | 3/2007 | Yamazaki |
| 2007/0082284 | A1 | 4/2007 | Stoessel |
| 2007/0103060 | A1 | 5/2007 | Itoh |
| 2007/0111025 | A1 | 5/2007 | Lennartz |
| 2007/0224447 | A1 | 9/2007 | Sotoyama |
| 2008/0001530 | A1 | 1/2008 | Ise |
| 2008/0036373 | A1 | 2/2008 | Itoh |
| 2008/0054799 | A1 | 3/2008 | Satou |
| 2008/0067925 | A1 | 3/2008 | Oshiyama |
| 2008/0079358 | A1 | 4/2008 | Satou |
| 2008/0241518 | A1 | 10/2008 | Satou |
| 2008/0241589 | A1 | 10/2008 | Fukunaga |
| 2008/0269491 | A1 | 10/2008 | Jabbour |
| 2009/0026936 | A1 | 1/2009 | Satou |
| 2009/0026939 | A1 | 1/2009 | Kinoshita |
| 2009/0032989 | A1 | 2/2009 | Karim |
| 2009/0039768 | A1 | 2/2009 | Igarashi |
| 2009/0079340 | A1 | 3/2009 | Kinoshita |
| 2009/0128008 | A1 | 5/2009 | Ise |
| 2009/0218561 | A1 | 9/2009 | Kitamura |
| 2009/0261721 | A1 | 10/2009 | Murakami |
| 2009/0267500 | A1 | 10/2009 | Kinoshita |
| 2009/0278453 | A1 | 11/2009 | Yam |
| 2010/0000606 | A1 | 1/2010 | Thompson |
| 2010/0013386 | A1 | 1/2010 | Thompson |
| 2010/0141127 | A1 | 6/2010 | Xia |
| 2010/0171111 | A1 | 7/2010 | Takada |
| 2011/0028723 | A1 | 2/2011 | Li |
| 2011/0062429 | A1 | 3/2011 | Kai |
| 2011/0062858 | A1 | 3/2011 | Yersin |
| 2011/0301351 | A1 | 12/2011 | Li |
| 2012/0095232 | A1 | 4/2012 | Li |
| 2012/0108806 | A1 | 5/2012 | Li |
| 2012/0181528 | A1 | 7/2012 | Takada |
| 2012/0205554 | A1 | 8/2012 | Hollis |
| 2012/0215001 | A1 | 8/2012 | Li |
| 2012/0223634 | A1 | 9/2012 | Xia |
| 2012/0264938 | A1 | 10/2012 | Li |
| 2012/0302753 | A1 | 11/2012 | Li |
| 2013/0048963 | A1 | 2/2013 | Beers |
| 2013/0137870 | A1 | 5/2013 | Li |
| 2013/0168656 | A1 | 7/2013 | Tsai |
| 2013/0203996 | A1 | 8/2013 | Li |
| 2013/0237706 | A1 | 9/2013 | Li |
| 2013/0341600 | A1 | 12/2013 | Lin |
| 2014/0014922 | A1 | 1/2014 | Lin |
| 2014/0027733 | A1 | 1/2014 | Zeng |
| 2014/0066628 | A1 | 3/2014 | Li |
| 2014/0073798 | A1 | 3/2014 | Li |
| 2014/0084261 | A1 | 3/2014 | Brooks |
| 2014/0114072 | A1 | 4/2014 | Li |
| 2014/0138653 | A1* | 5/2014 | Tsai et al. ............... H01L 51/00 313/504 |
| 2014/0147996 | A1 | 5/2014 | Vogt |
| 2014/0148594 | A1 | 5/2014 | Li |
| 2014/0203248 | A1 | 7/2014 | Zhou |
| 2014/0249310 | A1 | 9/2014 | Li |
| 2014/0330019 | A1 | 11/2014 | Li |
| 2014/0364605 | A1 | 12/2014 | Li |
| 2015/0008419 | A1 | 1/2015 | Li |
| 2015/0018558 | A1 | 1/2015 | Li |
| 2015/0028323 | A1 | 1/2015 | Xia |
| 2015/0069334 | A1 | 3/2015 | Xia |
| 2015/0105556 | A1 | 4/2015 | Li |
| 2015/0162552 | A1 | 6/2015 | Li |
| 2015/0194616 | A1 | 7/2015 | Li |
| 2015/0207086 | A1 | 7/2015 | Li |
| 2015/0228914 | A1 | 8/2015 | Li |
| 2015/0274762 | A1 | 10/2015 | Li |
| 2015/0287938 | A1 | 10/2015 | Li |
| 2015/0311456 | A1 | 10/2015 | Li |
| 2015/0318500 | A1 | 11/2015 | Li |
| 2015/0349279 | A1 | 12/2015 | Li |
| 2015/0380666 | A1 | 12/2015 | Szigethy |
| 2016/0028028 | A1 | 1/2016 | Li |
| 2016/0028029 | A1 | 1/2016 | Li |
| 2016/0043331 | A1 | 2/2016 | Li |
| 2016/0072082 | A1 | 3/2016 | Brooks |
| 2016/0133861 | A1 | 5/2016 | Li |
| 2016/0133862 | A1 | 5/2016 | Li |
| 2016/0194344 | A1 | 7/2016 | Li |
| 2016/0197291 | A1 | 7/2016 | Li |
| 2016/0285015 | A1 | 9/2016 | Li |
| 2016/0359120 | A1 | 12/2016 | Li |
| 2016/0359125 | A1 | 12/2016 | Li |
| 2017/0005278 | A1 | 1/2017 | Li |
| 2017/0012224 | A1 | 1/2017 | Li |
| 2017/0040555 | A1 | 2/2017 | Li |
| 2017/0047533 | A1 | 2/2017 | Li |
| 2017/0066792 | A1 | 3/2017 | Li |
| 2017/0069855 | A1 | 3/2017 | Li |
| 2017/0077420 | A1 | 3/2017 | Li |
| 2017/0125708 | A1 | 5/2017 | Li |
| 2017/0267923 | A1 | 9/2017 | Li |
| 2017/0271611 | A1 | 9/2017 | Li |
| 2017/0301871 | A1 | 10/2017 | Li |
| 2017/0305881 | A1 | 10/2017 | Li |
| 2017/0331056 | A1 | 11/2017 | Li |
| 2017/0342098 | A1 | 11/2017 | Li |
| 2017/0373260 | A1 | 12/2017 | Li |
| 2018/0006246 | A1 | 1/2018 | Li |
| 2018/0053904 | A1 | 2/2018 | Li |
| 2018/0130960 | A1 | 5/2018 | Li |
| 2018/0138428 | A1 | 5/2018 | Li |
| 2018/0148464 | A1 | 5/2018 | Li |
| 2018/0159051 | A1 | 6/2018 | Li |
| 2018/0166655 | A1 | 6/2018 | Li |
| 2018/0175329 | A1 | 6/2018 | Li |
| 2018/0194790 | A1 | 7/2018 | Li |
| 2018/0219161 | A1 | 8/2018 | Li |
| 2018/0226592 | A1 | 8/2018 | Li |
| 2018/0226593 | A1 | 8/2018 | Li |
| 2018/0277777 | A1 | 9/2018 | Li |
| 2018/0301641 | A1 | 10/2018 | Li |
| 2018/0312750 | A1 | 11/2018 | Li |
| 2018/0331307 | A1 | 11/2018 | Li |
| 2018/0334459 | A1 | 11/2018 | Li |
| 2018/0337345 | A1 | 11/2018 | Li |
| 2018/0337349 | A1 | 11/2018 | Li |
| 2018/0337350 | A1 | 11/2018 | Li |
| 2019/0013485 | A1 | 1/2019 | Li |
| 2019/0067602 | A1 | 2/2019 | Li |
| 2019/0109288 | A1 | 4/2019 | Li |
| 2019/0194536 | A1 | 6/2019 | Li |
| 2019/0259963 | A1 | 8/2019 | Li |
| 2019/0276485 | A1 | 9/2019 | Li |
| 2019/0312217 | A1 | 10/2019 | Li |
| 2019/0367546 | A1 | 12/2019 | Li |
| 2019/0389893 | A1 | 12/2019 | Li |
| 2020/0006678 | A1 | 1/2020 | Li |
| 2020/0071330 | A1 | 3/2020 | Li |
| 2020/0075868 | A1 | 3/2020 | Li |
| 2020/0119288 | A1 | 4/2020 | Li |
| 2020/0152891 | A1 | 5/2020 | Li |
| 2020/0239505 | A1 | 7/2020 | Li |
| 2020/0243776 | A1 | 7/2020 | Li |

FOREIGN PATENT DOCUMENTS

| | | | |
|---|---|---|---|
| CN | 101142223 | A | 3/2008 |
| CN | 101667626 | | 3/2010 |
| CN | 102449108 | A | 5/2012 |
| CN | 102892860 | A | 1/2013 |
| CN | 102971396 | A | 3/2013 |
| CN | 104232076 | A | 12/2014 |

(56) References Cited

FOREIGN PATENT DOCUMENTS

| | | | |
|---|---|---|---|
| CN | 104693243 | A | 6/2015 |
| CN | 105367605 | A | 3/2016 |
| CN | 105418591 | A | 3/2016 |
| EP | 1808052 | A1 | 7/2007 |
| EP | 1874893 | A1 | 1/2008 |
| EP | 1874894 | A1 | 1/2008 |
| EP | 1919928 | A1 | 5/2008 |
| EP | 2036907 | A1 | 3/2009 |
| EP | 2096690 | | 9/2009 |
| EP | 2112213 | A2 | 10/2009 |
| EP | 2417217 | A2 | 2/2012 |
| EP | 2711999 | A2 | 3/2014 |
| JP | 2002105055 | | 4/2002 |
| JP | 2003342284 | | 12/2003 |
| JP | 2005267557 | | 9/2005 |
| JP | 2005310733 | A | 11/2005 |
| JP | 2006047240 | A | 2/2006 |
| JP | 2006114889 | A | 4/2006 |
| JP | 2006232784 | A | 9/2006 |
| JP | 2006242080 | | 9/2006 |
| JP | 2006242081 | A | 9/2006 |
| JP | 2006256999 | A | 9/2006 |
| JP | 2006257238 | A | 9/2006 |
| JP | 2006261623 | A | 9/2006 |
| JP | 2006282965 | A | 10/2006 |
| JP | 2006290988 | A | 10/2006 |
| JP | 2006313796 | A | 11/2006 |
| JP | 2006332622 | A | 12/2006 |
| JP | 2006351638 | A | 12/2006 |
| JP | 2007019462 | A | 1/2007 |
| JP | 2007031678 | | 2/2007 |
| JP | 2007042875 | A | 2/2007 |
| JP | 2007053132 | A | 3/2007 |
| JP | 2007066581 | | 3/2007 |
| JP | 2007073620 | A | 3/2007 |
| JP | 2007073845 | A | 3/2007 |
| JP | 2007073900 | A | 3/2007 |
| JP | 2007080593 | | 3/2007 |
| JP | 2007080677 | A | 3/2007 |
| JP | 2007088105 | | 4/2007 |
| JP | 2007088164 | A | 4/2007 |
| JP | 2007096259 | A | 4/2007 |
| JP | 2007110067 | | 4/2007 |
| JP | 2007110102 | A | 4/2007 |
| JP | 2007258550 | A | 10/2007 |
| JP | 2007324309 | A | 12/2007 |
| JP | 2008010353 | A | 1/2008 |
| JP | 2008069268 | | 3/2008 |
| JP | 2008091860 | A | 4/2008 |
| JP | 2008103535 | A | 5/2008 |
| JP | 2008108617 | A | 5/2008 |
| JP | 2008109085 | | 5/2008 |
| JP | 2008109103 | A | 5/2008 |
| JP | 2008160087 | A | 7/2008 |
| JP | 2008198801 | A | 8/2008 |
| JP | 2008270729 | A | 11/2008 |
| JP | 2008270736 | | 11/2008 |
| JP | 2009016184 | A | 1/2009 |
| JP | 2009016579 | | 1/2009 |
| JP | 2009032977 | A | 2/2009 |
| JP | 2009032988 | A | 2/2009 |
| JP | 2009076509 | | 4/2009 |
| JP | 2009266943 | A | 11/2009 |
| JP | 2009267171 | A | 11/2009 |
| JP | 2009267244 | A | 11/2009 |
| JP | 2009272339 | A | 11/2009 |
| JP | 2009283891 | A | 12/2009 |
| JP | 2010135689 | A | 6/2010 |
| JP | 5604505 | | 9/2012 |
| JP | 2012222255 | A | 11/2012 |
| JP | 2013525436 | | 6/2013 |
| JP | 2014221807 | A | 11/2014 |
| JP | 2015081257 | A | 4/2015 |
| JP | 2016034935 | | 3/2016 |
| KR | 20060115371 | | 11/2006 |
| KR | 20070061830 | | 6/2007 |
| KR | 20070112465 | | 11/2007 |
| KR | 20130043460 | | 4/2013 |
| TW | 200701835 | | 1/2007 |
| TW | 201249851 | | 12/2012 |
| TW | 201307365 | A | 2/2013 |
| TW | 201710277 | | 3/2017 |
| WO | 0070655 | A2 | 11/2000 |
| WO | 2004003108 | | 1/2004 |
| WO | 2004039781 | | 5/2004 |
| WO | 2004085450 | | 10/2004 |
| WO | 2004108857 | | 12/2004 |
| WO | 2005042444 | A2 | 5/2005 |
| WO | 2005042550 | A1 | 5/2005 |
| WO | 2005075600 | | 8/2005 |
| WO | 2005103195 | | 11/2005 |
| WO | 2005105746 | A1 | 11/2005 |
| WO | 2005113704 | | 12/2005 |
| WO | 2006033440 | A1 | 3/2006 |
| WO | 2006067074 | | 6/2006 |
| WO | 2006082742 | A1 | 8/2006 |
| WO | 2006098505 | A1 | 9/2006 |
| WO | 2006100888 | | 9/2006 |
| WO | 2006115299 | A1 | 11/2006 |
| WO | 2006115301 | | 11/2006 |
| WO | 2007034985 | A1 | 3/2007 |
| WO | 2007069498 | A1 | 6/2007 |
| WO | 2008066192 | A1 | 6/2008 |
| WO | 2008066195 | A1 | 6/2008 |
| WO | 2008066196 | A1 | 6/2008 |
| WO | 2008117889 | | 10/2008 |
| WO | 2008123540 | | 10/2008 |
| WO | 2009017211 | A1 | 2/2009 |
| WO | 2009086209 | | 7/2009 |
| WO | 2009111299 | | 9/2009 |
| WO | 2010007098 | A1 | 1/2010 |
| WO | 2010056669 | | 5/2010 |
| WO | 2010093176 | | 8/2010 |
| WO | 2010105141 | | 9/2010 |
| WO | 2010118026 | A2 | 10/2010 |
| WO | 2011136755 | | 11/2011 |
| WO | 2011137429 | A2 | 11/2011 |
| WO | 2011137431 | A2 | 11/2011 |
| WO | 2012074909 | | 6/2012 |
| WO | 2012112853 | A1 | 8/2012 |
| WO | 2012142387 | | 10/2012 |
| WO | 2012162488 | A1 | 11/2012 |
| WO | 2012163471 | A1 | 12/2012 |
| WO | 2013130483 | A1 | 9/2013 |
| WO | 2014016611 | | 1/2014 |
| WO | 2014031977 | | 2/2014 |
| WO | 2014047616 | A1 | 3/2014 |
| WO | 2014109814 | | 7/2014 |
| WO | 2015027060 | A1 | 2/2015 |
| WO | 2015131158 | | 9/2015 |
| WO | 2016025921 | | 2/2016 |
| WO | 2016029137 | | 2/2016 |
| WO | 2016029186 | | 2/2016 |
| WO | 2016197019 | | 12/2016 |
| WO | 2018071697 | | 4/2018 |
| WO | 2018140765 | | 8/2018 |
| WO | 2019079505 | | 4/2019 |
| WO | 2019079508 | | 4/2019 |
| WO | 2019079509 | | 4/2019 |
| WO | 2019236541 | | 12/2019 |
| WO | 2020018476 | | 1/2020 |

OTHER PUBLICATIONS

JP2009267244, English Translation from EPO, Nov. 2009, 80 pages.

JP2010135689, English translation from EPO, dated Jun. 2010, 95 pages.

Chi et al.; Transition-metal phosphors with cyclometalating ligands: fundamentals and applications, Chemical Society Reviews, vol. 39, No. 2, Feb. 2010, pp. 638-655.

Satake et al., "Interconvertible Cationic and Neutral Pyridinylimidazole η3-Allylpalladium Complexes. Structural Assignment by 1H, 13C,

(56) References Cited

OTHER PUBLICATIONS and 15N NMR and X-ray Diffraction", Organometallics, vol. 18, No. 24, 1999, pp. 5108-5111.
Baldo et al., "Highly Efficient Phosphorescent Emission from Organic Electroluminescent Devices," Nature, vol. 395, Sep. 10, 1998, pp. 151-154.
Baldo et al., "Very high-efficiency green organic light-emitting devices based on electrophosphorescence," Applied Physics Letters, vol. 75, No. 1, Jul. 5, 1999, pp. 4-6.
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Barry O'Brien et al.: White organic light emitting diodes using Pt-based red, green and blue phosphorescent dopants. Proc. SPIE, vol. 8829, pp. 1-6, Aug. 25, 2013.
Ayan Maity et al., "Room-temperature synthesis of cyclometalated iridium(III) complexes; kinetic isomers and reactive functionalities" Chem. Sci., vol. 4, pp. 1175-1181 (2013).
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
Vanessa Wood et al., "Colloidal quantum dot light-emitting devices," Nano Reviews 1, Jul. 2010, pp. 5202. (7 pages).
Glauco Ponterini et al., "Comparison of Radiationless Decay Processes in Osmium and Platinum Porphyrins," J. Am. Chem. Soc., vol. 105, No. 14, 1983, pp. 4639-4645.
Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.
Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.
Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Shih-Chun Lo et al. "High-Triplet-Energy Dendrons: Enhancing the Luminescence of Deep Blue Phosphorescent Indium(III) Complexes" J. Am. Chem. Soc., vol. 131, 2009, pp. 16681-16688.
Jan Kalinowski et al., "Light-emitting devices based on organometallic platinum complexes as emitters," Coordination Chemistry Reviews, vol. 255, 2011, pp. 2401-2425.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Chi-Ming Che et al. "Photophysical Properties and OLEO Applications of Phosphorescent Platinum(II) Schiff Base Complexes," Chem. Eur. J., vol. 16, 2010, pp. 233-247.
Stephen R. Forrest, "The path to ubiquitous and low-cost organic electronic appliances on plastic," Nature, vol. 428, Apr. 29, 2004, pp. 911-918.
Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.
Xiaofan Ren et al., "Ultrahigh Energy Gap Hosts in Deep Blue Organic Electrophosphorescent Devices," Chem. Mater., vol. 16, 2004, pp. 4743-4747.
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Eric Turner et al., "Cyclometalated Platinum Complexes with Luminescent Quantum Yields Approaching 100%," Inorg. Chem., 2013, vol. 52, pp. 7344-7351.
Steven C. F. Kui et al., "Robust Phosphorescent Platinum(II) Complexes Containing Tetradentate O^N^C^N Ligands: Excimeric Excited State and Application in Organic White-Light-Emitting Diodes," Chem. Eur. J., 2013, vol. 19, pp. 69-73.
Steven C. F. Kui et al., "Robust phosphorescent platinum(II) complexes with tetradentate O^N^C^N ligands: high efficiency OLEDs with excellent efficiency stability," Chem. Commun., 2013, vol. 49, pp. 1497-1499.
Guijie Li et al., "Efficient and stable red organic light emitting devices from a tetradentate cyclometalated platinum complex," Organic Electronics, 2014, vol. 15 pp. 1862-1867.
Guijie Li et al., Efficient and Stable White Organic Light-Emitting Diodes Employing a Single Emitter, Adv. Mater., 2014, vol. 26, pp. 2931-2936.
Barry O'Brien et al., "High efficiency white organic light emitting diodes employing blue and red platinum emitters," Journal of Photonics for Energy, vol. 4, 2014, pp. 043597-1-8.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Murakami; JP 2007324309, English machine translation from EPO, dated Dec. 13, 2007, 89 pages.
Dorwald; "Side Reactions in Organic Synthesis: A Guide to Successful Synthesis Design," Chapter 1, 2005 Wiley-VCH Verlag Gmbh & Co. KGaA, Wienheim, 32 pages.
Marc Lepeltier et al., "Efficient blue green organic light-emitting devices based on a monofluorinated heteroleptic iridium(III) complex," Synthetic Metals, vol. 199, 2015, pp. 139-146.
Stefan Bernhard, "The First Six Years: A Report," Department of Chemistry, Princeton University, May 2008, 11 pages.
B. Harrison et al., "Near-infrared electroluminescence from conjugated polymer/lanthanide porphyrin blends", Applied Physics Letter, vol. 79, No. 23, pp. 3770-3772, Dec. 3, 2001.
Bei-Ping Yan et al., "Efficient White Organic Light-Emitting Devices Based on Phosphorescent Platinum(II)/Fluorescent Dual-Emitting Layers," Advanced Materials 19, 2007, pp. 3599-3603.
C.W. Tang, "Two-layer organic photovoltaic cell", Appl. Phys. Letters 48 (2), pp. 183-185, 1986.
Cardenas et al., "Divergent Behavior of Palladium(II) and Platinum(II) in the Metalation of 1,2-Di(2-pyridyl)benzene," Organometallics 1999, 18, pp. 3337-3341.
Del Cano et al., "Near-infrared electroluminescence based on perylenediimide-doped tris(8-quinolinolato) aluminum", Applied Physics Letters, 88, pp. 071117-1-071117-3, 2006.
Develay et al. "Cyclometalated Platinum(II) Complexes of Pyrazole-Based, N^C^N-Coordinating, Terdentate Ligands: the Contrasting Influence of Pyrazolyl and Pyridyl Rings on Luminescence" Inorganic Chemistry, vol. 47, No. 23, 2008, pp. 11129-11142.
Forrest et al., "Measuring the Efficiency of Organic Light-Emitting Devices", Advanced Materials, vol. 15, No. 13, pp. 1043-1048, 2003.
Gavino Sanna et al., "Platinum complexes with N—N—C ligands. Syntheses, electrochemical and spectroscopic characterisations of platinum(II) and relevant electroreduced species", Inorganica Chimica Acta, (2000), vol. 305, pp. 189-205.
Lonkin, A.S. et al.: Synthesis and structural characterization of a series of novel polyaromatic ligands containing pyrene and related biscyclometalated iridium complexes. Organometallics, vol. 25, pp. 1461-1471, 2006.

(56) References Cited

OTHER PUBLICATIONS

J. Kido et al., "Organo Lanthanide Metal Complexes for Electroluminescent Materials", Chem. Rev., vol. 102, pp. 2357-2368, 2002.
J. M. Longmire et al., "Synthesis and X-ray Crystal Structures of Palladium(II) and Platinum(II) Complexes of the PCP-Type Chiral Tridentate Ligand . . . ", Organometallics, vol. 17, pp. 4374-4379, 1998.
J.A. Gareth Williams et al., "Optimising the luminescence of platinum(II) complexes and their application in organic light emitting devices (OLEDs)," Coordination Chemistry Reviews 252, 2008, pp. 2596-2611.
Le Zhao et al., "Luminescent Amphiphilic 2,6-Bis(1-alkylpyrazol-3-yl)pyridyl Platinum(II) Complexes: Synthesis, Characterization, Electrochemical, Photophysical, and Langmuir-Blodgett Film Formation Studies," Chemistry A European Journal 16, 2010, pp. 6797-6809.
Lisa Murphy et al., "Blue-shifting the monomer and excimer phosphorescence of tridentate cyclometallated platinum(II) complexes for optimal white-light OLEDs," Chem. Commun. 48(47), Jun. 14, 2012, pp. 5817-5819.
Lixin Xiao et al., "Recent Progresses on Materials for Electrophosphorescent Organic Light-Emitting Devices," Advanced Materials 23, 2011, pp. 926-952.
Mai-Yan Yuen et al., "Synthesis, Photophysical and Electrophosphorescent Properties of Fluorene-Based Platinum(II) Complexes," Chemistry A European Journal 16 2010, pp. 14131-14141.
Nathan Bakken et al., "Highly efficient white organic light-emitting device using a single emitter," Journal of Photonics for Energy 2, 2012, pp. 021203-1-021203-7.
Nonoyama; "Ruthenium(II) Complexes of 2-(ρ-Toluidino)Pyridine and Rhodium(II) Complexes of N,N'-DI(2-Pyridyl)-1,3-Diamino-5-Chlorobenzene" Polyhedron 1985, 4, 765-768.
P. Peumans et al., "Small molecular weight organic thin-film photodetectors and solar cells", Journal of Applied Physics, vol. 93, No. 7, pp. 3693-3723, Apr. 1, 2003.
R. J. Holmes et al., "Saturated deep blue organic electrophosphorescence using a fluorine-free emitter," Applied Physics Letters 87, 2005, pp. 243507-1-3.
Rand et al., Organic Double-Heterostructure Photovoltaic Cells Employing Thick Tris (acetylacetonato) ruthenium (III) Exciton-Blocking Layers, Advanced Materials vol. 17, pp. 2714-2718, 2005.
S. A. Willison et al., "A Luminescent Platinum(II) 2,6-Bis(N-pyrazolyl)pyridine Complex", Inorg. Chem. vol. 43, pp. 2548-2555, 2004.
S. Lamansky et al., "Synthesis and Characterization of Phosphorescent Cyclometalated Iridium Complexes", Inorg. Chem., vol. 40, pp. 1704-1711, 2001.
S. Lamansky et al., "Highly Phosphorescent Bis-Cyclometalated Iridium Complexes: Synthesis, Photophysical Characterization, and Use in Organic Light Emitting Diodes", J. Am. Chem. Soc., vol. 123, pp. 4304-4312, 2001.
Seward; "Palladium(II) Complexes of Bowls, Pinwheels, Cages, and N,C,N-Pincers of Starburst Ligands 1,3,5-Tris(di-2-pyridylamino) benzene and 2,4,6-Tris(di-2-pyridylamino)-1,3,5-triazene" Inorg. Chem., 2004, 43, 978-985.
Song; Syntheses and Structures of New Luminescent Cyclometalated Palladium(II) and Platinum (II) Complexes: M(Bab)Cl, M(Br-Bab)Cl (M=Pd(II), Pt(II)), and Pd3Cl4(Tab)2 (Bab=I,3-bis(7-azaindolyl) phenyl, Br-Bab=I-Bromo-3,5-bis (7-azaindolyl)phenyl) Organometallics 2001, 20, 4683-4689.
Soon Ok Jeon et al., "External Quantum Efficiency Above 20% in Deep Blue Phosphorescent Organic Light-Emitting Diodes," Advanced Materials 23, 2011, pp. 1436-1441.
Sumby; Cyclometalated Compounds. XVII.1 The First Threefold Cyclopalladation of a Single Benzene Ring Organometallics, 2003, 22, 2358-2360.
Supporting Information: Xiao-Chun Hang et al., "Highly Efficient Blue-Emitting Cyclometalated Platinum(II) Complexes by Judicious Molecular Design," Wiley-VCH 2013, 7 pages.
Tani; "Synthesis of Re(I) complexes bearing tridenate 2,6-bis(7'-azaindolyl)phenyl ligand with green emission properties" Journal of Organometallic Chemistry 2004, 689, 1665-1674.
Tyler Fleetham et al., "Efficient deep blue electrophosphorescent devices based on platinum(II) bis(n-methyl-imidazolyl)benzene chloride," Organic Electronics 13, 2012, pp. 1430-1435.
Tyler Fleetham et al., "Single-Doped White Organic Light-Emitting Device with an External Quantum Efficiency Over 20%," Advanced Materials 25, 2013 pp. 2573-2576.
V. Adamovich et al., "High efficiency single dopant white electrophosphorescent light emitting diodes", New J. Chem, vol. 26, pp. 1171-1178. 2002.
Valery N. Kozhevnikov et al., "Phosphorescent, Terdentate, Liquid-Crystalline Complexes of Platinum(II): Stimulus-Dependent Emission," Angew. Chem. Int. Ed. 47, 2008, pp. 6286-6289.
Vanhelmont et al., "Synthesis, Crystal Structure, High-Resolution Optical Spectroscopy, and Extended Huckel Calculations for [Re(CO)4(thpy)] (thpy-2-(2-Thienyl)pyridinate). Comparison with Related Cyclometalated Complexes", Inorg. Chem., vol. 36, pp. 5512-5517, 1997.
Williams et al., "An Alternative Route to Highly Luminescent Platinum(II) Complexes," Inorg. Chem., 2003, 42, pp. 8609-8611.
Williams et al., "Organic light-emitting diodes having exclusive near-infrared electrophosphorescence", Applied Physics Letters, vol. 89, pp. 083506 (3 pages), 2006.
Wu; "A Blue Luminescent Starburst Molecule and Its Orange Luminescent Trinuclear Pdll Complex: 1,3,5-tris(7-azaindol-1-yl)benzene (tabH) and [Pd3II(tab)2Cl4]*" Angew. Chem. Int. Ed. 2000, 39, 3933-3935.
X. Li et al., "Synthesis and properties of novel poly(p-phenylenevinylene) copolymers for near-infrared emitting diodes", European Polymer Journal, vol. 41, pp. 2923-2933, 2005.
Xiaohui Yang et al., "Efficient Blue- and White-Emitting Electrophosphorescent Devices Based on Platinum(II) [1,3-Difluoro-4,6-di(2-pyridinyl)benzene] Chloride," Advanced Materials 20, 2008, pp. 2405-2409.
Xiaohui Yang et al., "Highly efficient excimer-based white phosphorescent devices with improved power efficiency and color rendering index," Applied Physics Letters 93, 2008, pp. 193305-1-193305-3.
Zixing Wang et al., "Facile Synthesis and Characterization of Phosphorescent Pt(NCN)X Complexes," Inorganic Chemistry 49(24), 2010, pp. 11276-11286.
Lai; Adv. Funct. Mater. 2013, 23, 5168-5176. DOI: 10.1002/adfm.201300281 (Year: 2013).
O'Brien; Proc. SPIE 8829, 2013, 882909, 6 pages. doi: 10.1117/12.2027143 (Year: 2013) (6 pages).
Vezzu, D. et al.: Highly luminescent tridentate platinum (II) complexes featured in fused five-six-membered metallacycle and diminishing concentration quenching. Inorganic Chem., vfol. 50 (17), pp. 8261-8273, 2011.

* cited by examiner

METAL-ASSISTED DELAYED FLUORESCENT EMITTERS CONTAINING TRIDENTATE LIGANDS

CROSS-REFERENCE TO RELATED APPLICATION

This application is a continuation of U.S. patent application Ser. No. 16/993,924 filed on Aug. 14, 2020, now allowed, which is a continuation of U.S. patent application Ser. No. 15/711,525, filed Sep. 21, 2017, now U.S. Pat. No. 10,790,457, which is a continuation of U.S. patent application Ser. No. 14/809,981, filed Jul. 27, 2015, now U.S. Pat. No. 9,818,959, which claims the benefit of U.S. Provisional Patent Application No. 62/030,235, filed Jul. 29, 2014, all which are incorporated by reference herein in their entireties

TECHNICAL FIELD

The present disclosure relates to tridentate platinum, palladium, gold, iridium, and rhodium complexes for phosphorescent or delayed fluorescent and phosphorescent or emitters in display and lighting applications, and specifically to phosphorescent or delayed fluorescent and phosphorescent tridentate metal complexes having modified emission spectra.

BACKGROUND

Compounds capable of absorbing and/or emitting light can be suited for use in a wide variety of optical and electroluminescent devices, including, for example, photo-absorbing devices such as solar- and photo-sensitive devices, organic light emitting diodes (OLEDs), photo-emitting devices, or devices capable of both photo-absorption and emission and as markers for bio-applications. Much research has been devoted to the discovery and optimization of organic and organometallic materials for using in optical and electroluminescent devices. Generally, research in this area aims to accomplish a number of goals, including improvements in absorption and emission efficiency and improvements in the stability of devices, as well as improvements in processing ability.

Despite significant advances in research devoted to optical and electro-optical materials (e.g., red and green phosphorescent organometallic materials are commercially available and have been used as phosphors in organic light emitting diodes (OLEDs), lighting, and advanced displays), many currently available materials exhibit a number of disadvantages, including poor processing ability, inefficient emission or absorption, and less than ideal stability, among others.

Good blue emitters are particularly scarce, with one challenge being the stability of the blue devices. The choice of the host materials has an impact on the stability and the efficiency of the devices. The lowest triplet excited state energy of the blue phosphors is very high compared with that of the red and green phosphors, which means that the lowest triplet excited state energy of host materials for the blue devices should be even higher. Thus, one of the problems is that there are limited host materials to be used for the blue devices. Accordingly, a need exists for new materials which exhibit improved performance in optical emitting and absorbing applications.

SUMMARY

The present disclosure relates to platinum, palladium, gold, iridium, and rhodium compounds suitable for emitters in organic light emitting diodes (OLEDs) and display and lighting applications.

Disclosed herein are metal-assisted delayed fluorescent and phosphorescent emitters, metal-assisted delayed fluorescent emitters, and phosphorescent emitters of Formula A-I and Formula A-II:

Formula A-I

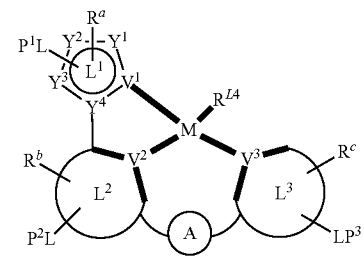

Formula A-II

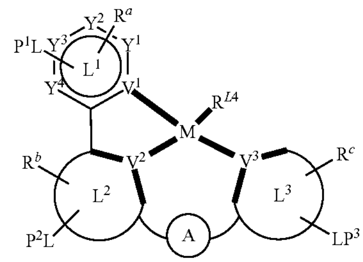

wherein:

M is Pt, Pd, or Au, $L^1$ is a five-membered heterocyclyl, five-membered heteroaryl, five-membered carbene, five-membered N-heterocyclic carbene, a six-membered aryl, or six-membered heteroaryl, each of $L^2$ and $L^3$ is independently substituted or unsubstituted aryl, cycloalkyl, cycloalkenyl, heteroaryl, heterocyclyl, carbene, or N-heterocyclic carbene, $R^{L4}$ is an inorganic anion or organic anion as described herein, each of $LP^1$, $LP^2$, and $LP^3$ is independently a fluorescent luminophore, each of LP', $LP^2$, and $LP^3$ is independently present or absent, and at least one of $LP^1$, $LP^2$, or $LP^3$ is present, A is $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, and optionally forms more than one bond with $L^2$, $L^3$, or both, thereby forming a ring system with $L^2$, a ring system with $L^3$, or both, each of $V^1$, $V^2$, and $V^3$ is independently N, C, P, B, or Si, each of $Y^1$, $Y^2$, $Y^3$, and $Y^4$ is independently C, N, O, S, S═O, $SO_2$, Se, Se═O, $SeO_2$, $PR^3$, $R^3P$═O, $AsR^3$, $R^3As$═O, or $BR^3$, each of $R^a$, $R^b$, and $R^c$ is independently present or absent, and if present each of $R^a$, $R^b$, and $R^c$ independently represents a mono-, di-, or tri-substitution, and each $R^a$, $R^b$, and $R^c$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and each of $R^1$, $R^2$, and $R^3$ is independently hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, monoalkylamino, dialkylamino, monoarylamino, diarylamino, alkoxy, aryloxy, haloalkyl, aralkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, or polymeric; or any conjugate or combination thereof.

In one aspect, each of $LP^1$, $LP^2$ and $LP^3$ is independently an aromatic hydrocarbon, an aromatic hydrocarbon derivative, a polyphenyl hydrocarbon, a hydrocarbon with condensed aromatic nuclei, naphthalene, anthracene, phenanthrene, chrysene, pyrene, triphenylene, perylene, acenaphthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, arylethylene, arylacetylene, an arylacetylene derivative, a diarylethylene, a diarylpolyene, a diaryl-substituted vinylbenzene, a distyrylbenzene, a trivinylbenzene, an arylacetylene, a functional substitution product of stilbene, a five-, six- or seven-membered heterocyclic compound derivative, a furan derivative, a thiophene derivative, a pyrrole derivative, an aryl-substituted oxazole, a 1,3,4-oxadiazole, a 1,3,4-thiadiazole, an aryl-substituted 2-pyrazoline, an aryl-substituted pyrazole, a benzazole, 2H-benzotriazole, a substitution product of 2H-benzotriazole, a heterocycle with one, two or three nitrogen atoms, an oxygen-containing heterocycle, a coumarin, a coumarin derivative, a dye, an acridine dye, a xanthene dye, an oxazine, or a thiazine.

In another aspect, two or more of $R^a$ are optionally linked together, two or more of $R^b$ are optionally linked together, two or more of $R^c$ are optionally linked together, or any combination thereof.

Disclosed herein are metal-assisted delayed fluorescent and phosphorescent emitters, metal-assisted delayed fluorescent emitters or phosphorescent emitters of Formula B-I, Formula B-II and Formula B-III:

Formula B-I

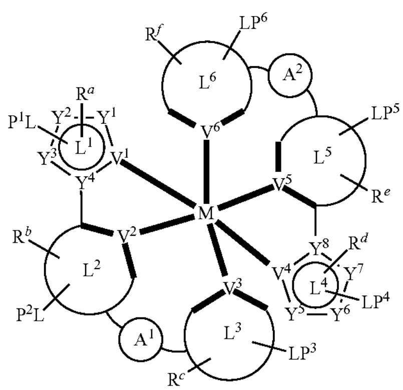

-continued

Formula B-II

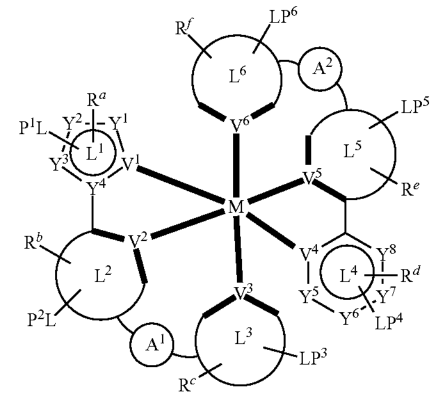

Formula B-III

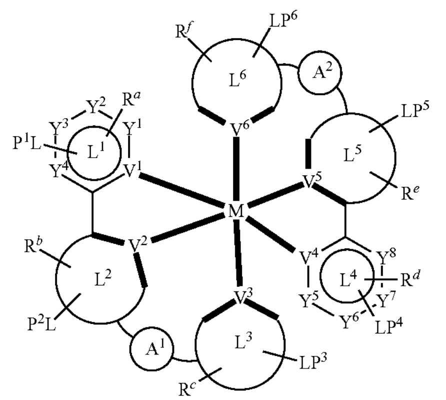

wherein:

M is Ir or Rh, each of $L^1$ and $L^4$ is independently a five-membered heterocyclyl, five-membered heteroaryl, five-membered carbene, five-membered N-heterocyclic carbene, six-membered aryl, or six-membered heteroaryl, each of $L^2$, $L^3$, $L^5$, and $L^6$ is independently substituted or unsubstituted aryl, cycloalkyl, cycloalkenyl, heteroaryl, heterocyclyl, carbene, or N-heterocyclic carbene, each of $LP^1$, $LP^2$, $LP^3$, $LP^4$, $LP^5$, and $LP^6$ is independently a fluorescent luminophore, each of $LP^1$, $LP^2$, $LP^3$, $LP^4$, $LP^5$, and $LP^6$ is independently present or absent, and at least one of $LP^1$, $LP^2$, $LP^3$, $LP^4$, $LP^5$, and $LP^6$ is present, each of $A^1$ and $A^2$ is independently $CH_2$, $CR^1R^2$, C=O, $CH_2$, $SiR^1R^2$, $GeH_2$, $GeR^1R^2$, NH, $NR^3$, PH, $PR^3$, $R^3P$=O, $AsR^3$, $R^3As$=O, O, S, S=O, $SO_2$, Se, Se=O, $SeO_2$, BH, $BR^3$, $R^3Bi$=O, BiH, or $BiR^3$, and $A^1$ optionally forms more than one bond with $L^2$, $L^3$, or both, thereby forming a ring system with $L^2$, a ring system with $L^3$, or both, and $A^2$ optionally forms more than one bond with $L^5$, $L^6$, or both, thereby forming a ring system with $L^5$, a ring system with $L^6$, or both, each of $V^1$, $V^2$, $V^3$, $V^4$, $V^5$, and $V^6$ is independently N, C, P, B, or Si, each of $Y^1$, $Y^2$, $Y^3$, $Y^4$, $Y^5$, $Y^6$, $Y^7$, and $Y^8$ is independently C, N, O, S, S=O, $SO_2$, Se, Se=O, $SeO_2$, $PR^3$, $R^3P$=O, $AsR^3$, $R^3As$=O, or $BR^3$, each of $R^a$, $R^b$, $R^e$, $R^d$, $R^e$, and $R^f$ is independently present or absent, and if present each of $R^a$, $R^b$, $R^c$, $R^d$, $R^e$, and $R^f$ is independently a mono-, di-, or tri-substitution, and each $R^a$, $R^b$, $R^e$, $R^d$, $R^e$, and $R^f$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and each of $R^1$, $R^2$, and $R^3$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one aspect, each of $LP^1$, $LP^2$, $LP^3$, $LP^4$, $LP^5$ and $LP^6$ is independently an aromatic hydrocarbon, an aromatic hydrocarbon derivative, a polyphenyl hydrocarbon, a hydrocarbon with condensed aromatic nuclei, naphthalene, anthracene, phenanthrene, chrysene, pyrene, triphenylene, perylene, acenaphthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, an arylethylene derivative, an arylacetylene derivative, a diarylethylene, a diarylpolyene, a diaryl-substituted vinylbenzene, a distyrylbenzene, a trivinylbenzene, an arylacetylene, a functional substitution product of stilbene, a five-, six- or seven-membered heterocyclic compound derivative, a furan derivative, a thiophene derivative, a pyrrole derivative, an aryl-substituted oxazole, an 1,3,4-oxadiazole, an 1,3,4-thiadiazole, an aryl-substituted 2-pyrazoline, an aryl-substituted pyrazole, a benzazole, 2H-benzotriazole, a substitution product of 2H-benzotriazole, a heterocycle with one, two, or three nitrogen atoms, an oxygen-containing heterocycle, a coumarin, a coumarin derivative, a dye, an acridine dye, a xanthene dye, an oxazine, or a thiazine.

In another aspect, two or more of $R^a$ are optionally linked together, two or more of $R^b$ are optionally linked together, two or more of $R^c$ are optionally linked together, two or more of $R^d$ are optionally linked together, two or more of $R^e$ are optionally linked together, two or more of $R^f$ are optionally linked together, or any combination thereof.

In some cases, the structures of Formulas B-I and B-III are symmetrical, and certain of the variables described herein are not independently selected. In one example, Formula B-I is symmetrical, and $A^1=A^2$, $L^1=L^4$, $L^2=L^5$, $L^3=L^6$, $LP^1=LP^4$, $LP^2=LP^5$, $LP^3=LP^6$, $R^a=R^d$, $R^b=R^e$, $R^c=R^e$, $V^1=V^4$, $V^2=V^5$, $V^3=V^6$, $Y^1=Y^5$, $Y^2=Y^6$, $Y^3=Y^7$, and $Y^4=Y^8$. In other cases, the structures of Formulas B-I and B-III are asymmetrical.

Also disclosed herein are compositions including one or more of the compounds disclosed herein, as well as devices, such as OLEDs, including one or more of the compounds or compositions disclosed herein.

Additional aspects will be set forth in the description which follows. Advantages will be realized and attained by means of the elements and combinations particularly pointed out in the claims. It is to be understood that both the foregoing general description and the following detailed description are exemplary and explanatory only and are not restrictive.

DETAILED DESCRIPTION

Figure 1:
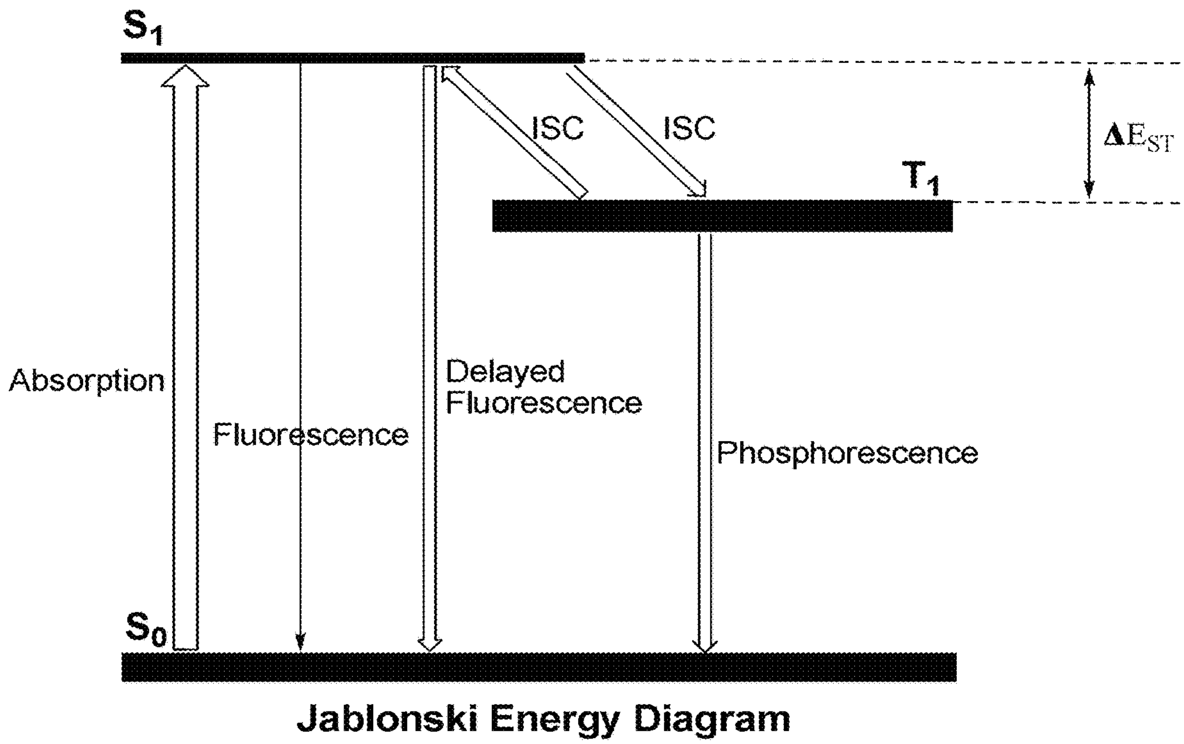
FIG. 1 is a Jablonski Energy Diagram depicting the emission pathways of fluorescence, phosphorescence, and delayed fluorescence.

This disclosure provides a materials design route to reduce the energy gap between the lowest triplet excited state and the lowest singlet excited state of the metal compounds to afford delayed fluorescent materials which can be an approach to solve the problems of the blue emitters. The present disclosure can be understood more readily by reference to the following detailed description and the Examples included therein.

Before the present compounds, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of the aspects of this disclosure, example methods and materials are now described.

As used in the specification and the appended claims, the singular forms “a”, “an”, and “the” include plural referents unless the context clearly dictates otherwise. Thus, for example, reference to “a component” includes mixtures of two or more components.

As used herein, the terms “optional” or “optionally” means that the subsequently described event or circumstance can or cannot occur, and that the description includes instances where said event or circumstance occurs and instances where it does not.

Disclosed are the components to be used to prepare the compositions disclosed herein as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds cannot be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions. Thus, if there are a variety of additional steps that can be performed it is understood that each of these additional steps can be performed with any specific embodiment or combination of embodiments of the methods.

As referred to herein, a linking atom or group connects two atoms such as, for example, an N atom and a C atom. A linking atom or group is in one aspect disclosed as A, $A^1$, $A^2$, $A^3$, etc. herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amine, amide, thiol, aryl, heteroaryl, cycloalkyl, and heterocyclyl moieties.

The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "A," "$A^1$," and "$A^2$" or other designations are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dodecyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The term "polyalkylene group" as used herein is a group having two or more $CH_2$ groups linked to one another. The polyalkylene group can be represented by the formula $—(CH_2)_a—$, where "a" is an integer of from 2 to 500.

The terms "alkoxy" and "alkoxyl" as used herein to refer to an alkyl or cycloalkyl group bonded through an ether linkage; that is, an "alkoxy" group can be defined as $—OA^1$ where $A^1$ is alkyl or cycloalkyl as defined above. "Alkoxy" also includes polymers of alkoxy groups as just described; that is, an alkoxy can be a polyether such as $—OA^1\text{-}OA^2$ or $—OA^1\text{-}(OA^2)_a\text{-}OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C{=}C(A^3A^4)$ are intended to include both the E and Z isomers. This can be presumed in structural formulae herein wherein an asymmetric alkene is present, or it can be explicitly indicated by the bond symbol C═C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C═C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C═O.

The terms "amine" or "amino" as used herein are represented by the formula $—NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula $—N(\text{-alkyl})_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula $—OC(O)A^1$ or $—C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula $-(A^1O(O)C\text{-}A^2\text{-}C(O)O)_a—$ or $-(A^1O(O)C\text{-}A^2\text{-}OC(O))_a—$, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula $-(A^1O\text{-}A^2O)_a—$, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "polymeric" includes polyalkylene, polyether, polyester, and other groups with repeating units, such as, but not limited to $—(CH_2O)_n—CH_3$, $—(CH_2CH_2O)_n—CH_3$, $—[CH_2CH(CH_3)]_n—CH_3$, $—[CH_2CH(COOCH_3)]_n—CH_3$, —$[CH_2CH(COOCH_2CH_3)]_n$—$CH_3$, and —$[CH_2CH(COO^tBu)]_n$—$CH_3$, where n is an integer (e.g., n>1 or n>2).

The term "halide" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula —$N_3$.

The term "nitro" as used herein is represented by the formula —$NO_2$.

The term "nitrile" as used herein is represented by the formula —CN.

The term "silyl" as used herein is represented by the formula —$SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas —$S(O)A^1$, —$S(O)_2A^1$, —$OS(O)_2A^1$, or —$OS(O)_2OA^1$, where $A^1$ can be hydrogen or an alkyl, cycloalkyl, alkenyl, cycloalkenyl, alkynyl, cycloalkynyl, aryl, or heteroaryl group as described herein. Throughout this specification "S(O)" is a short hand notation for S═O. The term "sulfonyl" is used herein to refer to the sulfo-oxo group represented by the formula —$S(O)_2A^1$, where $A^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH.

"R," "$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

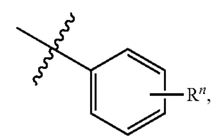

which is understood to be equivalent to a formula:

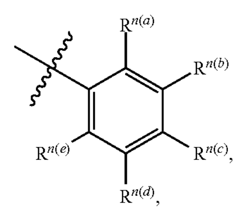

wherein n is typically an integer. That is, $R^n$ is understood to represent five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$, etc. are made in chemical structures and moieties disclosed and described herein. Any description of R, $R^1$, $R^2$, $R^3$, $R^4$, $R^5$, $R^6$ etc. in the specification is applicable to any structure or moiety reciting R, $R^1$, $R^2$, $R^3$, $R^4$, $R^5$, $R^6$, etc. respectively.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

Excitons decay from singlet excited states to the ground state to yield prompt luminescence, which is fluorescence. Excitons decay from triplet excited states to the ground state to generate luminescence, which is phosphorescence. Because the strong spin-orbit coupling of the heavy metal atom enhances intersystem crossing (ISC) very efficiently between singlet and triplet excited states, phosphorescent metal complexes, such as platinum, iridium and palladium complexes, have demonstrated their potential to harvest both the singlet and triplet excitons to achieve 100% internal quantum efficiency. Thus phosphorescent metal complexes are good candidates as dopants in the emissive layer of organic light emitting devices (OLEDs)

However, to date, blue electroluminescent devices remain the most challenging area of this technology, due at least in part to stability of the blue devices. It has been proved that the choice of host materials plays a role in the stability of the blue devices. But the lowest triplet excited state ($T_1$) energy of the blue phosphors is very high, which indicates that the lowest triplet excited state ($T_1$) energy of host materials for the blue devices should be even higher. As such, development of the host materials for the blue devices can be difficult.

This disclosure provides a materials design route by introducing fluorescent luminophore(s) to the ligand of the metal complexes. Thereby, chemical structures of the fluorescent luminophores and the ligands may be modified, and the metal can be changed to adjust the singlet state energy and the triplet state energy of the metal complexes, which all could affect the optical properties of the complexes and therefore properties such as emission and absorption spectra. The energy gap ($\Delta E_{ST}$) between the lowest triplet excited state ($T_1$) and the lowest singlet excited state ($S_1$) may also be adjusted. When $\Delta E_{ST}$ becomes small enough, intersystem crossing (ISC) from the lowest triplet excited state ($T_1$) to the lowest singlet excited state ($S_1$) occurs efficiently. Excitons can therefore undergo non-radiative relaxation via ISC from $T_1$ to $S_1$, then relax from $S_1$ to $S_0$, leading to delayed fluorescence (see FIG. 1). Through this pathway, higher energy excitons can be obtained from a lower excited state (from $T_1 \rightarrow S_1$), which means more host materials can be available for the dopants.

The metal complexes described herein can be tailored or tuned to a particular emission or absorption characteristic for a specific application. The optical properties of the metal complexes in this disclosure can be tuned by varying the structure of the ligand surrounding the metal center or varying the structure of fluorescent luminophore(s) on the ligands. For example, the metal complexes having a ligand with electron donating substituents or electron withdrawing substituents can be generally exhibit different optical properties, including emission and absorption spectra. The color of the metal complexes can be tuned by modifying the conjugated groups on the fluorescent luminophores and ligands.

The emission of complexes described herein can be tuned, for example, from the ultraviolet to near-infrared, by, for example, modifying the ligand or fluorescent luminophore structure. A fluorescent luminophore is a group of atoms in an organic molecule that can absorb energy to generate singlet excited state(s). The singlet exciton(s) produce(s) decay rapidly to yield prompt luminescence. In one aspect, the complexes provide emission over a majority of the visible spectrum. In one example, the complexes described herein emit light over a range of from about 400 nm to about 700 nm. In another aspect, the complexes described herein have improved stability and efficiency over traditional emission complexes. In yet another aspect, the complexes are useful as luminescent labels in, for example, bio-applications, anti-cancer agents, emitters in organic light emitting diodes (OLEDs), or a combination thereof. In another aspect, the complexes described herein suitable for light emitting devices, such as, for example, compact fluorescent lamps (CFL), light emitting diodes (LED), incandescent lamps, and the like.

Disclosed herein are compounds, compound complexes, or complexes including platinum, palladium, gold, iridium, and rhodium. The terms "compound," "complex," and "compound complex" are used interchangeably herein. In one aspect, the compounds disclosed herein have a neutral charge.

The compounds disclosed herein exhibit desirable properties and have emission and/or absorption spectra that can be tuned via the selection of appropriate ligands. The compounds disclosed herein include delayed fluorescent emitters, phosphorescent emitters, or a combination thereof. In one aspect, the compounds disclosed herein are delayed fluorescent emitters. In another aspect, the compounds disclosed herein are phosphorescent emitters. In yet another aspect, a compound disclosed herein is both a delayed fluorescent emitter and a phosphorescent emitter. In another aspect, any one or more of the compounds, structures, or portions thereof, specifically recited herein, can be excluded.

The compounds disclosed herein are suited for use in a wide variety of optical and electro-optical devices, including, but not limited to, photo-absorbing devices such as solar- and photo-sensitive devices, organic light emitting diodes (OLEDs), photo-emitting devices, luminescent devices and displays, full color displays, and devices capable of both photo-absorption and emission and as markers for bio-applications. In another aspect, the compounds provide improved efficiency and/or operational lifetimes in lighting devices, such as, for example, organic light emitting devices, as compared to conventional materials.

The compounds described herein can be made using a variety of methods, including, but not limited to those recited in the Examples.

Metal-assisted delayed fluorescent and phosphorescent emitters, metal-assisted delayed fluorescent emitters, and phosphorescent emitters include compounds of Formula A-I and Formula A-II:

Formula A-I

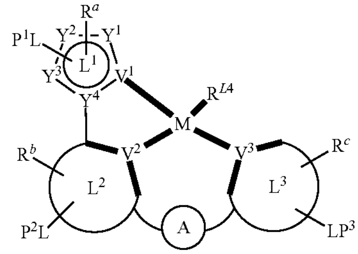

-continued

Formula A-II

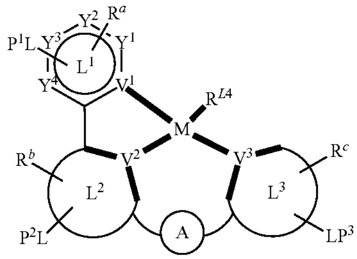

wherein:

M is Pt, Pd, or Au, $L^1$ is a five-membered heterocyclyl, five-membered heteroaryl, five-membered carbene, five-membered N-heterocyclic carbene, a six-membered aryl, or six-membered heteroaryl, each of $L^2$ and $L^3$ is independently substituted or unsubstituted aryl, cycloalkyl, cycloalkenyl, heteroaryl, heterocyclyl, carbene, or N-heterocyclic carbene, $R^{L4}$ is an inorganic anion or organic anion as defined herein, each of $LP^1$, $LP^2$, and $LP^3$ is independently a fluorescent luminophore, each of $LP'$, $LP^2$, and $LP^3$ is independently present or absent, and at least one of $LP^1$, $LP^2$, or $LP^3$ is present, A is $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, and optionally forms more than one bond with $L^2$, $L^3$, or both, thereby forming a ring system with $L^2$, a ring system with $L^3$, or both, each of $V^1$, $V^2$, and $V^3$ is independently N, C, P, B, or Si, each of $Y^1$, $Y^2$, $Y^3$, and $Y^4$ is independently C, N, O, S, S═O, $SO_2$, Se, Se═O, $SeO_2$, $PR^3$, $R^3P$═O, $AsR^3$, $R^3As$═O, or $BR^3$, each of $R^a$, $R^b$, and $R^c$ is independently present or absent, and if present each of $R^a$, $R^b$, and $R^c$ independently represents mono-, di-, or tri-substitutions, and each of $R^a$, $R^b$, and $R^c$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and each of $R^1$, $R^2$, and $R^3$ is independently hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, monoalkylamino, dialkylamino, monoarylamino, diarylamino, alkoxy, aryloxy, haloalkyl, aralkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, or polymeric; or any conjugate or combination thereof.

In one aspect, each of $LP^1$, $LP^2$ and $LP^3$ is independently an aromatic hydrocarbon, an aromatic hydrocarbon derivative, a polyphenyl hydrocarbon, a hydrocarbon with condensed aromatic nuclei, naphthalene, anthracene, phenanthrene, chrysene, pyrene, triphenylene, perylene, acenaphthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, arylethylene, arylacetylene, an arylacetylene derivative, a diarylethylene, a diarylpolyene, a diaryl-substituted vinylbenzene, a distyrylbenzene, a trivinylbenzene, an arylacetylene, a functional substitution product of stilbene, a five-, six- or seven-membered heterocyclic compound derivative, a furan derivative, a thiophene derivative, a pyrrole derivative, an aryl-substituted oxazole, a 1,3,4-oxadiazole, a 1,3,4-thiadiazole, an aryl-substituted 2-pyrazoline, an aryl-substituted pyrazole, a benzazole, 2H-benzotriazole, a substitution product of 2H-benzotriazole, a heterocycle with one, two or three nitrogen atoms, an oxygen-containing heterocycle, a coumarin, a coumarin derivative, a dye, an acridine dye, a xanthene dye, an oxazine, or a thiazine.

In some cases, two or more of $R^a$ are optionally linked together, two or more of $R^b$ are optionally linked together, two or more of $R^c$ are optionally linked together, or any combination thereof.

In another aspect, metal-assisted delayed fluorescent and phosphorescent emitters, metal-assisted delayed fluorescent emitters or phosphorescent emitters have the structure of one of Formulas A-1-A-10:

A-1

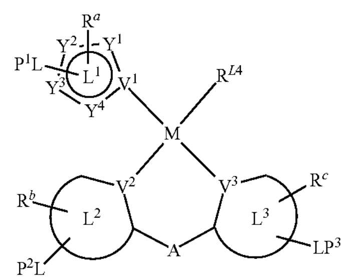

A-2

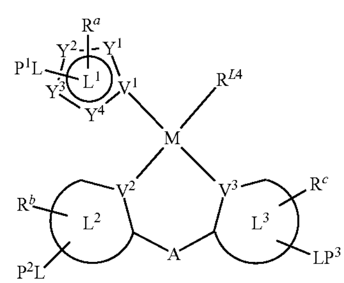

A-3

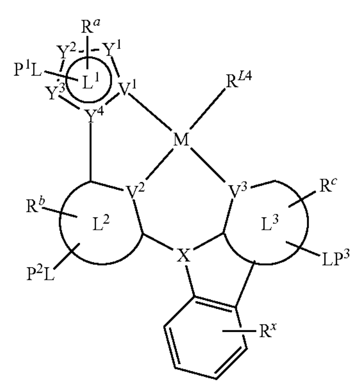

-continued

A-4

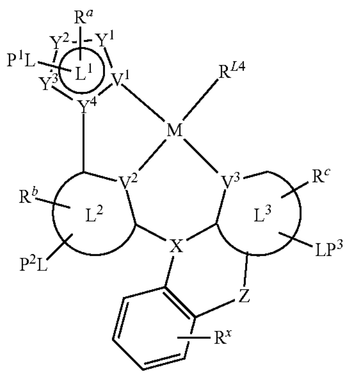

A-5

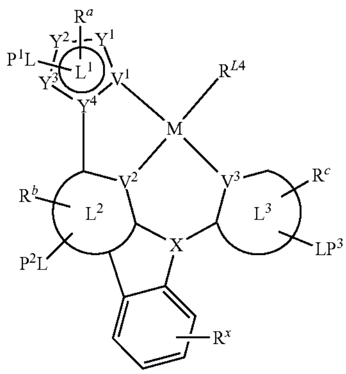

A-6

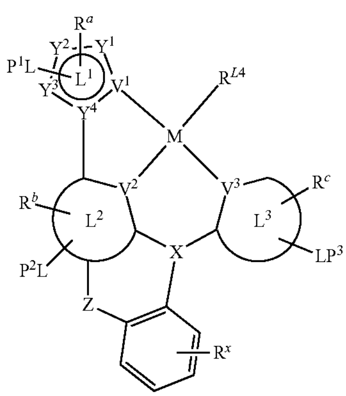

A-7

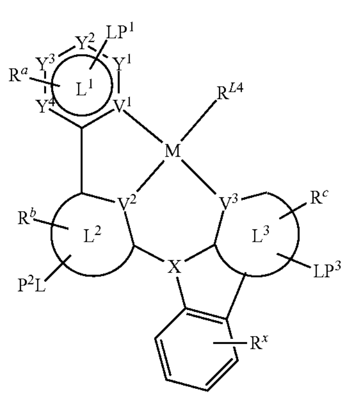

-continued

A-8

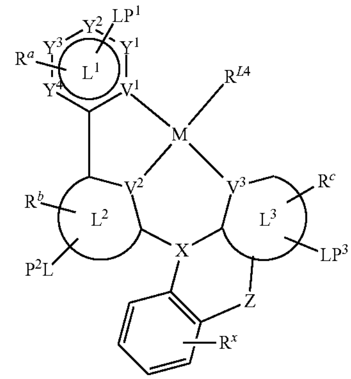

A-9

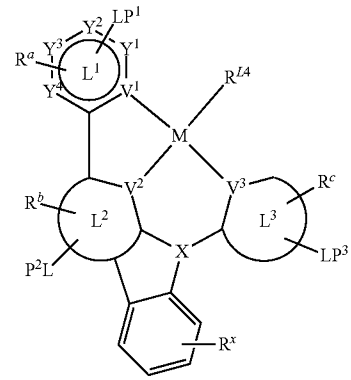

A-10

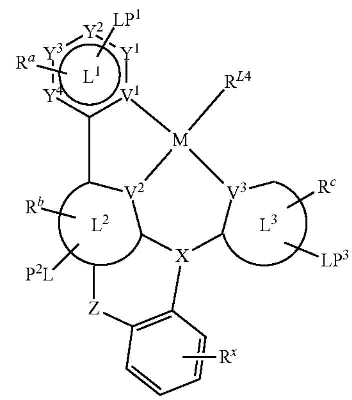

M is Pt, Pd, or Au, $L^1$ is a five-membered heterocyclyl, five-membered heteroaryl, five-membered carbene, five-membered N-heterocyclic carbene, a six-membered aryl, or six-membered heteroaryl, each of $L^2$ and $L^3$ is independently substituted or unsubstituted aryl, cycloalkyl, cycloalkenyl, heteroaryl, heterocyclyl, carbene, or N-heterocyclic carbene, $R^{L4}$ is an inorganic anion or organic anion, each of $LP^1$, $LP^2$, and $LP^3$ is independently a fluorescent luminophore, each of $LP^1$, $LP^2$, and $LP^3$ is independently present or absent, and at least one of $LP^1$, $LP^2$, or $LP^3$ is present, A is $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, each of $V^1$, $V^2$, and $V^3$ is independently N, C, P, B, or Si, each of $Y^1$, $Y^2$, $Y^3$, and $Y^4$ is independently C, N, O, S, S═O, $SO_2$, Se, Se═O, $SeO_2$, $PR^3$, $R^3P$═O, $AsR^3$, $R^3As$═O, or $BR^3$, each of $R^a$, $R^b$, and $R^c$ is independently present or absent, and if present each of $R^a$, $R^b$ and $R^c$ is independently a mono-, di-, tri-, or tetra-substitution, valency permitting, and each $R^a$, $R^b$, and $R^c$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, $R^x$ is present or absent, and if present $R^x$ is a mono-, di-, tri-, tetra-, or penta-substitution, and each $R^x$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, X is N, P, P═O, As, As═O, $CR^1$, CH, $SiR^1$, SiH, $GeR^1$, GeH, B, Bi, or Bi═O, and Z is a linking atom or a linking group, and each of $R^1$, $R^2$, and $R^3$ is independently hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, monoalkylamino, dialkylamino, monoarylamino, diarylamino, alkoxy, aryloxy, haloalkyl, aralkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted ilyl, or polymeric; or any conjugate or combination thereofIn one aspect, each of $LP^1$, $LP^2$ and $LP^3$ is independently an aromatic hydrocarbon, an aromatic hydrocarbon derivative, a polyphenyl hydrocarbon, a hydrocarbon with condensed aromatic nuclei, naphthalene, anthracene, phenanthrene, chrysene, pyrene, triphenylene, perylene, acenaphthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, arylethylene, arylacetylene, an arylacetylene derivative, a diarylethylene, a diarylpolyene, a diaryl-substituted vinylbenzene, a distyrylbenzene, a trivinylbenzene, an arylacetylene, a functional substitution product of stilbene, a five-, six- or seven-membered heterocyclic compound derivative, a furan derivative, a thiophene derivative, a pyrrole derivative, an aryl-substituted oxazole, a 1,3,4-oxadiazole, a 1,3,4-thiadiazole, an aryl-substituted 2-pyrazoline, an aryl-substituted pyrazole, a benzazole, 2H-benzotriazole, a substitution product of 2H-benzotriazole, a heterocycle with one, two or three nitrogen atoms, an oxygen-containing heterocycle, a coumarin, a coumarin derivative, a dye, an acridine dye, a xanthene dye, an oxazine, or a thiazine.

In another aspect, two or more of $R^a$ are optionally linked together, two or more of $R^b$ are optionally linked together, two or more of $R^c$ are optionally linked together, or any combination thereof.

Disclosed herein are metal-assisted delayed fluorescent and phosphorescent emitters, metal-assisted delayed fluorescent emitters or phosphorescent emitters of Formula B-I, Formula B-II, and Formula B-III:

Formula B-I

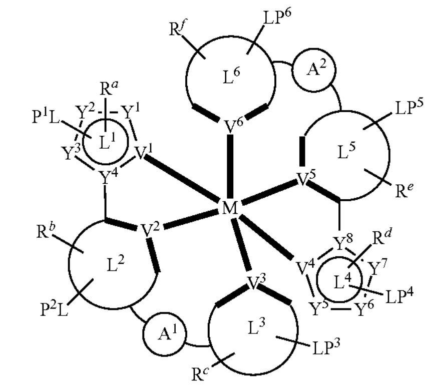

Formula B-II

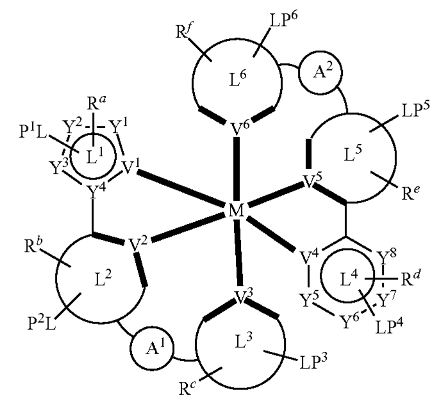

Formula B-III

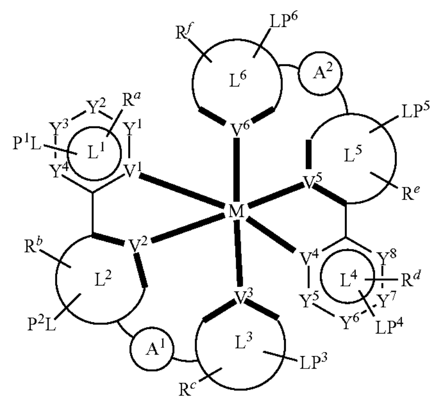

wherein:

M is Ir or Rh, each of $L^1$ and $L^4$ is independently a five-membered heterocyclyl, five-membered heteroaryl, five-membered carbene, five-membered N-heterocyclic carbene, six-membered aryl, or six-membered heteroaryl, each of $L^2$, $L^3$, $L^5$, and $L^6$ is independently substituted or unsubstituted aryl, cycloalkyl, cycloalkenyl, heteroaryl, heterocyclyl, carbene, or N-heterocyclic carbene, each of $LP^1$, $LP^2$, $LP^3$, $LP^4$, $LP^5$, and $LP^6$ is independently a fluorescent luminophore, each of $LP^1$, $LP^2$, $LP^3$, $LP^4$, $LP^5$, and $LP^6$ is independently present or absent, and at least one of $LP^1$, $LP^2$, $LP^3$, $LP^4$, $LP^5$, and $LP^6$ is present, each of $A^1$ and $A^2$ is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, and $A^1$ optionally forms more than one bond with $L^2$, $L^3$, or both, thereby forming a ring system with $L^2$, a ring system with $L^3$, or both, and $A^2$ optionally forms more than one bond with $L^5$, $L^6$, or both, thereby forming a ring system with $L^5$, a ring system with $L^6$, or both, each of $V^1$, $V^2$, $V^3$, $V^4$, $V^5$, and $V^6$ is independently N, C, P, B, or Si, each of $Y^1$, $Y^2$, $Y^3$, $Y^4$, $Y^5$, $Y^6$, $Y^7$, and $Y^8$ is independently C, N, O, S, S═O, $SO_2$, Se, Se═O, $SeO_2$, $PR^3$, $R^3P$═O, $AsR^3$, $R^3As$═O, or $BR^3$, each of $R^a$, $R^b$, $R^c$, $R^d$, $R^e$, and $R^f$ is independently present or absent, and if present each of $R^a$, $R^b$, $R^c$, $R^d$, $R^e$, and $R^f$ is independently a mono-, di-, or tri-substitution, and each $R^a$, $R^b$, $R^c$, $R^d$, $R^e$, and $R^f$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and each of $R^1$, $R^2$, and $R^3$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In some cases, the structures of Formulas B-I and B-III are symmetrical, and certain of the variables described herein are not independently selected. In one example, Formula B-I is symmetrical and $A^1=A^2$, $L^1=L^4$, $L^2=L^5$, $L^3=L^6$, $LP^1=LP^4$, $LP^2=LP^5$, $LP^3=LP^6$, $R^a=R^d$, $R^b=R^e$, $R^c=R^e$, $V^1=V^4$, $V^2=V^5$, $V^3=V^6$, $Y^1=Y^5$, $Y^2=Y^6$, $Y^3=Y^7$, and $Y^4=Y^8$. In other cases, the structures of Formulas B-I and B-III are asymmetrical.

In one aspect, each of $LP^1$, $LP^2$, $LP^3$, $LP^4$, $LP^5$, and $LP^6$ is independently an aromatic hydrocarbon, an aromatic hydrocarbon derivative, a polyphenyl hydrocarbon, a hydrocarbon with condensed aromatic nuclei, naphthalene, anthracene, phenanthrene, chrysene, pyrene, triphenylene, perylene, acenaphthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, an arylethylene derivative, an arylacetylene derivative, a diarylethylene, a diarylpolyene, a diaryl-substituted vinylbenzene, a distyrylbenzene, a trivinylbenzene, an arylacetylene, a functional substitution product of stilbene, a five-, six- or seven-membered heterocyclic compound derivative, a furan derivative, a thiophene derivative, a pyrrole derivative, an aryl-substituted oxazole, an 1,3,4-oxadiazole, an 1,3,4-thiadiazole, an aryl-substituted 2-pyrazoline, an aryl-substituted pyrazole, a benzazole, 2H-benzotriazole, a substitution product of 2H-benzotriazole, a heterocycle with one, two, or three nitrogen atoms, an oxygen-containing heterocycle, a coumarin, a coumarin derivative, a dye, an acridine dye, a xanthene dye, an oxazine, or a thiazine.

In another aspect, two or more of $R^a$ are optionally linked together, two or more of $R^b$ are optionally linked together, two or more of $R^e$ are optionally linked together, two or more of $R^d$ are optionally linked together, two or more of $R^e$ are optionally linked together, two or more of $R^f$ are optionally linked together, or any combination thereof.

The metal-assisted delayed fluorescent and phosphorescent emitters, metal-assisted delayed fluorescent emitters or phosphorescent emitters of Formula B-I, Formula B-II, and Formula B-III may have the structure of any of symmetrical formulas B-1-B-10 or asymmetrical formulas B-11-B-65:

B-1

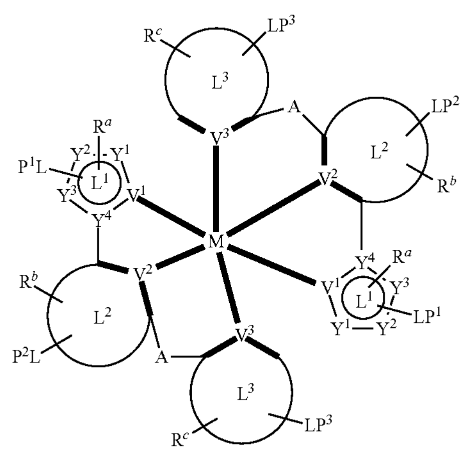

B-2

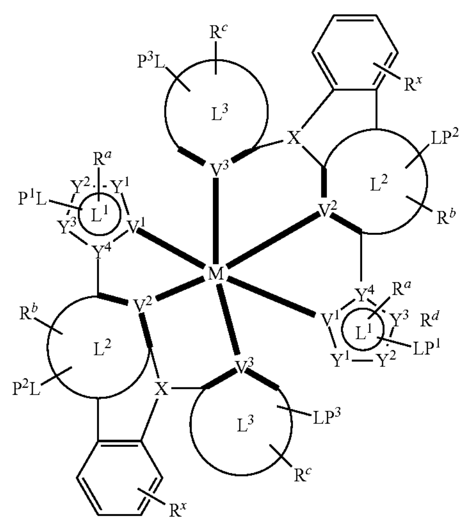

-continued
B-3
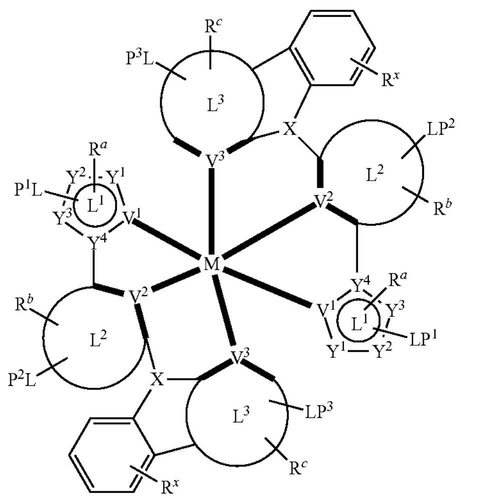
B-4
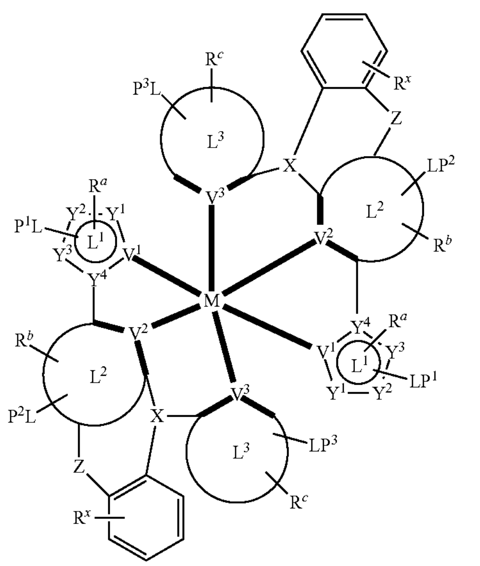
B-5
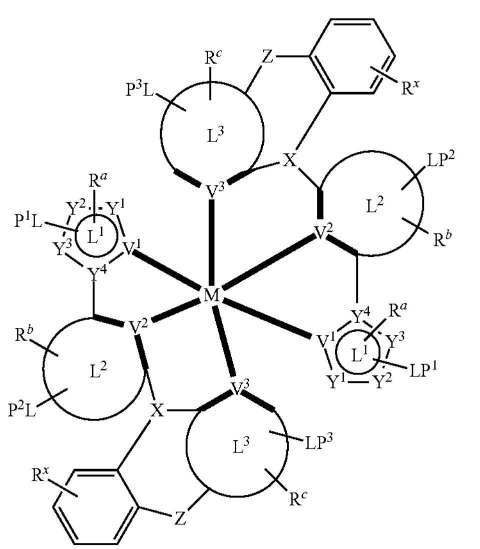
-continued
B-6
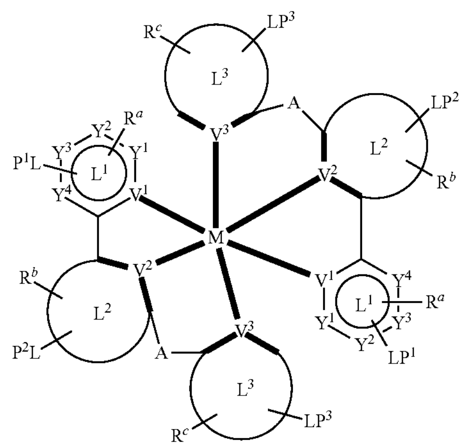
B-7
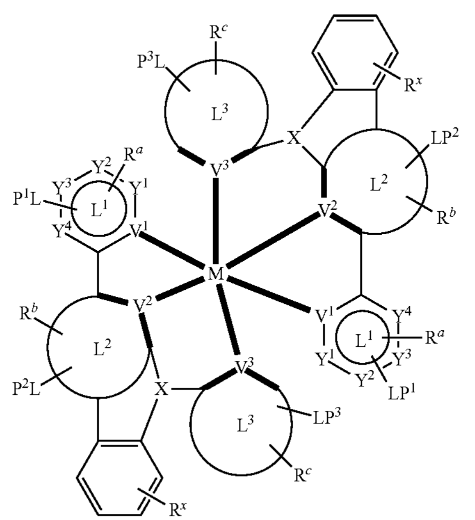
B-8
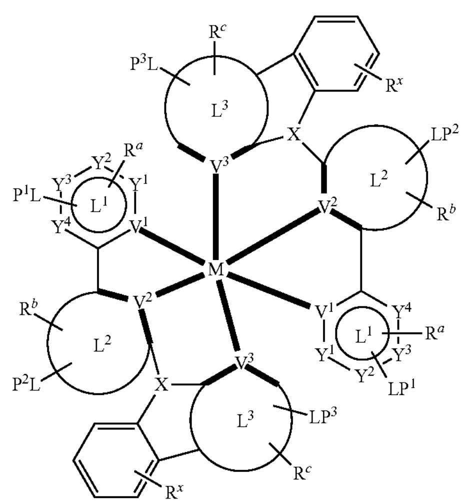

-continued
B-9
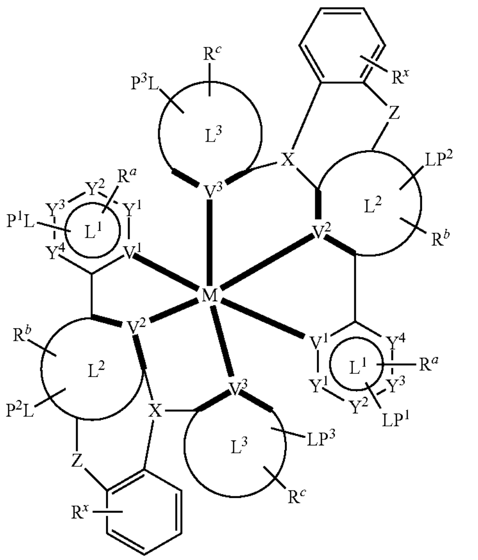
B-10
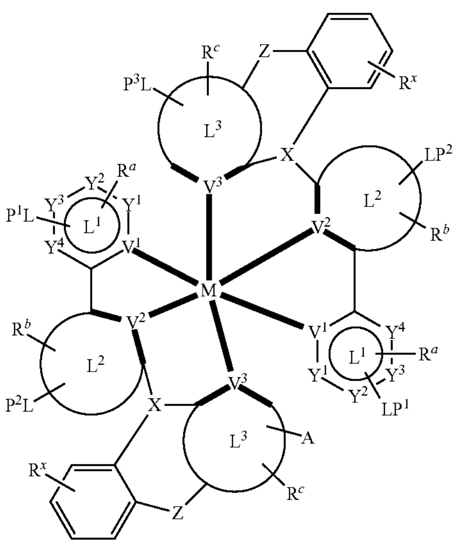
B-11
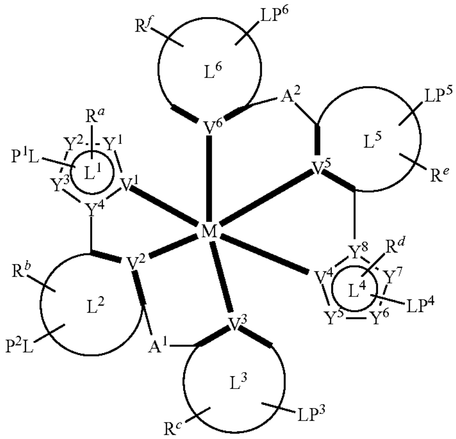
-continued
B-12
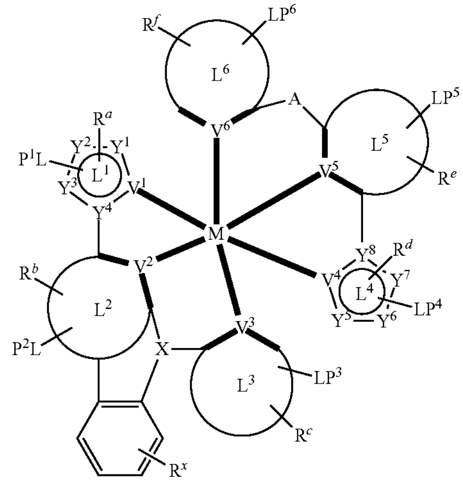
B-13
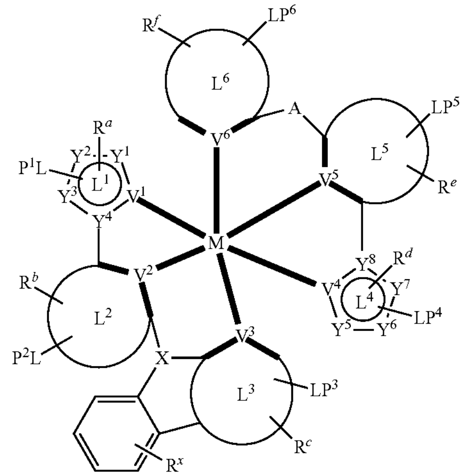
B-14
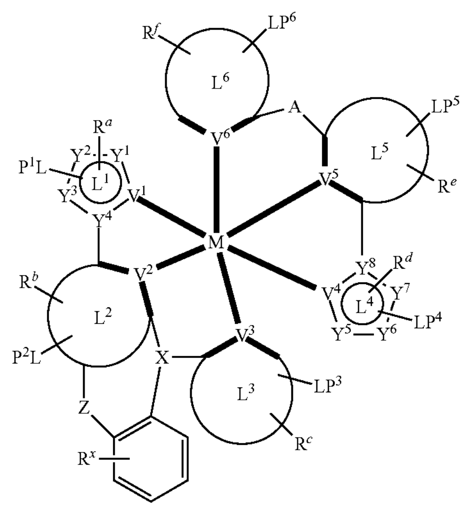

-continued
B-15
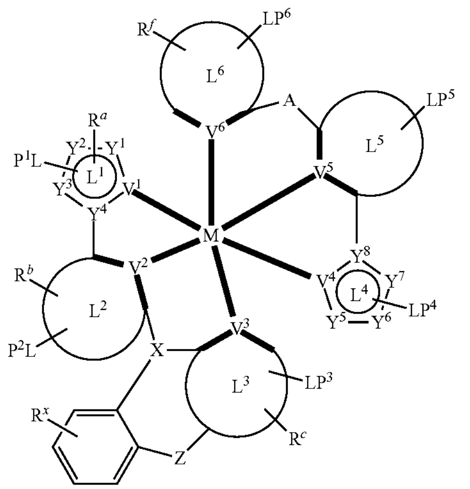
B-16
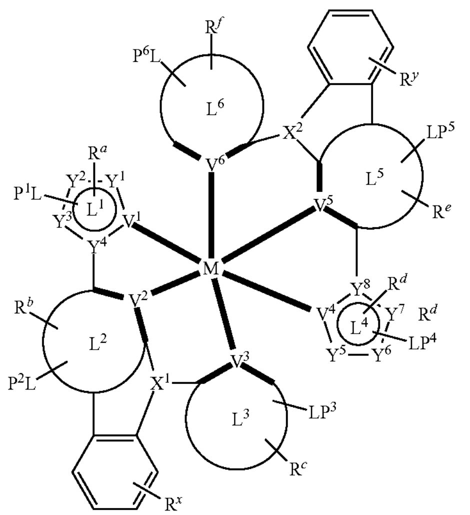
B-17
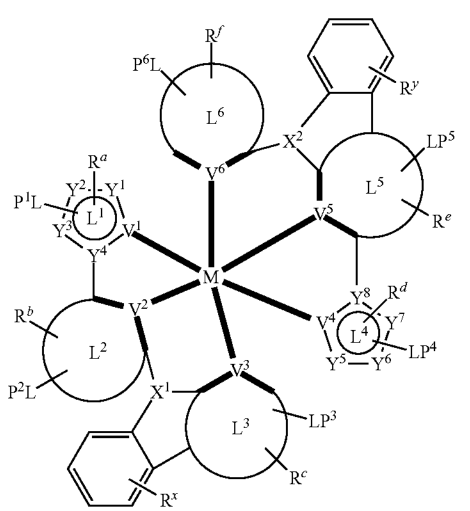
-continued
B-18
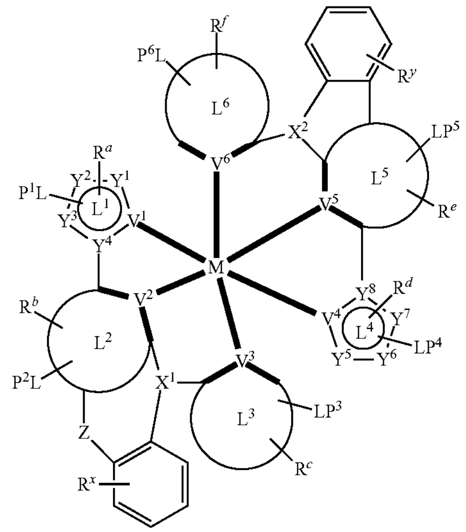
B-19
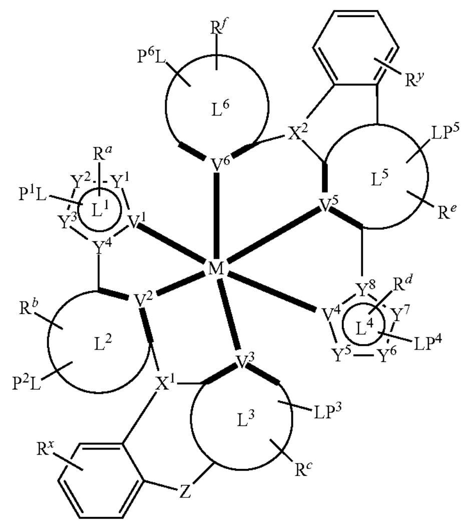
B-20
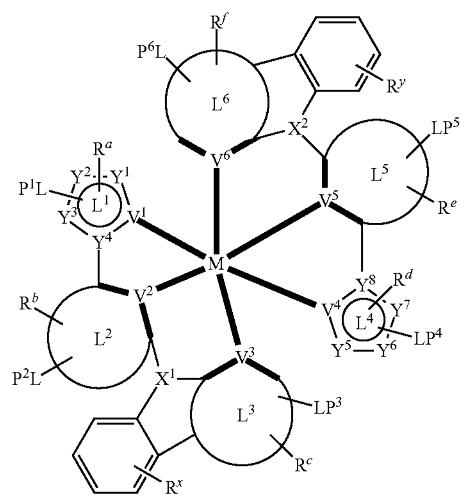

B-21
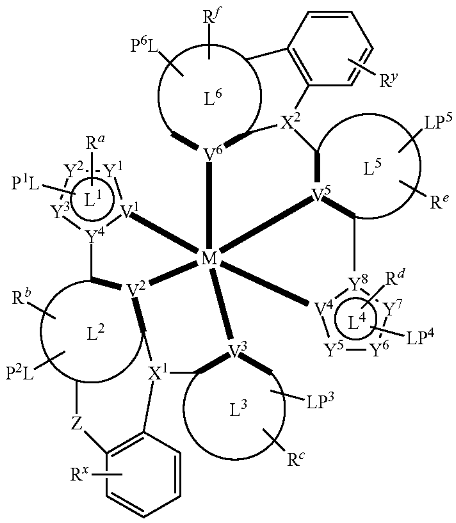
B-22
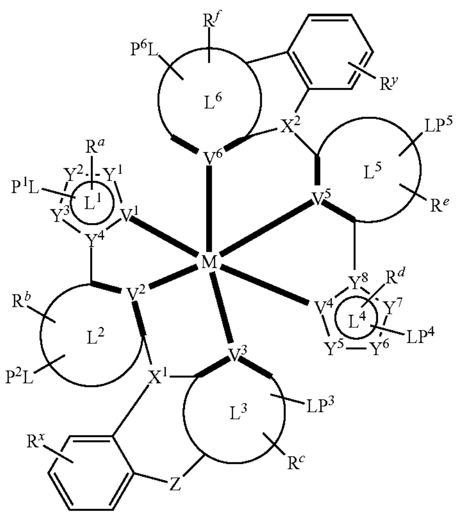
B-23
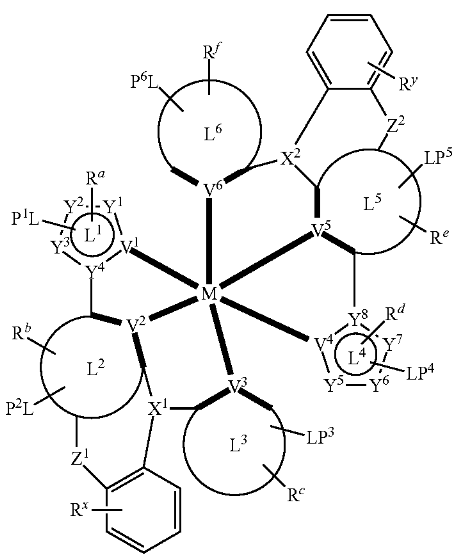
B-24
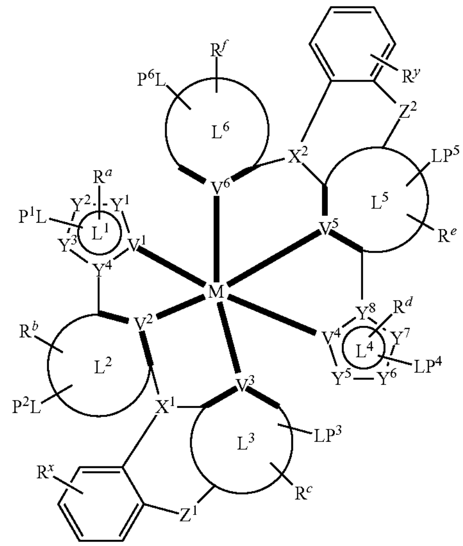
B-25
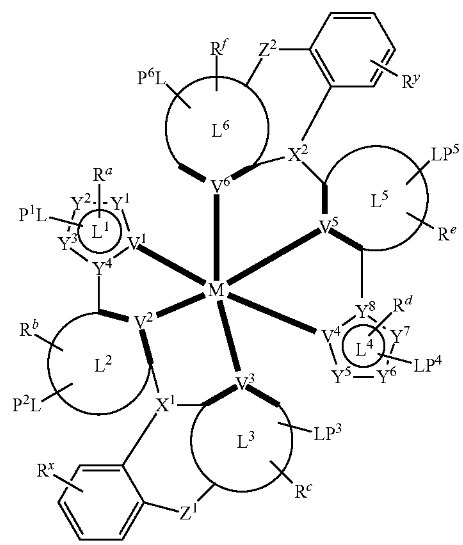
B-26
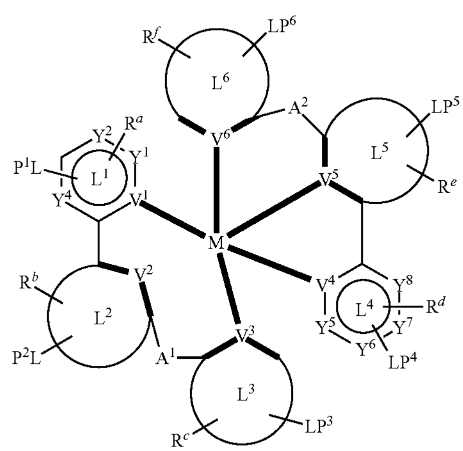

-continued
B-27
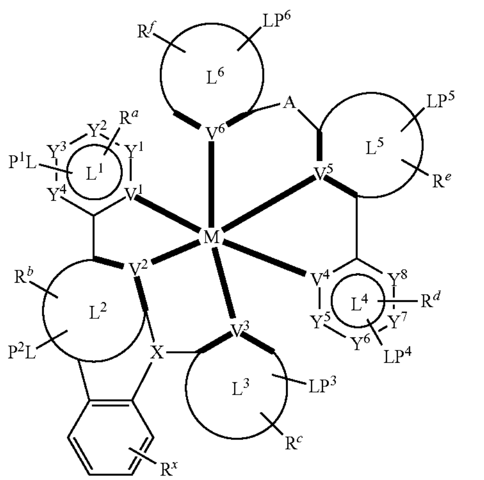
B-28
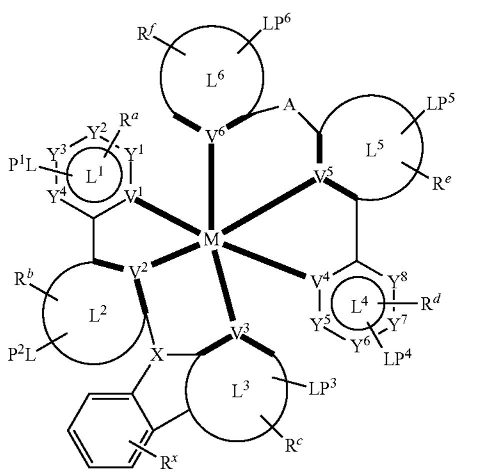
B-29
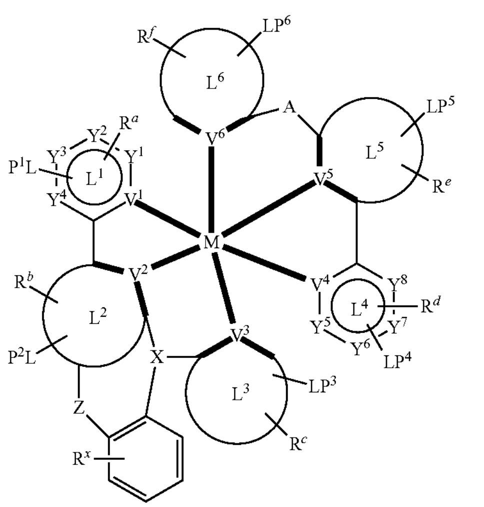
-continued
B-30
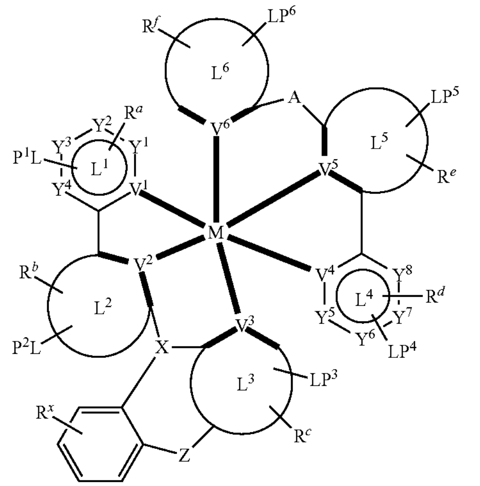
B-31
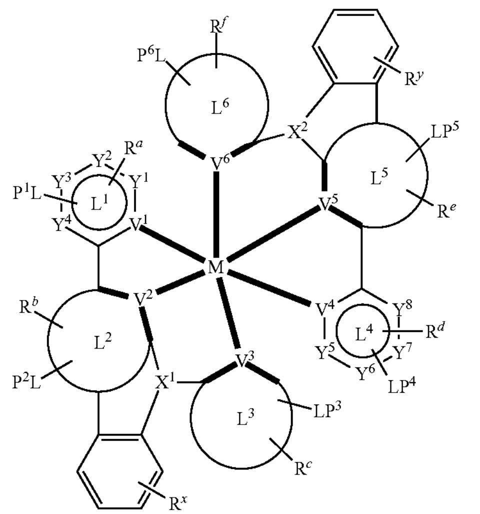
B-32
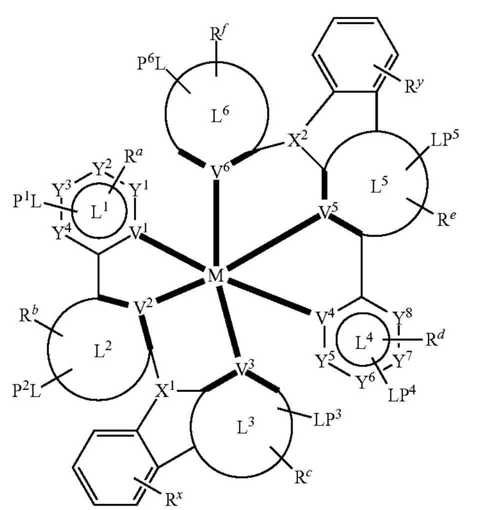

-continued
B-33
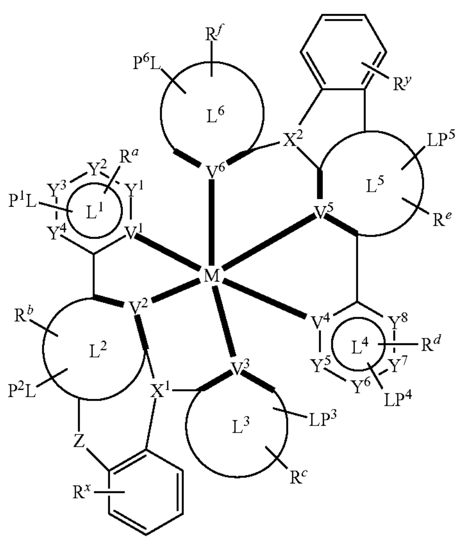
B-34
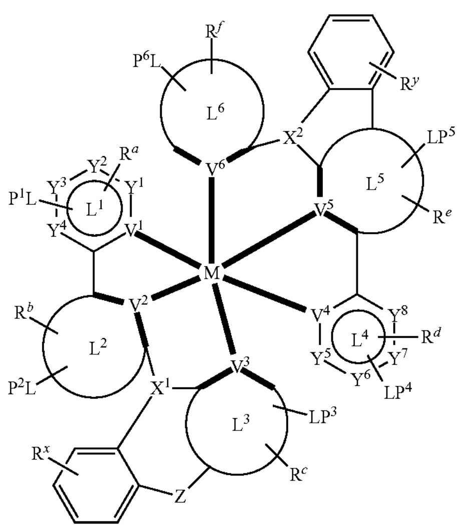
B-35
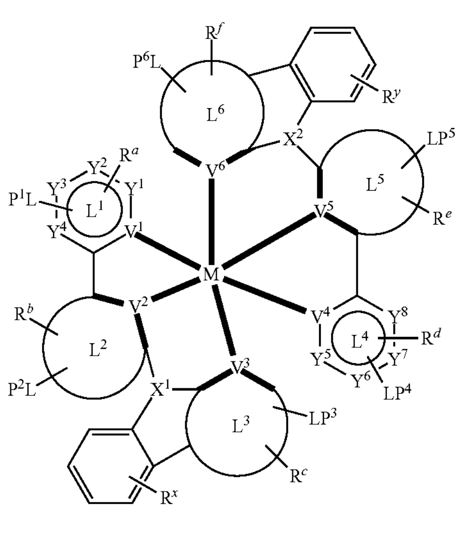
-continued
B-36
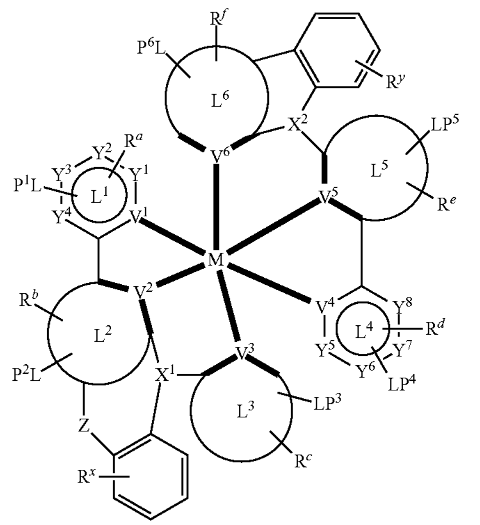
B-37
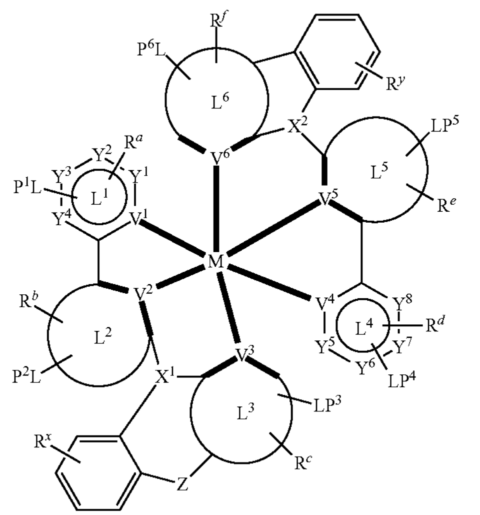
B-38
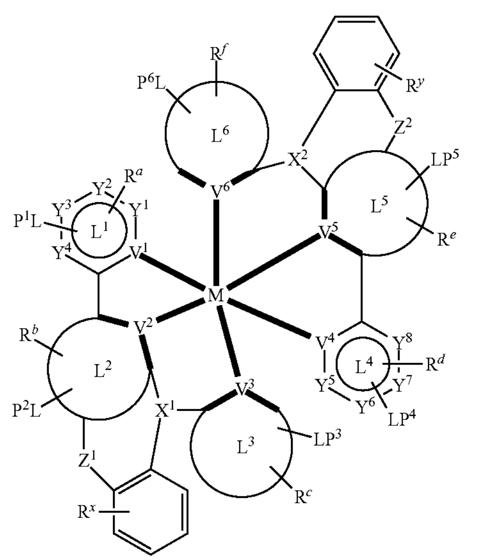

-continued
B-39
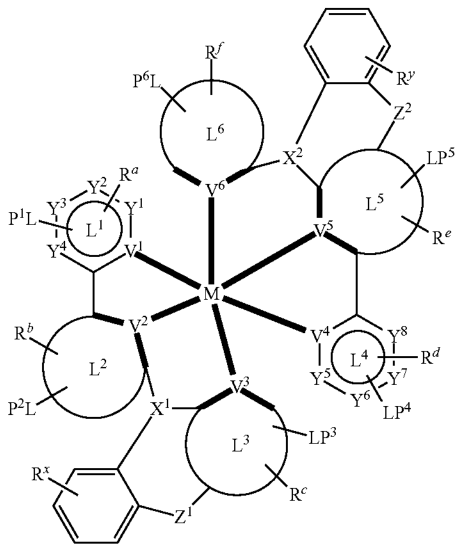
B-40
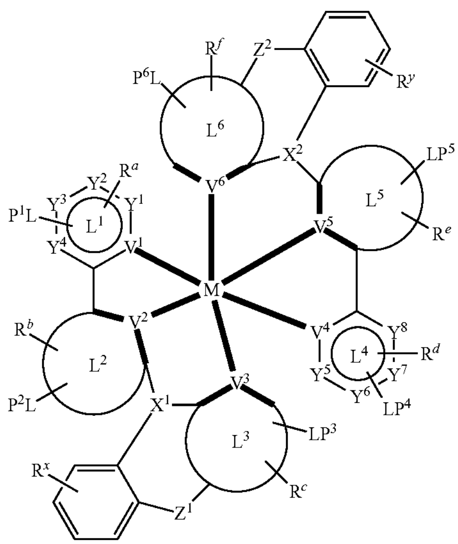
B-41
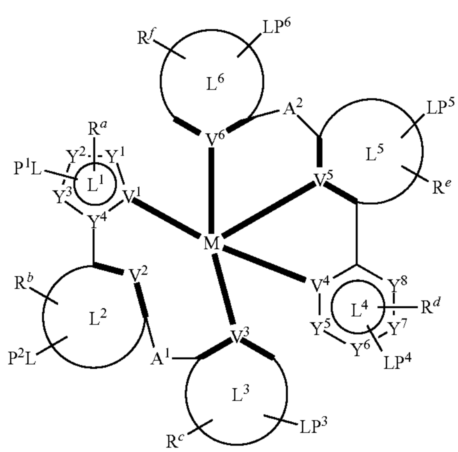
-continued
B-42
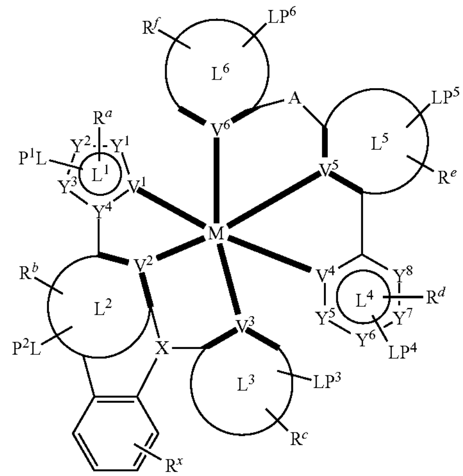
B-43
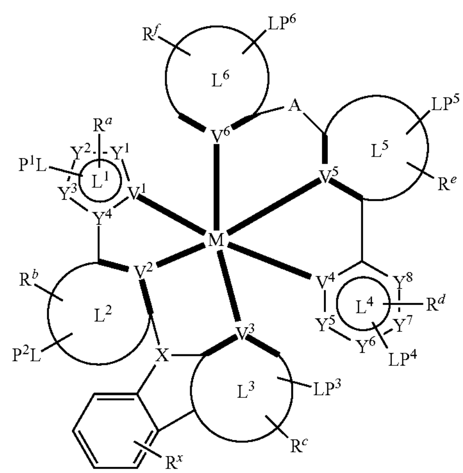
B-44
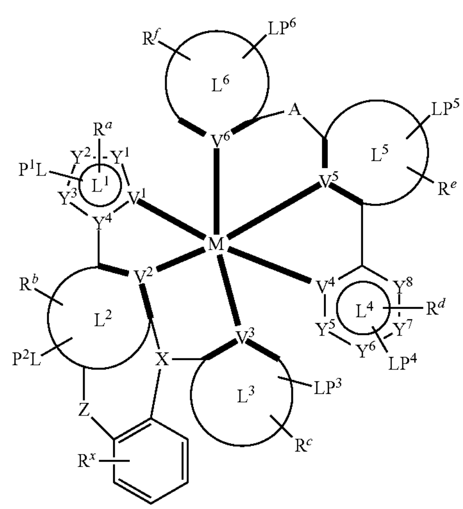

-continued
B-45
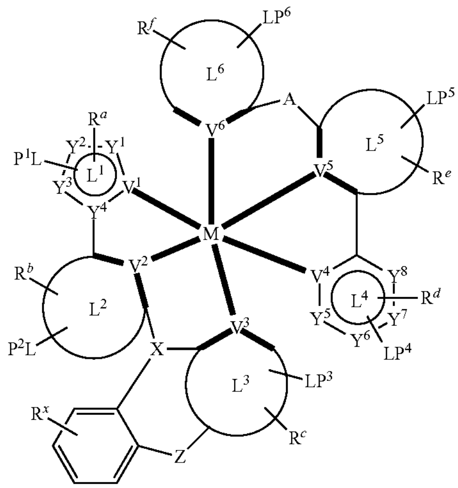
B-46
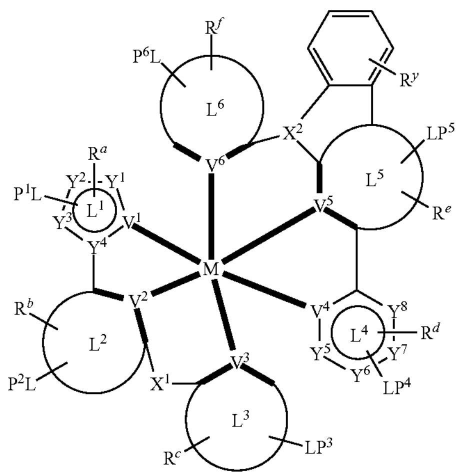
B-47
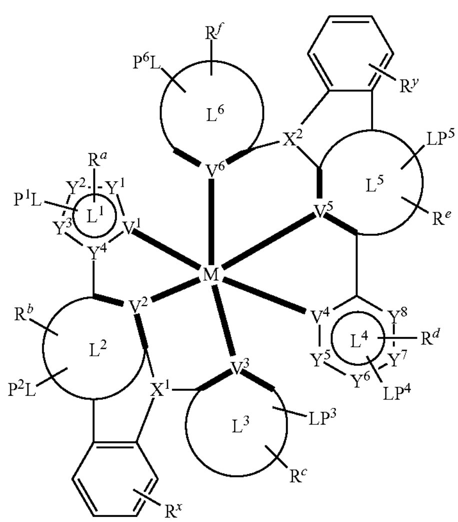
-continued
B-48
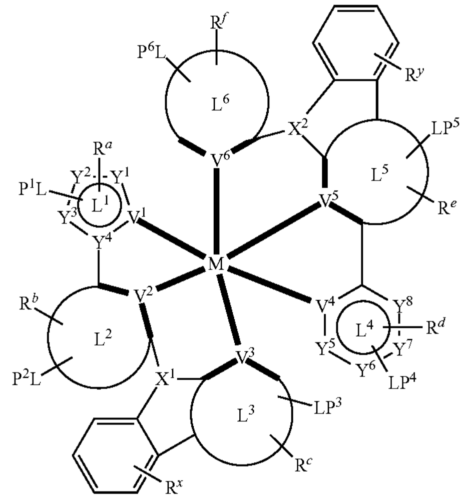
B-49
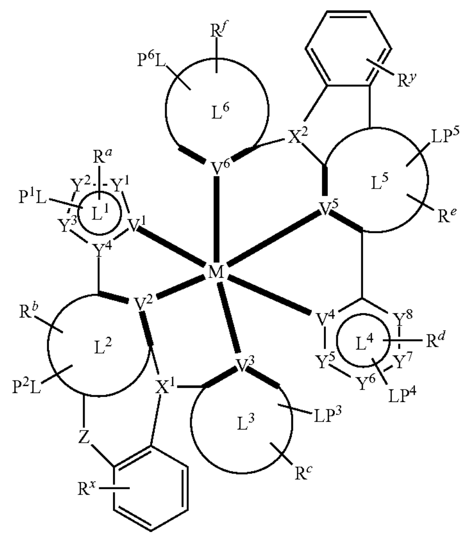
B-50
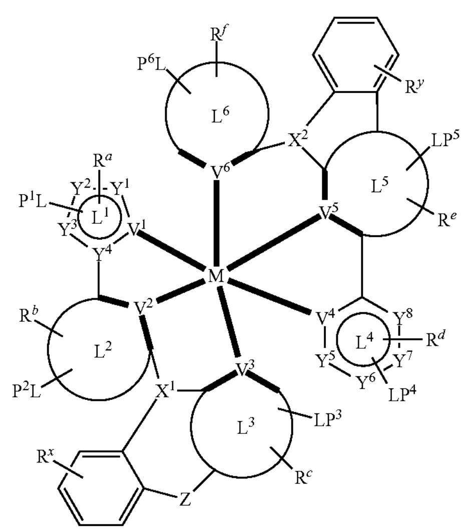

-continued
B-51
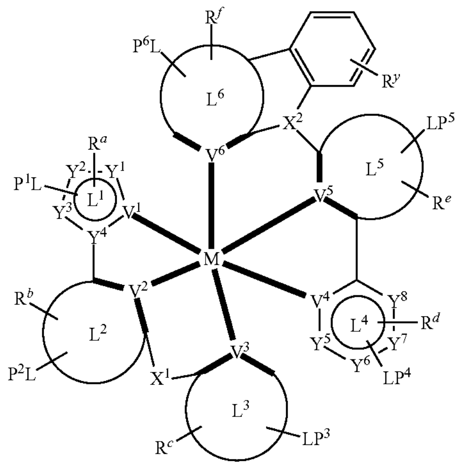
B-52
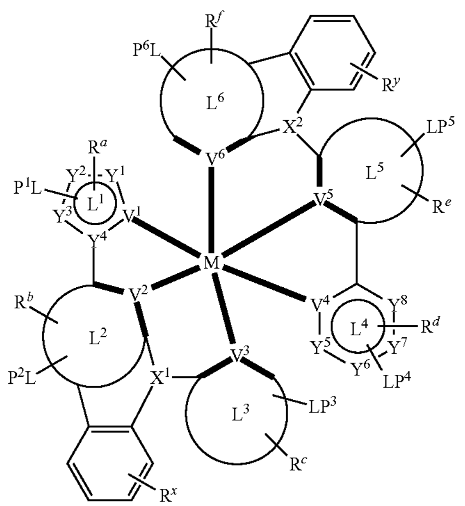
B-53
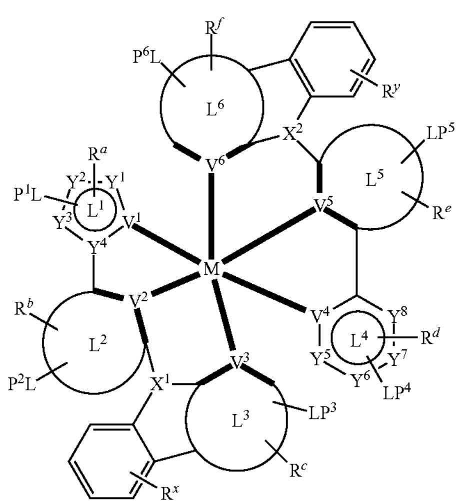
-continued
B-54
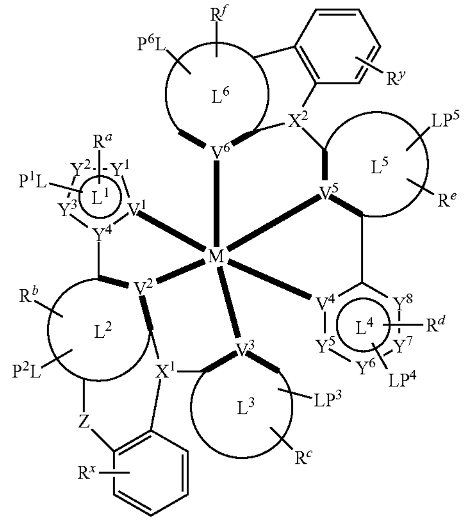
B-55
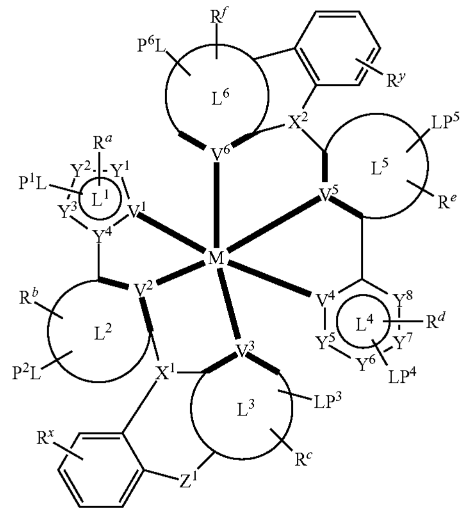
B-56
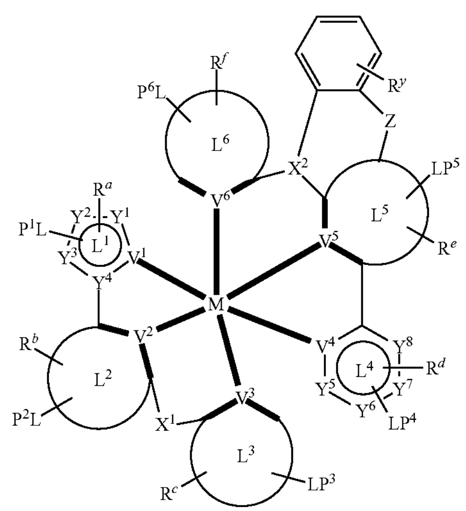

B-57
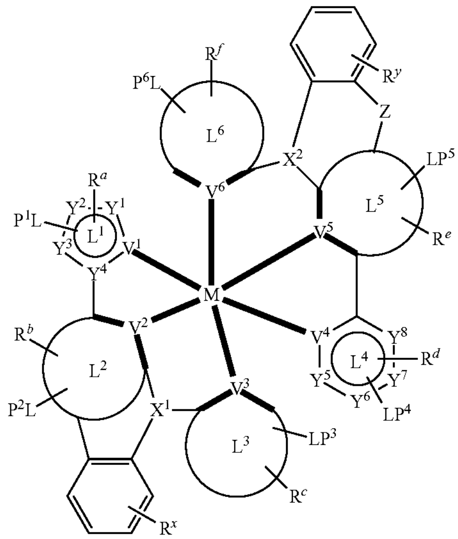
B-58
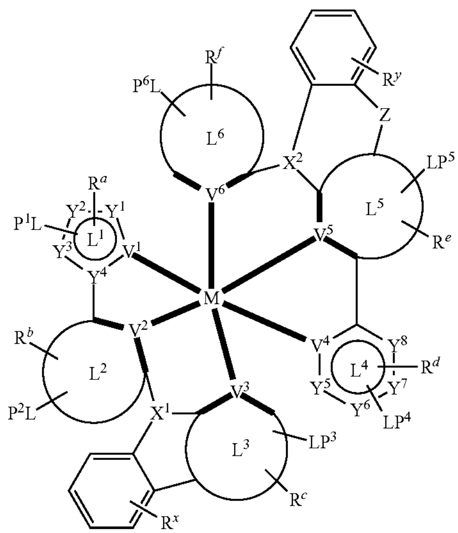
B-59
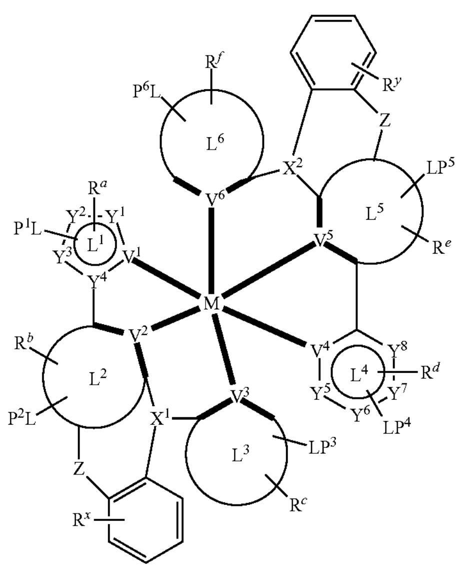
B-60
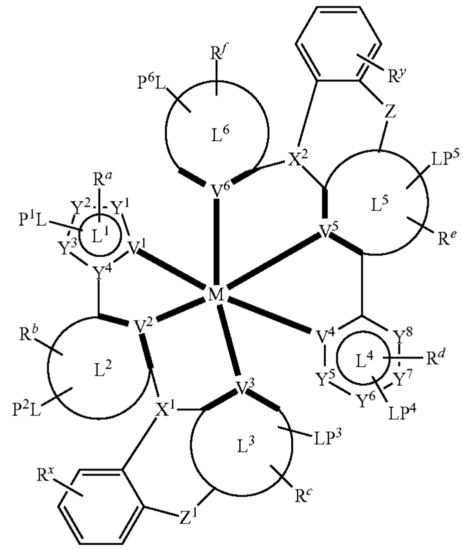
B-61
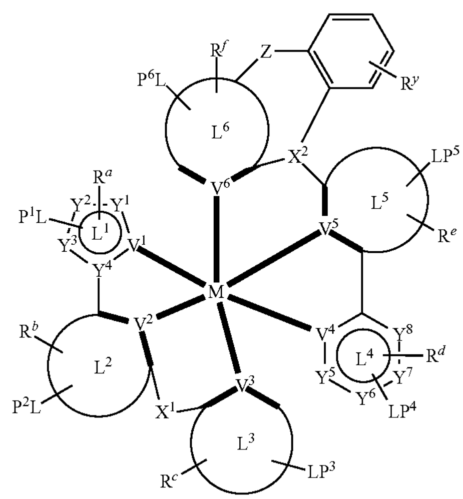
B-62
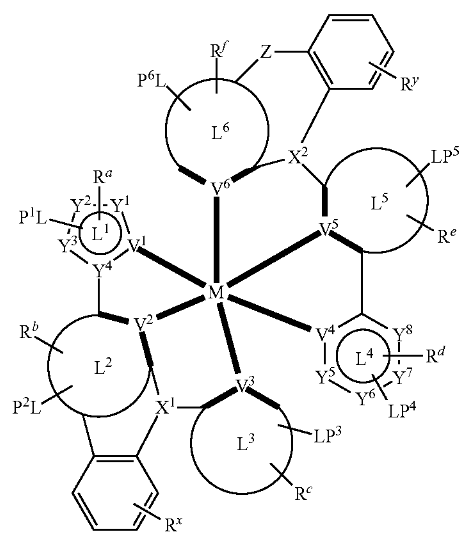

-continued

B-63

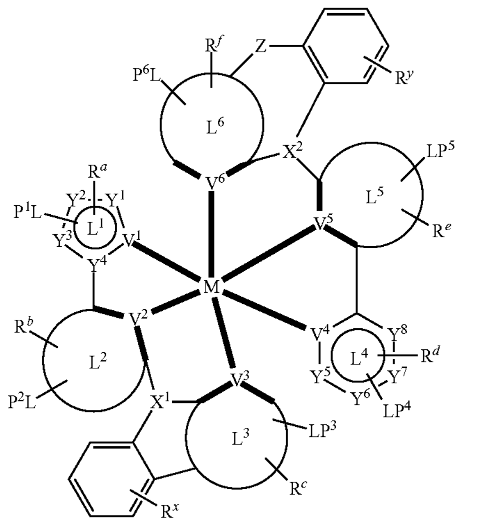

B-64

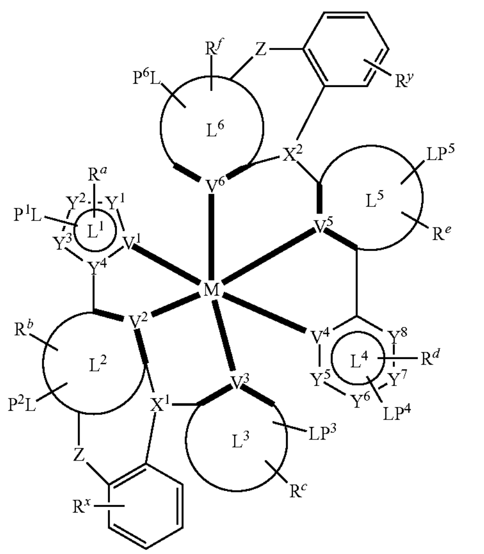

B-65

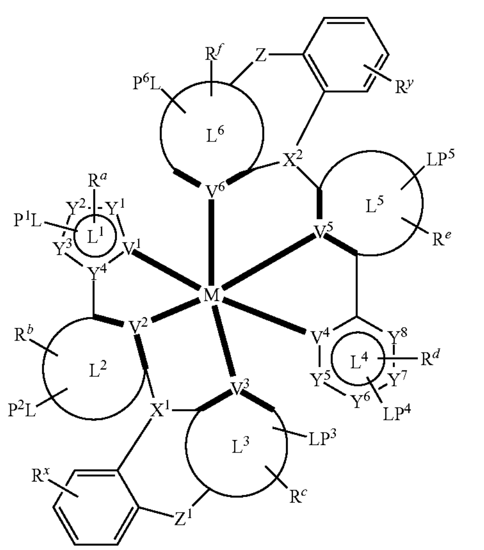

wherein Formulas B-1 through B-10 are symmetrical, and for Formulas B-1 through B10:

M is Ir or Rh, $L^1$ and $L^4$ are five-membered heterocyclyl, five-membered heteroaryl, five-membered carbene, five-membered N-heterocyclic carbene, six-membered aryl, or six-membered heteroaryl, each of $L^2$ and $L^3$ is independently substituted or unsubstituted aryl, cycloalkyl, cycloalkenyl, heteroaryl, heterocyclyl, carbene, or N-heterocyclic carbene, each of $LP^1$, $LP^2$, and $LP^3$ is independently a fluorescent luminophore, each of $LP^1$, $LP^2$, and $LP^3$ is independently present or absent, and at least one of $LP^1$, $LP^2$, and $LP^3$ is present, A is $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, each of $V^1$, $V^2$, and $V^3$ is independently N, C, P, B, or Si, each of $Y^1$, $Y^2$, $Y^3$, and $Y^4$ is independently C, N, O, S, S═O, $SO_2$, Se, Se═O, $SeO_2$, $PR^3$, $R^3P$═O, $AsR^3$, $R^3As$═O, or $BR^3$, each of $R^a$, $R^b$, and $R^c$ is independently present or absent, and if present each of $R^a$, $R^b$, and $R^c$ is independently a mono-, di-, or tri-substitution, and each $R^a$, $R^b$, and $R^c$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, each of $R^1$, $R^2$, and $R^3$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, X is N, P, P═O, As, As═O, $CR^1$, CH, $SiR^1$, SiH, $GeR^1$, GeH, B, Bi, or Bi═O, each of Z is a linking atom or linking group, and $R^x$ is present or absent, and if present each $R^x$ is a mono-, di-, tri-, or tetra-substitution, and each $R^x$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof;

wherein Formulas B-11 through B-65 are asymmetrical, and for Formulas B-11 through B-65:

M is Ir or Rh, each of $L^1$ and $L^4$ is independently a five-membered heterocyclyl, five-membered heteroaryl, five-membered carbene, five-membered N-heterocyclic carbene, six-membered aryl, or six-membered heteroaryl, each of $L^2$, $L^3$, $L^5$, and $L^6$ is independently substituted or unsubstituted aryl, cycloalkyl, cycloalkenyl, heteroaryl, heterocyclyl, carbene, or N-heterocyclic carbene, each of $LP^1$, $LP^2$, $LP^3$, $LP^4$, $LP^5$, and $LP^6$ is independently a fluorescent luminophore, each of $LP^1$, $LP^2$, $LP^3$, $LP^4$, $LP^5$, and $LP^6$ is independently present or absent, and at least one of $LP^1$, $LP^2$, $LP^3$, $LP^4$, $LP^5$, and $LP^6$ is present, each of A, $A^1$, and $A^2$ is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, each of $V^1$, $V^2$, $V^3$, $V^4$, $V^5$, and $V^6$ is independently N, C, P, B, or Si, each of $Y^1$, $Y^2$, $Y^3$, $Y^4$, $Y^5$, $Y^6$, $Y^7$ and $Y^8$ is independently C, N, O, S, S═O, $SO_2$, Se, Se═O, $SeO_2$, $PR^3$, $R^3P$═O, $AsR^3$, $R^3As$═O, or $BR^3$, each of $R^a$, $R^b$, $R^c$, $R^d$, $R^e$, and $R^f$ is independently present or absent, and if present each of $R^a$, $R^b$, $R^c$, $R^d$, $R^e$, and $R^f$ is independently a mono-, di-, tri-, or tetra-substitution, and each $R^a$, $R^b$, $R^c$, $R^d$, $R^e$, and $R^f$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, each of $R^1$, $R^2$, and $R^3$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, each of X, $X^1$, and $X^2$ is independently N, P, P═O, As, As═O, CW, CH, $SiR^1$, SiH, $GeR^1$, GeH, B, Bi, or Bi═O, each of Z, $Z^1$, and $Z^2$ is a linking atom or linking group, and each of $R^x$ and $R^y$ is independently present or absent, and if present each of $R^x$ and $R^y$ is a mono-, di-, tri-, or tetra-substitution, and each $R^x$ and $R^y$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one aspect, each of $LP^1$, $LP^2$, $LP^3$, $LP^4$, $LP^5$ and $LP^6$ is independently an aromatic hydrocarbon, an aromatic hydrocarbon derivative, a polyphenyl hydrocarbon, a hydrocarbon with condensed aromatic nuclei, naphthalene, anthracene, phenanthrene, chrysene, pyrene, triphenylene, perylene, acenaphthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, an arylethylene derivative, an arylacetylene derivative, a diarylethylene, a diarylpolyene, a diaryl-substituted vinylbenzene, a distyrylbenzene, a trivinylbenzene, an arylacetylene, a functional substitution product of stilbene, a five-, six- or seven-membered heterocyclic compound derivative, a furan derivative, a thiophene derivative, a pyrrole derivative, an aryl-substituted oxazole, an 1,3,4-oxadiazole, an 1,3,4-thiadiazole, an aryl-substituted 2-pyrazoline, an aryl-substituted pyrazole, a benzazole, 2H-benzotriazole, a substitution product of 2H-benzotriazole, a heterocycle with one, two, or three nitrogen atoms, an oxygen-containing heterocycle, a coumarin, a coumarin derivative, a dye, an acridine dye, a xanthene dye, an oxazine, or a thiazine.

In another aspect, two or more of $R^a$ are optionally linked together, two or more of $R^b$ are optionally linked together, two or more of $R^c$ are optionally linked together, two or more of $R^d$ are optionally linked together, two or more of $R^e$ are optionally linked together, two or more of $R^f$ are optionally linked together, or any combination thereof.

In one aspect, for any of the formulas depicted in this disclosure, $M\text{-}R^{L4}$ represents one or more of the following structures, where R" is an organic or inorganic anion:

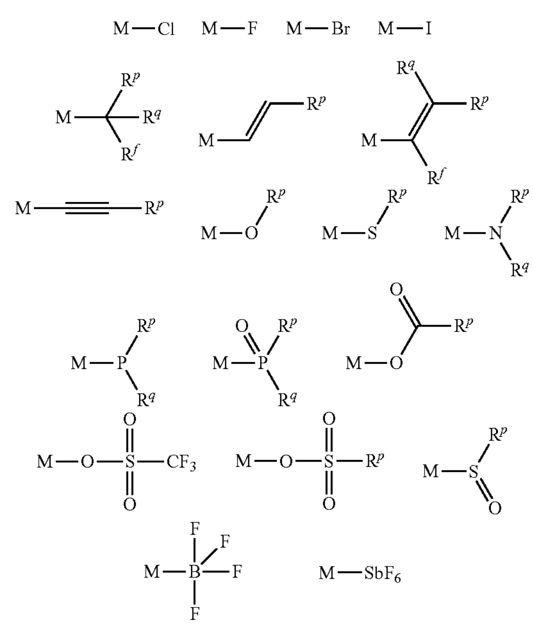

wherein each of $R^p$, $R^q$, and $R^r$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In some cases, two or more of $R^p$ are optionally linked together, two or more of $R^q$ are optionally linked together, two or more of $R^r$ are optionally linked together, or any combination thereof.

In one aspect, for any of the formulas depicted in this disclosure, each of

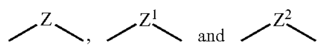

(also denoted as Z, $Z^1$, and $Z^2$ herein) is independently one or more of the following structures:

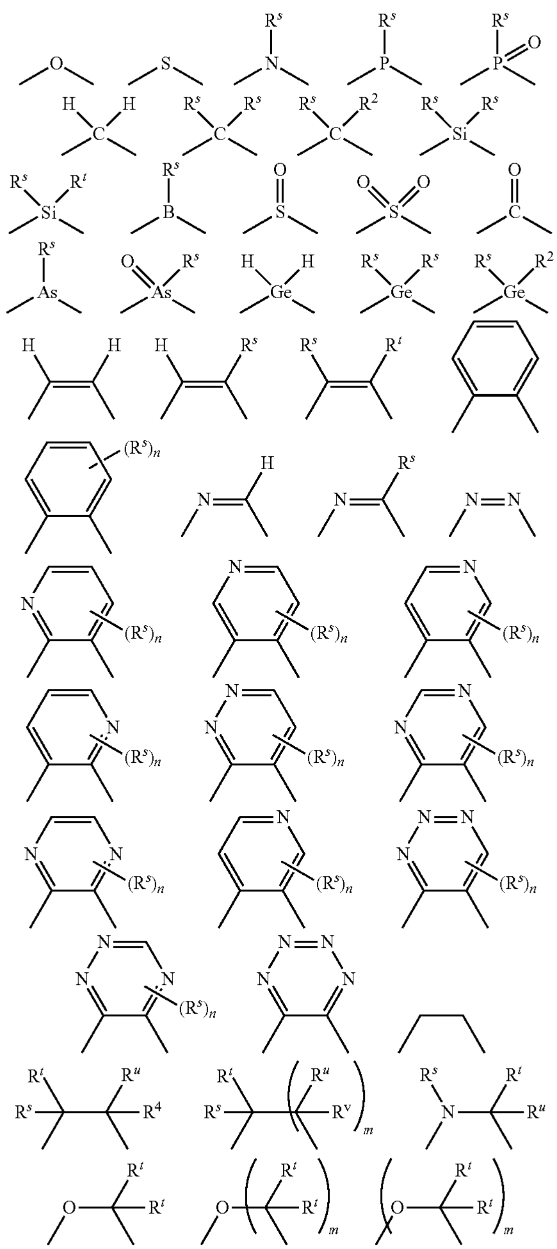

-continued

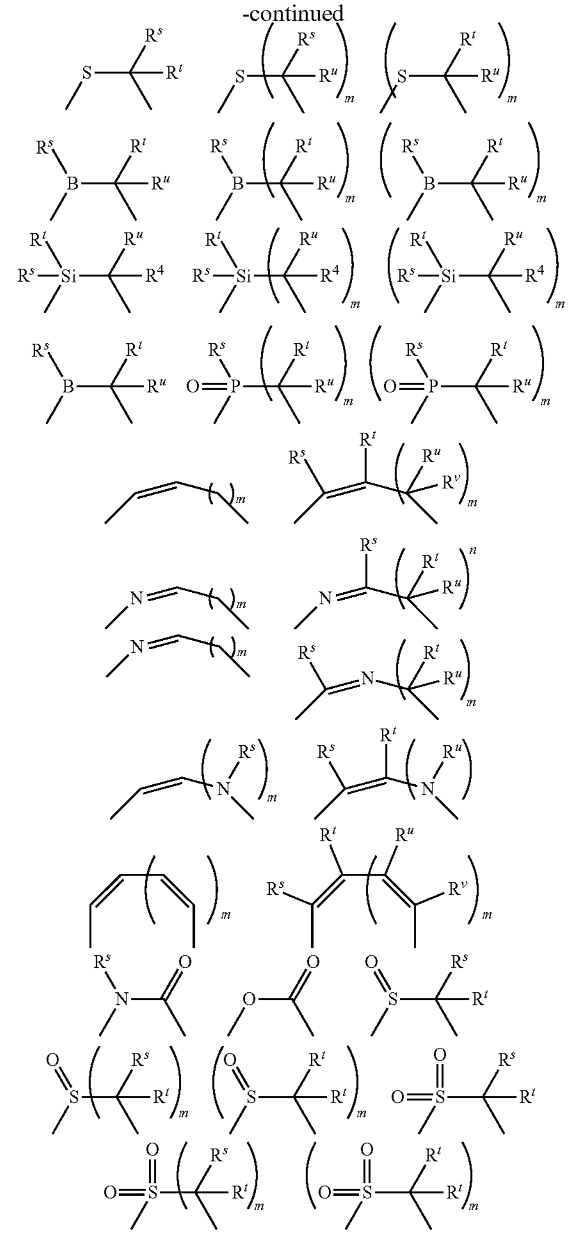

wherein:

n is an integer from 0 to 4, m is an integer from 1 to 3, each of $R^s$, $R^t$, $R^u$, and $R^v$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one aspect, for any of the formulas depicted in this disclosure, each five-membered heterocyclyl

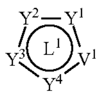 and 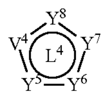

independently represents one of the following structures:

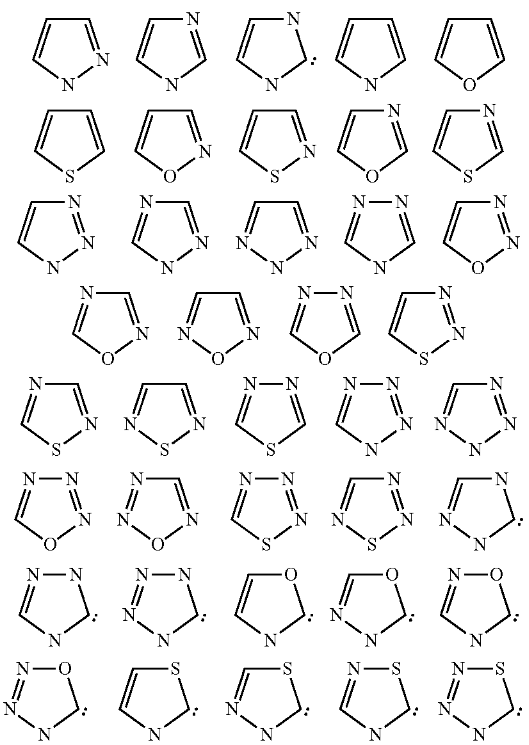

One or more of each of $R^a$ and $R^d$ may be independently bonded to

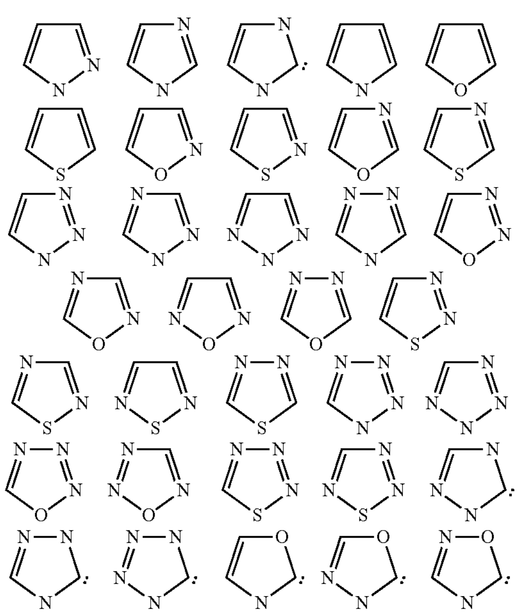

-continued

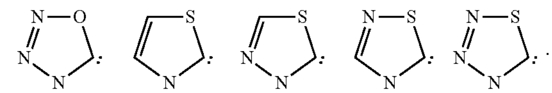

In another aspect, for any of the formulas depicted in this disclosure, each six-membered heterocyclyl

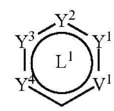 and 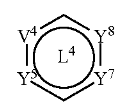

independently represents one of the following structures:

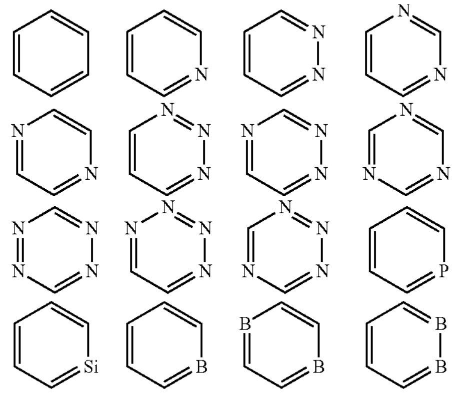

One or more of each of $R^a$ and $R^d$ may be independently bonded to

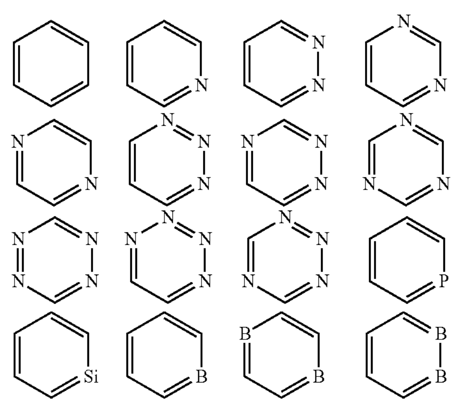

In one aspect, for any of the formulas depicted in this disclosure, each of

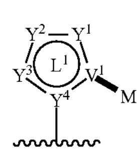 and 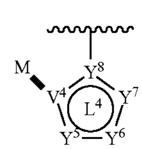

independently represents one of the following structures:
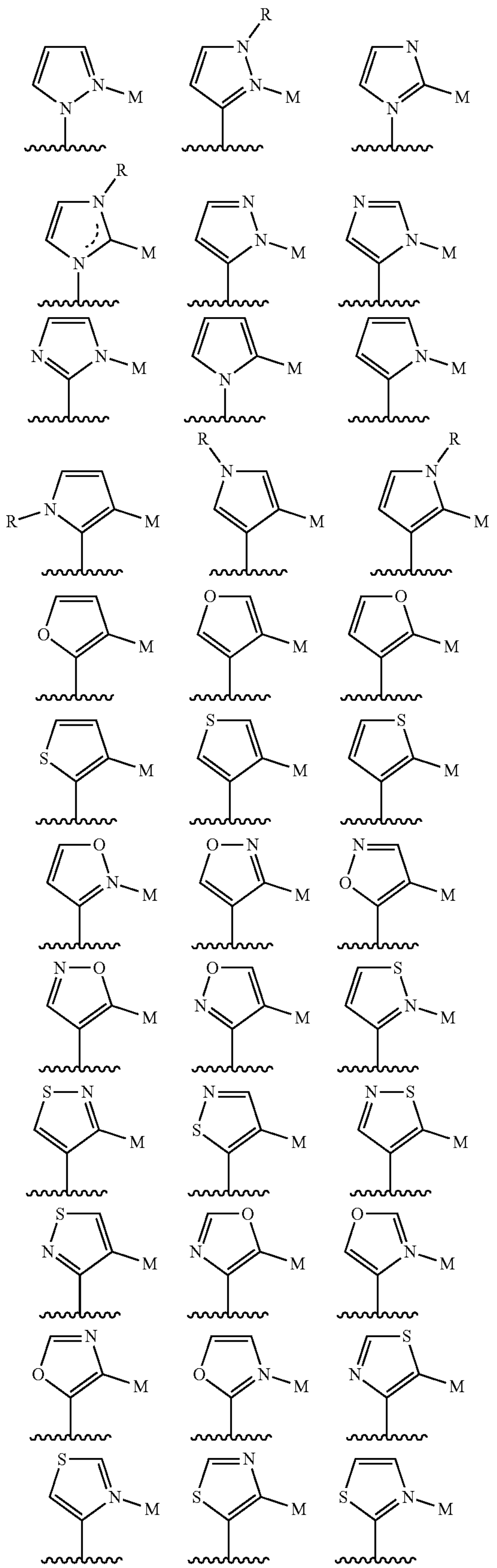
-continued
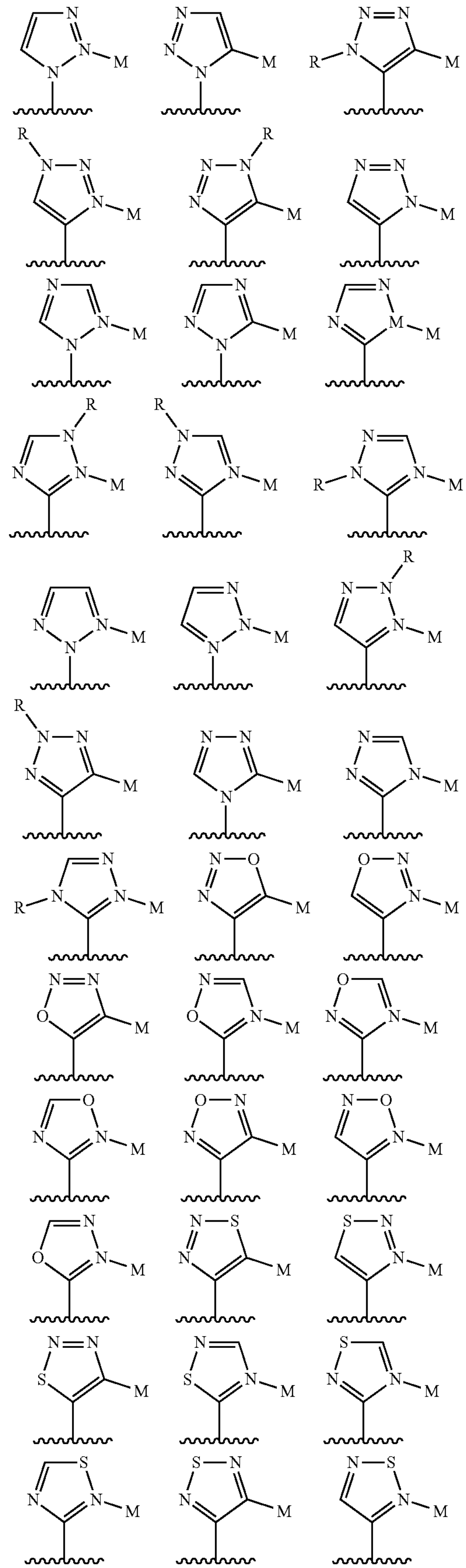

-continued

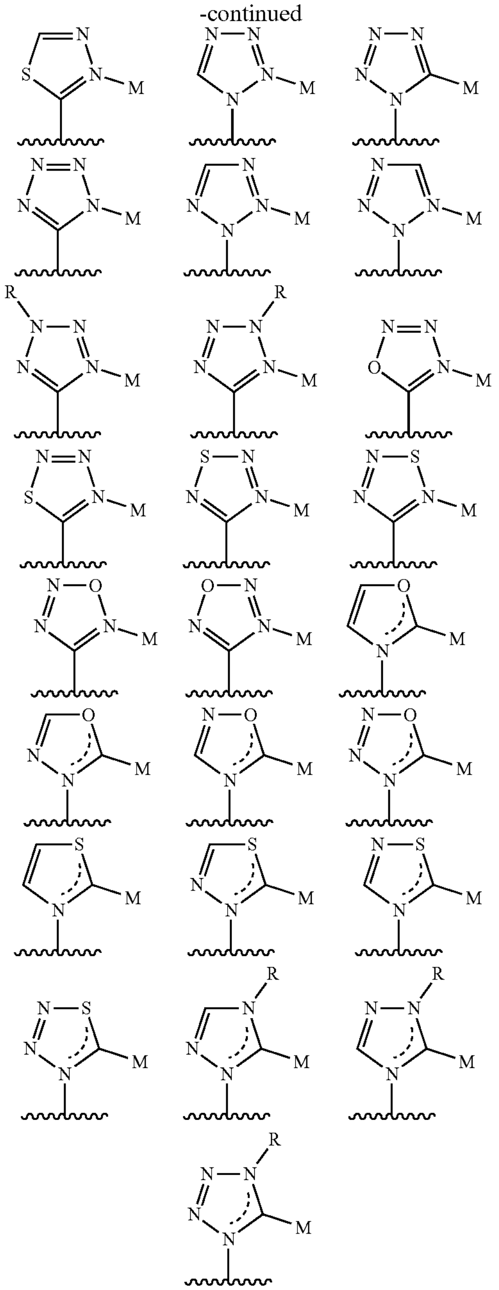

wherein R is hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one aspect, for any of the formulas depicted in this disclosure, each of

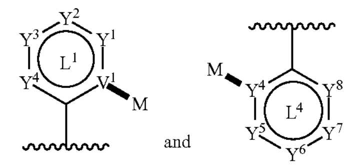

independently represents:

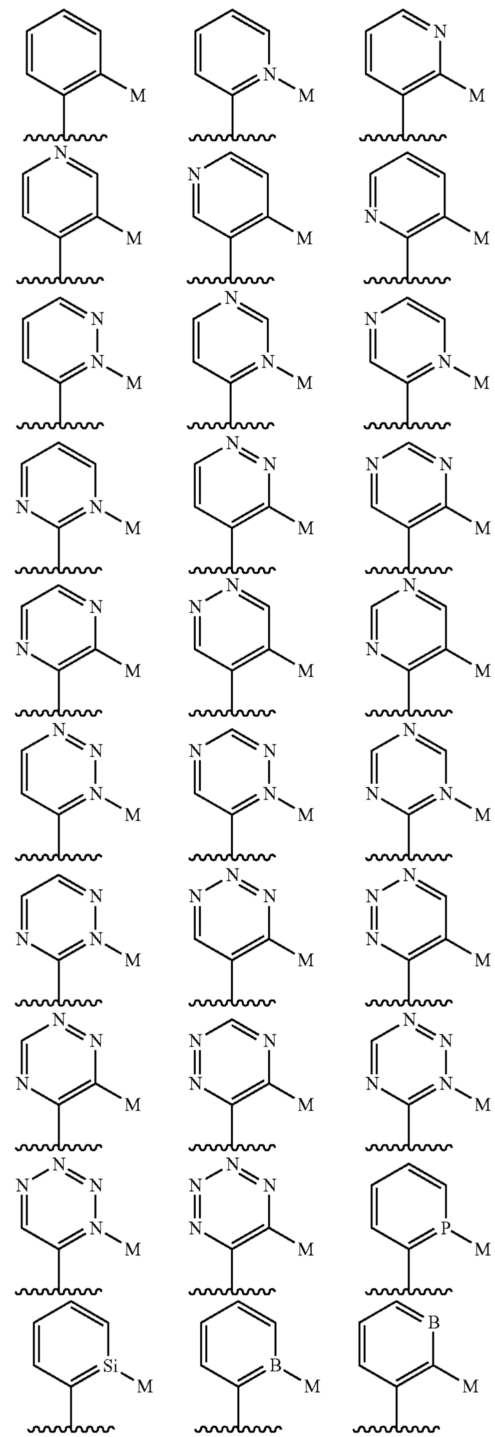

-continued
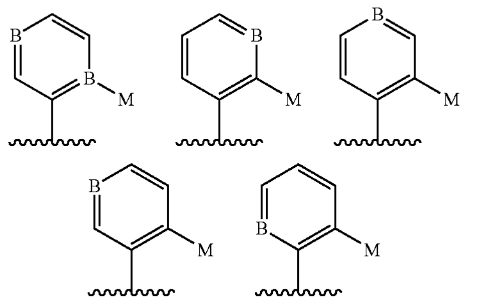
In one aspect, for any of the formulas depicted in this disclosure, each of
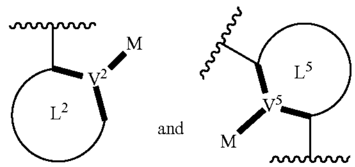
independently represents:
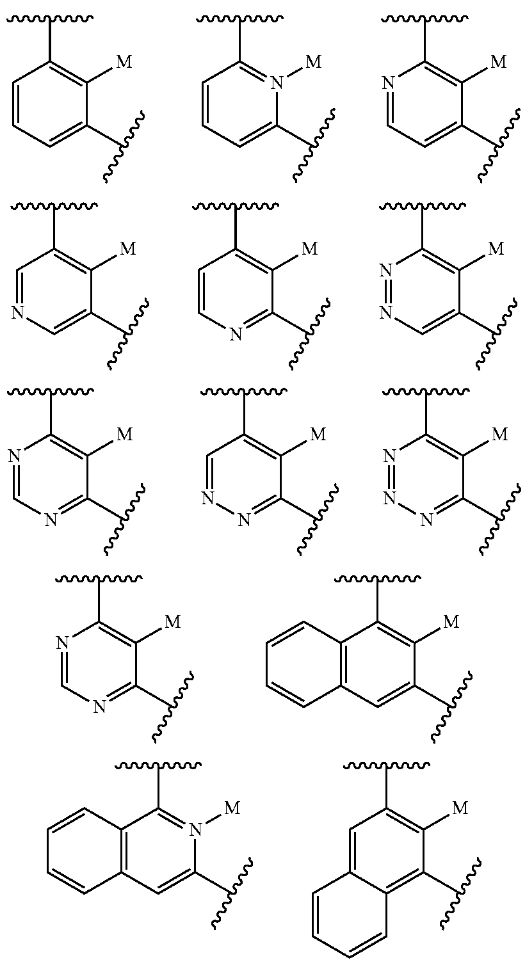
-continued
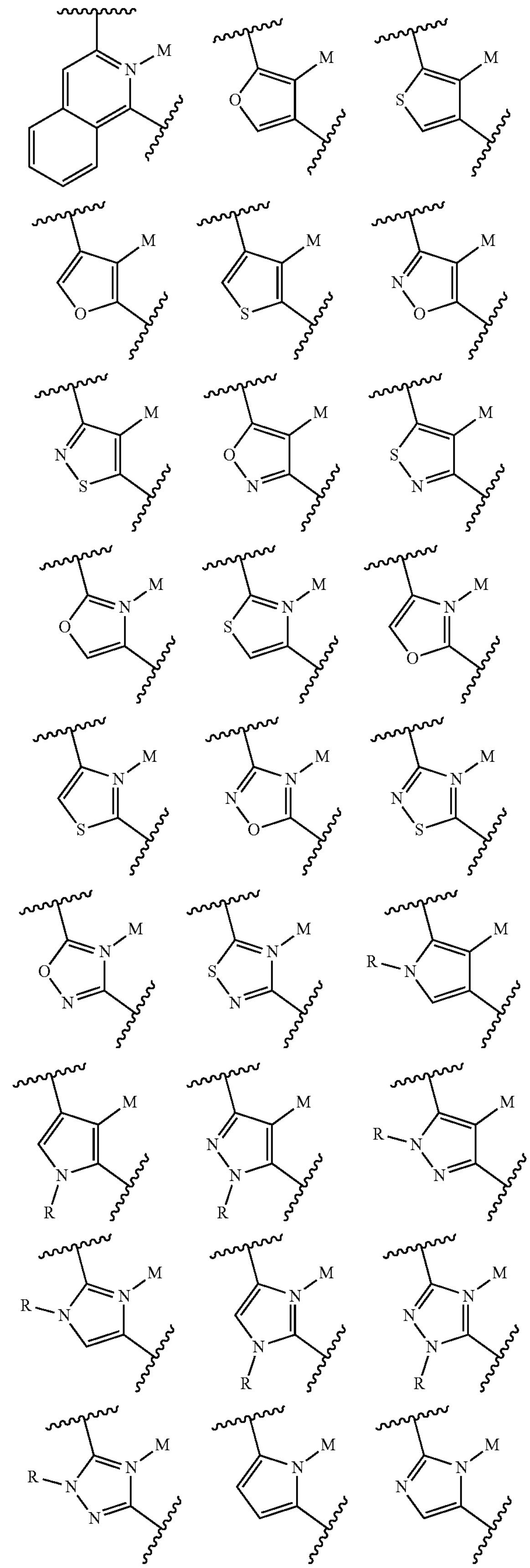

-continued

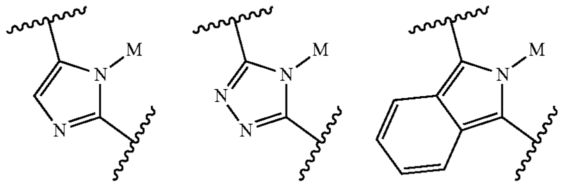

wherein R is hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one aspect, for any of the formulas depicted in this disclosure, each of

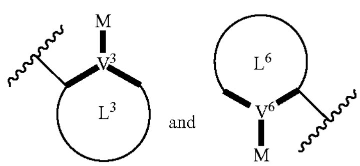

independently represents:

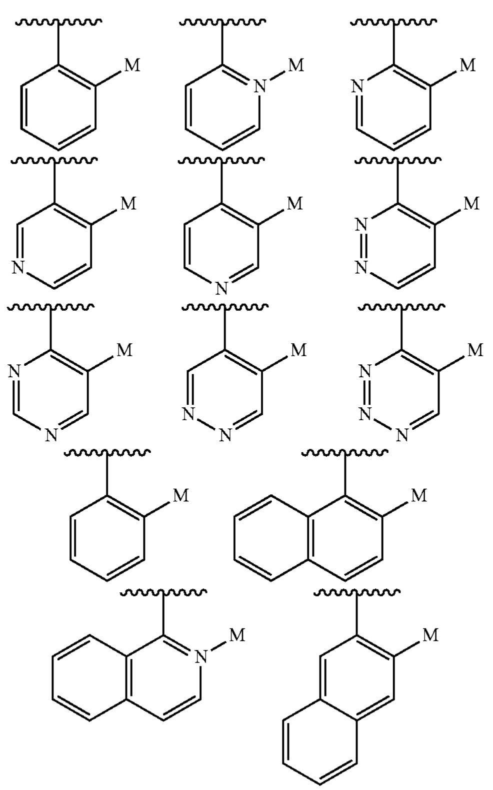

-continued

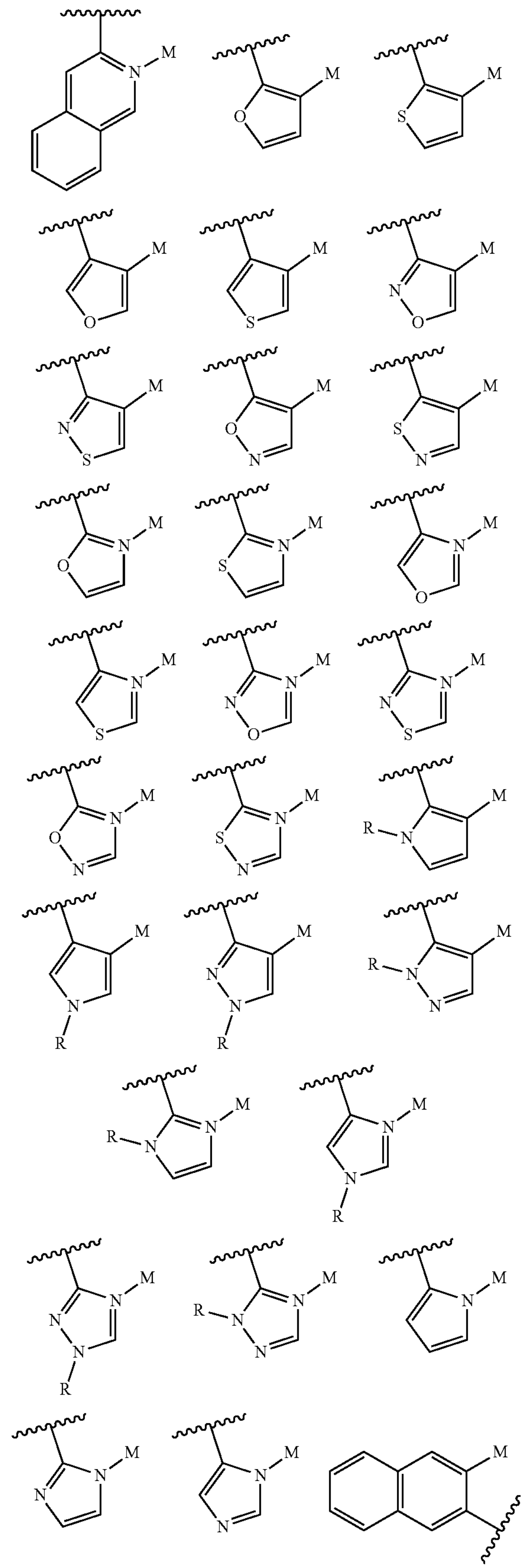

-continued

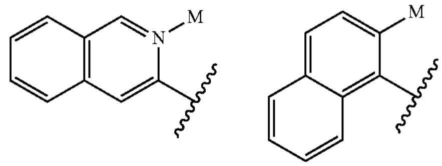
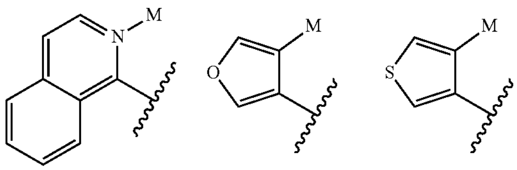
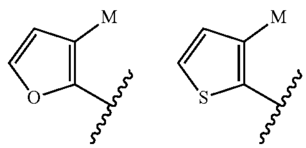
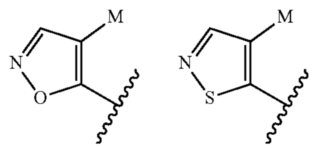
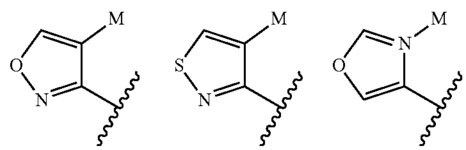
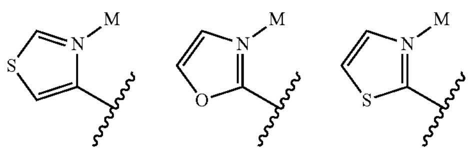
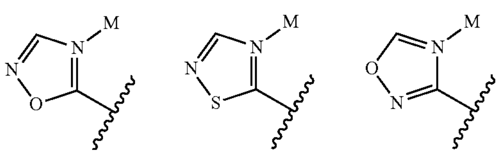
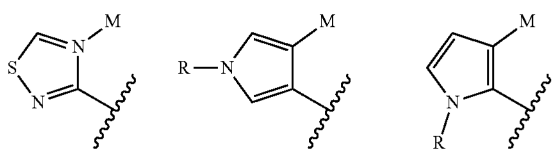
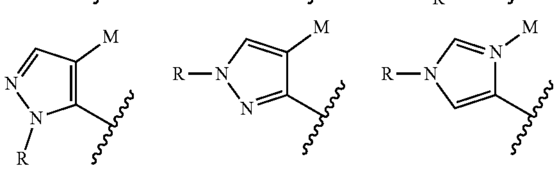
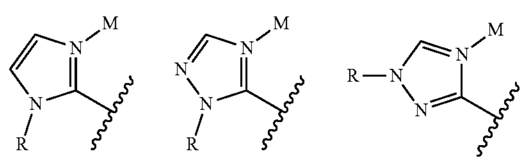
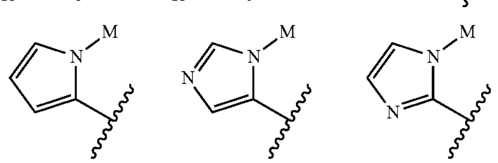

-continued

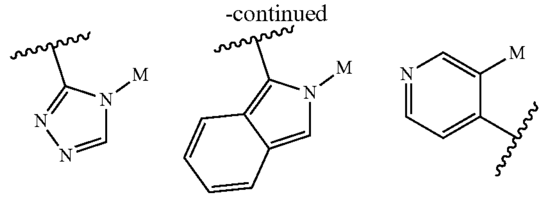
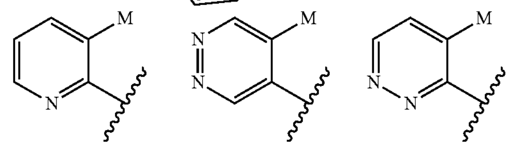

wherein R is hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one aspect, for any of the formulas depicted in this disclosure, each fluorescent luminophore $LP^1$, $LP^2$, $LP^3$, $LP^4$, $LP^5$, and $LP^6$ independently represents:

1. Aromatic Hydrocarbons and their Derivatives

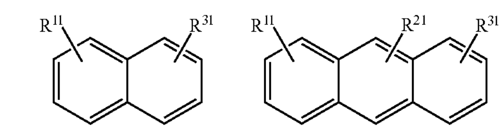
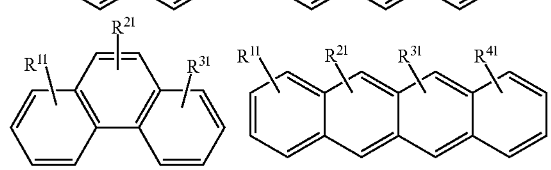
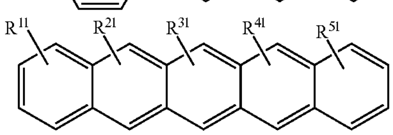
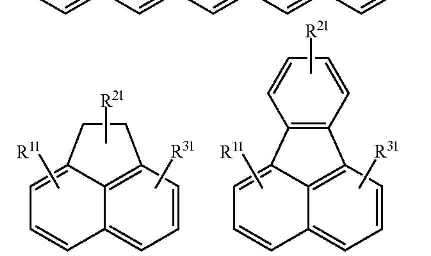
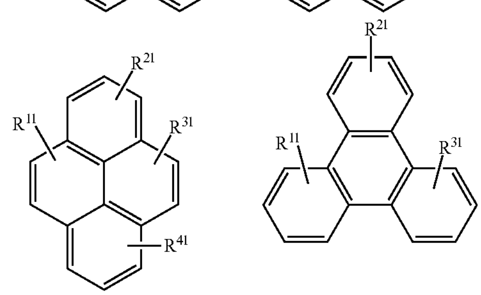

-continued
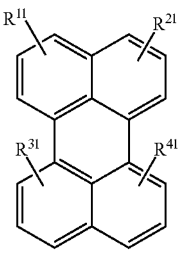
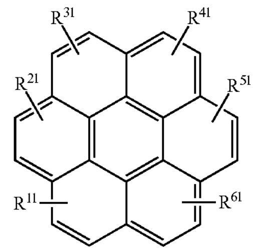
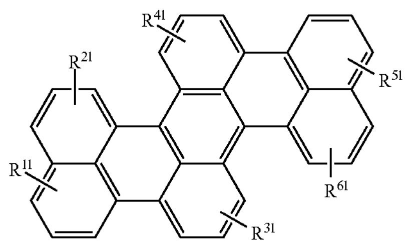
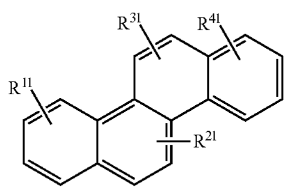
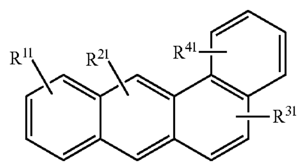
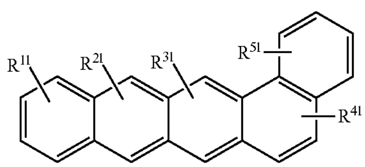
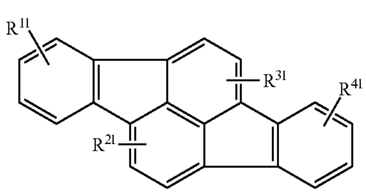
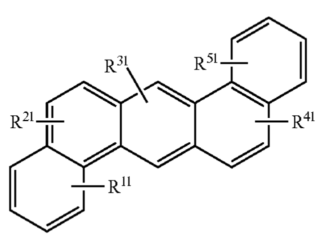
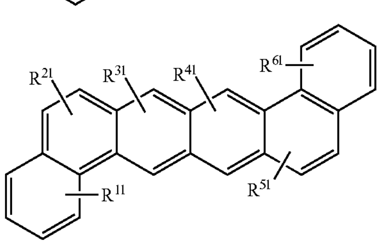
-continued
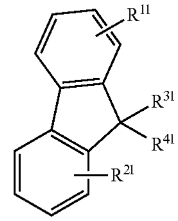
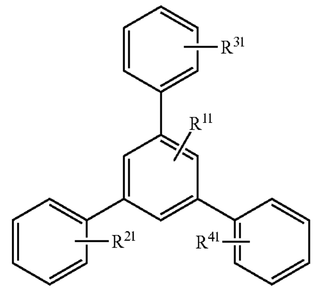
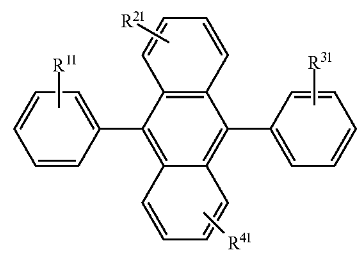
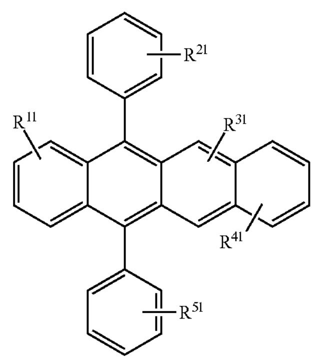
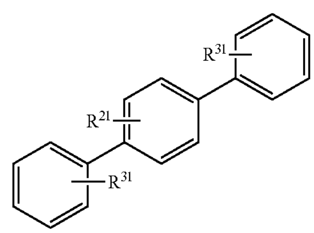
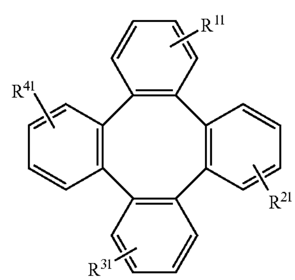
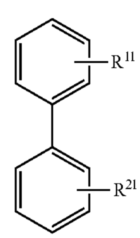
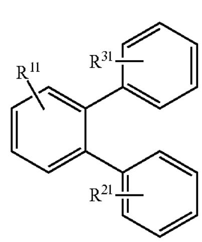

-continued
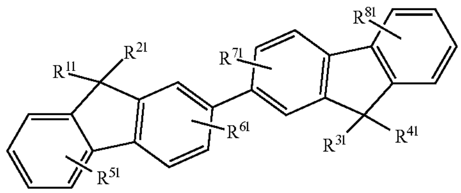
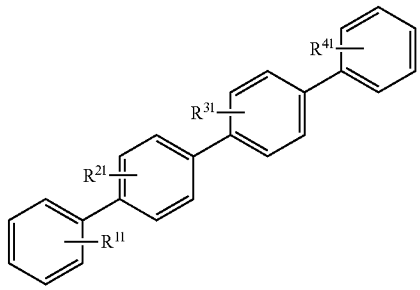
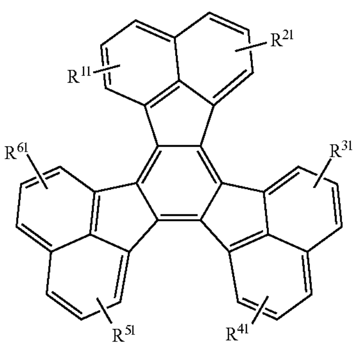
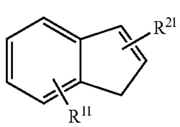
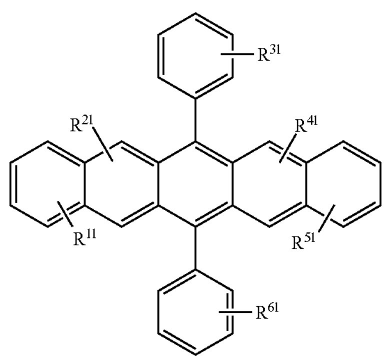
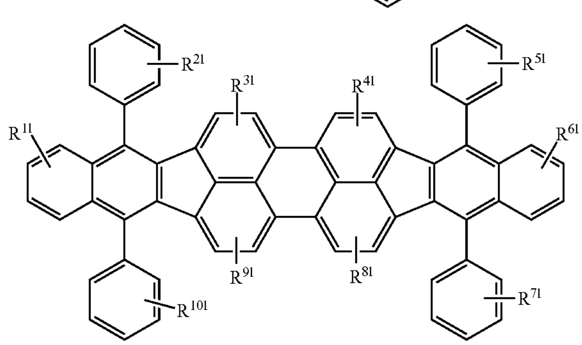
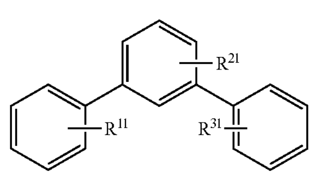
-continued
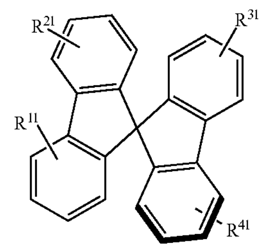
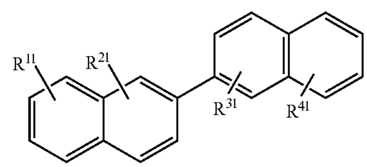
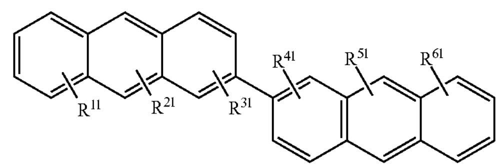
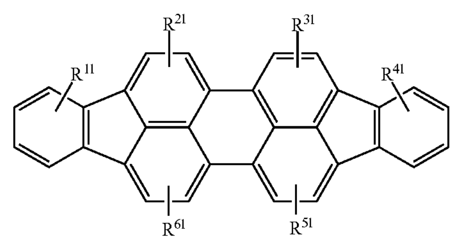
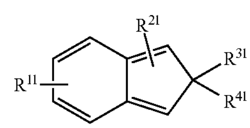
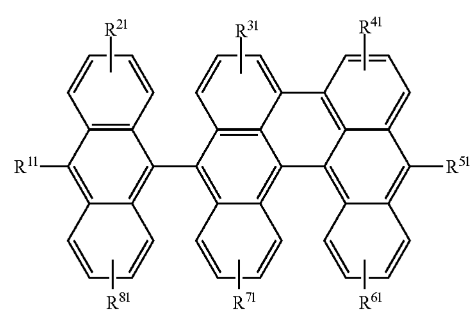
2. Arylethylene, Arylacetylene and their Derivatives
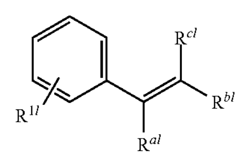
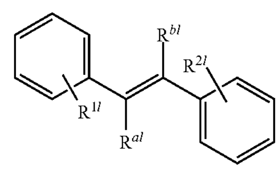

-continued
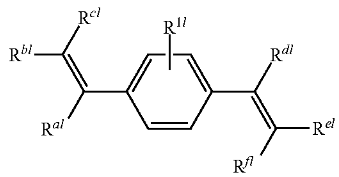
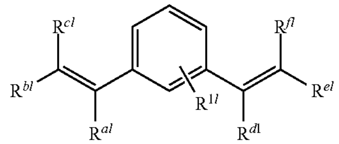
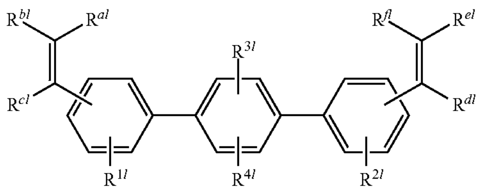
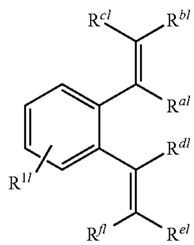
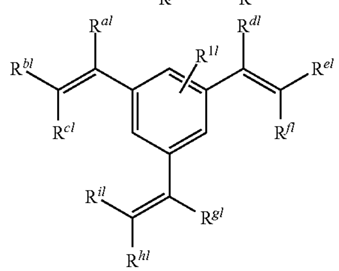
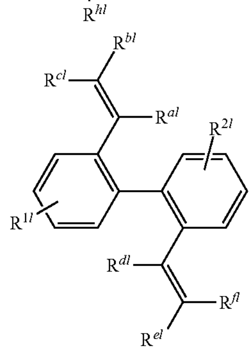
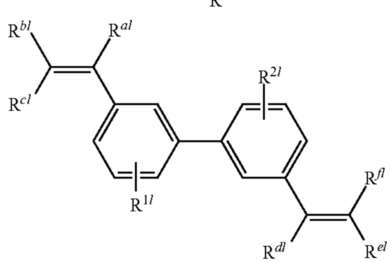
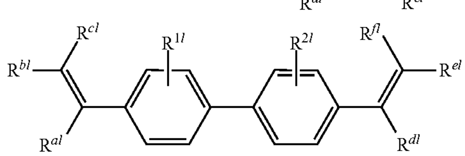
-continued
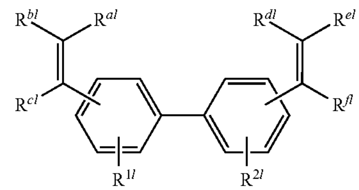
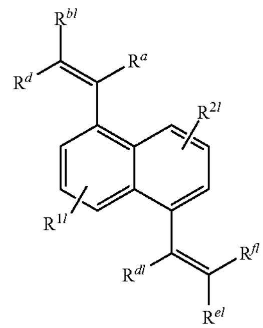
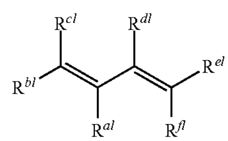
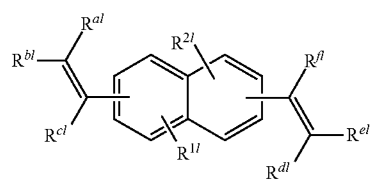
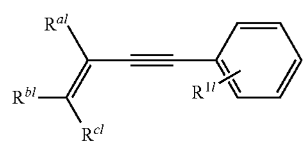
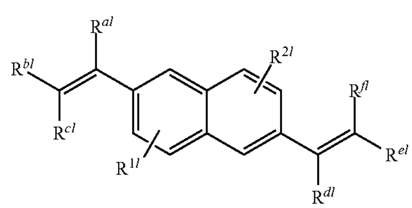
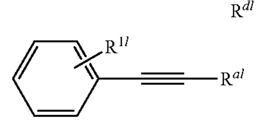
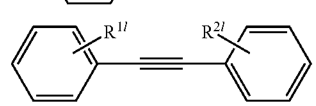
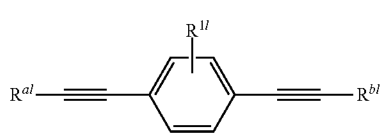
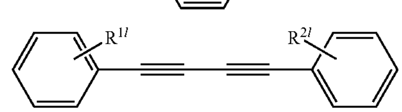

-continued
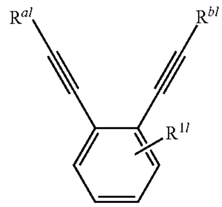
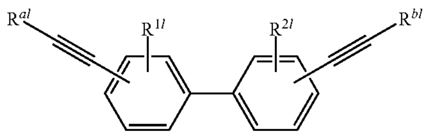
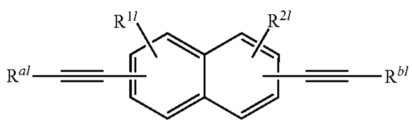
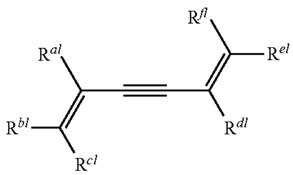
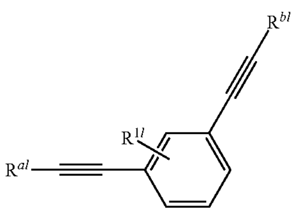
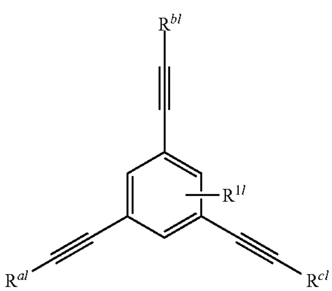
wherein $R^{al}$, $R^{bl}$, $R^{cl}$, $R^{dl}$, $R^{cl}$, $R^{dl}$, $R^{el}$, $R^{fl}$, $R^{gl}$, $R^{hl}$ and $R^{jl}$ can be one of the following structure:
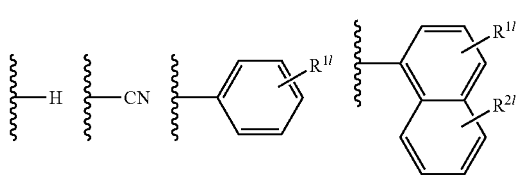
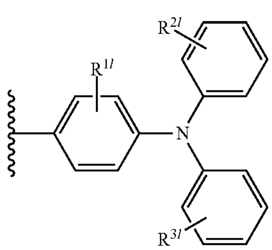
-continued
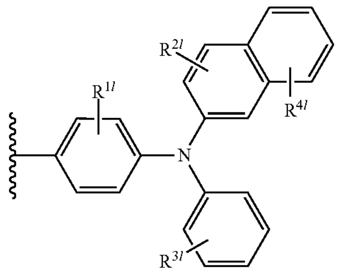
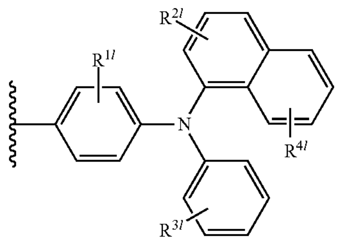
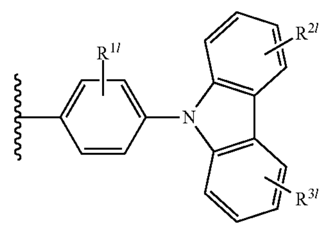
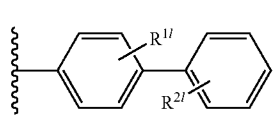
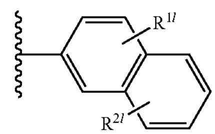
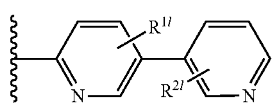
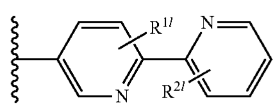
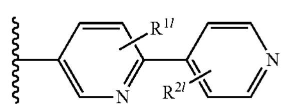
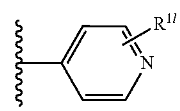
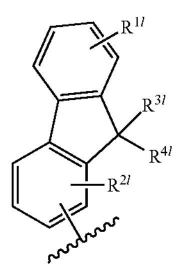
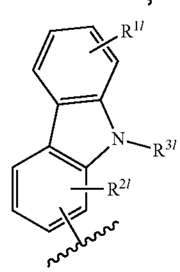
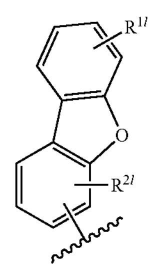
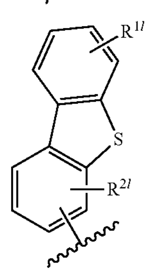
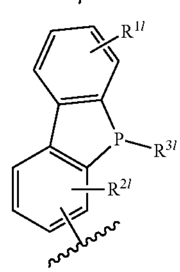
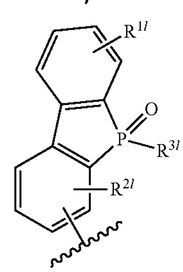

-continued
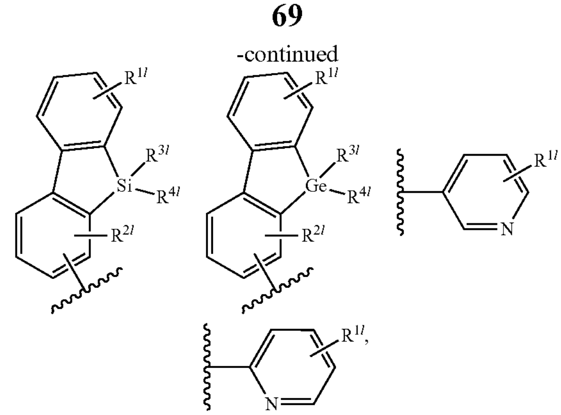
3. Heterocyclic Compounds and their Derivatives
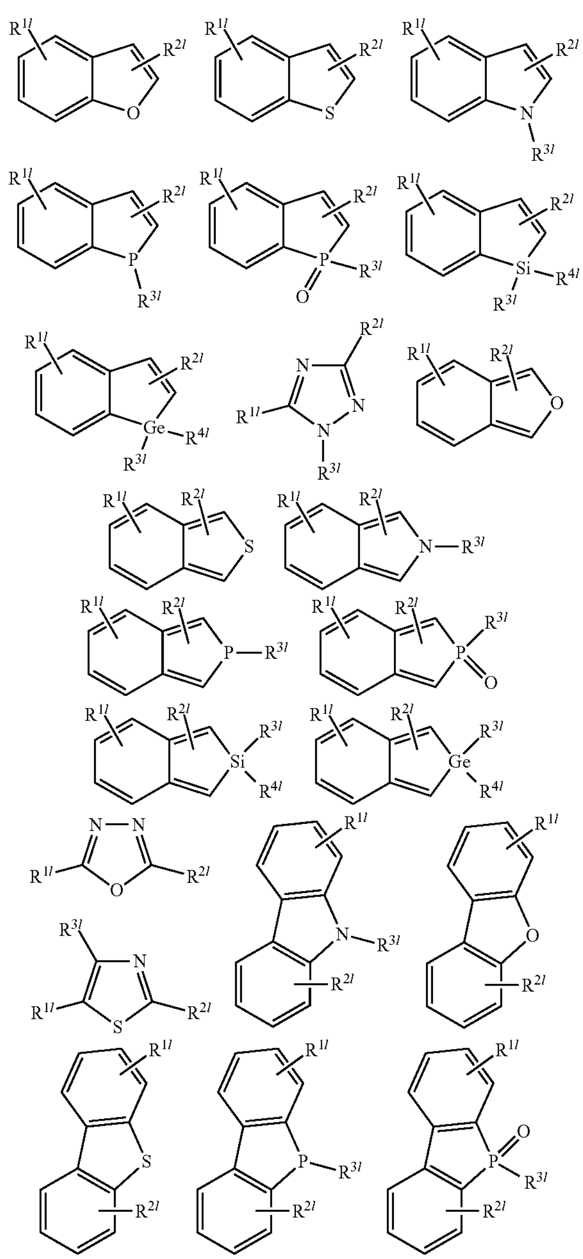
-continued
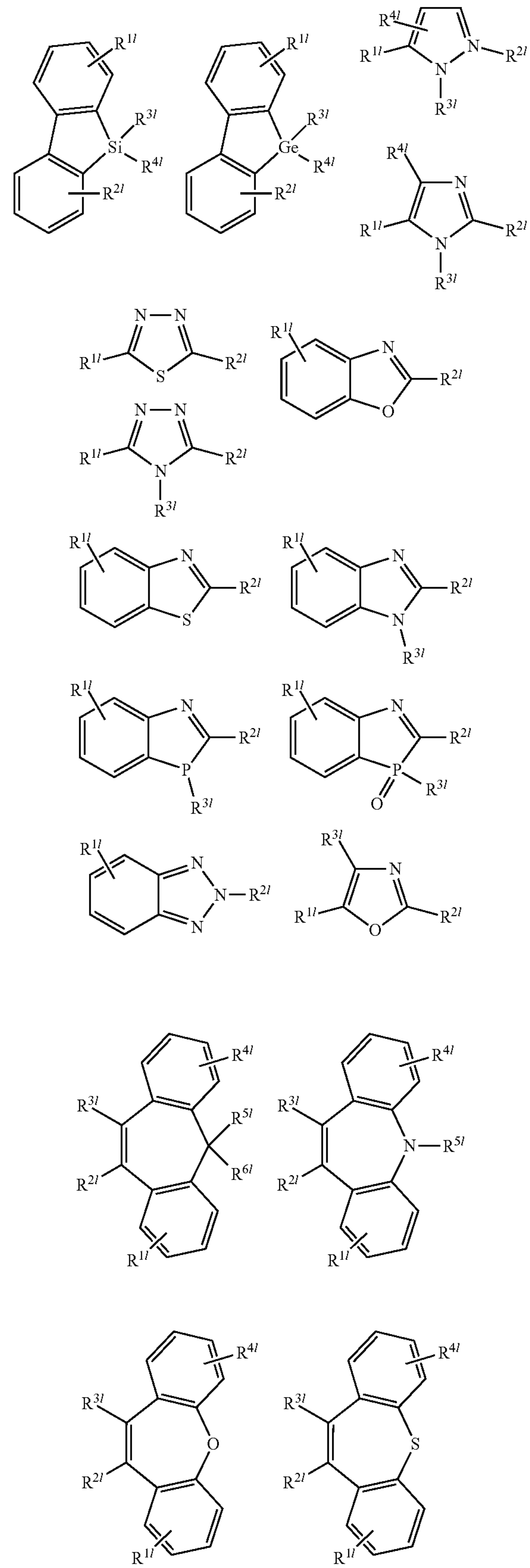

-continued
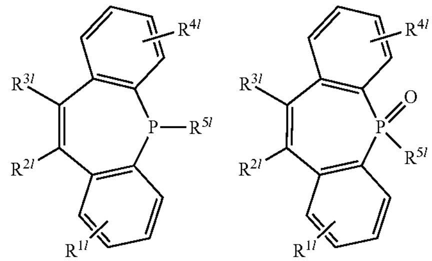
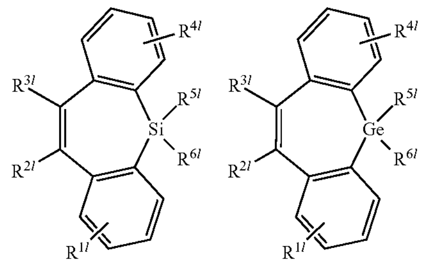
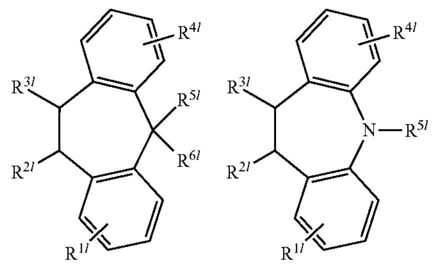
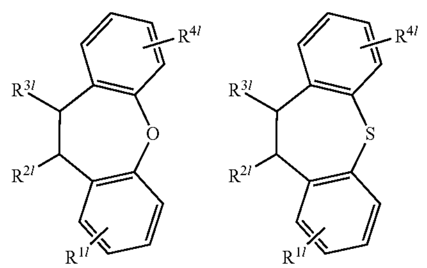
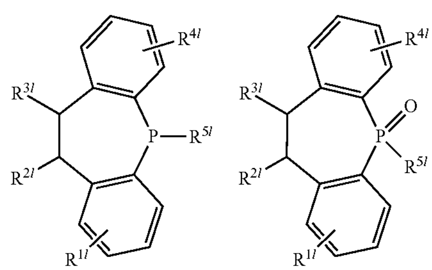
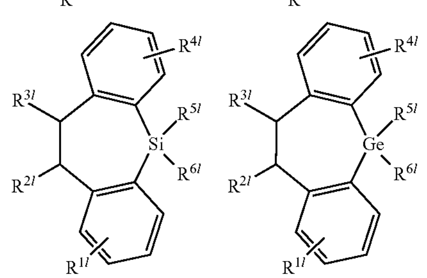
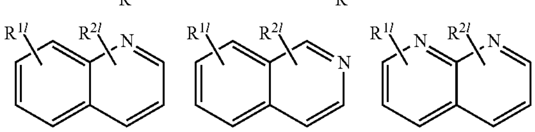
-continued
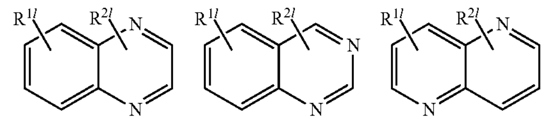
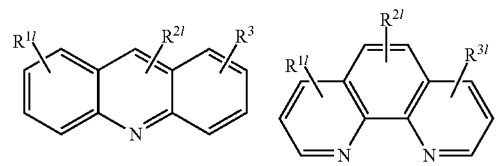
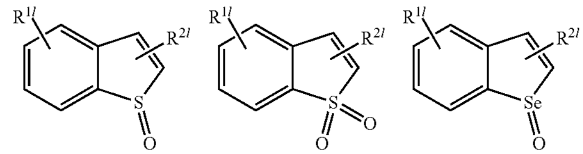
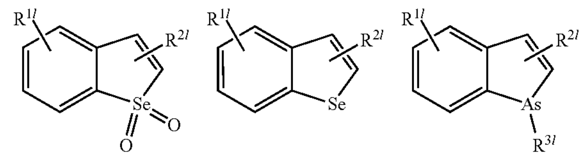
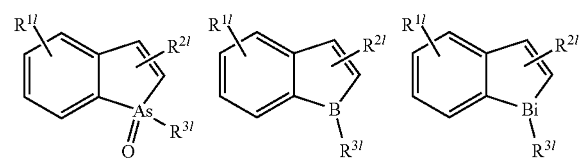
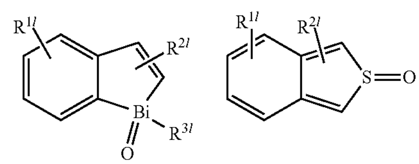
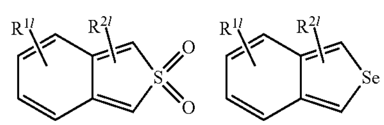
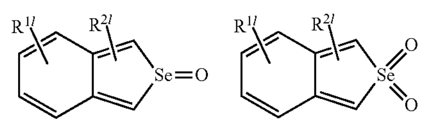
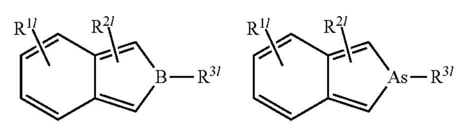
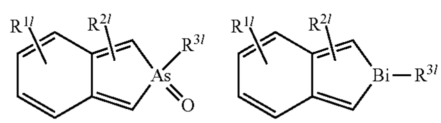
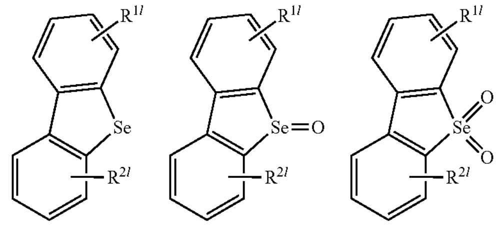

-continued
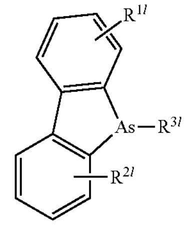
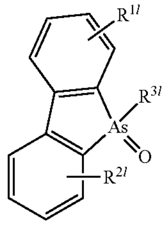
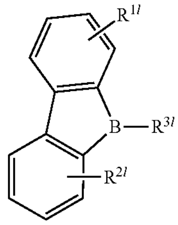
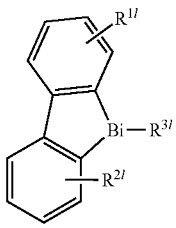
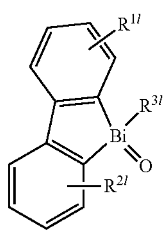
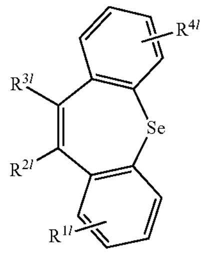
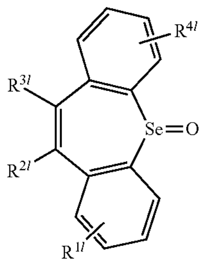
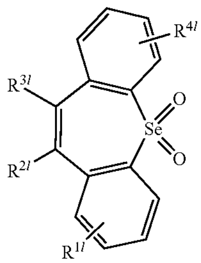
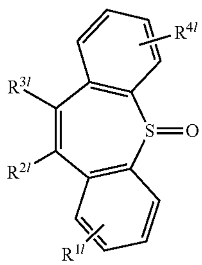
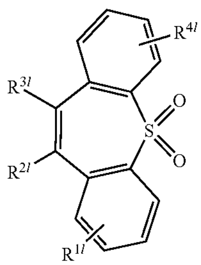
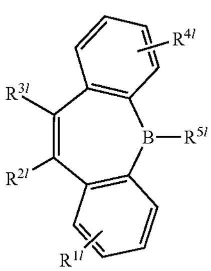
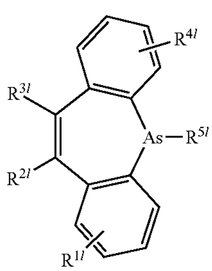
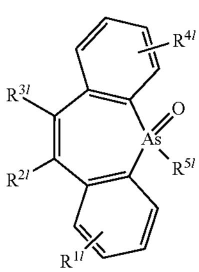
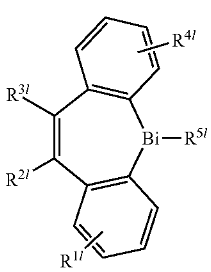
-continued
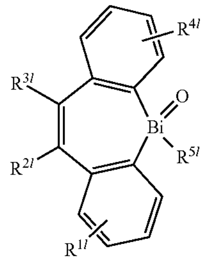
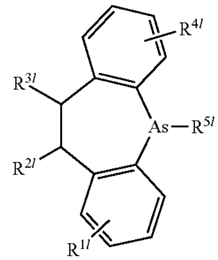
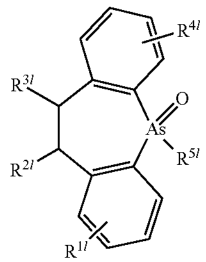
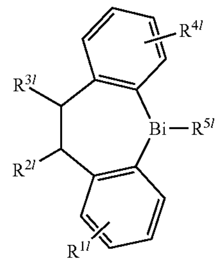
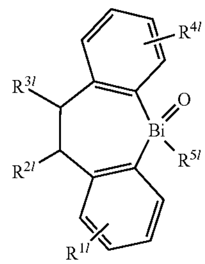
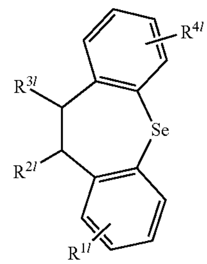
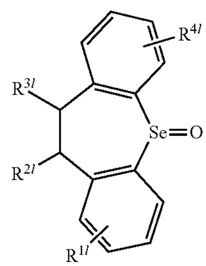
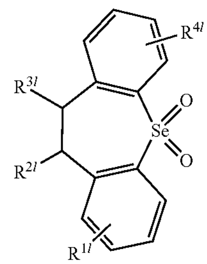
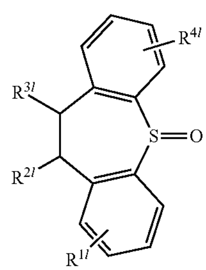
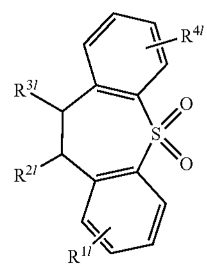
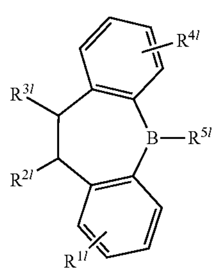
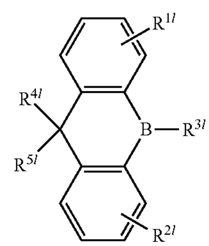

-continued
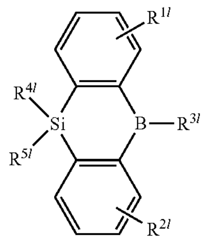
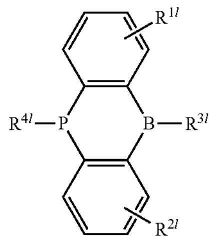
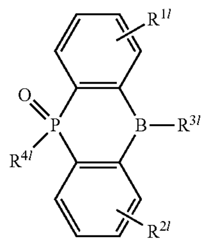
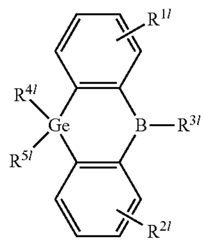
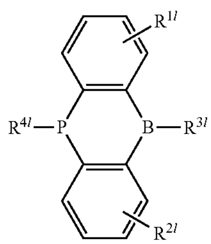
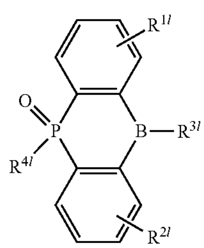
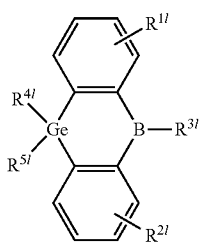
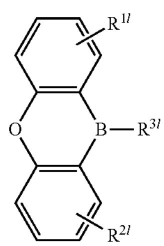
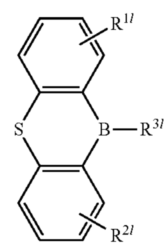
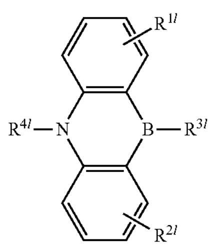
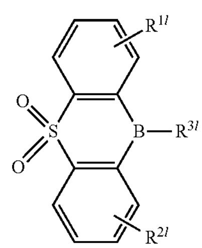
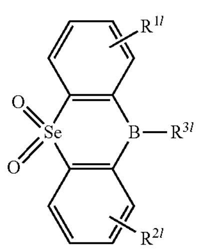
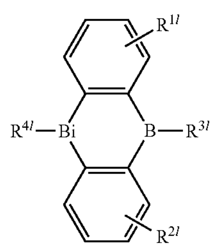
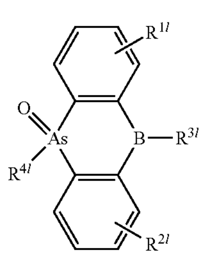
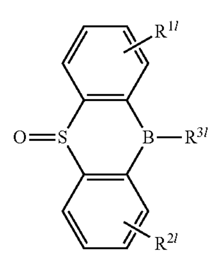
-continued
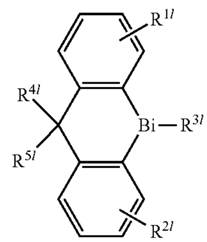
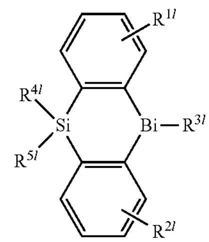
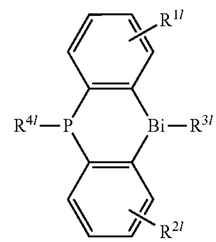
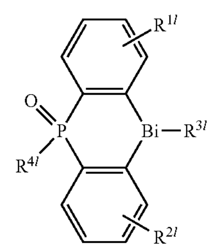
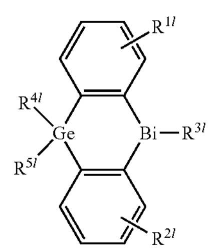
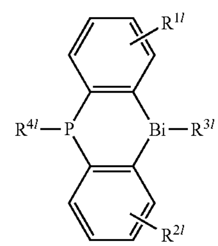
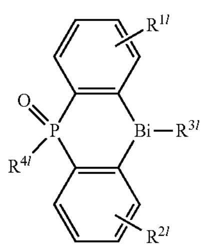
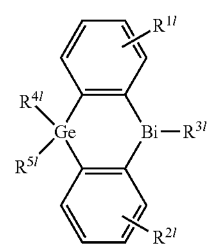
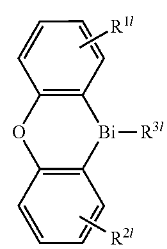
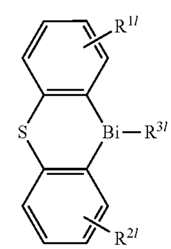
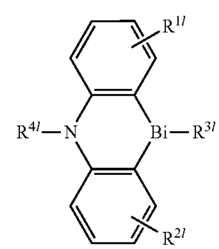
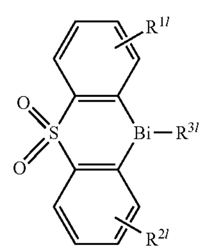
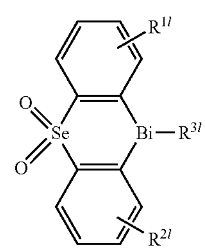
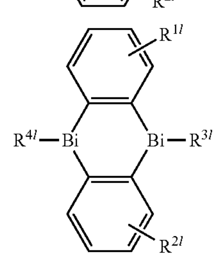
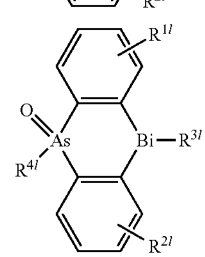

-continued
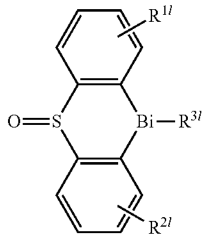
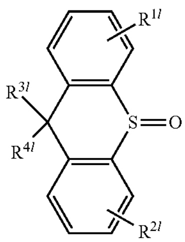
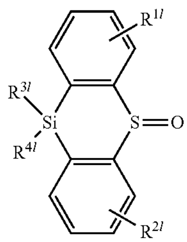
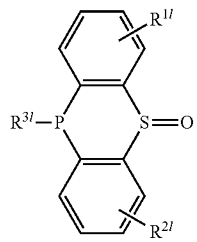
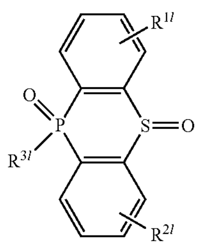
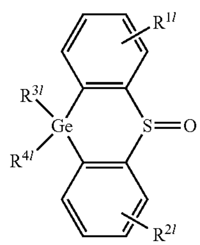
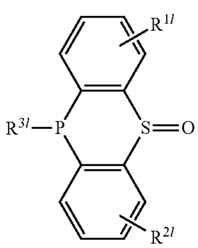
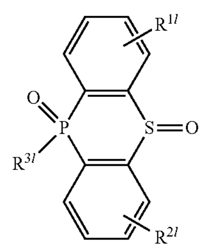
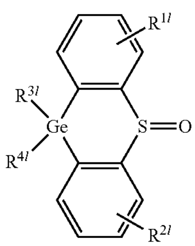
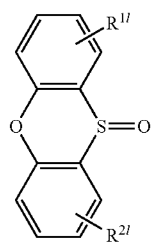
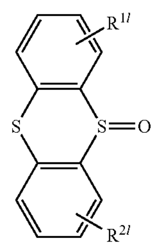
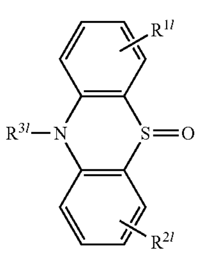
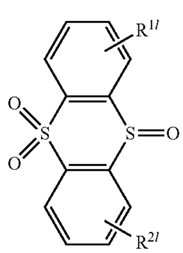
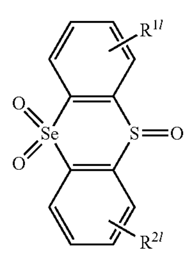
-continued
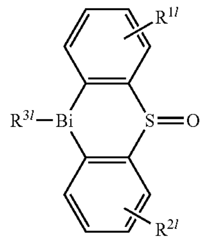
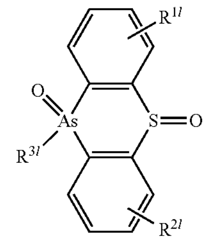
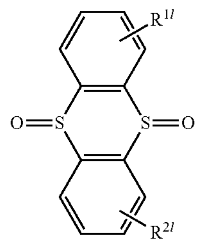
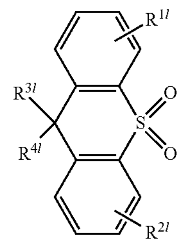
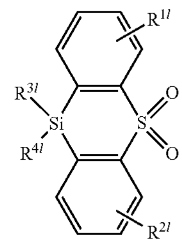
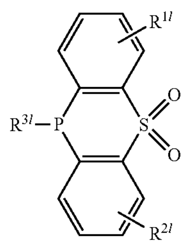
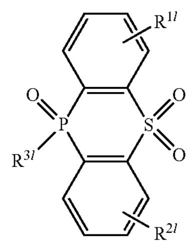
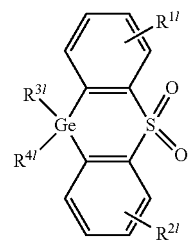
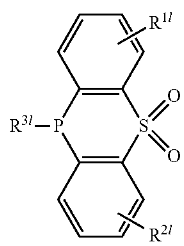
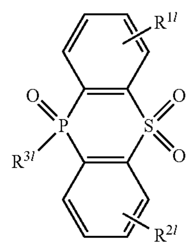
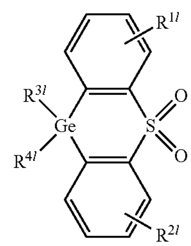
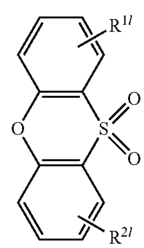
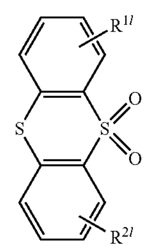
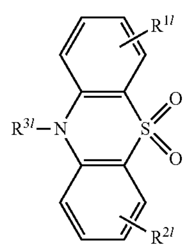
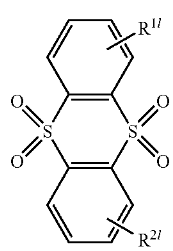
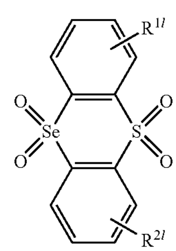
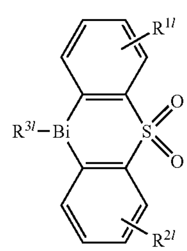
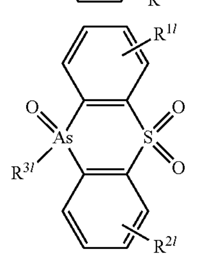
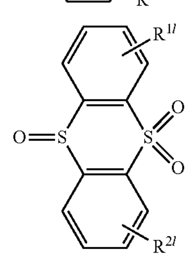
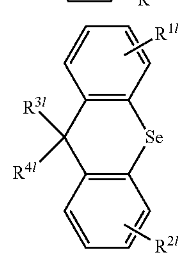

-continued
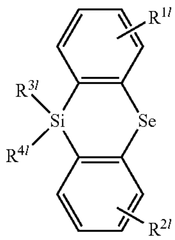
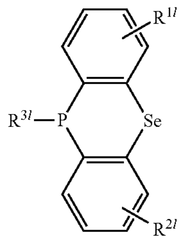
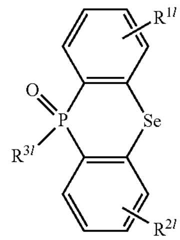
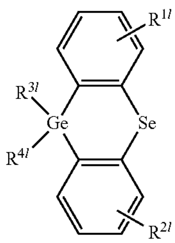
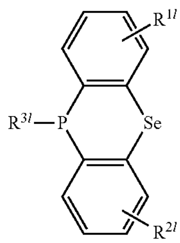
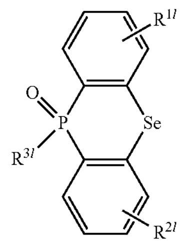
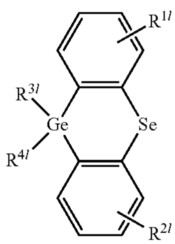
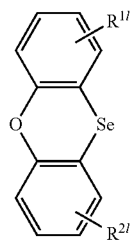
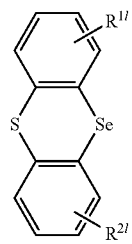
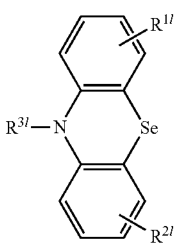
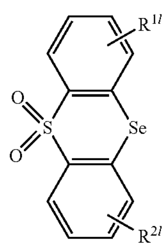
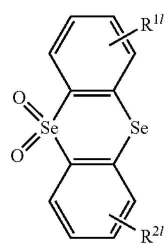
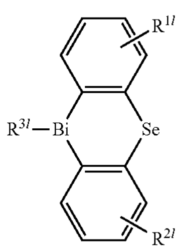
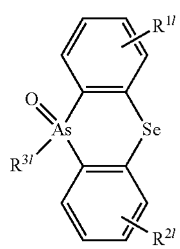
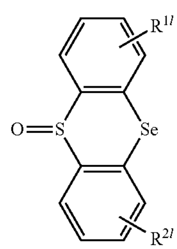
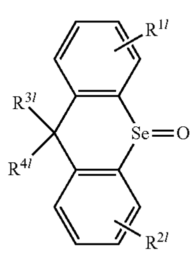
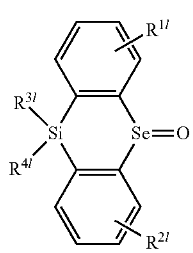
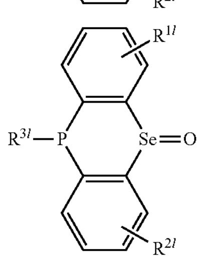
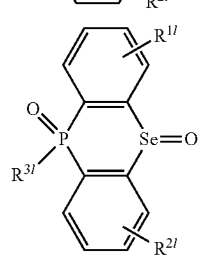
-continued
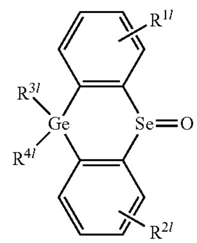
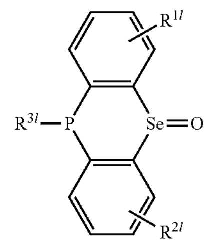
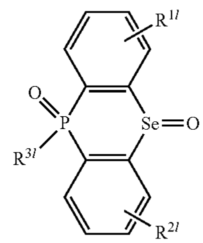
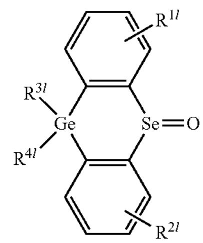
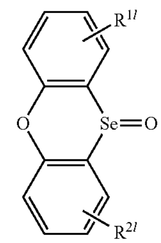
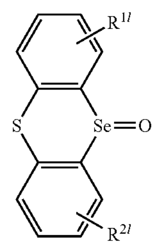
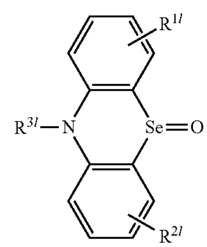
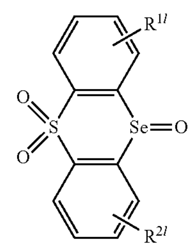
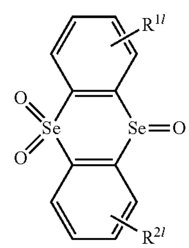
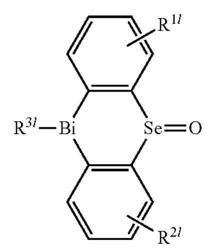
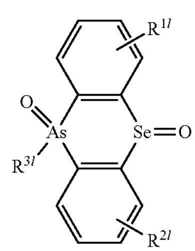
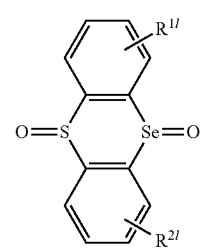
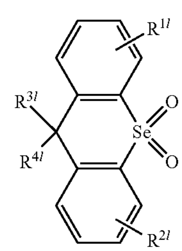
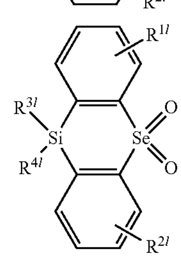
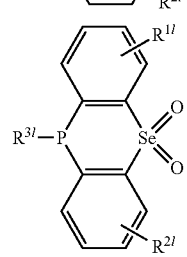
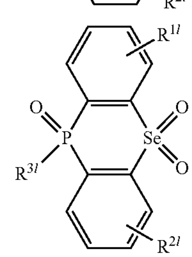
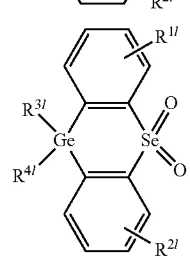
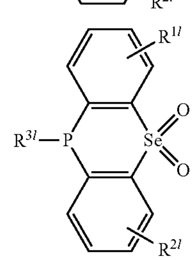
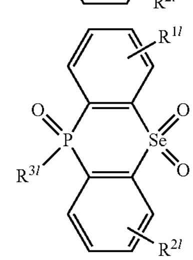

-continued
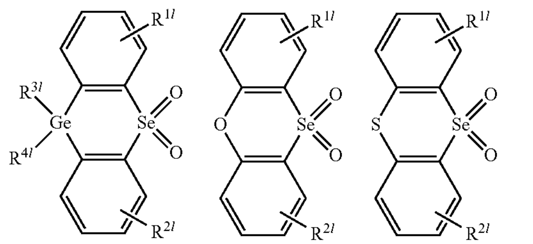
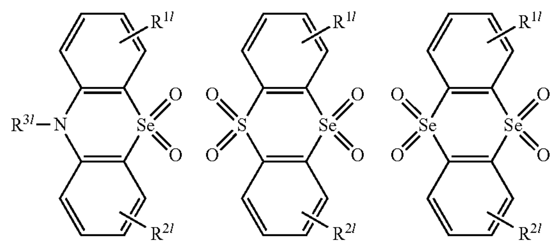
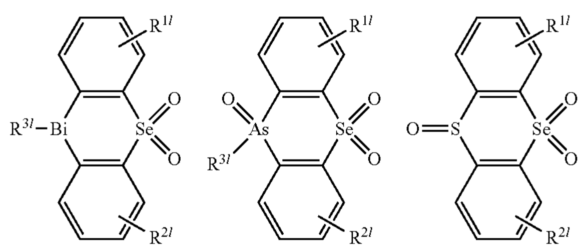
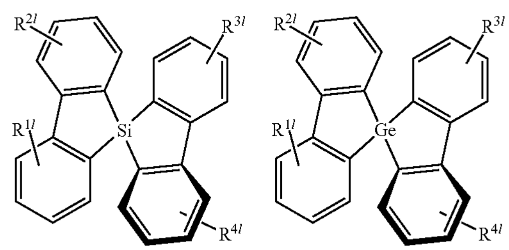
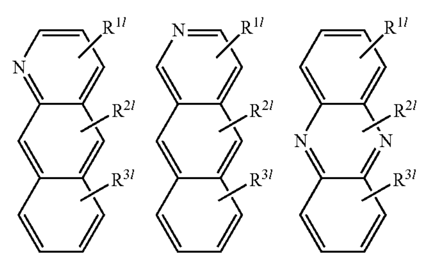
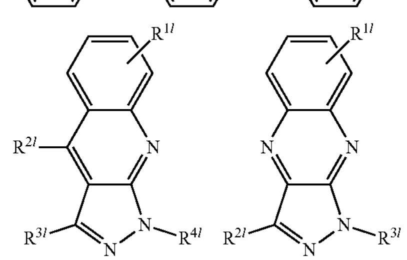
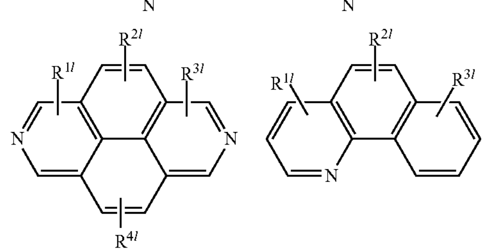
-continued
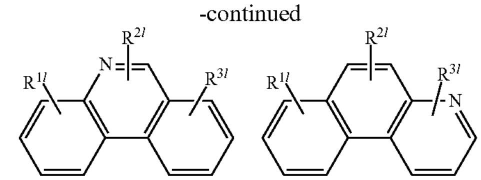
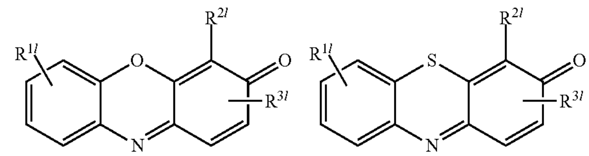
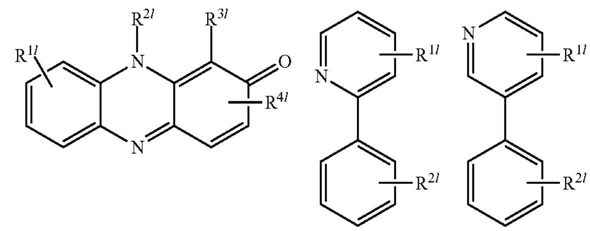
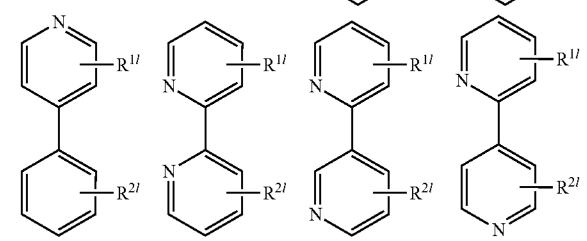
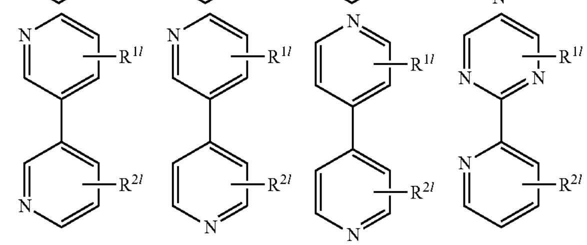
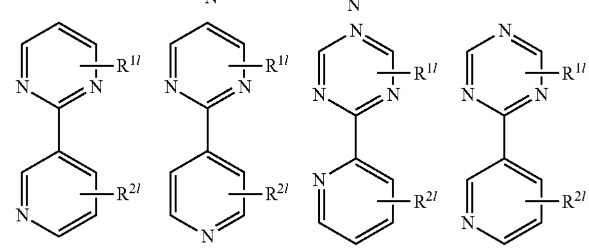
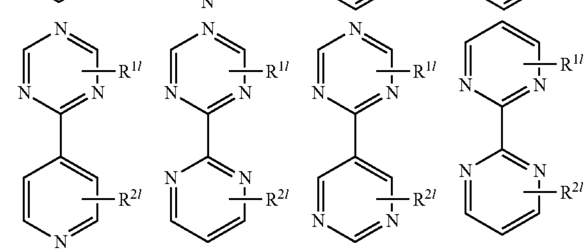
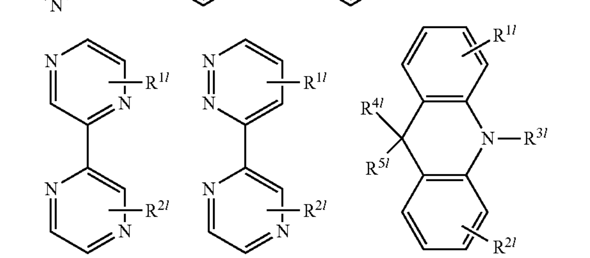

-continued
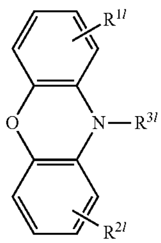
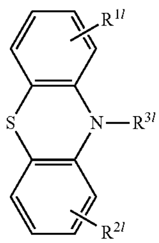
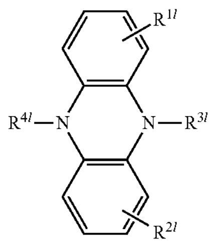
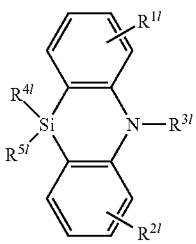
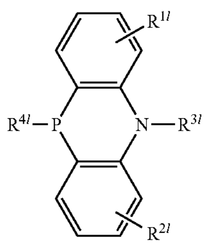
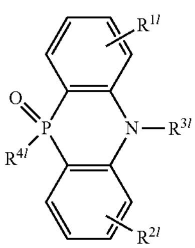
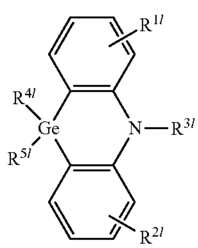
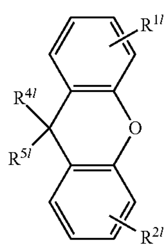
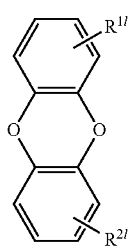
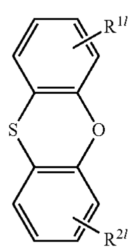
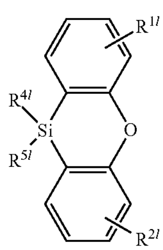
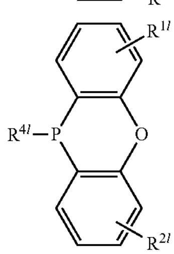
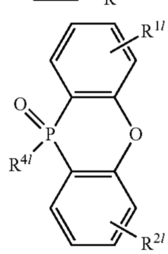
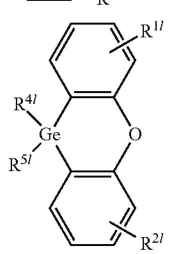
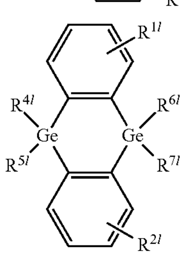
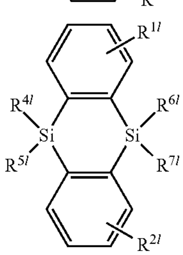
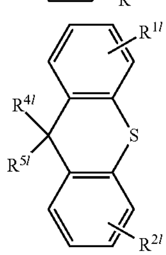
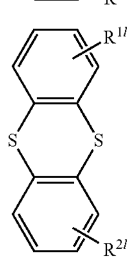
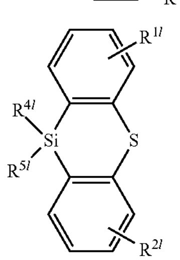
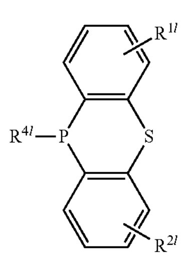
-continued
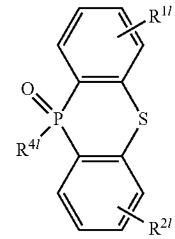
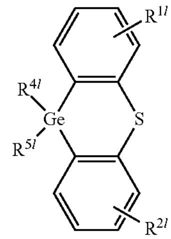
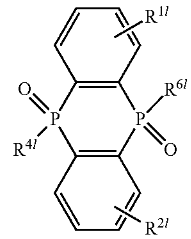
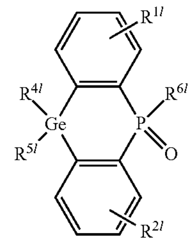
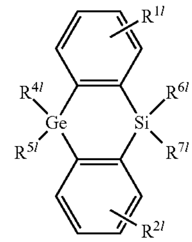
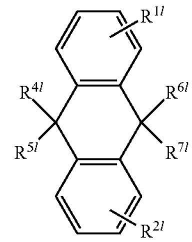
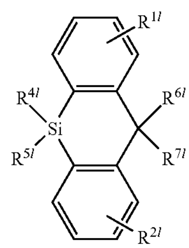
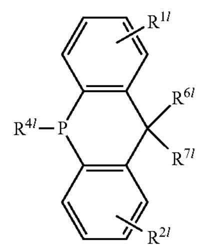
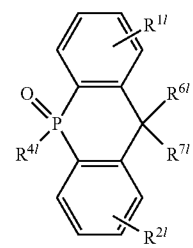
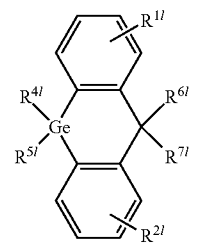
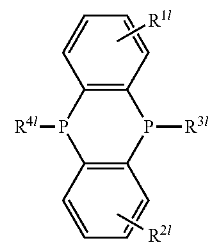
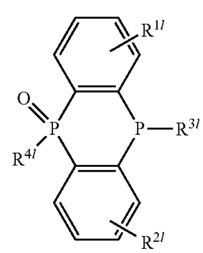
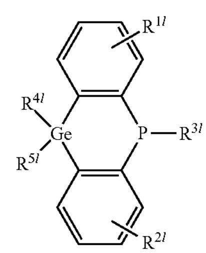
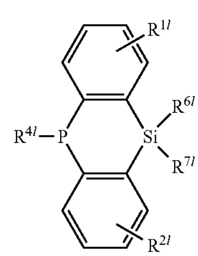
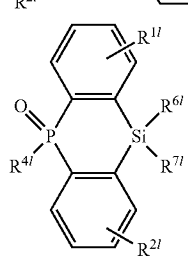
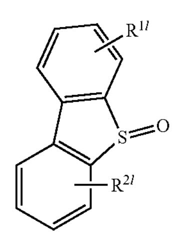
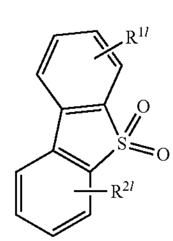
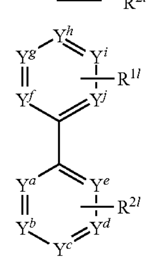
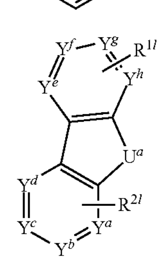

-continued
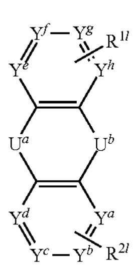
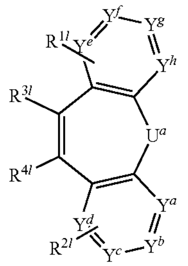
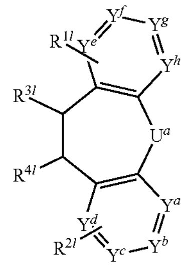
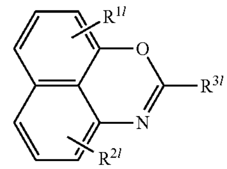
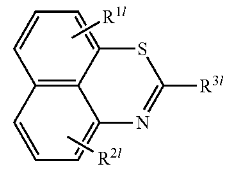
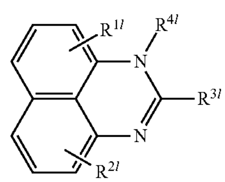
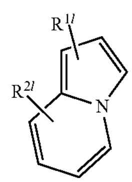
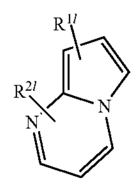
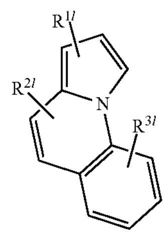
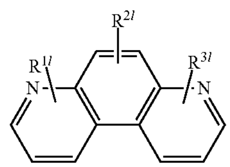
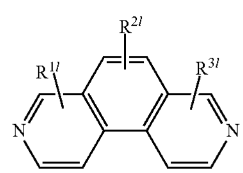
4. Other Fluorescent Luminophores
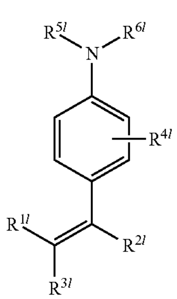
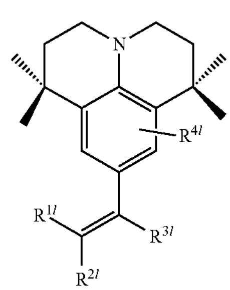
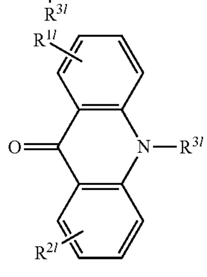
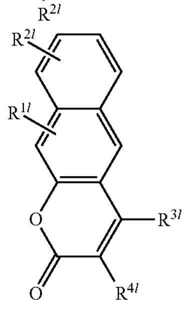
-continued
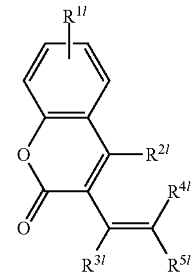
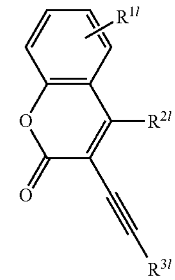
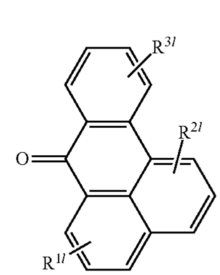
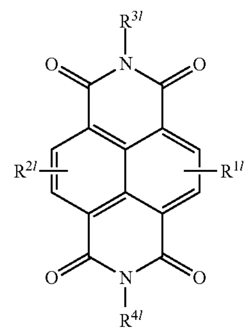
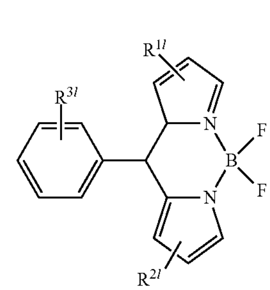
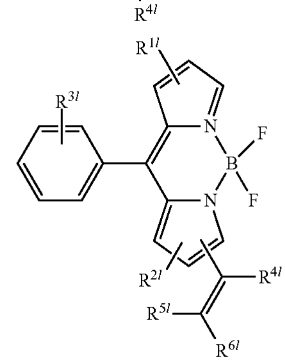
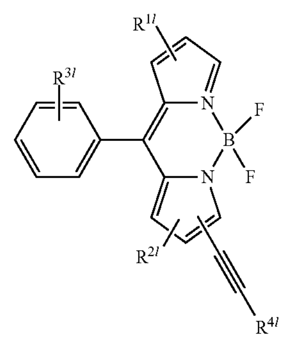
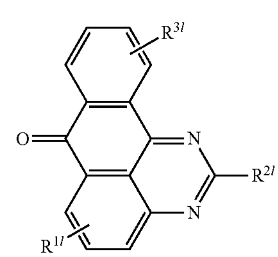
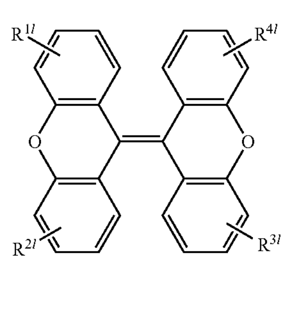
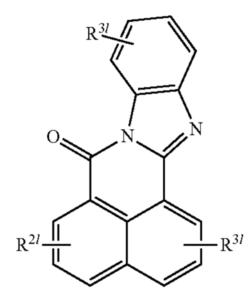

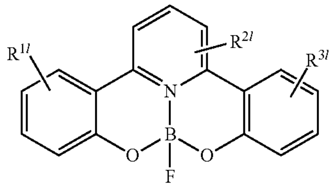
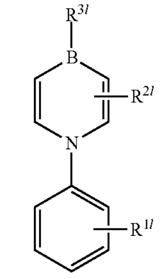
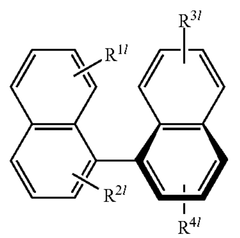
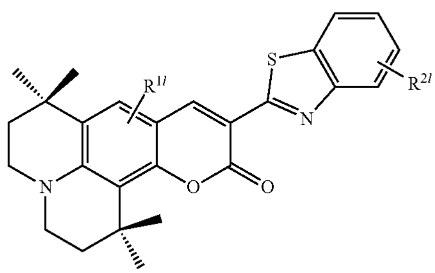
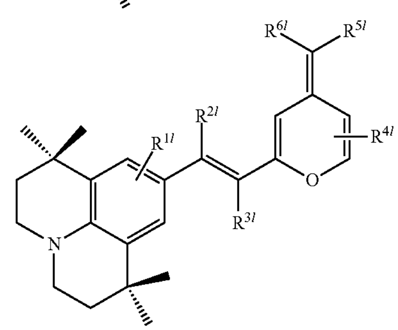
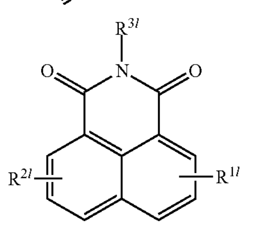
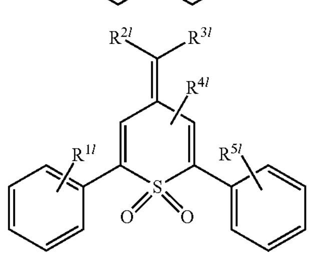
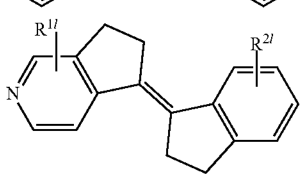
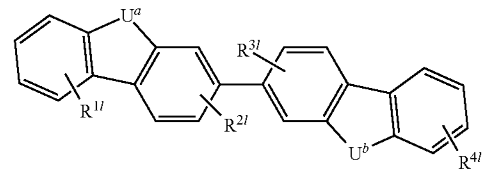
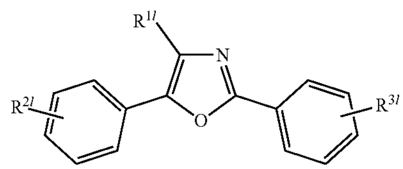
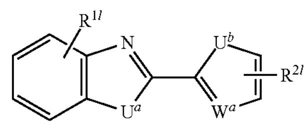
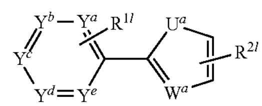
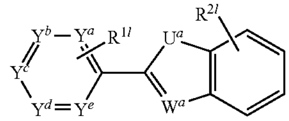
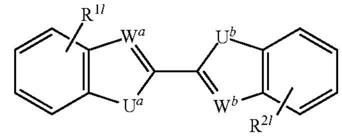
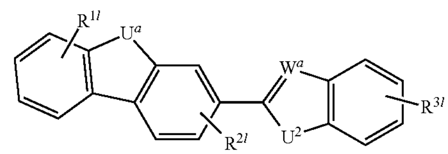
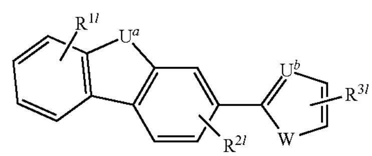
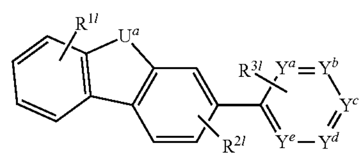
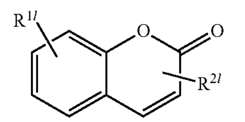
Coumarins
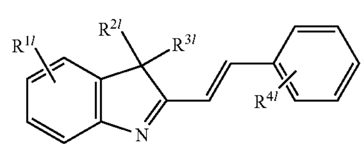
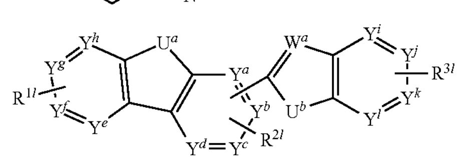

-continued

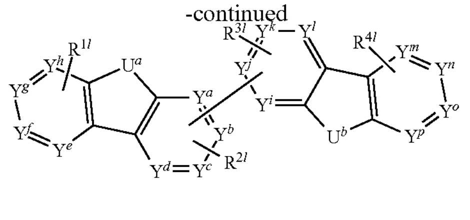

wherein:

each of $R^{1l}$, $R^{2l}$, $R^{3l}$, $R^{4l}$, $R^{5l}$, $R^{6l}$, $R^{7l}$, and $R^{8l}$ a is a mono-, di-, tri-, or tetra-substitution, and each is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$, and $Y^p$ is independently C, N or B, each of $U^a$, $U^b$, and $U^c$ is independently $CH_2$, $CR^1R^2$, C=O, $CH_2$, $SiR^1R^2$, $GeH_2$, $GeR^1R^2$, NH, $NR^3$, PH, $PR^3$, $R^3P{=}O$, $AsR^3$, $R^3As{=}O$, O, S, S=O, $SO_2$, Se, Se=O, $SeO_2$, BH, $BR^3$, $R^3Bi{=}O$, BiH, or $BiR^3$, and each of $W^a$, $W^b$, and $W^c$ is independently CH, $CR^1$, $SiR^1$, GeH, $GeR^1$, N, P, B, Bi, or Bi=O, where $R^1$, $R^2$, and $R^3$ are as defined herein.

In one aspect, fluorescent luminophore $LP^1$ is covalently bonded to $L^1$ directly, $LP^2$ is covalently bonded to $L^2$ directly, $LP^3$ is covalently bonded to $L^3$ directly, $LP^4$ is covalently bonded to $L^4$ directly, fluorescent luminophore $LP^5$ is covalently bonded to $L^5$ directly, fluorescent luminophore $LP^6$ is covalently bonded to $L^6$ directly, or any combination thereof. In another aspect, fluorescent luminophore $LP^1$ is covalently bonded to $L^1$ by a linking atom or linking group, $LP^2$ is covalently bonded to $L^2$ by a linking atom or linking group, $LP^3$ is covalently bonded to $L^3$ by a linking atom or linking group, $LP^4$ is covalently bonded to $L^4$ by a linking atom or linking group, fluorescent luminophore $LP^5$ is covalently bonded to $L^5$ by a linking atom or linking group, fluorescent luminophore $LP^6$ is covalently bonded to $L^6$ by a linking atom or linking group, or any combination thereof. In some aspects, each linking atom or linking group is independently one of the following structures.

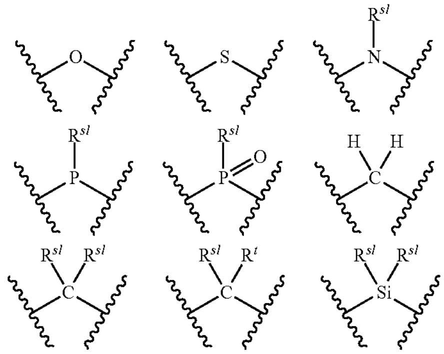

-continued

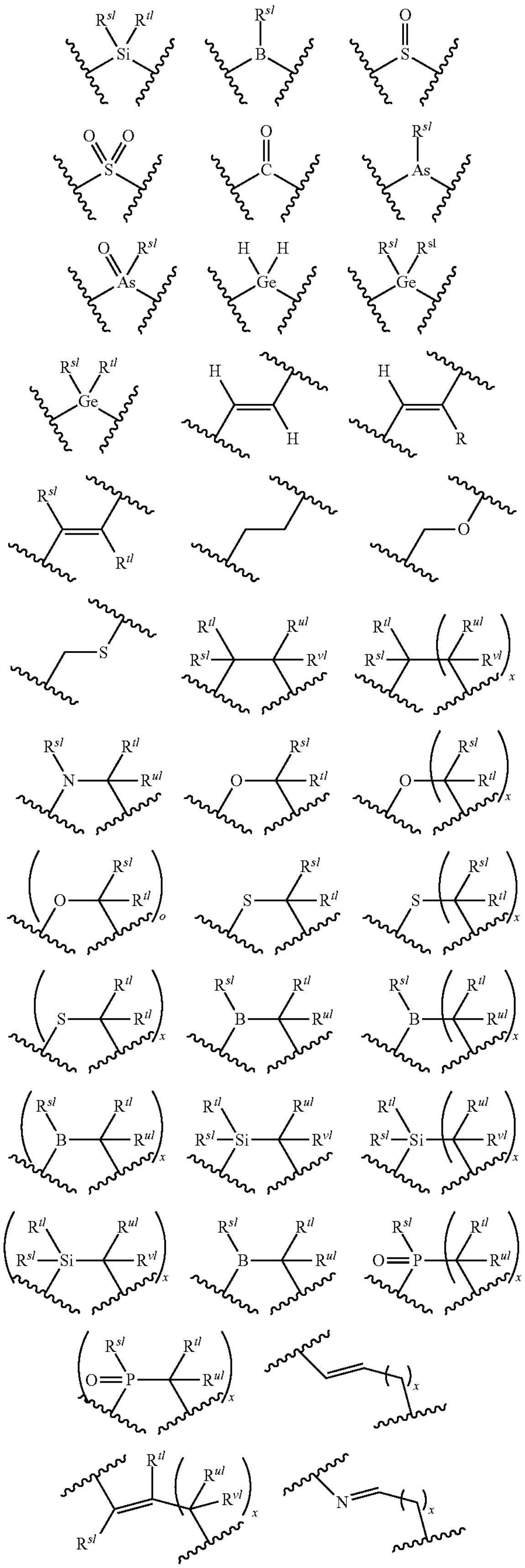

-continued

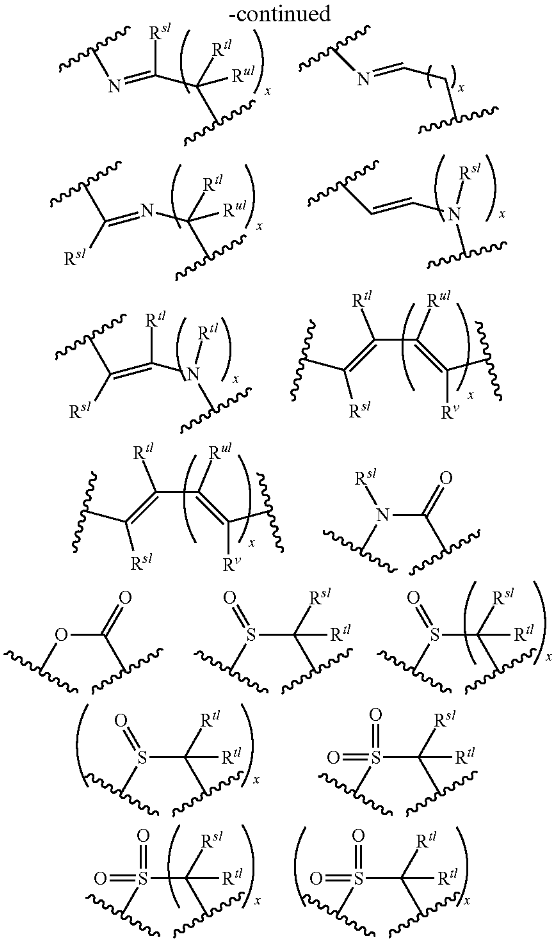

wherein:

x is an integer from 1 to 10, each of $R^{sl}$, $R^{tl}$, $R^{ul}$, and $R^{vl}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

In one aspect, the linking atom and linking group recited above is covalently bonded to any atom of the fluorescent luminophore $LP^1$, $LP^2$, $LP^3$, $LP^4$, $LP^5$, and $LP^6$ if valency permits. For example, if $LP^1$ is

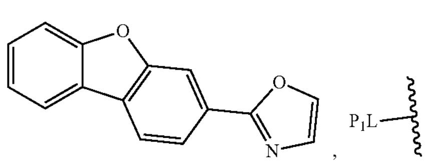

can be

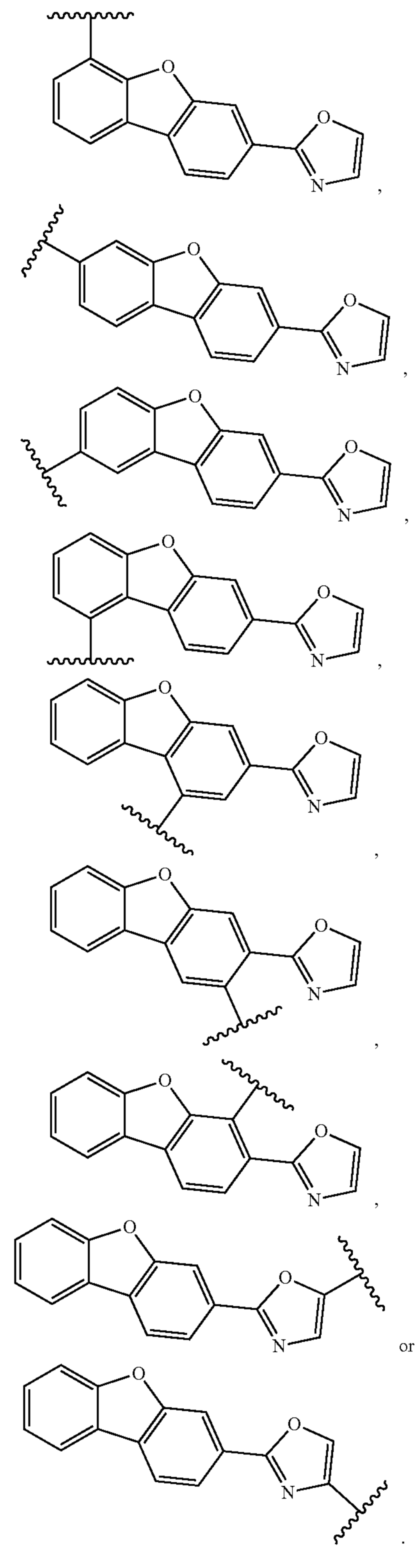

In one aspect, at least one $R^a$ is present. In another aspect, $R^a$ is absent. In one aspect, $R^a$ is a mono-substitution. In another aspect, $R^a$ is a di-substitution. In yet another aspect, $R^a$ is a tri-substitution.

In one aspect, $R^a$ is connected to at least $Y^1$. In another aspect, $R^a$ is connected to at least $Y^2$. In yet another aspect, $R^a$ is connected to at least $Y^3$. In one aspect, $R^a$ is connected to at least $Y^1$ and $Y^2$. In one aspect, $R^a$ is connected to at least $Y^1$ and $Y^3$. In one aspect, $R^a$ is connected to at least $Y^2$ and $Y^3$. In one aspect, $R^a$ is connected to $Y^1$, $Y^2$, and $Y^3$.

In one aspect, $R^a$ is a di-substitution and the $R^a$'s are linked together. When the $R^a$'s are linked together the resulting structure may be a cyclic structure that includes a portion of the five-membered cyclic structure as described herein. For example, a cyclic structure may be formed when the di-substitution is of $Y^1$ and $Y^2$ and the $R^a$'s are linked together. A cyclic structure may also be formed when the di-substitution is of $Y^2$ and $Y^3$ and the $R^a$'s are linked together. A cyclic structure can also be formed when the di-substitution is of $Y^3$ and $Y^4$ and the $R^a$'s are linked together.

In one aspect, each $R^a$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof. Two or more of $R^a$ may be linked together.

In one aspect, at least one $R^b$ is present. In another aspect, $R^b$ is absent. In one aspect, $R^b$ is a mono-substitution. In another aspect, $R^b$ is a di-substitution. In yet another aspect, $R^b$ is a tri-substitution.

In one aspect, each $R^b$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof. Two or more of $R^b$ may be linked together.

In one aspect, at least one $R^c$ is present. In another aspect, $R^c$ is absent. In one aspect, $R^c$ is a mono-substitution. In another aspect, $R^c$ is a di-substitution. In yet another aspect, $R^c$ is a tri-substitution.

In one aspect, each $R^c$ is deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof. Two or more of $R^c$ may be linked together.

In one aspect, at least one $R^d$ is present. In another aspect, $R^d$ is absent. In one aspect, $R^d$ is a mono-substitution. In another aspect, $R^d$ is a di-substitution. In yet another aspect, $R^d$ is a tri-substitution.

In one aspect, $R^d$ is connected to at least $Y^5$. In another aspect, $R^d$ is connected to at least $Y^6$. In yet another aspect, $R^d$ is connected to at least $Y^7$. In one aspect, $R^d$ is connected to at least $Y^5$ and $Y^6$. In one aspect, $R^d$ is connected to at least $Y^5$ and $Y^7$. In one aspect, $R^d$ is connected to at least $Y^6$ and $Y^7$. In one aspect, $R^d$ is connected to $Y^5$, $Y^6$, and $Y^7$.

In one aspect, $R^d$ is a di-substitution and the $R^d$'s are linked together. When the $R^d$'s are linked together the resulting structure can be a cyclic structure which includes a portion of the five-membered cyclic structure as described herein. For example, a cyclic structure can be formed when the di-substitution is of $Y^5$ and $Y^6$ and the $R^d$'s are linked together. A cyclic structure can also be formed when the di-substitution is of $Y^6$ and $Y^7$ and the $R^d$'s are linked together. A cyclic structure can also be formed when the di-substitution is of $Y^7$ and $Y^8$ and the $R^d$'s are linked together. Two or more of may be linked together. Similarly, two or more of $R^e$ or $R^f$ may be linked together.

In one aspect, $R^1$ and $R^2$ are linked to form the cyclic structure

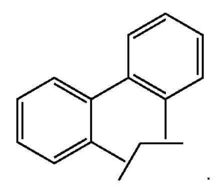

.

In one aspect, X is N, P, P═O, As, As═O, $CR^1$, CH, $SiR^1$, SiH, $GeR^1$, GeH, B, Bi, or Bi═O. In one example, X is N or P. In another example, X is P═O, As, As═O, $CR^1$, CH, $SiR^1$, SiH, $GeR^1$, GeH, B, Bi, or Bi═O. In another aspect, X is Z, $Z^1$, or $Z^2$ (e.g., a linking group such as $NR^1$, $PR^1$, P═$OR^1$, $AsR^1$, As═$OR^1$, $C(R^1)_2$, $CH(R^1)$, $Si(R^1)_2$, $SiH(R^1)$, $Ge(R^1)_2$, $GeH(R^1)$, $BR^1$, $BiR^1$, or Bi═$O(R^1)$) $R^1$ is as defined herein.

In one aspect, Y is N, P, P═O, As, As═O, $CR^1$, CH, $SiR^1$, SiH, $GeR^1$, GeH, B, Bi, or Bi═O. In one example, Y is N or P. In another example, Y is P═O, As, As═O, $CR^1$, CH, $SiR^1$, SiH, $GeR^1$, GeH, B, Bi, or Bi═O. In another aspect, Y is Z, $Z^1$, or $Z^2$ (e.g., a linking group such as $NR^1$, $PR^1$, P═$OR^1$, $AsR^1$, As═$OR^1$, $C(R^1)_2$, $CH(R^1)$, $Si(R^1)_2$, $SiH(R^1)$, $Ge(R^1)_2$, $GeH(R^1)$, $BR^1$, $BiR^1$, or Bi═$O(R^1)$) $R^1$ is as defined herein.

In one aspect, $L^2$ is aryl, cycloalkyl, cycloalkenyl, heteroaryl, heterocyclyl, carbene, or N-heterocyclic carbene. In one example, $L^2$ is aryl, cycloalkyl, cycloalkenyl, heteroaryl, or N-heterocyclyl. In another example, $L^2$ is aryl or heteroaryl. In yet another example, $L^2$ is aryl. In one aspect, $L^2$ is

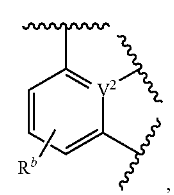

, for example,
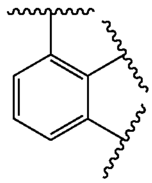
,
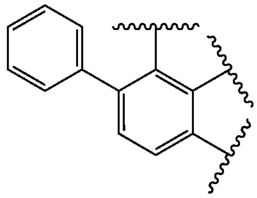
,
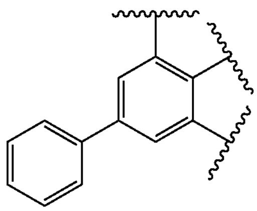
,
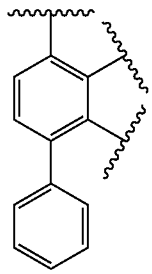
, or
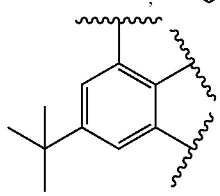
.
In another aspect, $L^2$ is
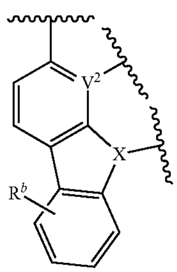
or
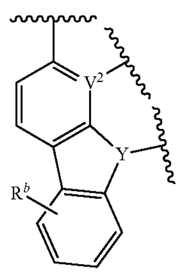
,
for example,
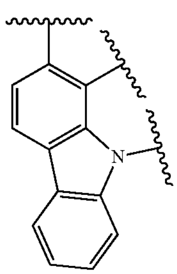
,
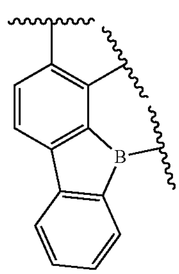
,
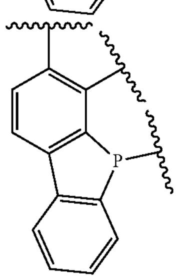
,
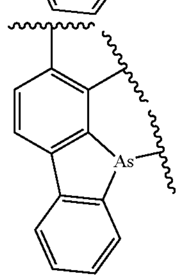
,
-continued
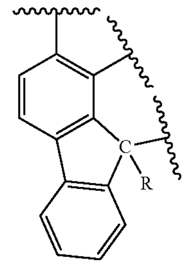
,
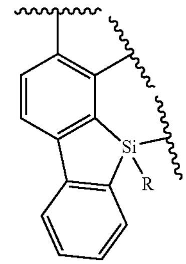
,
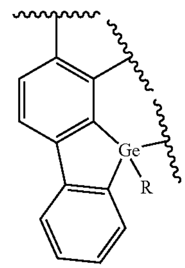
,
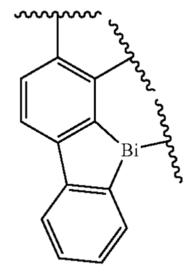
,
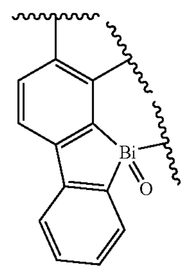
,
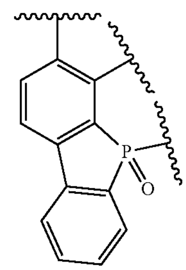
, or
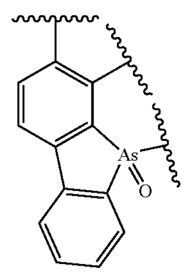
.
In another aspect, $L^2$ is
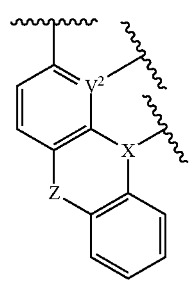
,
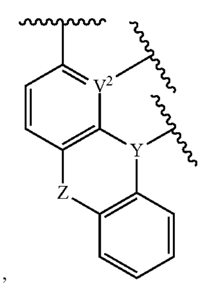
, or -continued

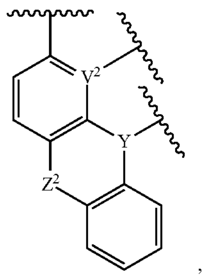

for example,

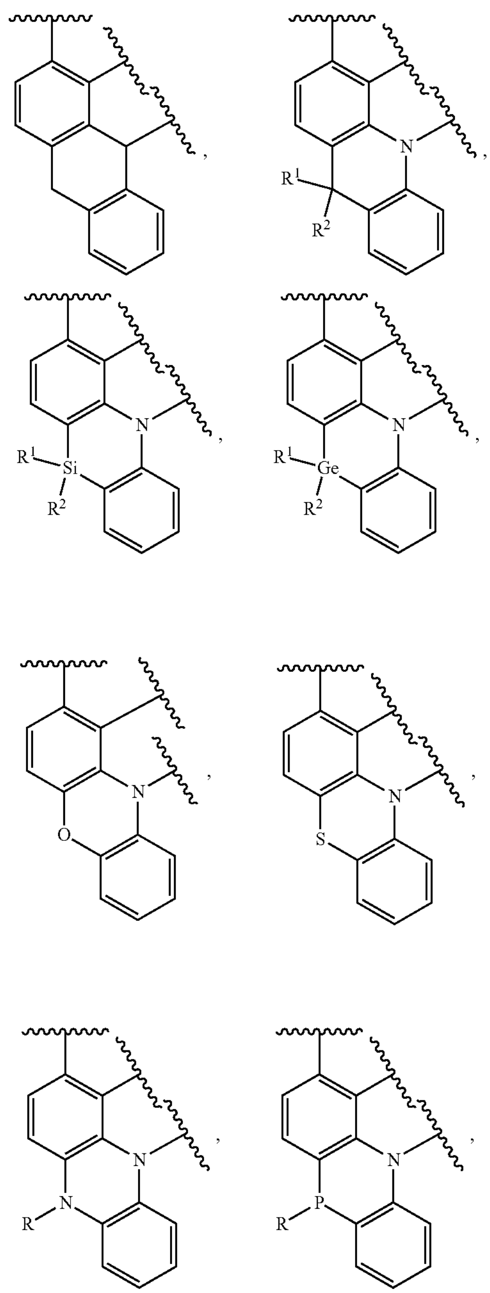

-continued

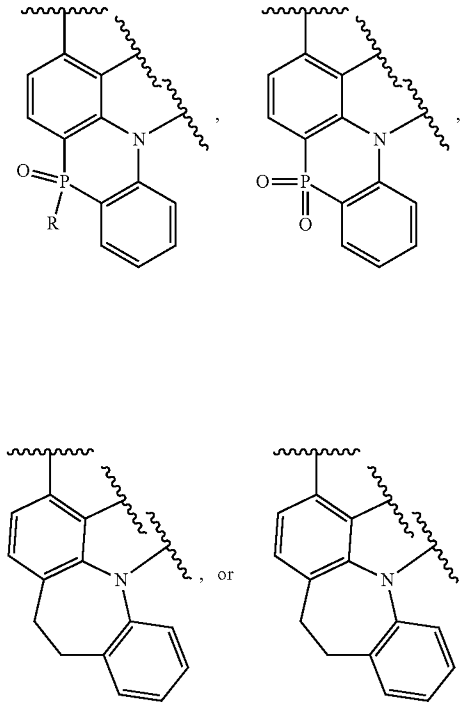

In another aspect, $L^2$ is

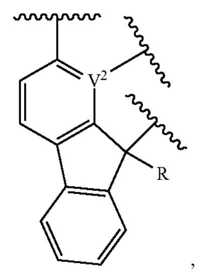

wherein each R, $R^1$, and $R^2$ is independently hydrogen, alkyl, alkenyl, alkynyl, aryl, cycloalkyl, cycloalkenyl, heteroaryl, heterocyclyl, halogen, hydroxyl, amino, or thiol. In one aspect, $V^2$ is N, C, P, B, or Si. In one example, $V^2$ is N or C. In another example, $V^2$ is C.

In one aspect, $L^3$ is aryl, cycloalkyl, cycloalkenyl, heteroaryl, heterocyclyl, carbene, or N-heterocyclic carbene. In one example, $L^3$ is aryl, cycloalkyl, cycloalkenyl, heteroaryl, or heterocyclyl. In another example, $L^3$ is aryl or heteroaryl. In yet another example, $L^3$ is aryl. In one aspect, $L^3$ represents

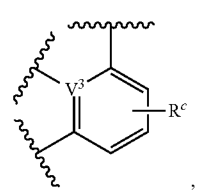

for example,
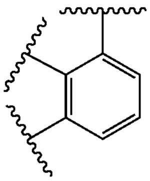, 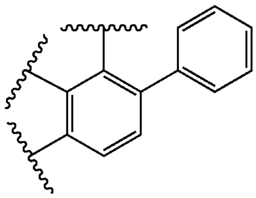, 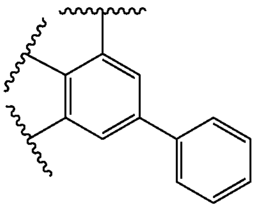, 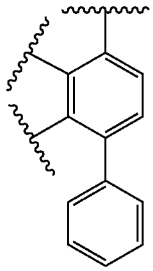, or 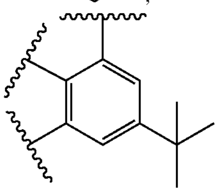.
In another aspect, $L^3$ is
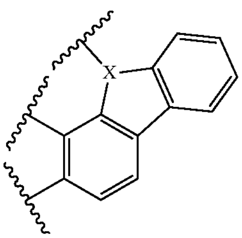, 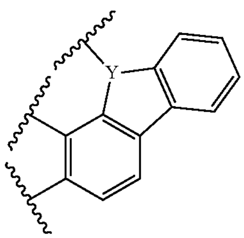, 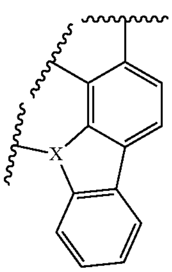 or 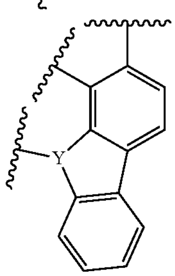,
for example,
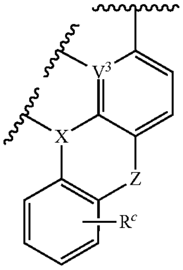, 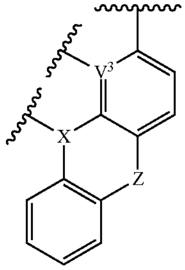, or
-continued
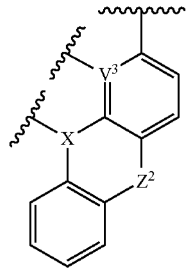,
In another aspect, $L^3$ is
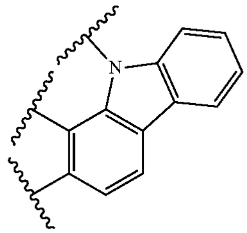, 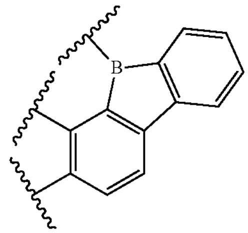, 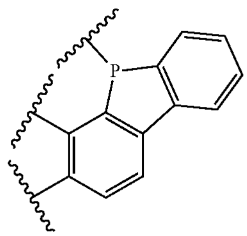, 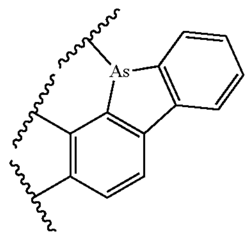, 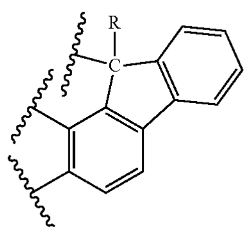, 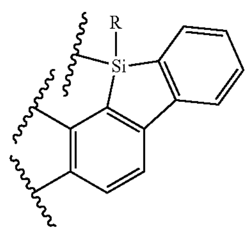, 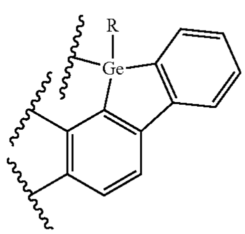, 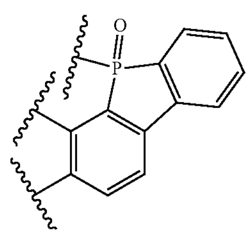, or 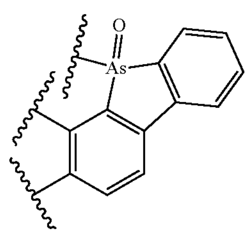.

for example,

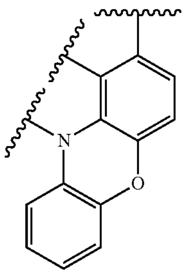,
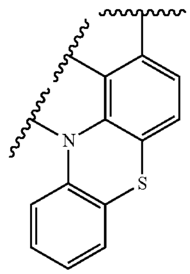,
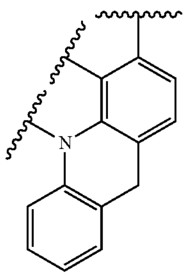,
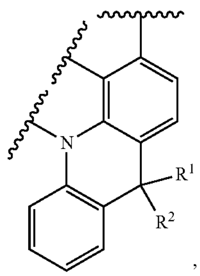,
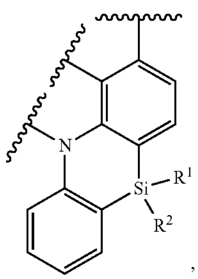,
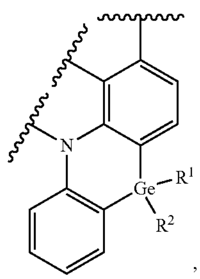,
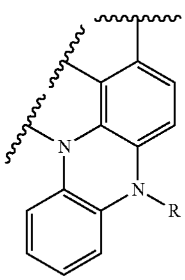,
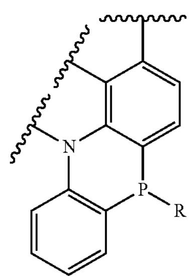,
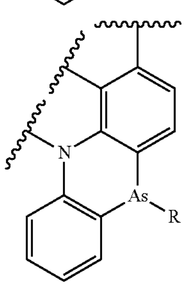,
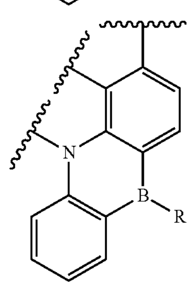,
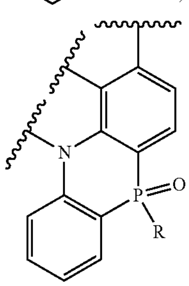,
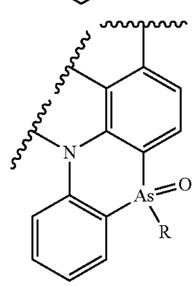, -continued

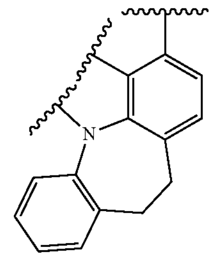, or 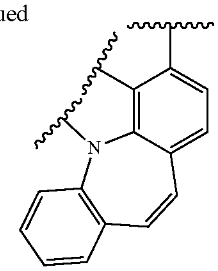.

wherein each of R, $R^1$, and $R^2$ is independently hydrogen, alkyl, alkenyl, alkynyl, aryl, cycloalkyl, cycloalkenyl, heteroaryl, heterocyclyl, halogen, hydroxyl, amino, or thiol. In one aspect, $V^3$ is N, C, P, B, or Si. In one example, $V^3$ is N or C. In another example, $V^3$ is C.

In one aspect, $L^4$ is aryl, cycloalkyl, cycloalkenyl, heteroaryl, heterocyclyl, carbene, or N-heterocyclic carbene. For example, $L^4$ is aryl, cycloalkyl, cycloalkenyl, heteroaryl, or heterocyclyl. In another example, $L^4$ is aryl or heteroaryl. In yet another example, $L^4$ is heteroaryl. In yet another example, $L^4$ is heterocyclyl. It is understood that, $V^4$ can be a part of $L^4$ and is intended to include the description of $L^4$ above. In one aspect, $L^4$ is

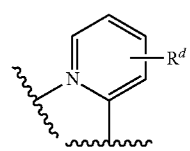.

for example,

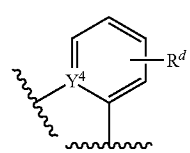,

In yet another aspect, $L^4$ is

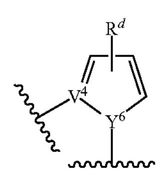, for example,

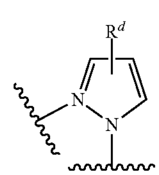.

In yet another aspect, $L^4$ is

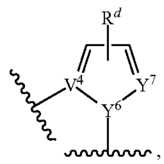

for example,

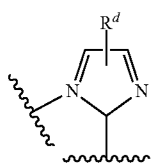
and
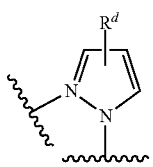
.

In yet another aspect, $L^4$ is

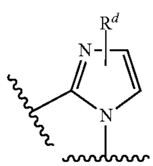
or
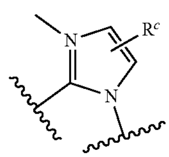
.

In yet another aspect, $L^4$ is

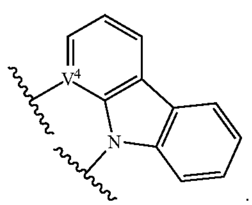
.

In one aspect, $V^4$ represents N, C, P, B, or Si. In one example, $V^4$ is N or C. In another example, $V^4$ is N.

In one aspect, the platinum, palladium, gold, iridium, or rhodium complexes depicted in this disclosure includes the following structures.

Structures Pt-1

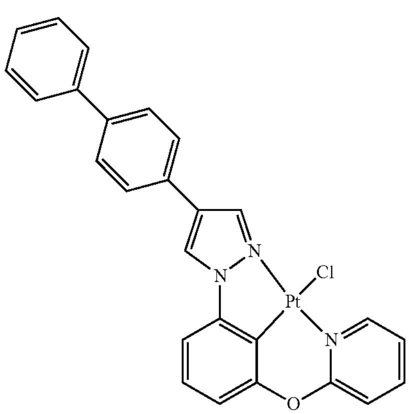

-continued

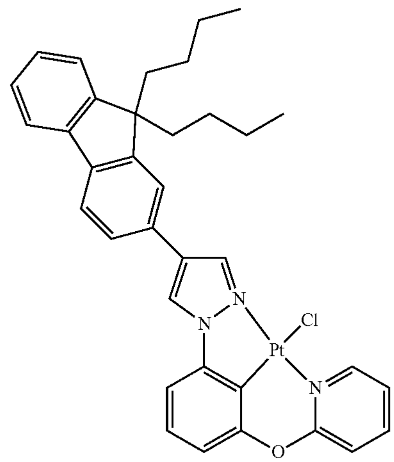

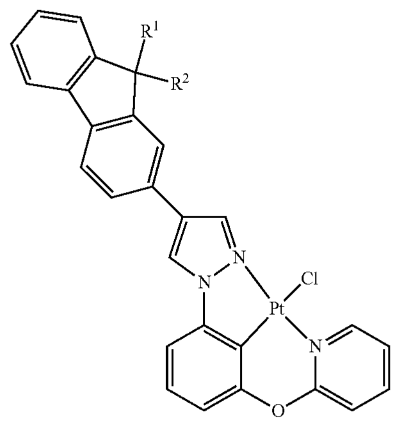

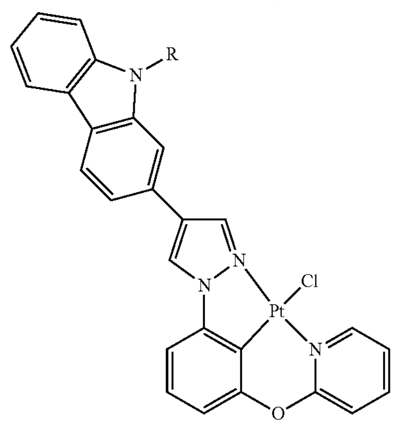

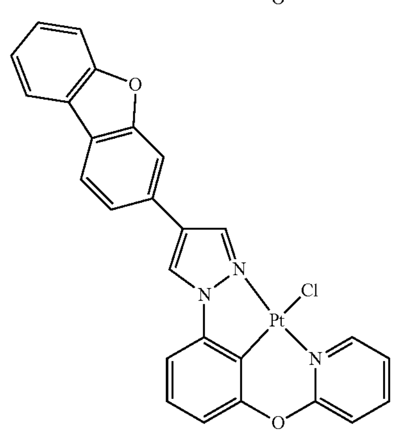

-continued
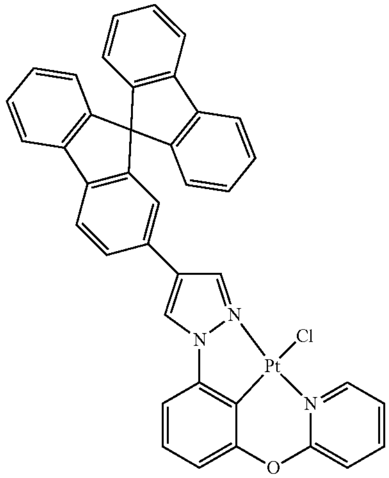
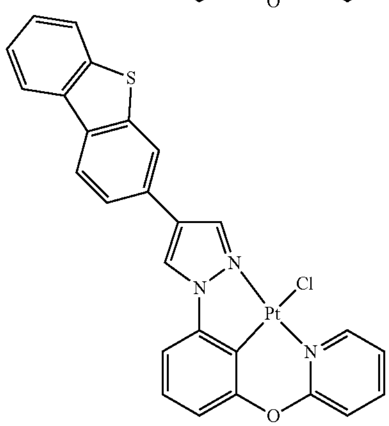
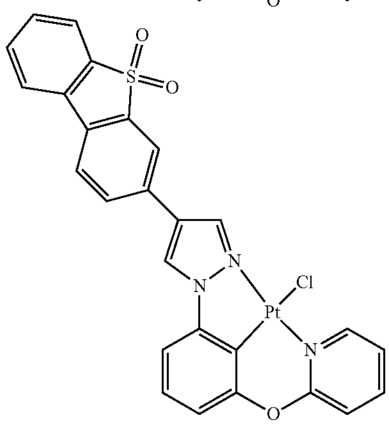
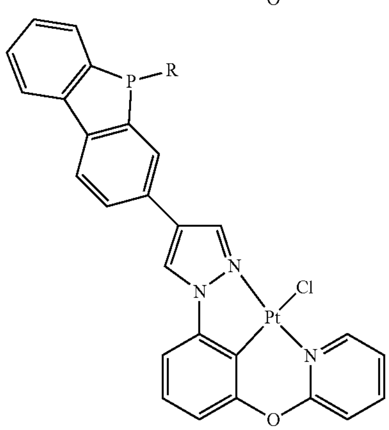
-continued
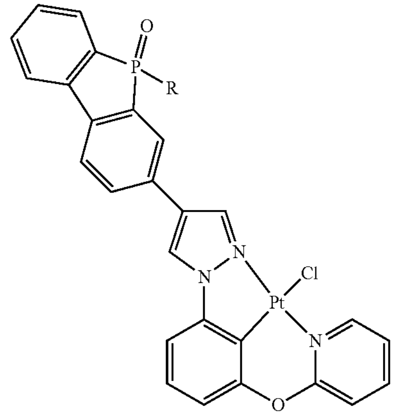
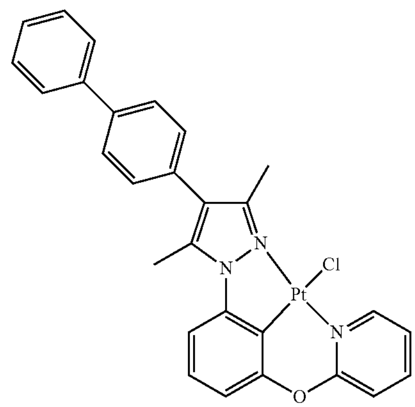
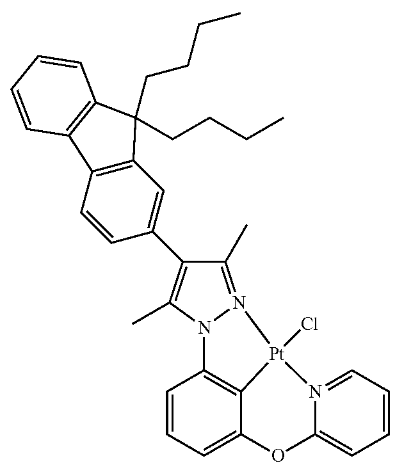
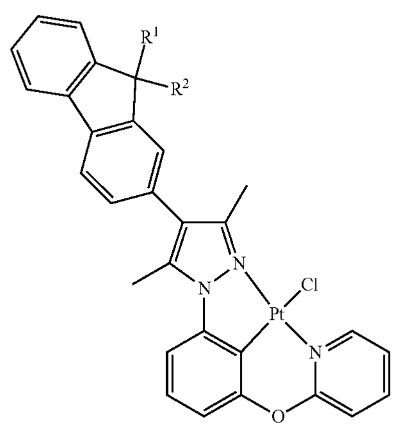

-continued
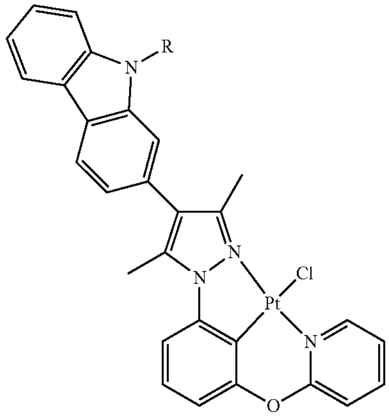
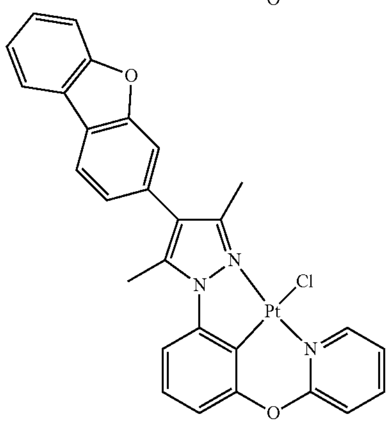
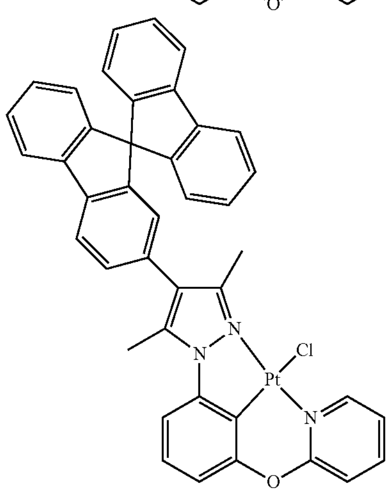
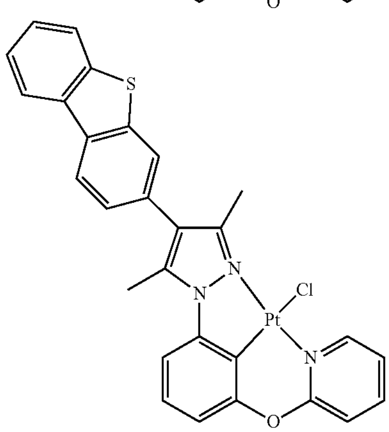
-continued
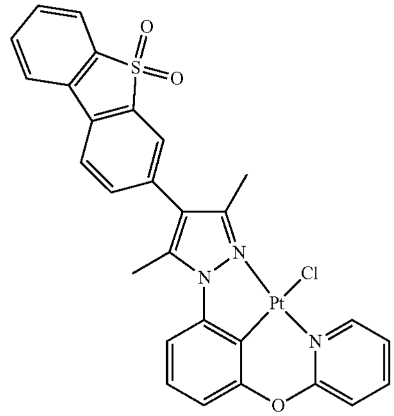
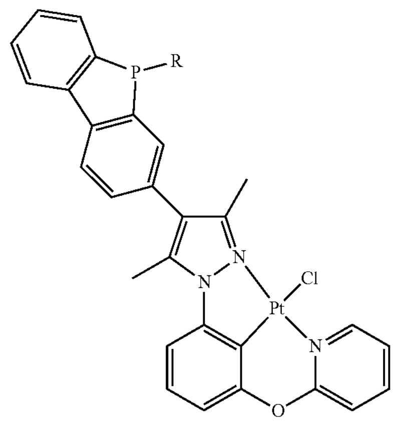
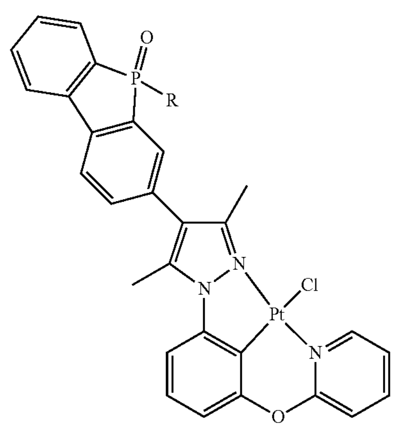
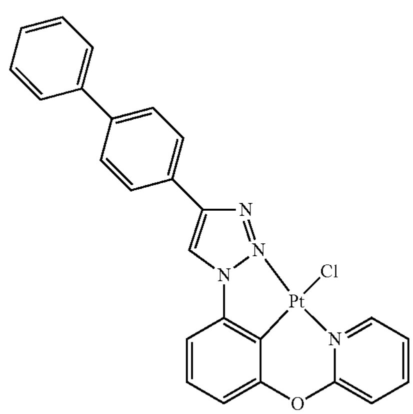

-continued
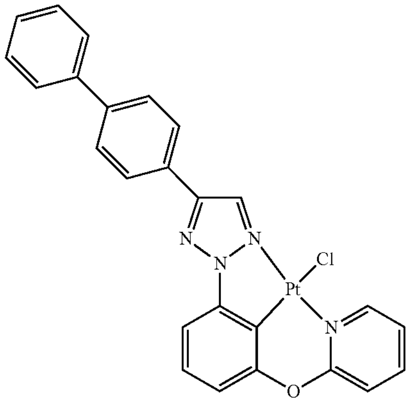
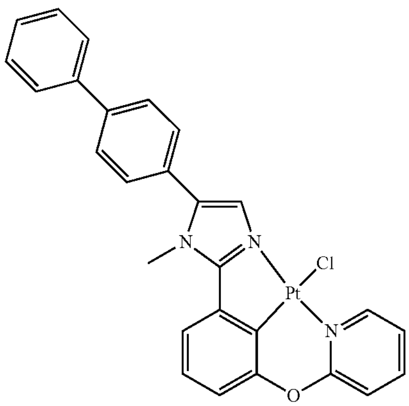
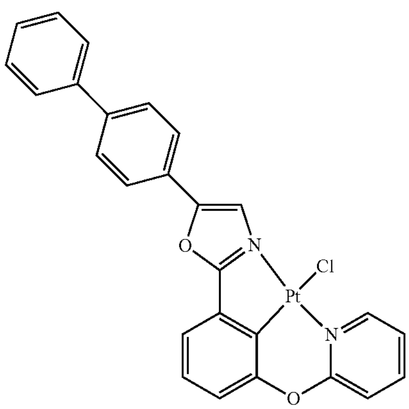
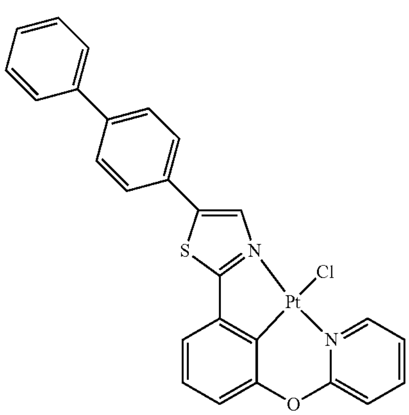
-continued
Structures Pt-2
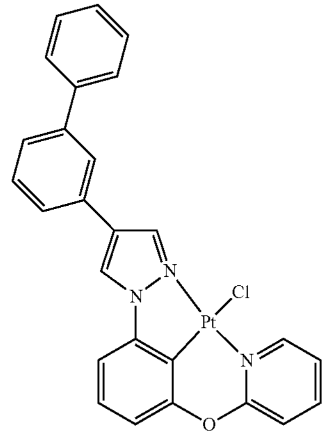
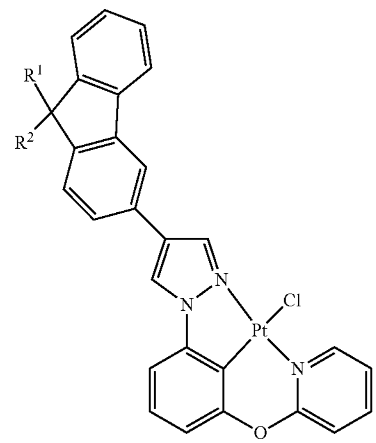
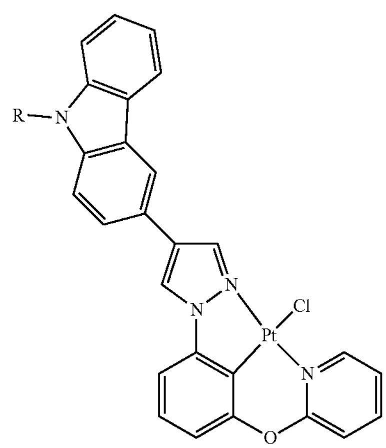

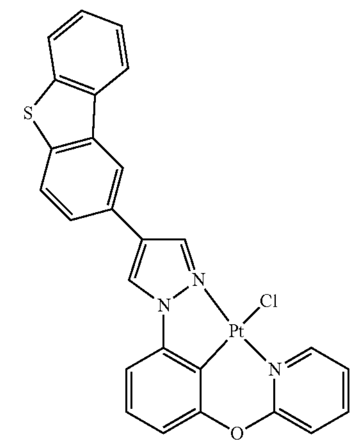
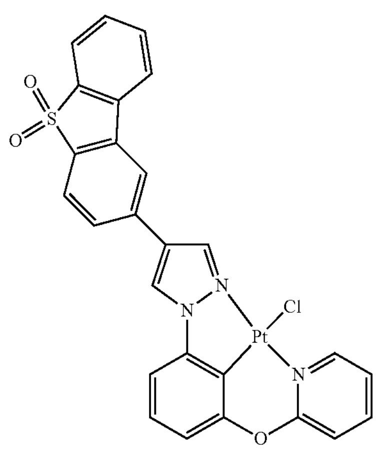
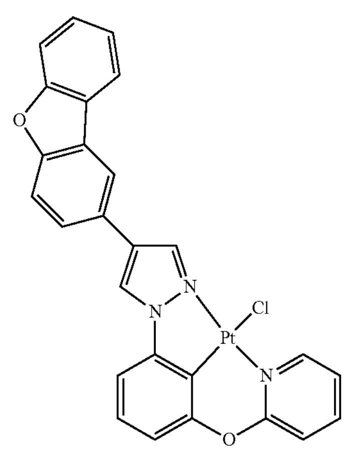
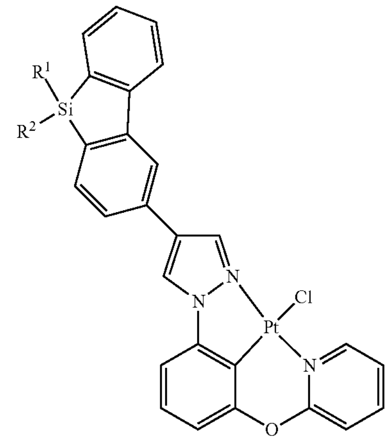
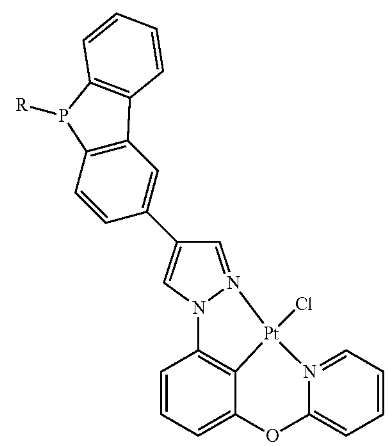
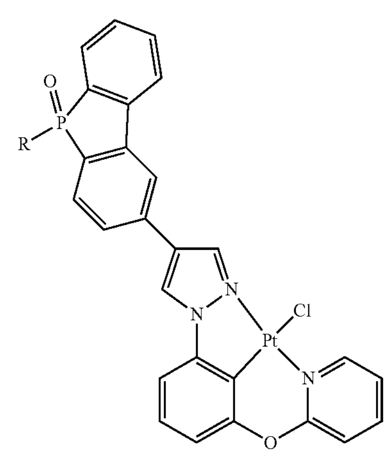

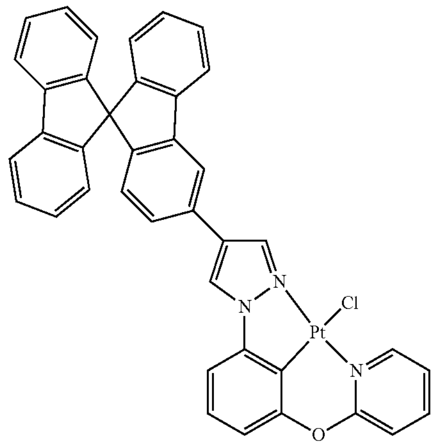
N
N
Cl
Pt
N
O
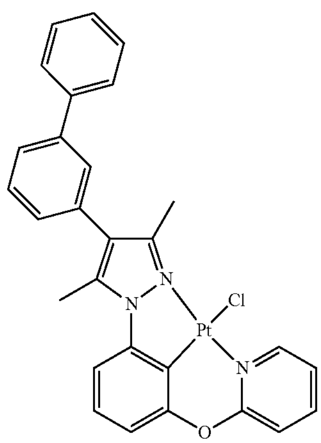
N
N
Cl
Pt
N
O
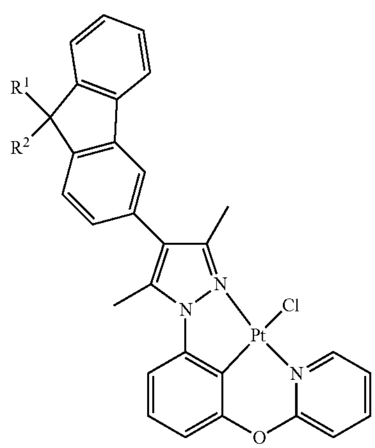
R1
R2
N
N
Cl
Pt
N
O
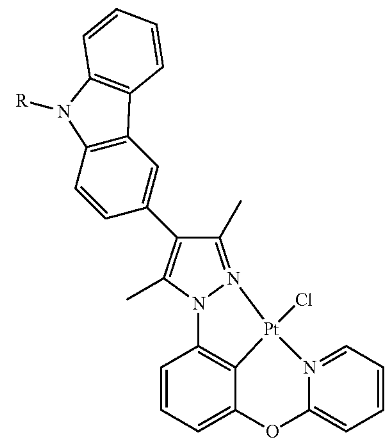
R
N
N
N
Cl
Pt
N
O
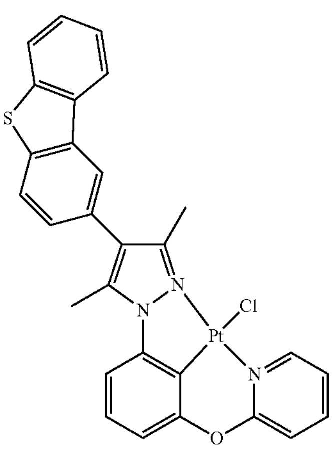
S
N
N
Cl
Pt
N
O
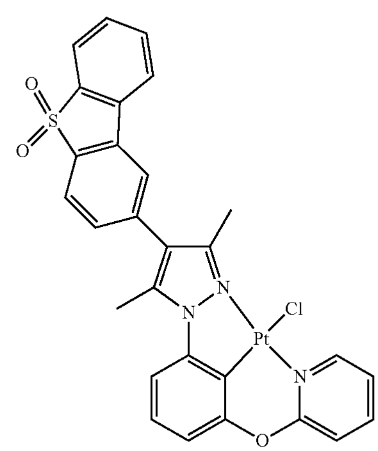
O
S
O
N
N
Cl
Pt
N
O

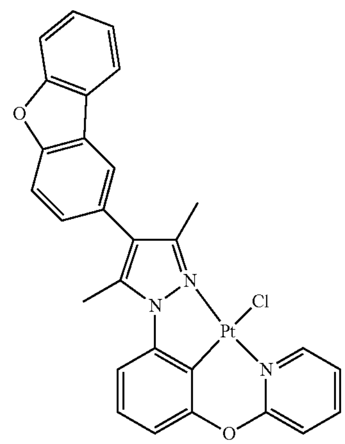
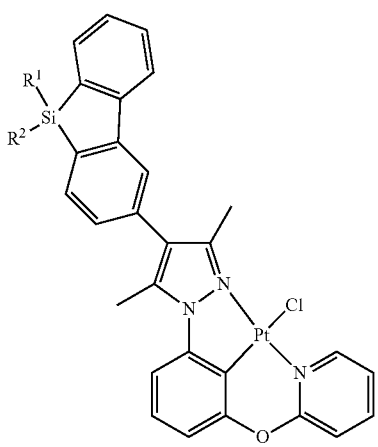
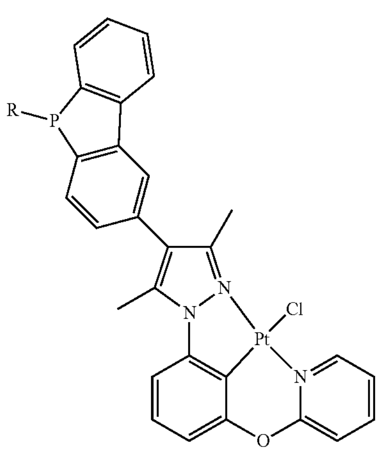
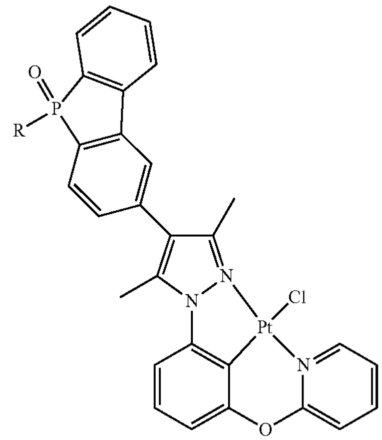
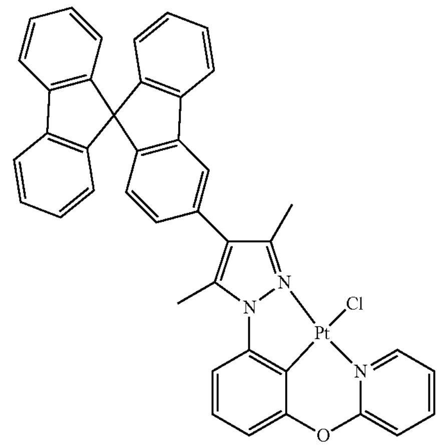
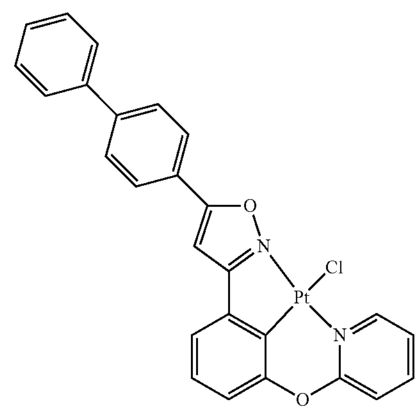
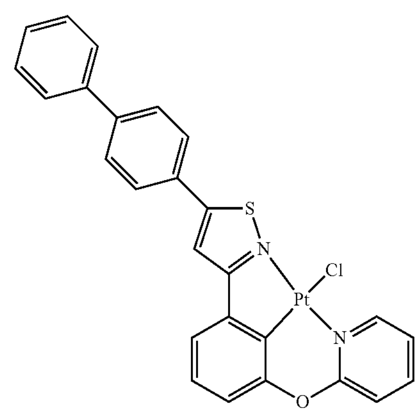

-continued
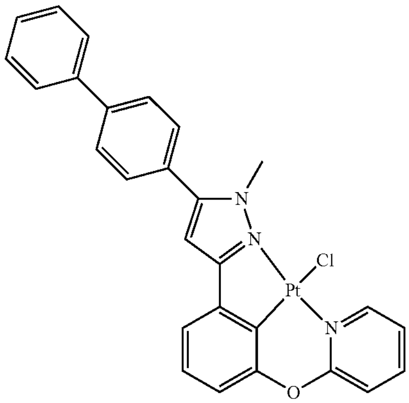
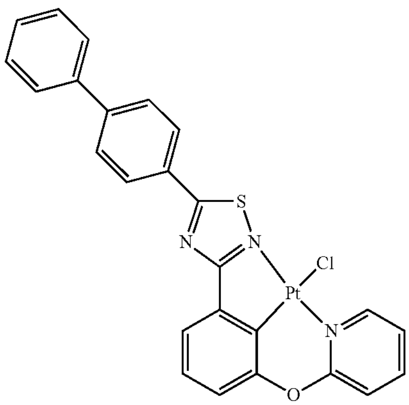
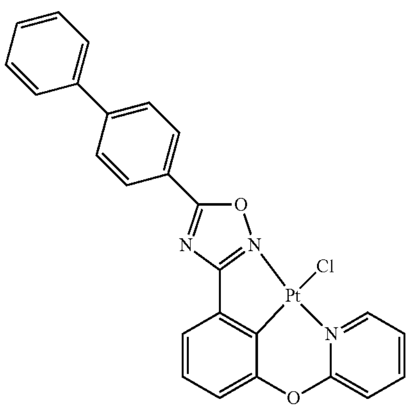
Structures Pt-3
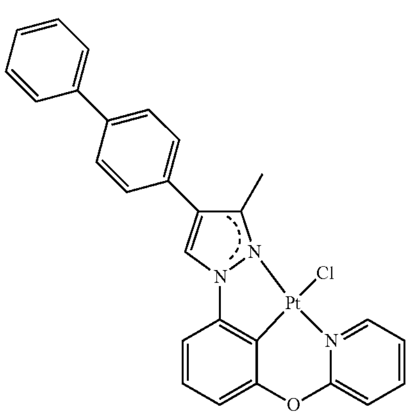
-continued
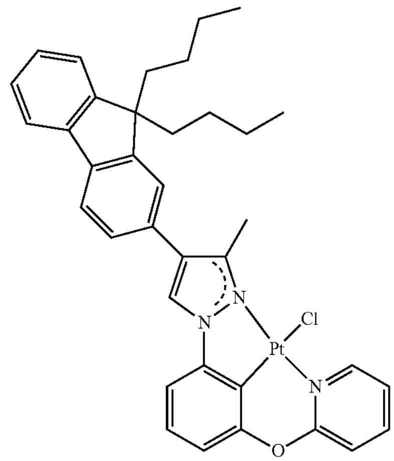
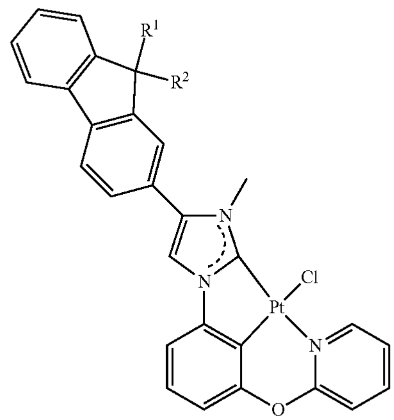
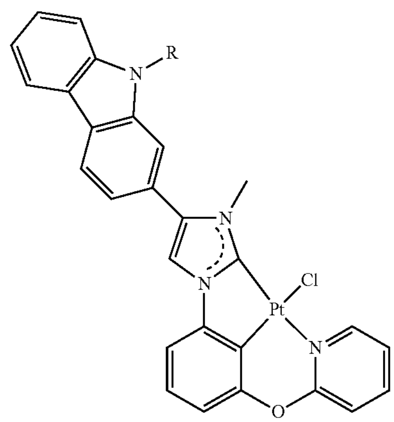
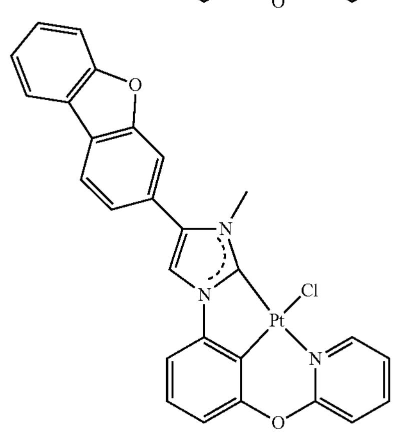

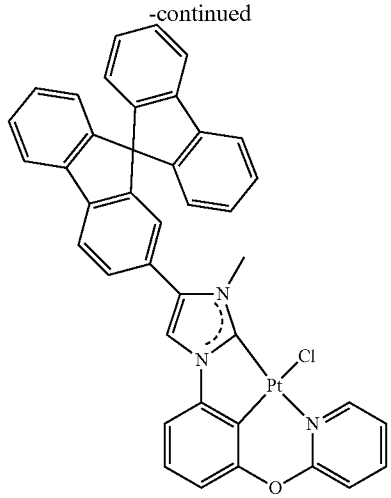
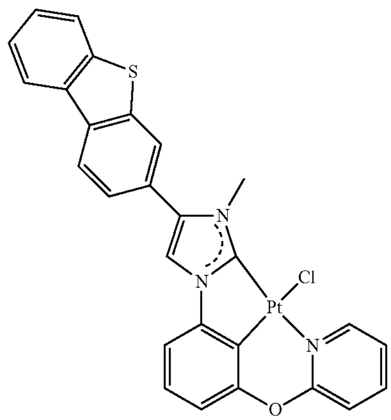
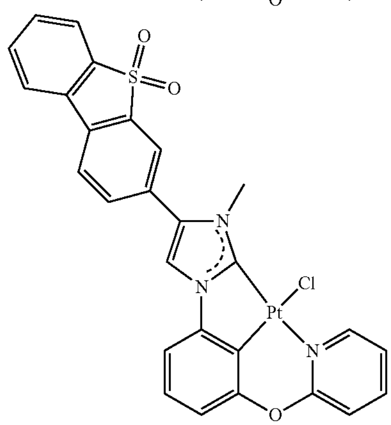
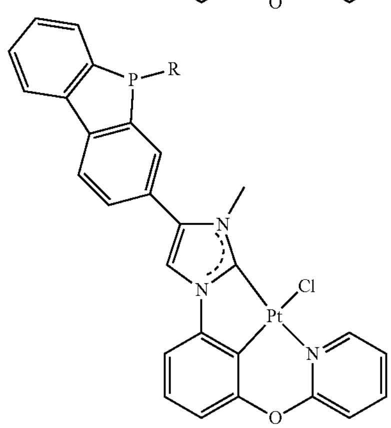
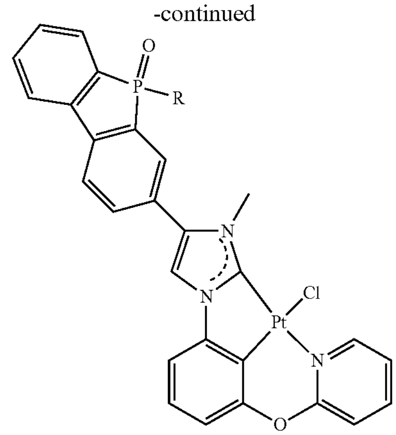
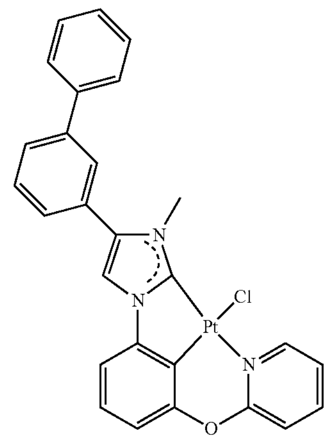
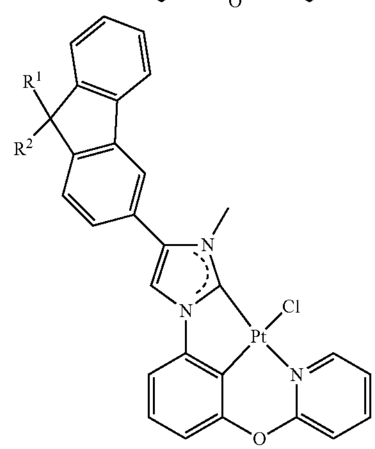
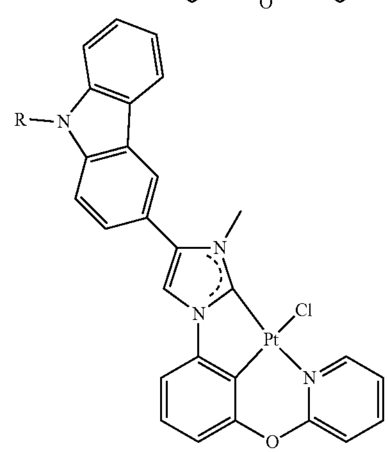

-continued
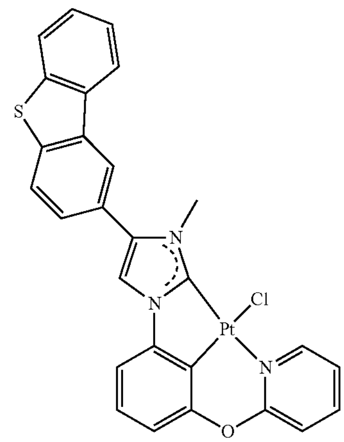
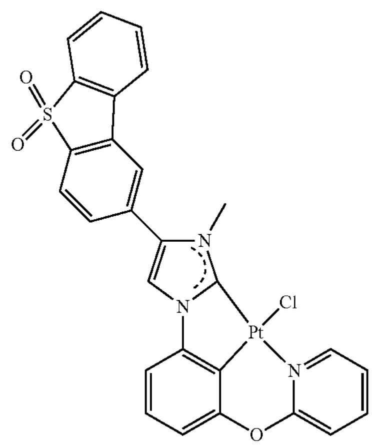
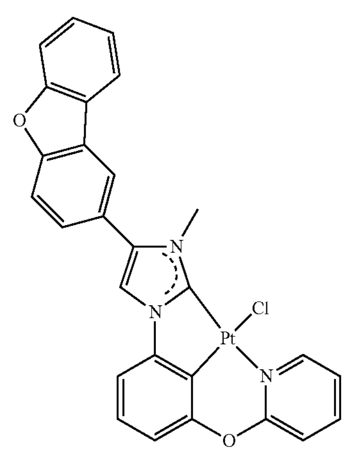
-continued
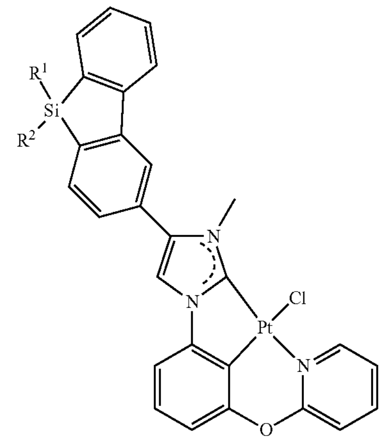
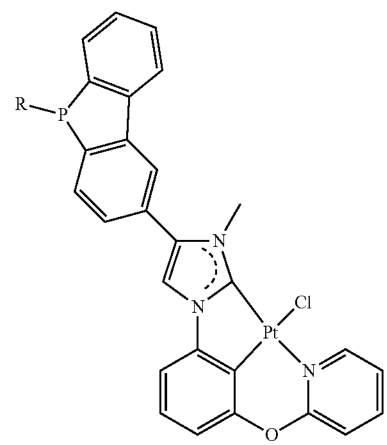
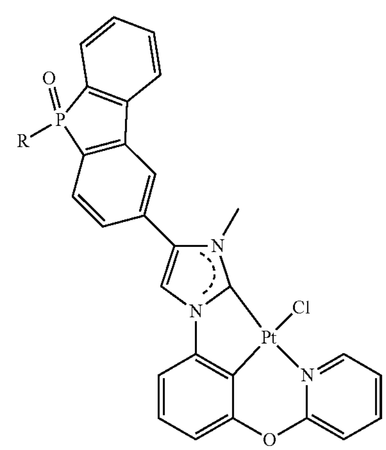

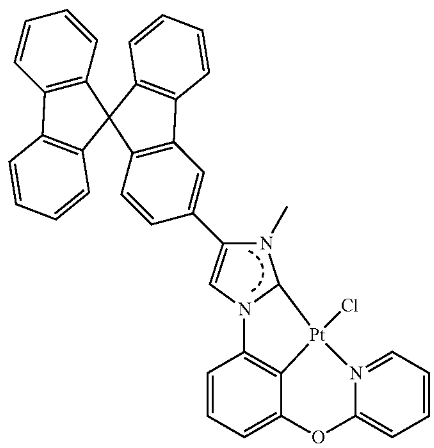
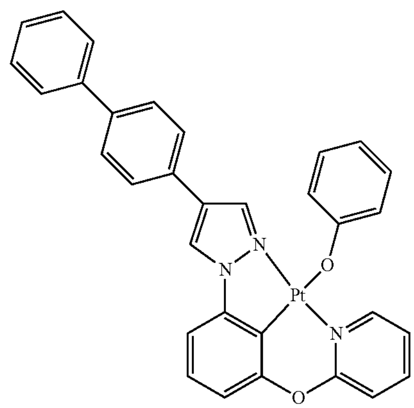
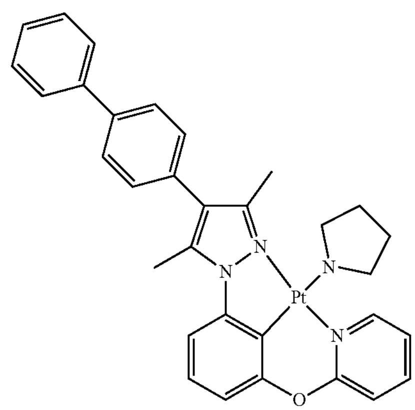
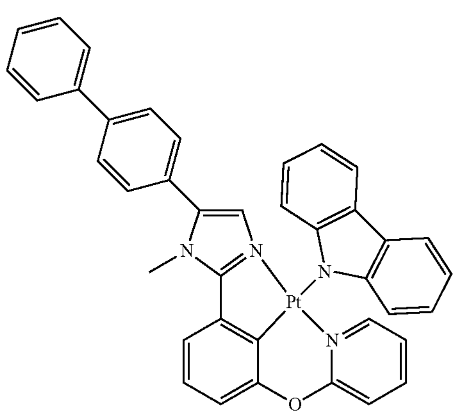
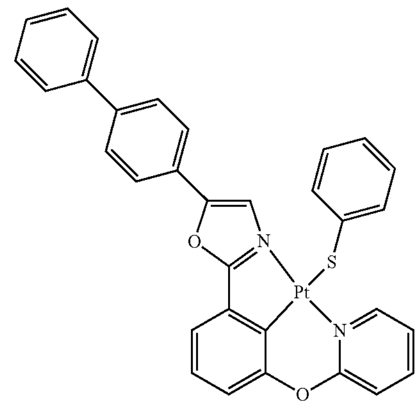
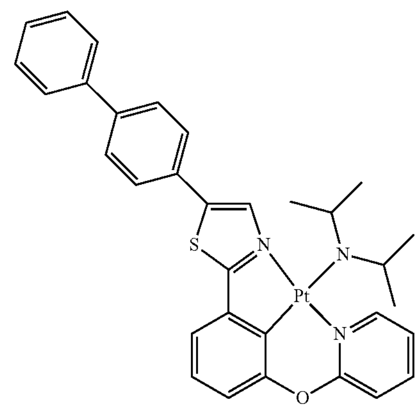
Structures Pt-4
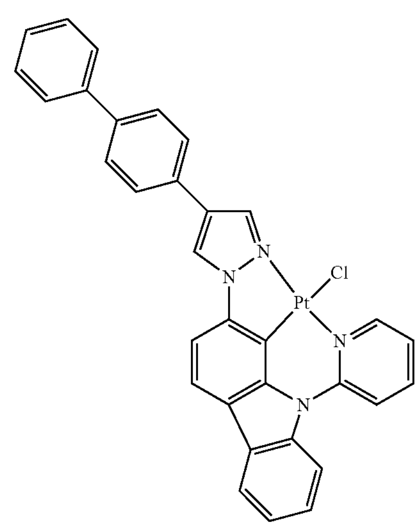

-continued
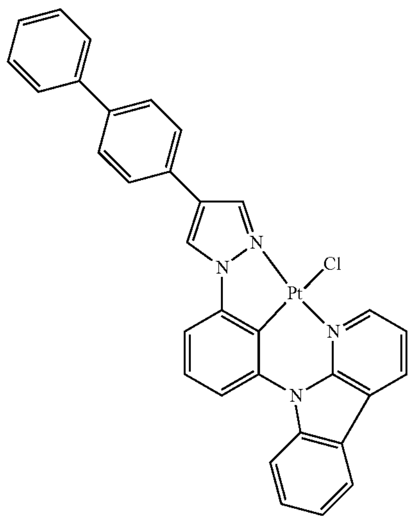
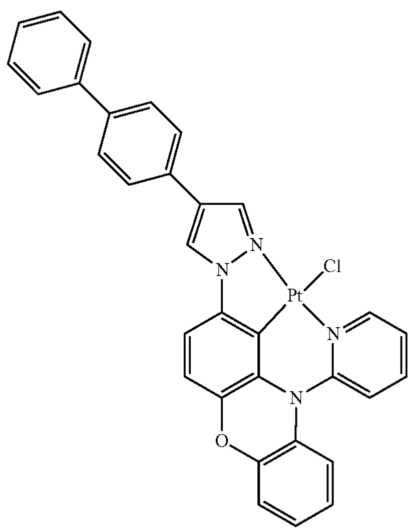
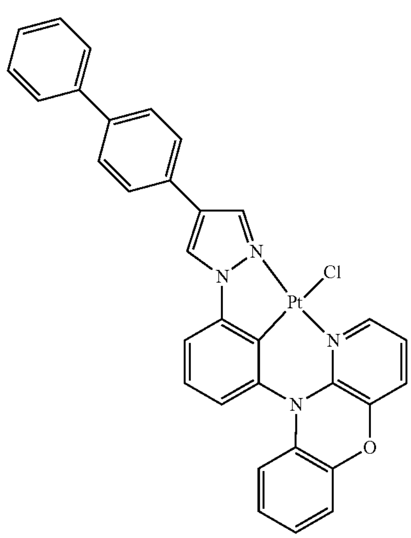
-continued
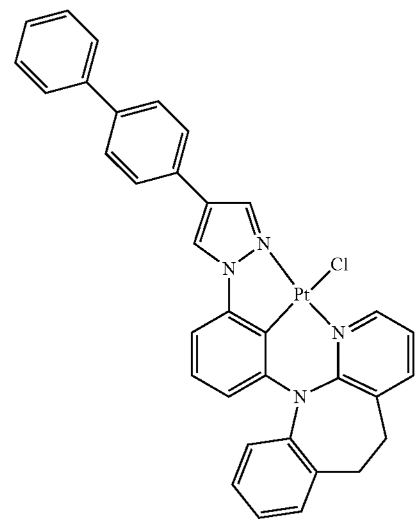
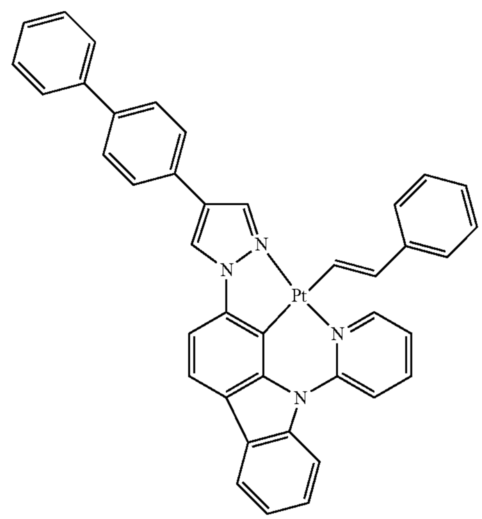
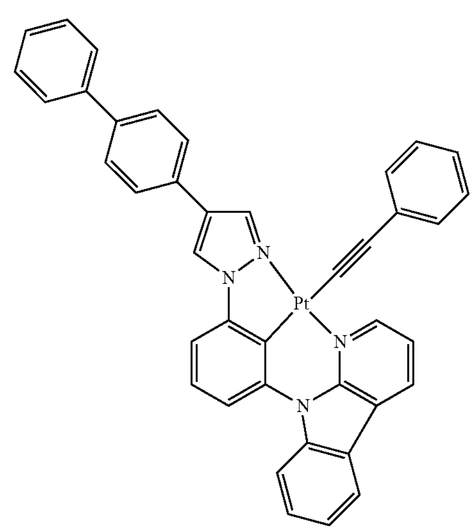

-continued
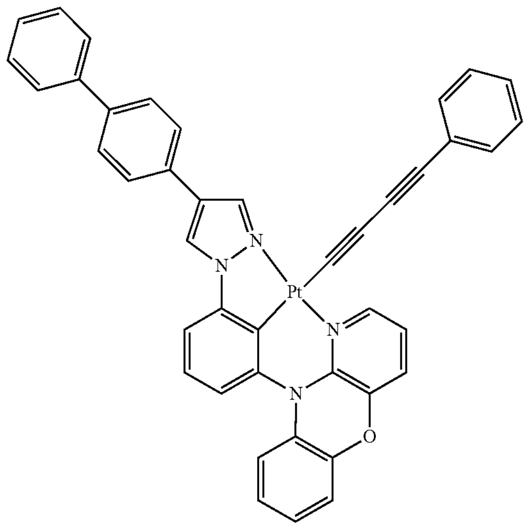
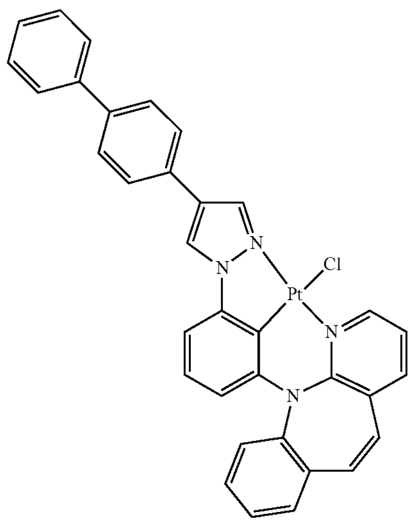
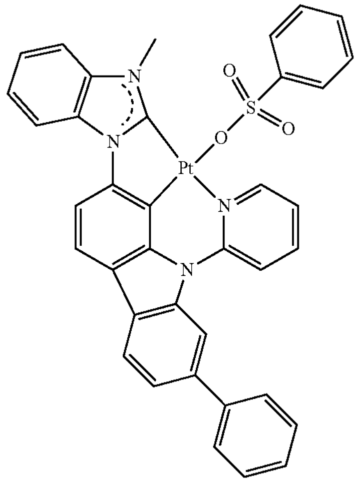
-continued
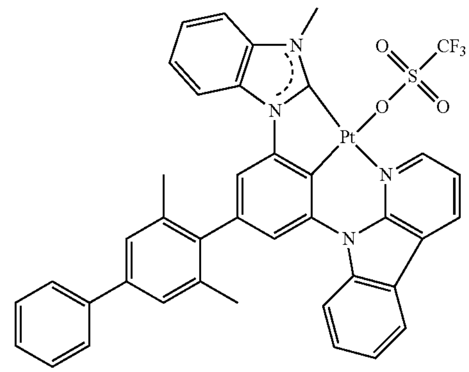
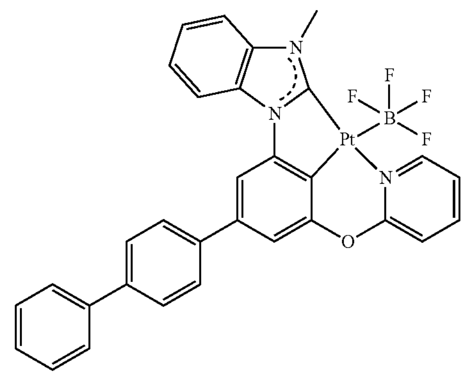
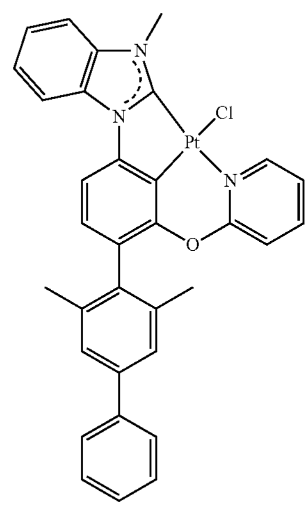
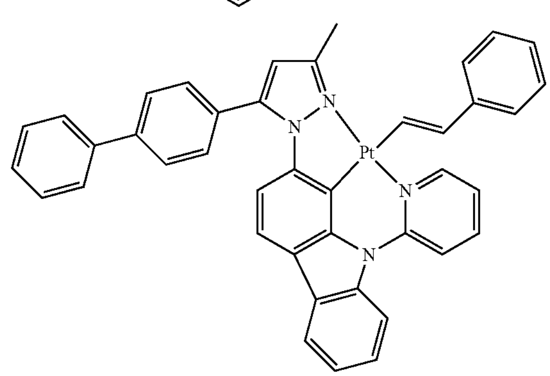

-continued
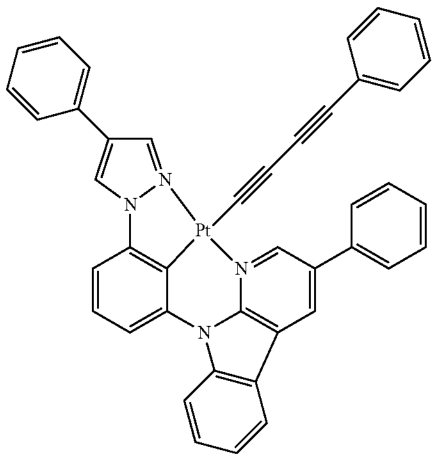
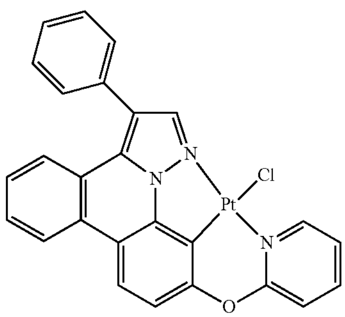
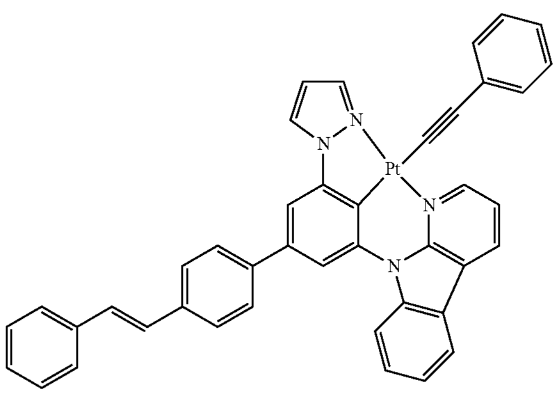
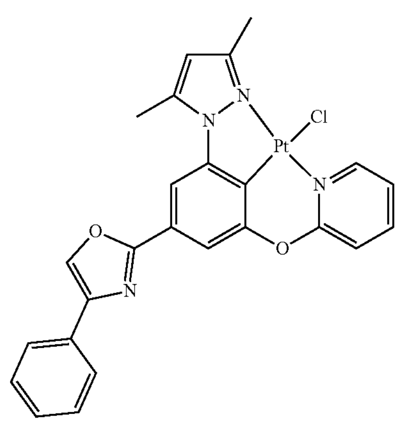
-continued
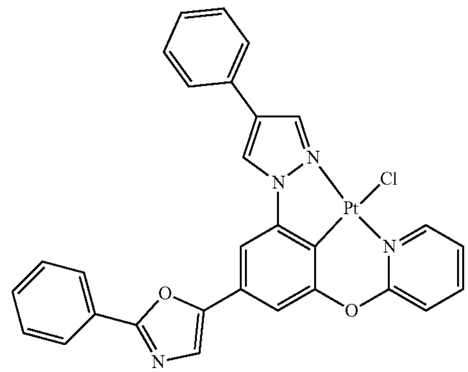
Structures Pt-5
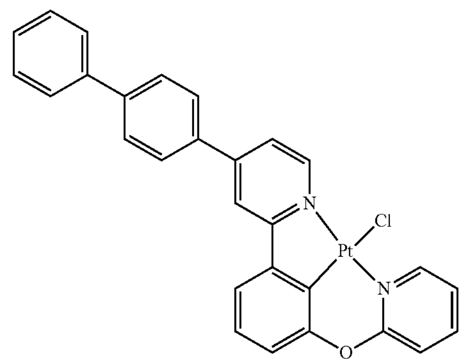
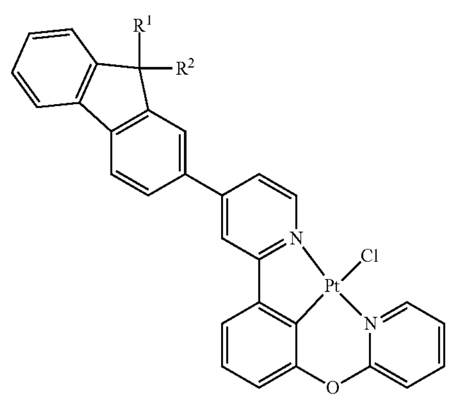
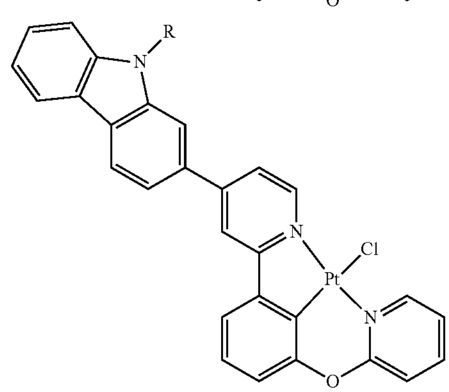

-continued
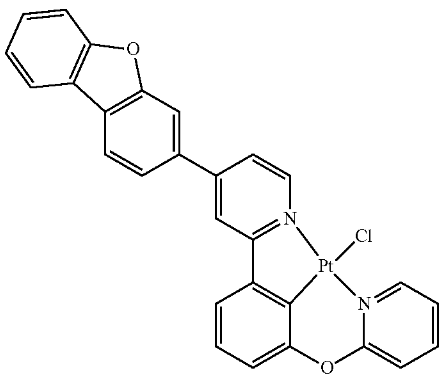
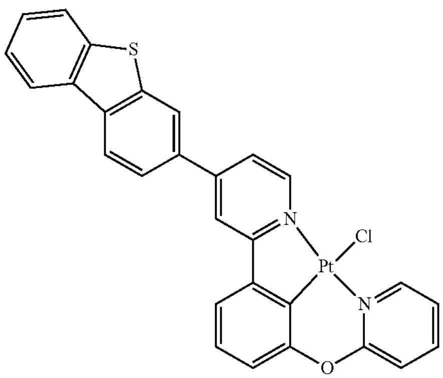
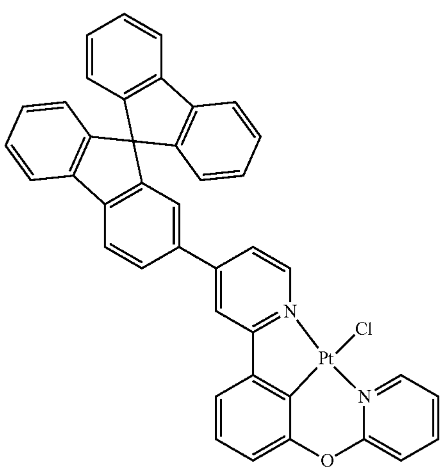
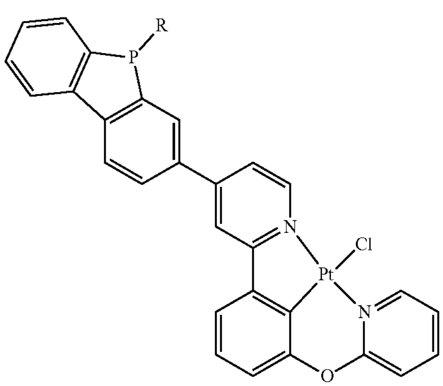
-continued
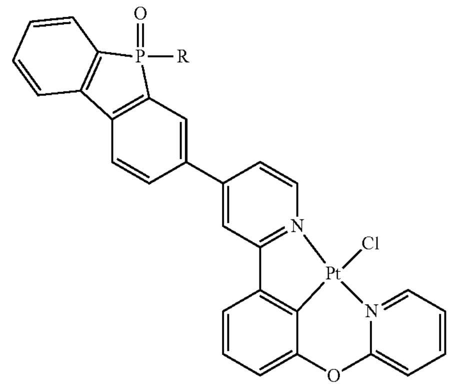
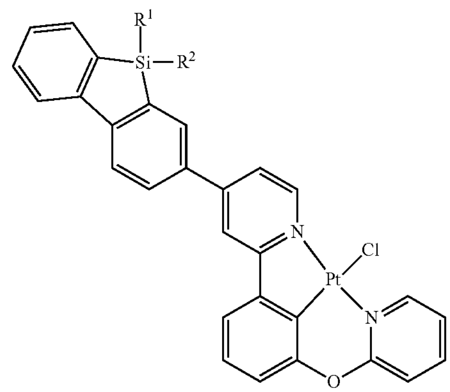
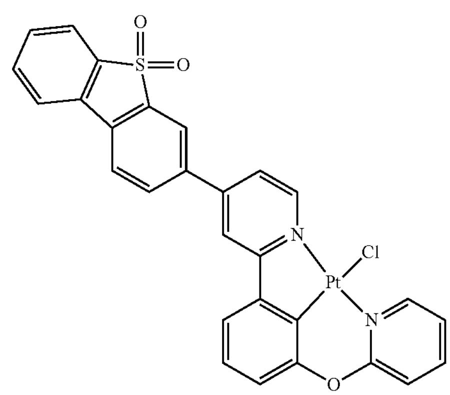
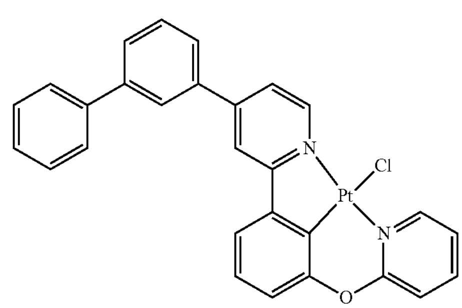

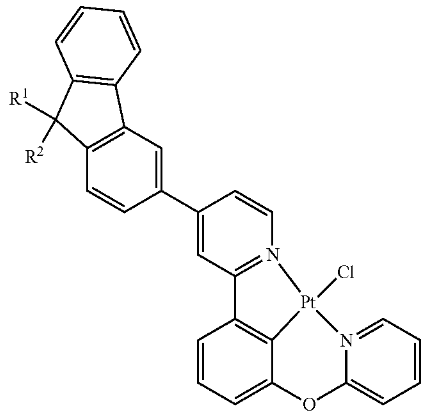
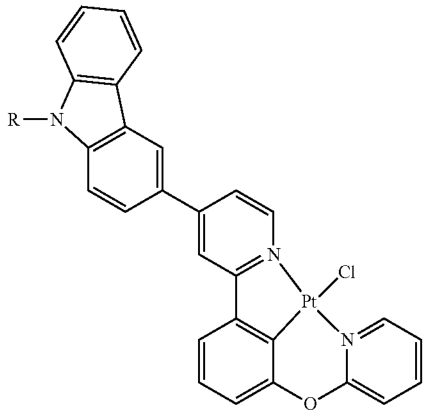
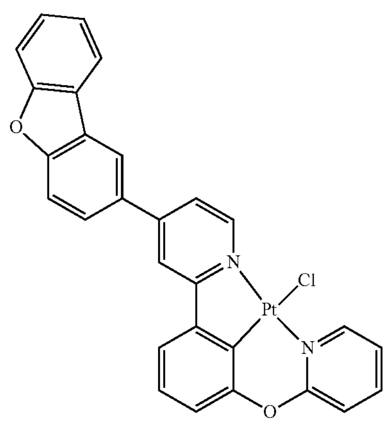
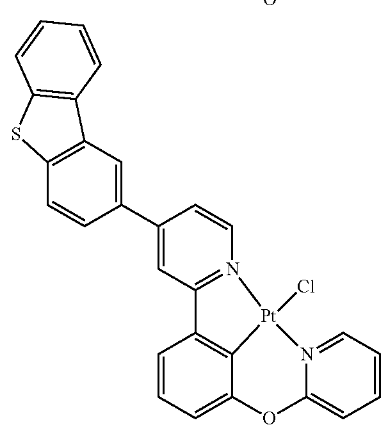
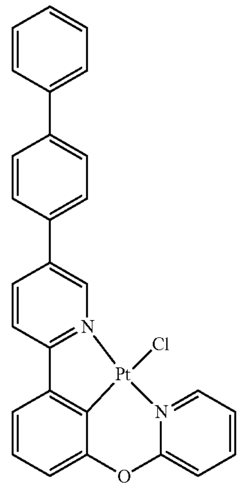
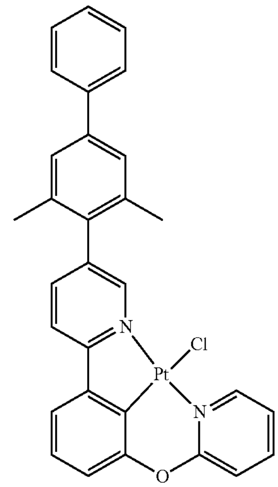
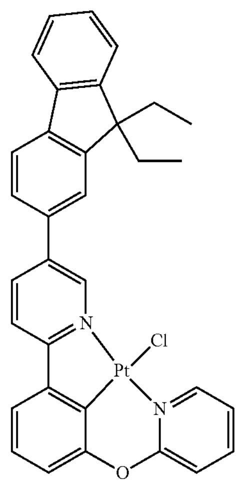
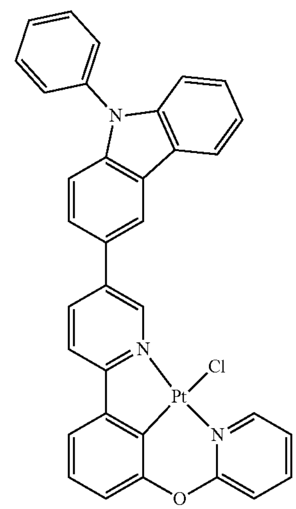
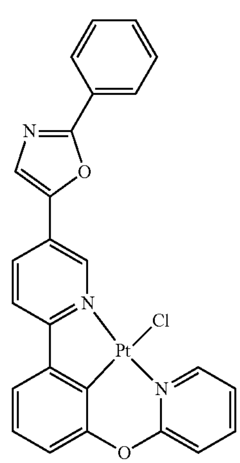
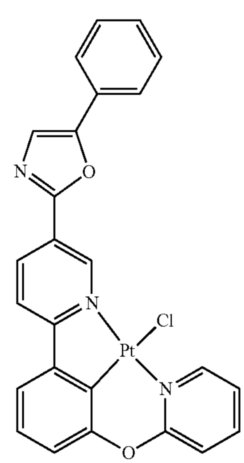

-continued
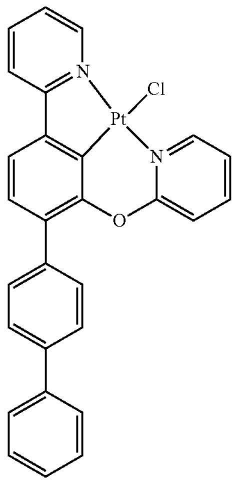
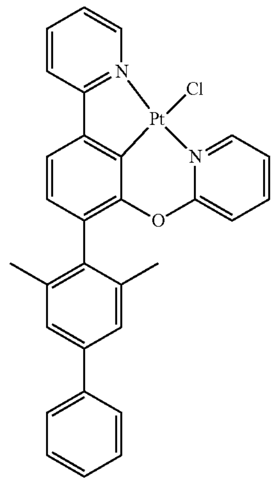
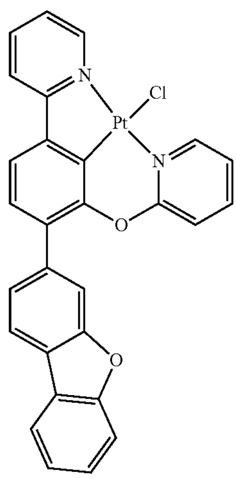
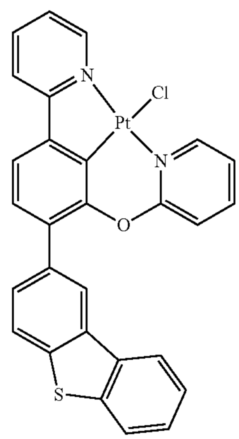
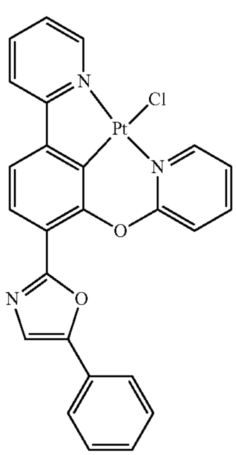
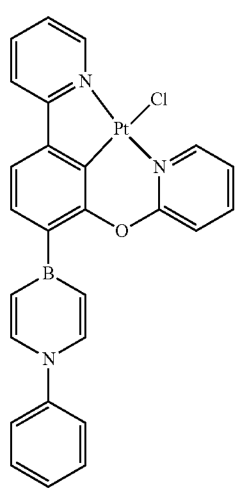
-continued
Structures Pt-6
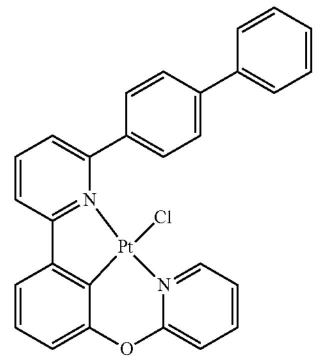
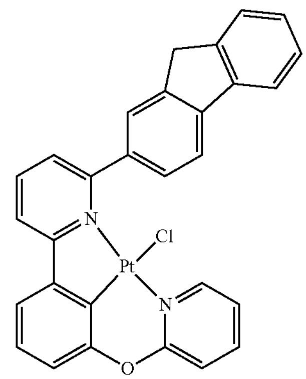
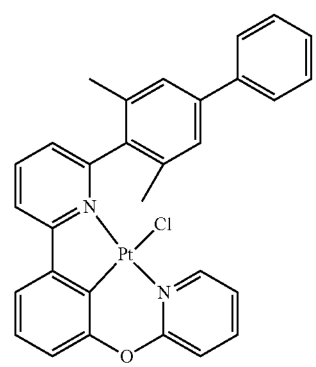
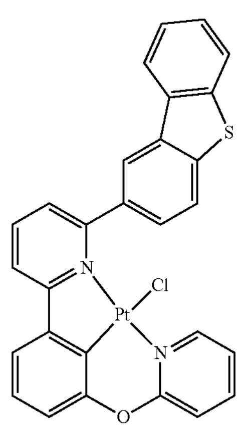
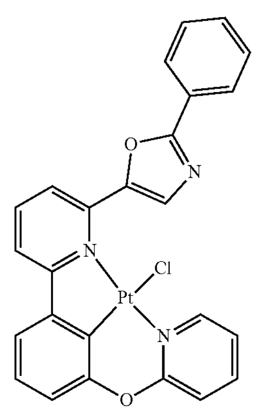

-continued
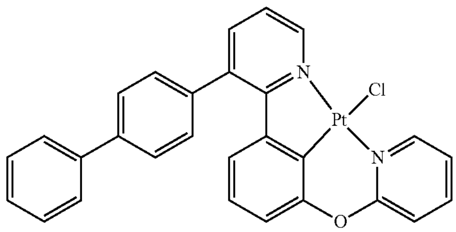
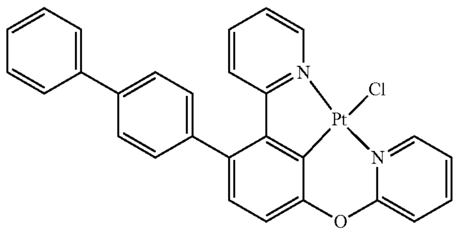
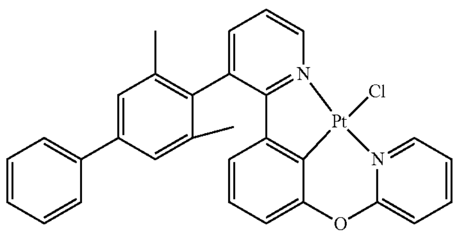
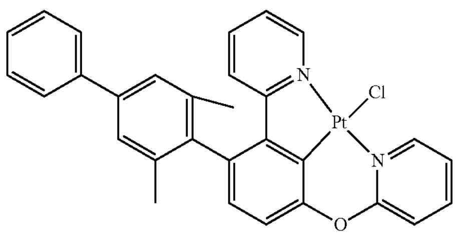
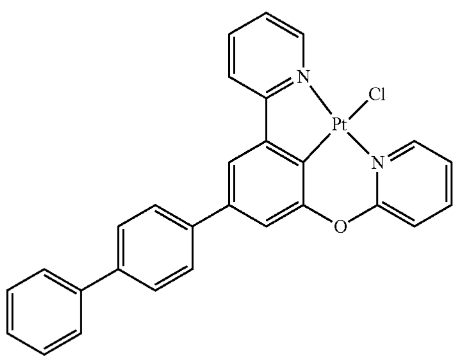
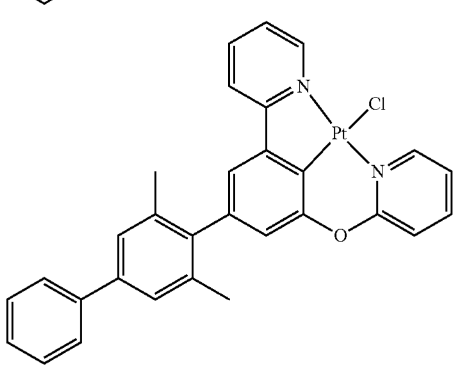
-continued
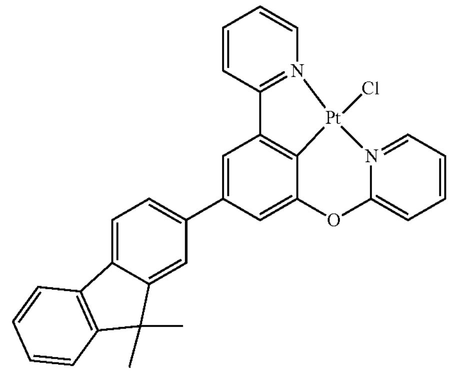
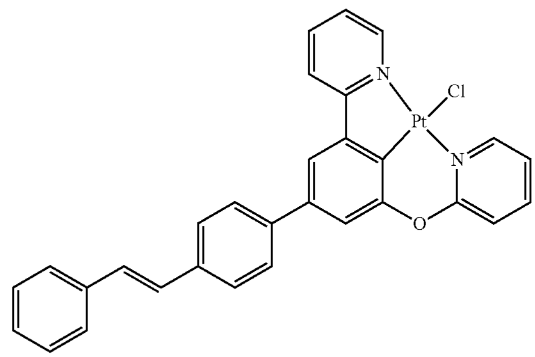
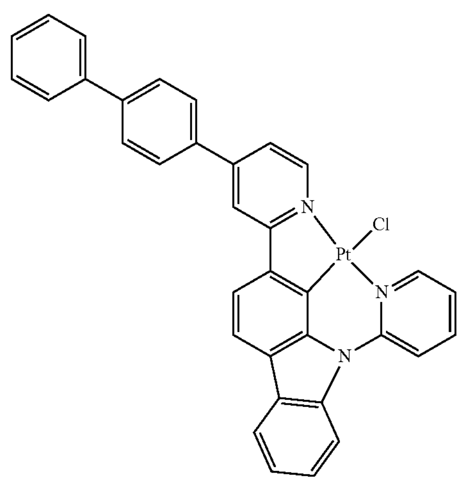
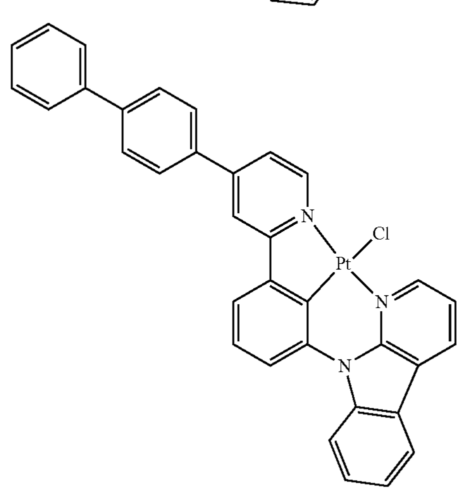

-continued
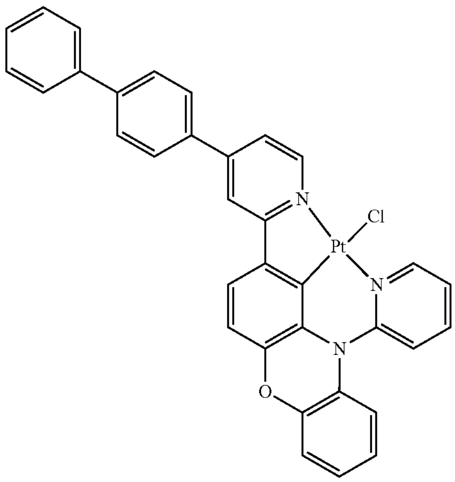
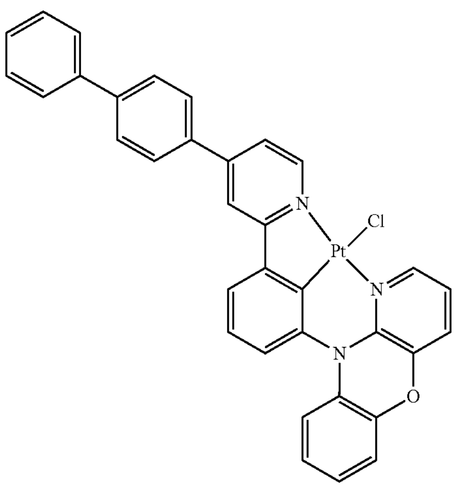
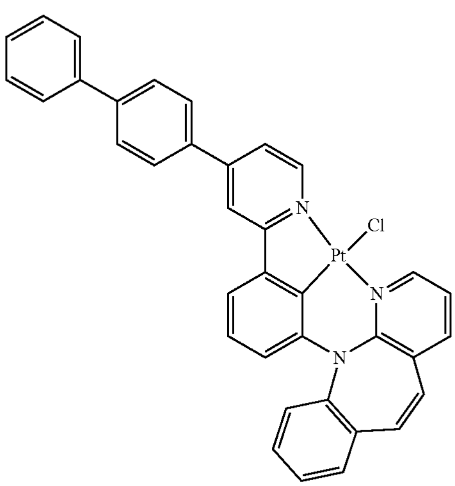
-continued
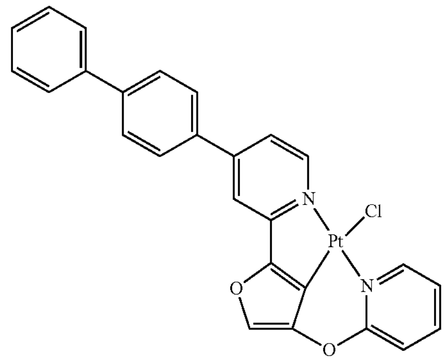
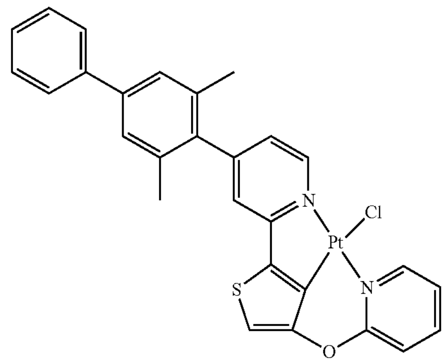
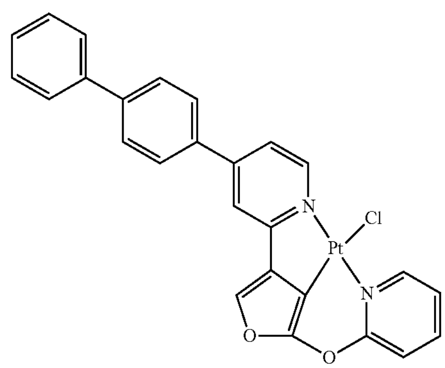
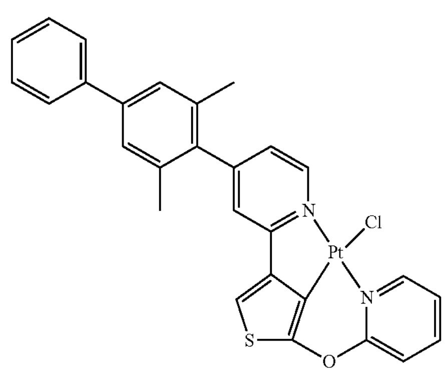

-continued
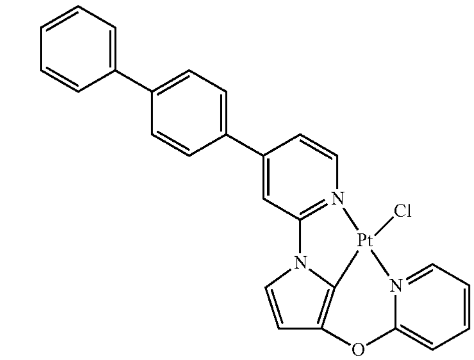
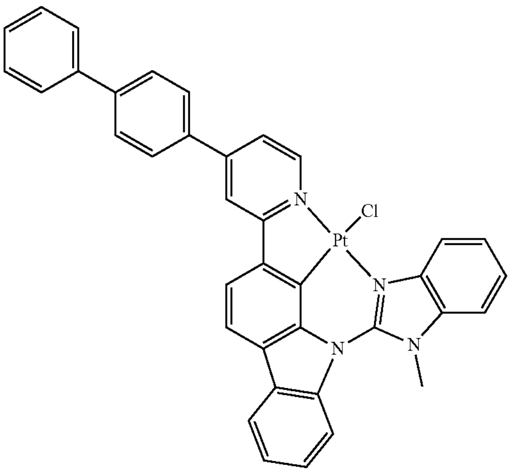
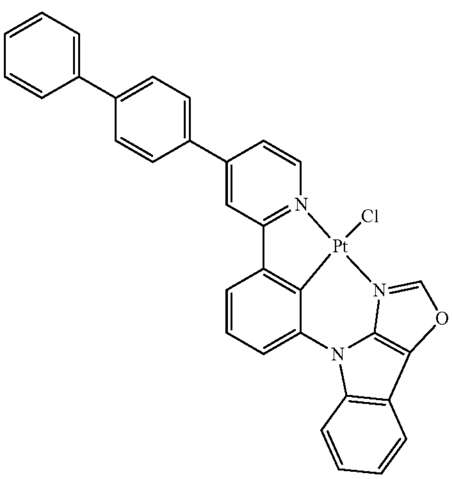
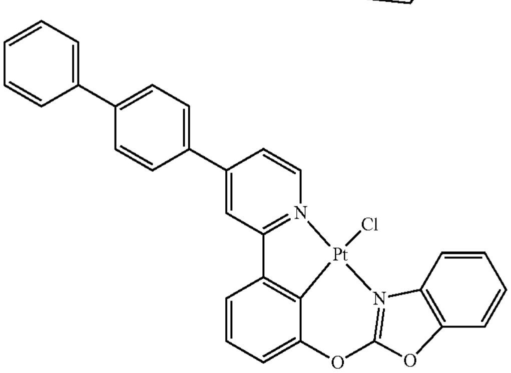
-continued
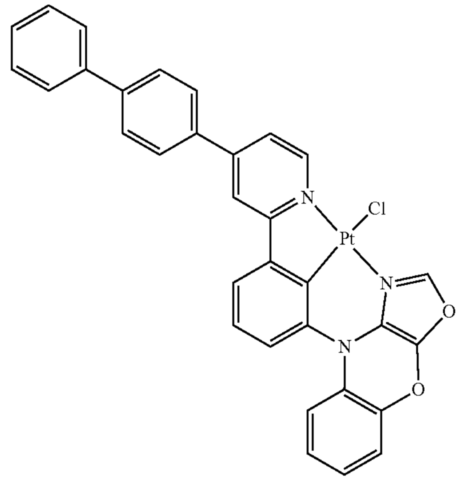
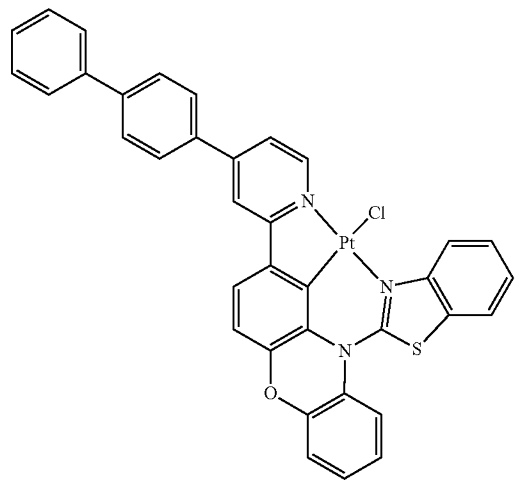
Structures Pt-7
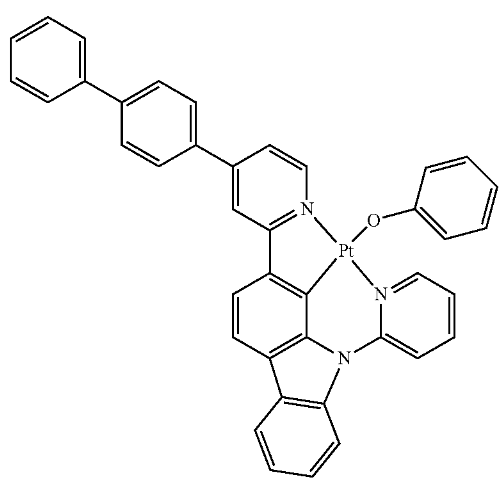

-continued
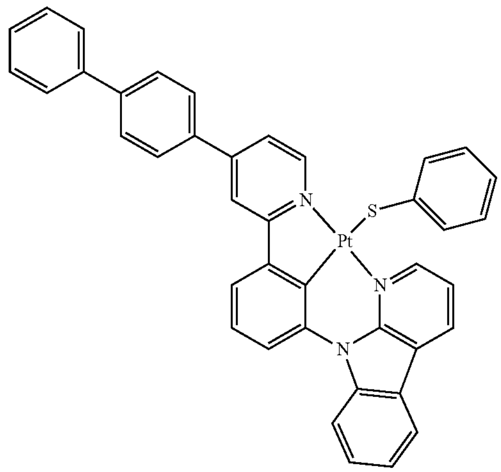
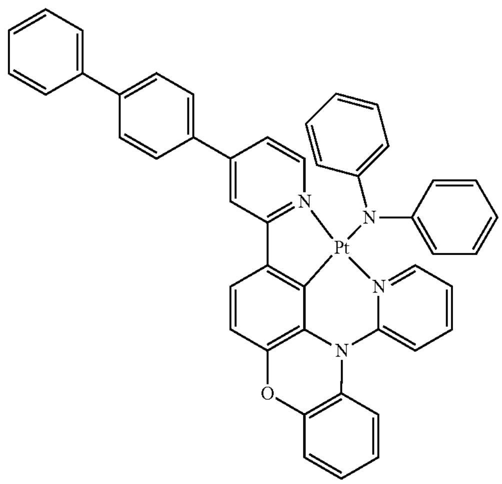
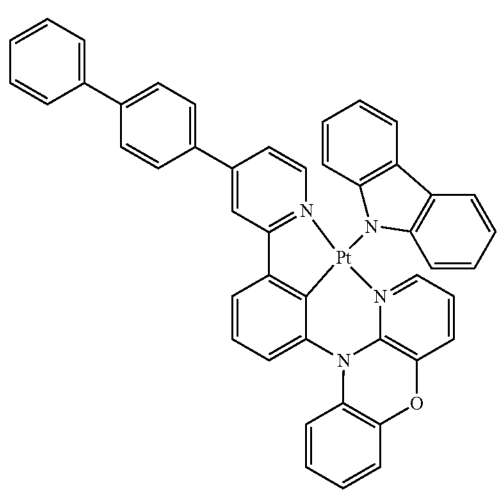
-continued
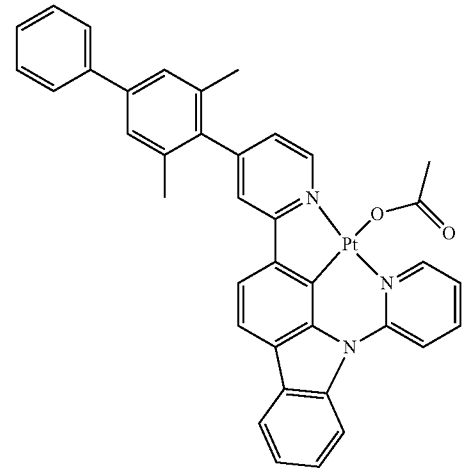
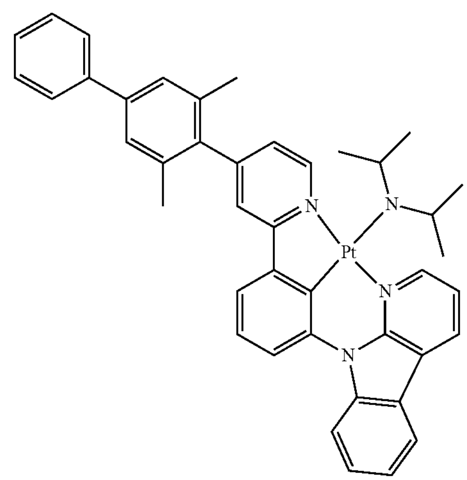
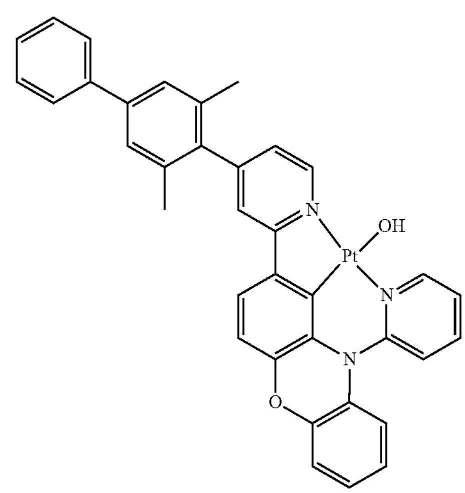

-continued
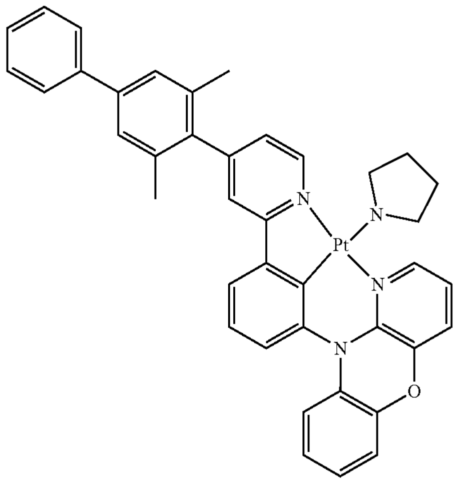
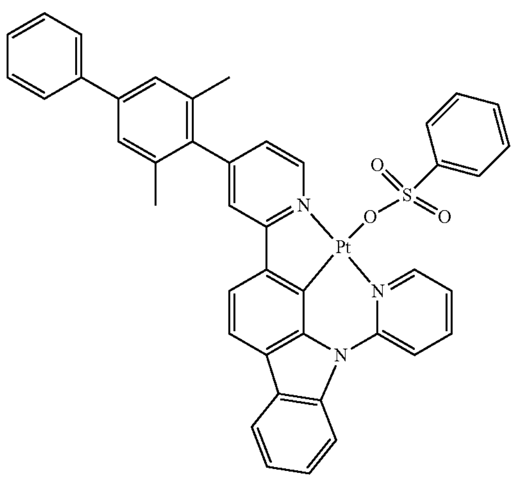
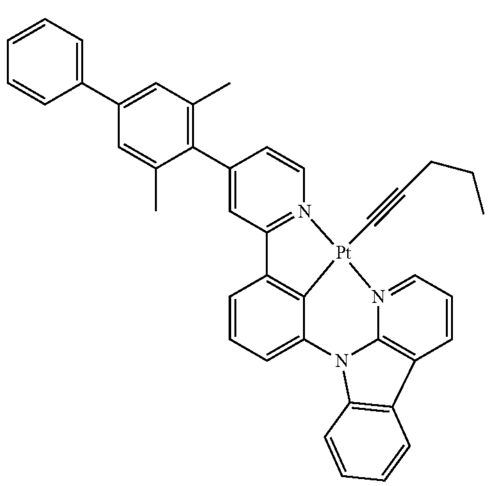
-continued
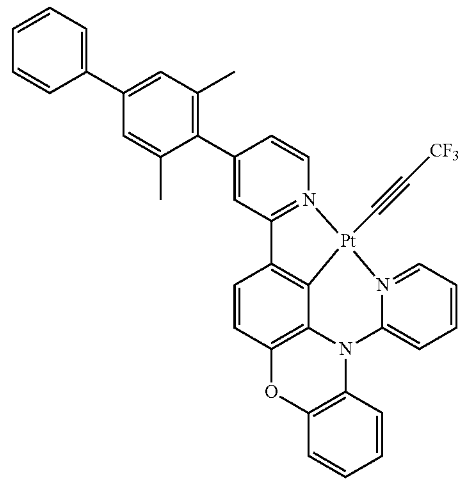
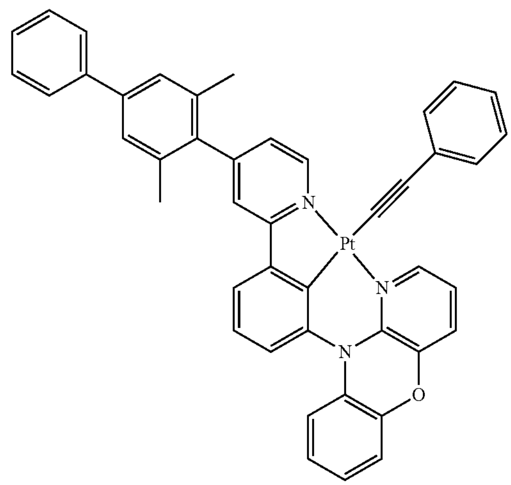
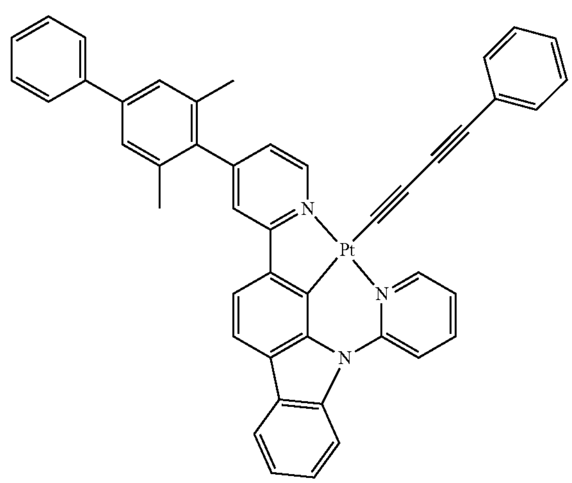

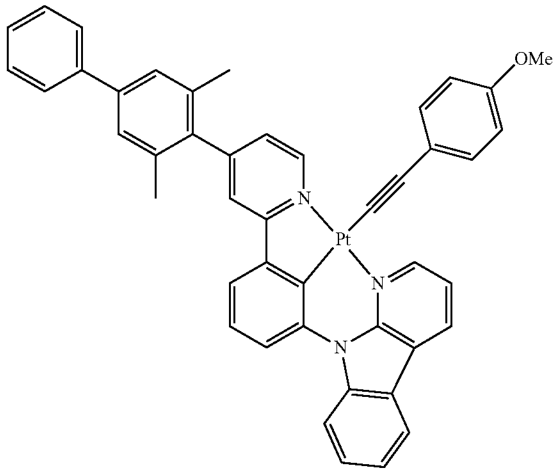
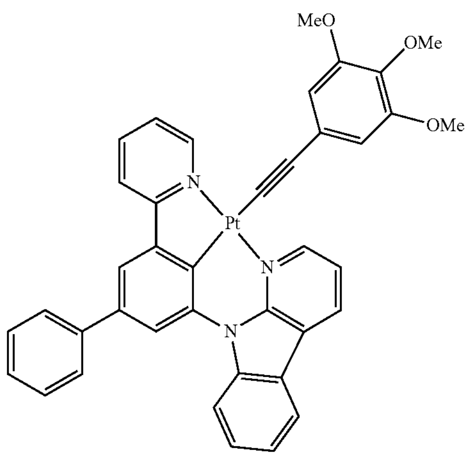
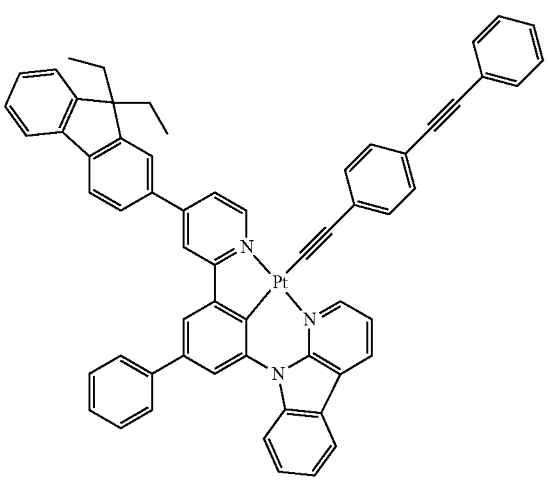
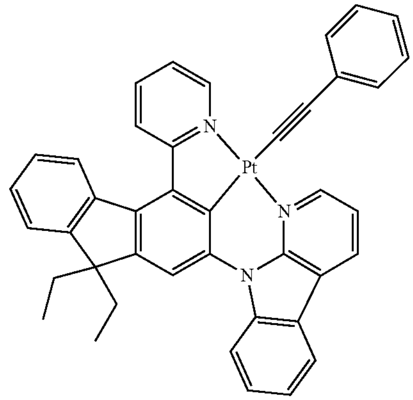
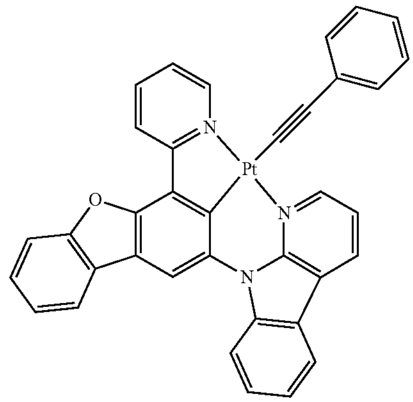
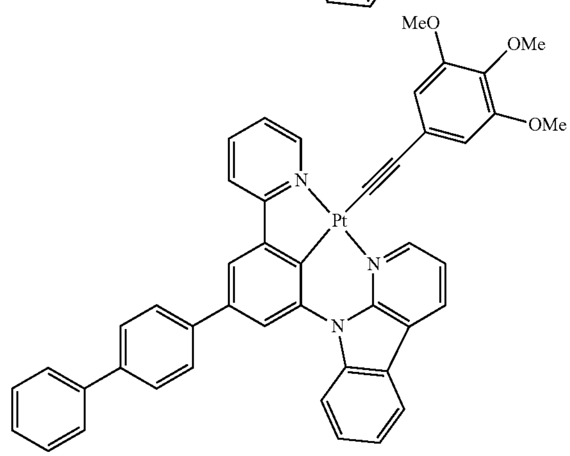
Structures Pd-1
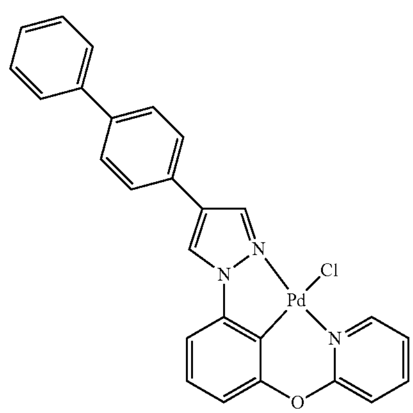

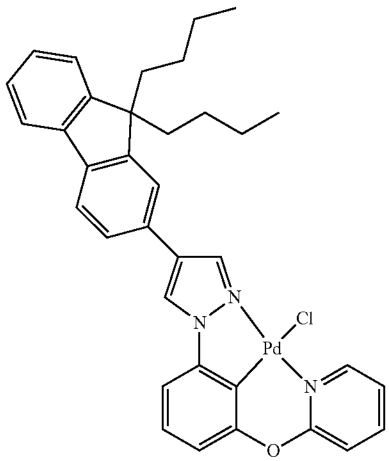
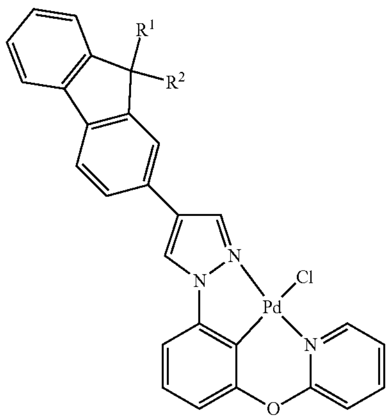
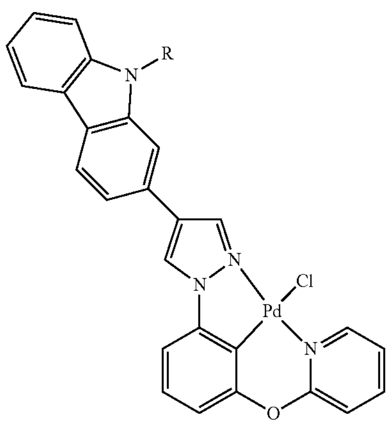
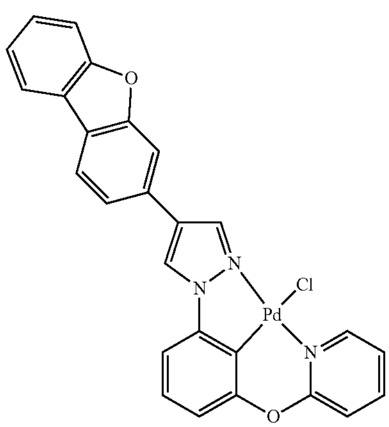
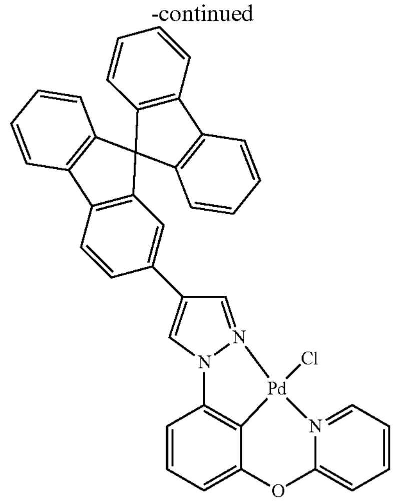
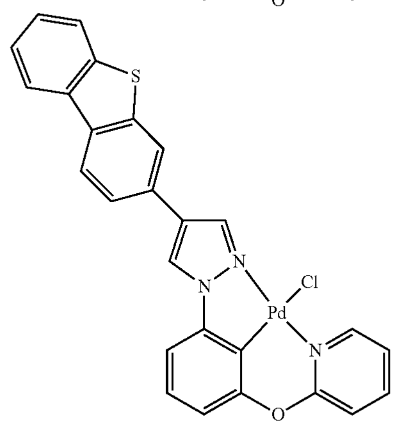
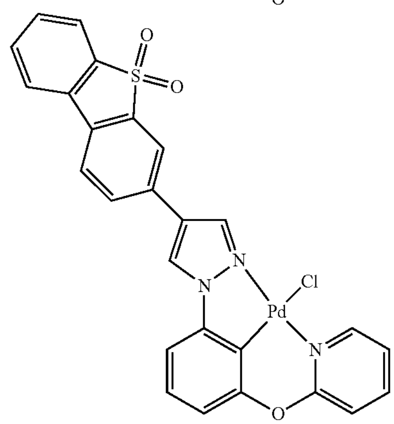
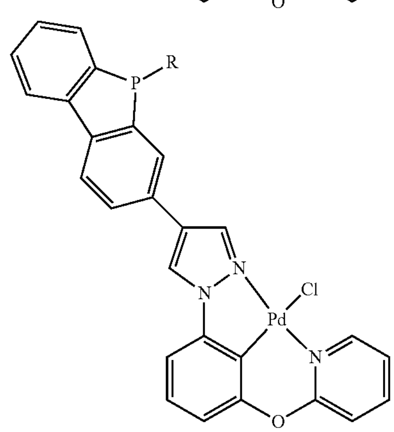

-continued
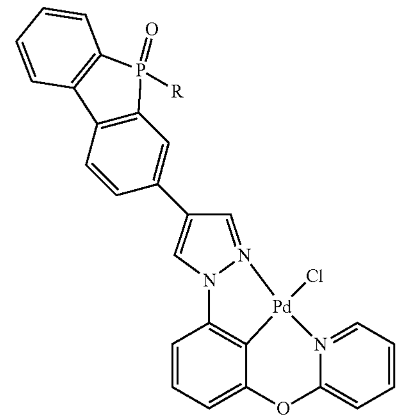
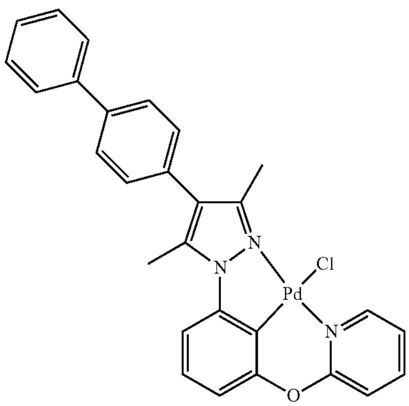
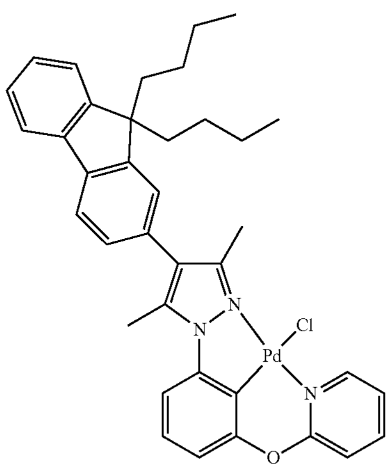
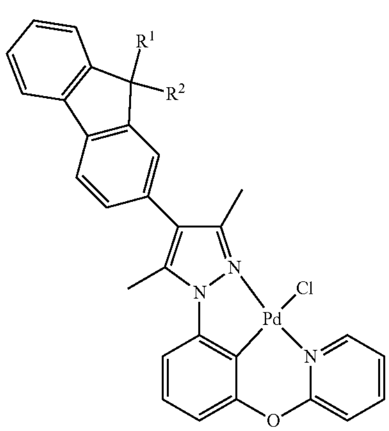
-continued
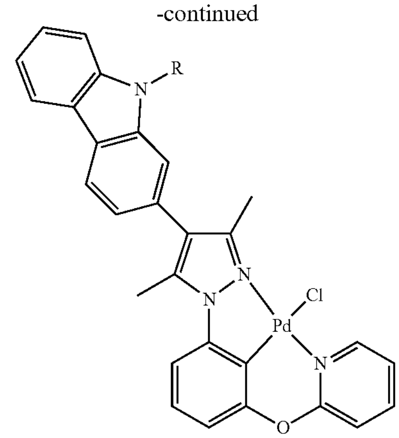
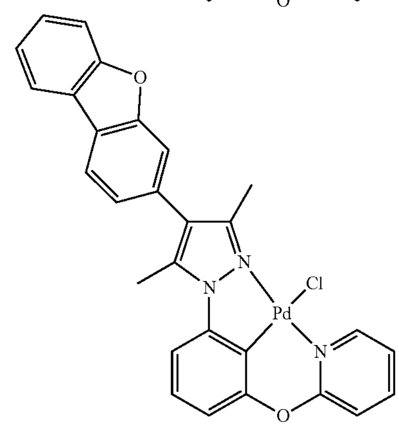
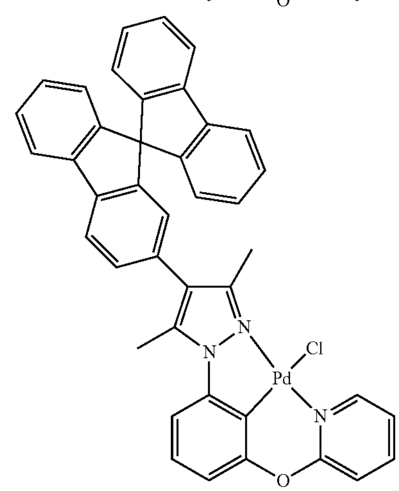
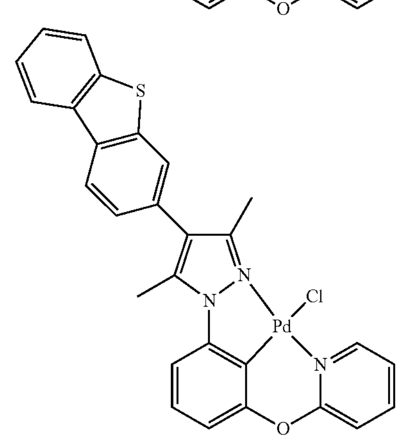

-continued
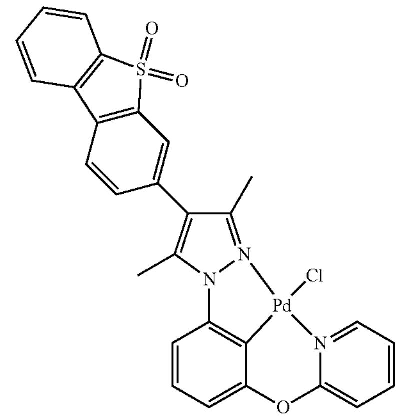
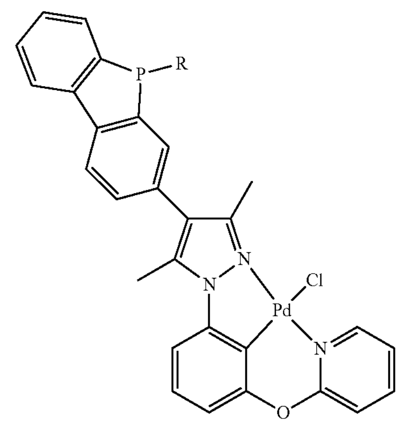
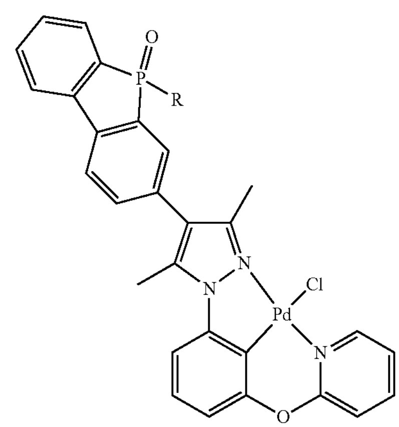
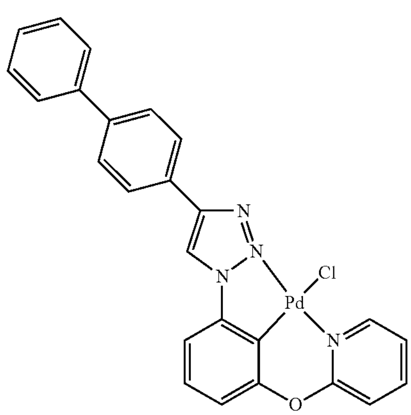
-continued
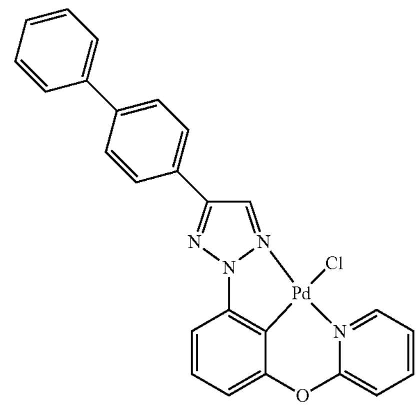
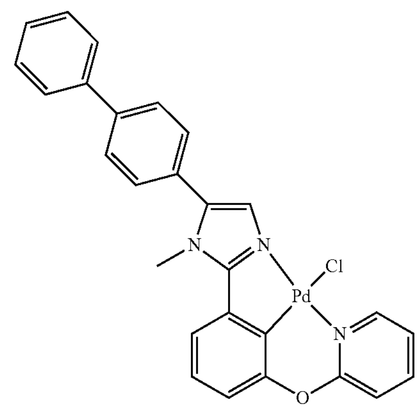
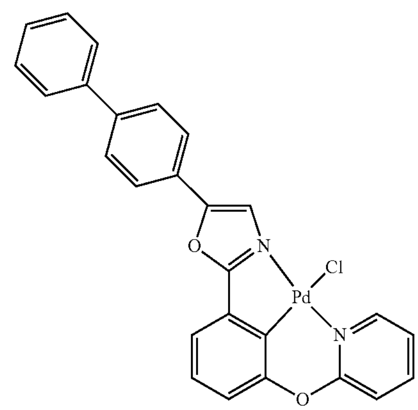
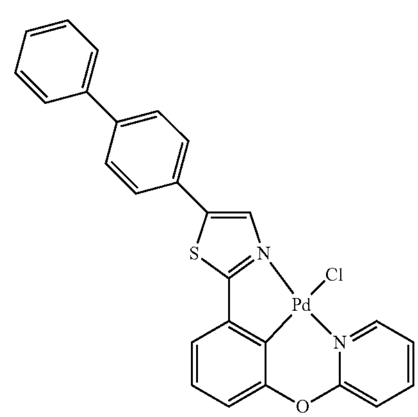

-continued
Structures Pd-2
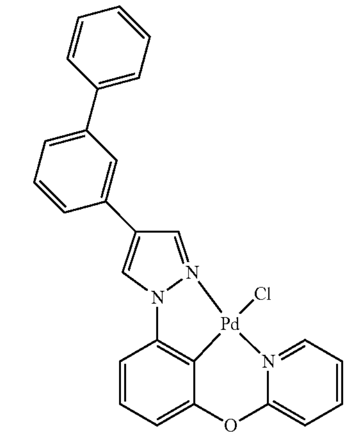
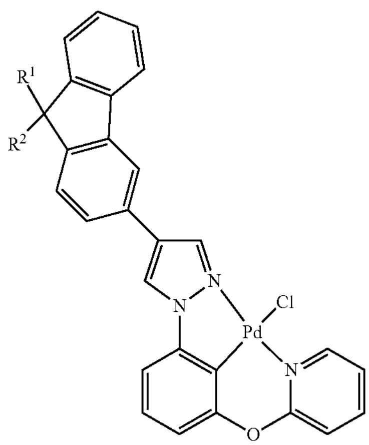
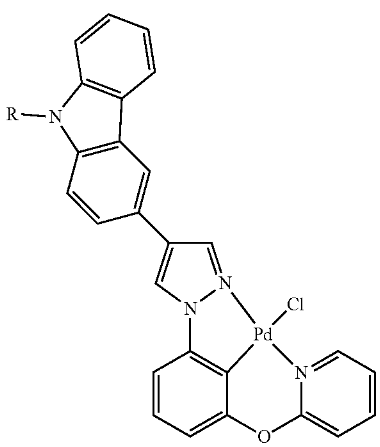
-continued
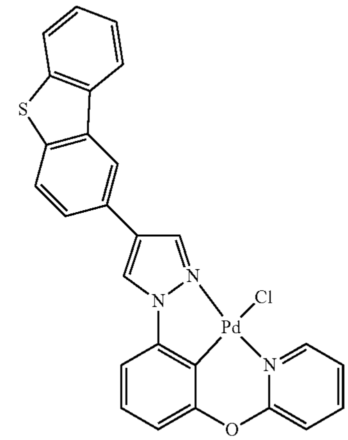
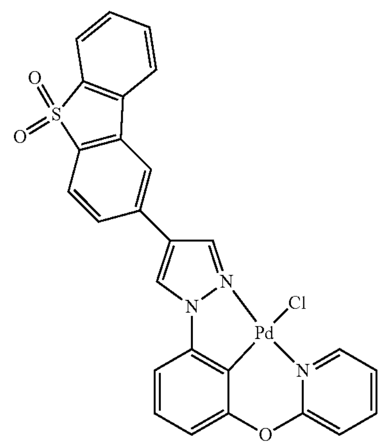
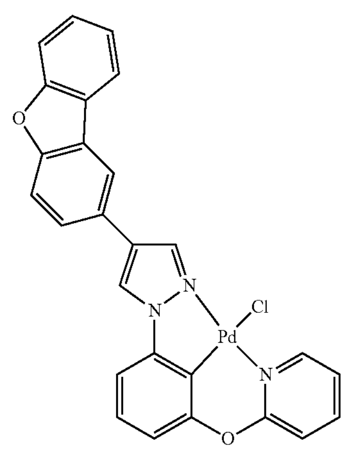

-continued
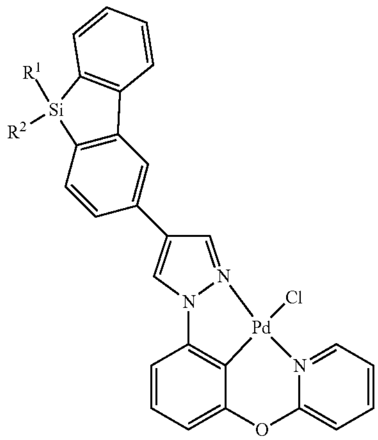
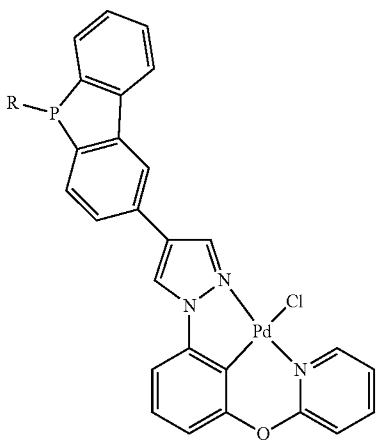
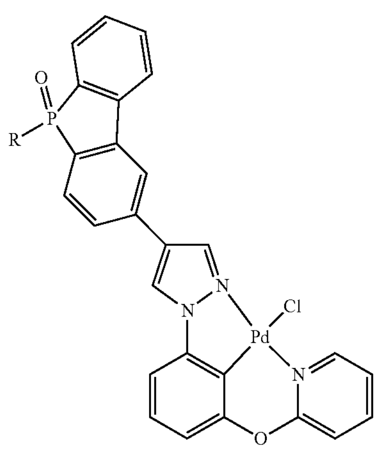
-continued
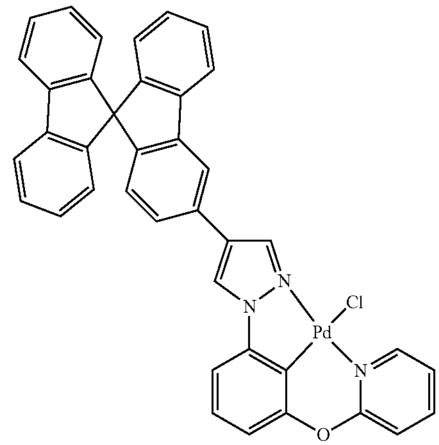
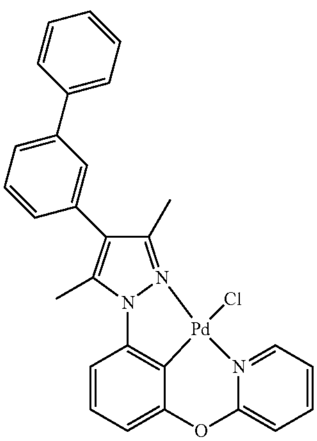
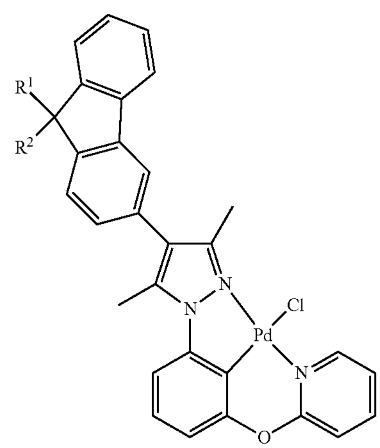

-continued
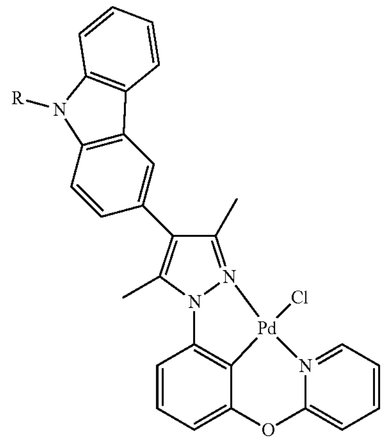
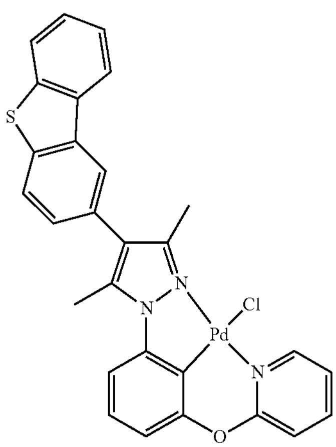
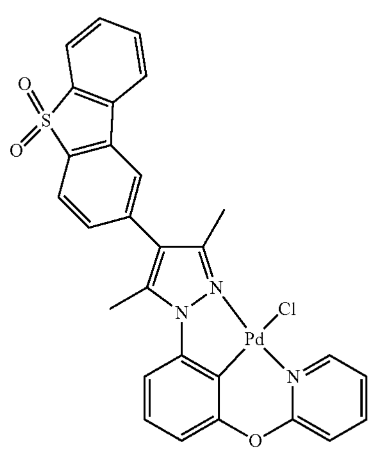
-continued
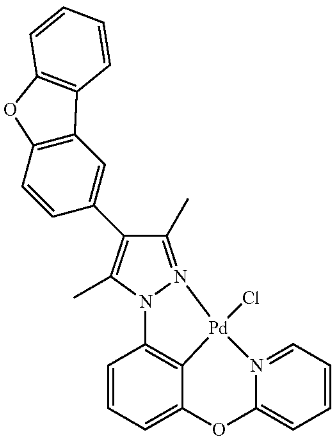
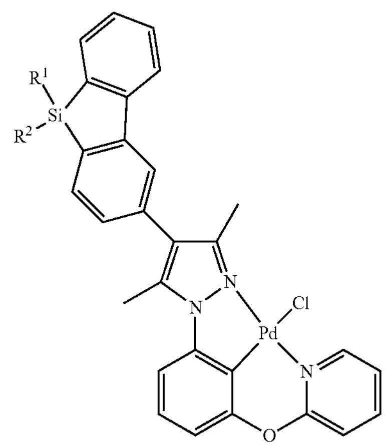
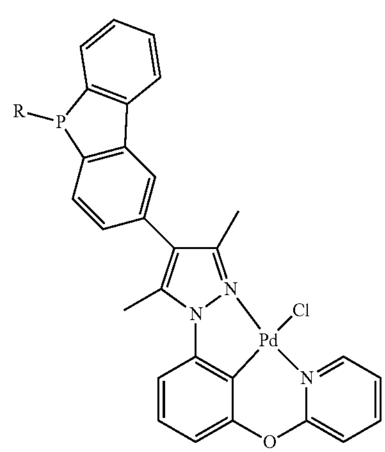

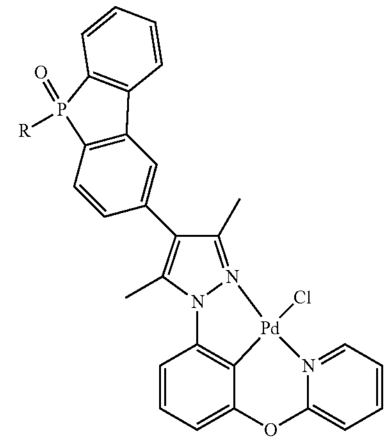
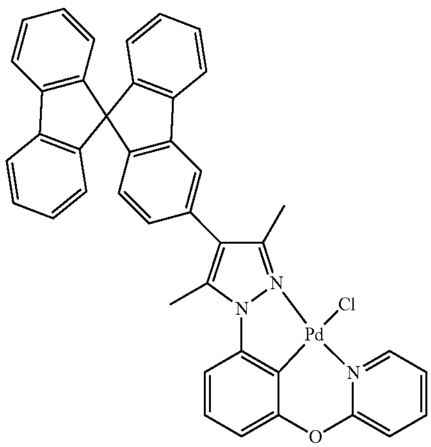
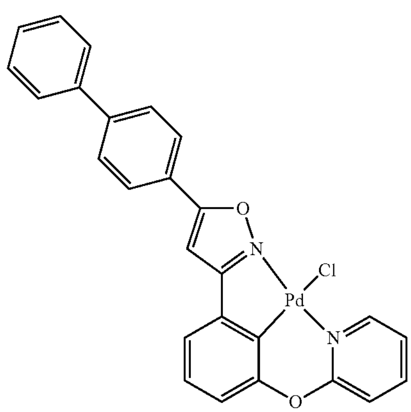
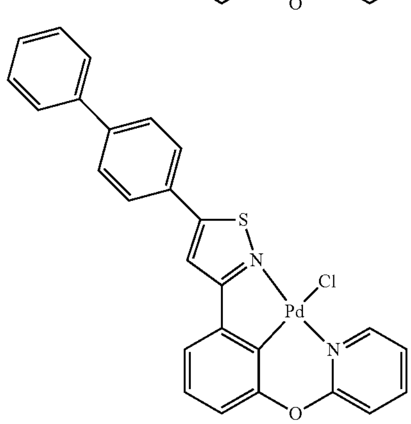
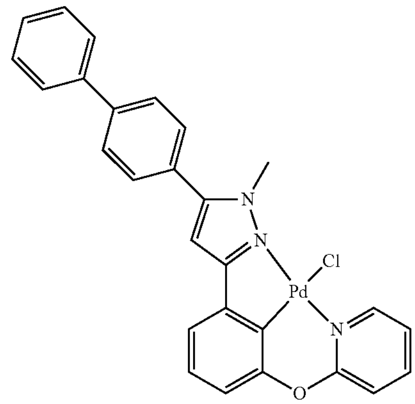
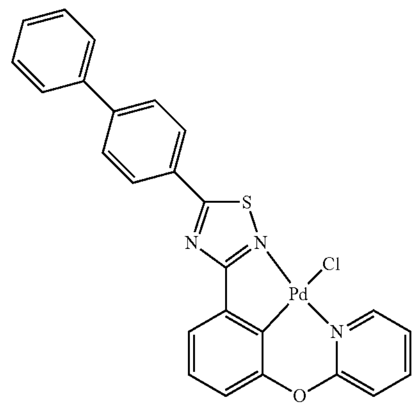
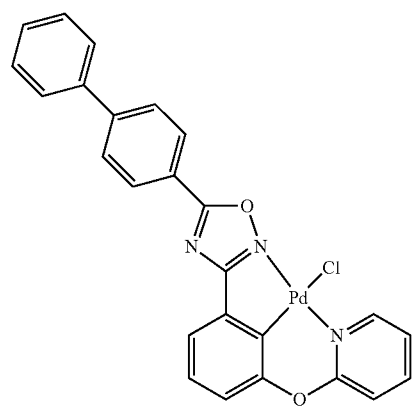
Structures Pd-3
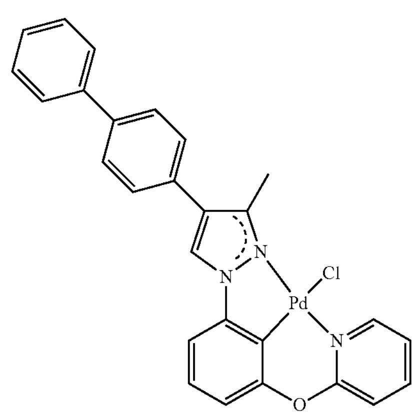

-continued
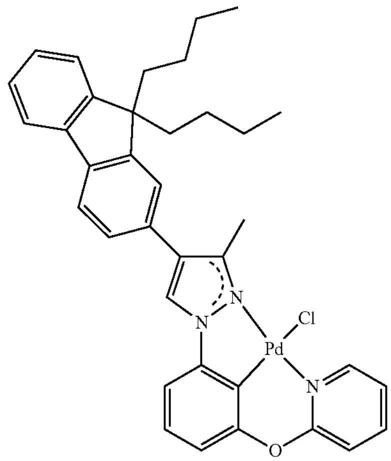
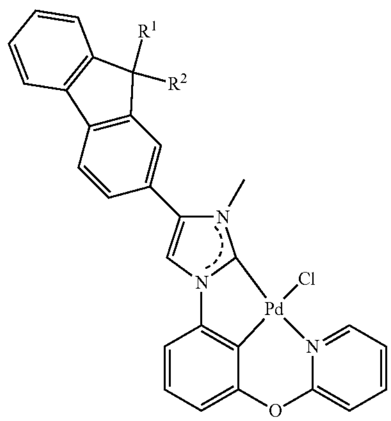
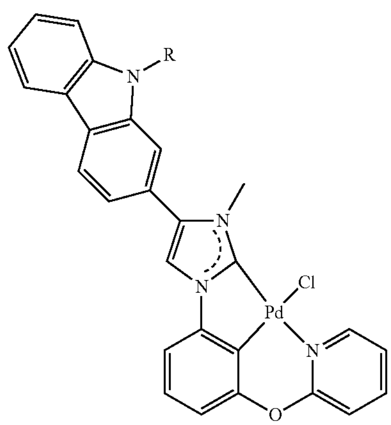
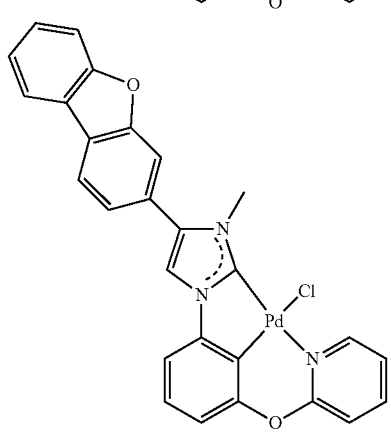
-continued
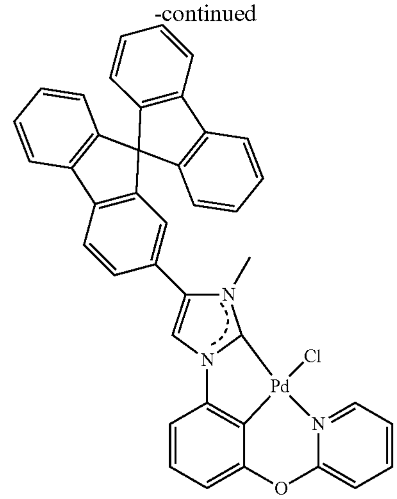
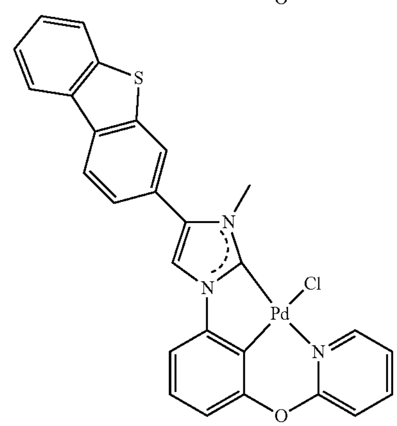
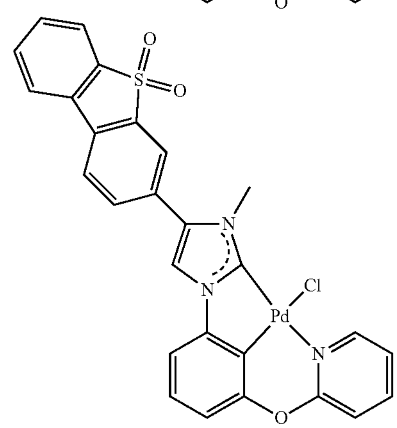
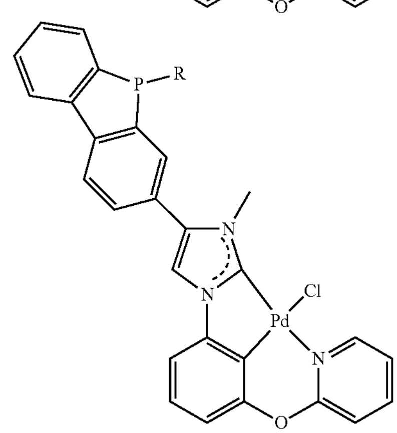

-continued
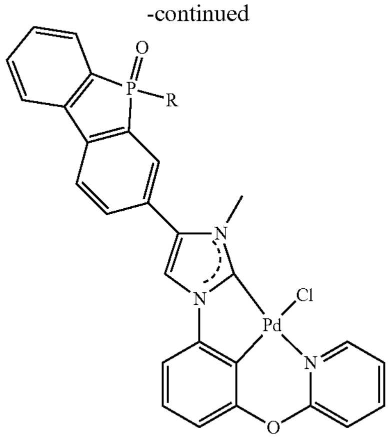
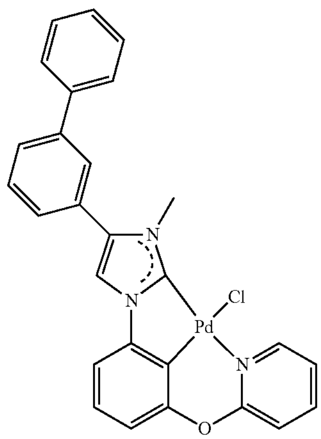
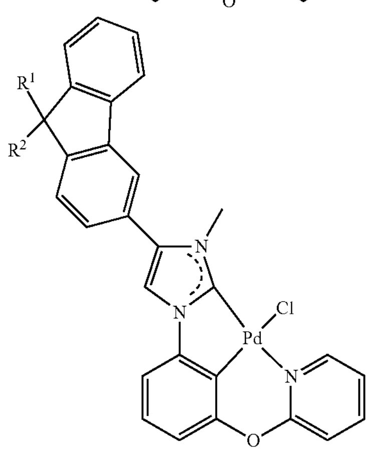
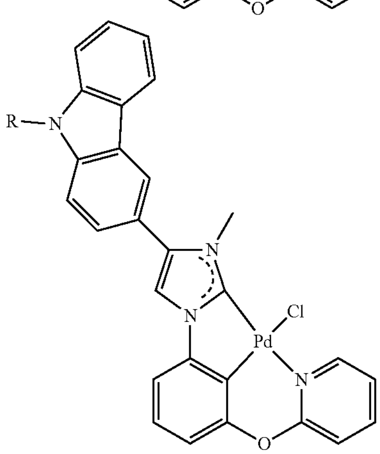
-continued
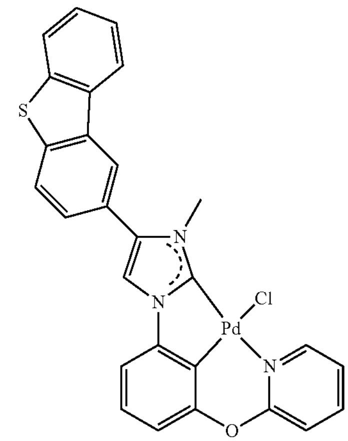
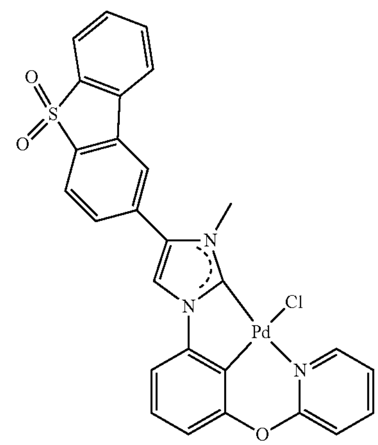
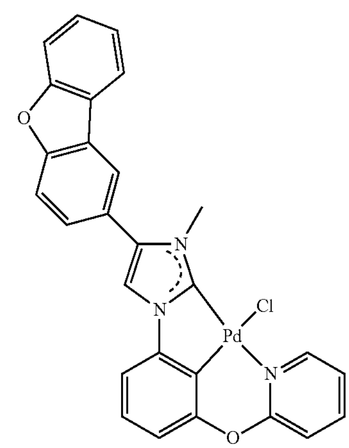

-continued
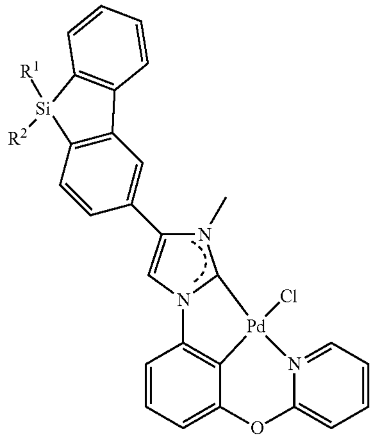
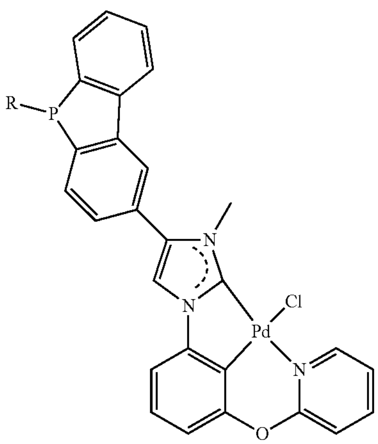
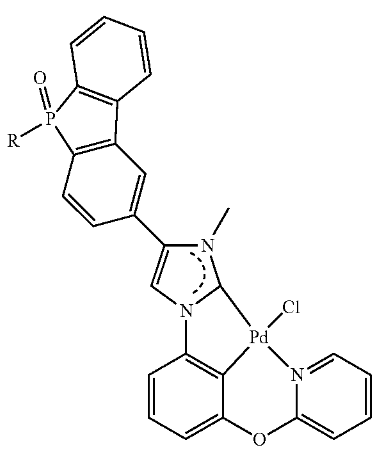
-continued
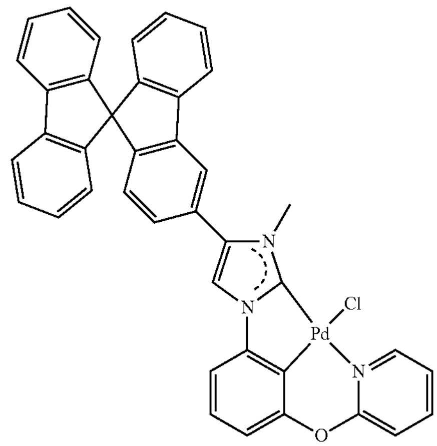
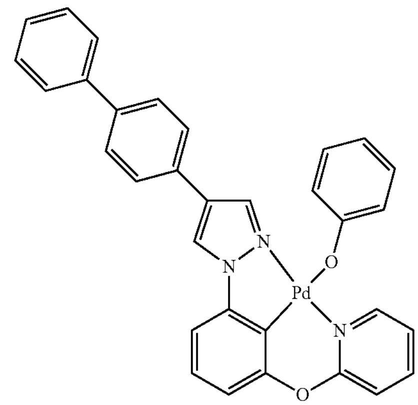
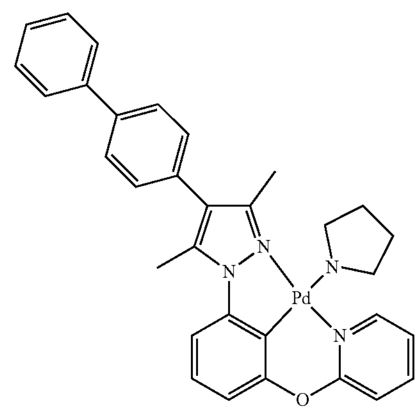
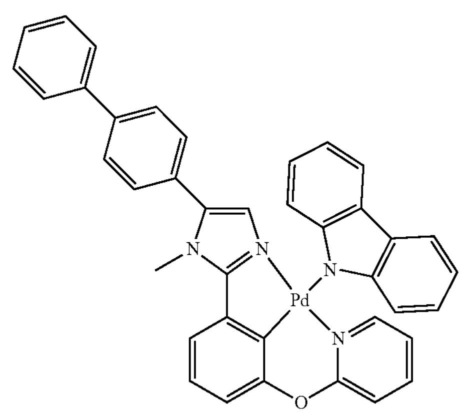

-continued
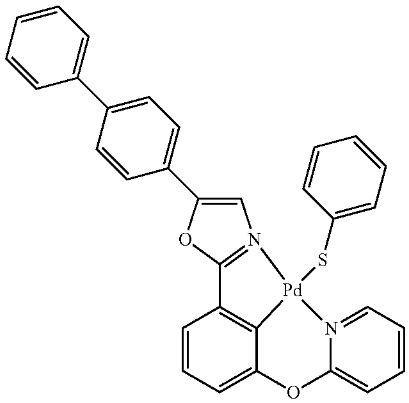
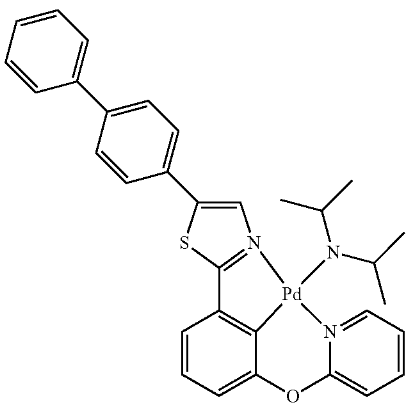
Structures Pd-4
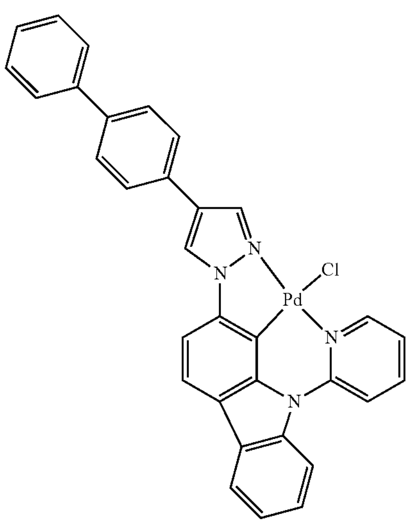
-continued
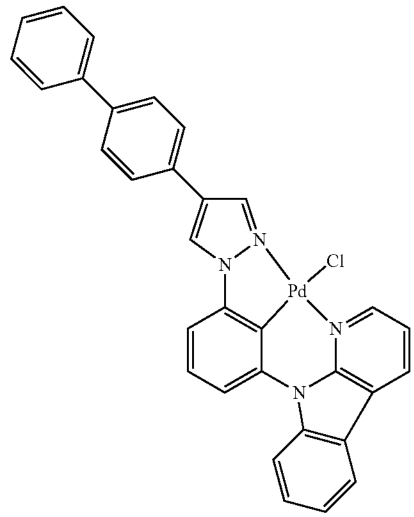
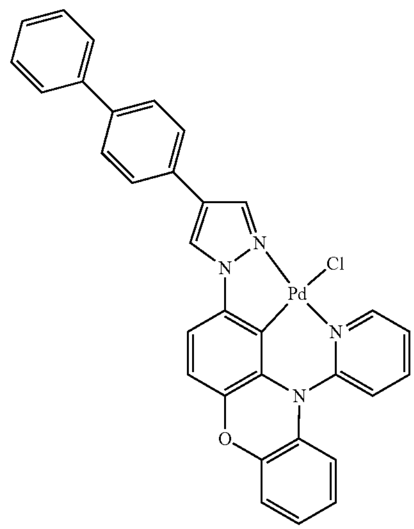
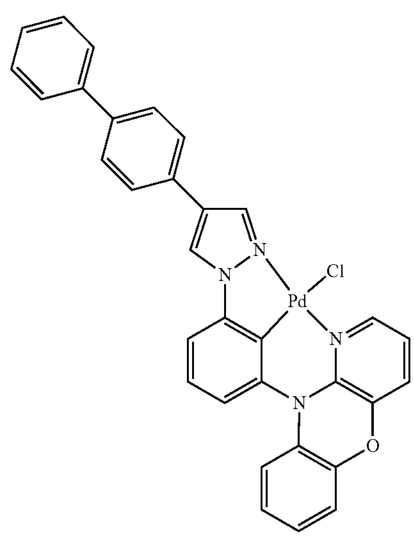

-continued
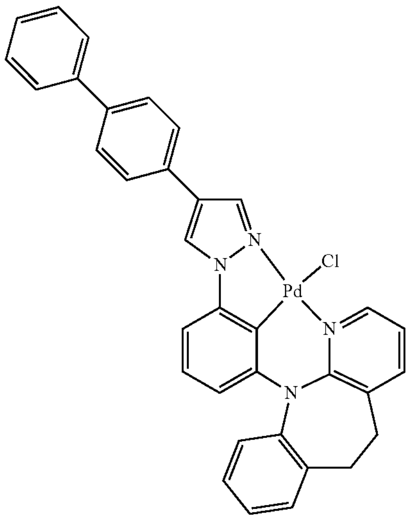
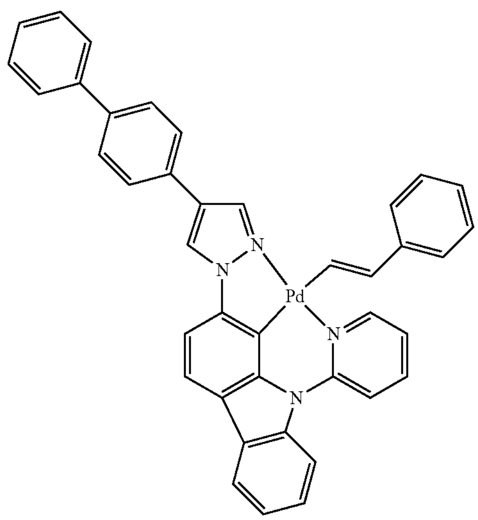
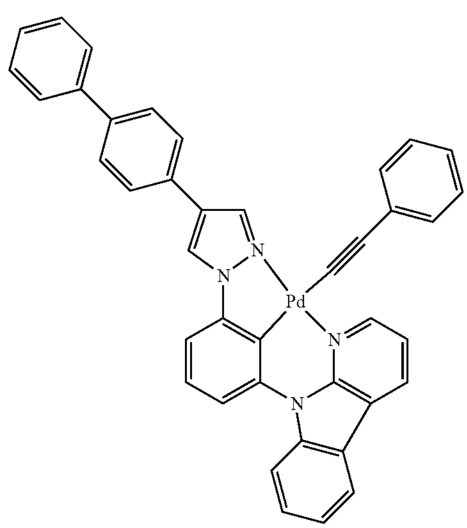
-continued
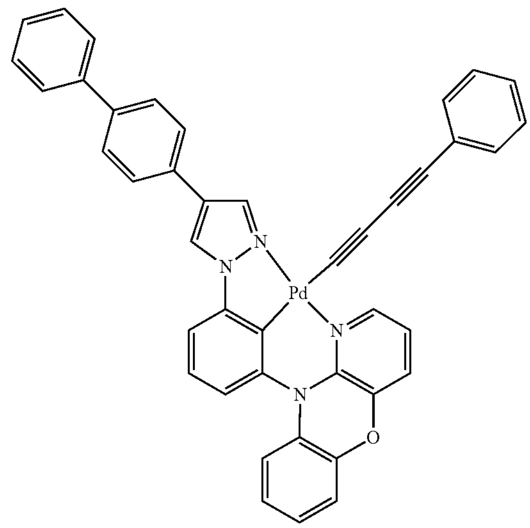
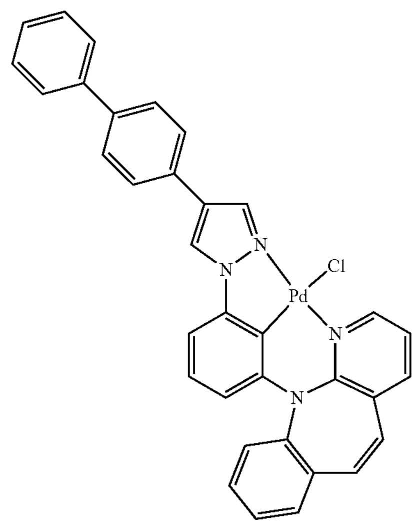
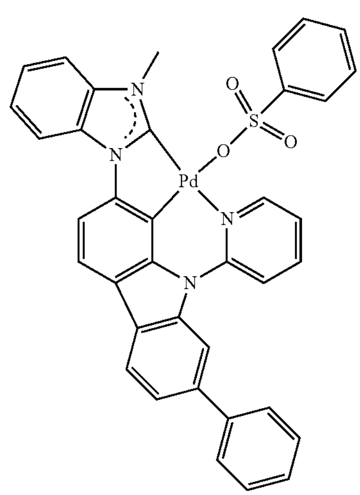

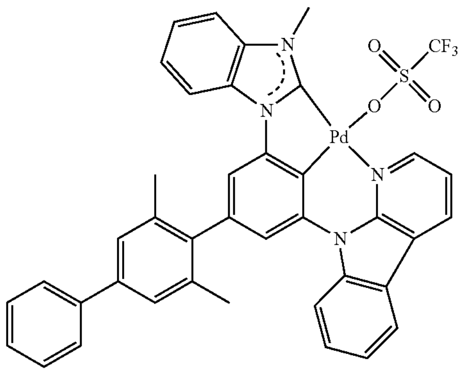
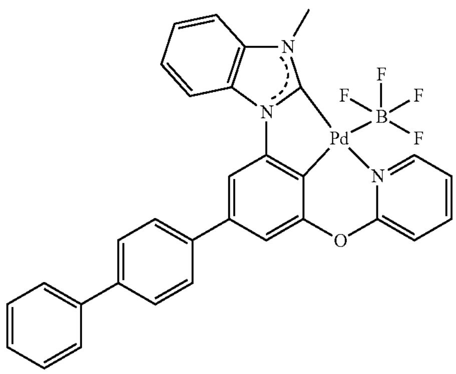
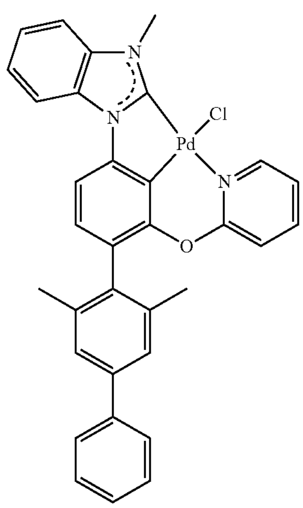
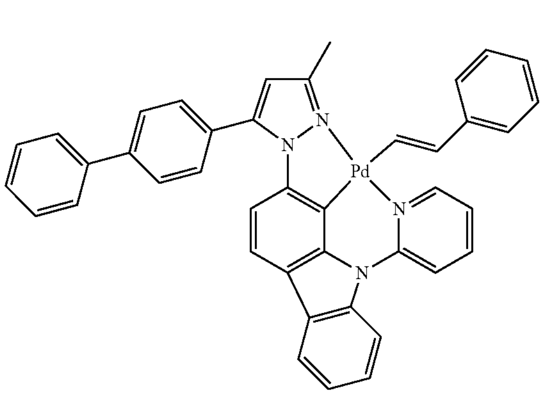
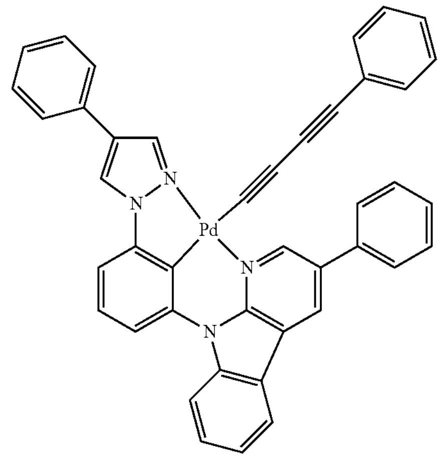
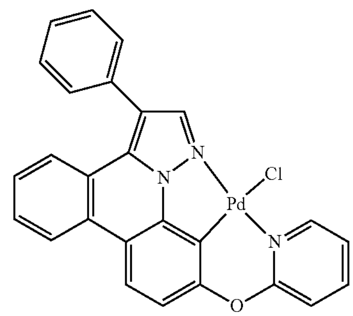
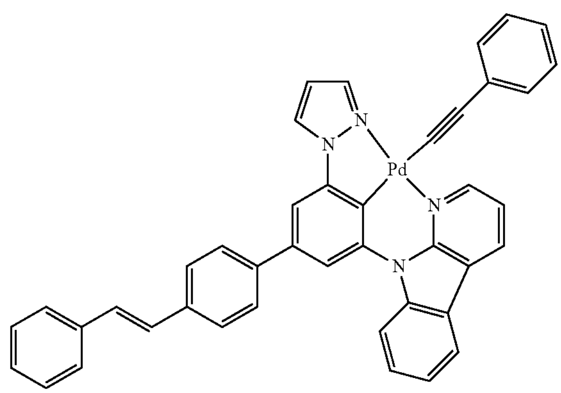
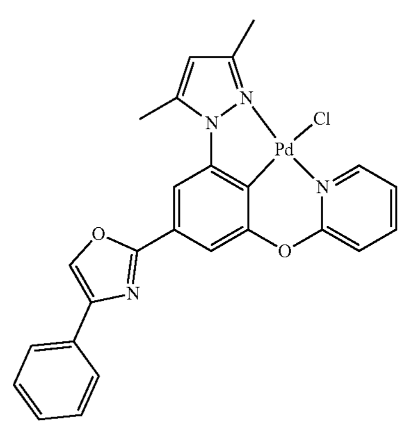

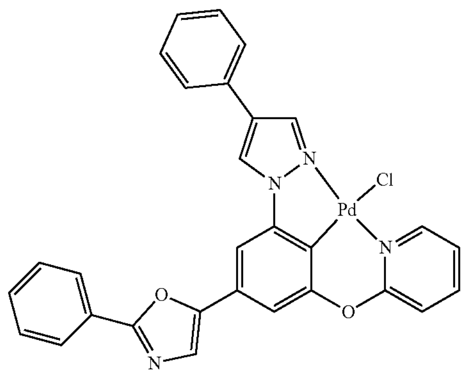
Structures Pd-5
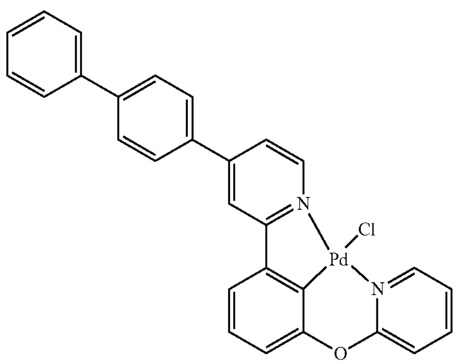
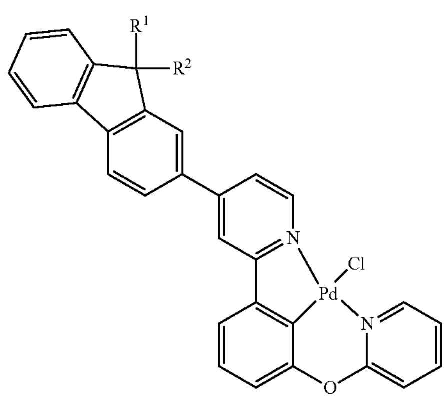
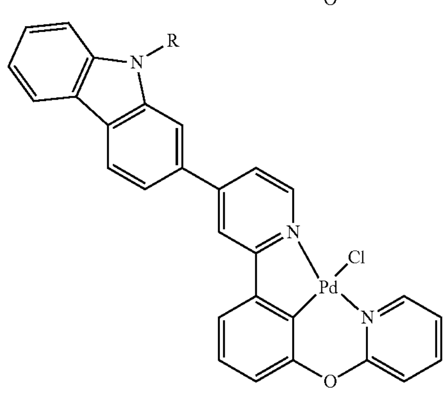
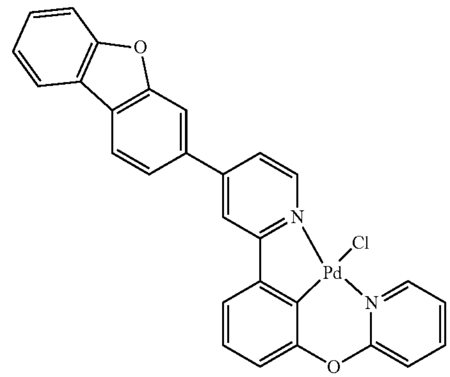
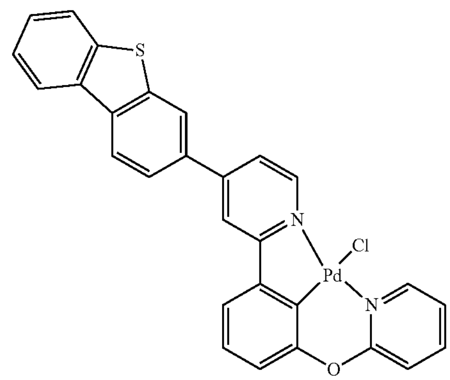
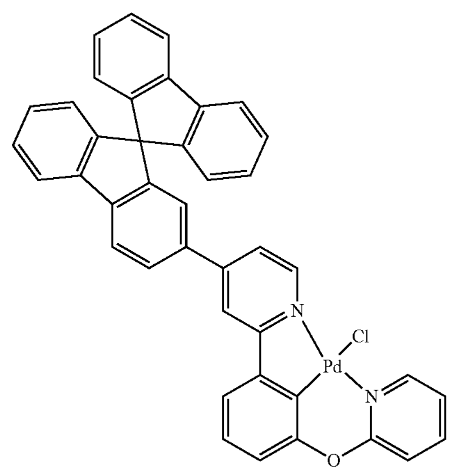
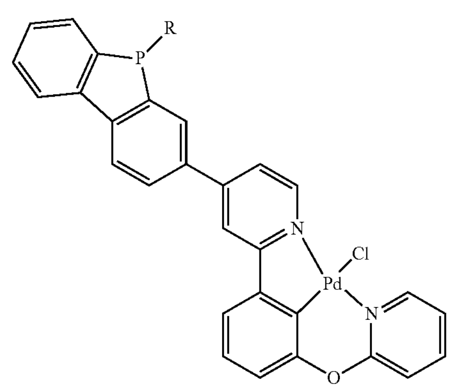

-continued
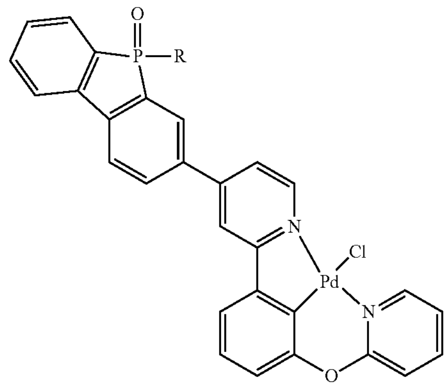
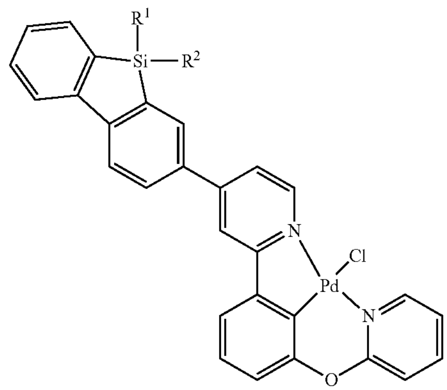
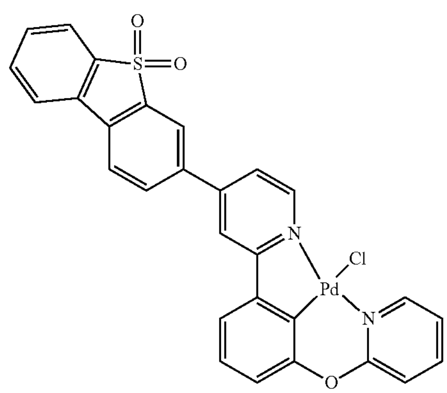
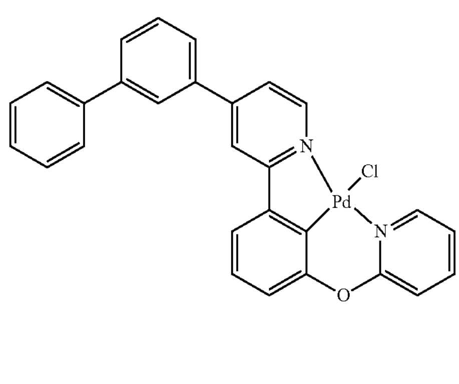
-continued
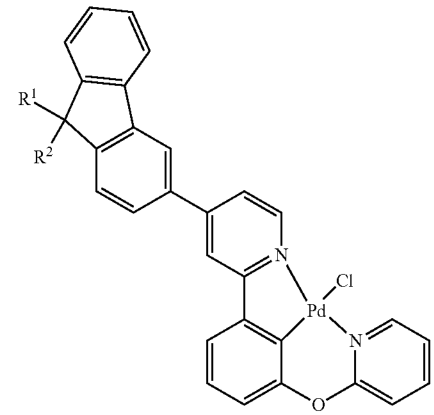
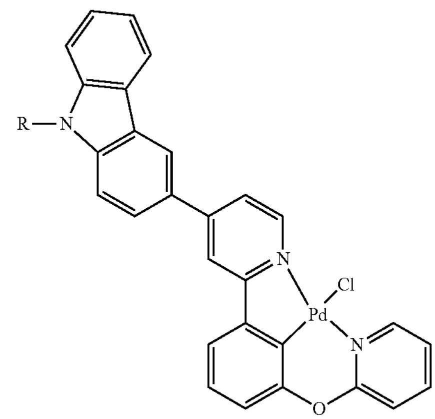
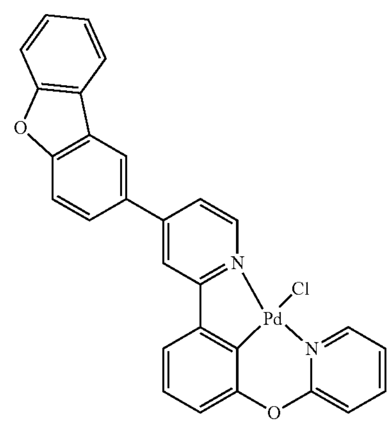
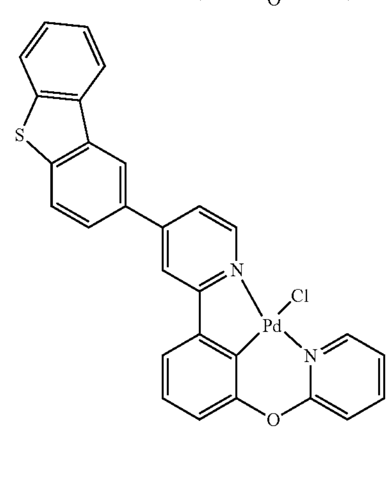

-continued
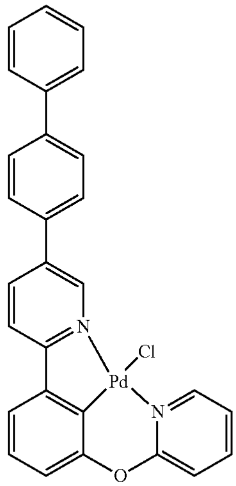
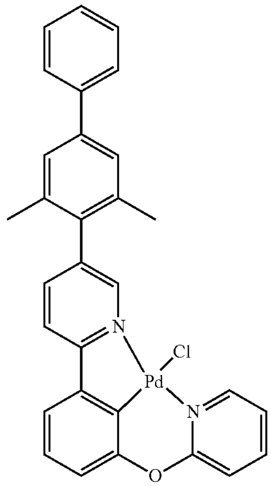
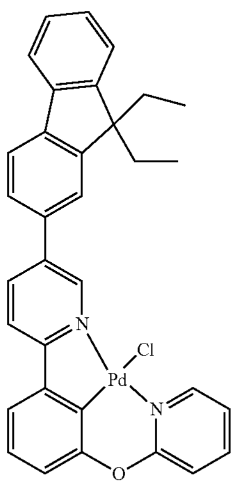
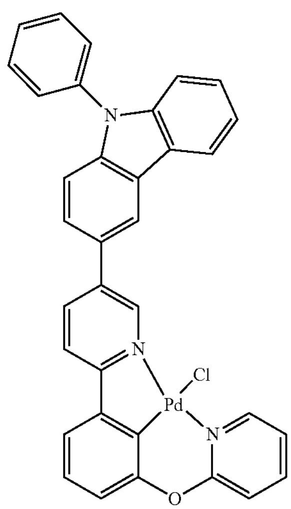
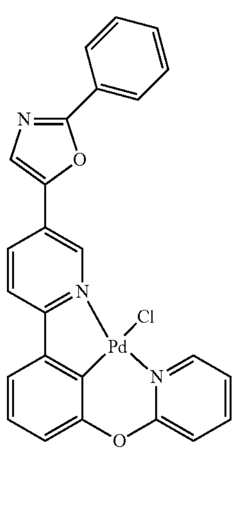
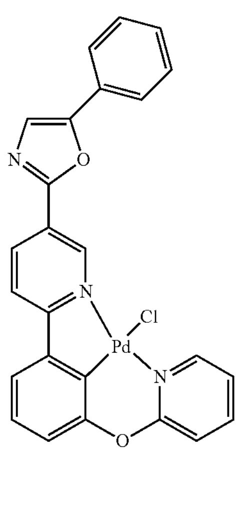
-continued
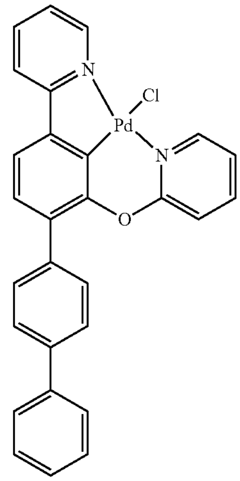
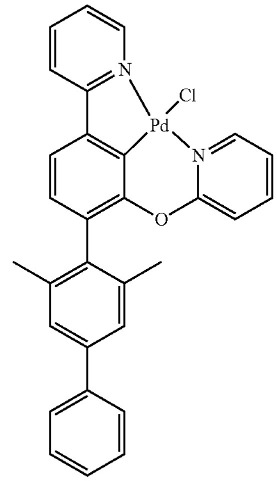
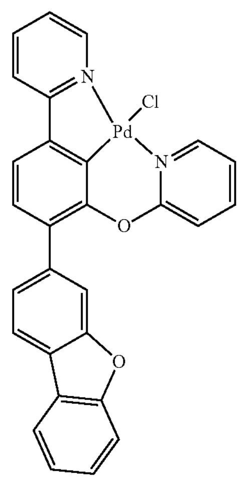
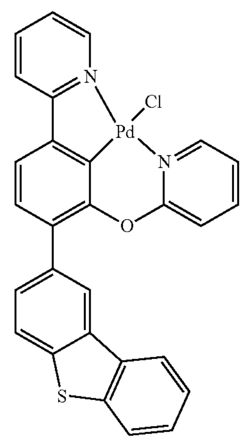
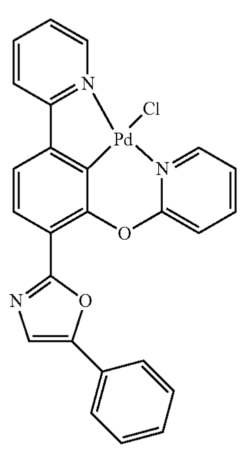
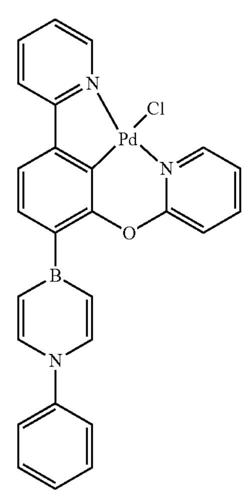

-continued
Structures Pd-6
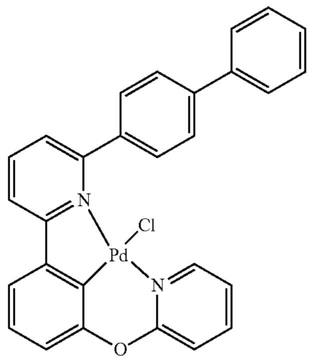
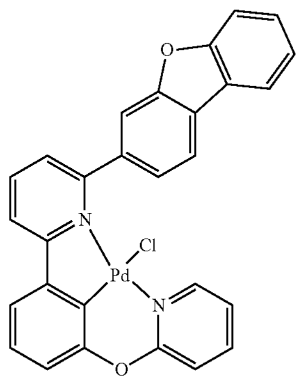
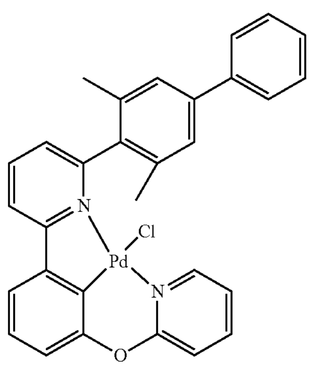
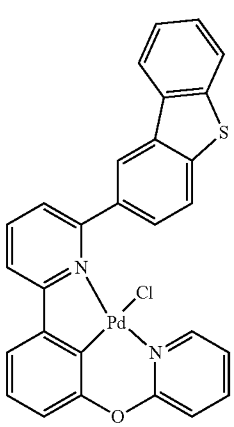
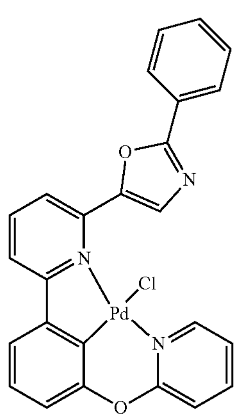
-continued
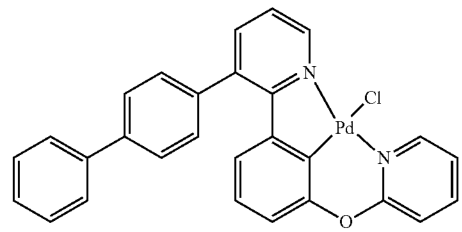
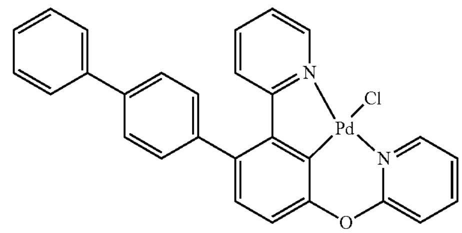
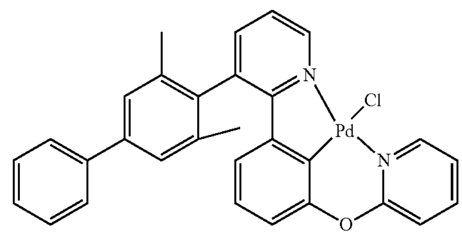
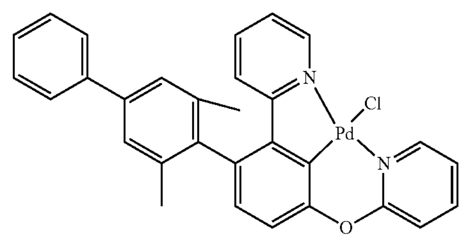
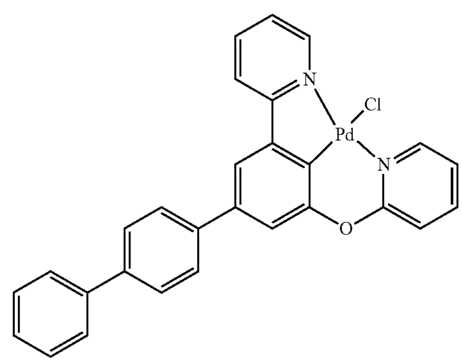
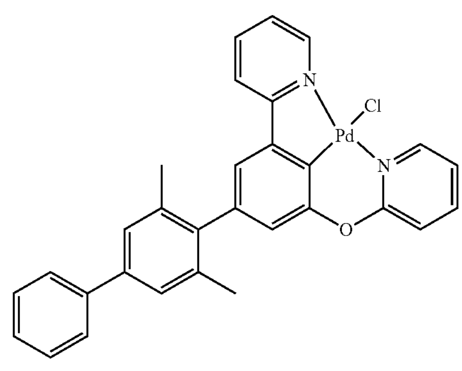

-continued
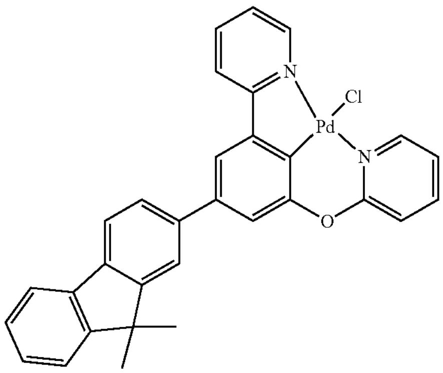
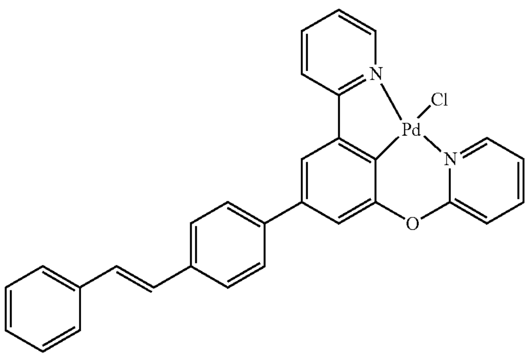
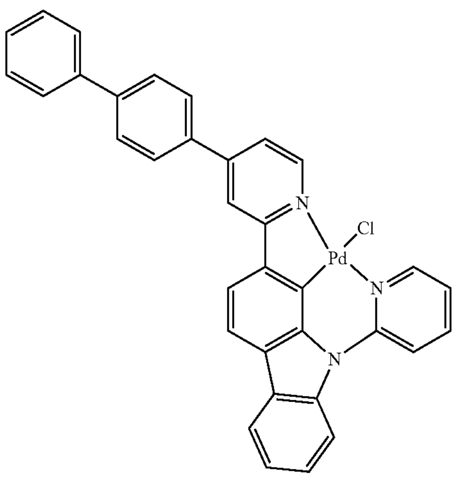
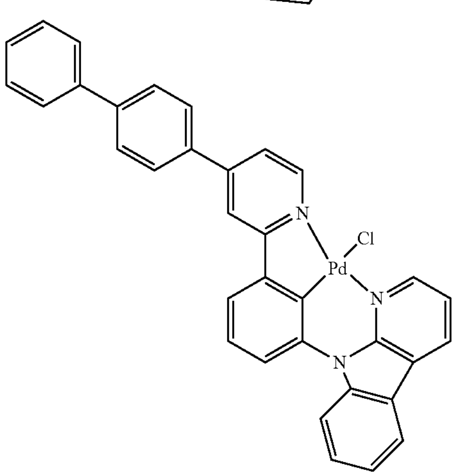
-continued
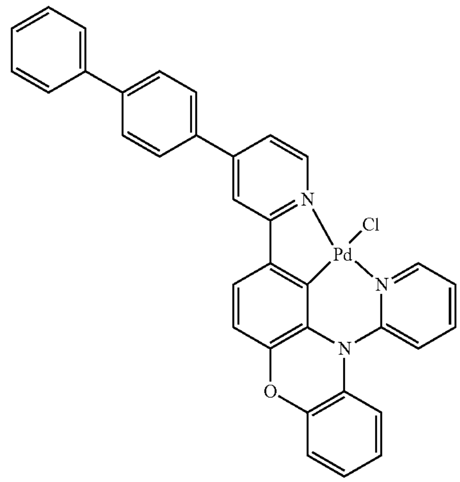
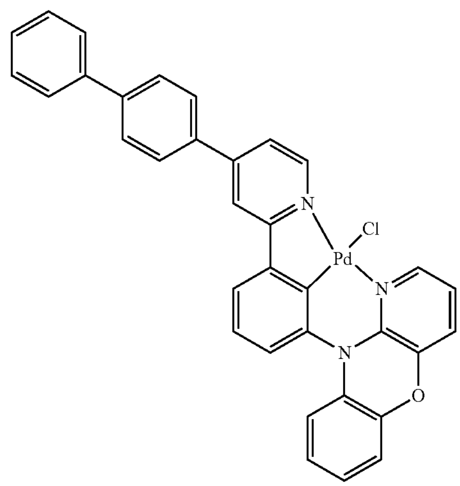
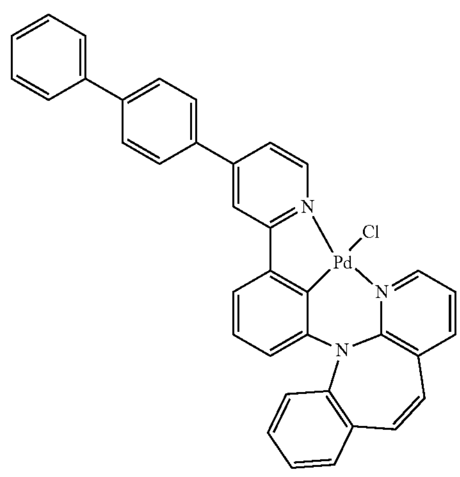

-continued
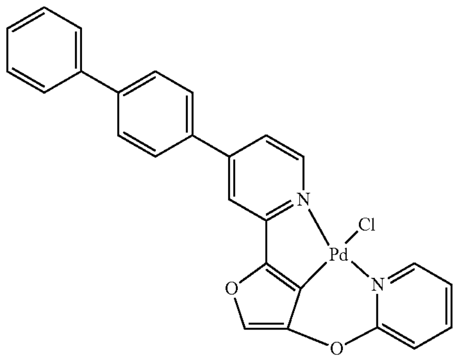
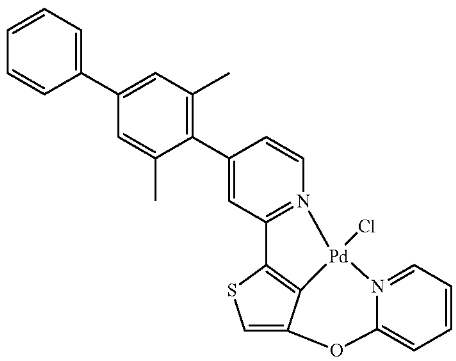
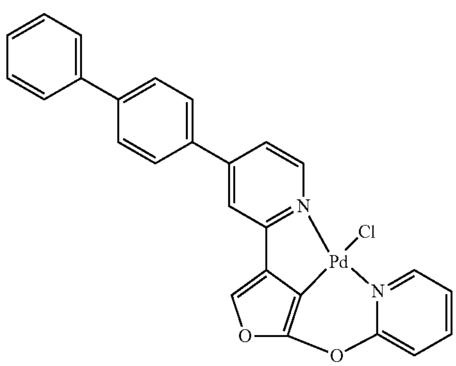
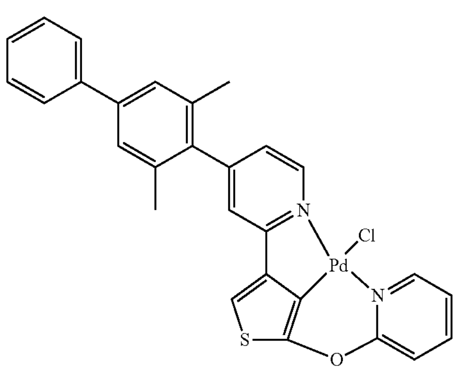
-continued
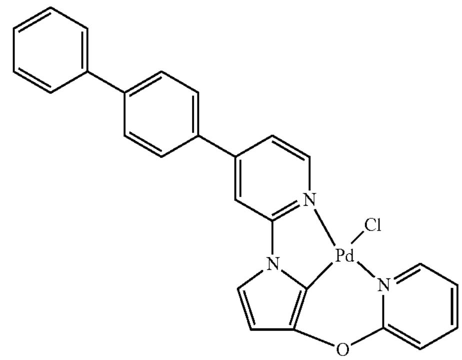
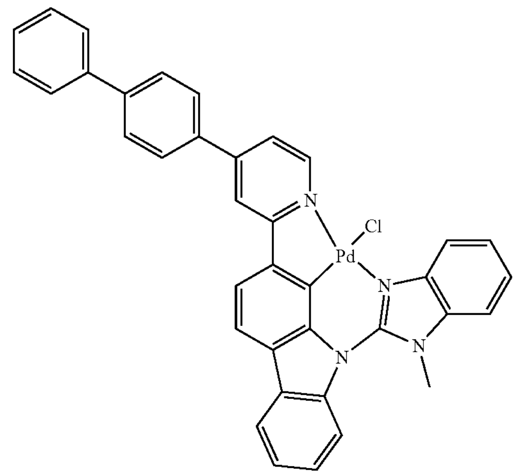
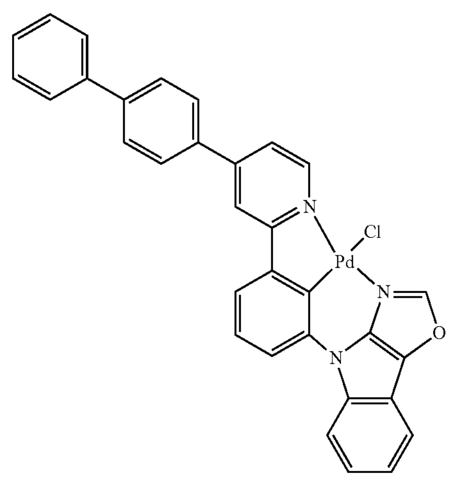
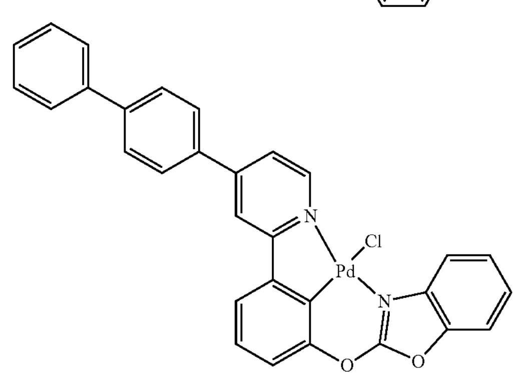

-continued
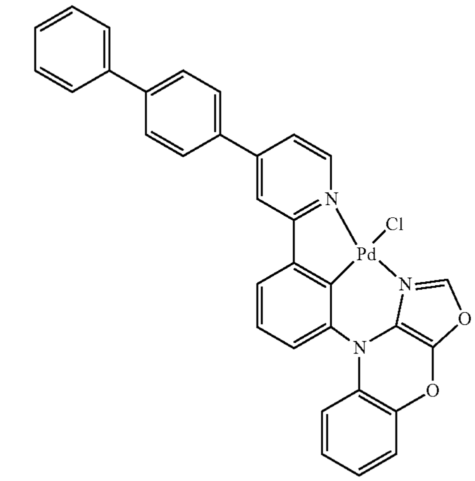
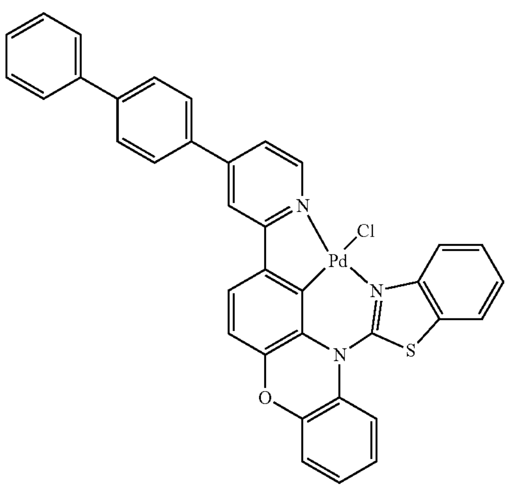
Structures Pd-7
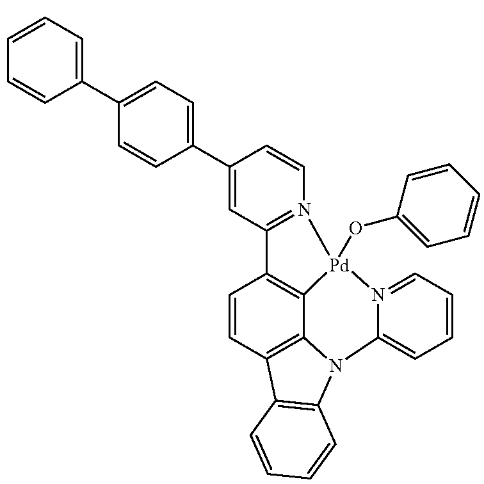
-continued
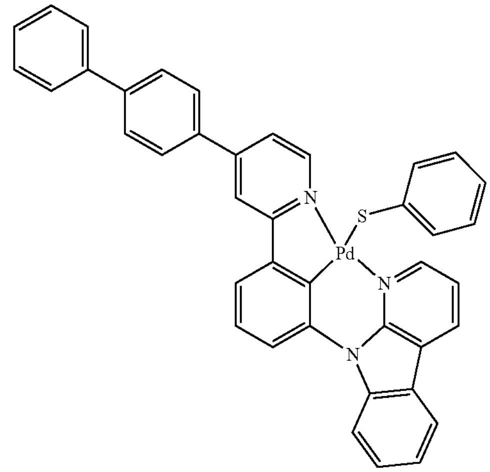
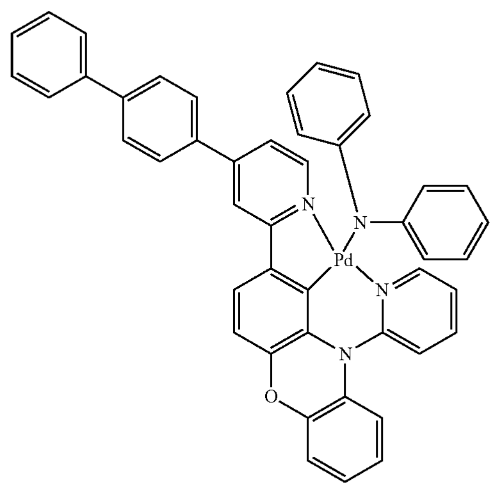
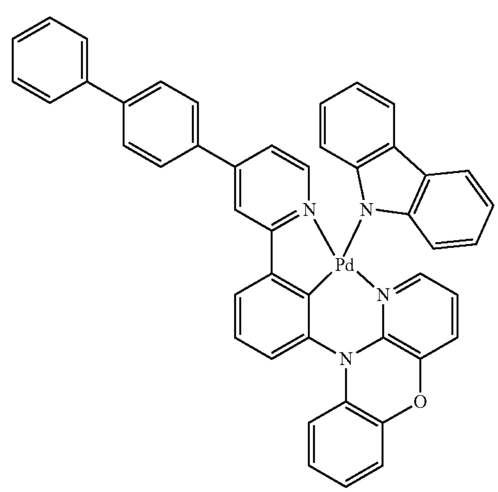

-continued
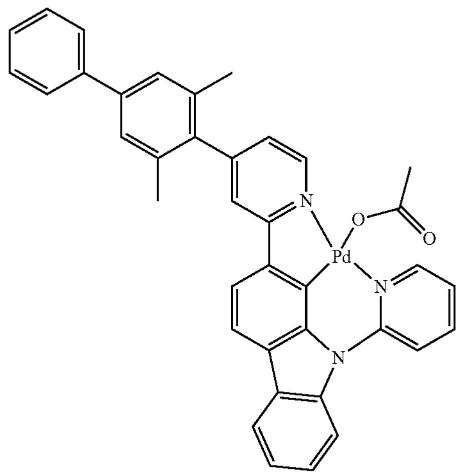
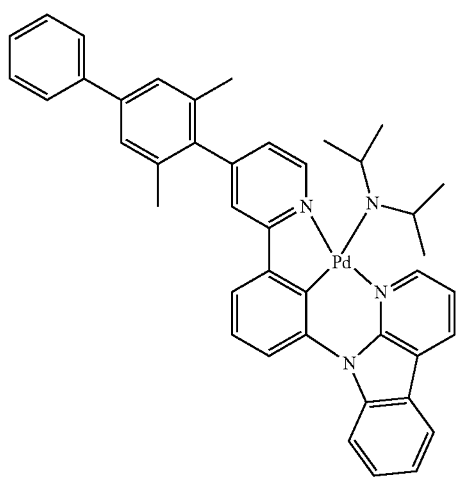
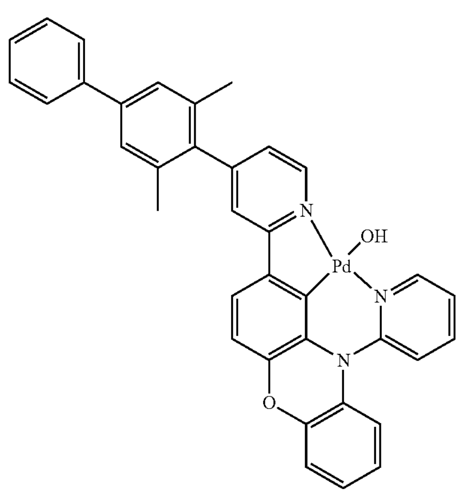
-continued
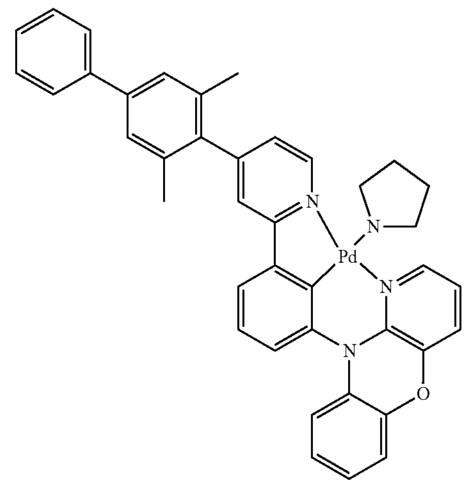
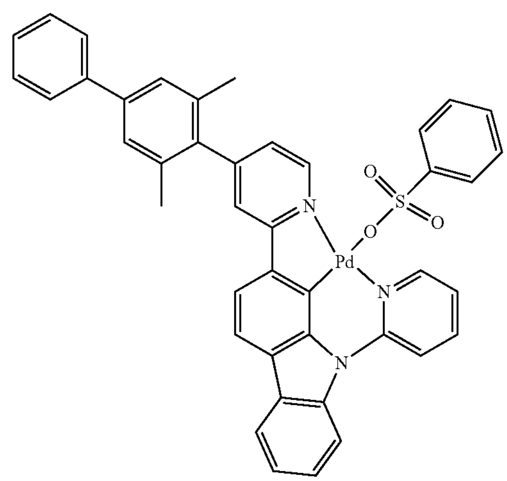
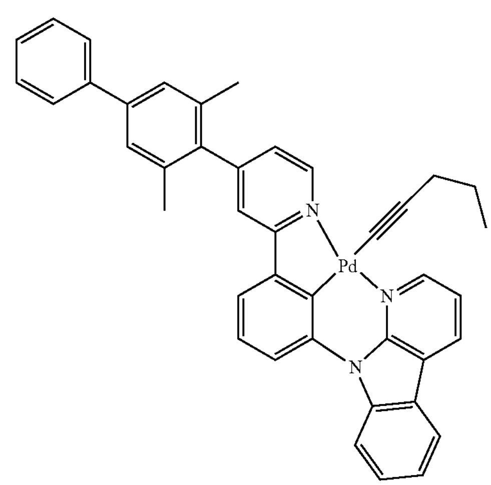

-continued
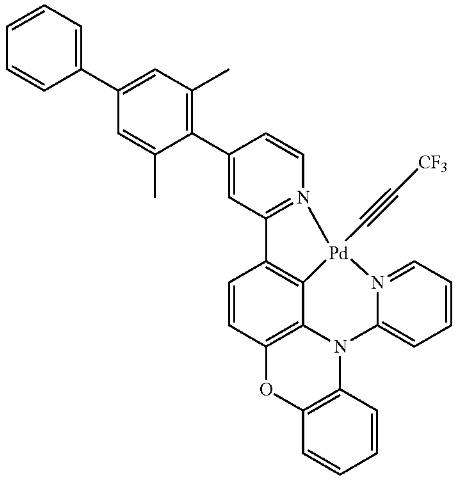
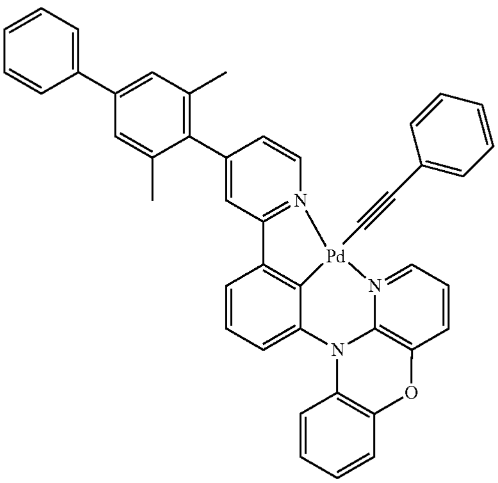
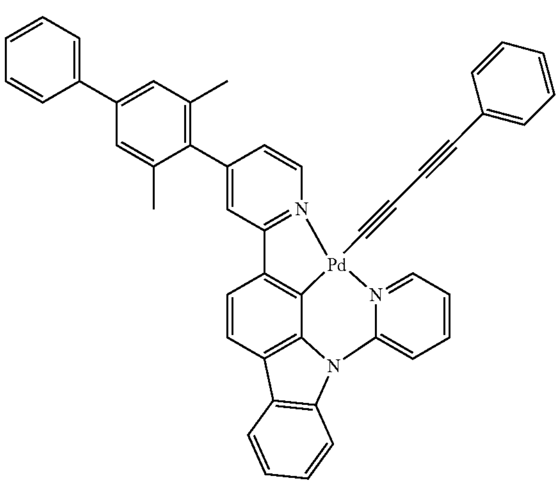
-continued
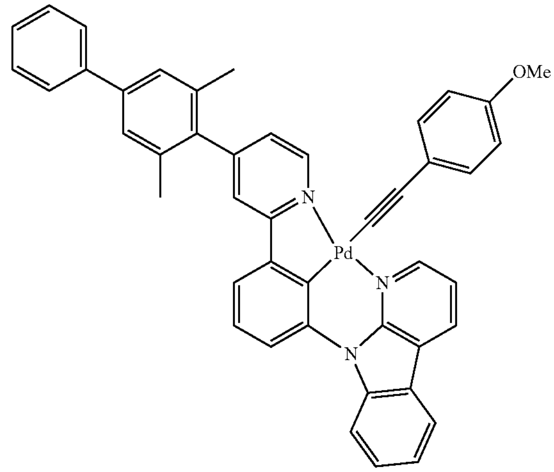
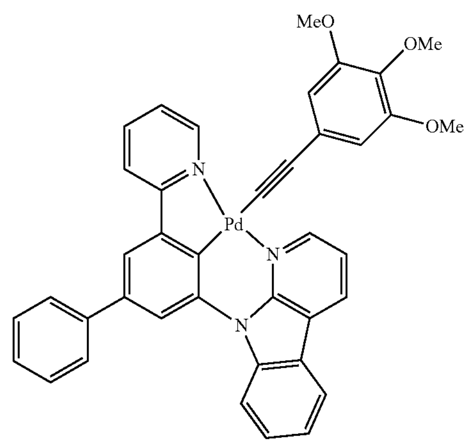
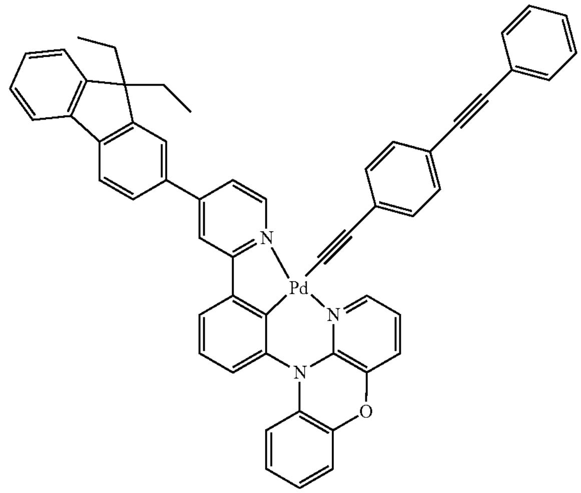

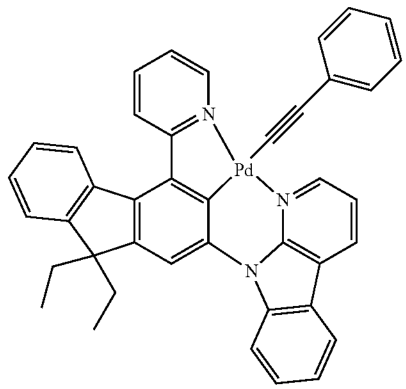
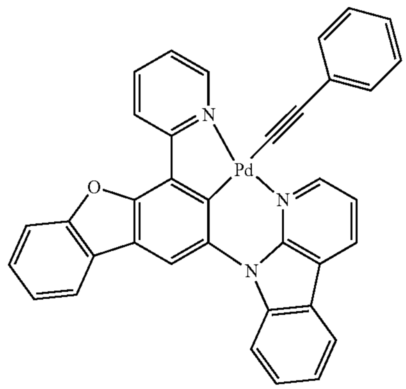
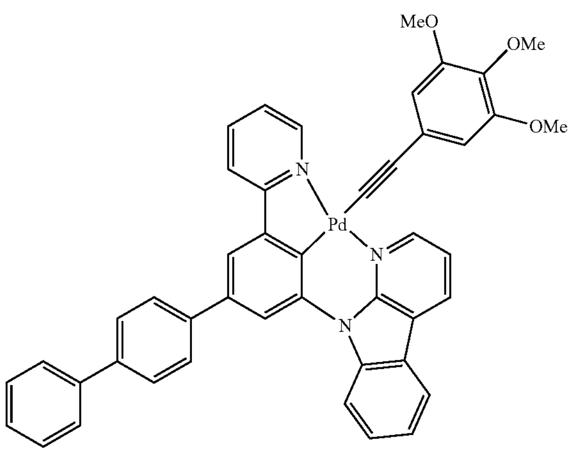
Structures Au-1
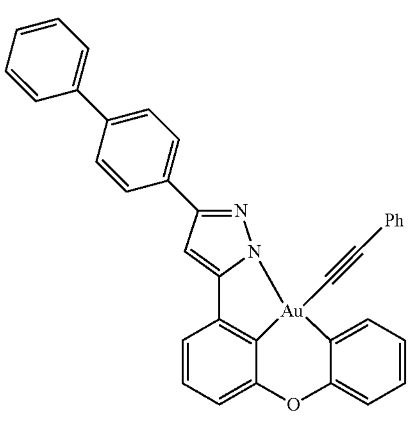
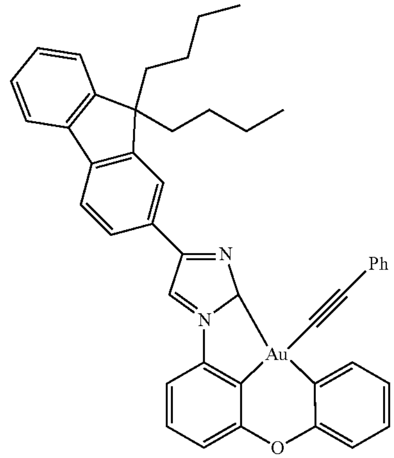
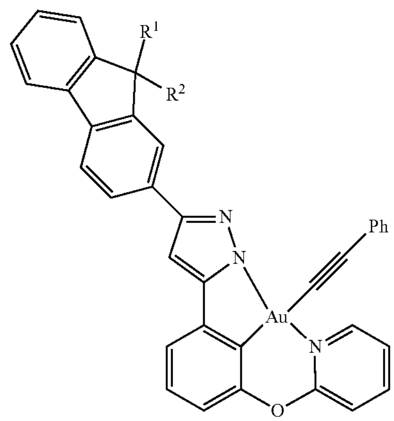
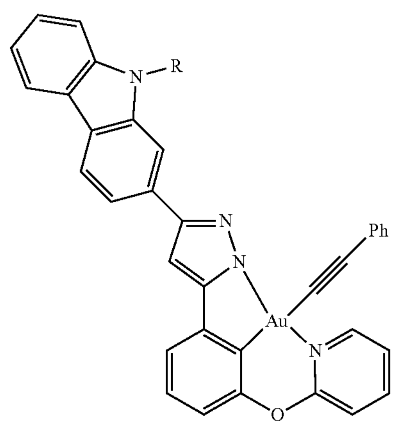
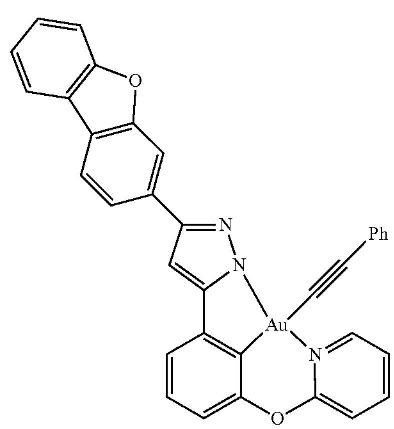

-continued
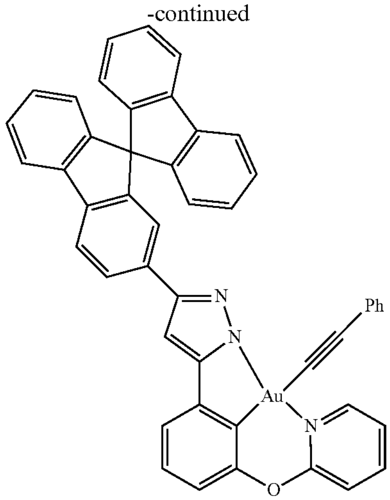
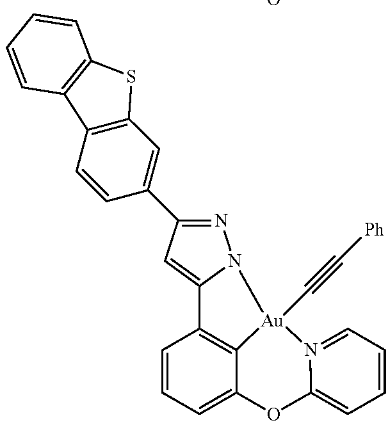
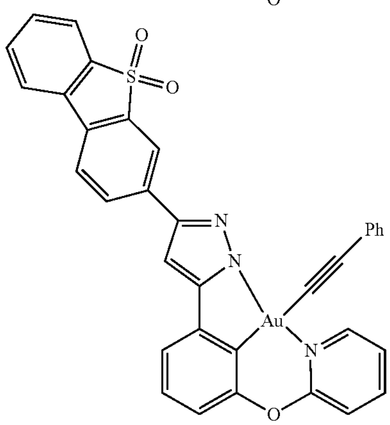
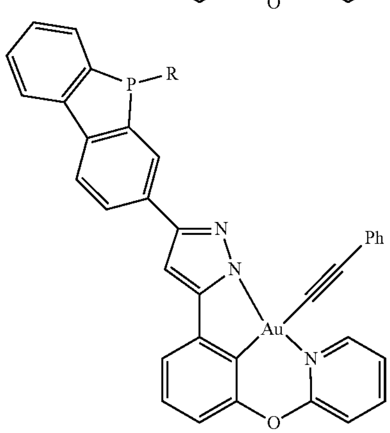
-continued
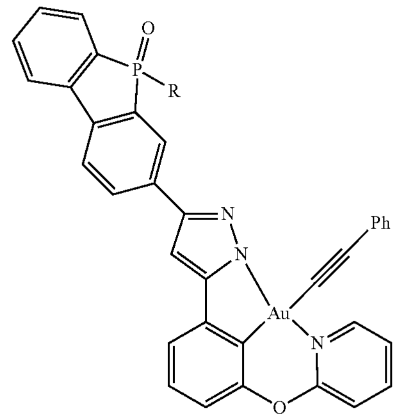
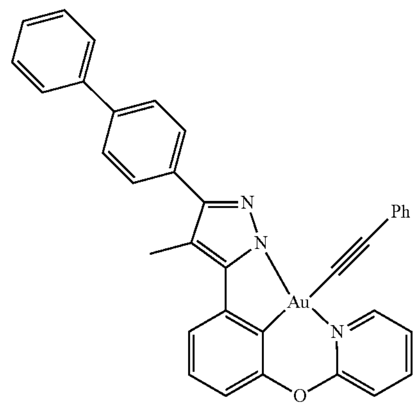
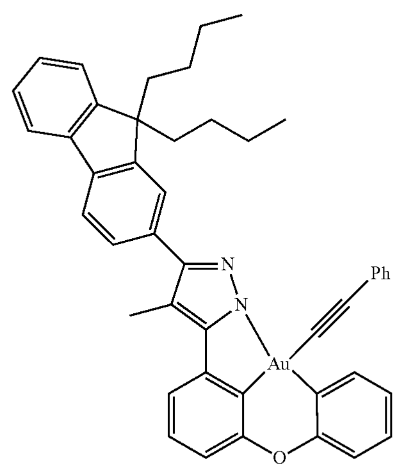
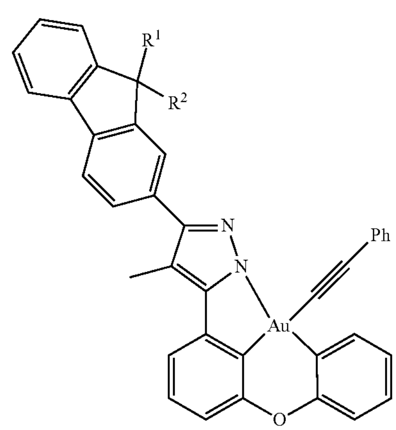

-continued
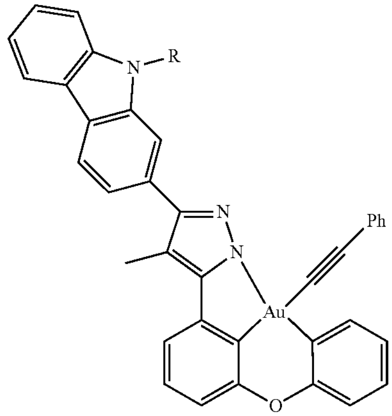
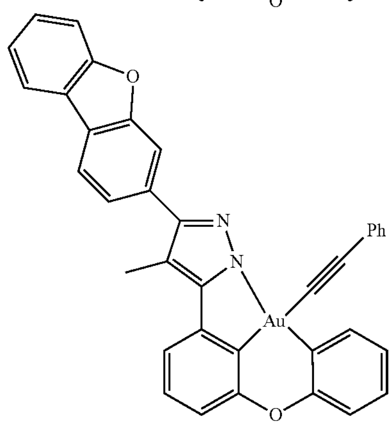
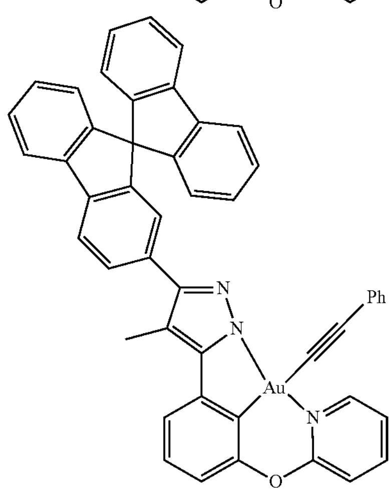
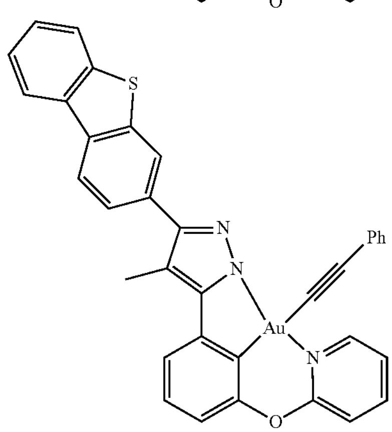
-continued
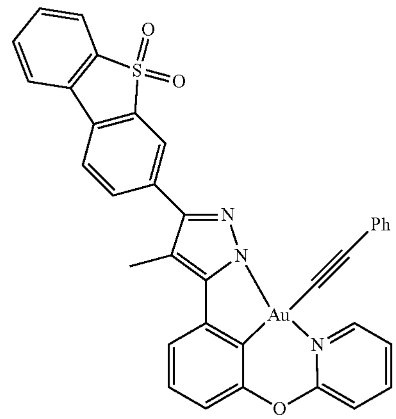
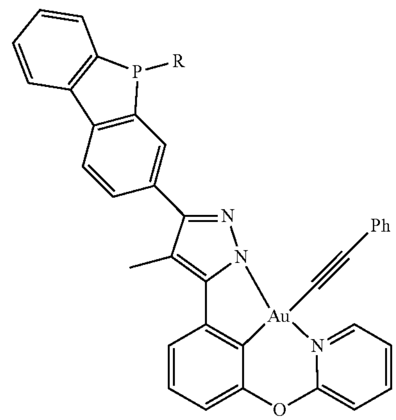
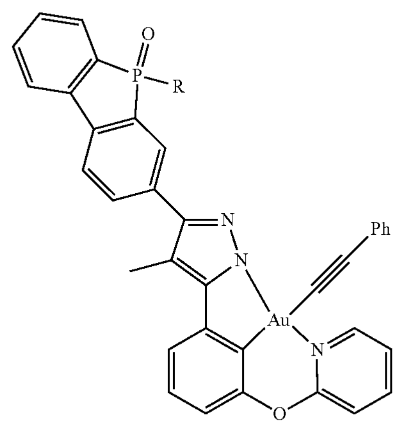
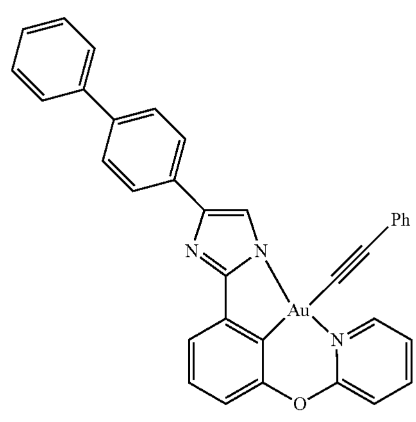

-continued
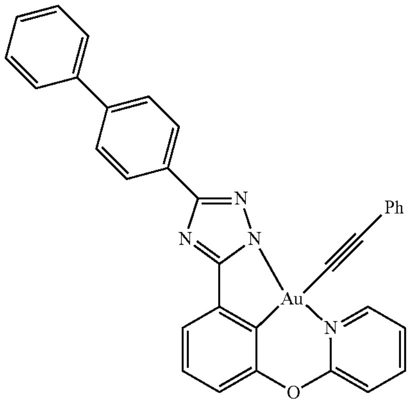
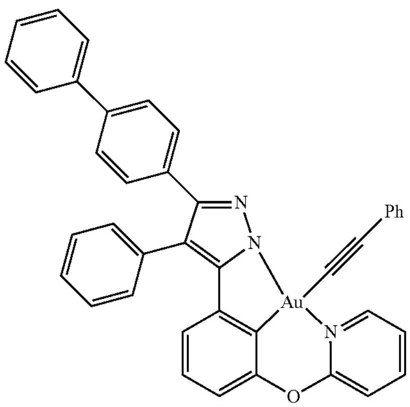
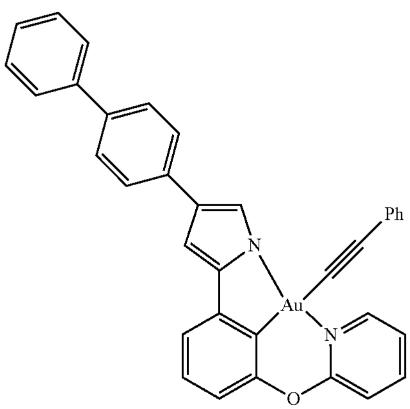
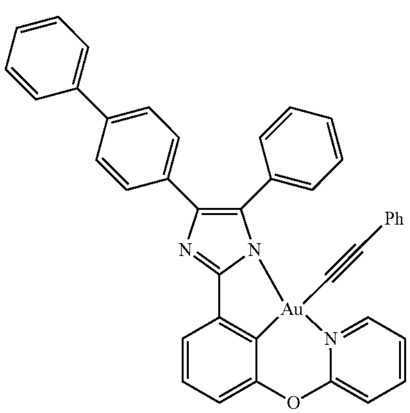
-continued
Structures Au-2
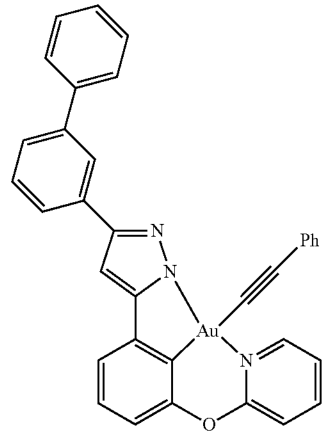
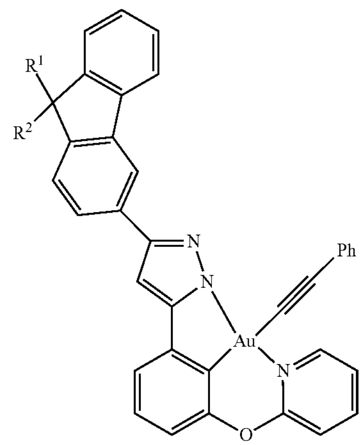
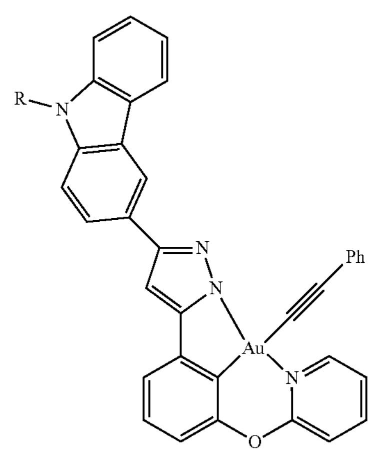

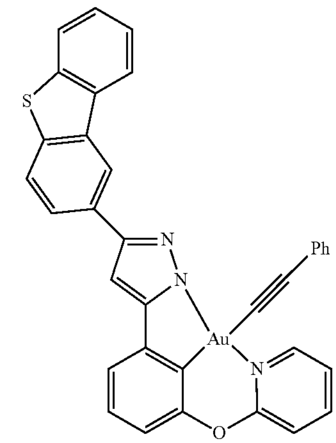
S
N
N
Ph
Au
N
O
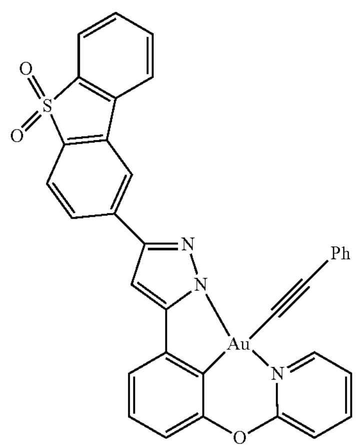
O
O
S
N
N
Ph
Au
N
O
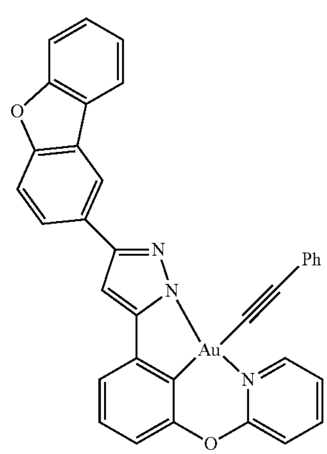
O
N
N
Ph
Au
N
O
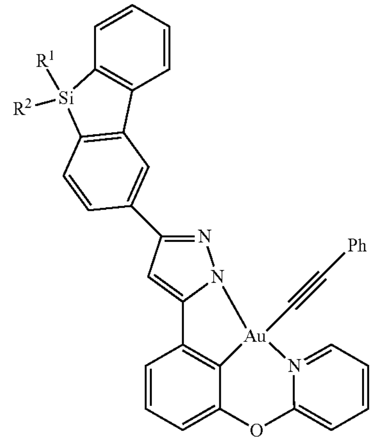
R1
R2
Si
N
N
Ph
Au
N
O
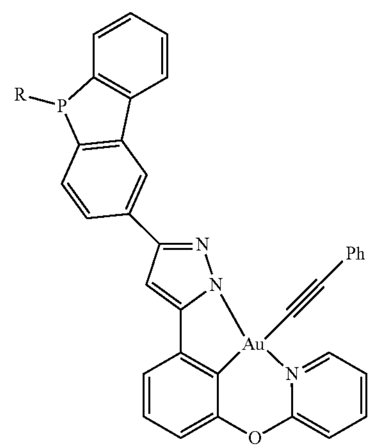
R
P
N
N
Ph
Au
N
O
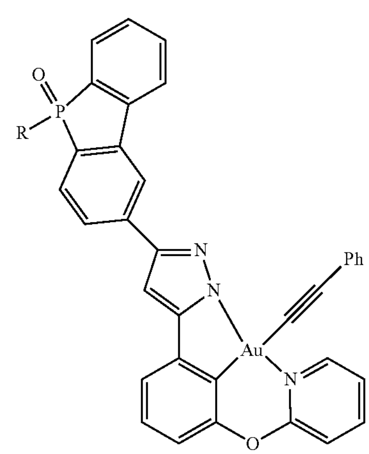
O
P
R
N
N
Ph
Au
N
O -continued
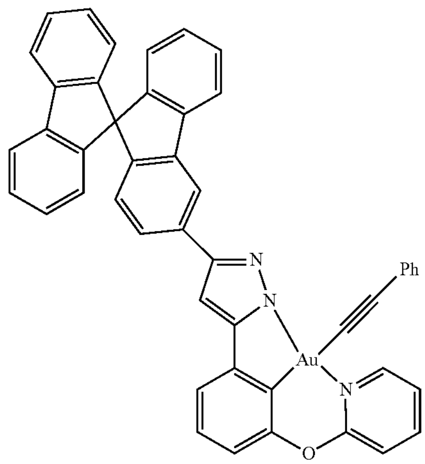
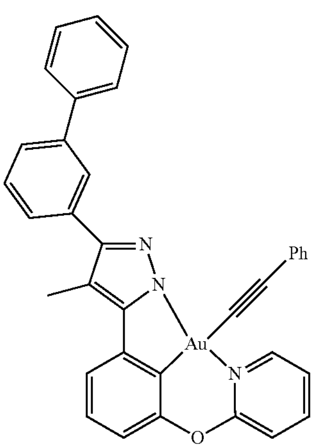
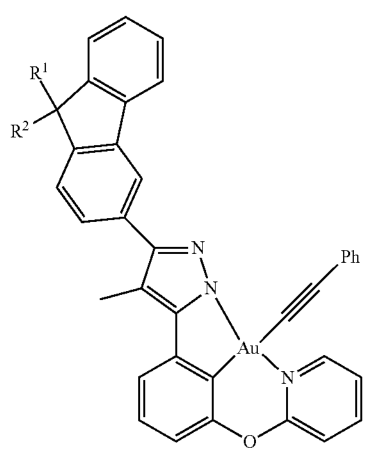
-continued
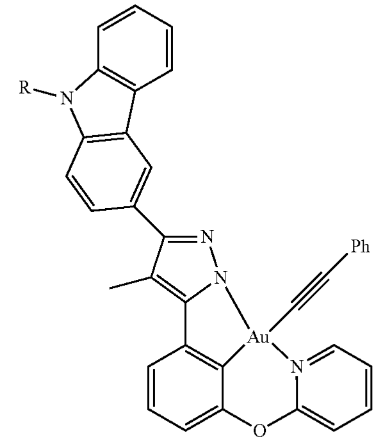
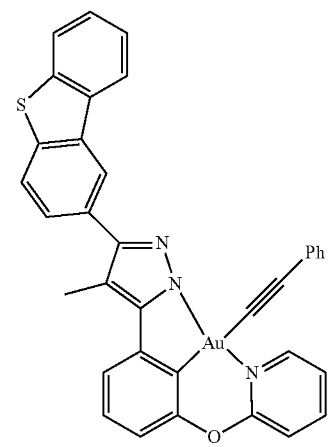
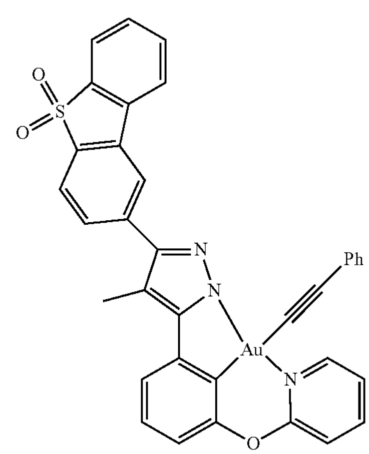

-continued
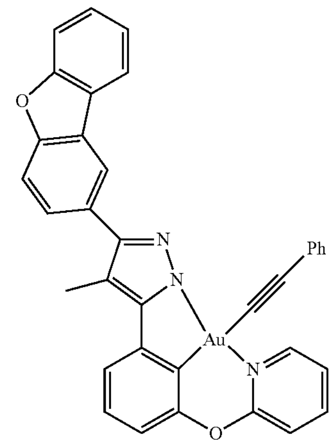
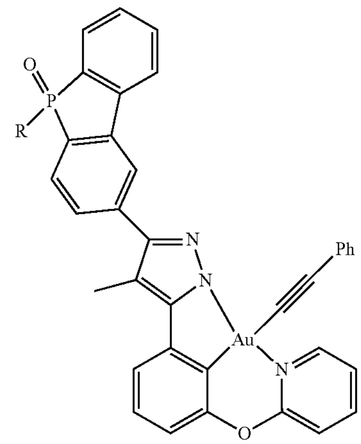
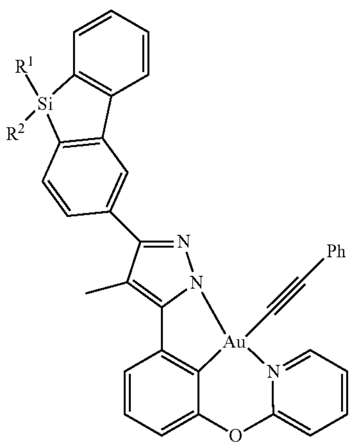
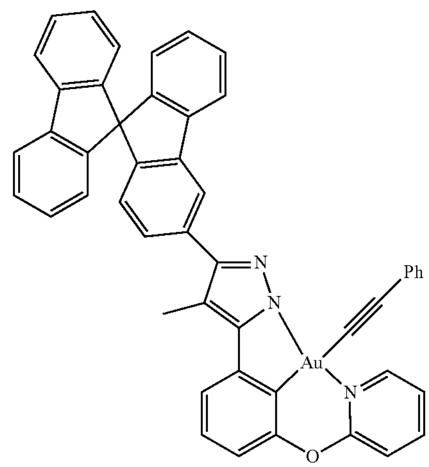
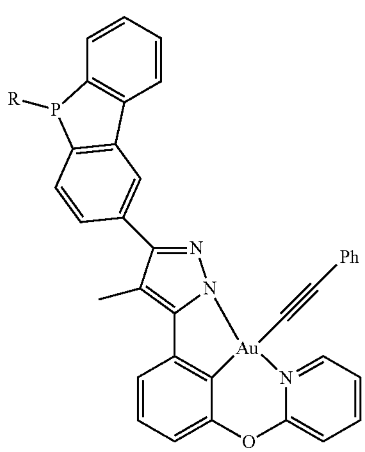
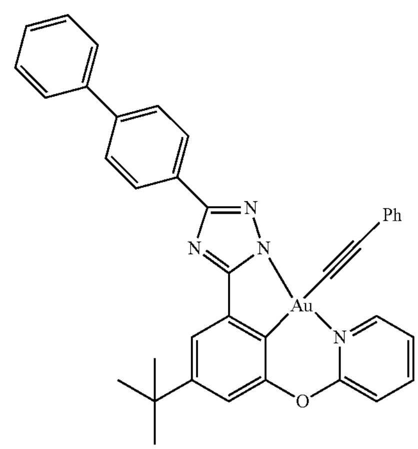

-continued
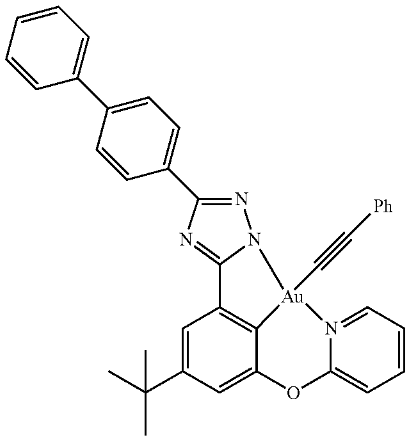
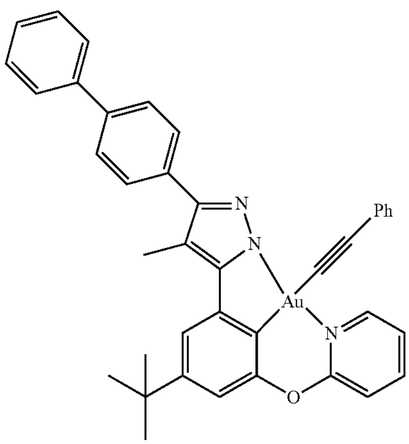
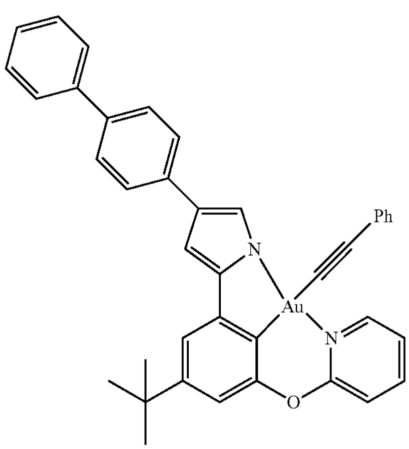
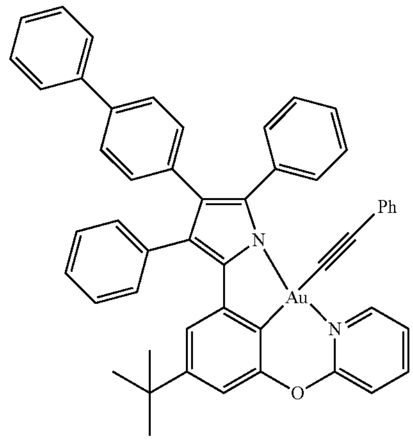
-continued
Structures Au-3
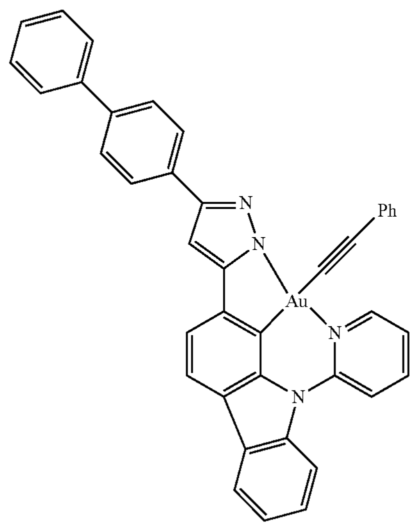
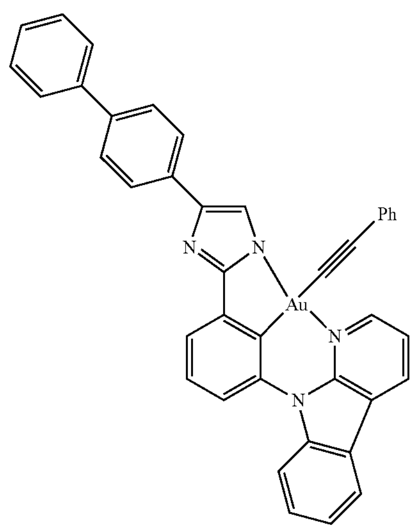

-continued
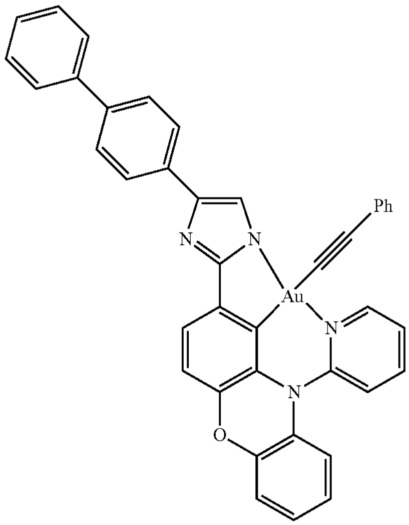
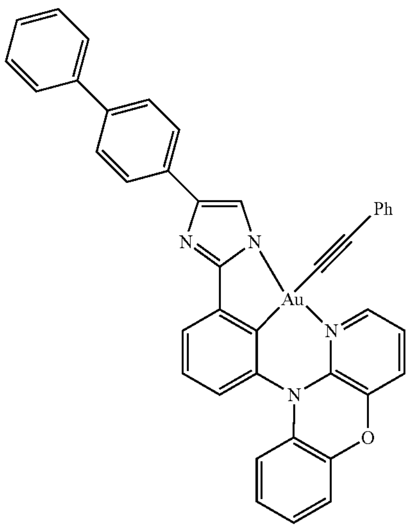
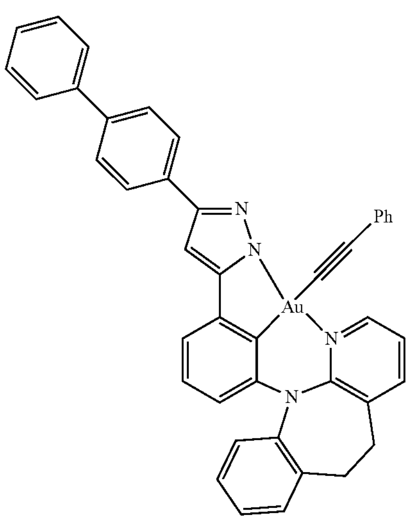
-continued
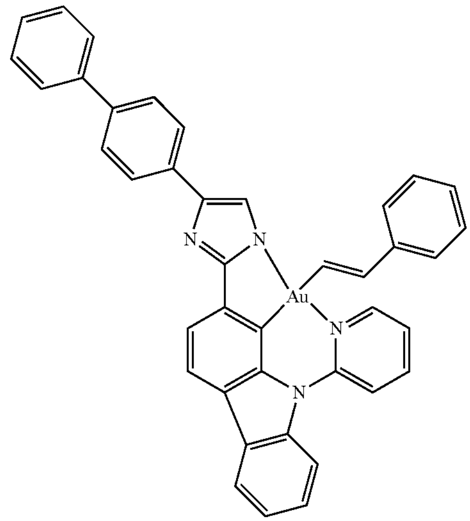
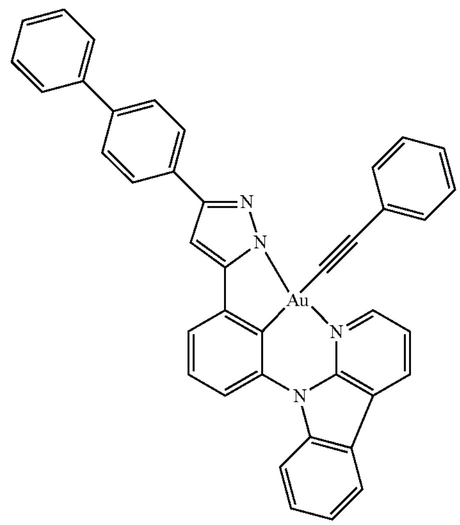
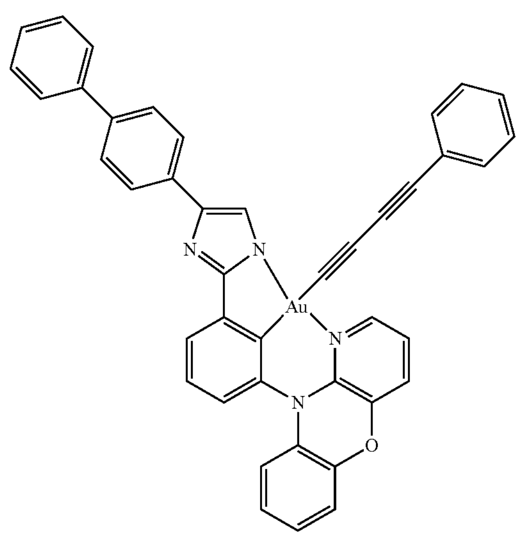

-continued
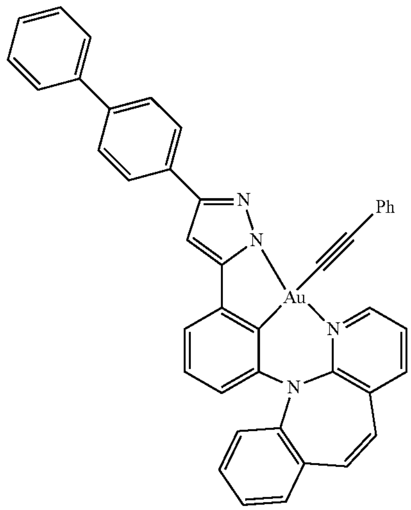
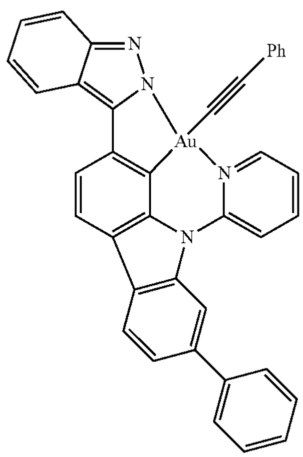
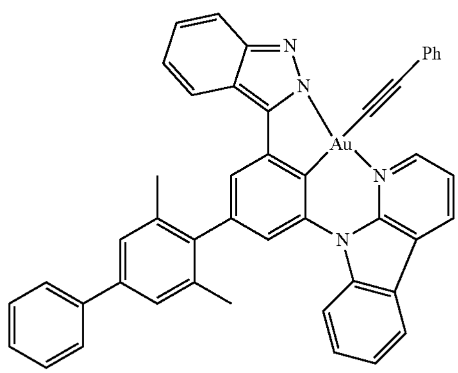
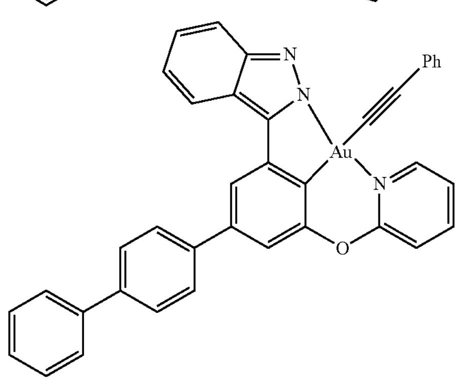
-continued
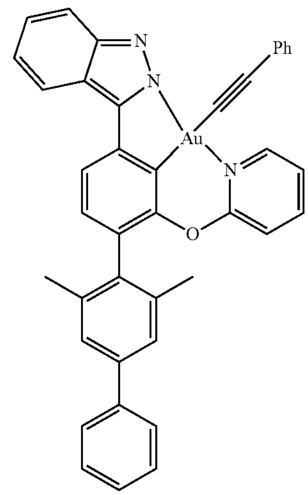
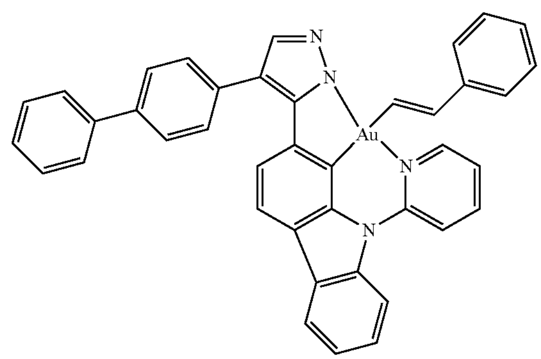
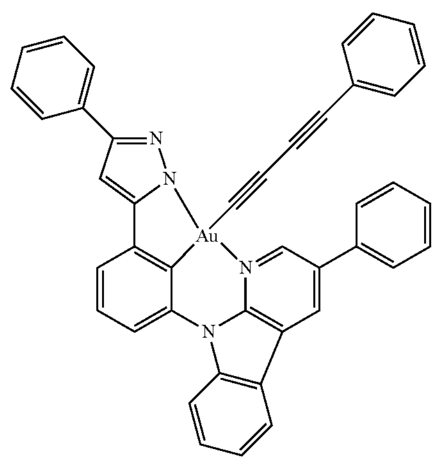
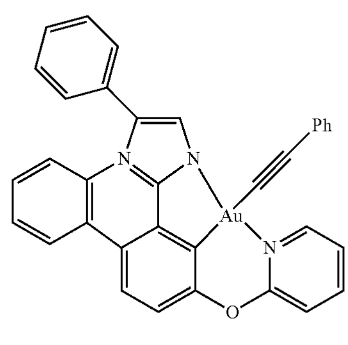

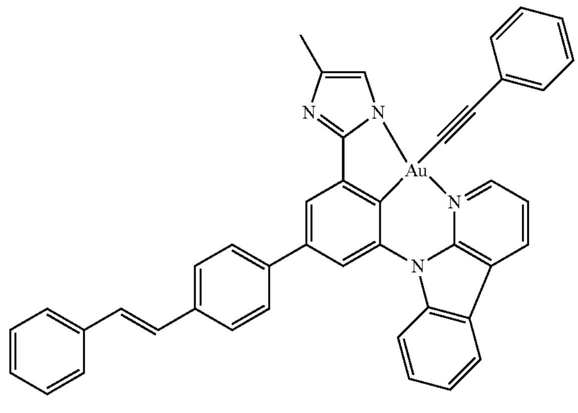
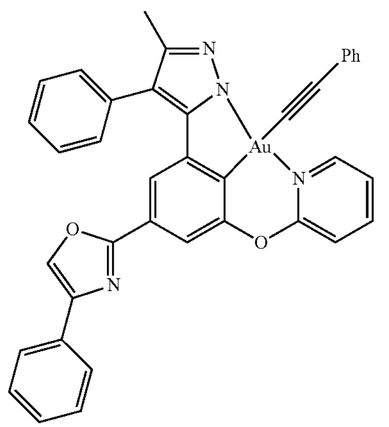
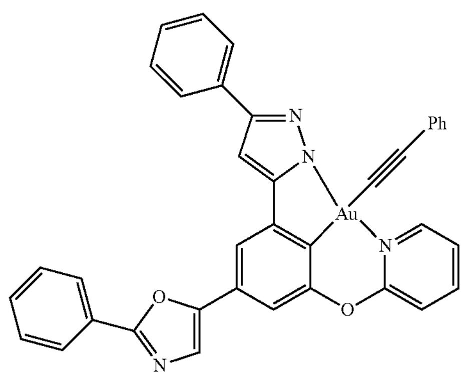
Structures M-1 (M = Ir, Rh)
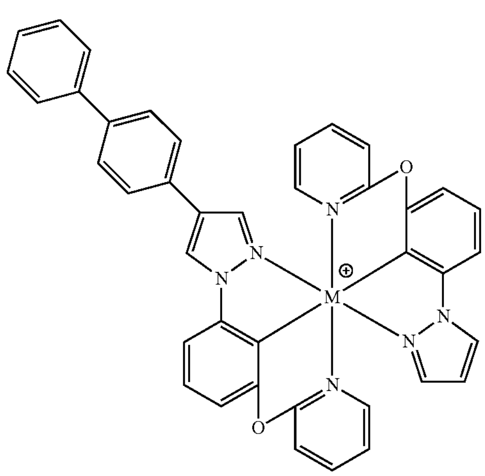
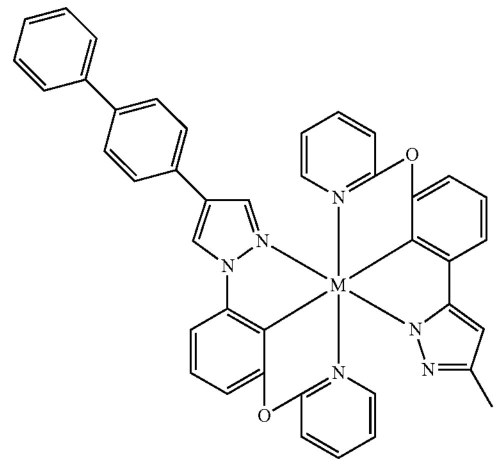
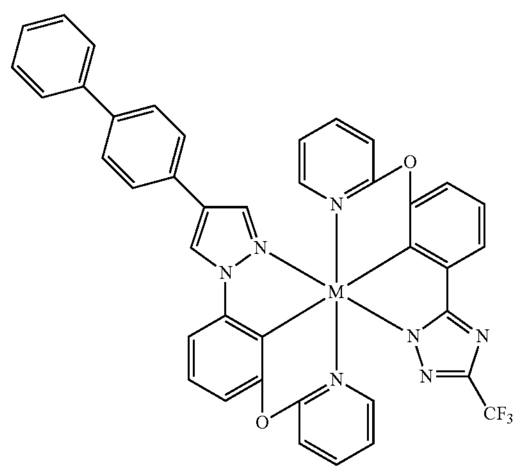
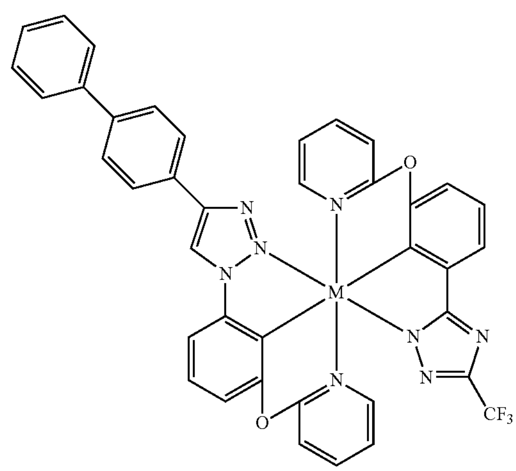

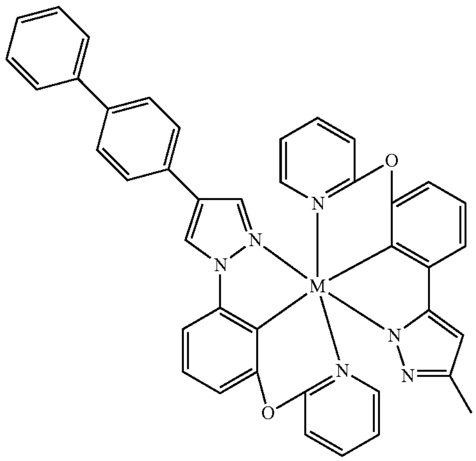
O
N
N
N
M
N
N
N
O
N
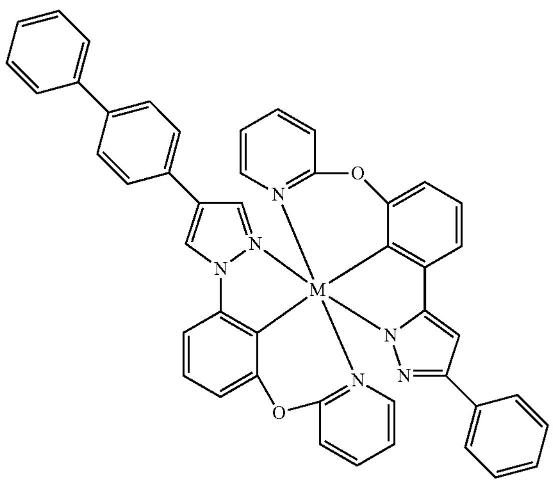
O
N
N
N
M
N
N
N
O
N
N
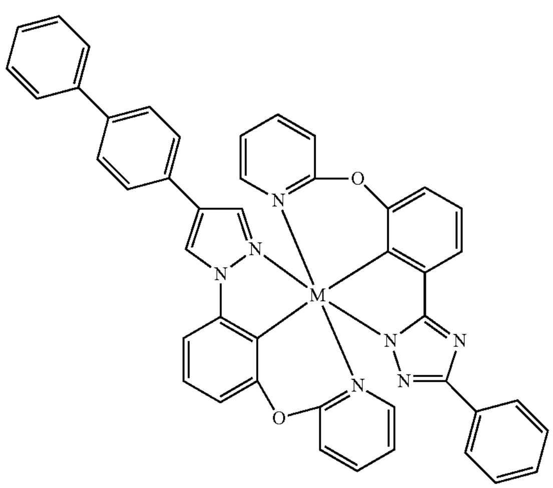
O
N
N
N
M
N
N
N
N
O
N
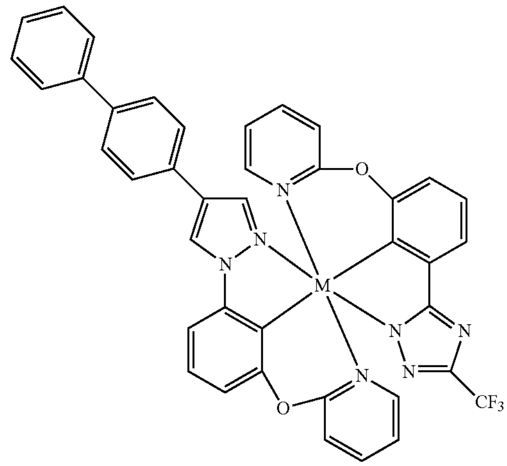
N
O
N
N
M
N
N
N
O
N
CF3
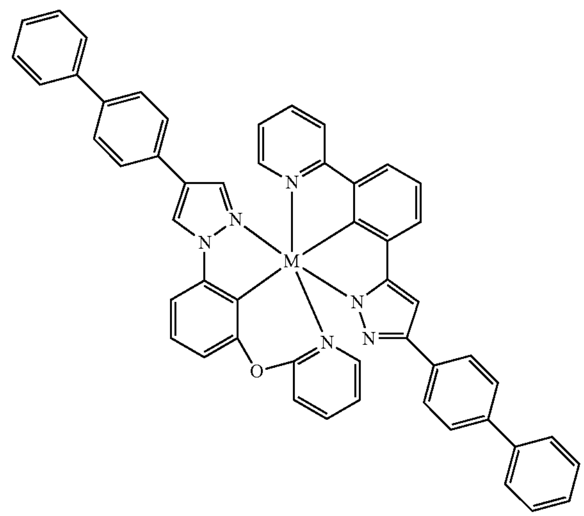
N
N
N
M
N
N
O
N
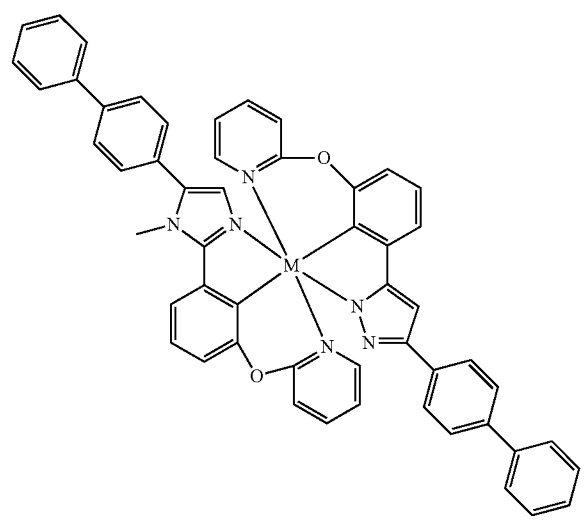
N
O
N
N
M
N
N
O
N -continued
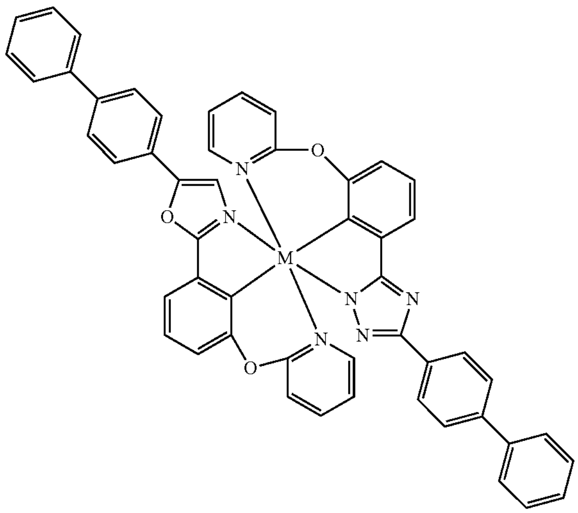
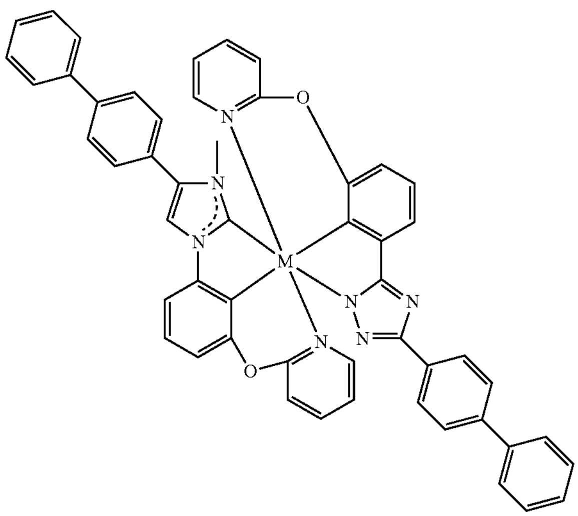
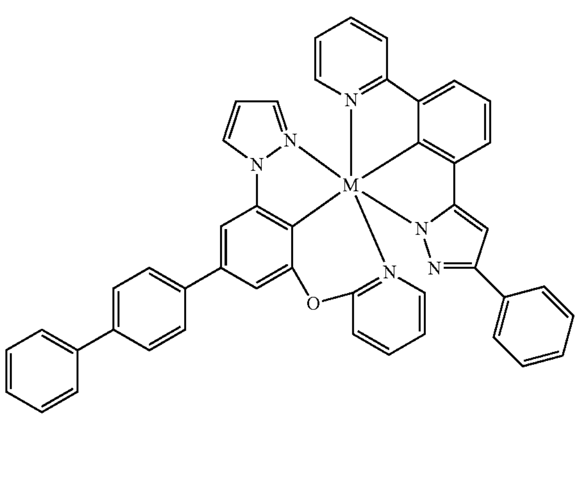
-continued
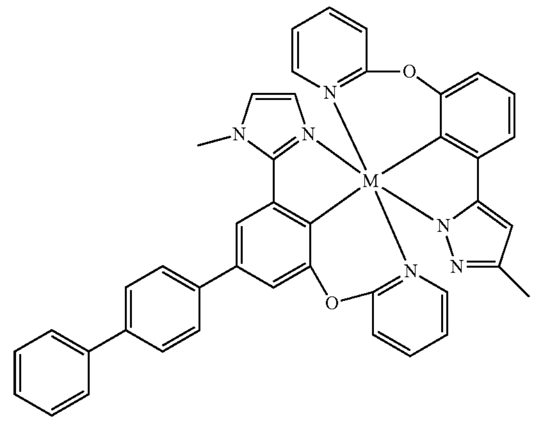
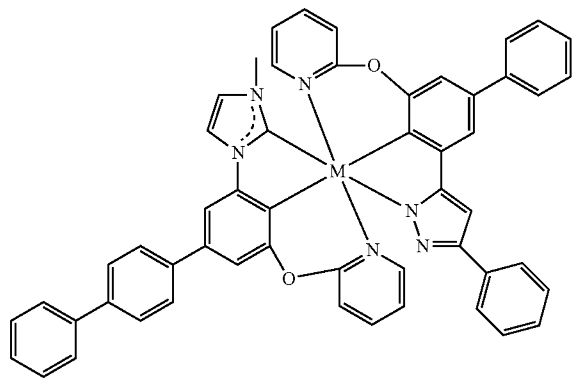
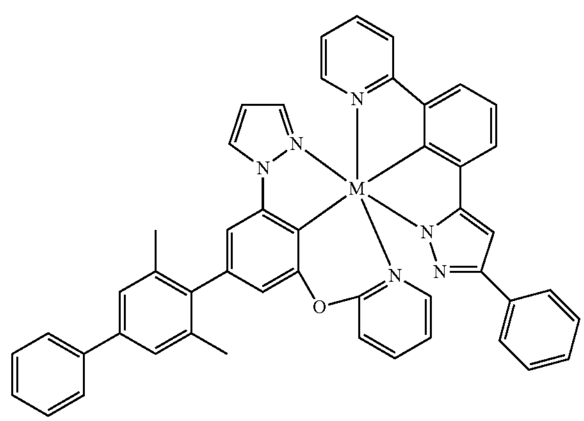
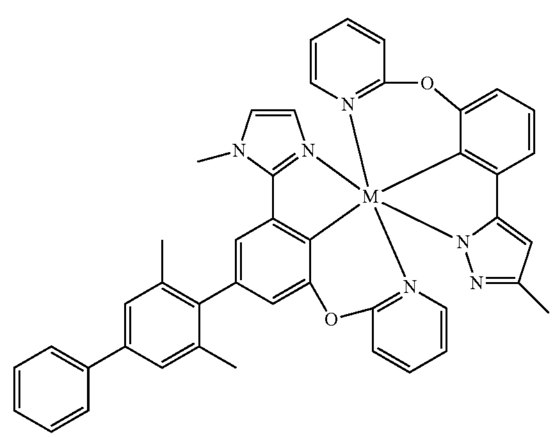

-continued
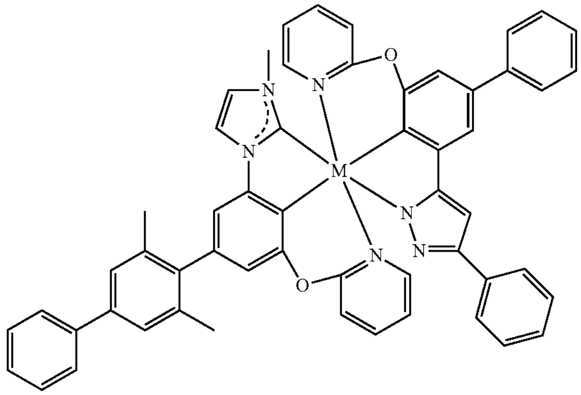
-continued
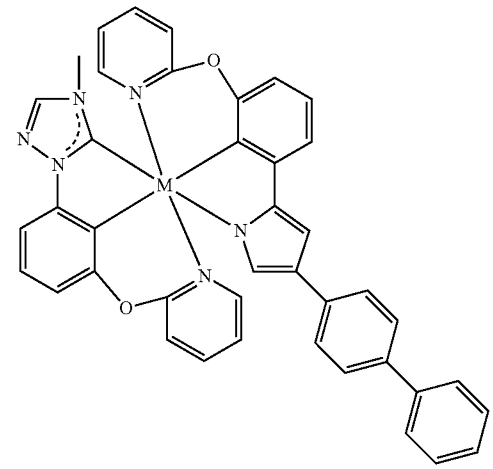
Structures M-2 (M = Ir, Rh)
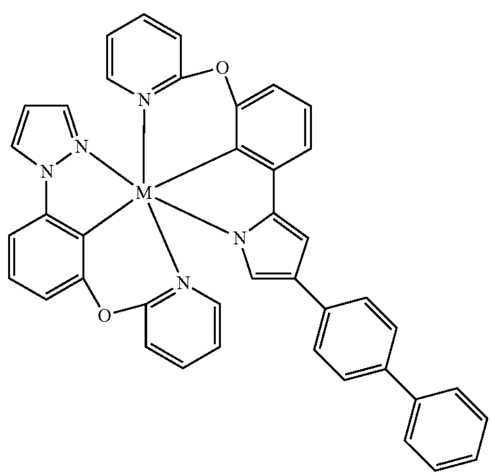
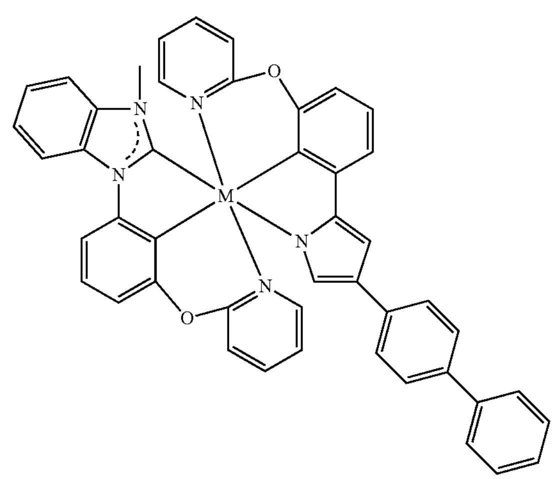
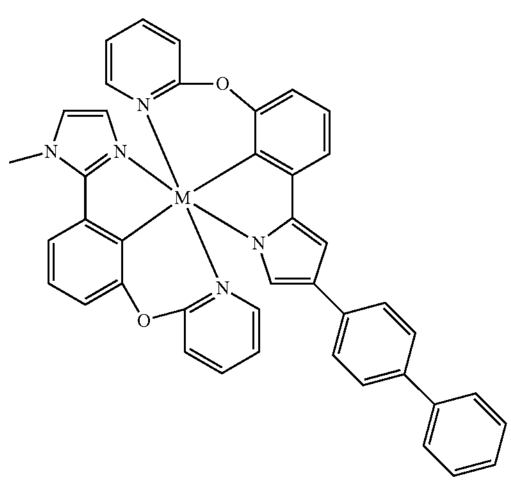
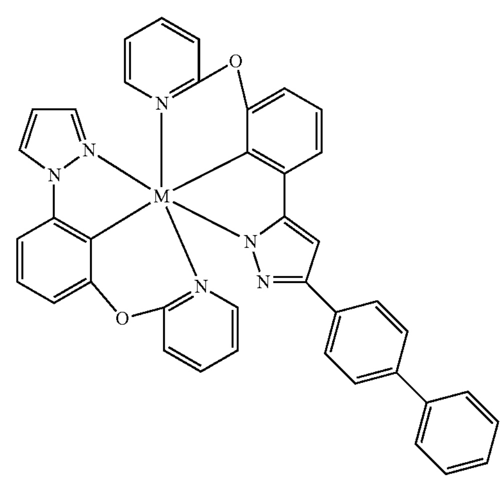

-continued
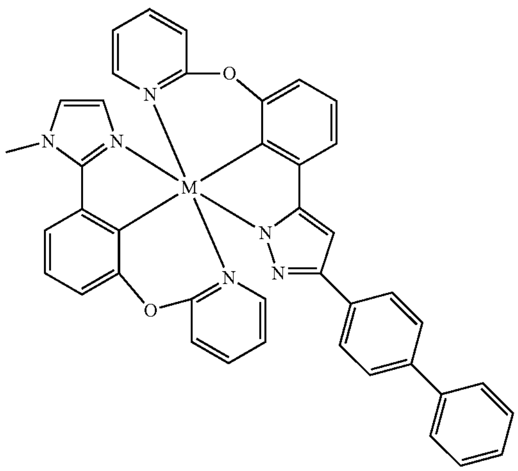
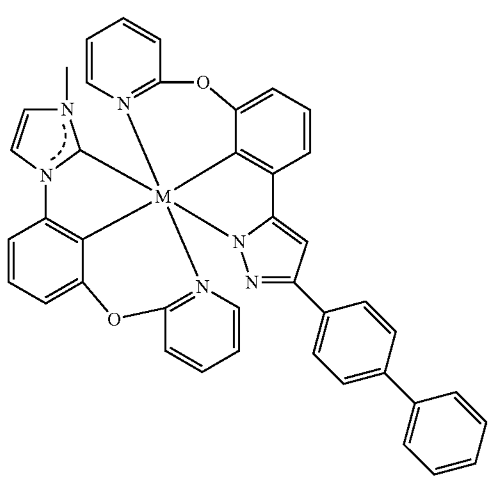
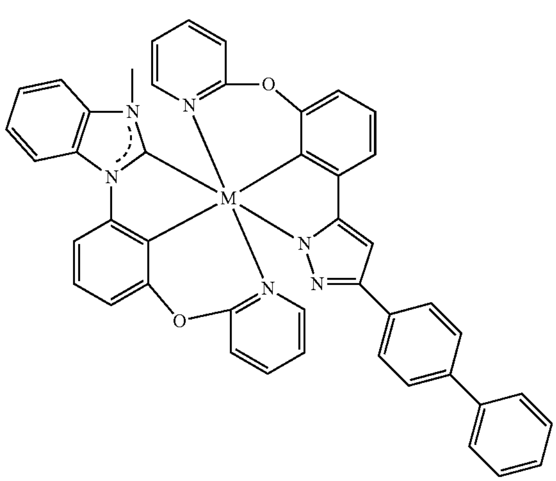
-continued
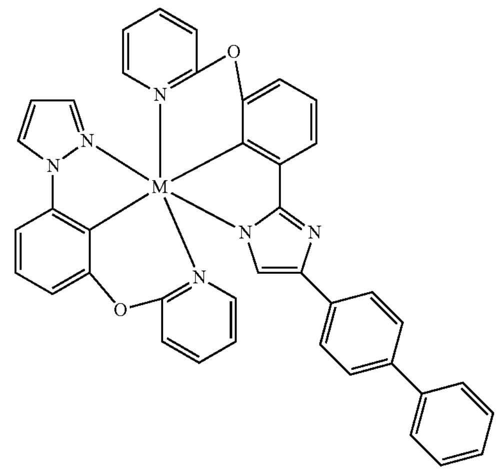
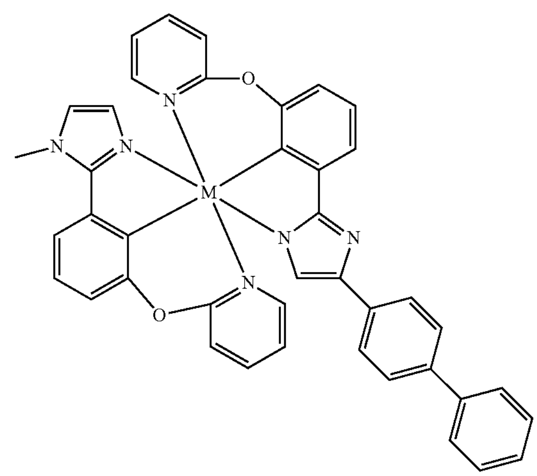
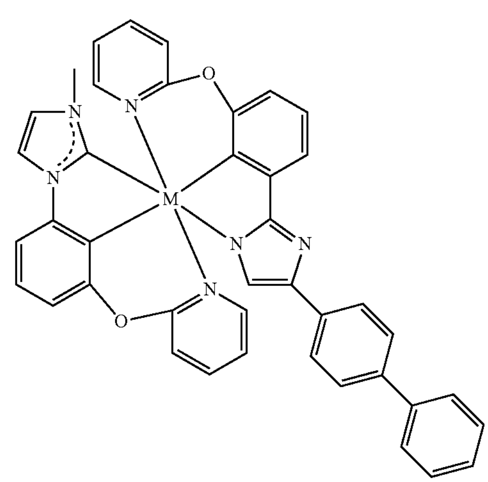

-continued
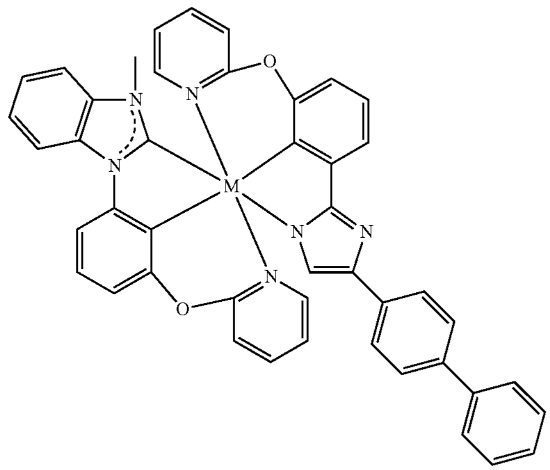
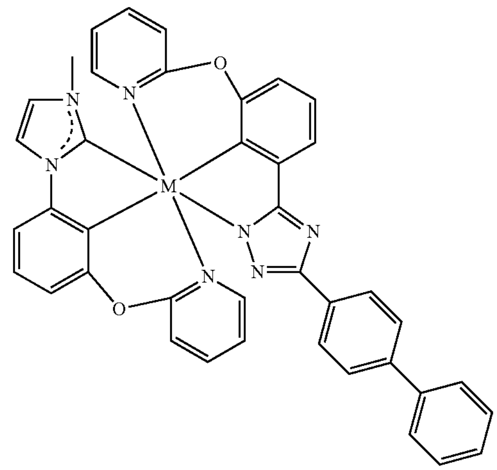
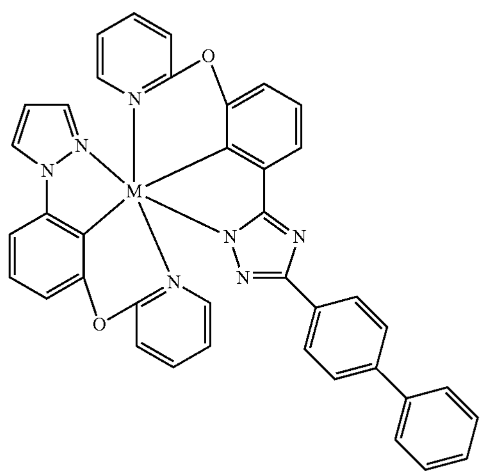
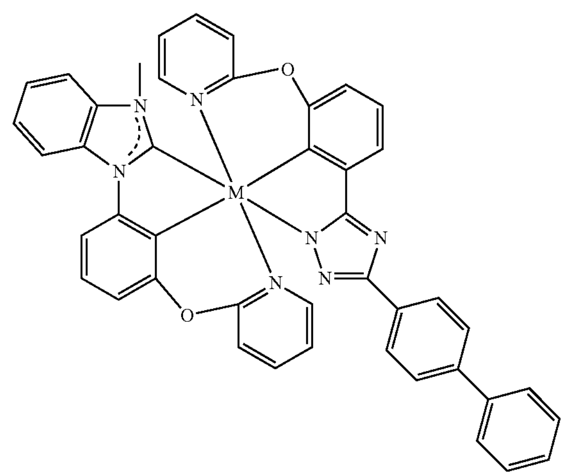
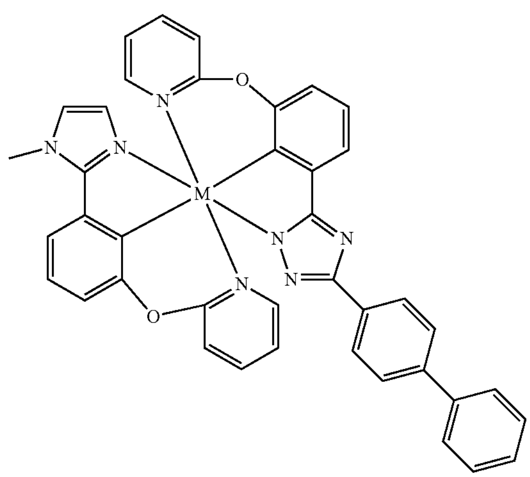
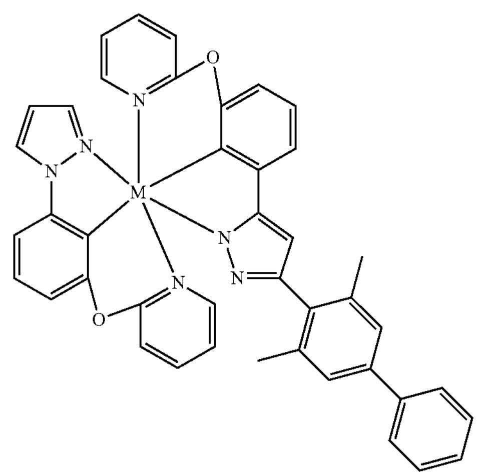

-continued
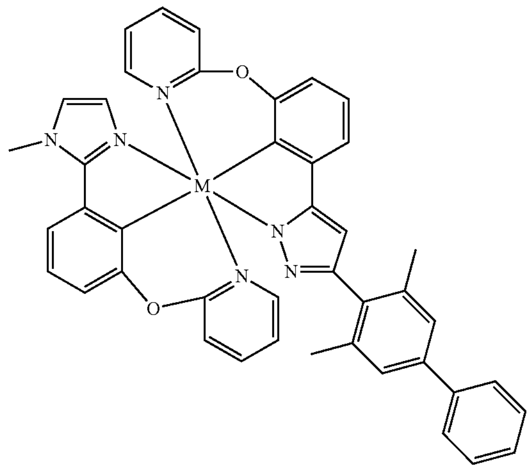
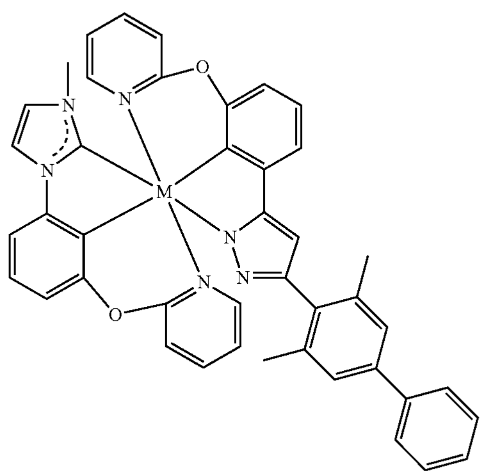
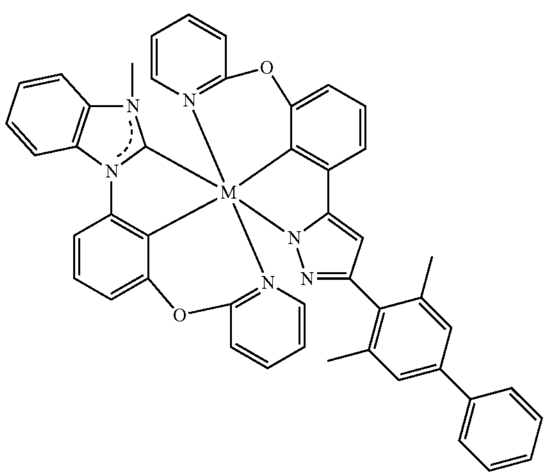
-continued
Structures M-3 (M = Ir, Rh)
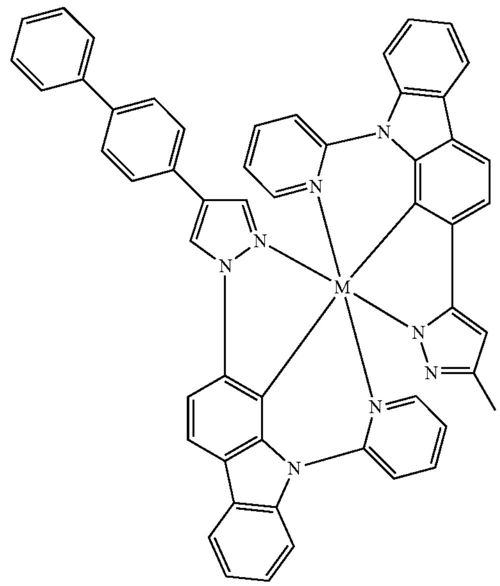
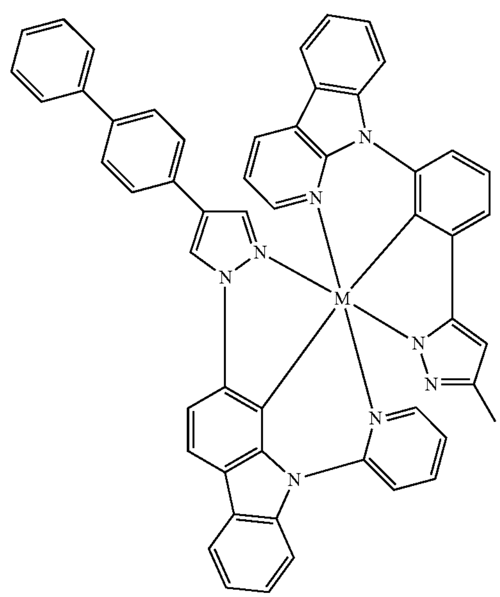

-continued
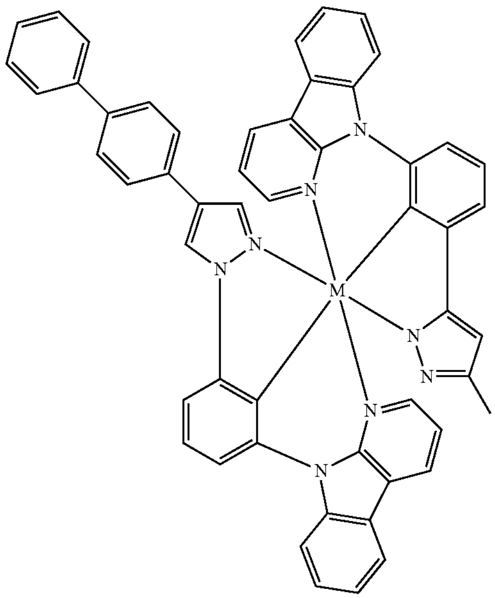
-continued
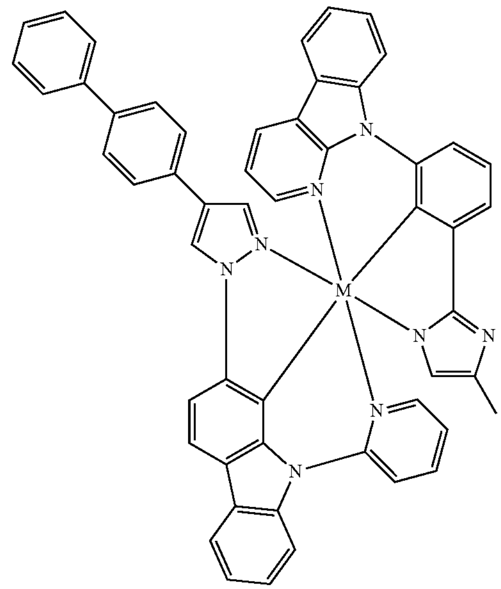
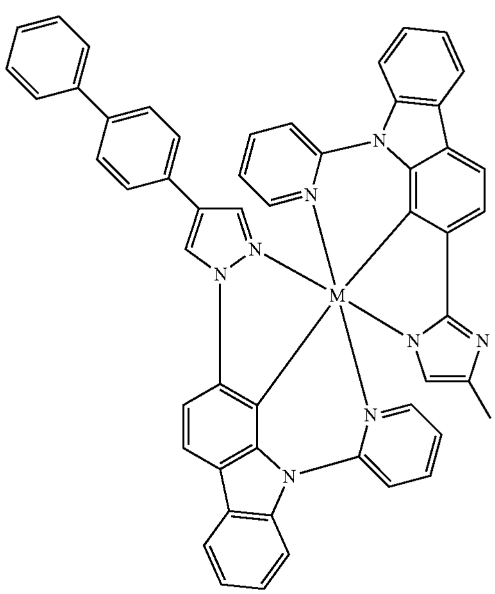
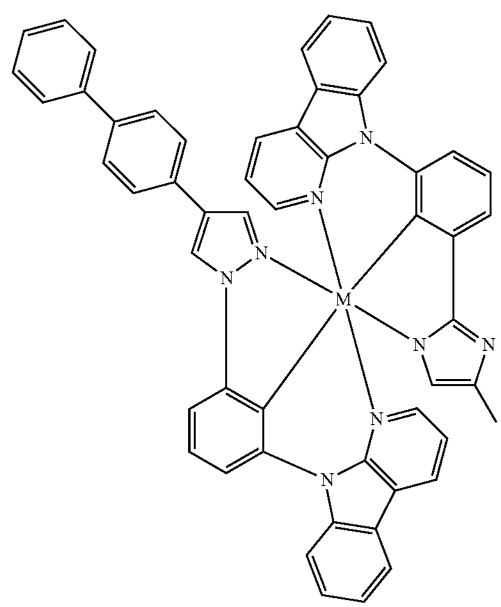

-continued
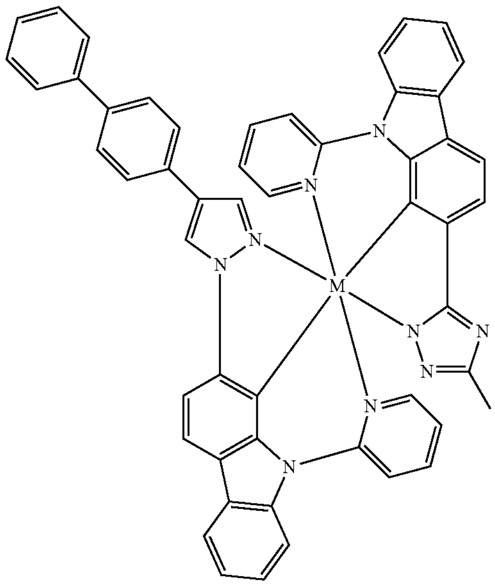
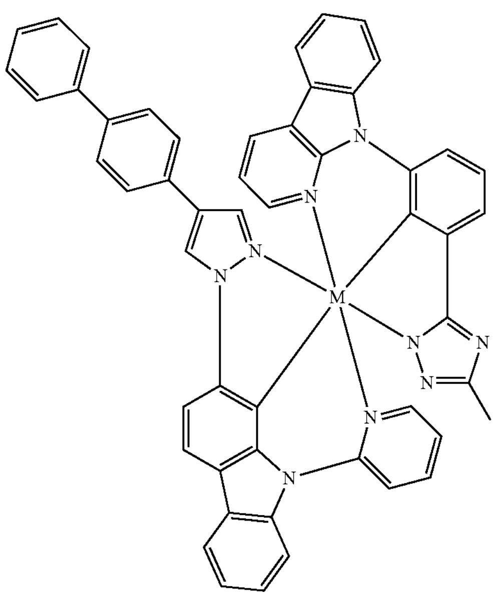
-continued
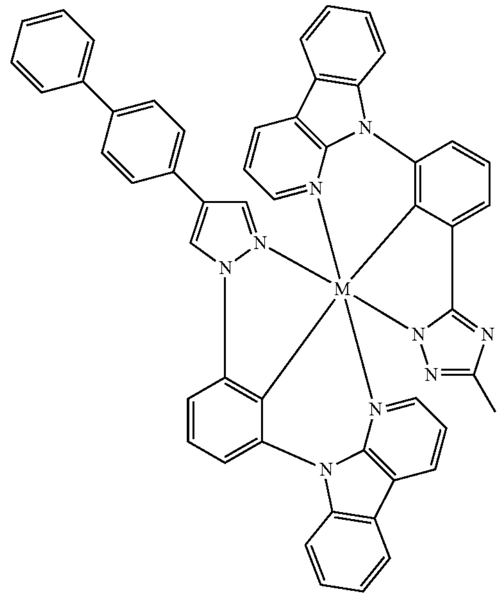
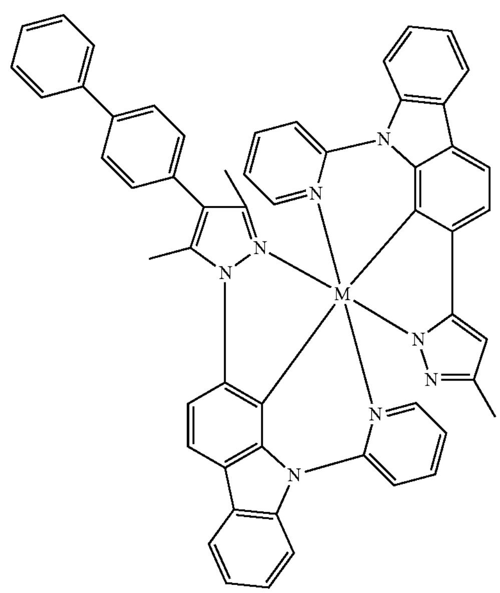

-continued
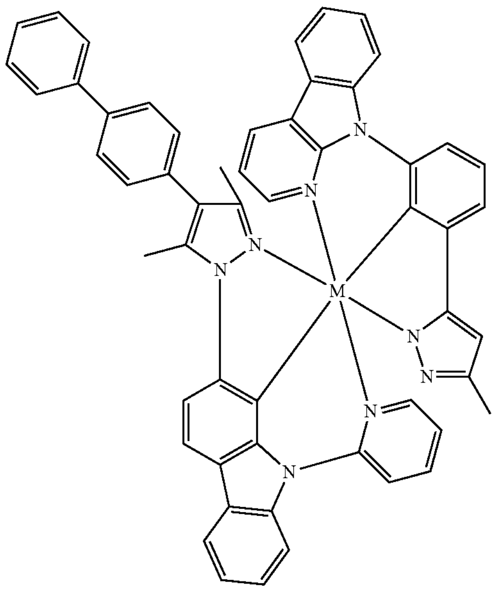
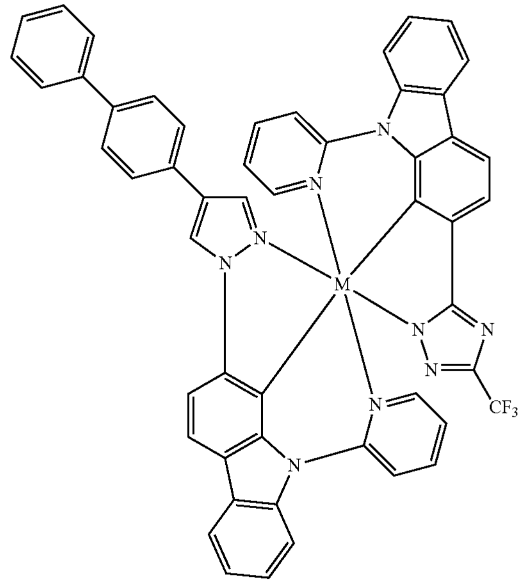
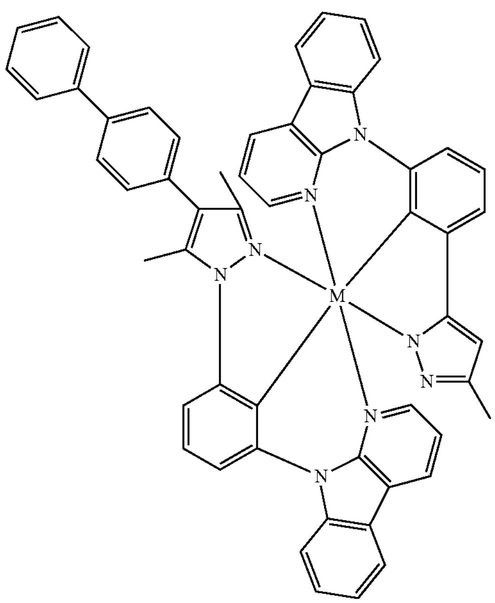
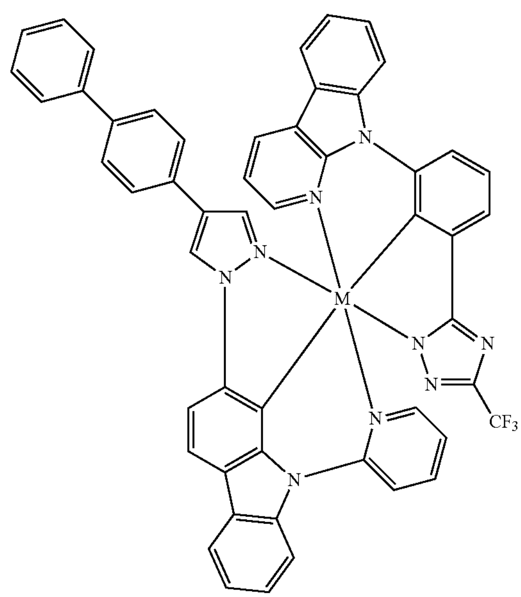

-continued
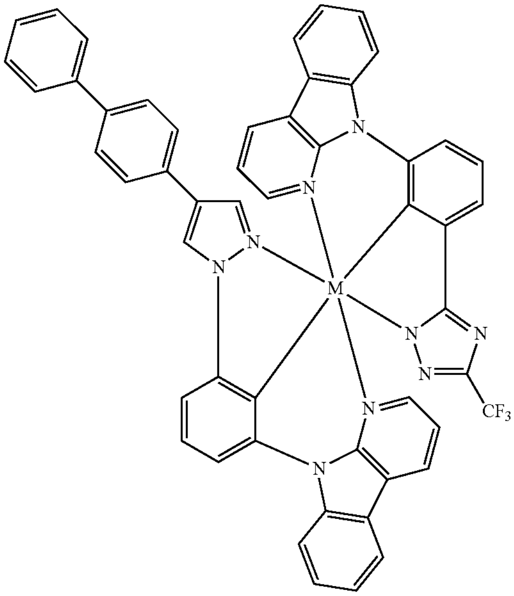
-continued
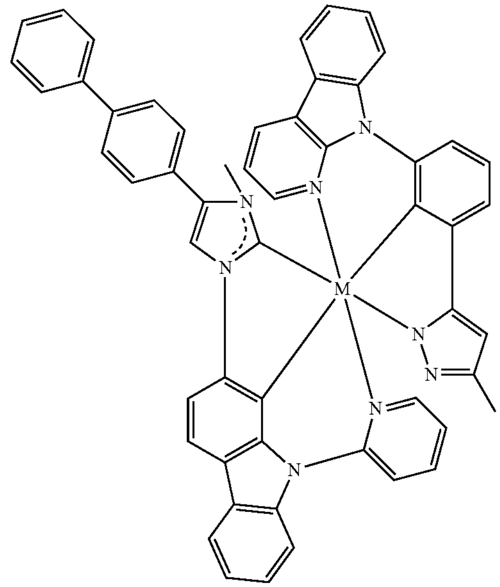
Structures M-4 (M = Ir, Rh)
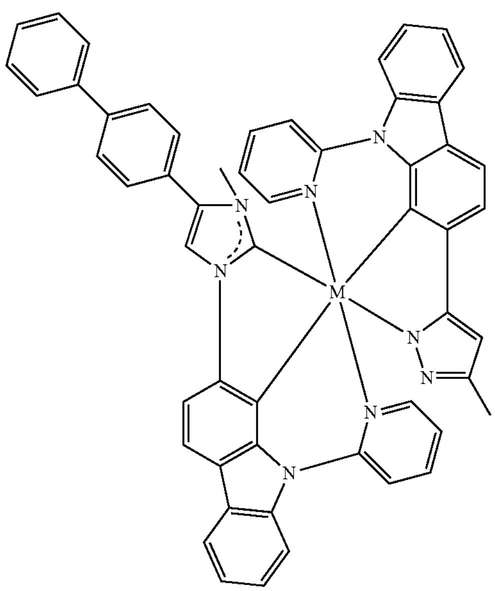
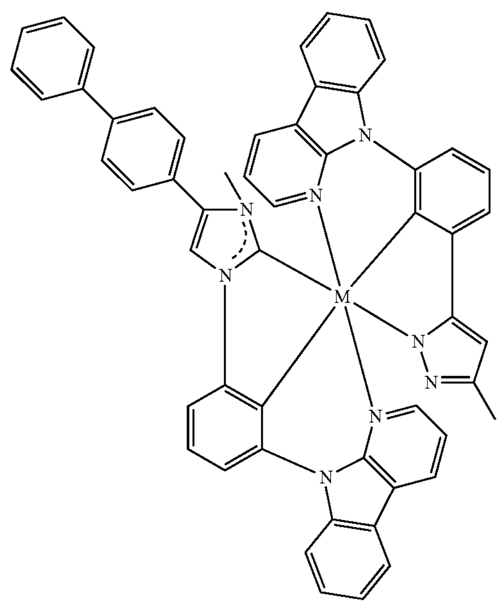

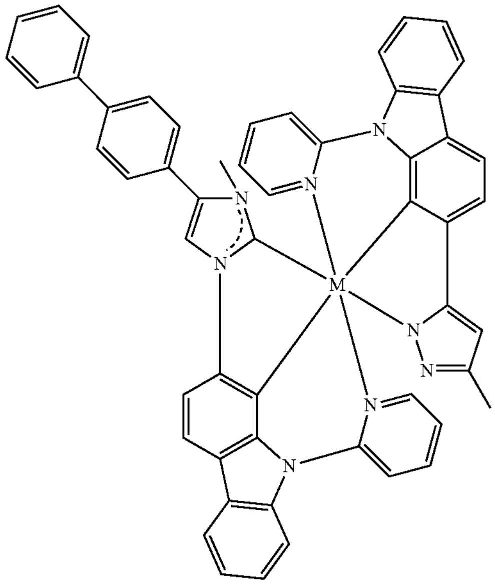
N
N
N
M
N
N
N
N
N
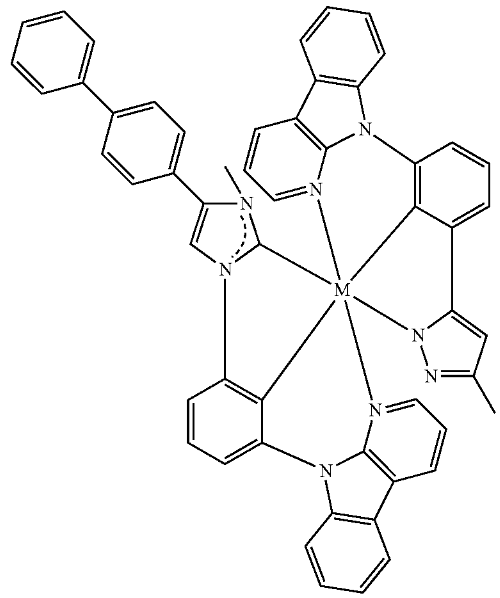
N
N
N
M
N
N
N
N
N
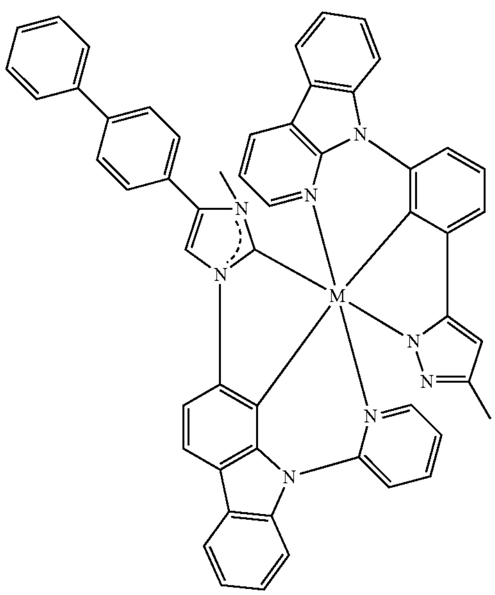
N
N
N
M
N
N
N
N
N
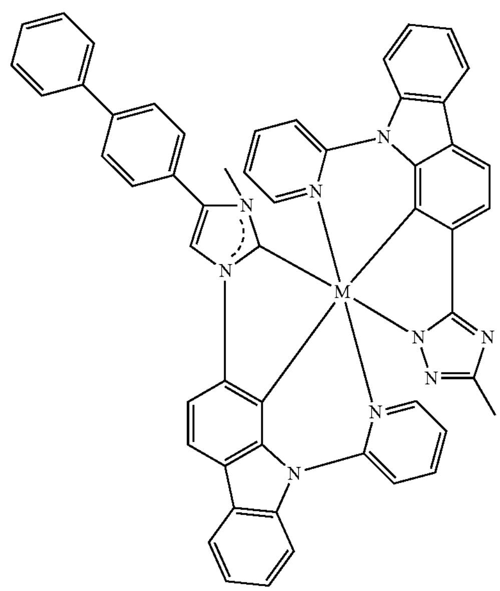
N
N
N
M
N
N
N
N
N
N -continued
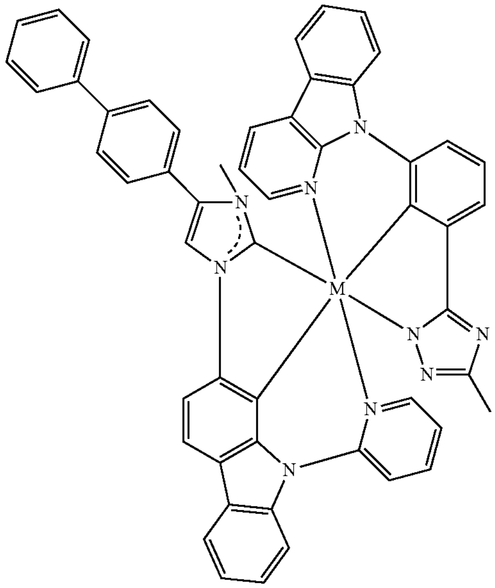
-continued
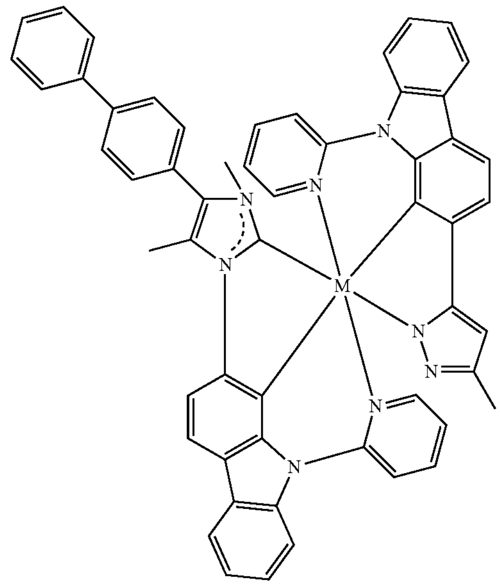
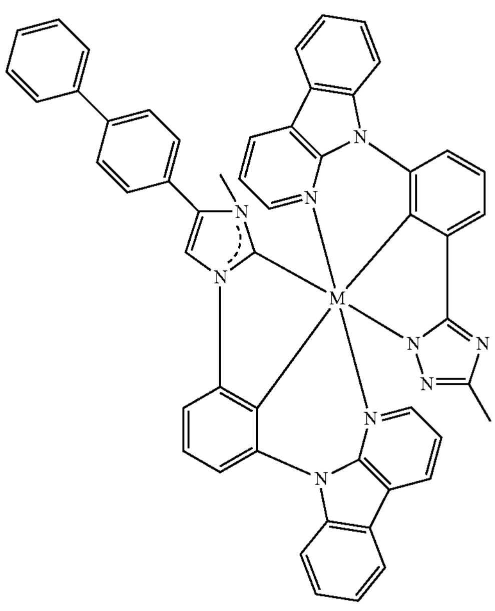
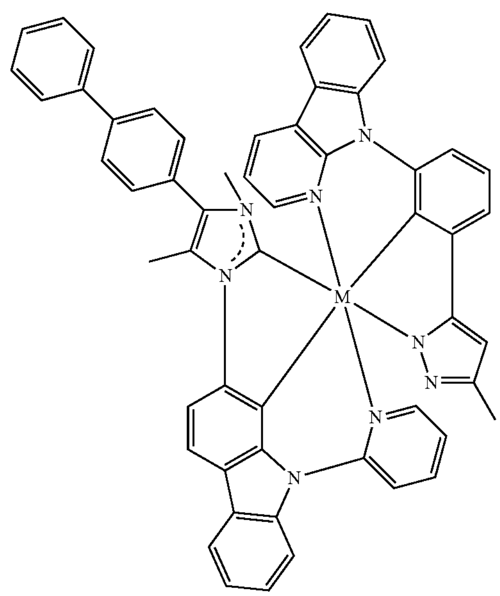

-continued
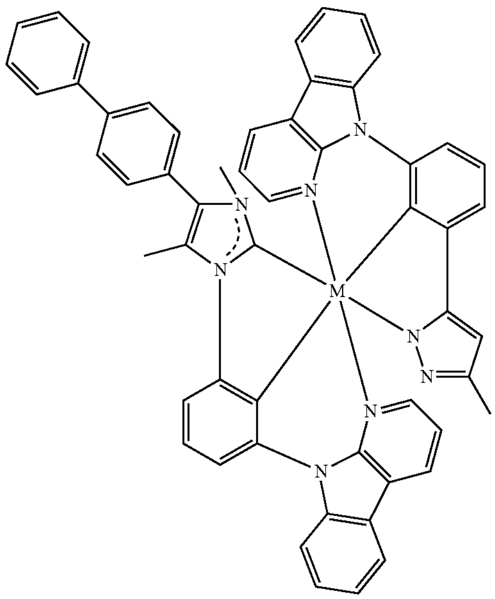
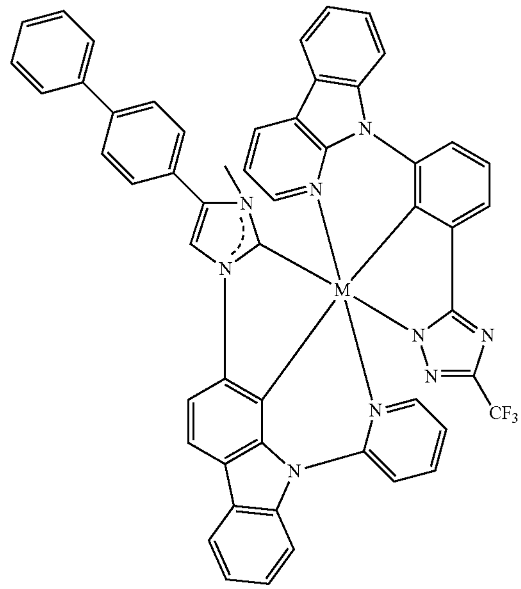
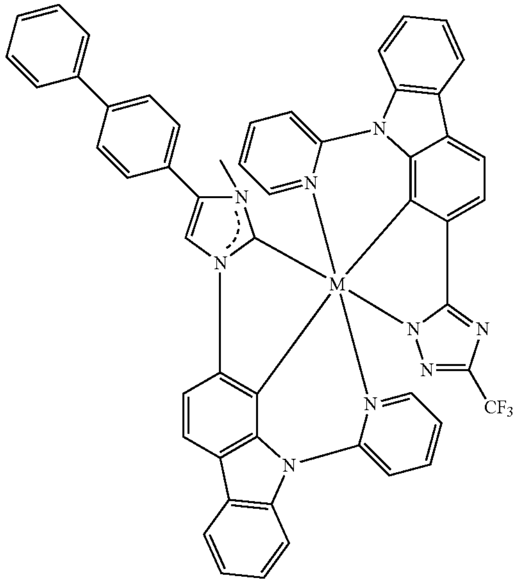
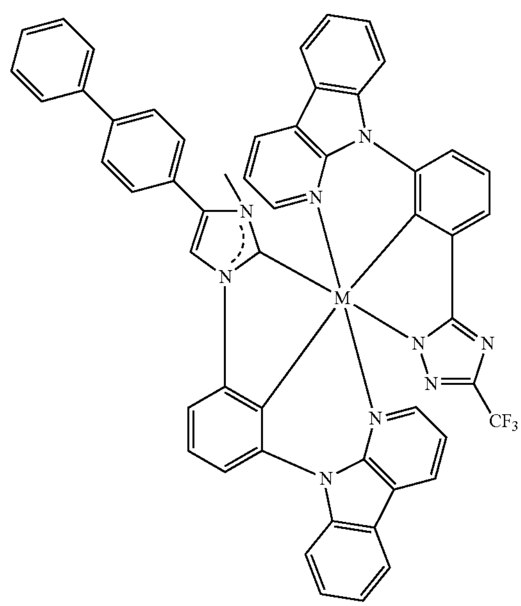

Structures M-5 (M = Ir, Rh)
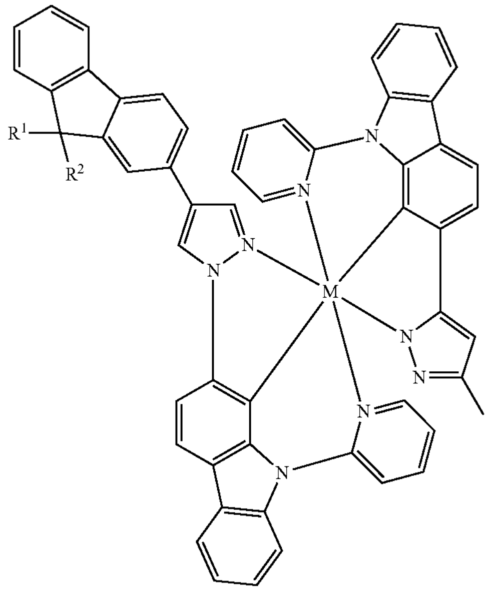
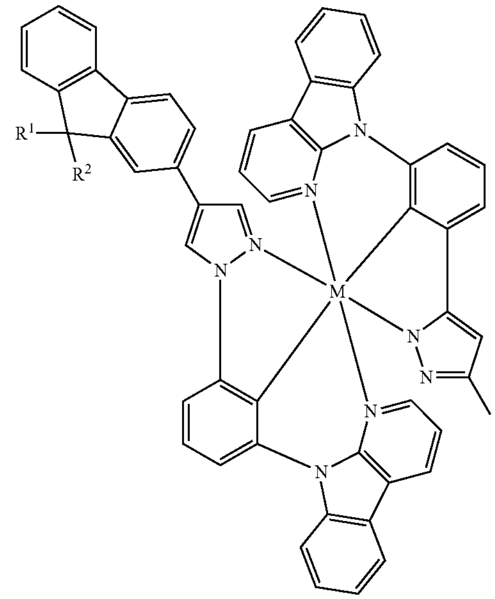
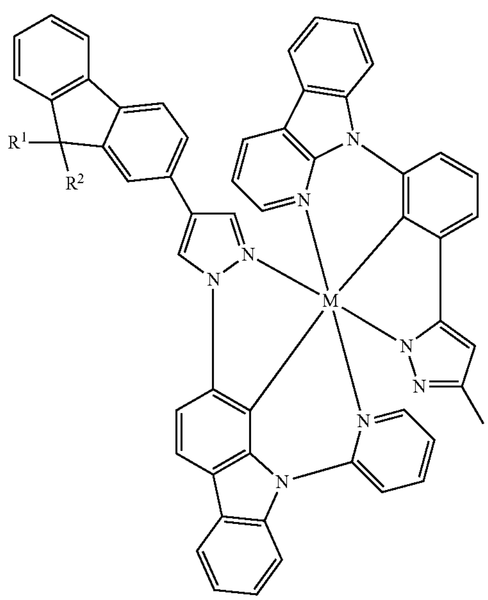
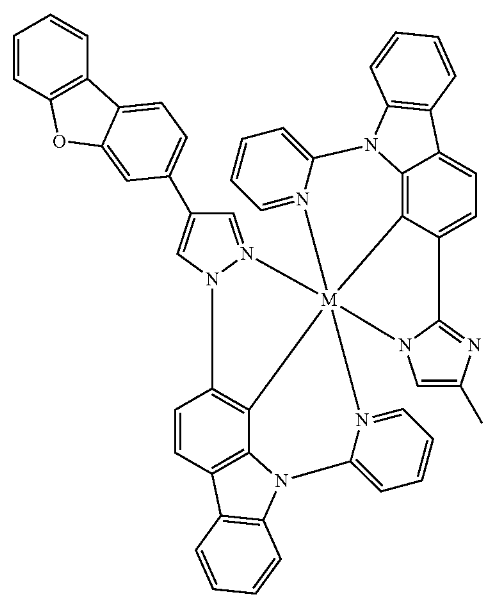

-continued
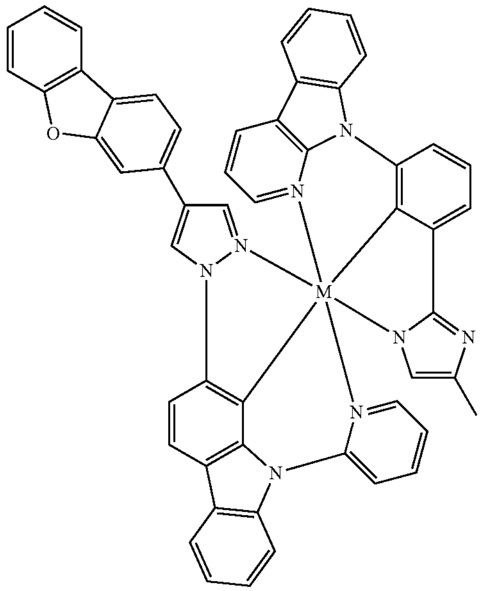
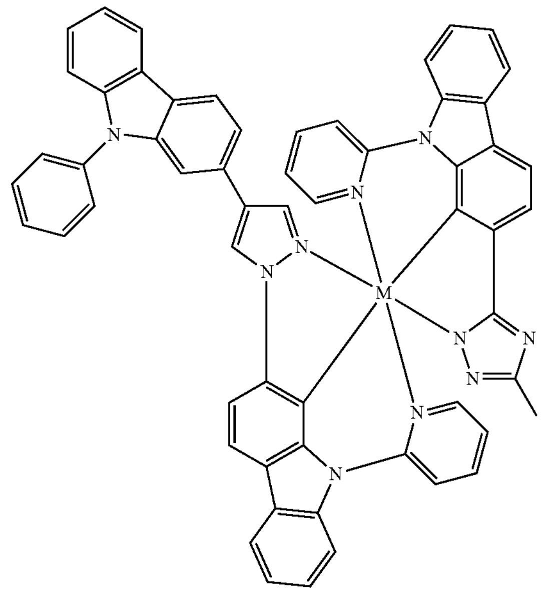
-continued
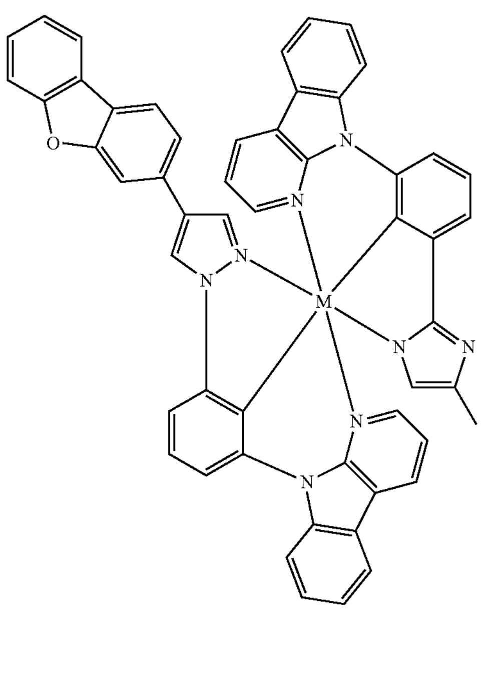
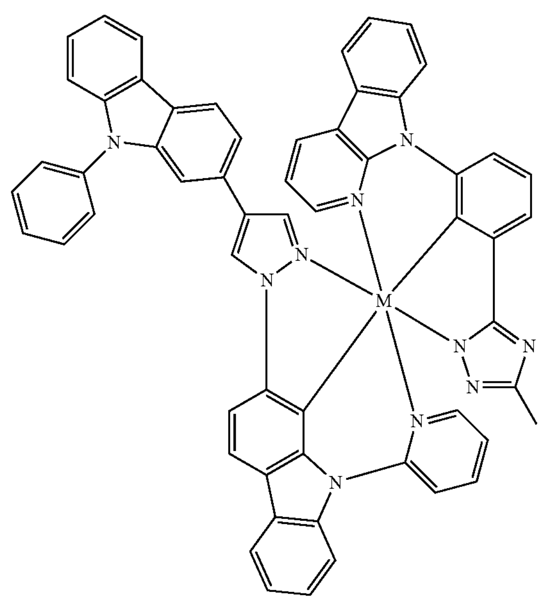

-continued
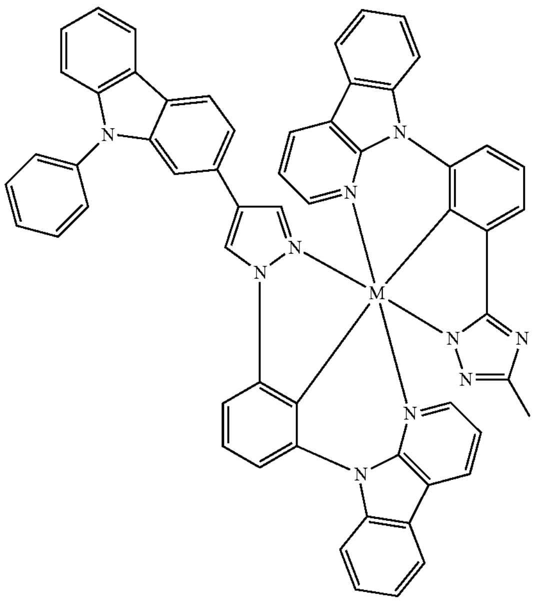
-continued
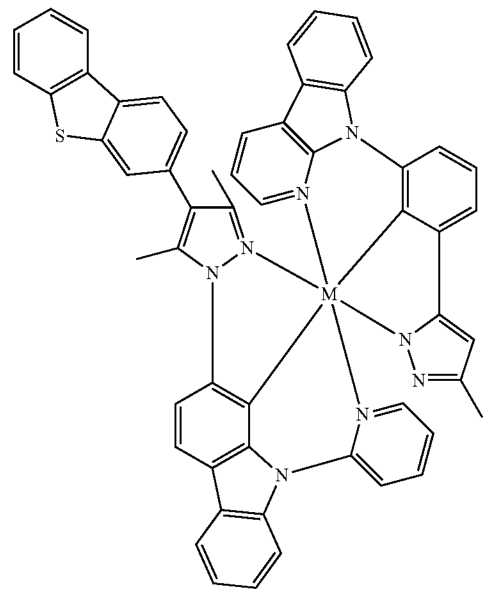
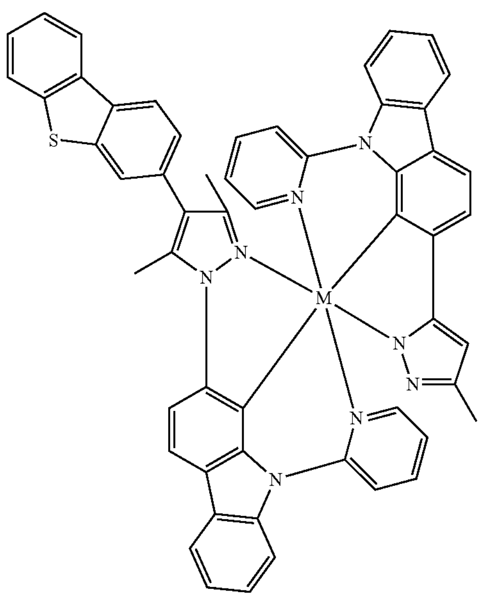
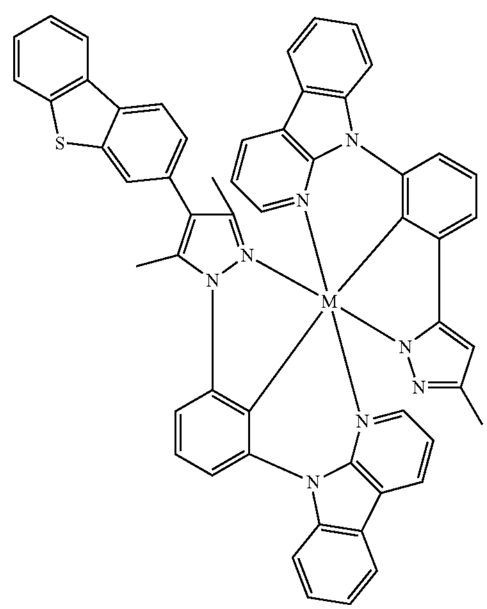

-continued
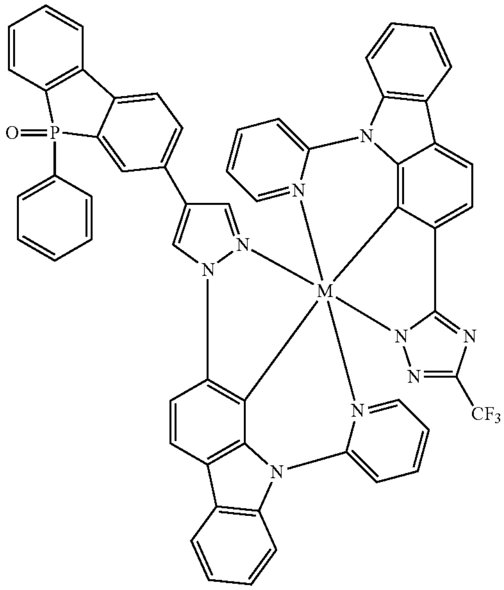
-continued
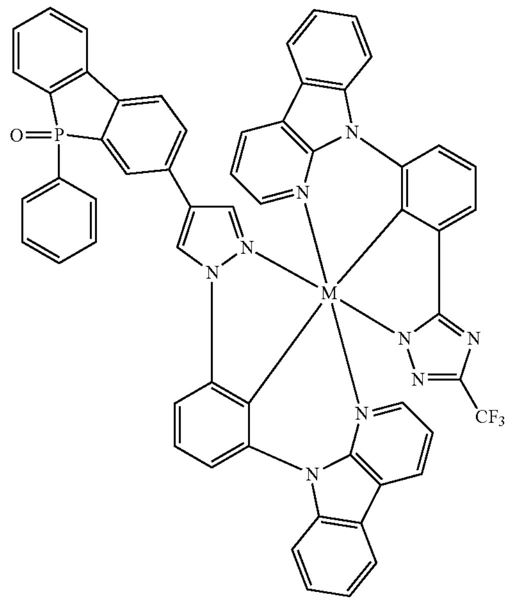
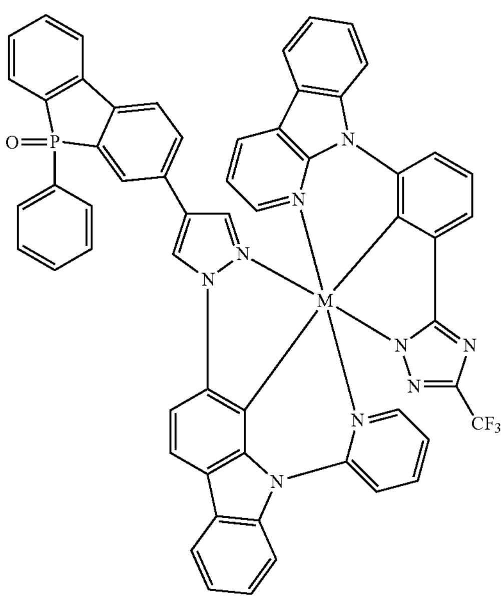
Structures M-6 (M = Ir, Rh)
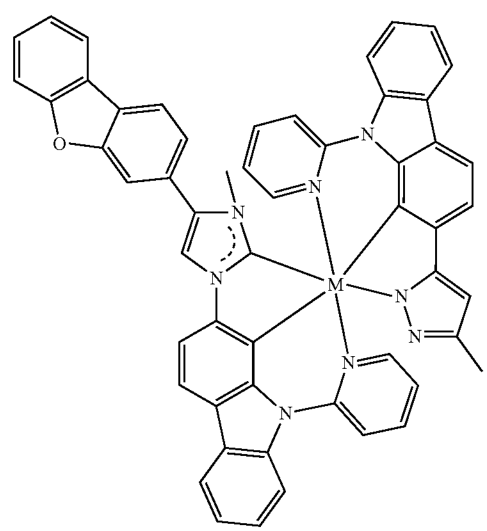

-continued
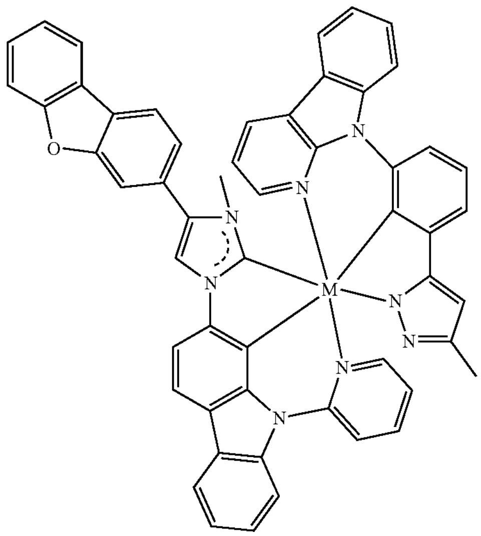
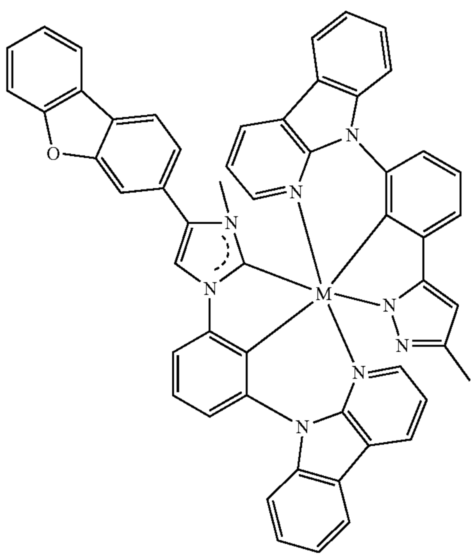
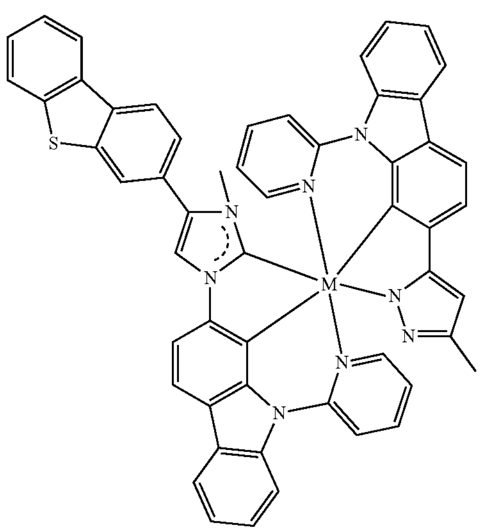
-continued
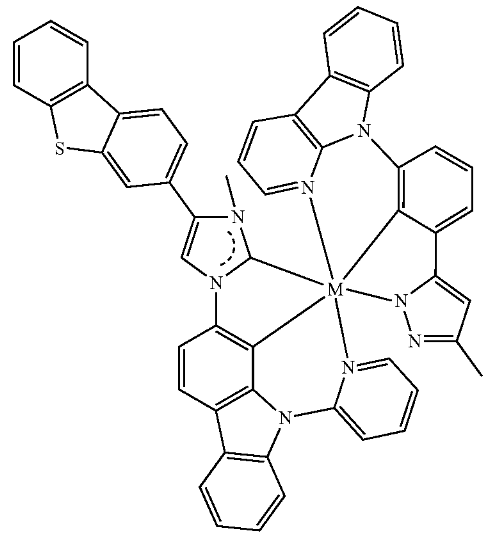
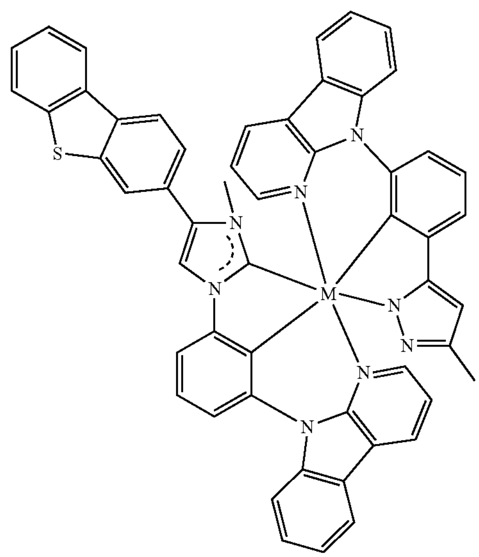
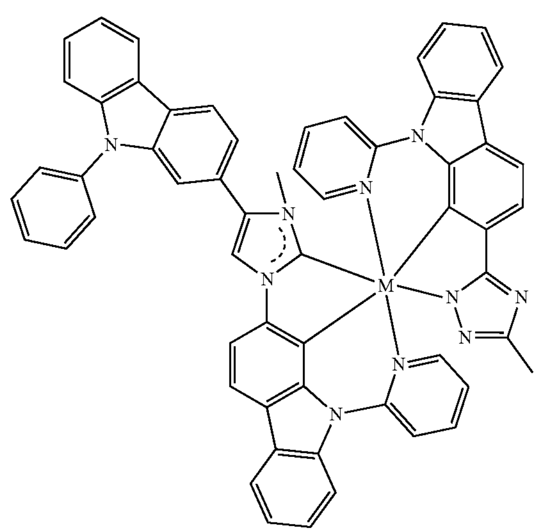

-continued
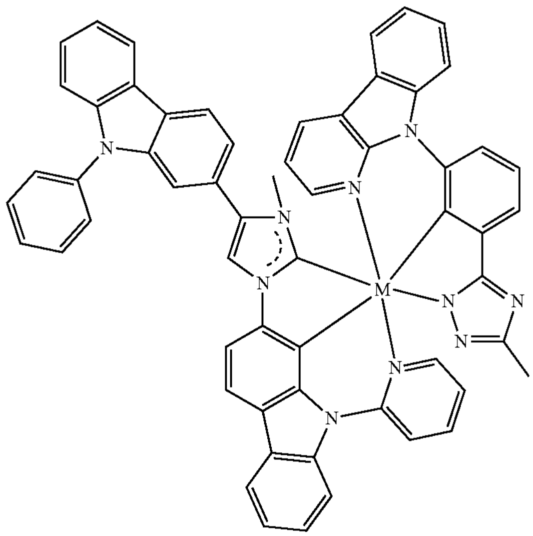
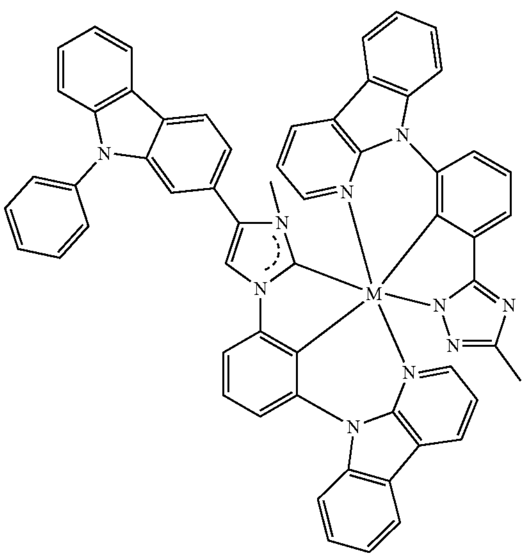
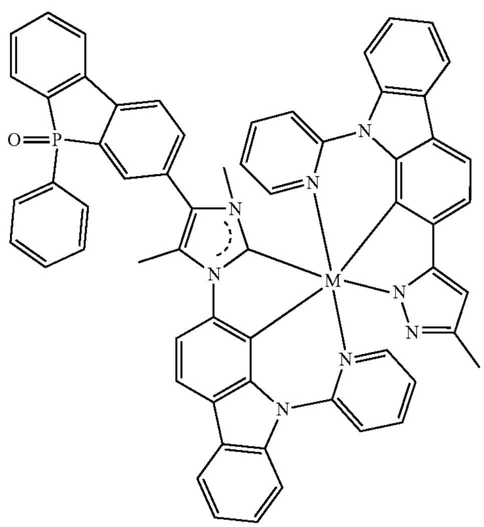
-continued
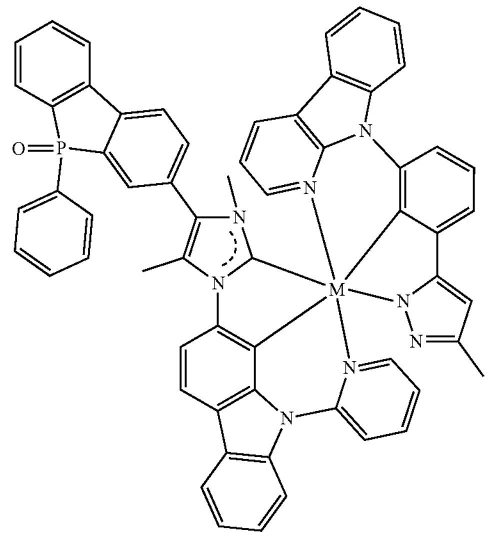
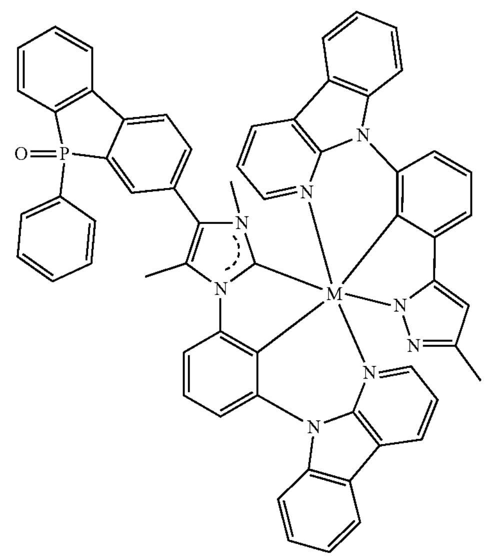
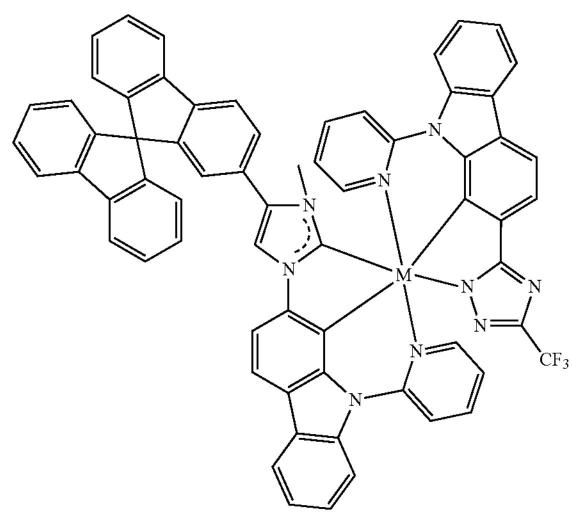

-continued
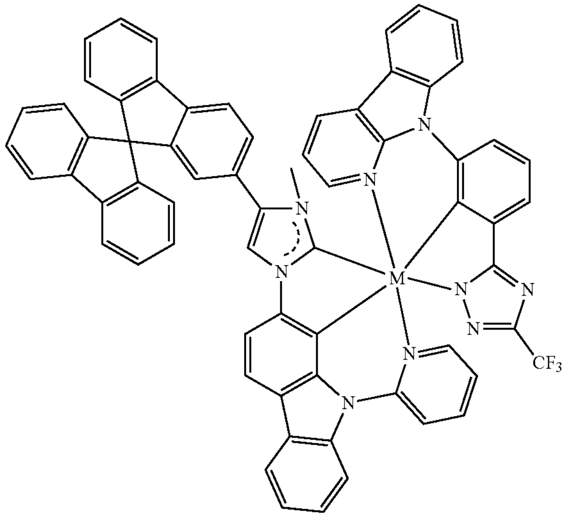
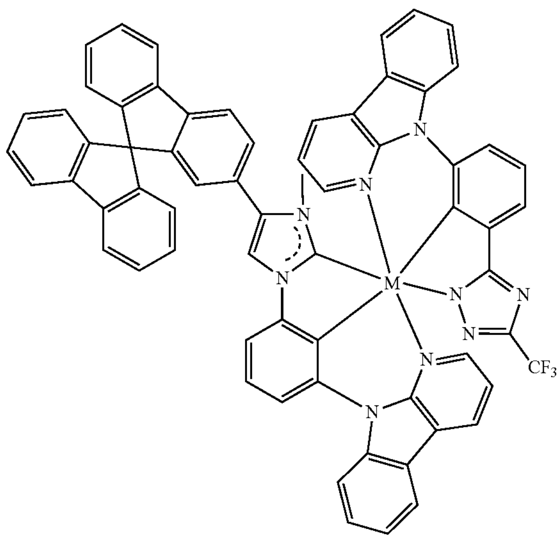
Structures M-7 (M = Ir, Rh)
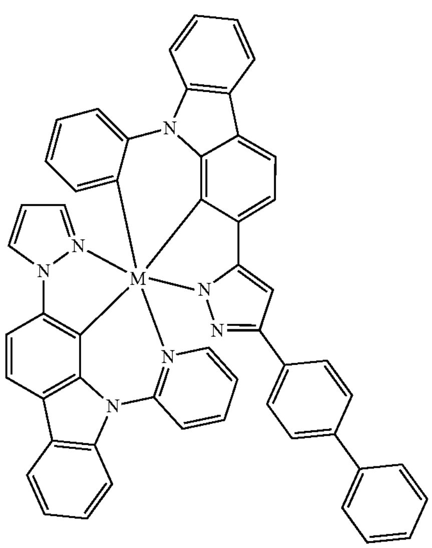
-continued
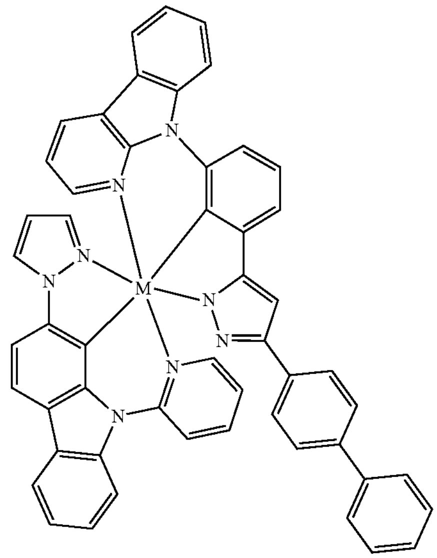
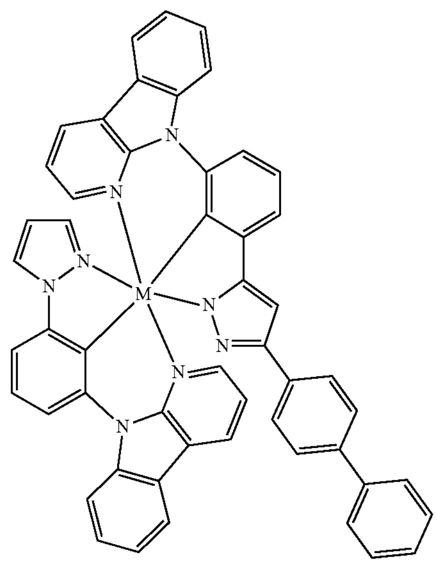
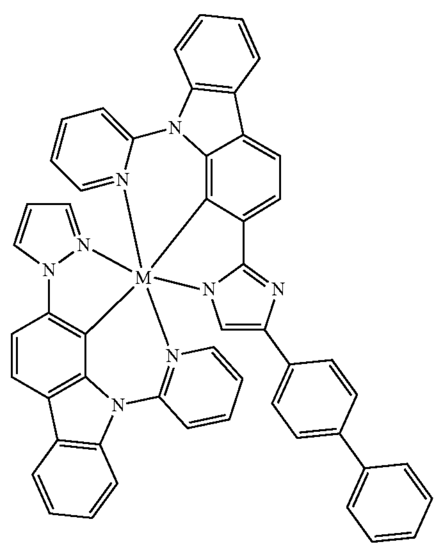

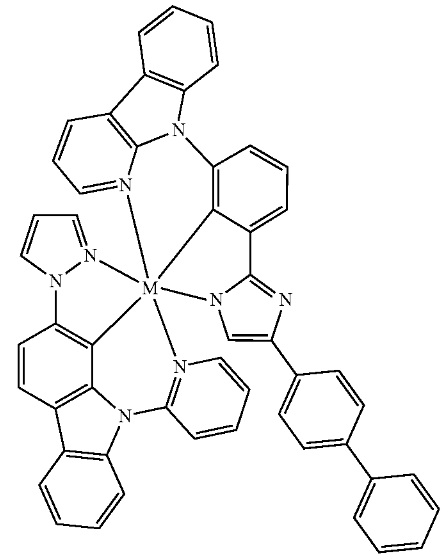
N
N
N
N
M
N
N
N
N
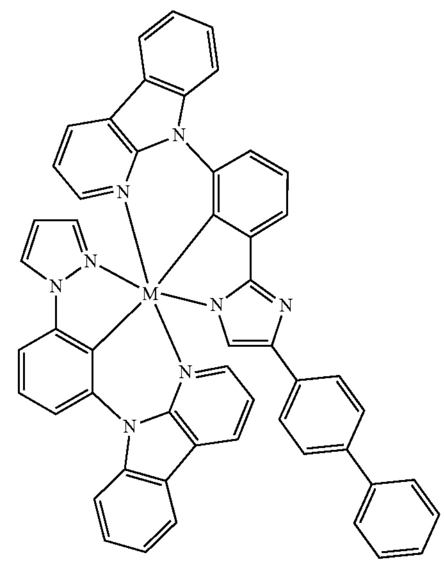
N
N
N
M
N
N
N
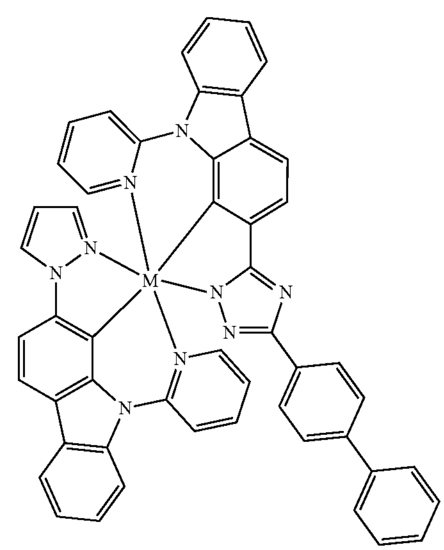
N
N
N
M
N
N
N
N
N
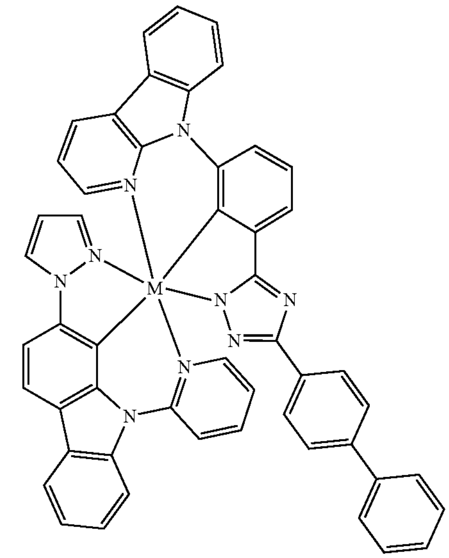
N
N
N
N
M
N
N
N
N
N
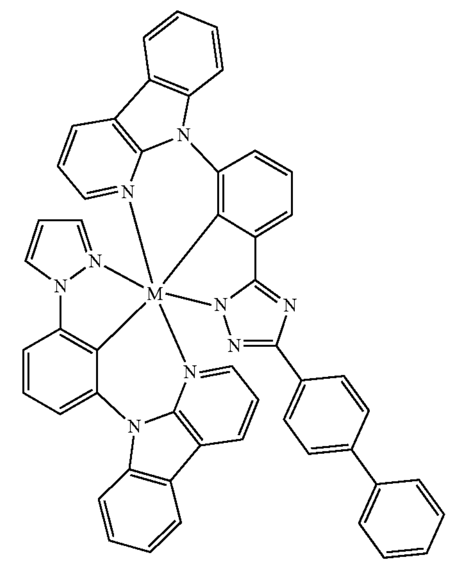
N
N
N
M
N
N
N
N
N
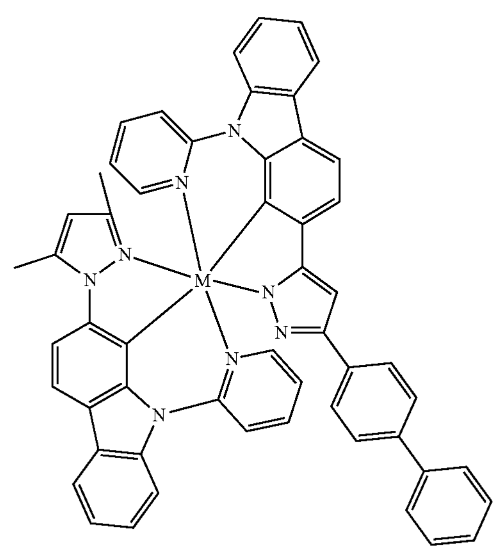
N
N
N
M
N
N
N
N -continued
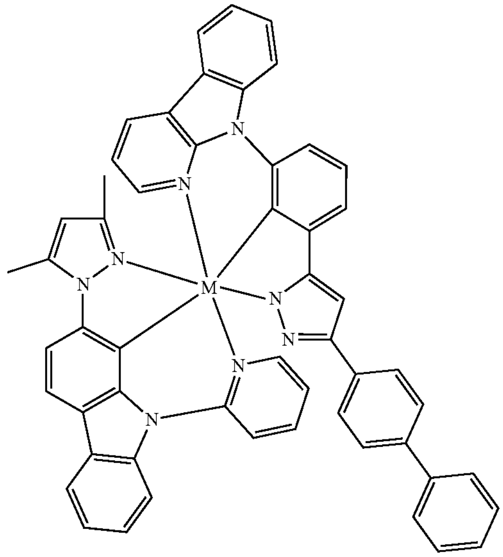
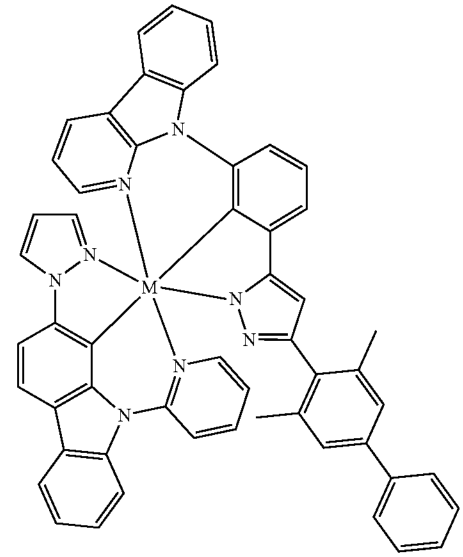
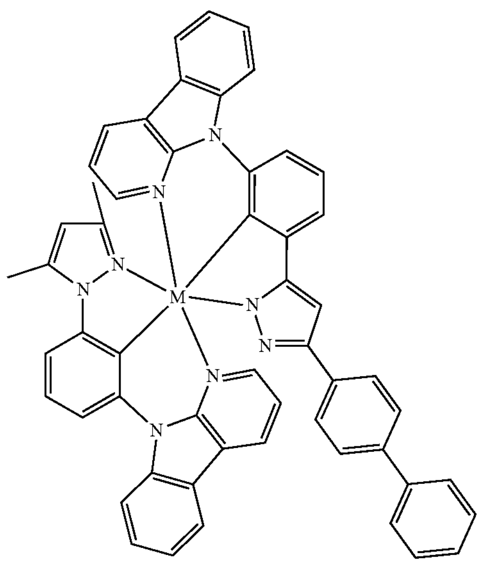
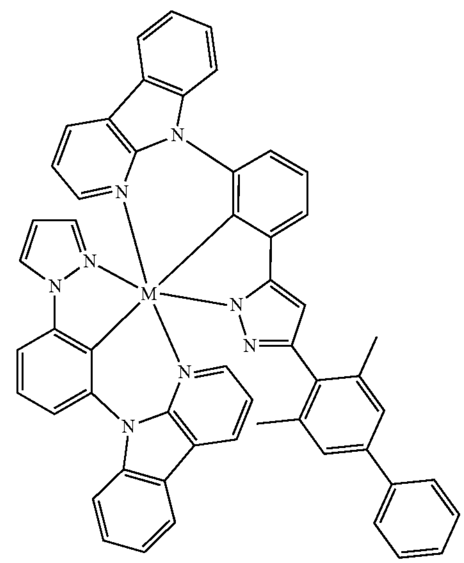
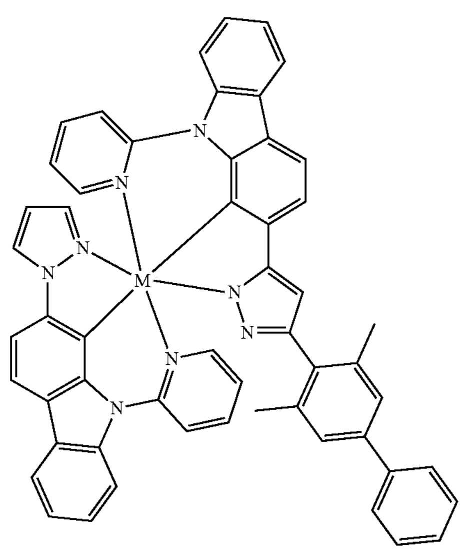
Structures M-8 (M = Ir, Rh)
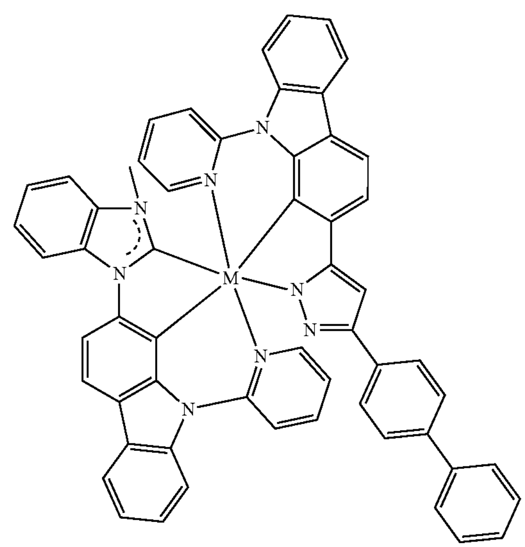

-continued
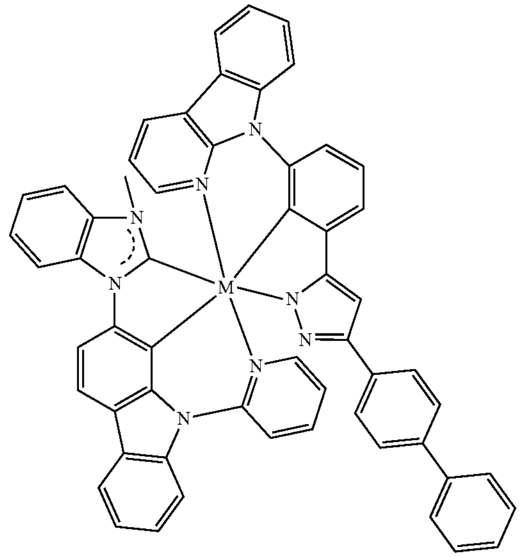
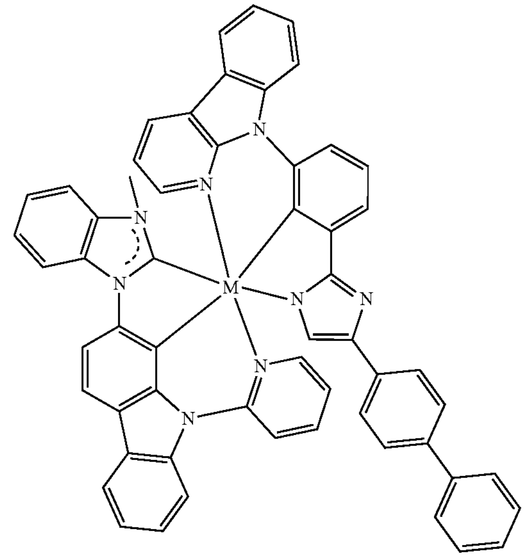
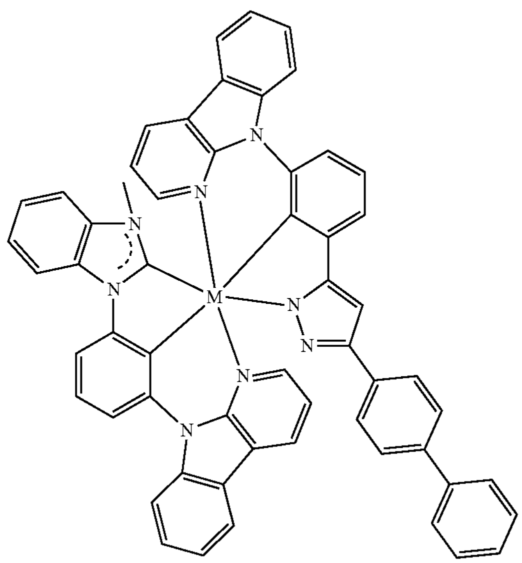
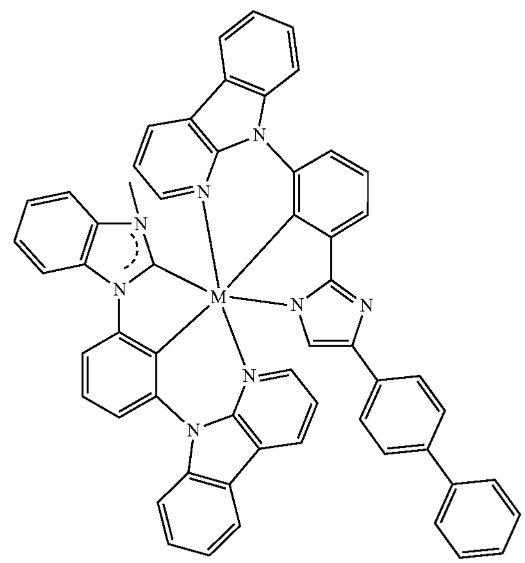
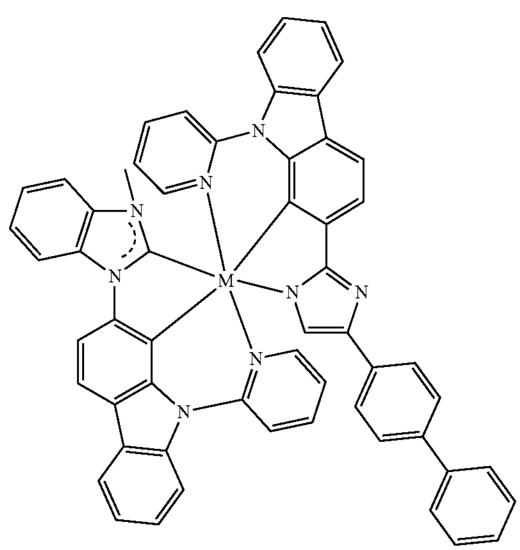
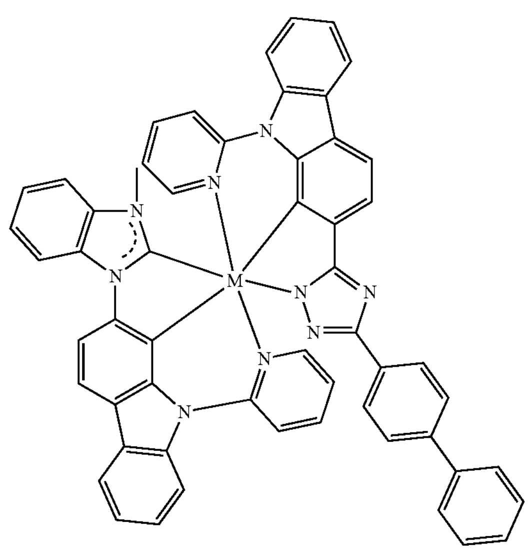
-continued -continued
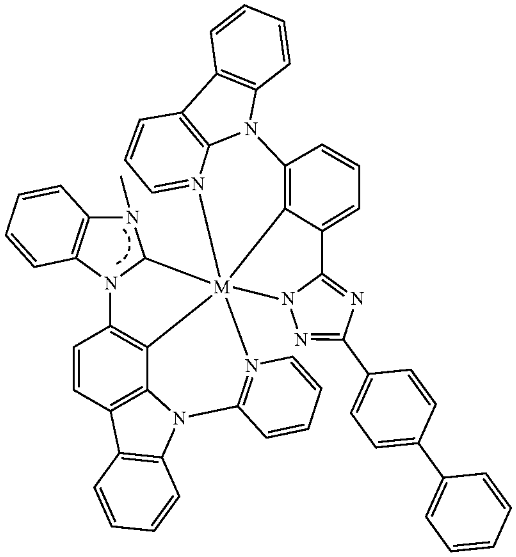
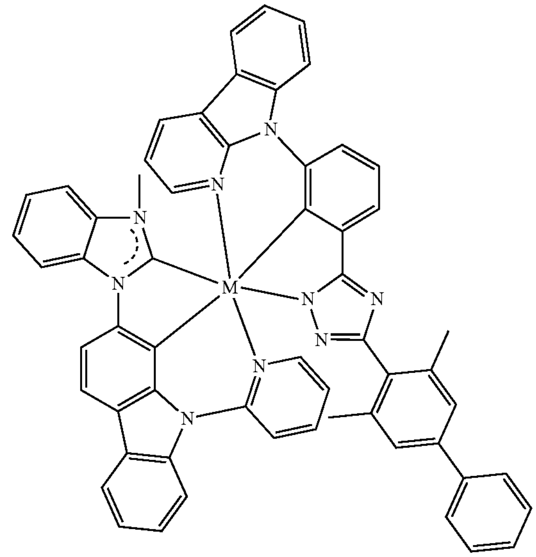
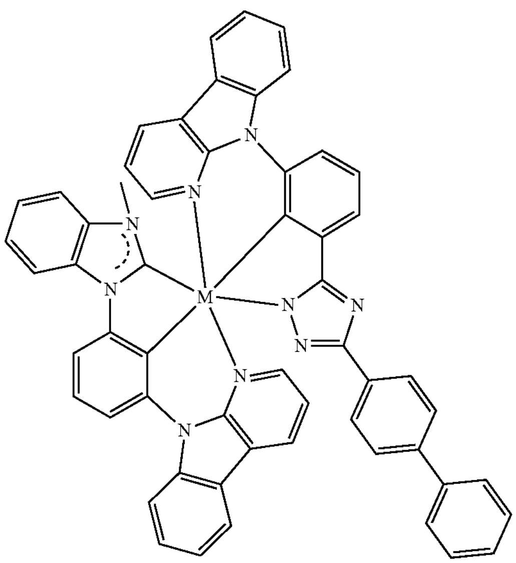
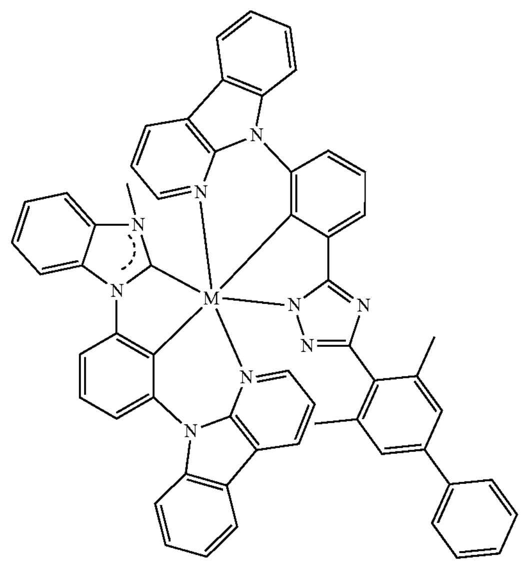
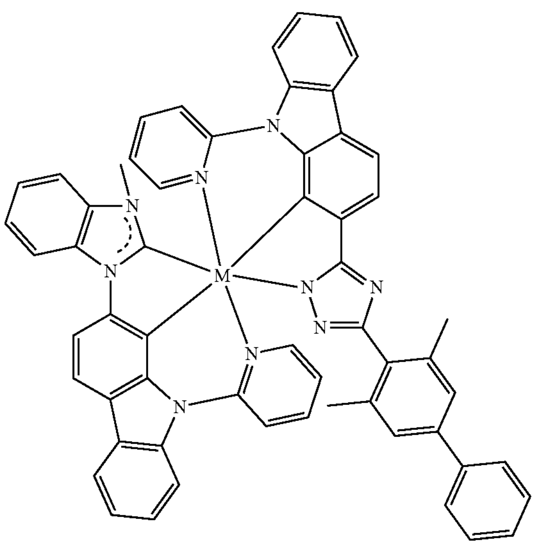
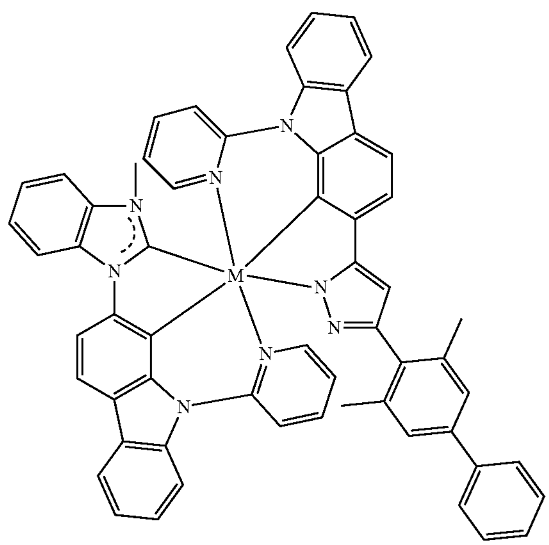
-continued -continued
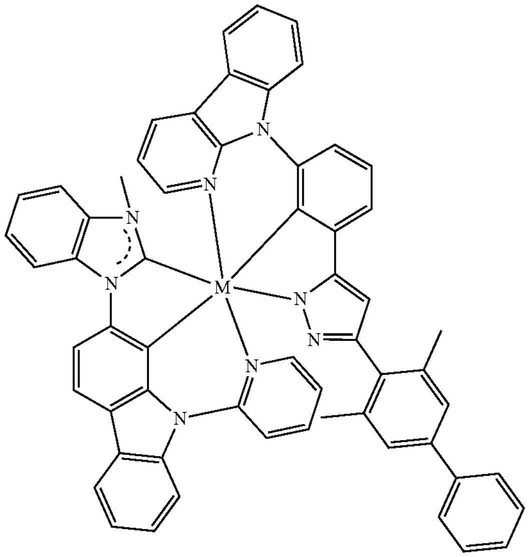
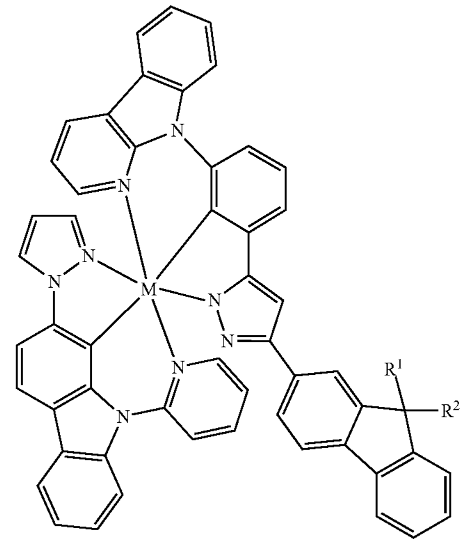
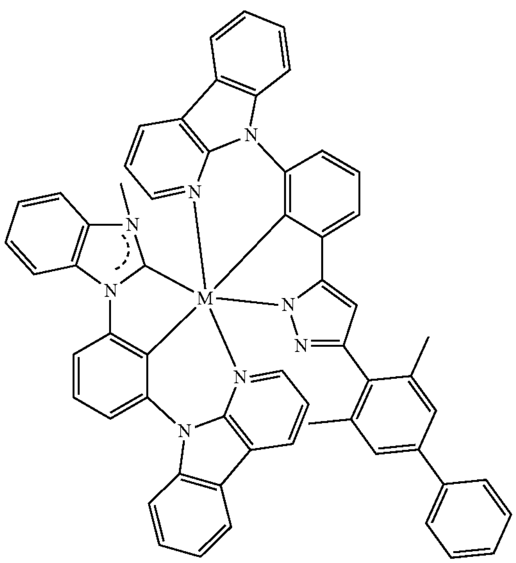
Structures M-9 (M = Ir, Rh)
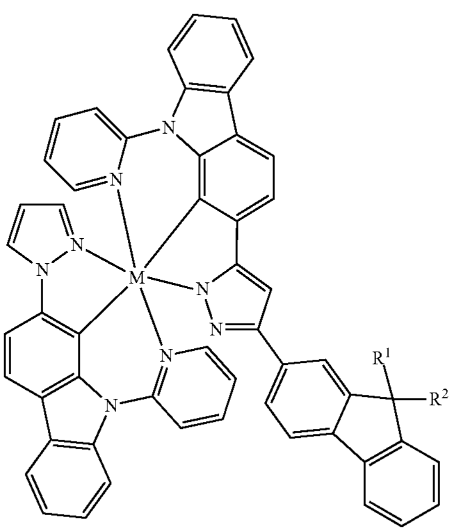
-continued
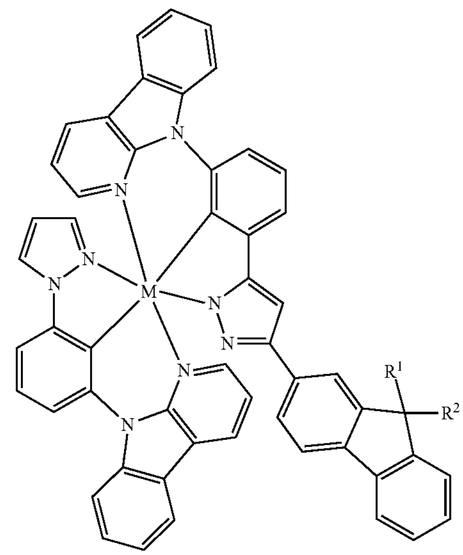
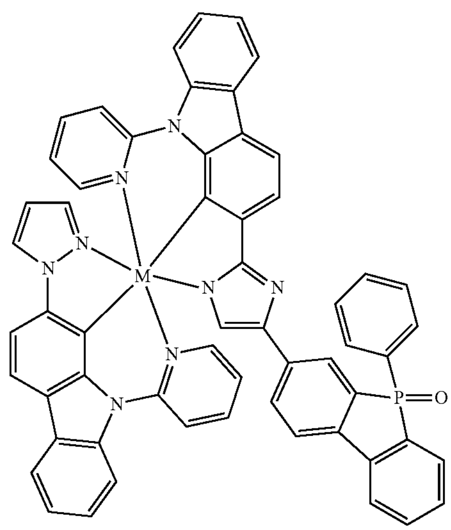

-continued
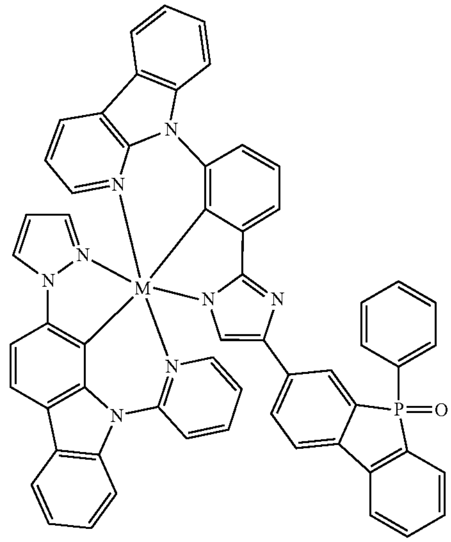
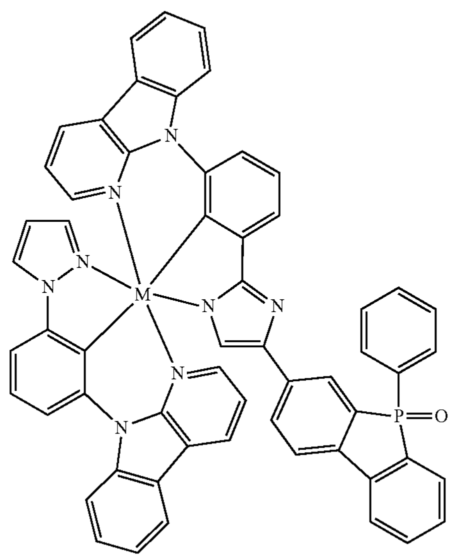
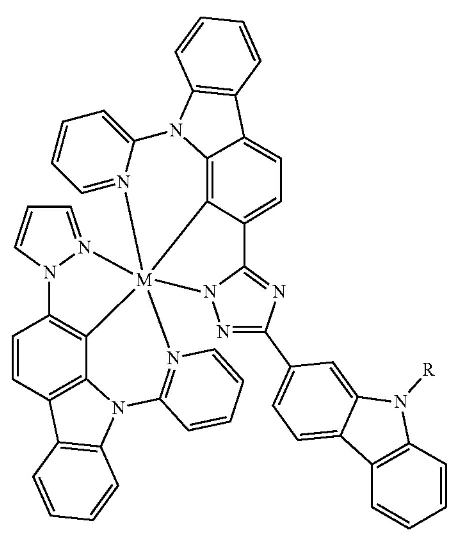
-continued
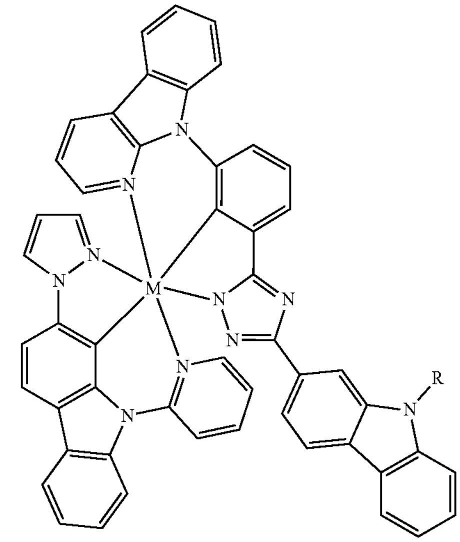
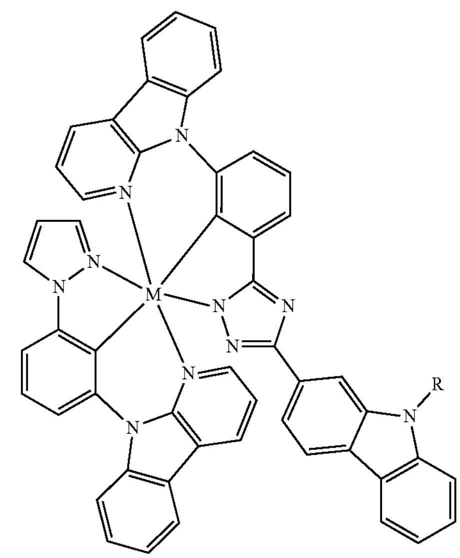
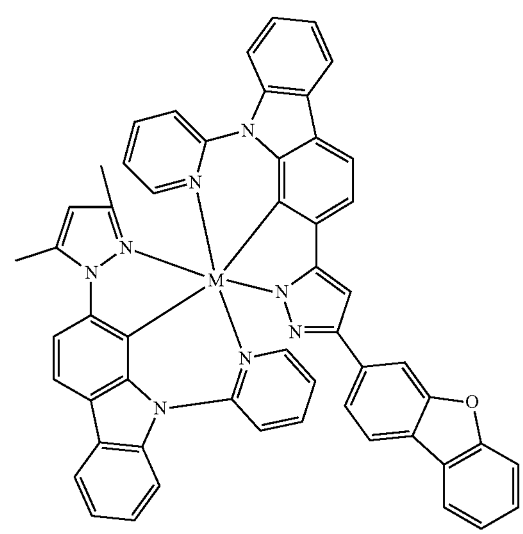

-continued
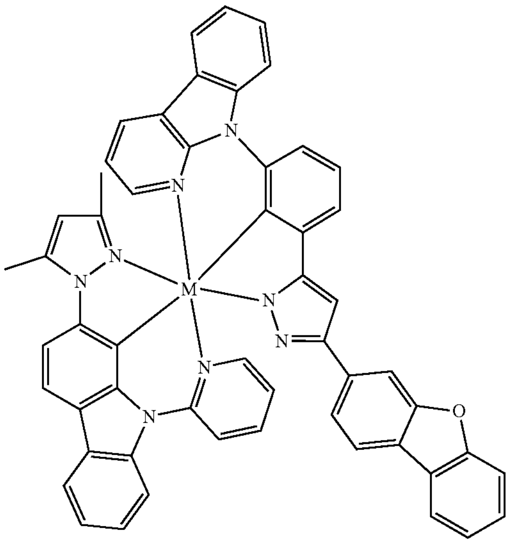
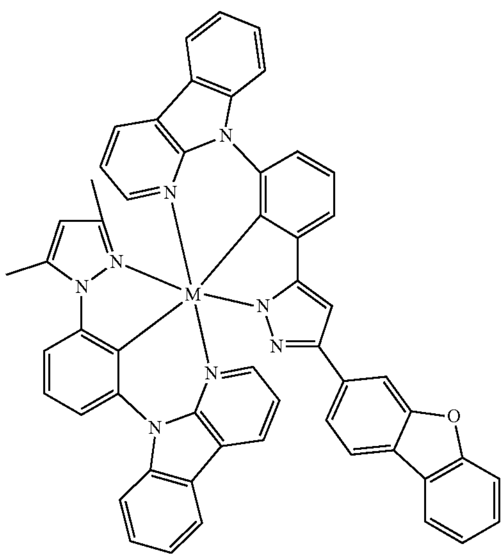
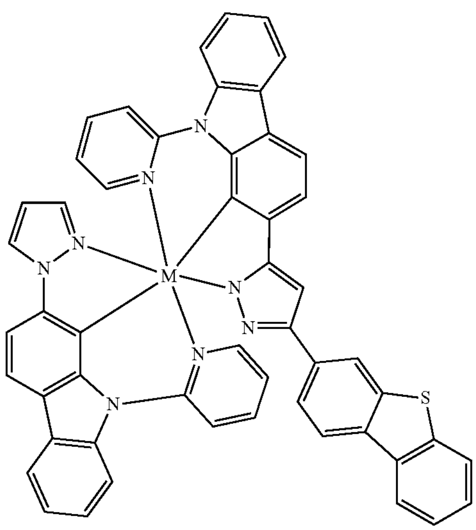
-continued
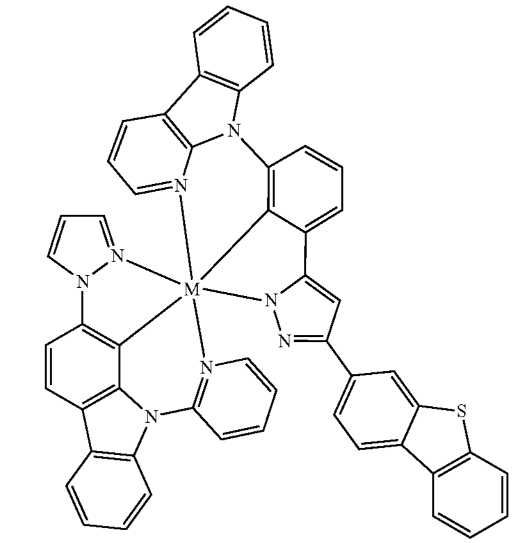
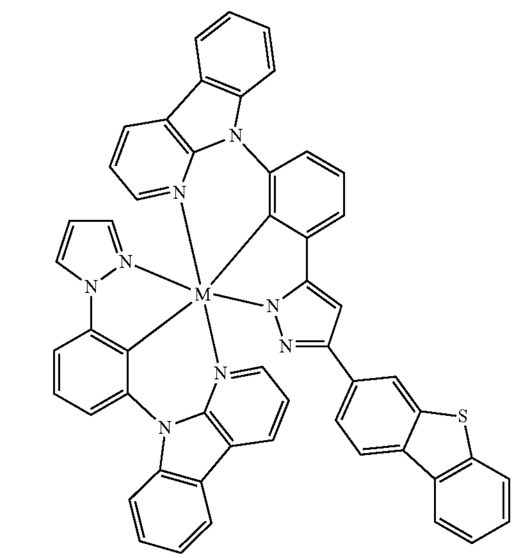
Structures M-10 (M = Ir, Rh)
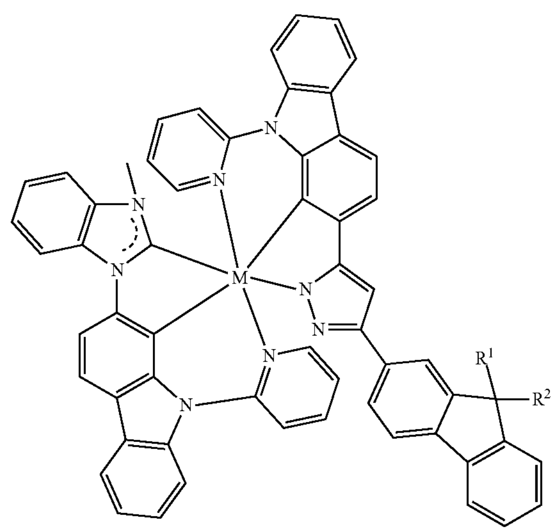

-continued
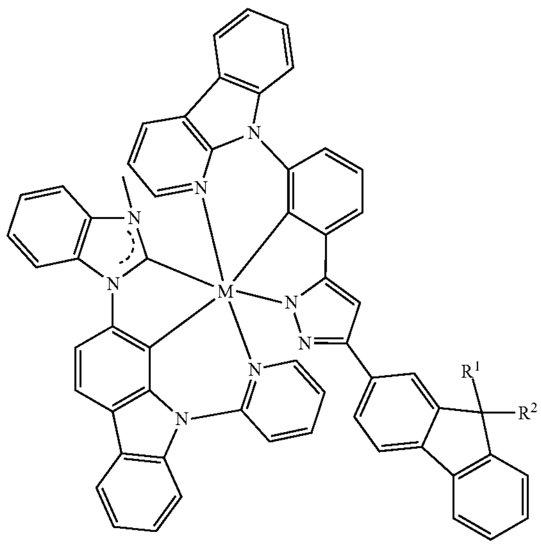
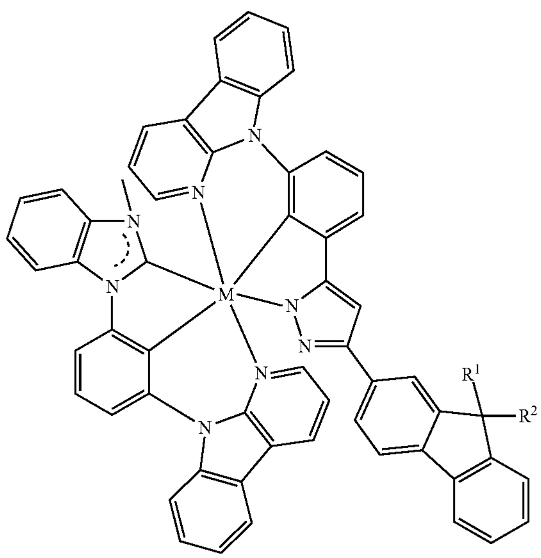
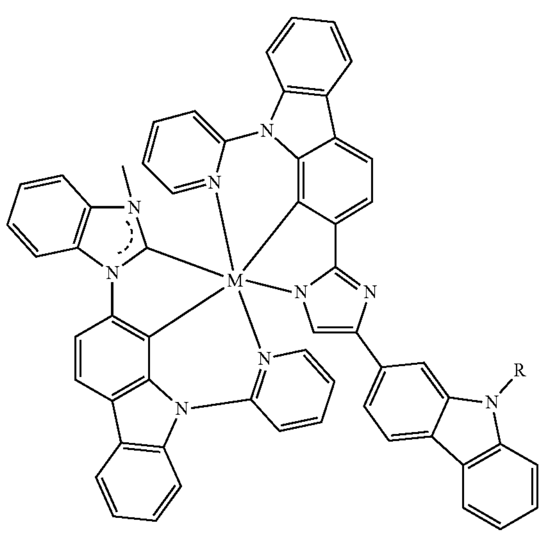
-continued
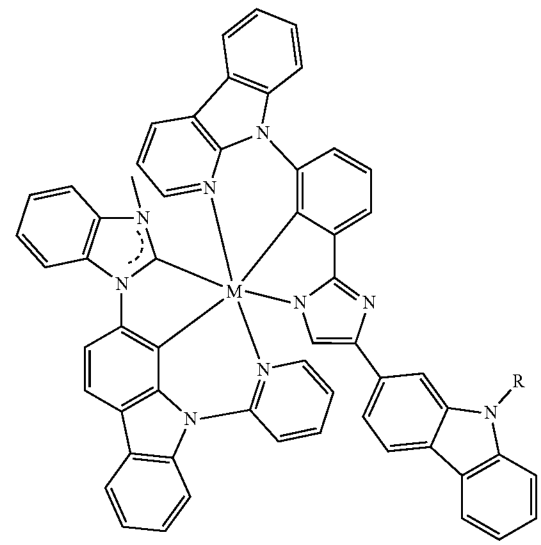
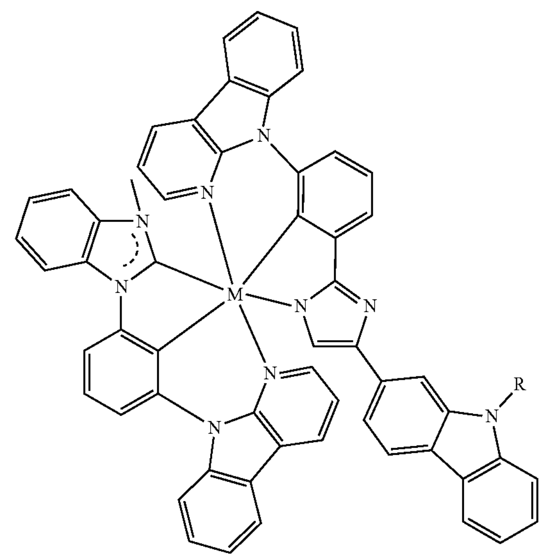
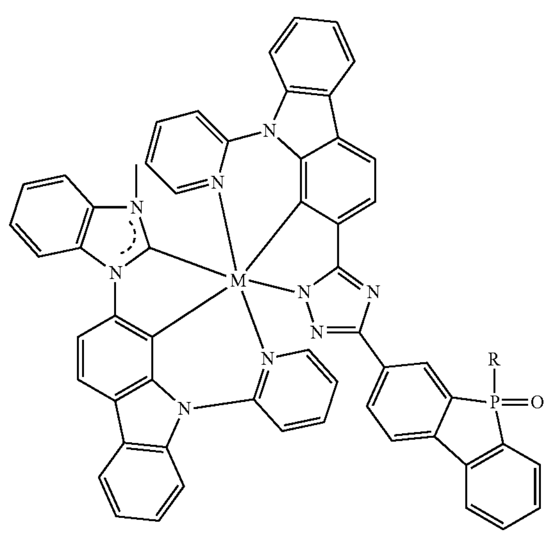

-continued
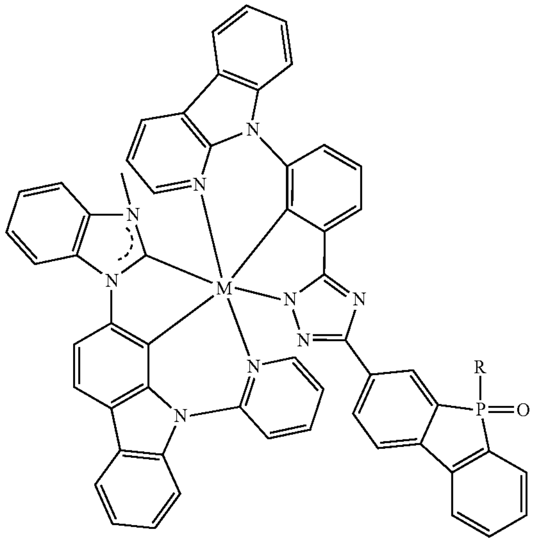
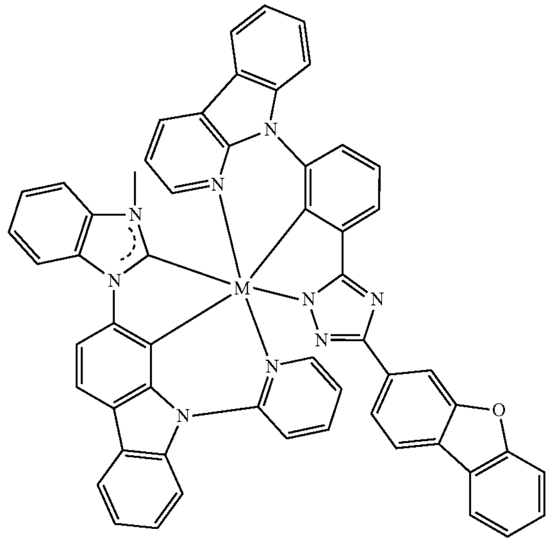
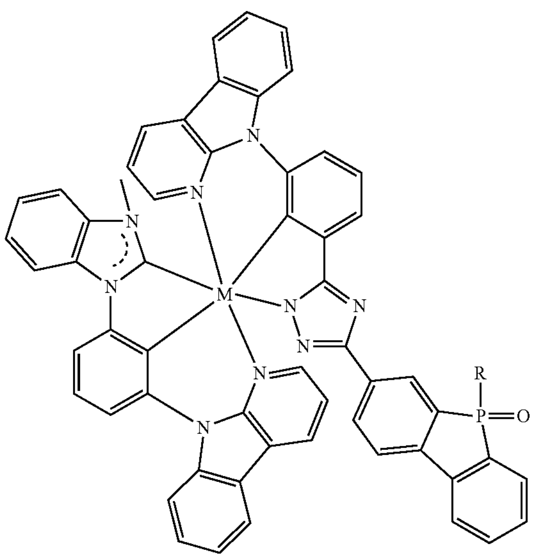
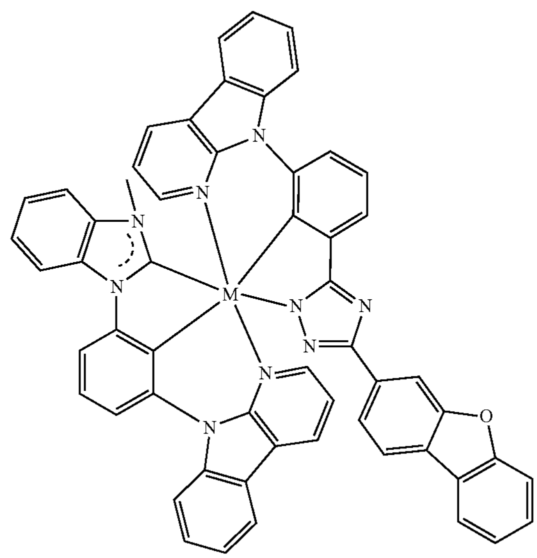
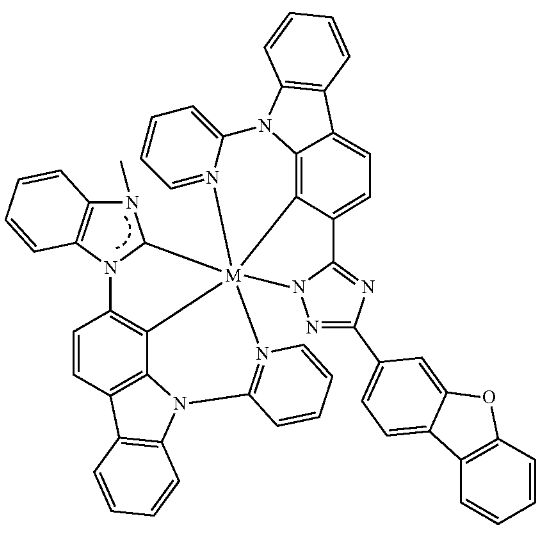
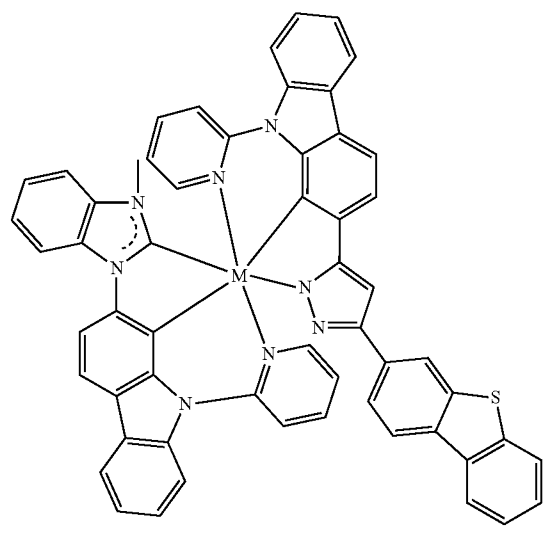

-continued
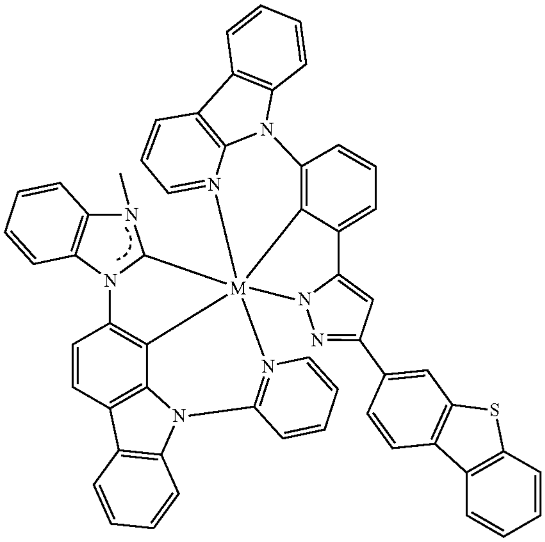
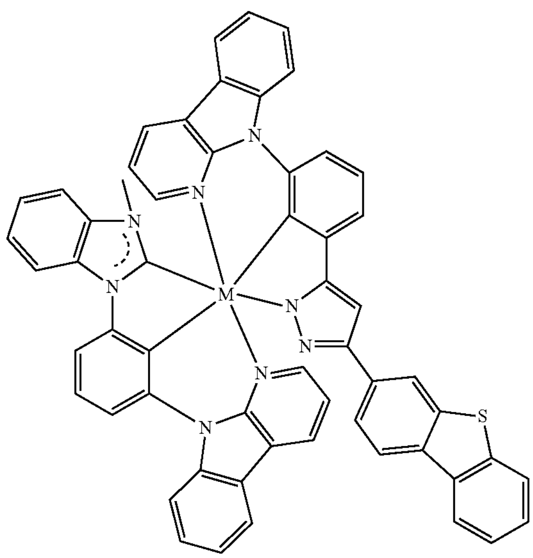
Structures M-11 (M = Ir, Rh)
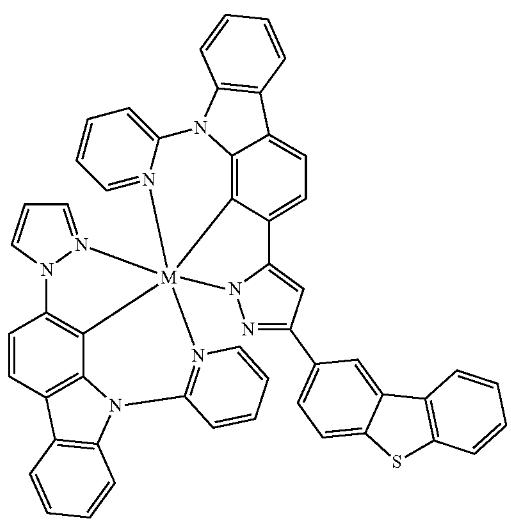
-continued
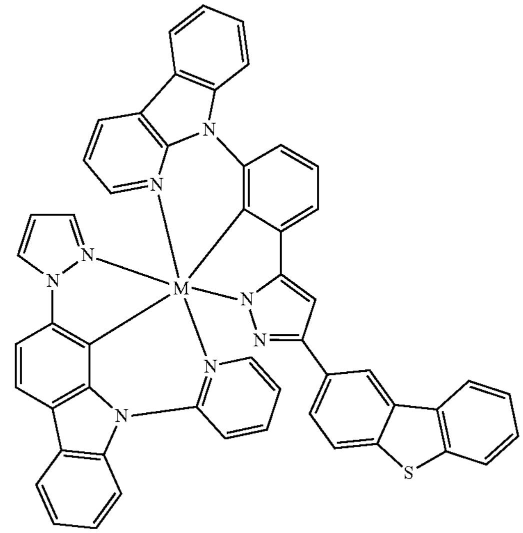
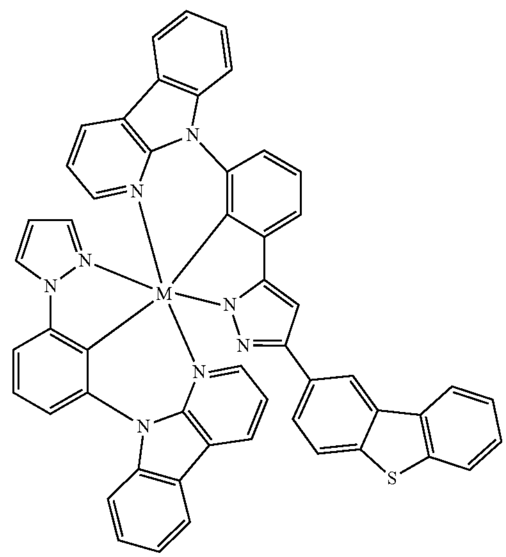
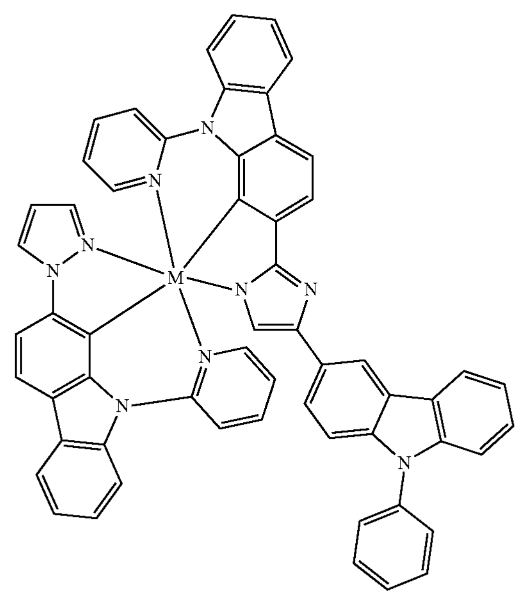

-continued
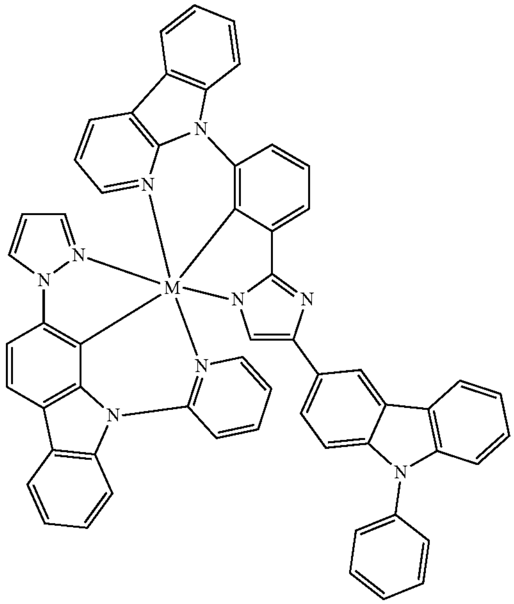
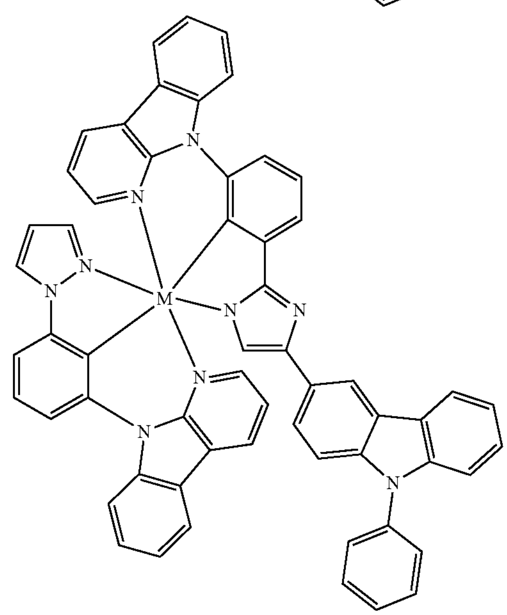
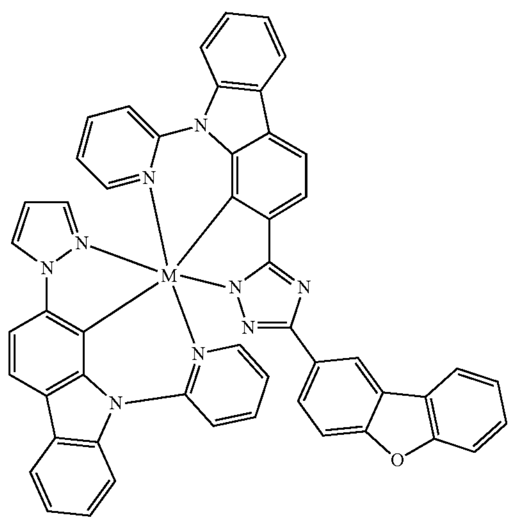
-continued
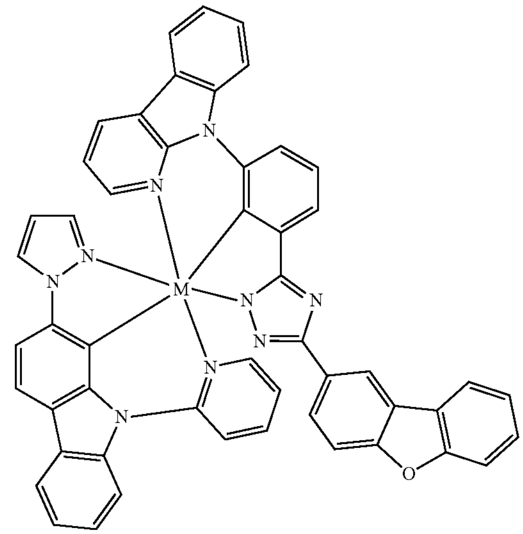
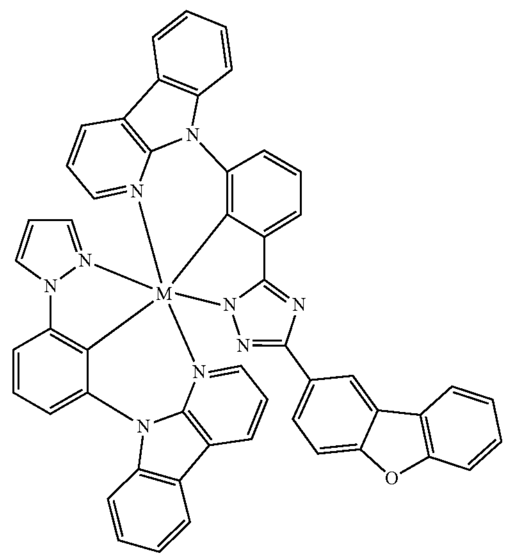
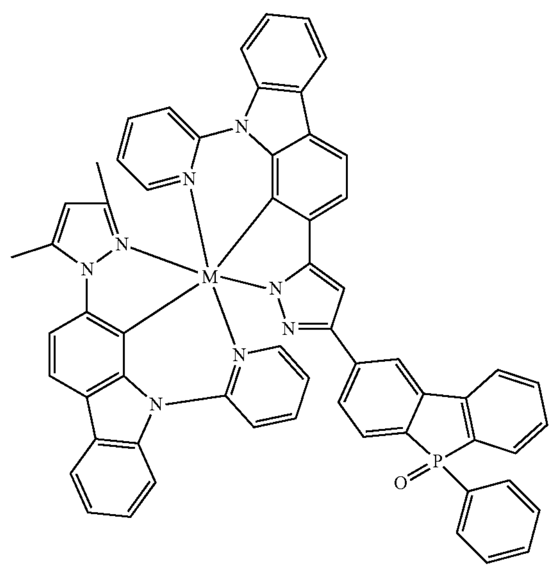

-continued
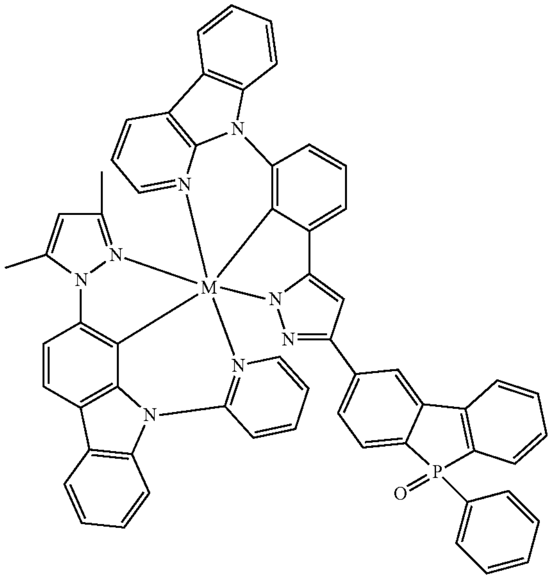
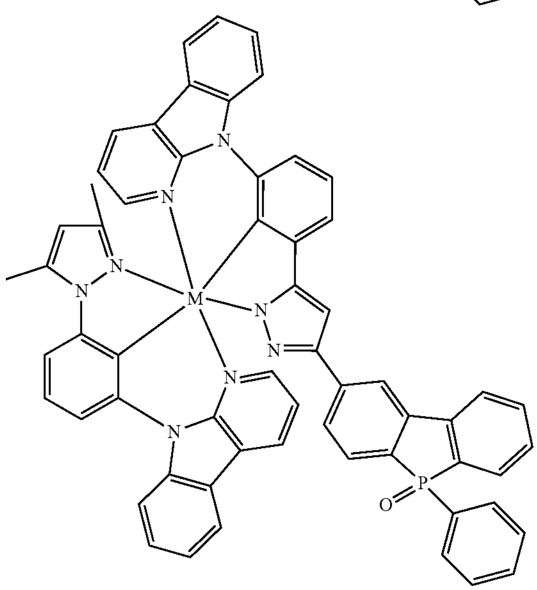
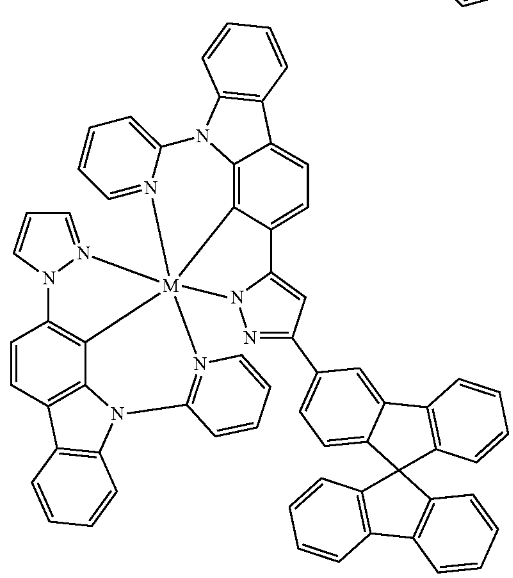
-continued
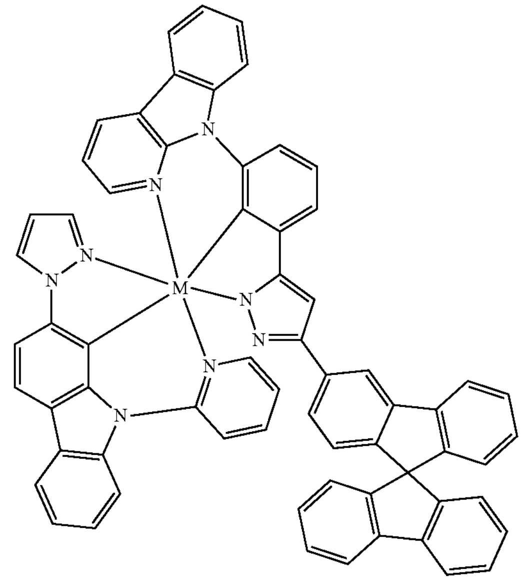
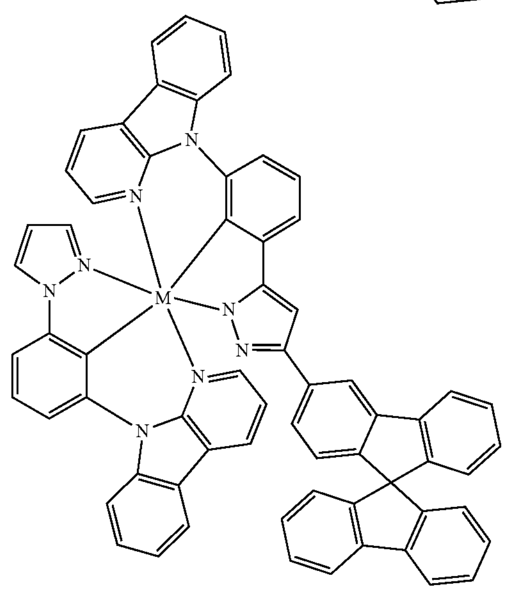
Structures M-12 (M = Ir, Rh)
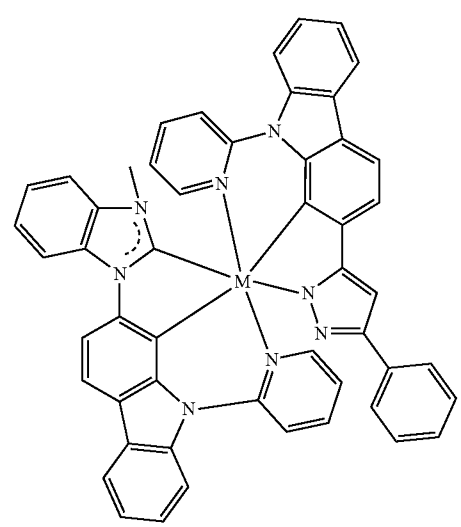

-continued
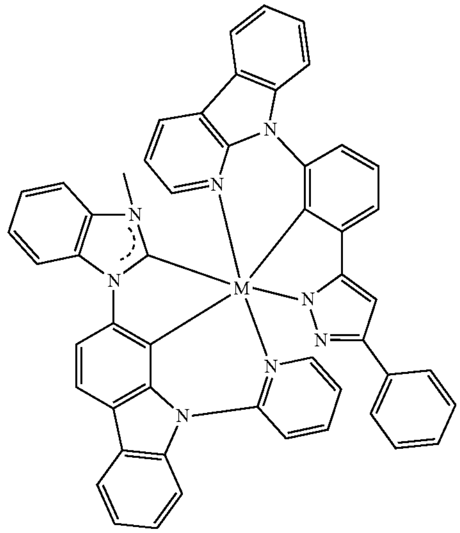
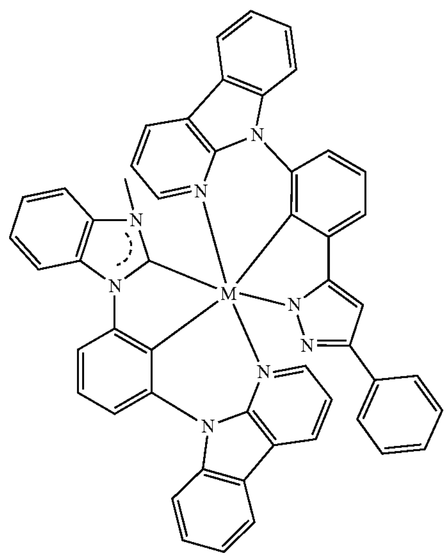
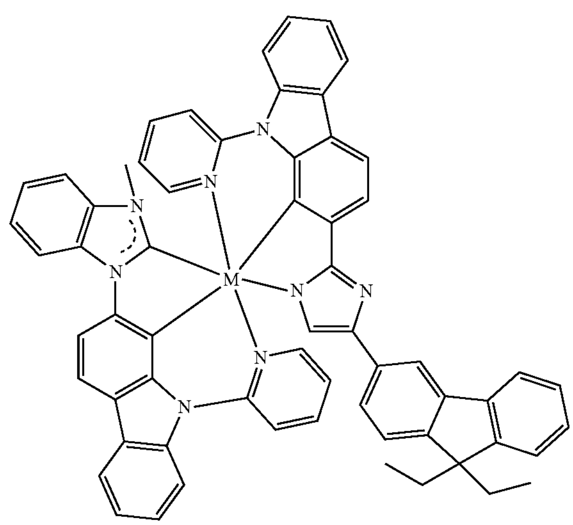
-continued
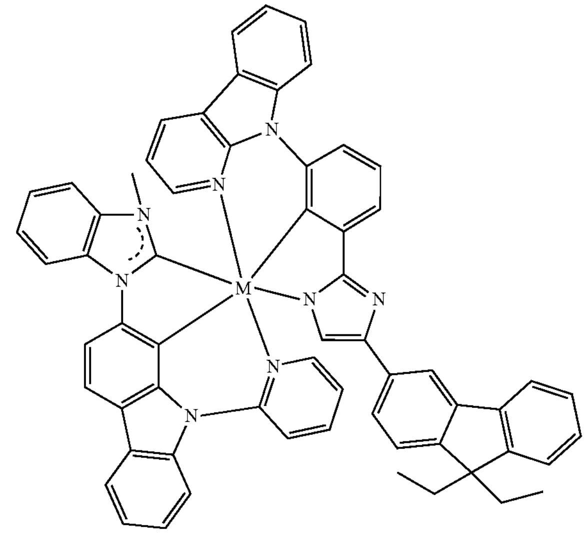
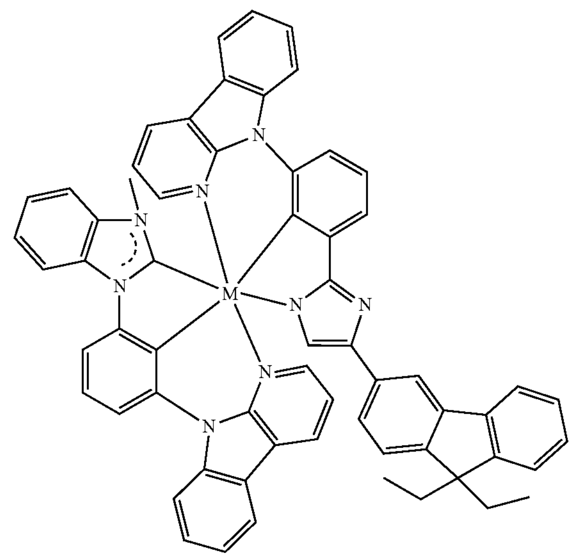
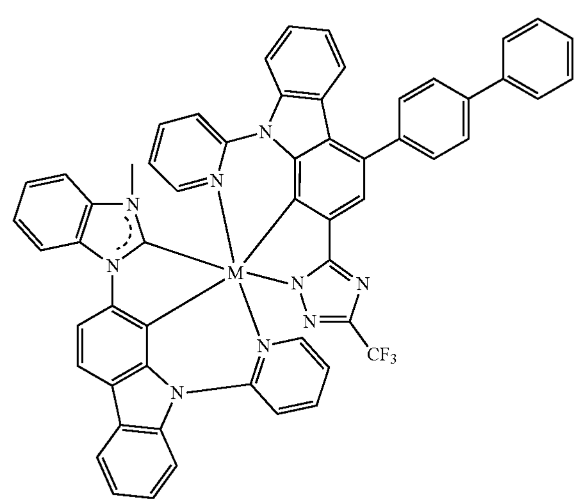

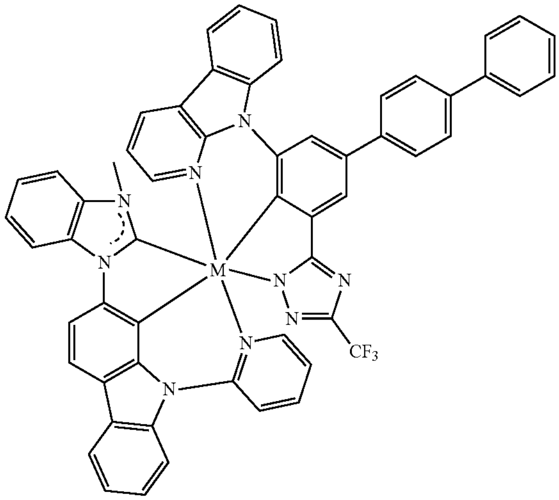
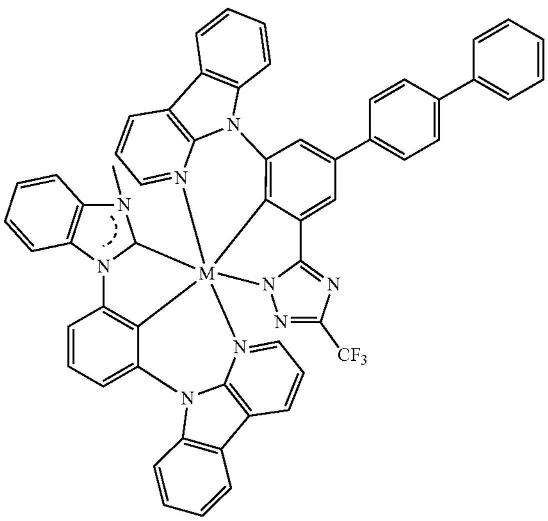
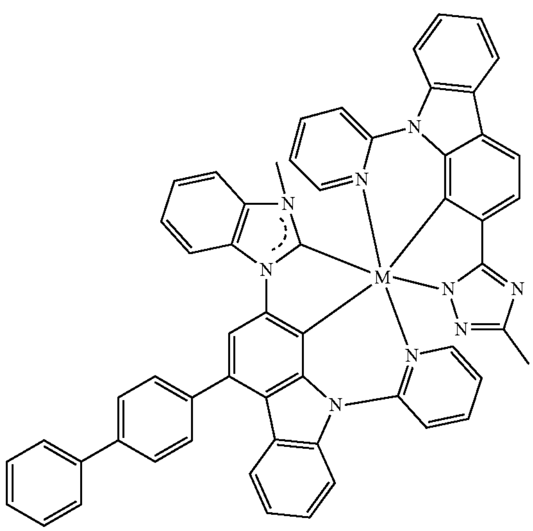
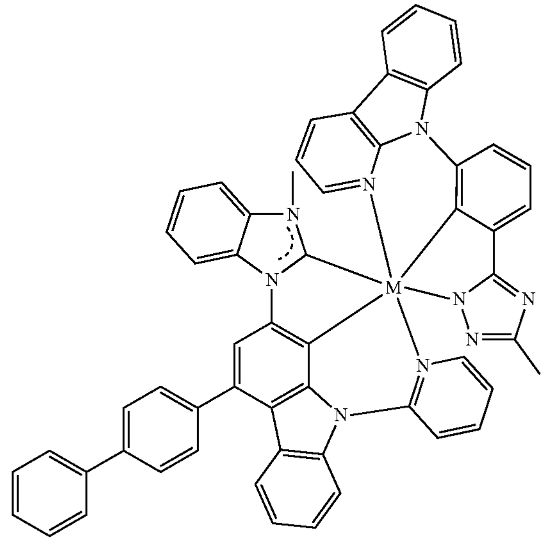
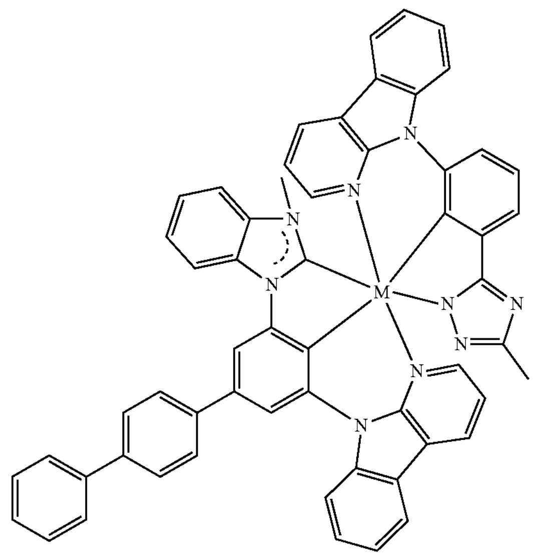
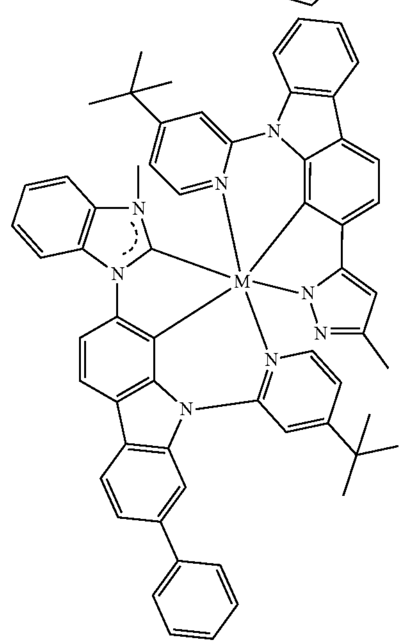

-continued
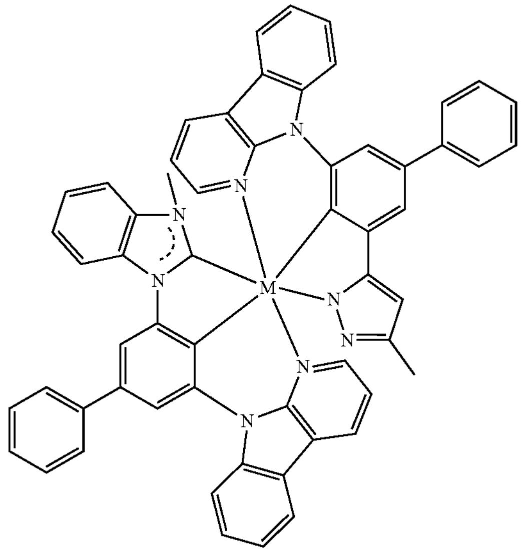
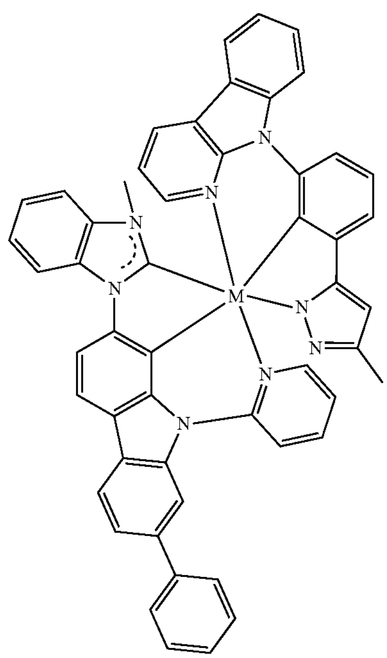
-continued
Structures M-13 (M = Ir, Rh)
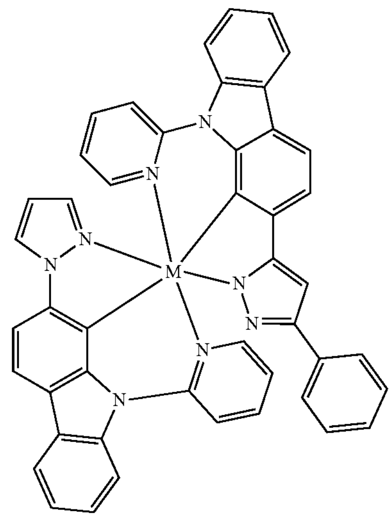
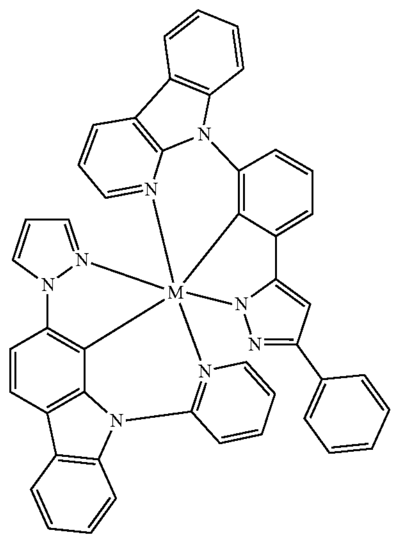
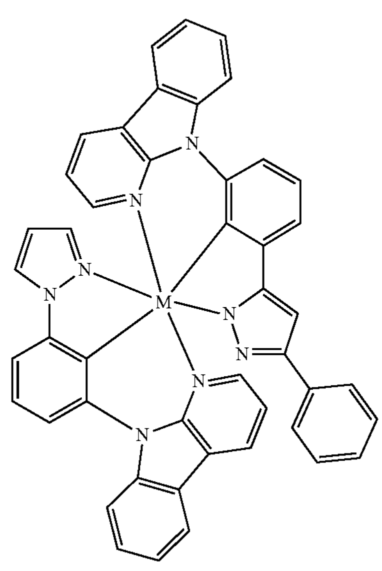

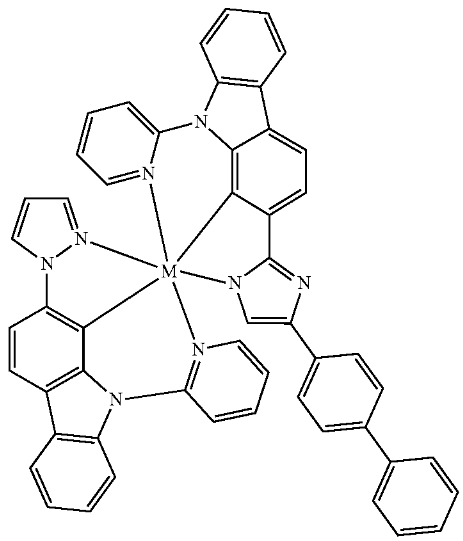
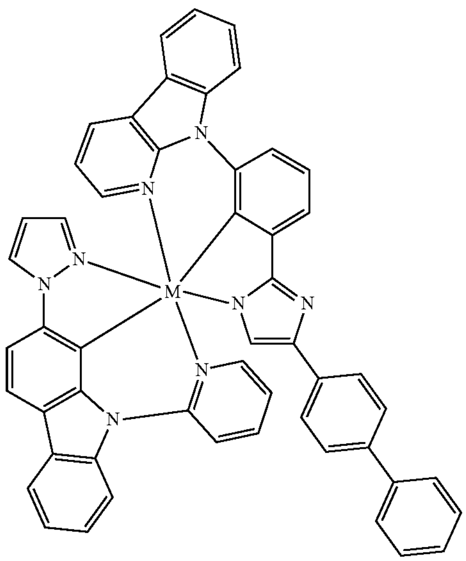
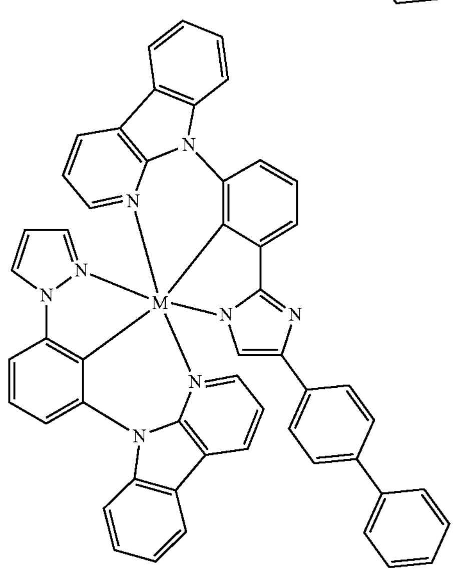
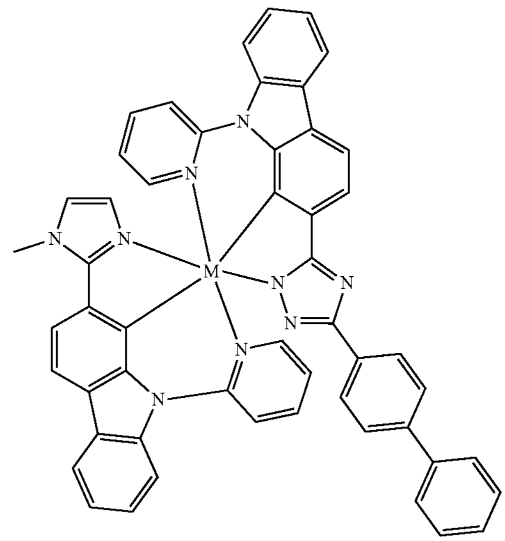
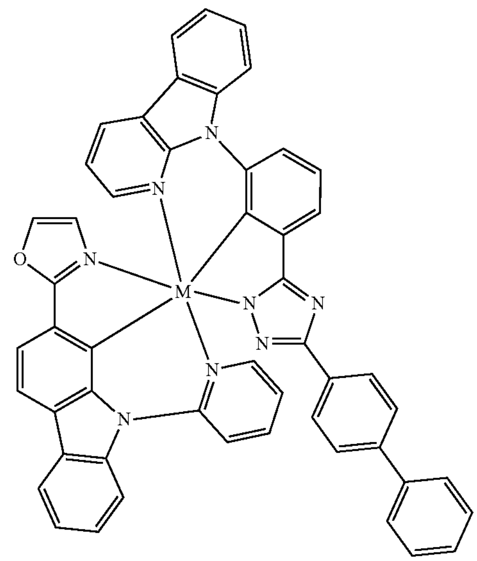
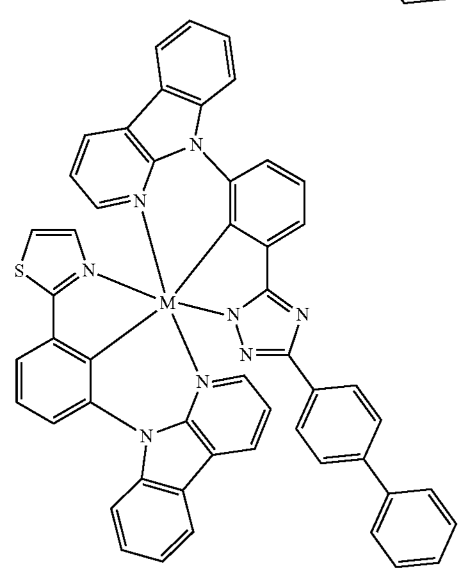

-continued
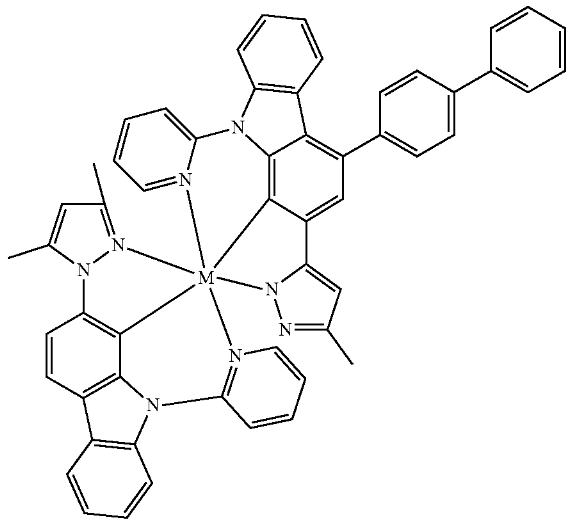
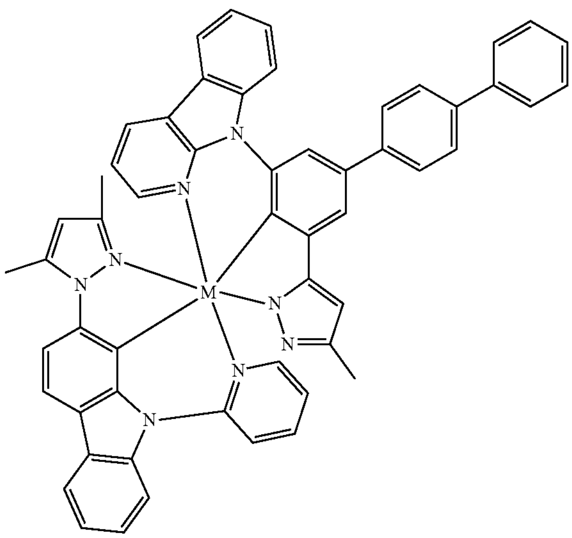
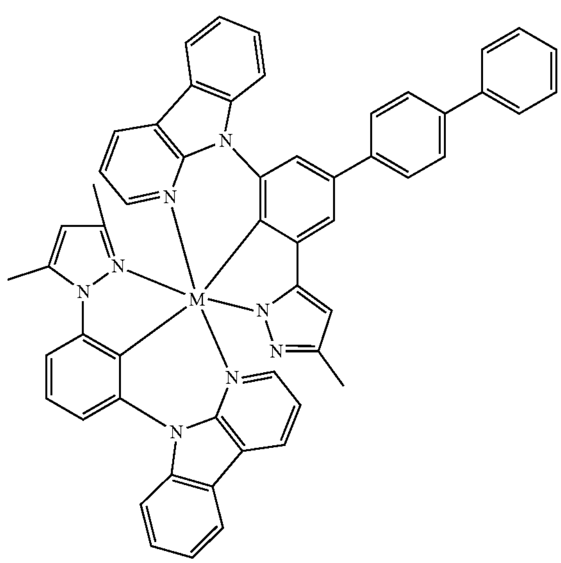
-continued
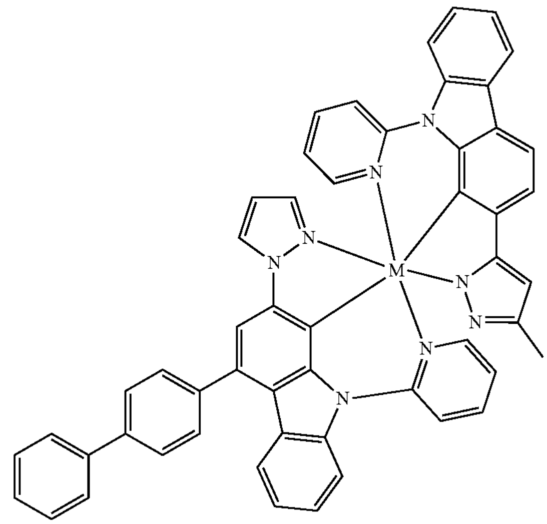
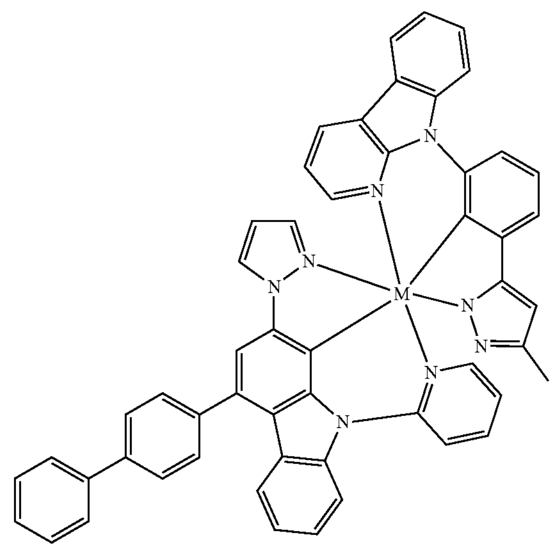
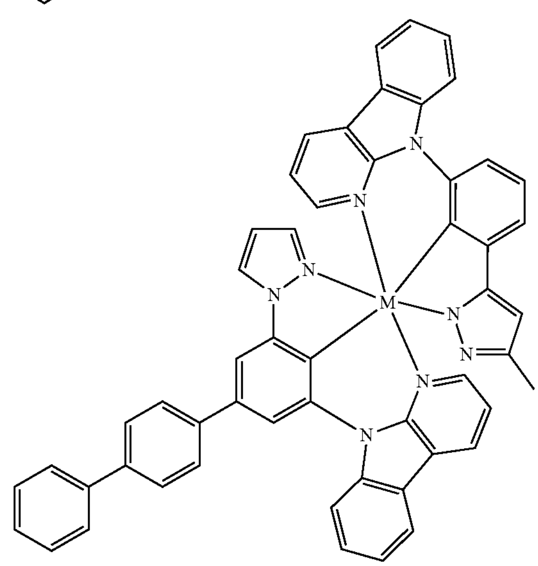

Structures M-14 (M = Ir, Rh)
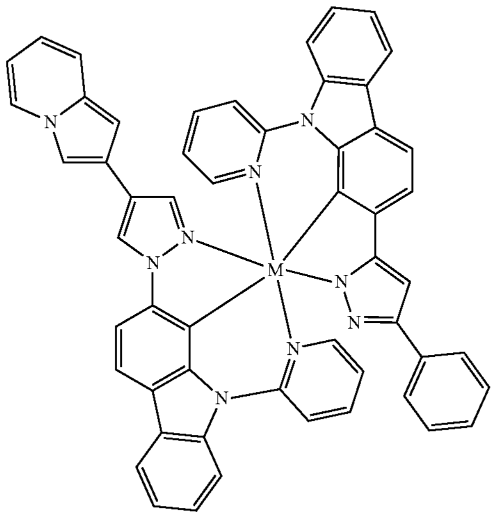
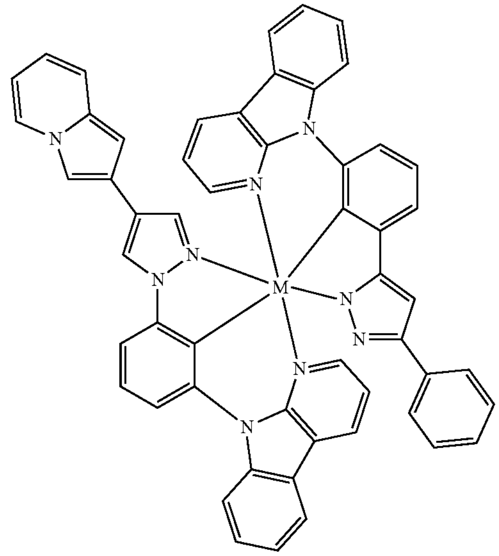
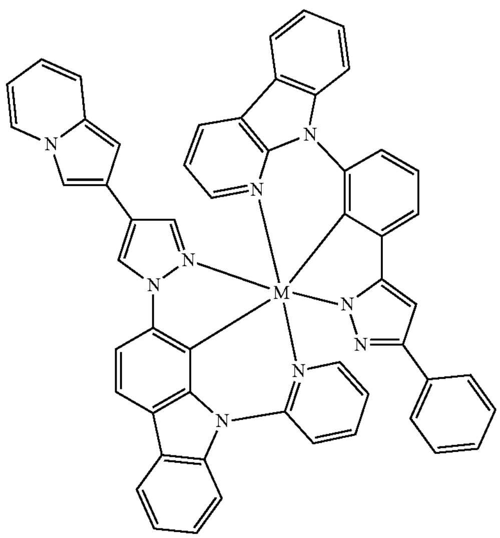
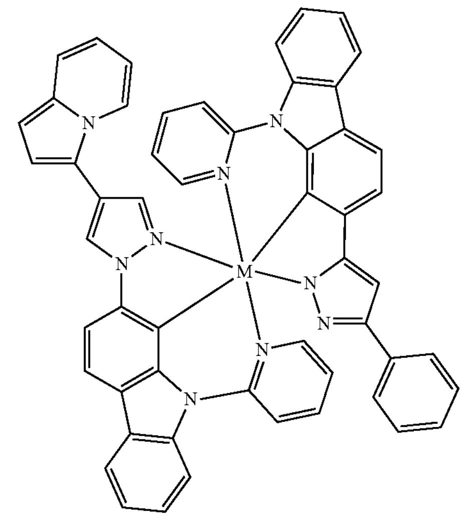
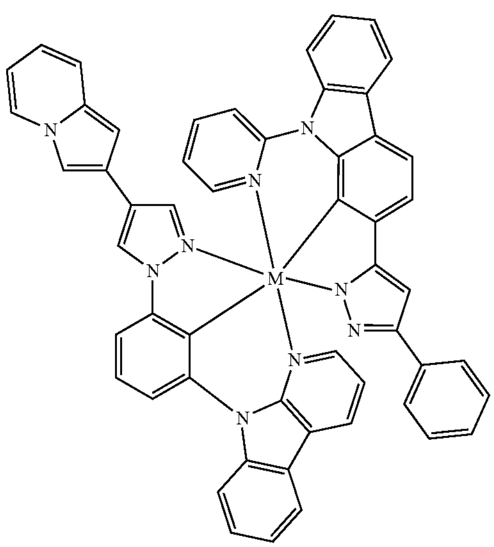
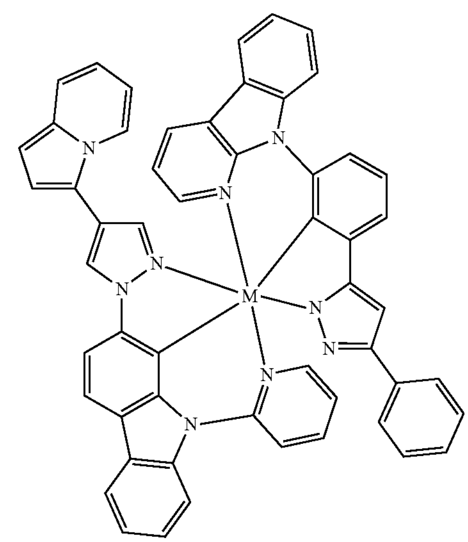

-continued
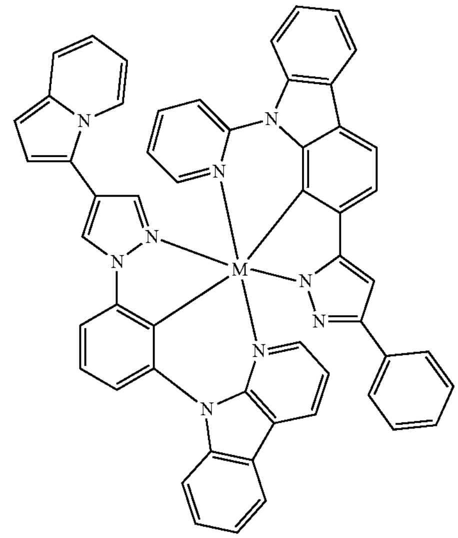
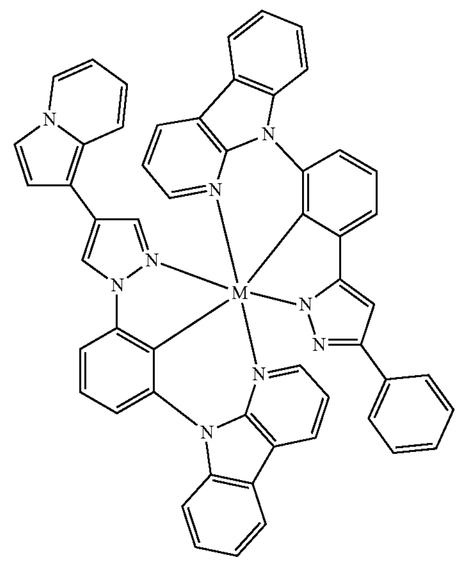
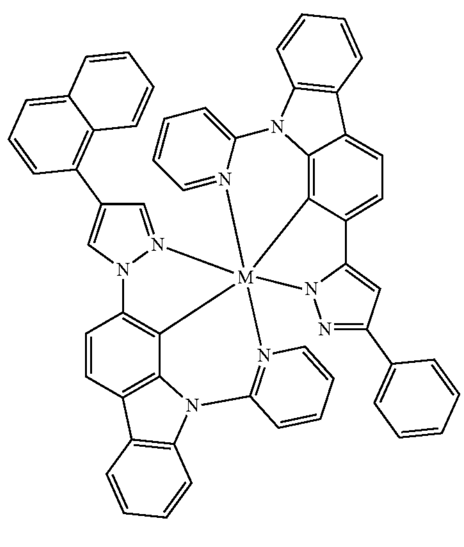
-continued
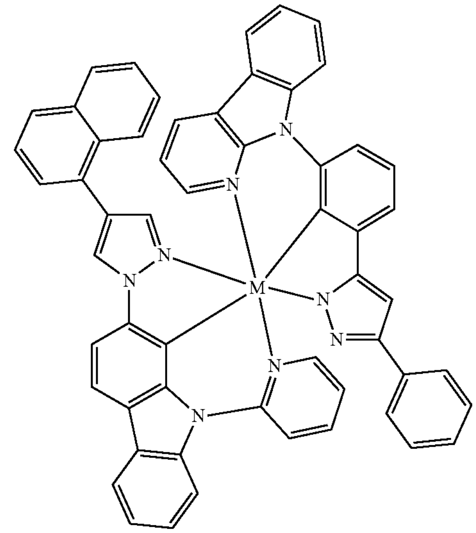
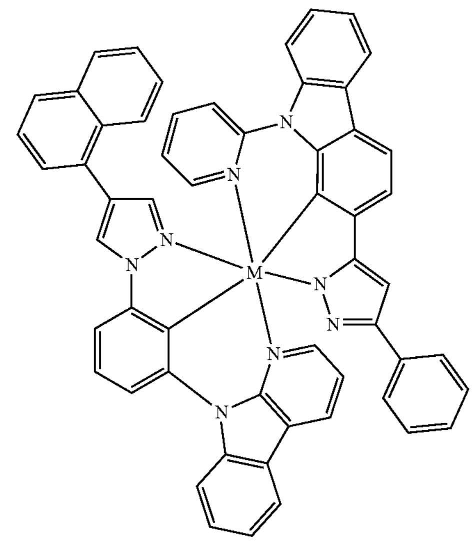
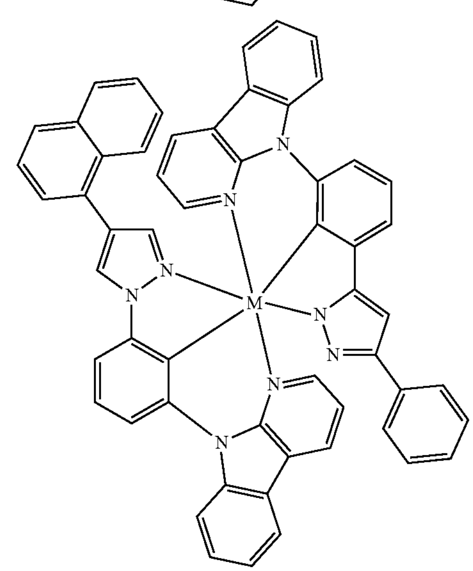

-continued
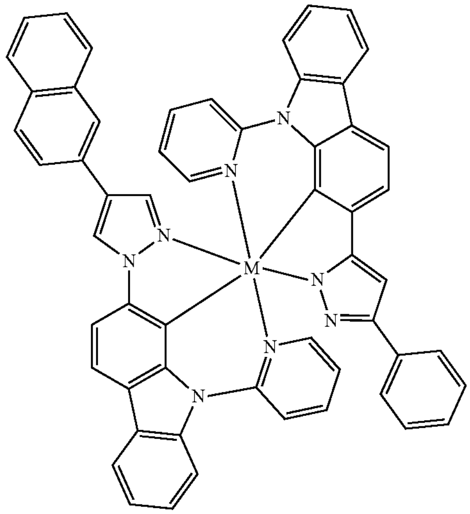
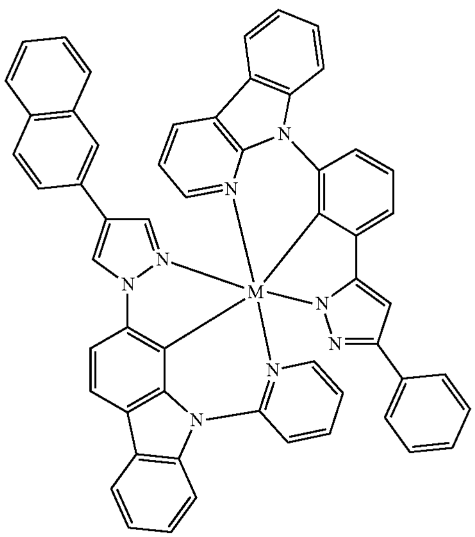
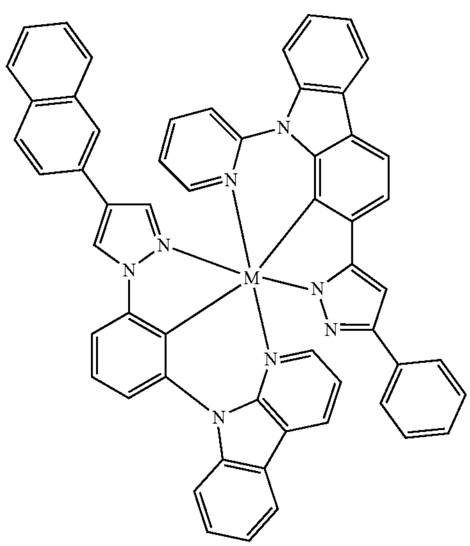
-continued
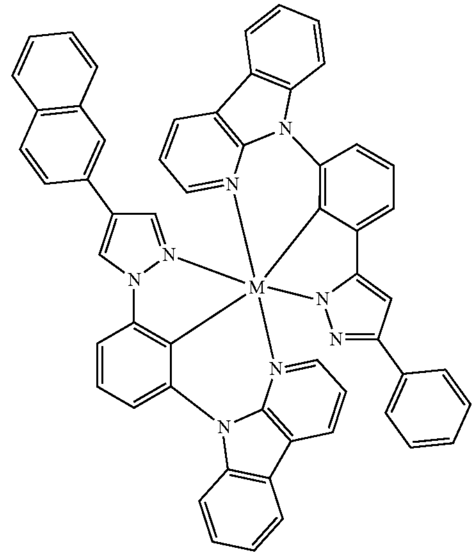
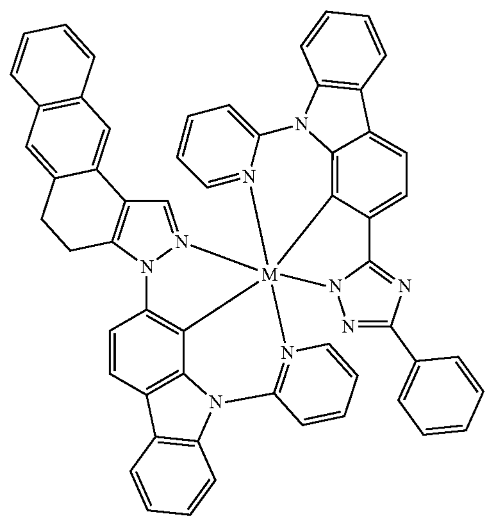
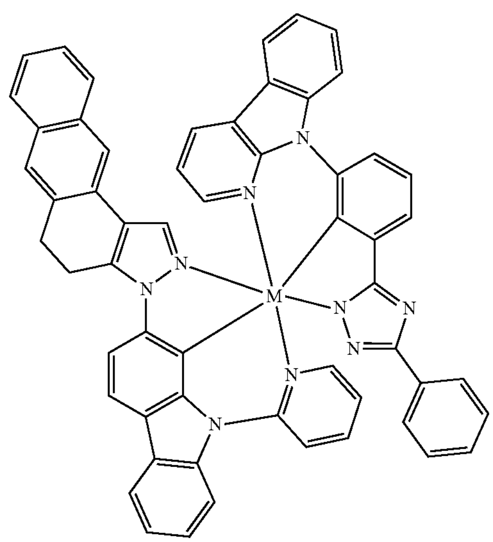

-continued
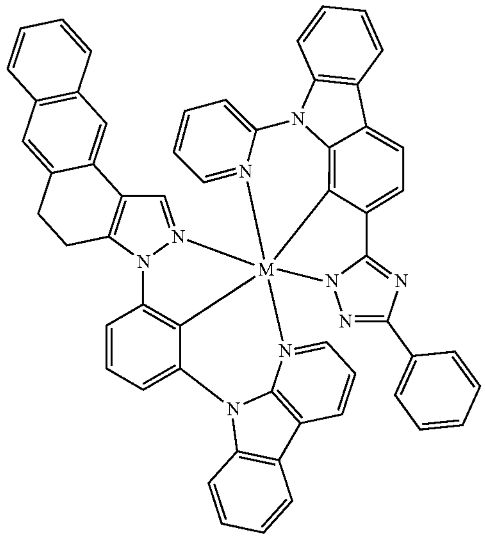
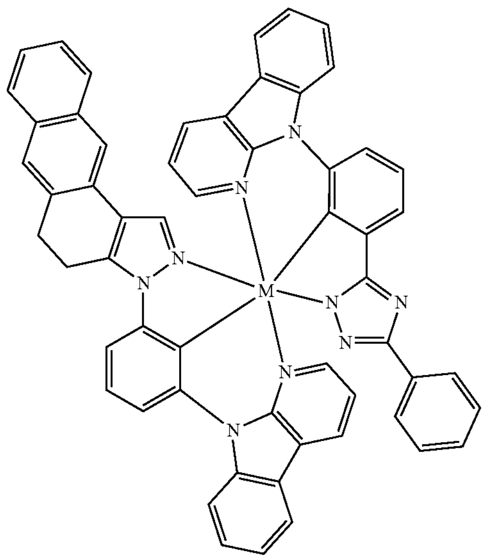
Structures M-15 (M = Ir, Rh)
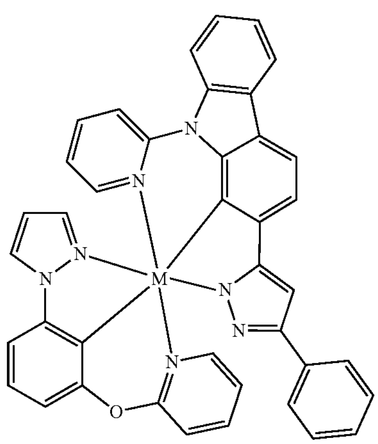
-continued
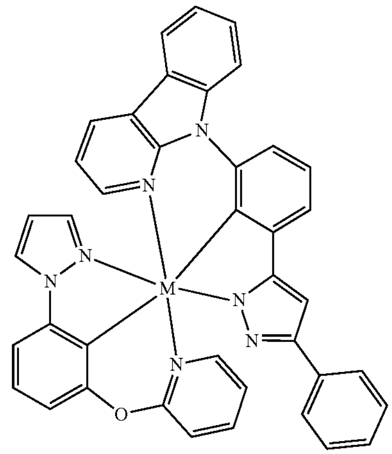
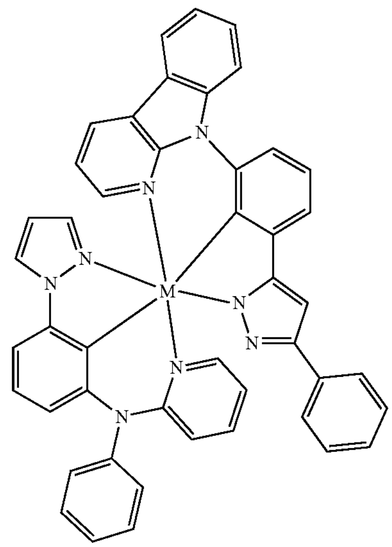
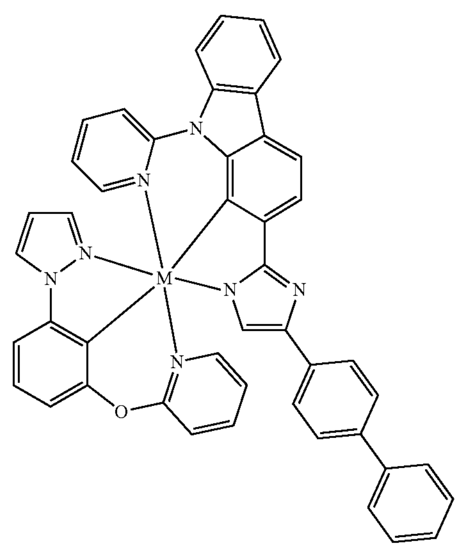

-continued
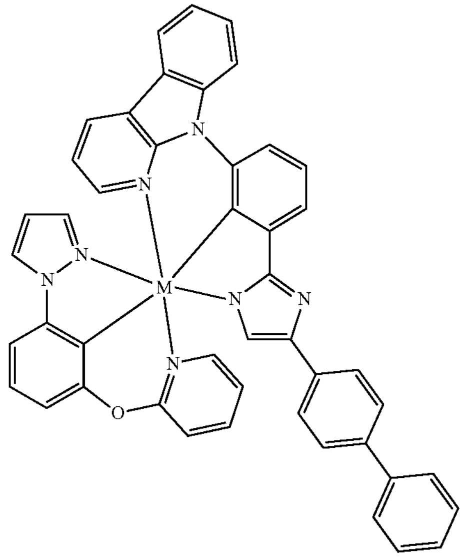
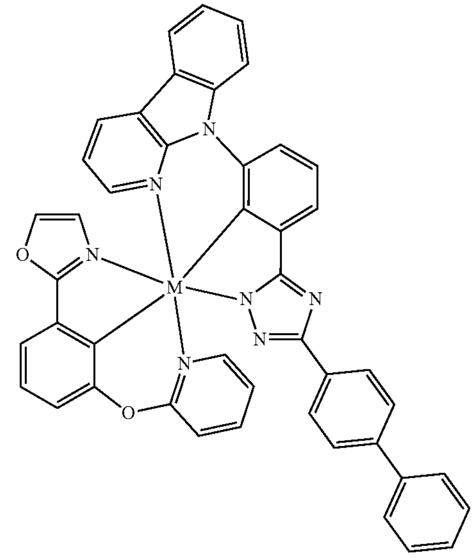
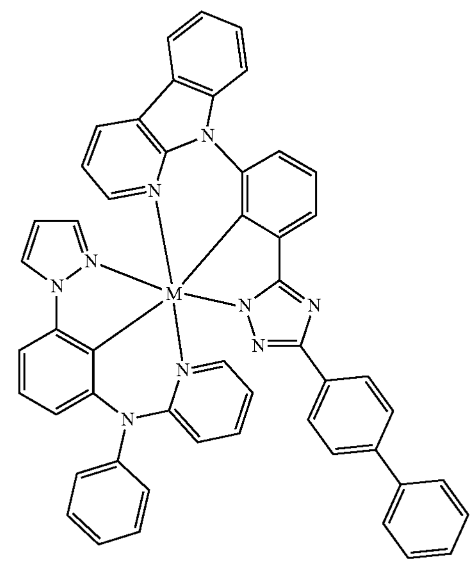
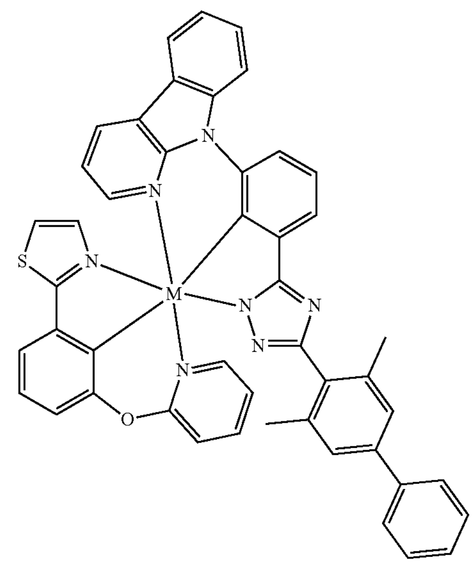
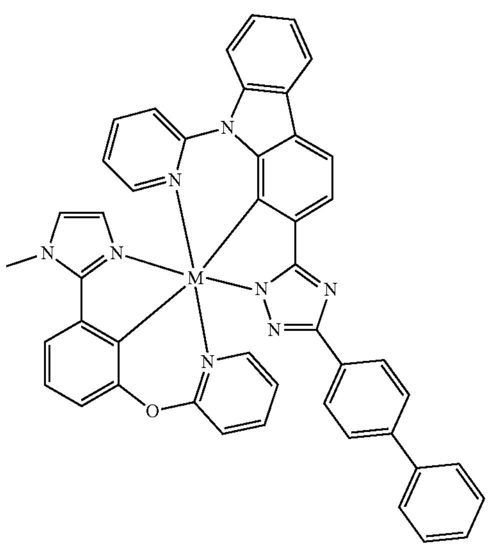
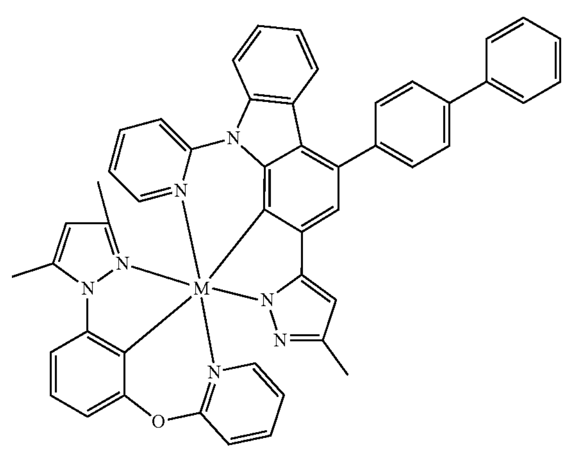

-continued
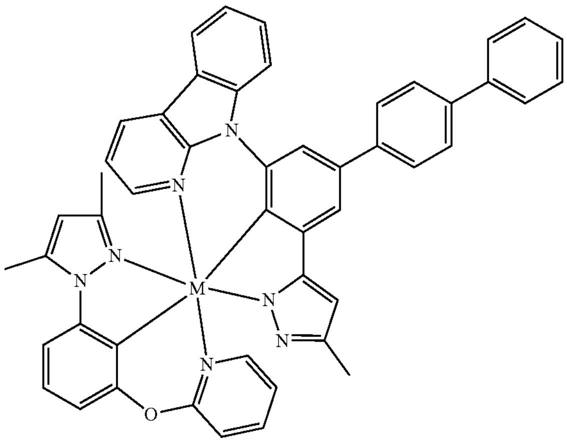
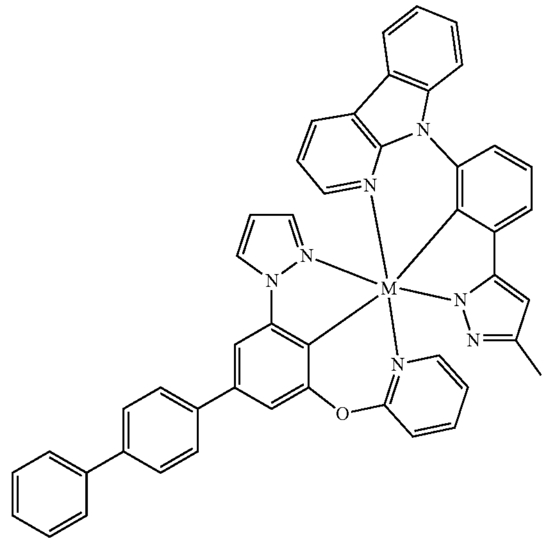
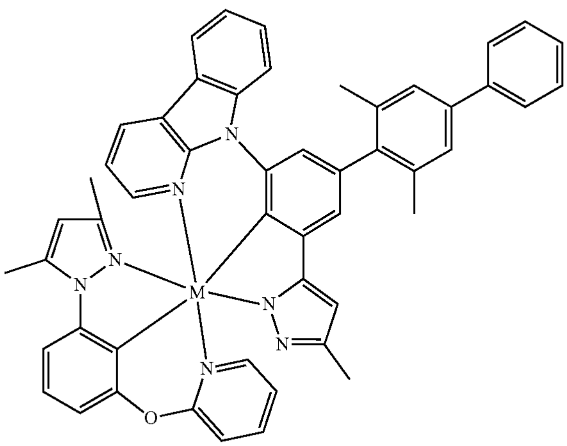
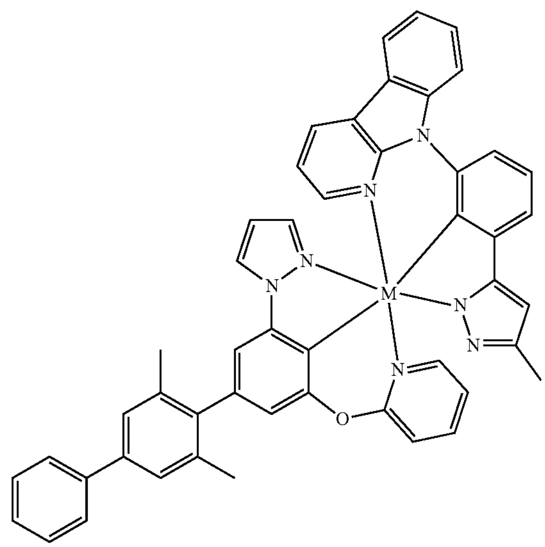
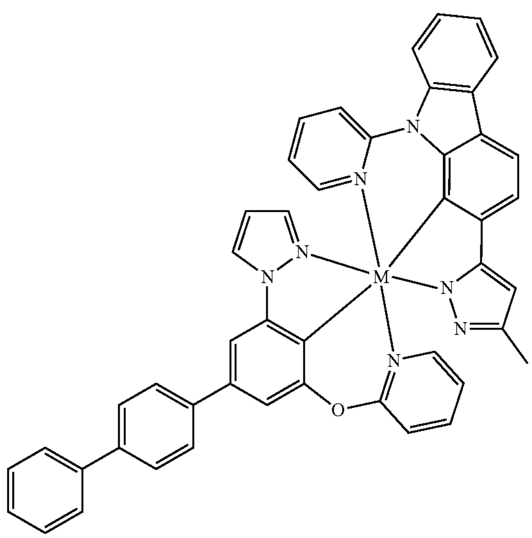
Structures M-16 (M = Ir, Rh)
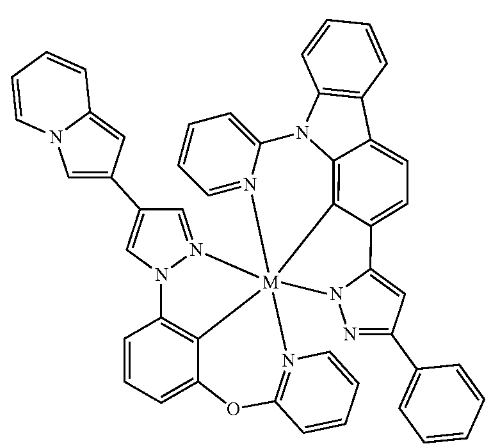

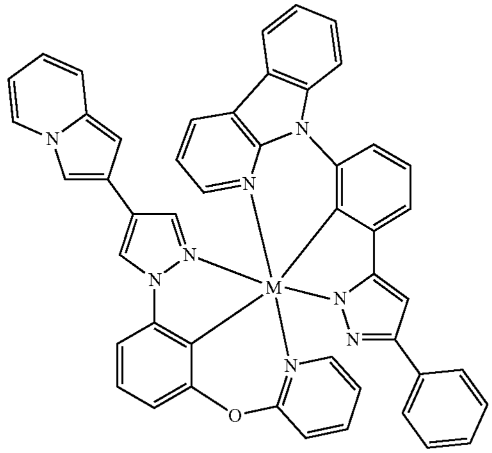
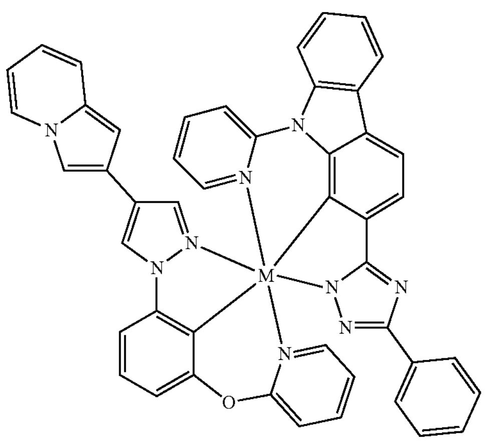
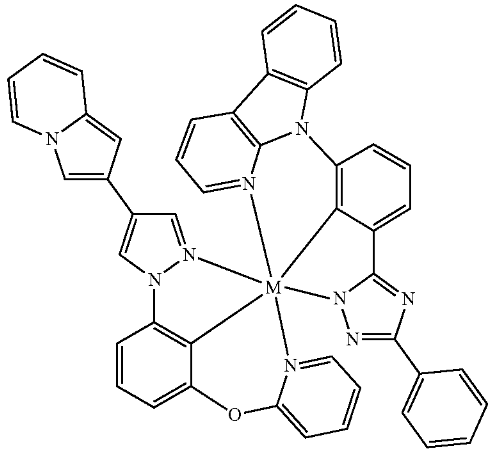
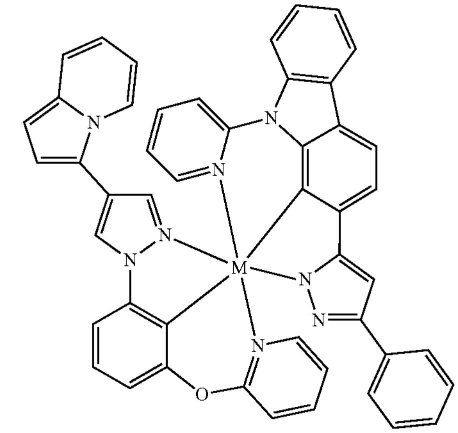
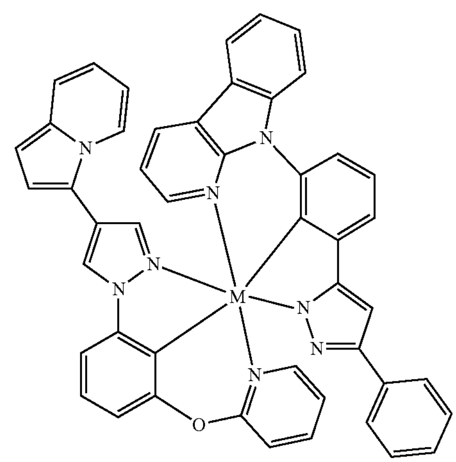
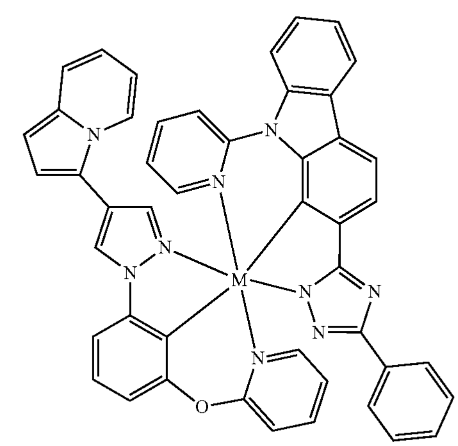

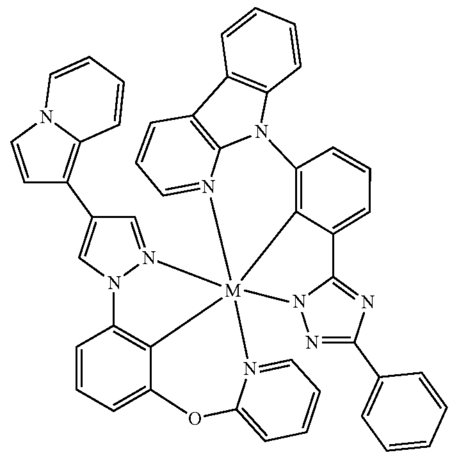
N
N
N
N
M
N
N
N
N
O
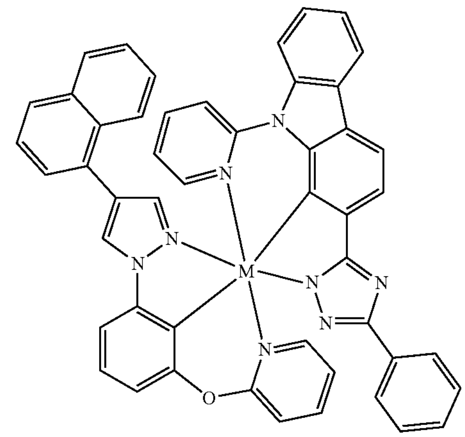
N
N
N
N
M
N
N
N
N
O
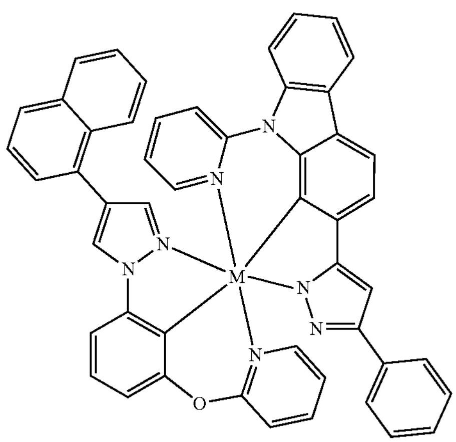
N
N
N
N
M
N
N
N
O
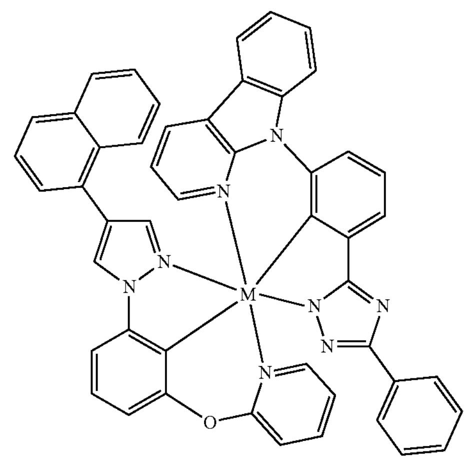
N
N
N
N
M
N
N
N
N
O
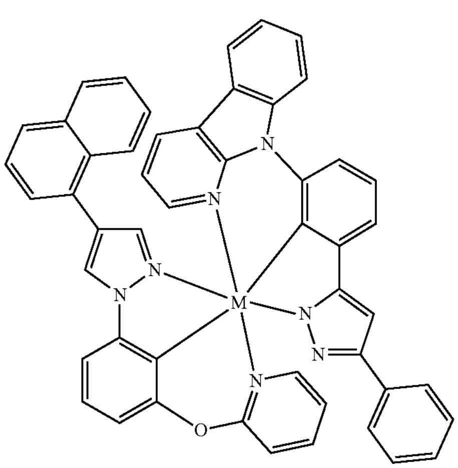
N
N
N
N
M
N
N
N
O
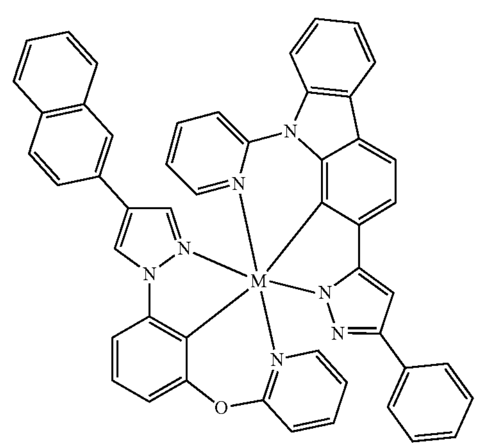
N
N
N
N
M
N
N
N
O -continued
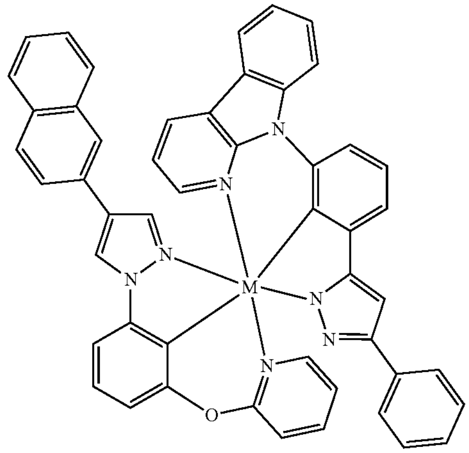
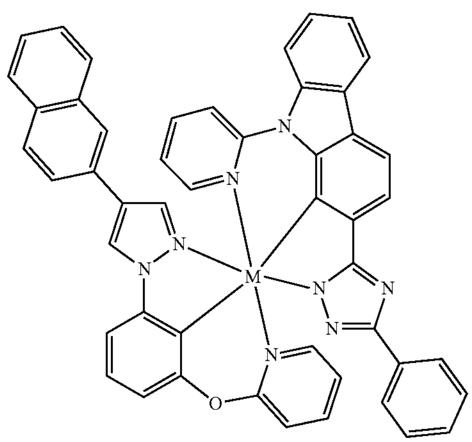
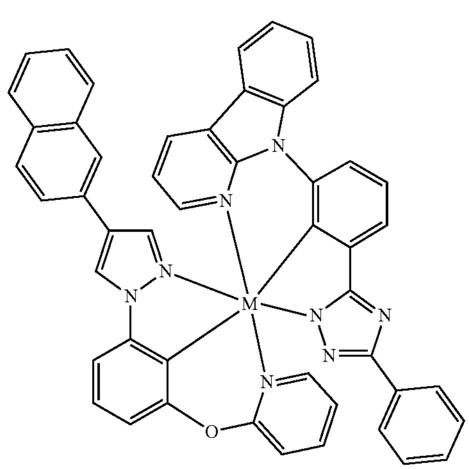
-continued
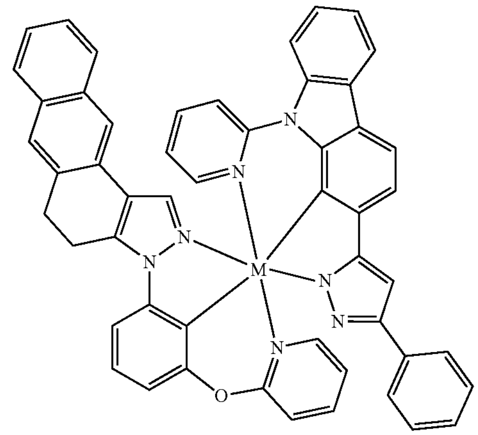
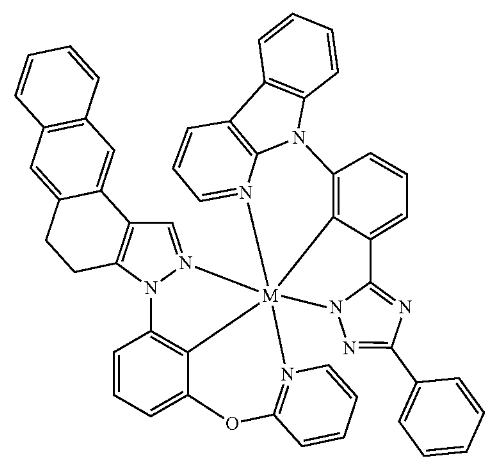
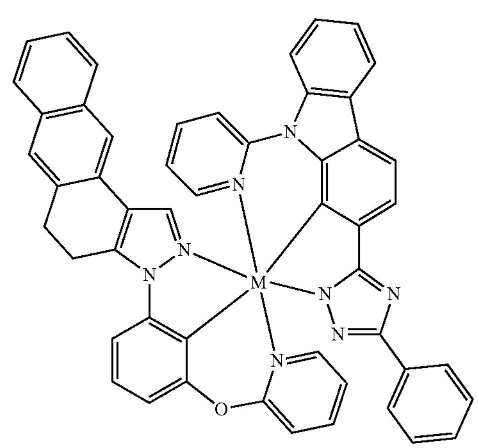

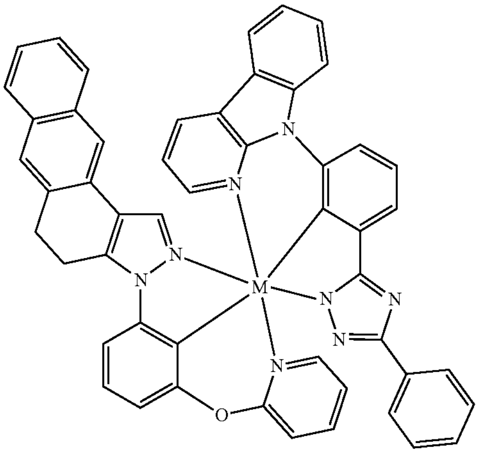
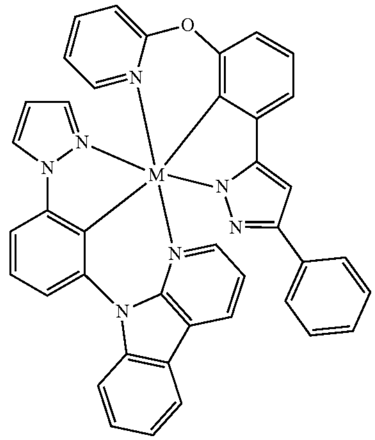
Structures M-17 (M = Ir, Rh)
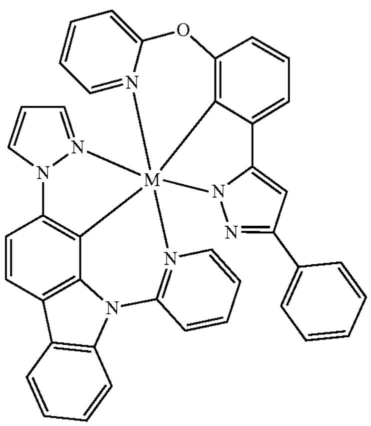
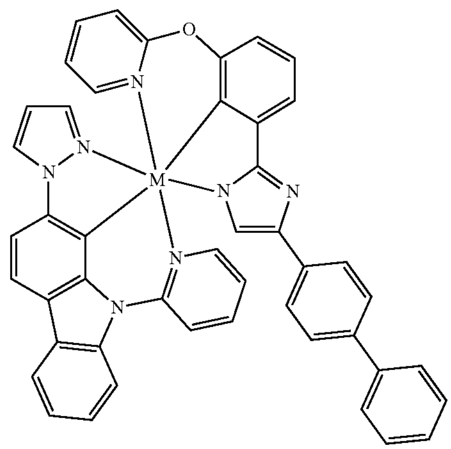
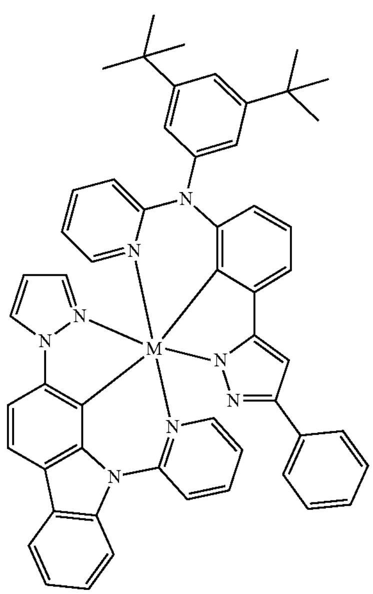
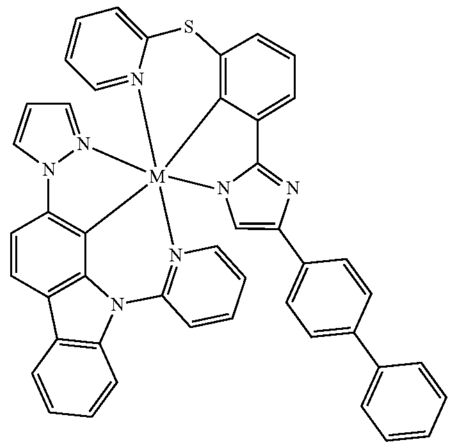

-continued
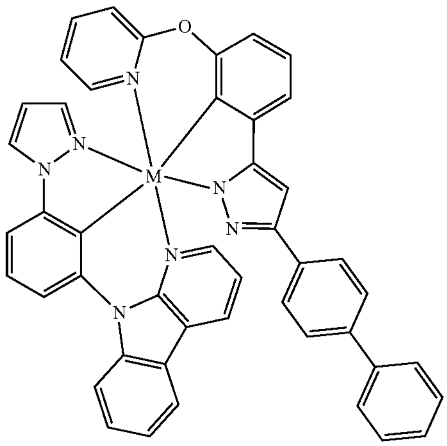
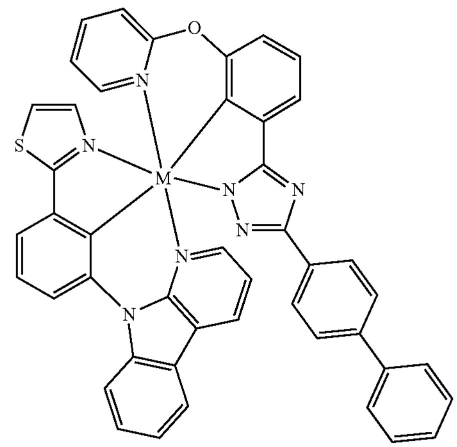
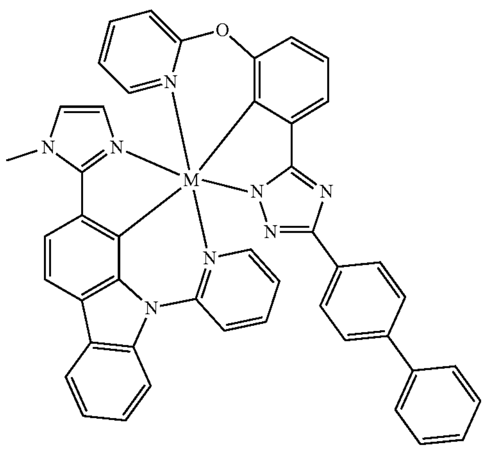
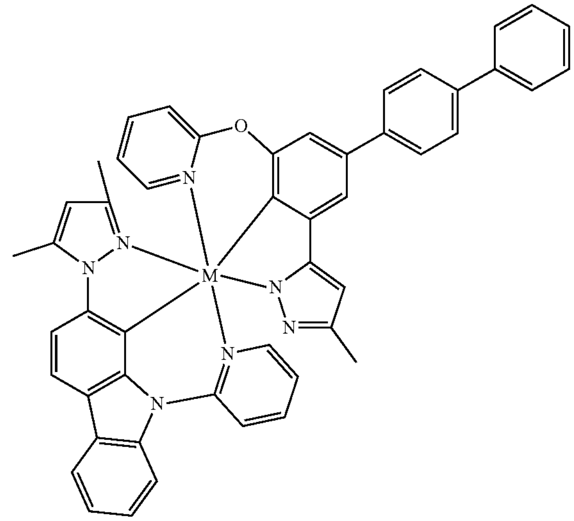
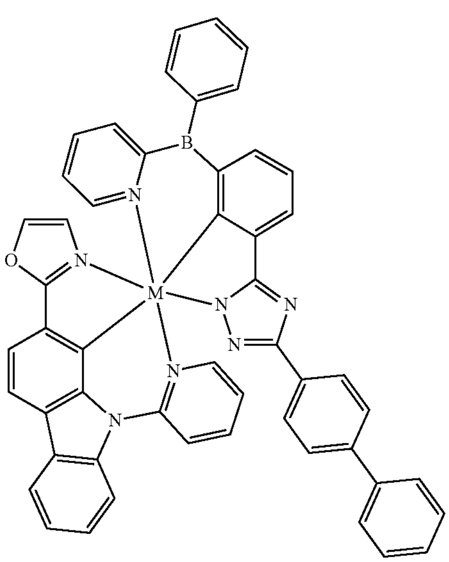
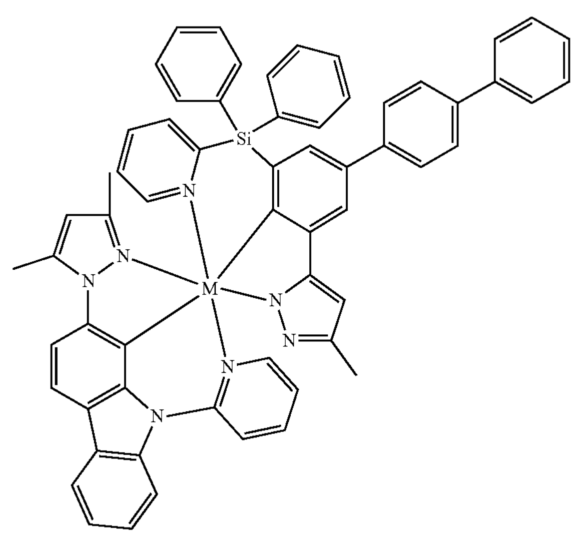

-continued
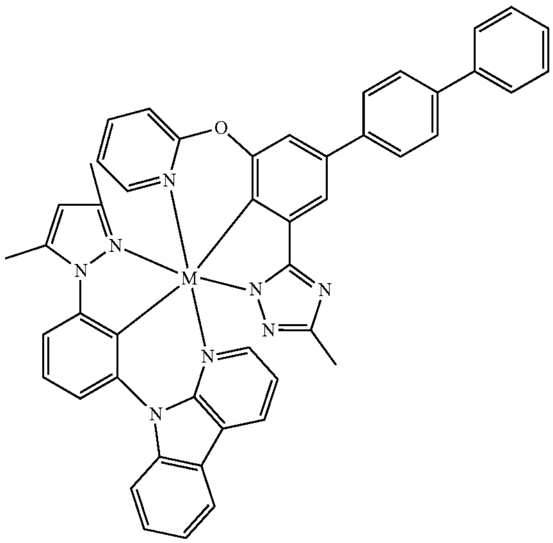
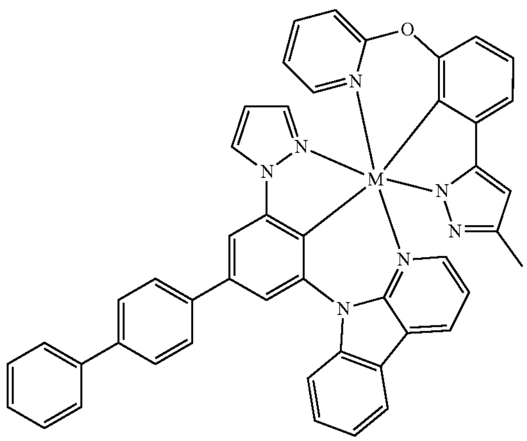
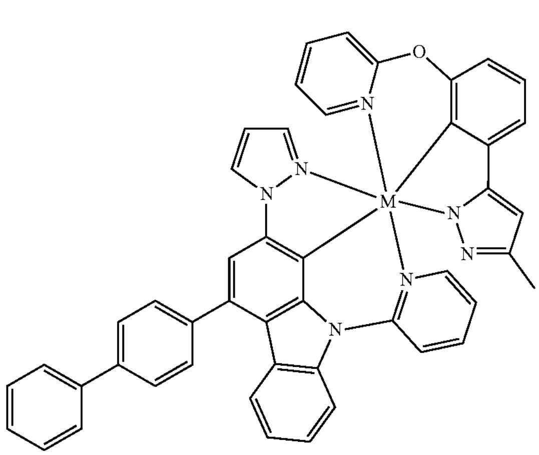
-continued
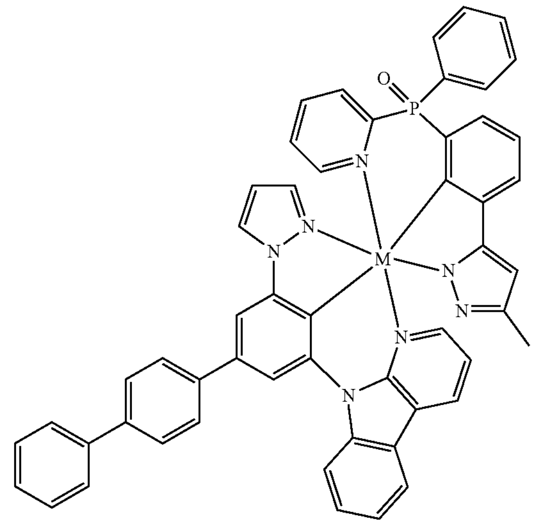
Structures M-18 (M = Ir, Rh)
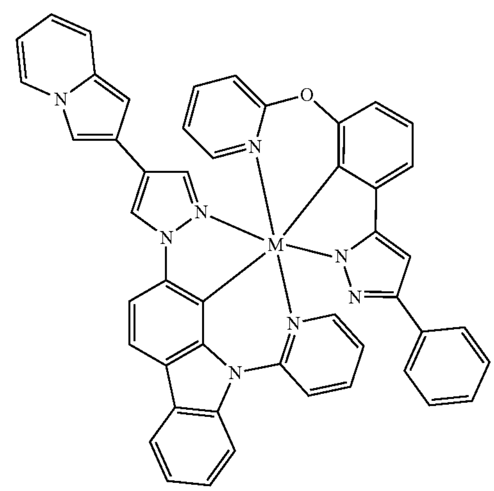
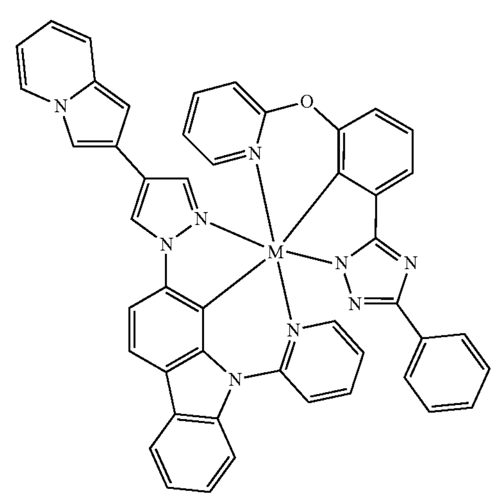

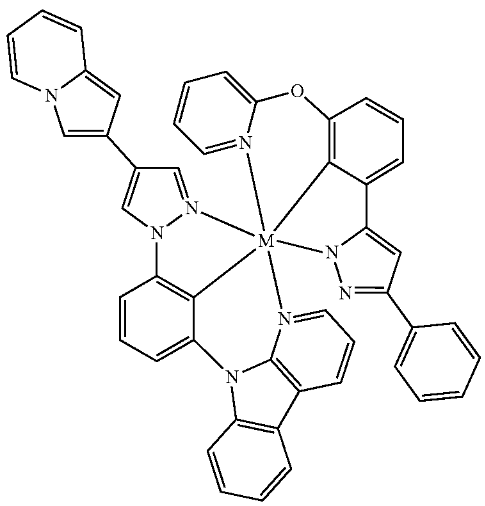
O
N
N
N
M
N
N
N
N
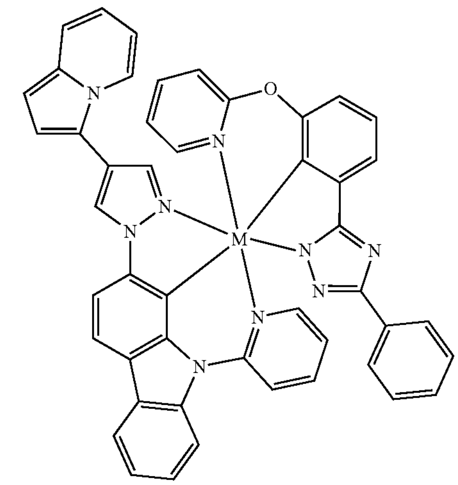
O
N
N
N
M
N
N
N
N
N
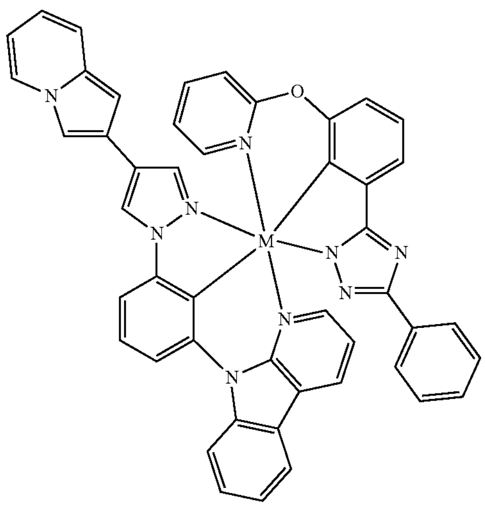
O
N
N
N
M
N
N
N
N
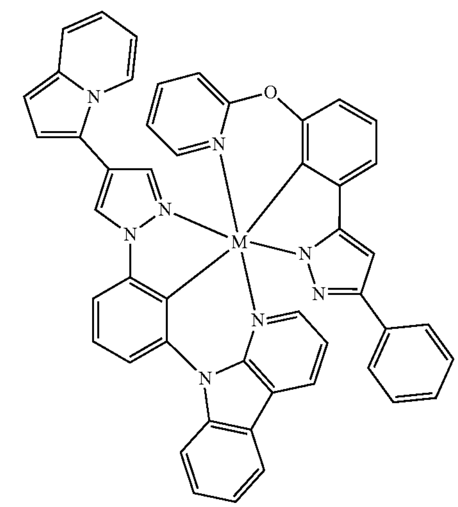
O
N
N
N
M
N
N
N
N
N
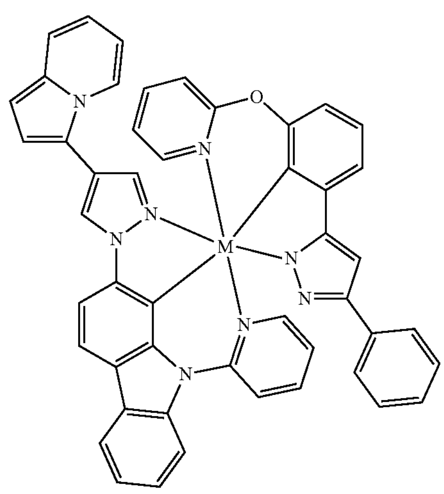
O
N
N
N
M
N
N
N
N
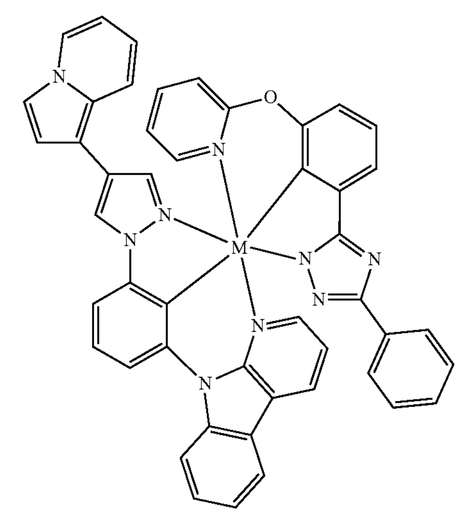
O
N
N
N
M
N
N
N
N
N -continued
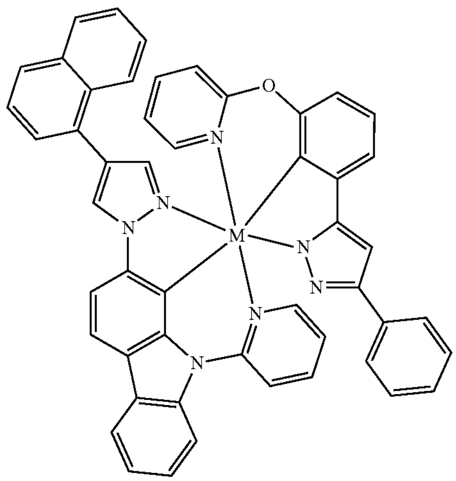
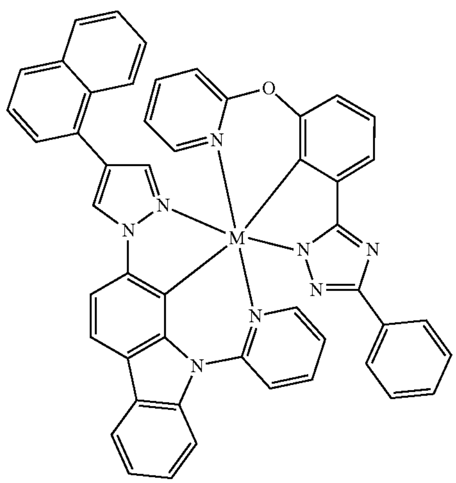
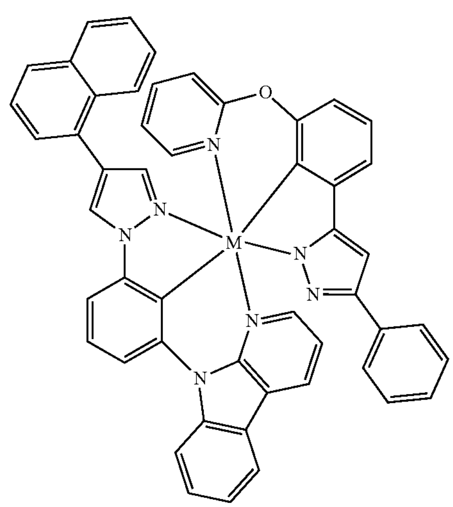
-continued
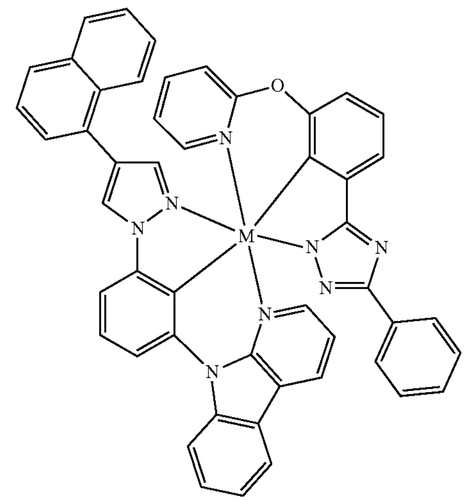
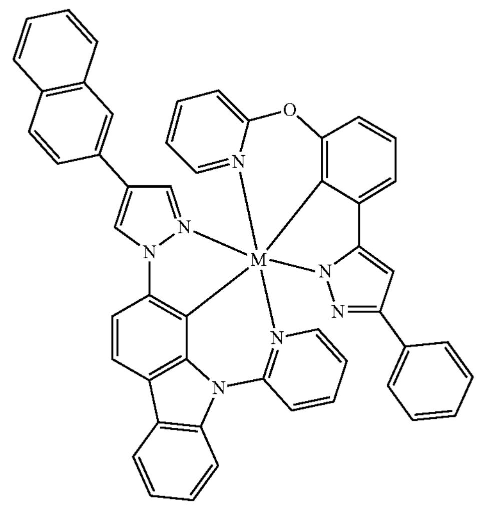
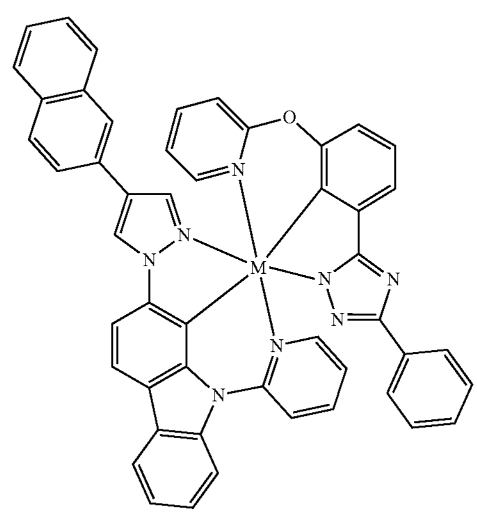

-continued
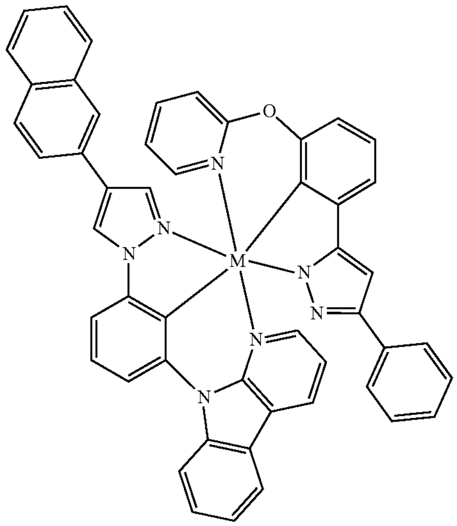
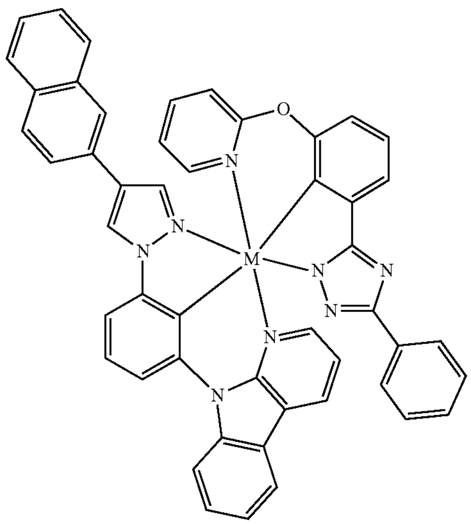
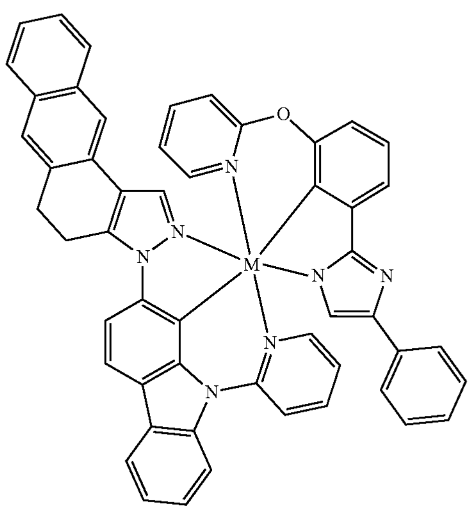
-continued
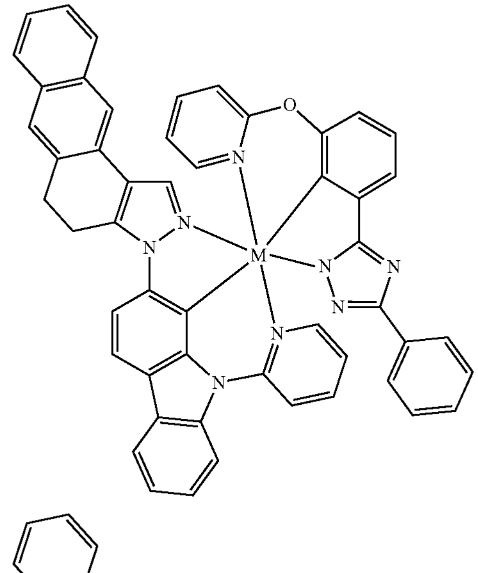
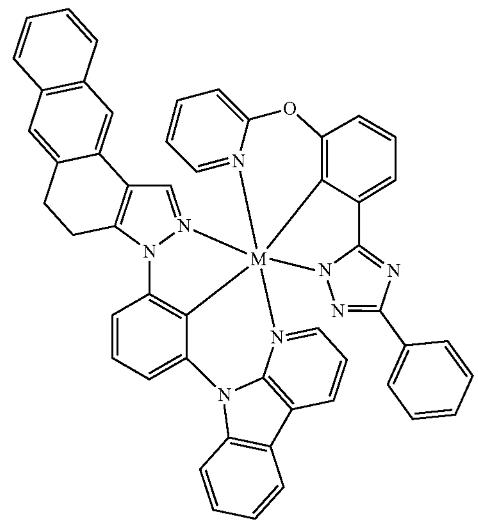
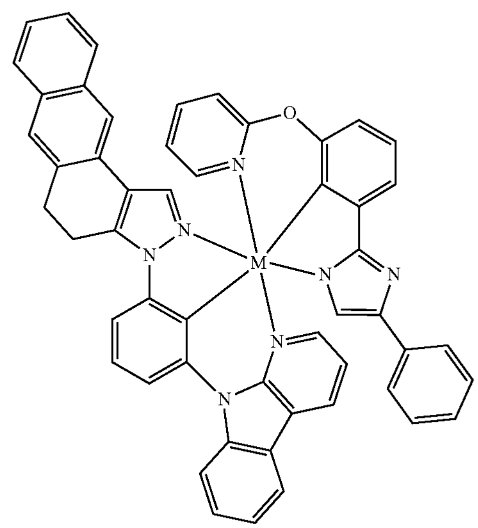

-continued
Structures M-19 (M = Ir, Rh)
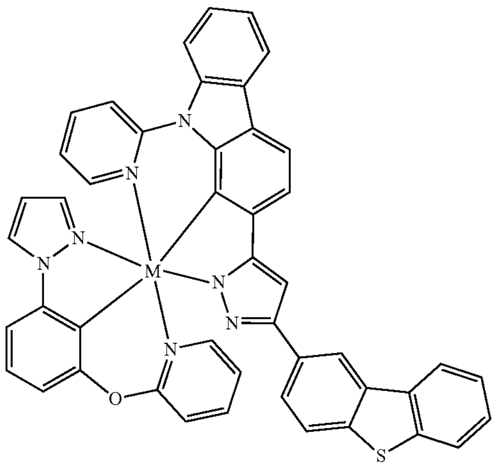
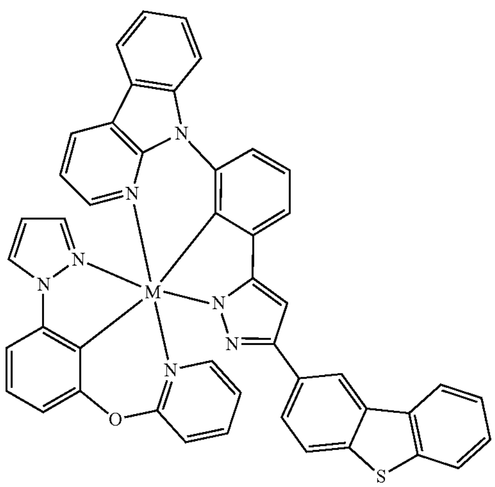
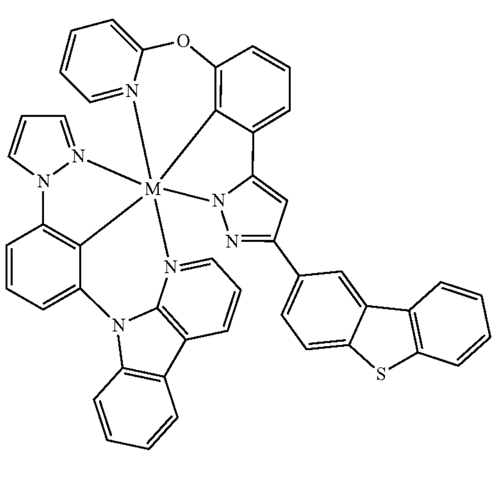
-continued
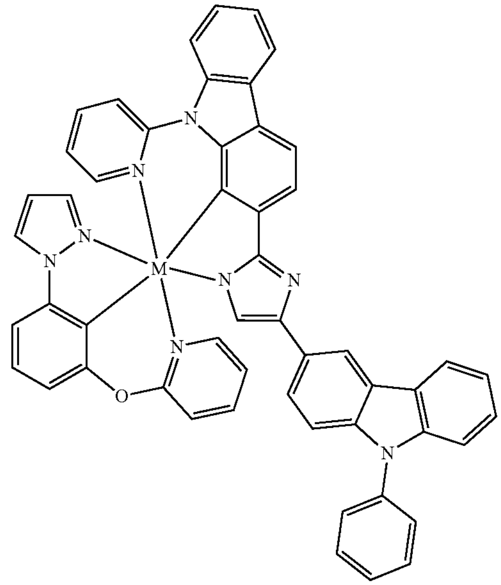
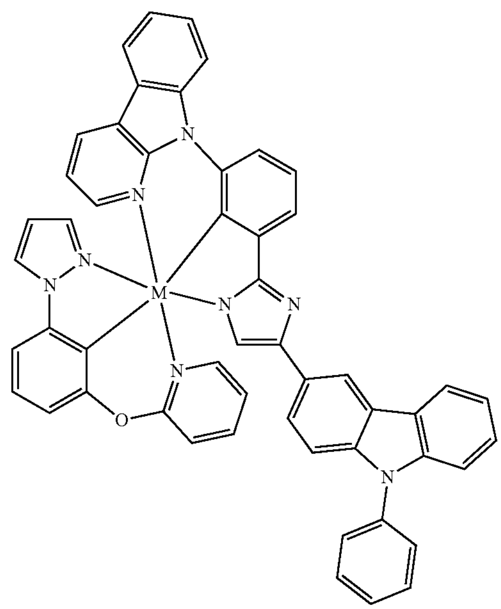
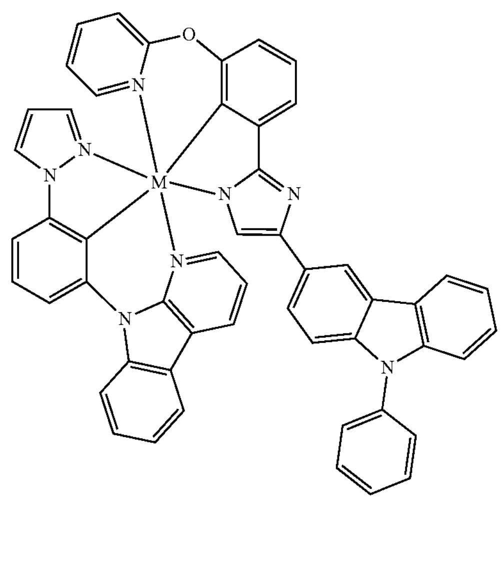

-continued
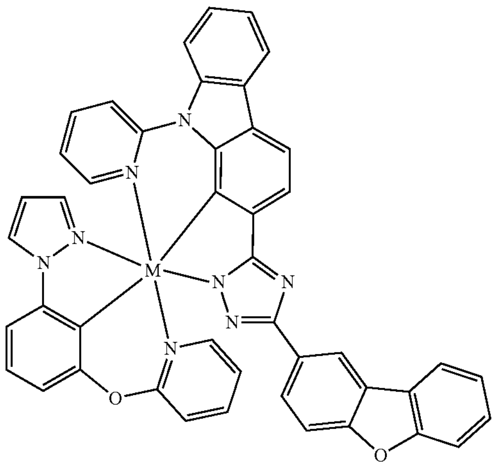
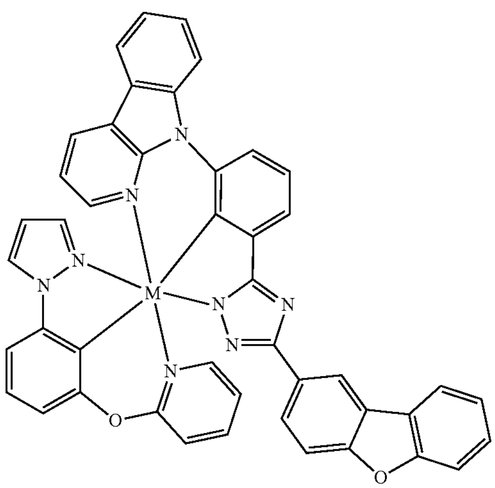
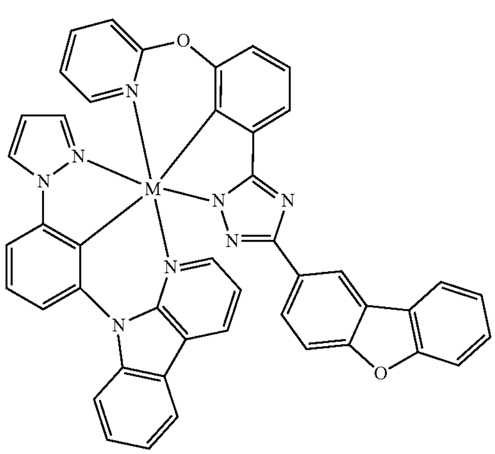
-continued
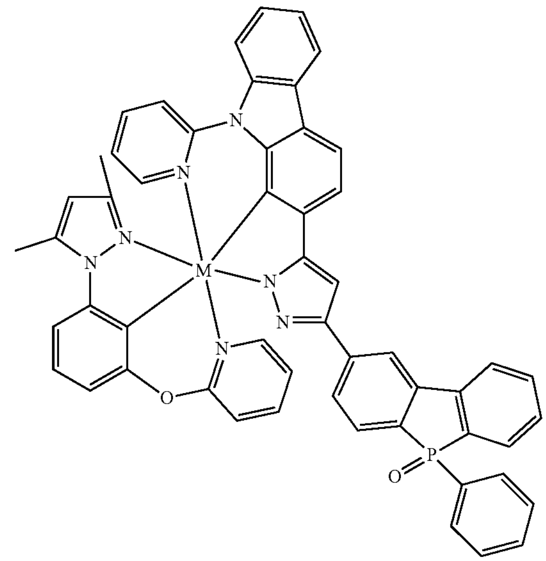
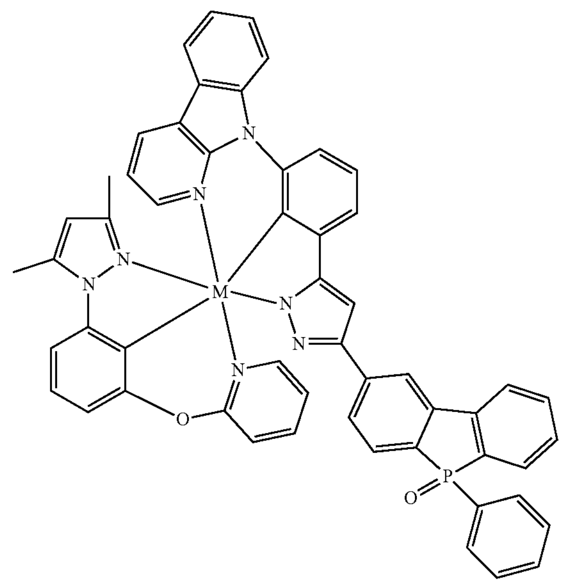
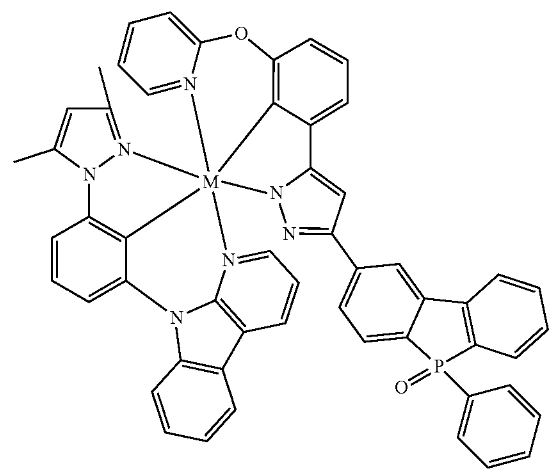

-continued
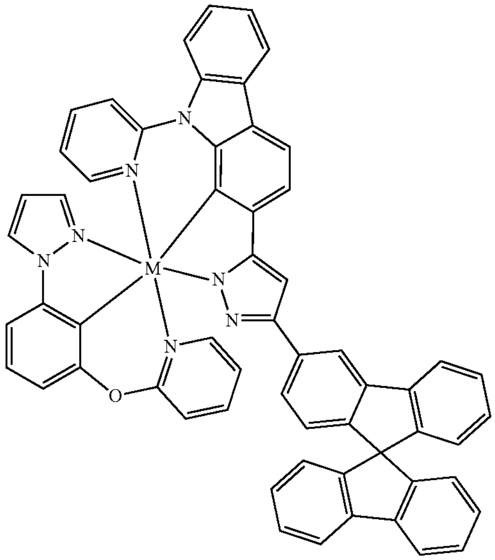
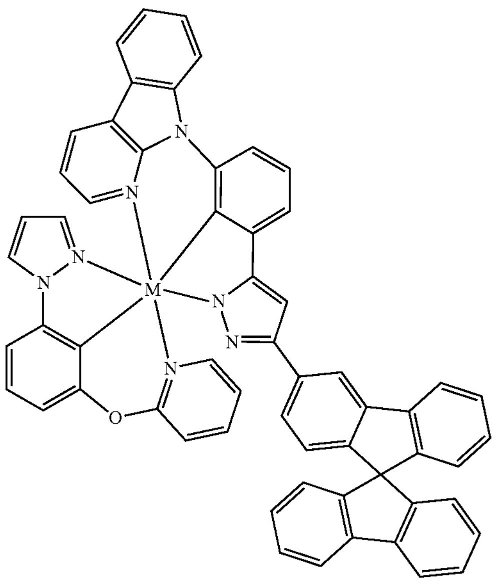
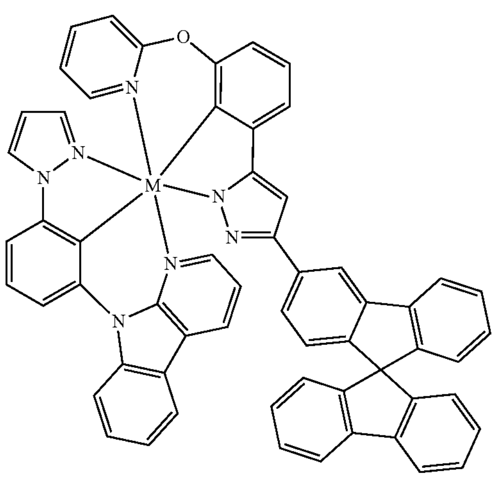
-continued
Structures M-20 (M = Ir, Rh)
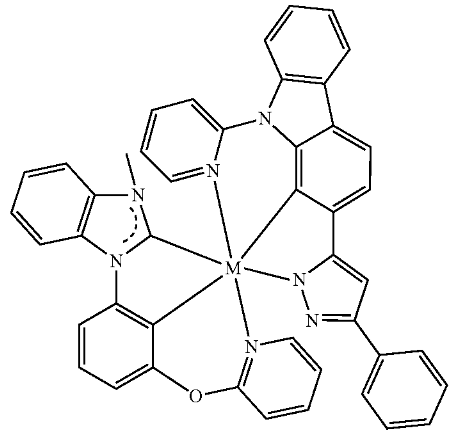
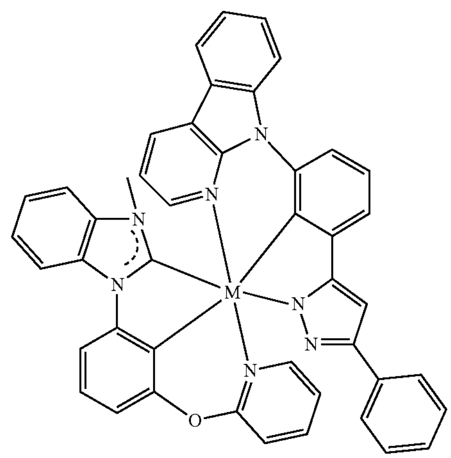
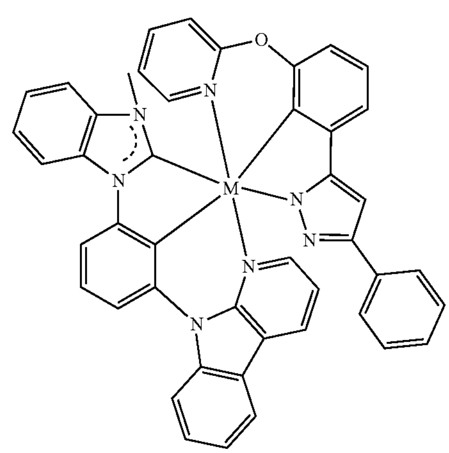

-continued
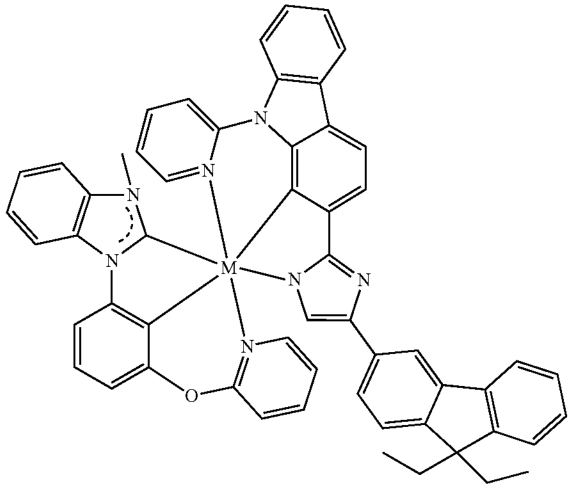
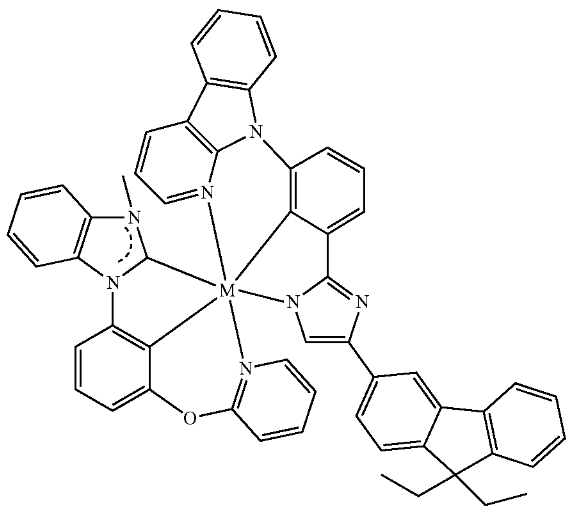
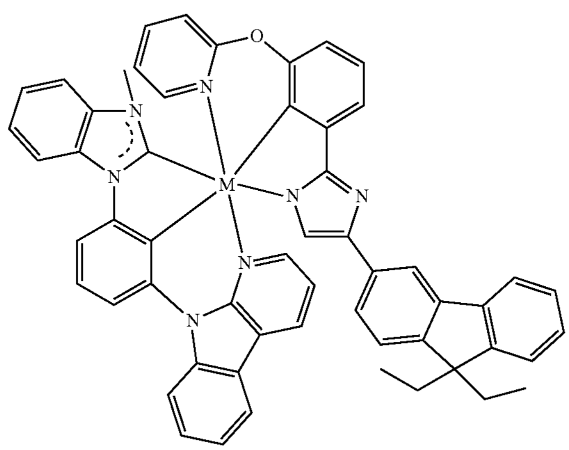
-continued
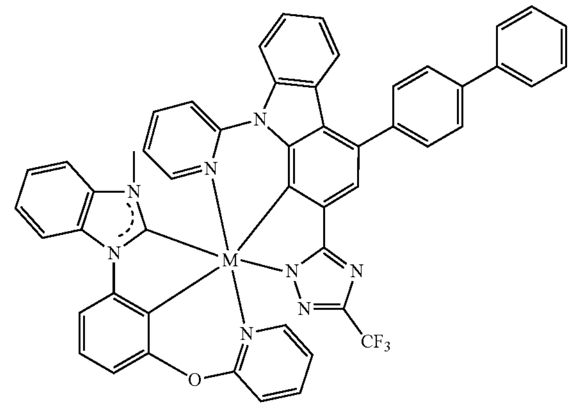
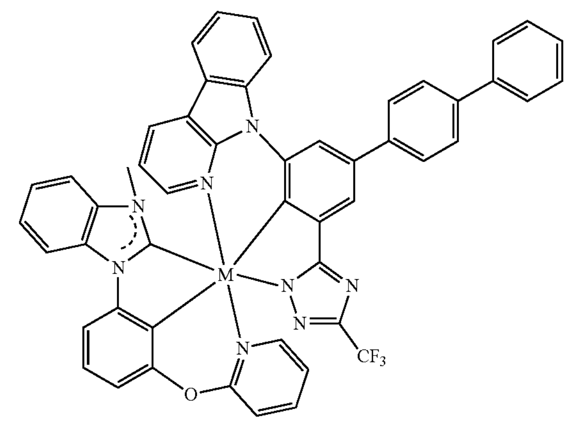
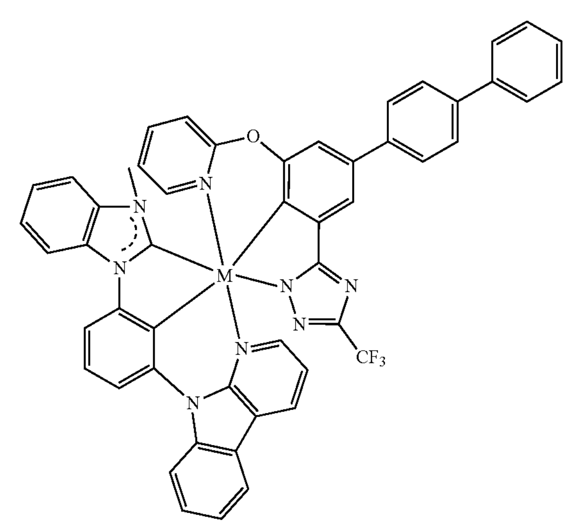

-continued
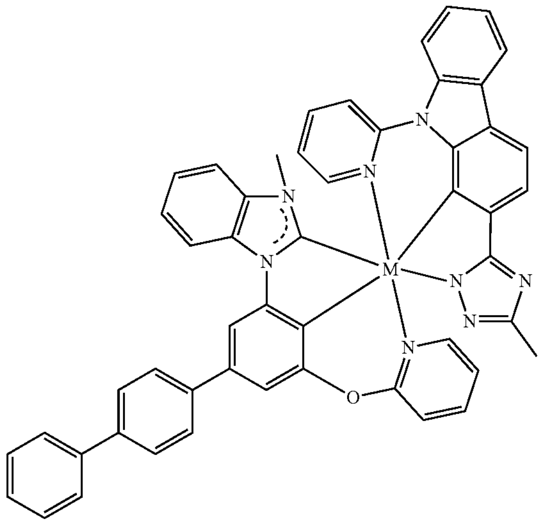
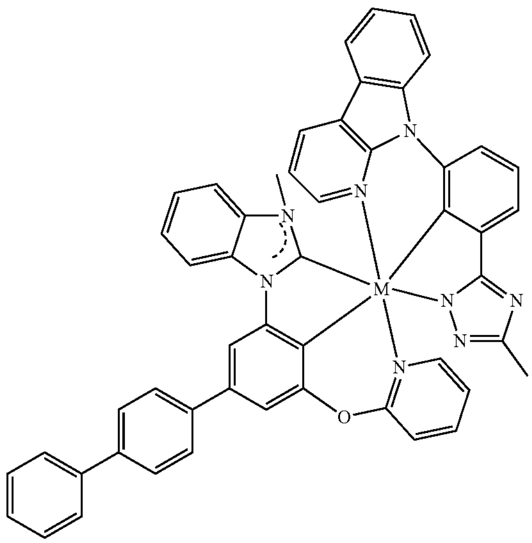
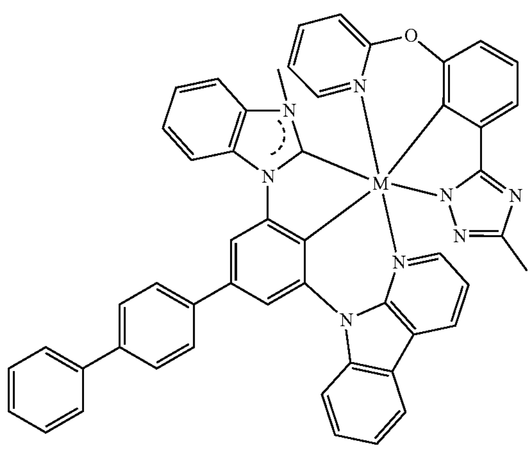
-continued
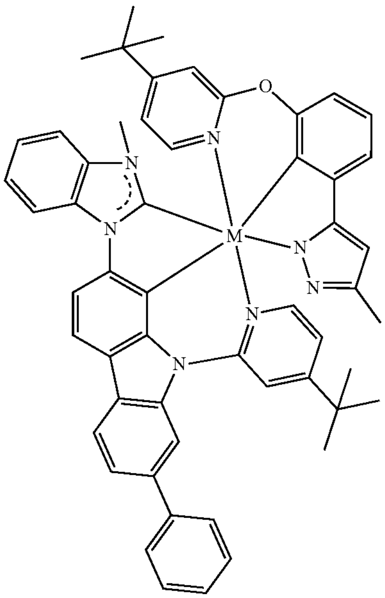
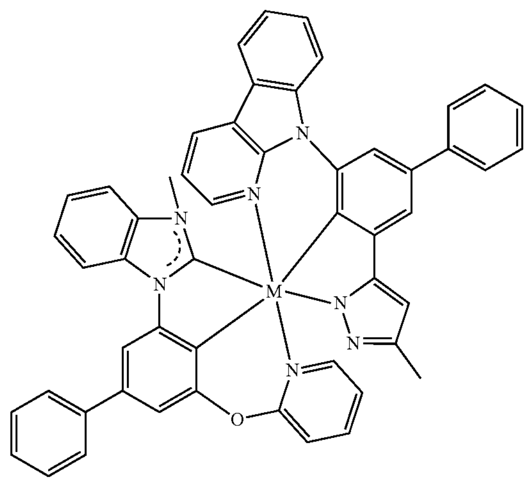
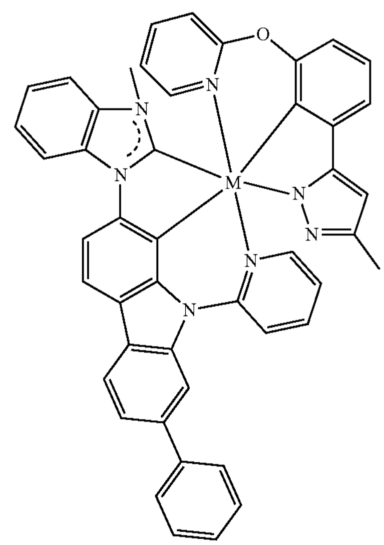

Structures M-21 (M = Ir, Rh)
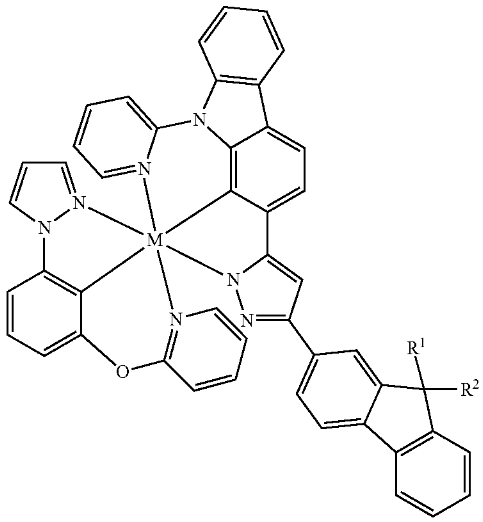
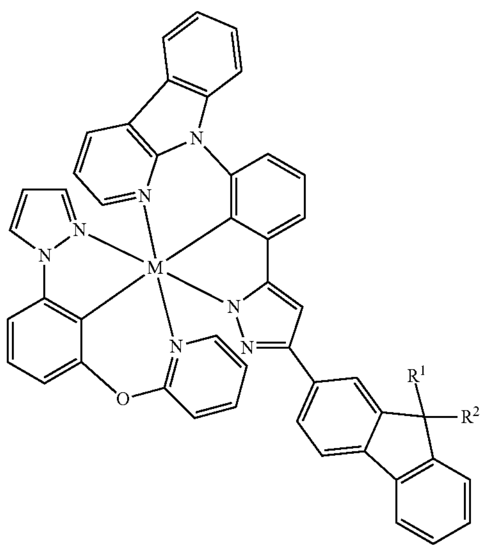
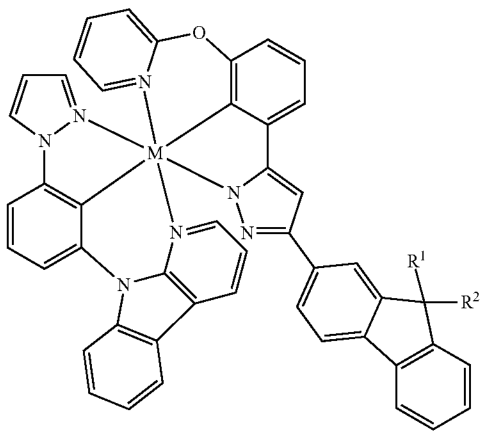
-continued
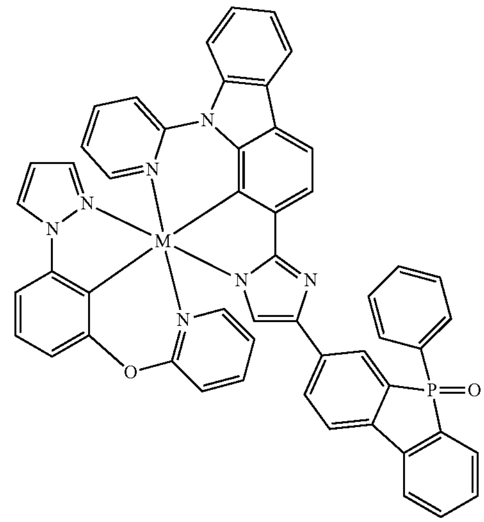
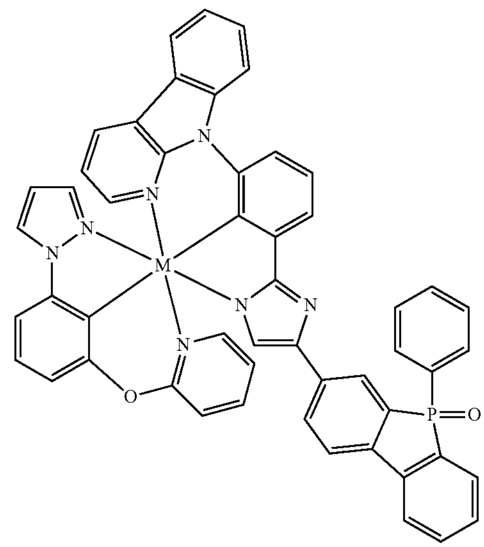
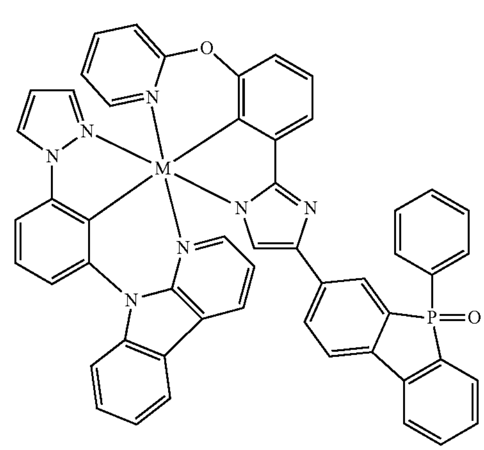

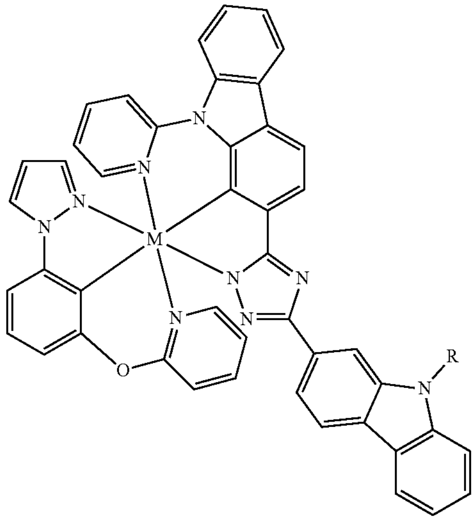
N
N
N
M
N
N
N
N
N
O
N
R
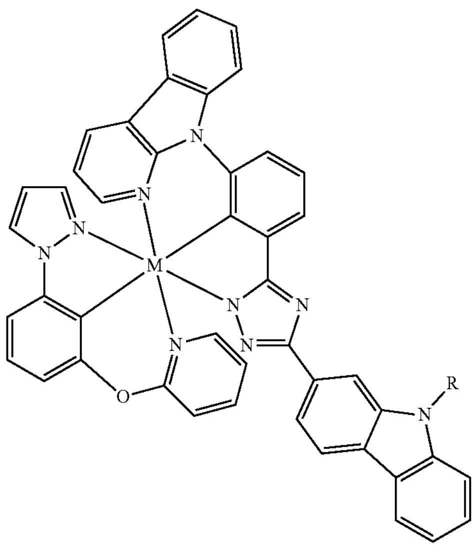
N
N
N
M
N
N
N
N
N
O
N
R
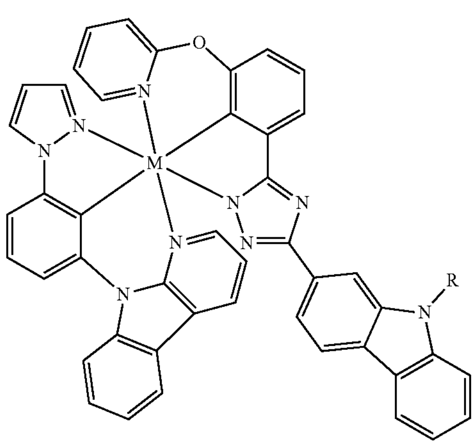
O
N
N
N
M
N
N
N
N
N
N
R
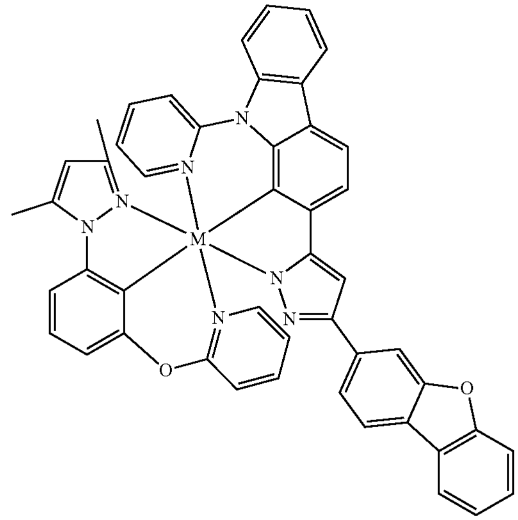
N
N
N
N
M
N
N
N
O
O
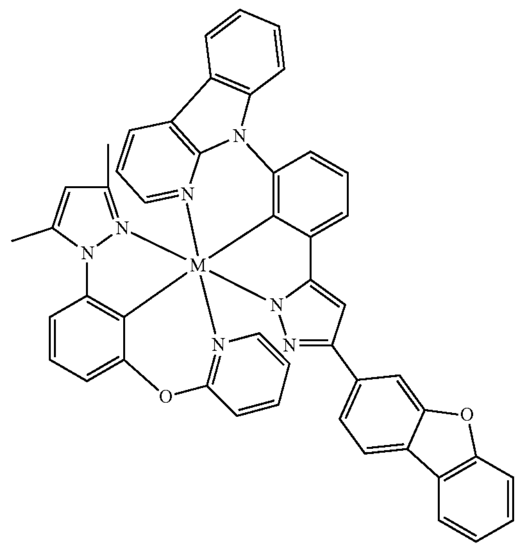
N
N
N
N
M
N
N
N
O
O
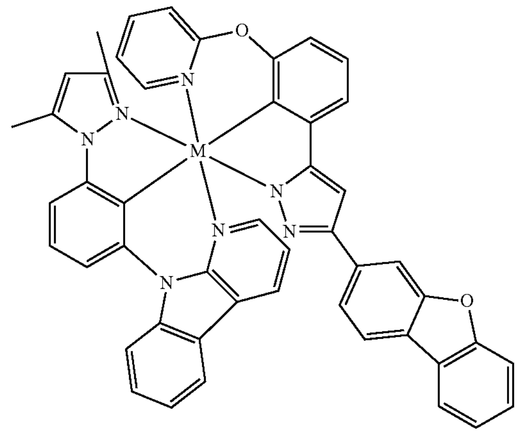
O
N
N
N
M
N
N
N
N
O -continued
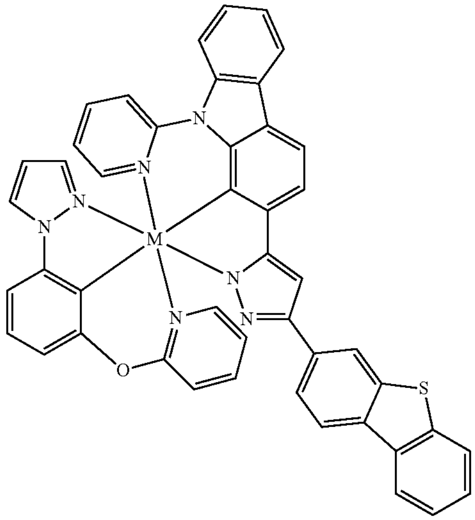
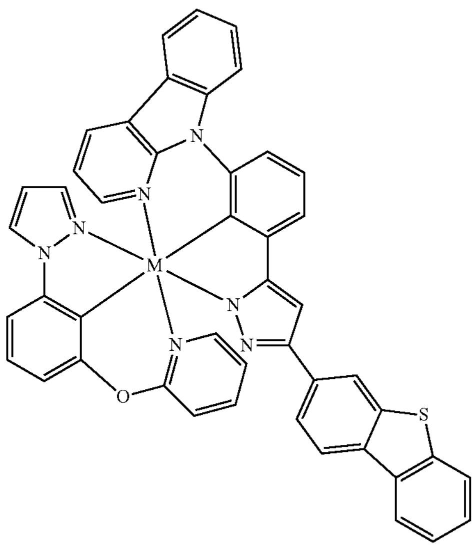
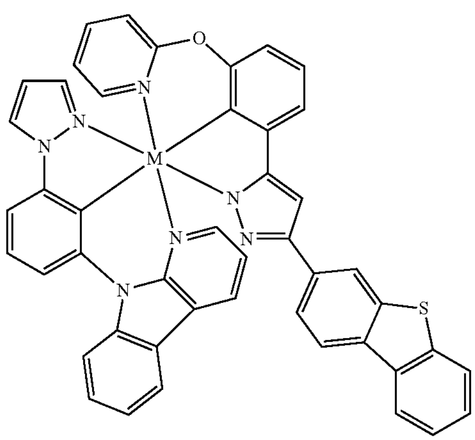
-continued
Structures M-22 (M = Ir, Rh)
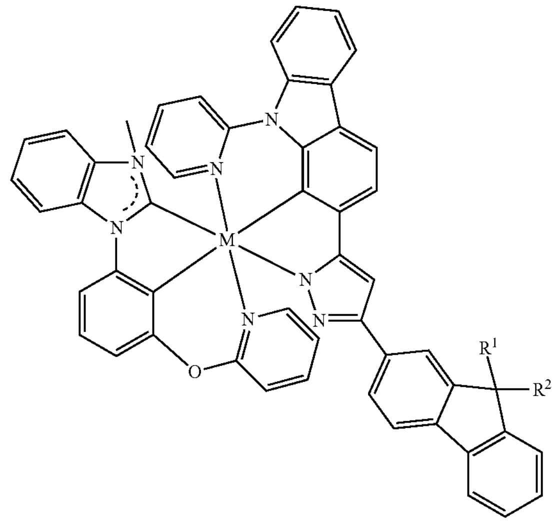
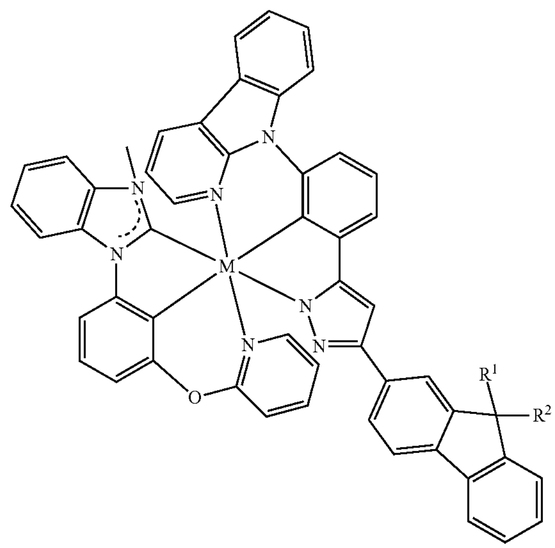
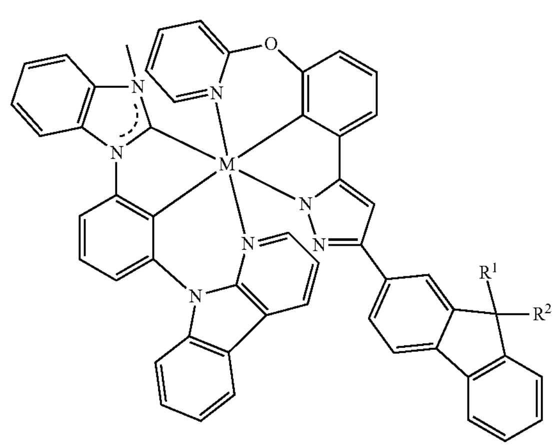

-continued
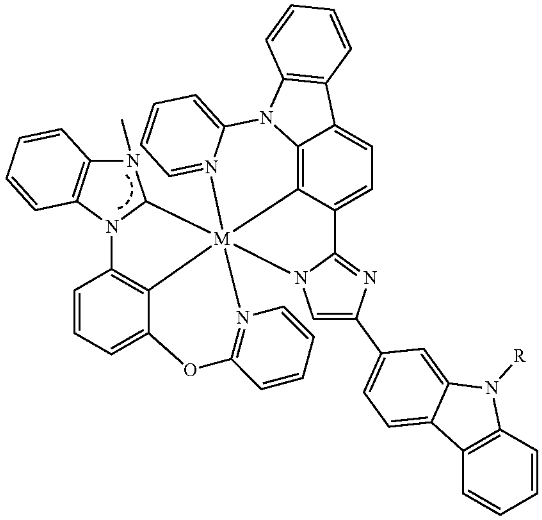
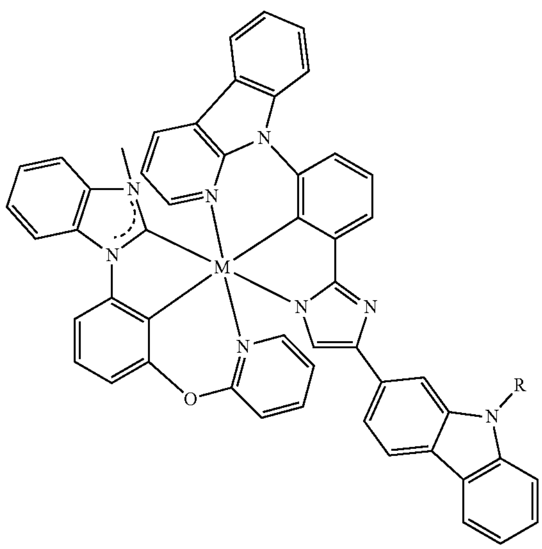
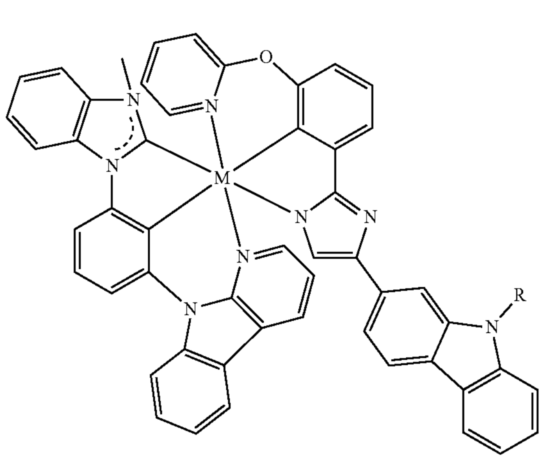
-continued
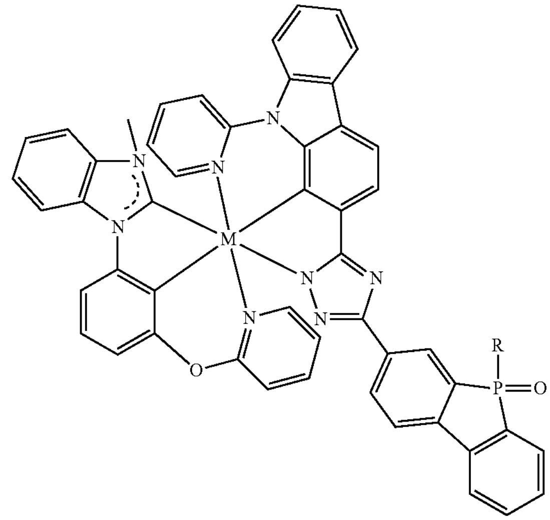
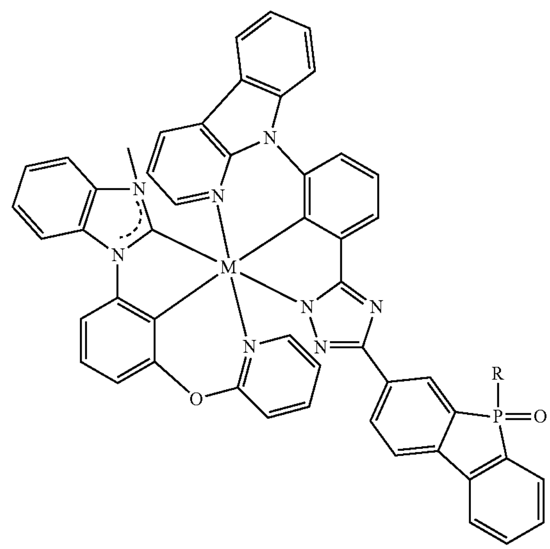
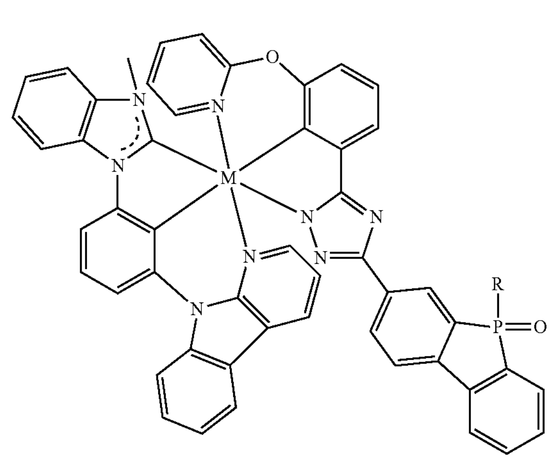

-continued
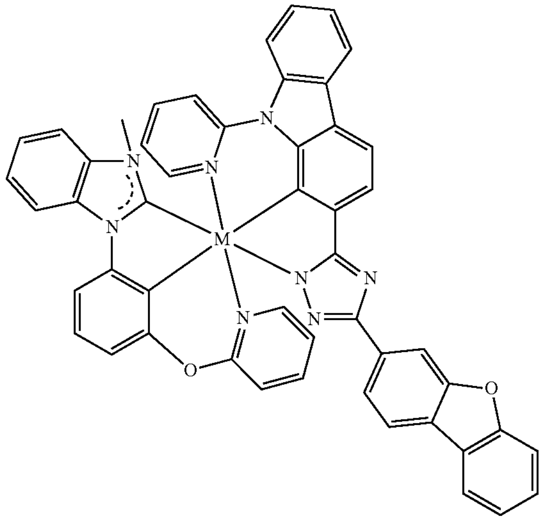
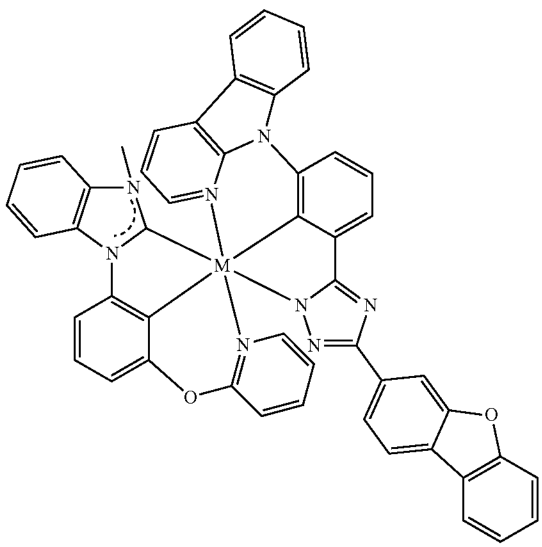
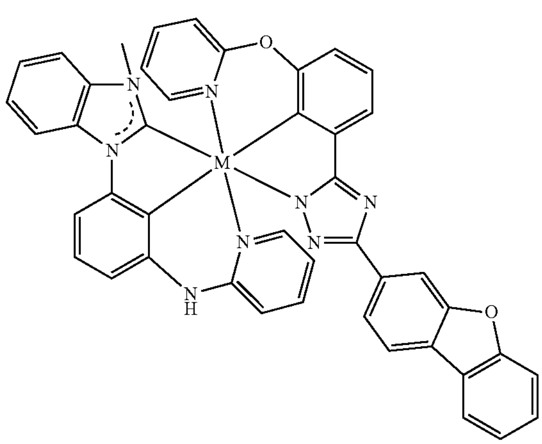
-continued
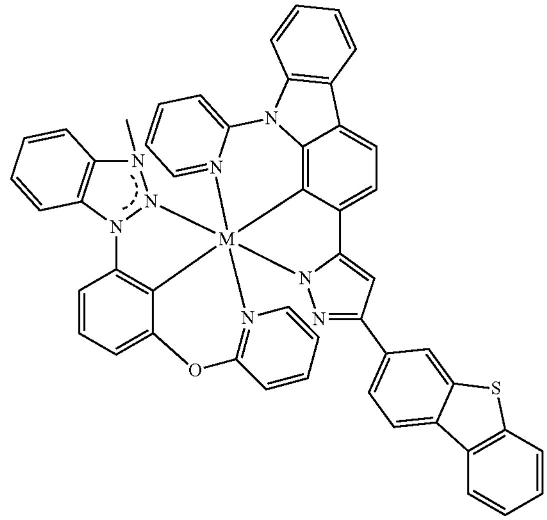
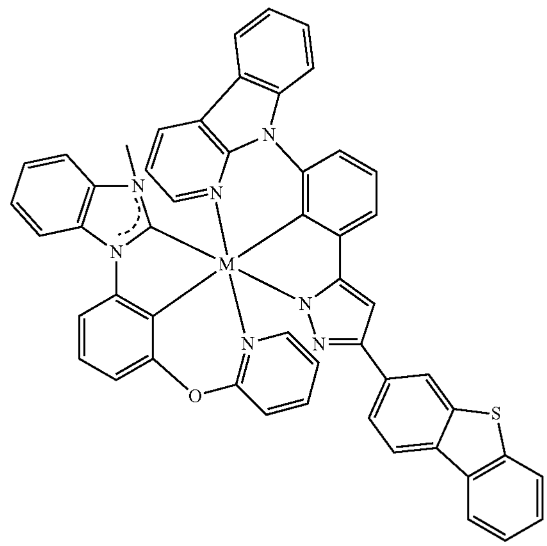
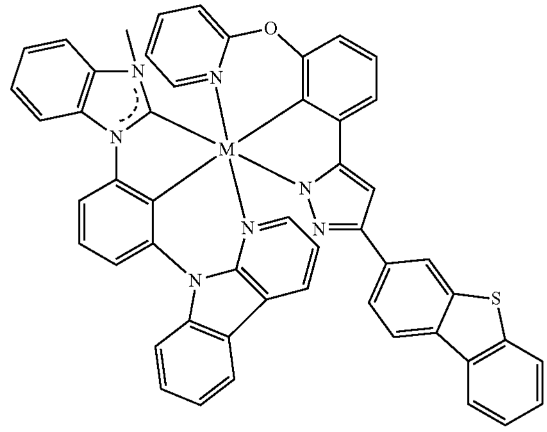

-continued
Structures M-23 (M = Ir, Rh)
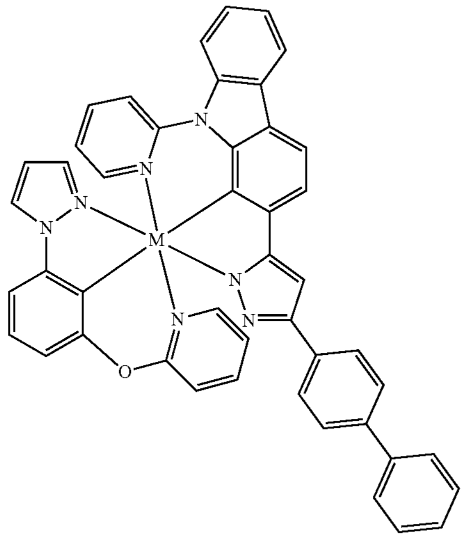
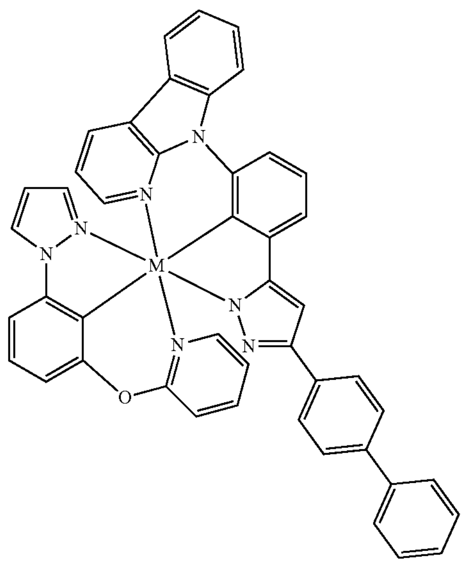
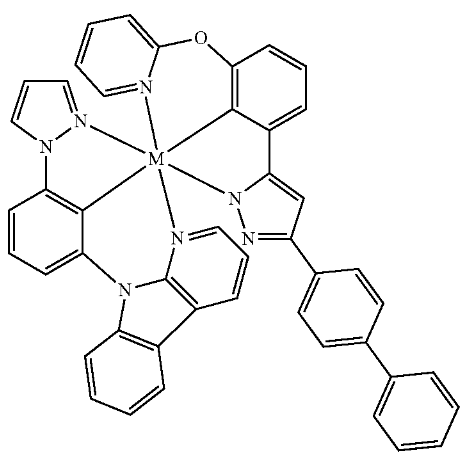
-continued
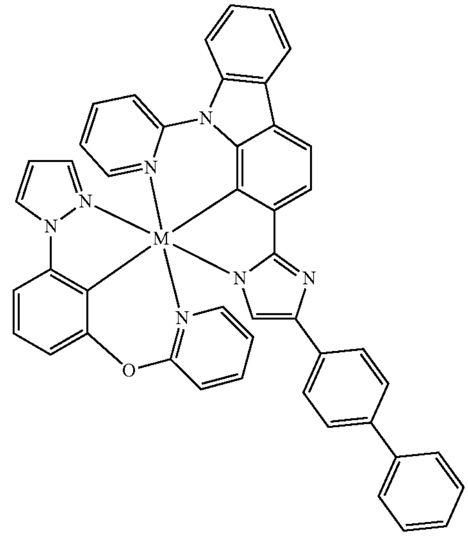
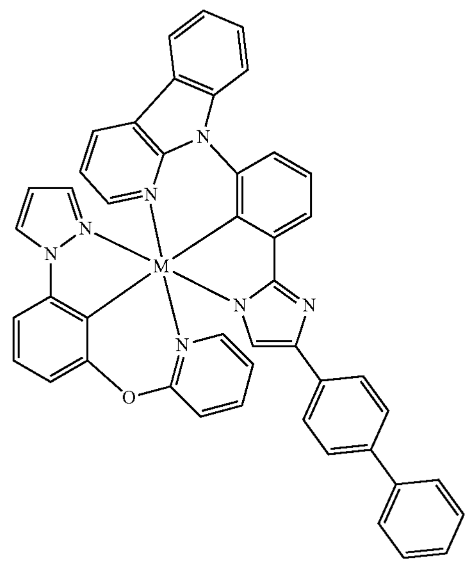
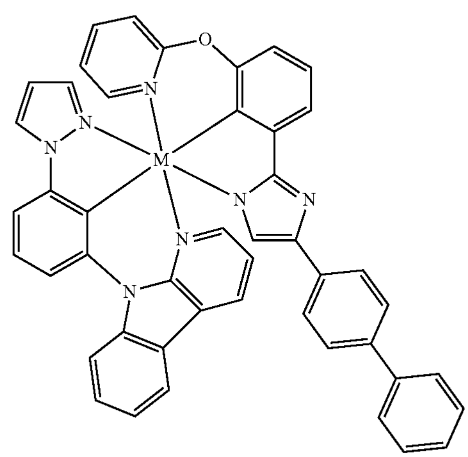

-continued
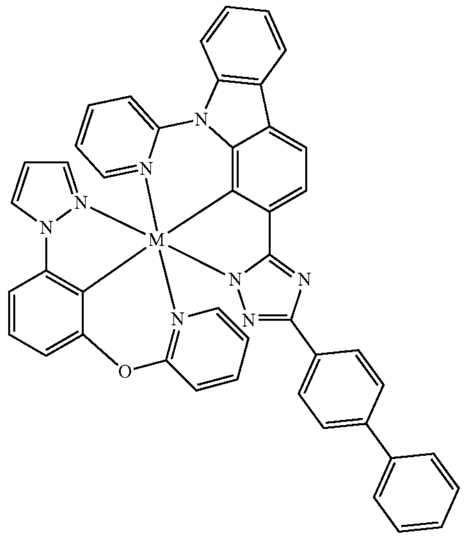
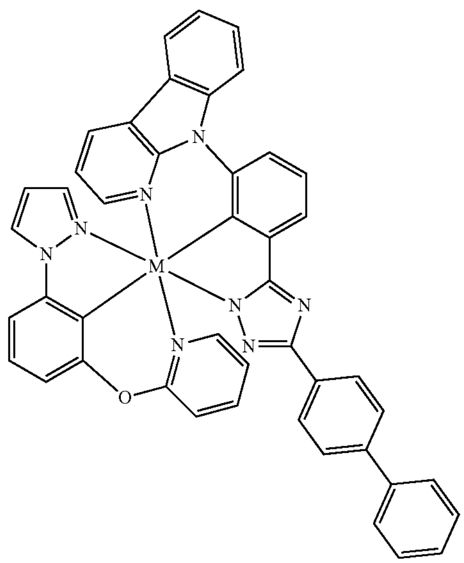
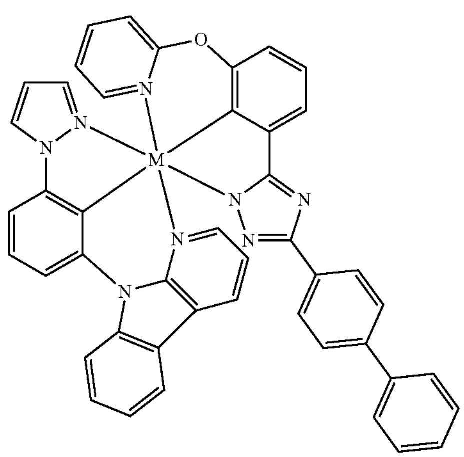
-continued
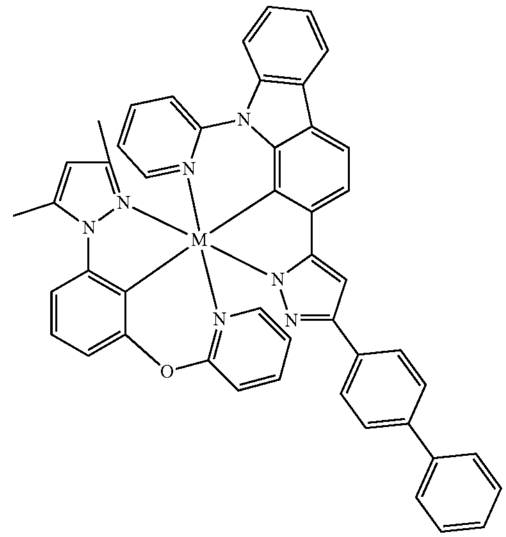
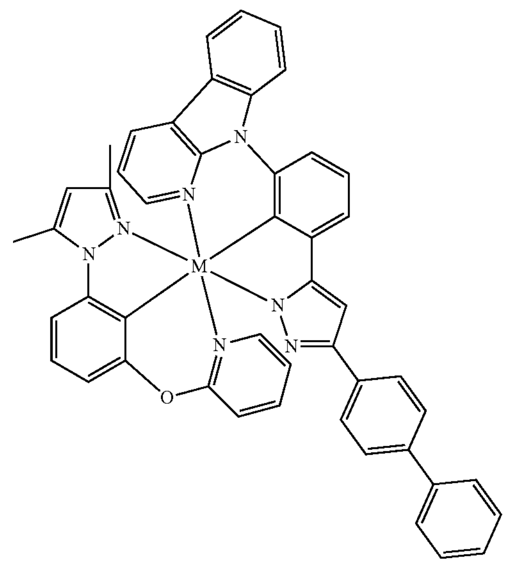
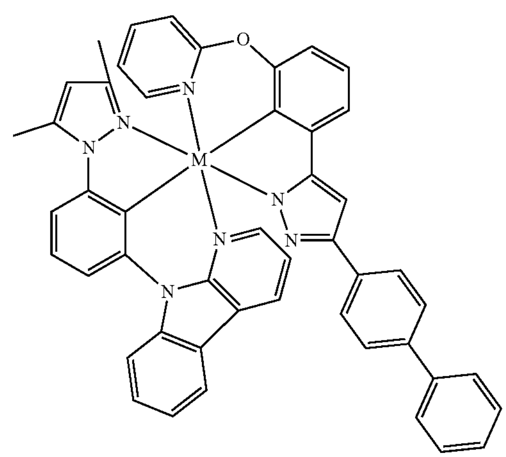

-continued
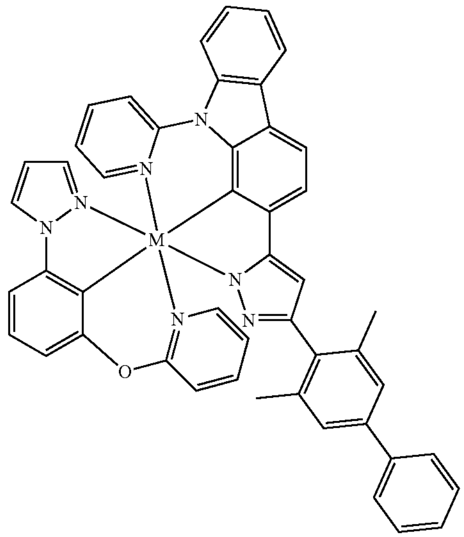
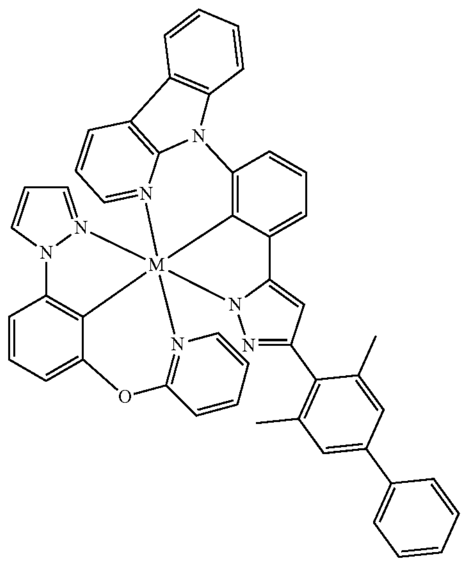
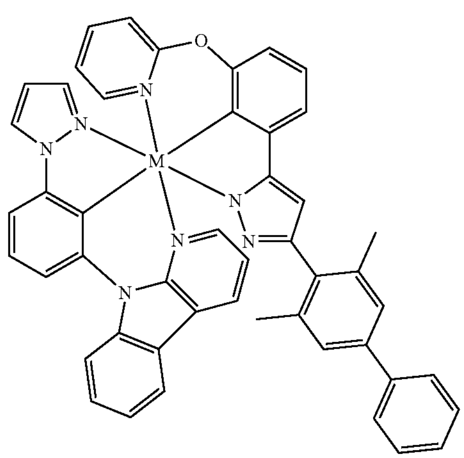
-continued
Structures M-24 (M = Ir, Rh)
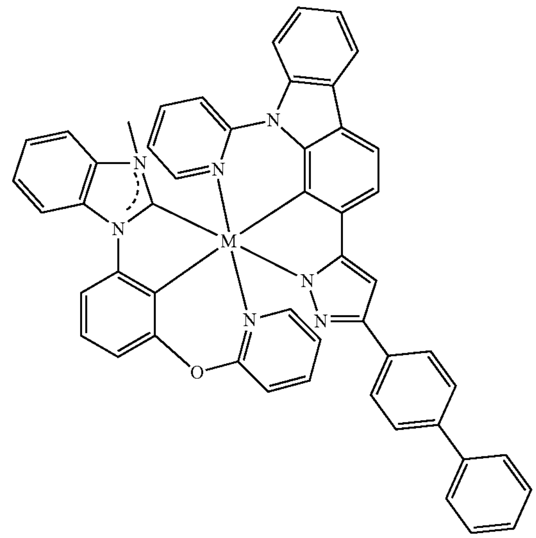
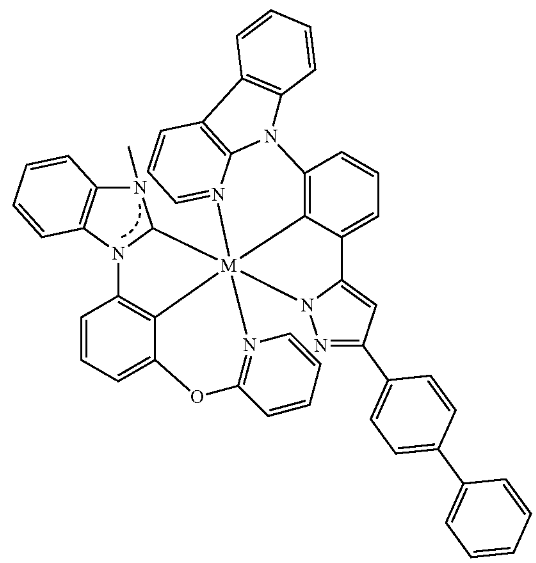
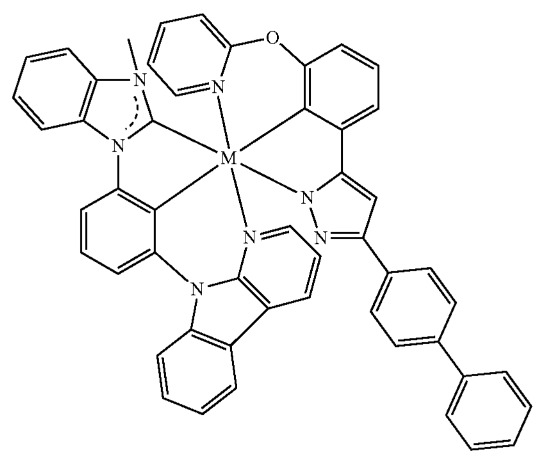

-continued
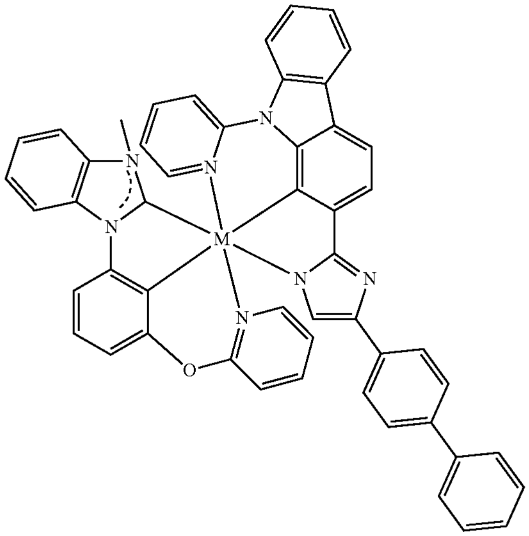
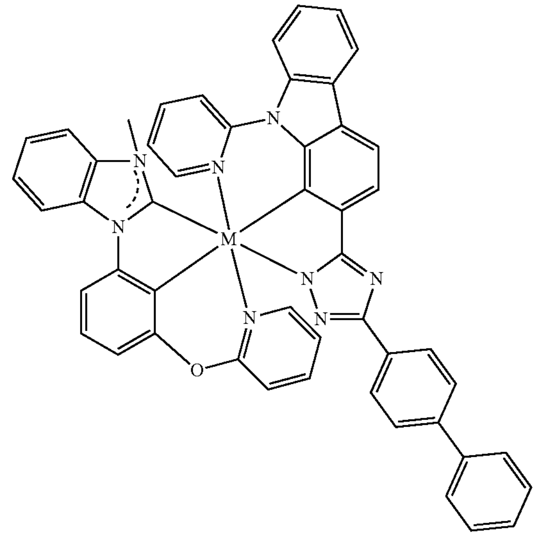
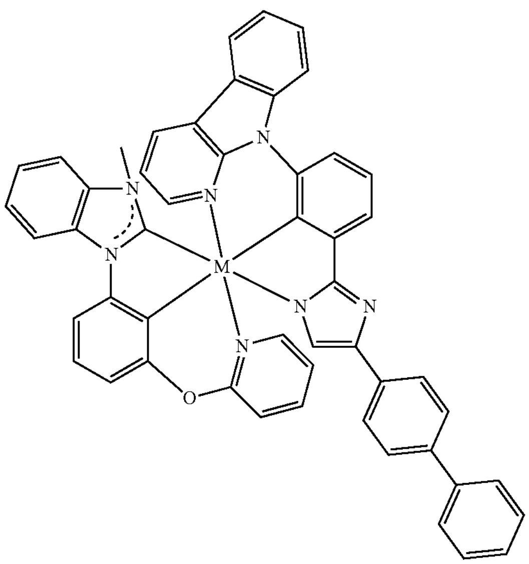
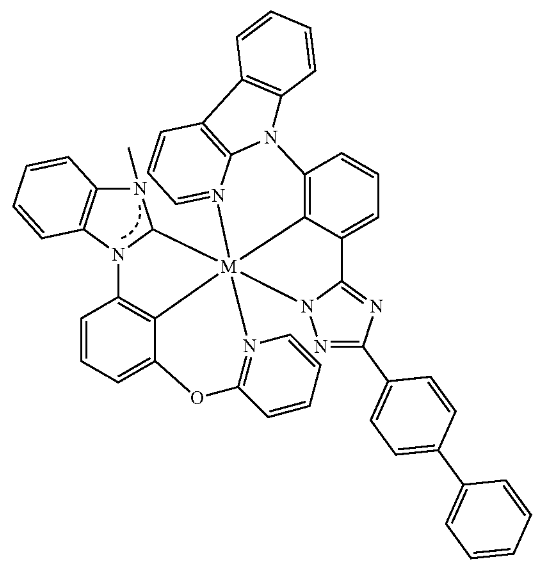
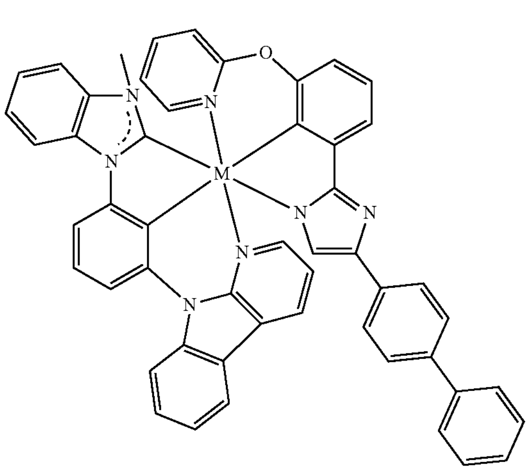
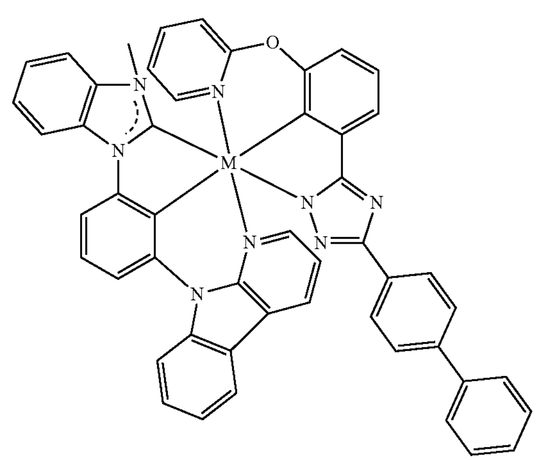
-continued

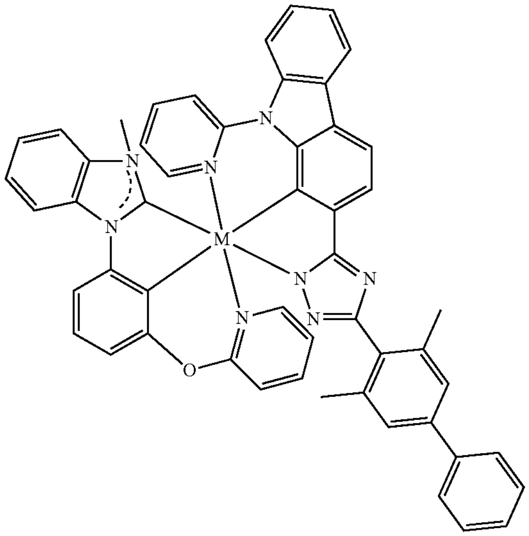
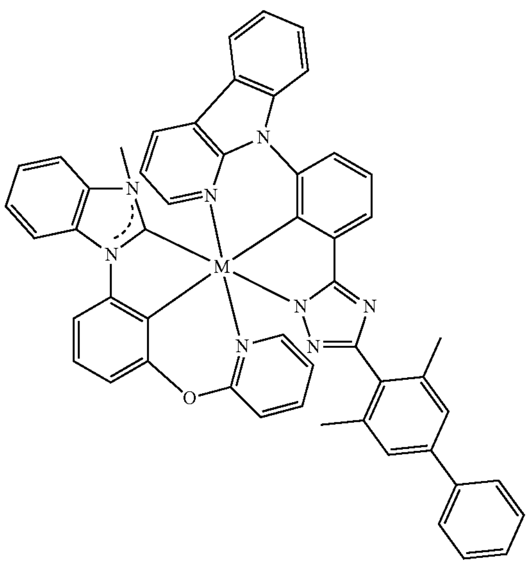
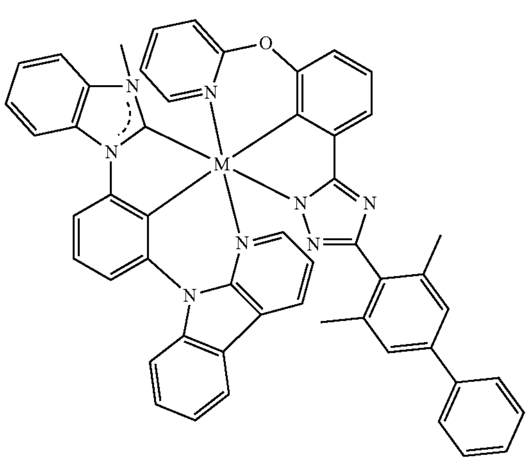
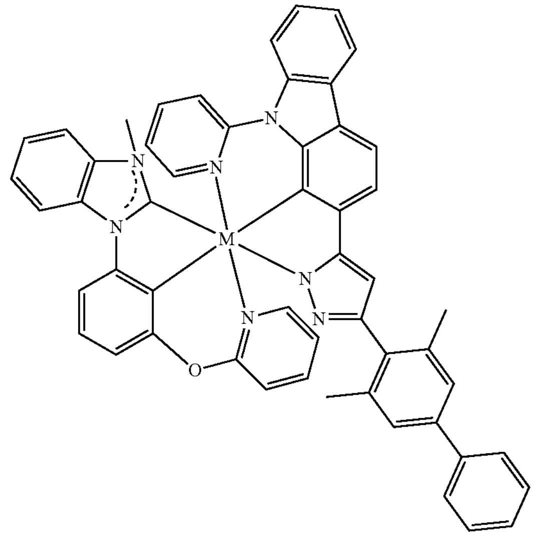
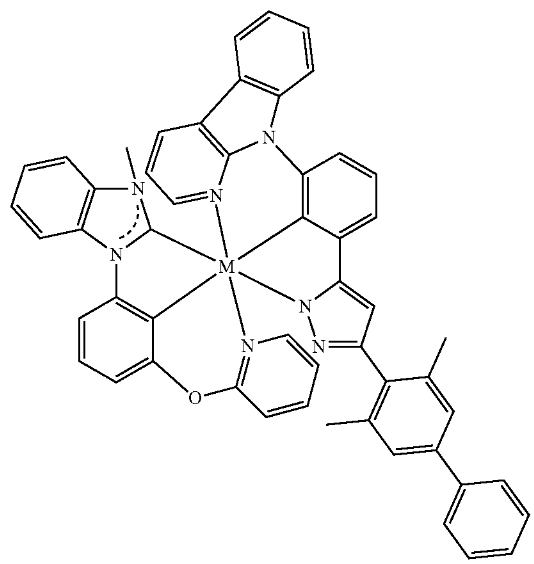
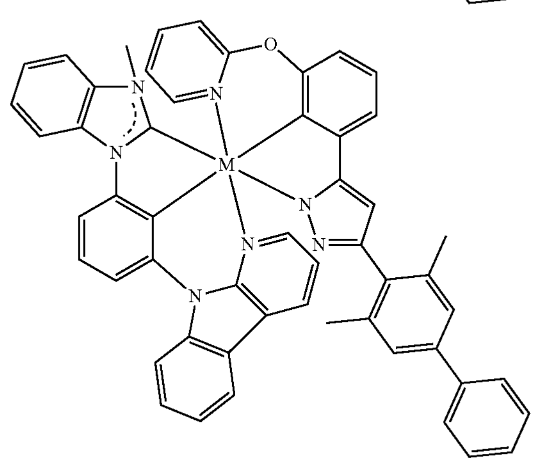

-continued
Structures M-25 (M = Ir, Rh)
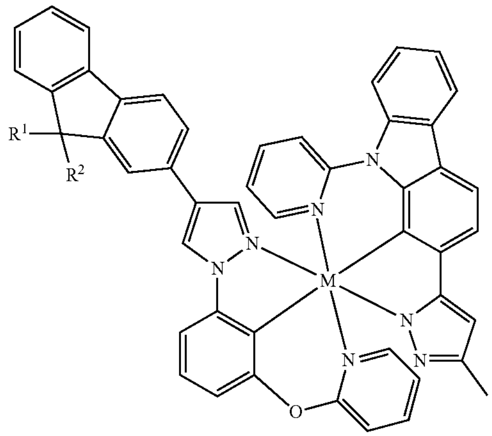
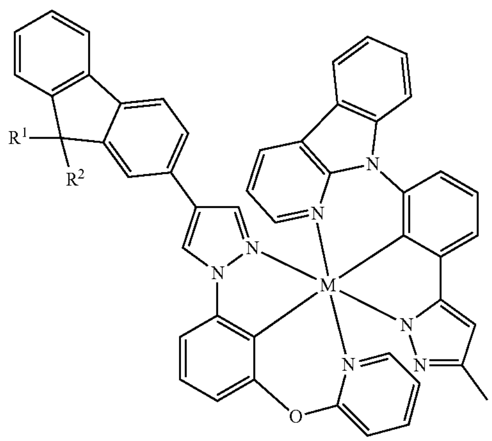
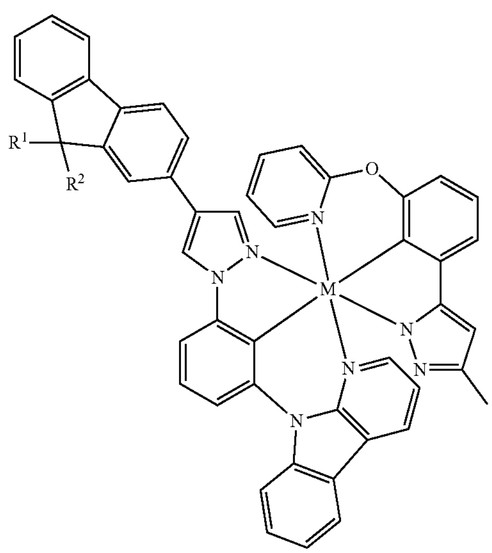
-continued
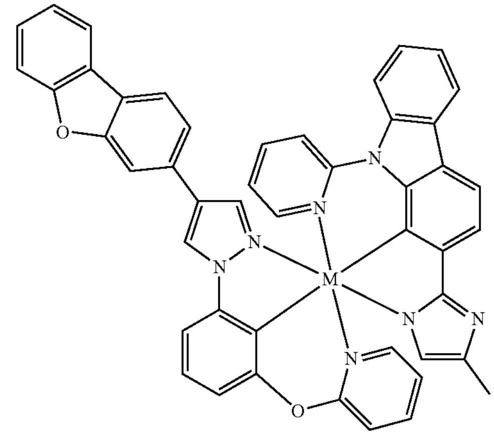
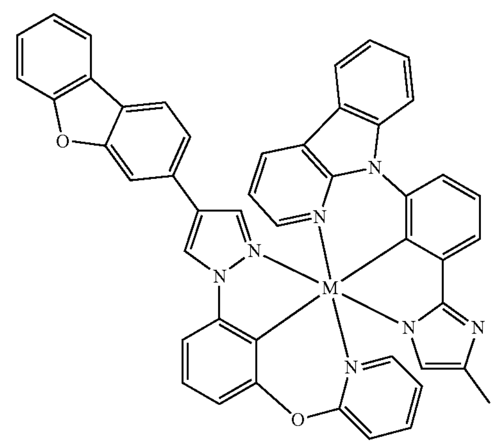
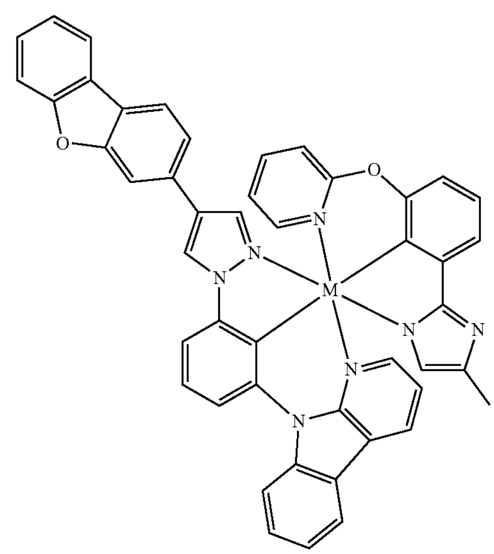

-continued
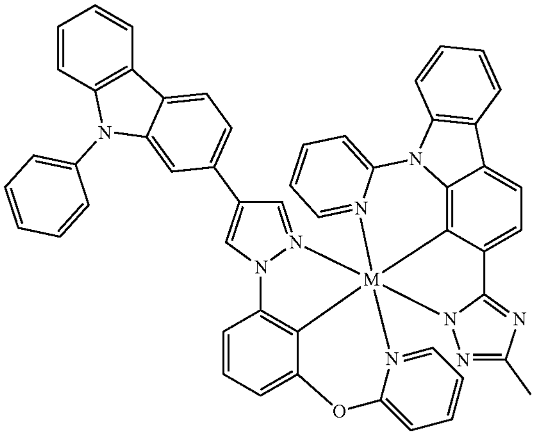
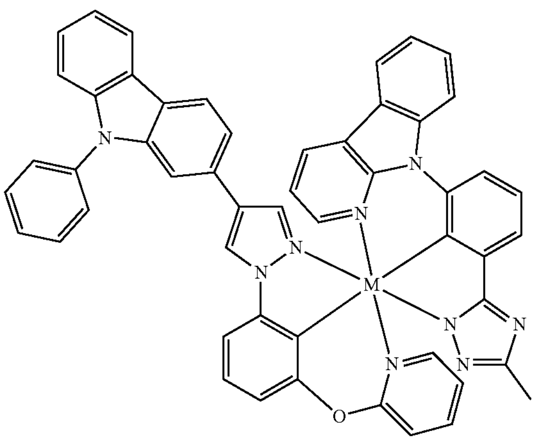
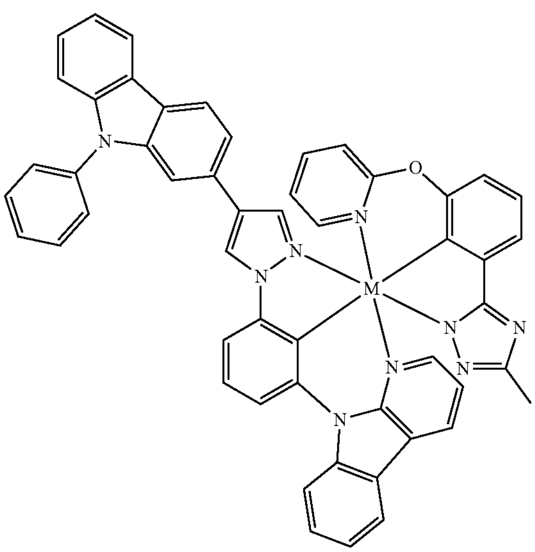
-continued
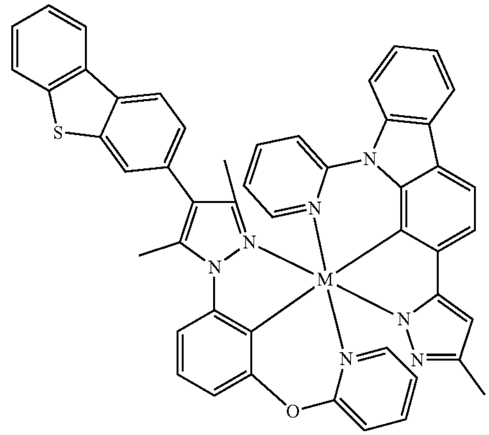
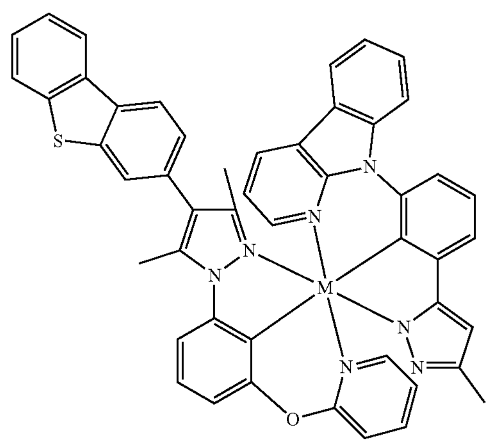
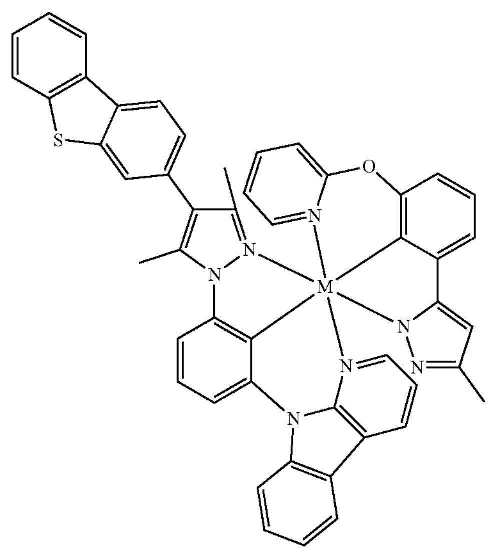

-continued
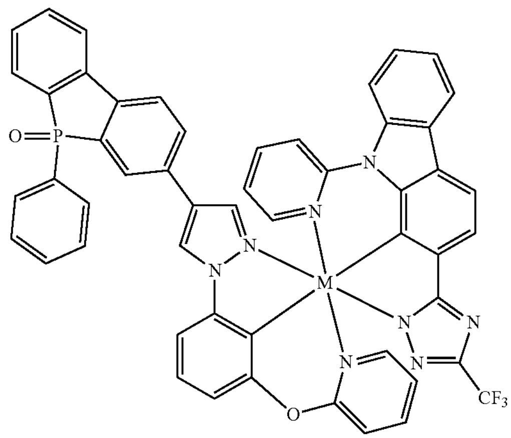
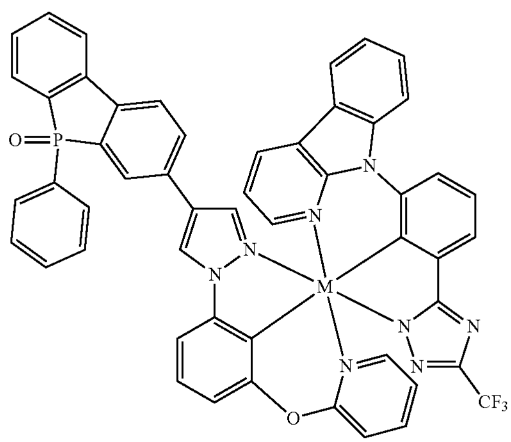
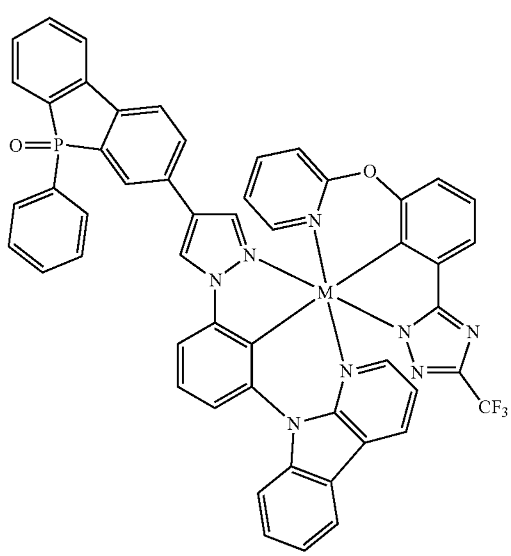
-continued
Structures M-26 (M = Ir, Rh)
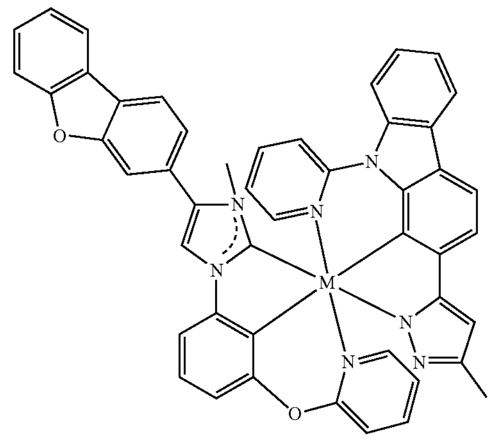
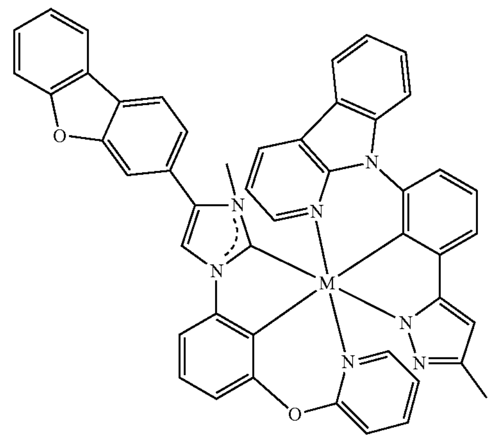
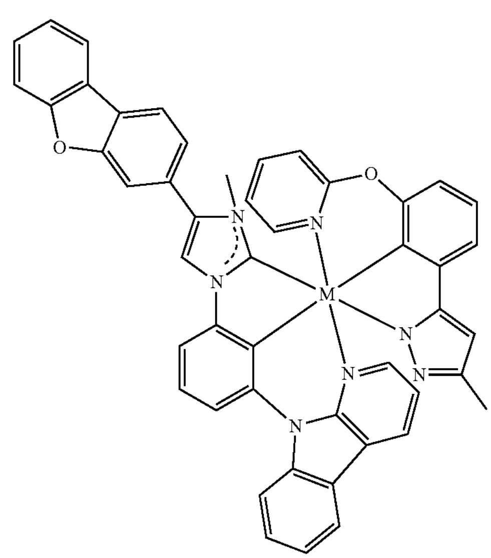

-continued
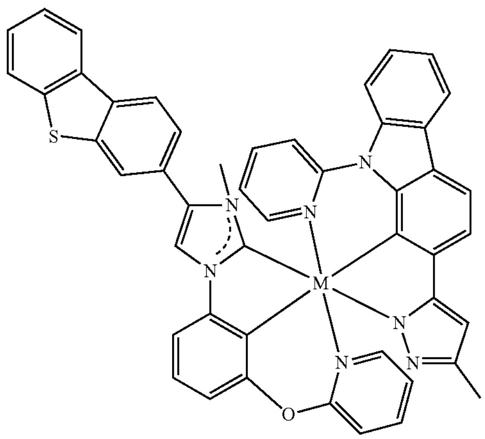
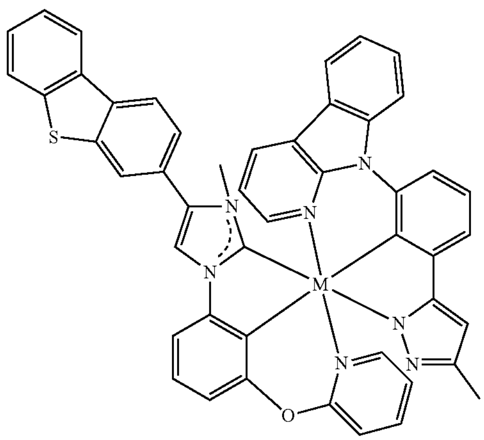
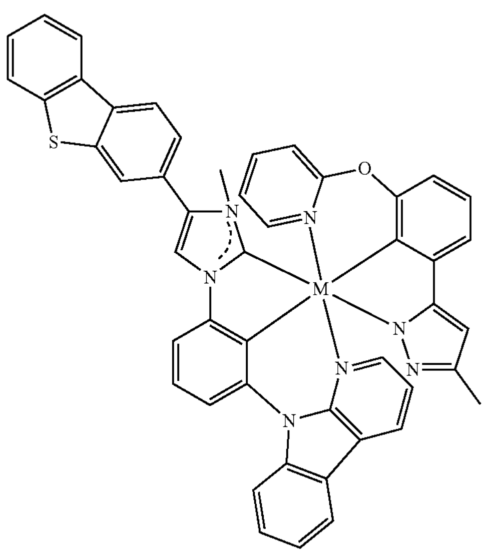
-continued
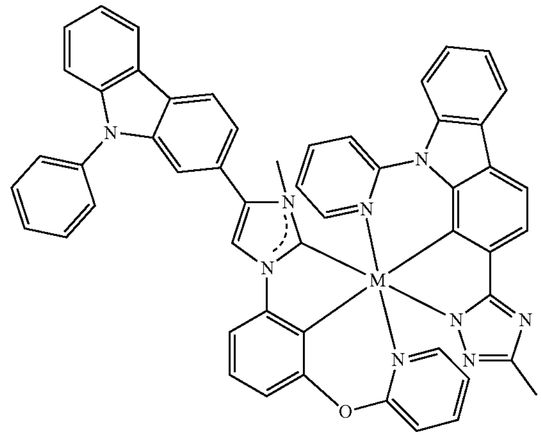
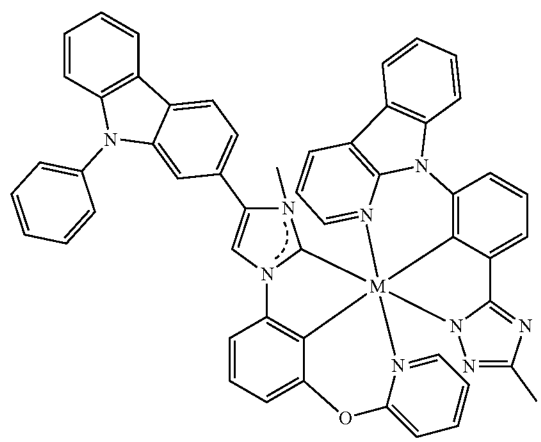
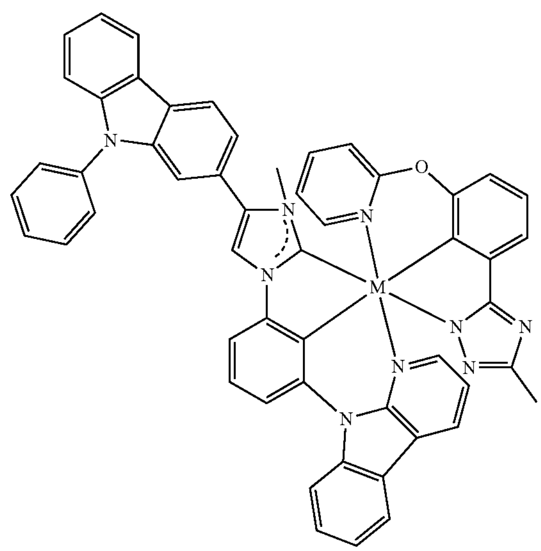

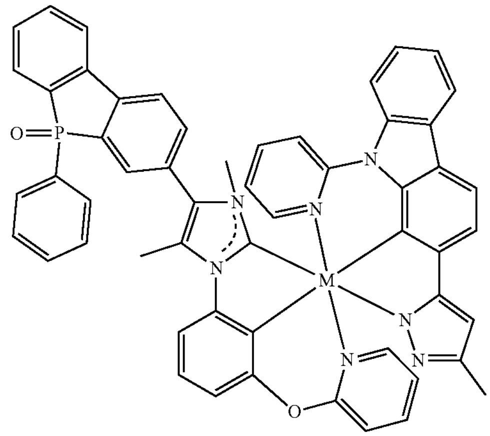
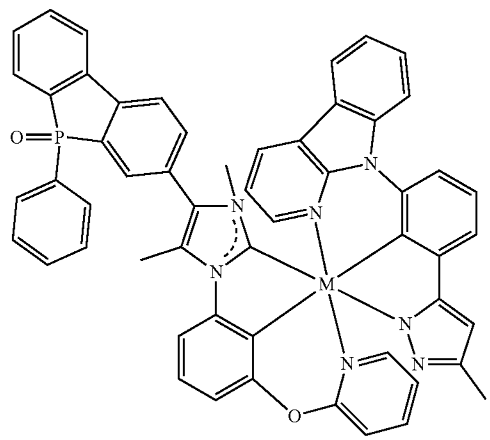
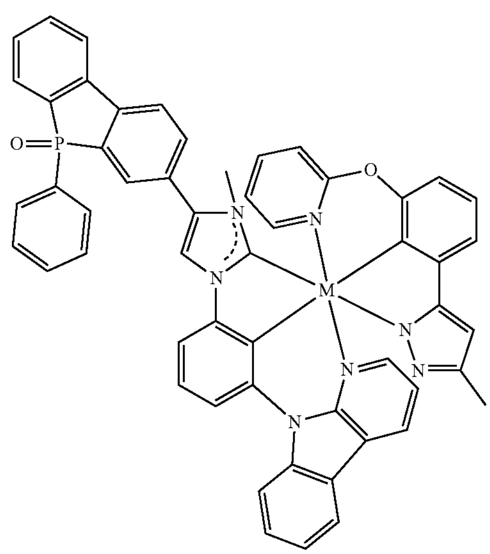
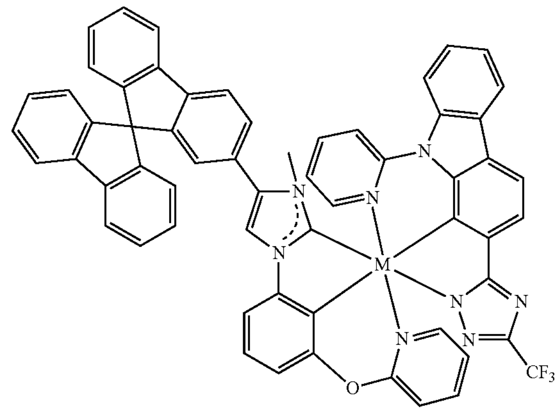
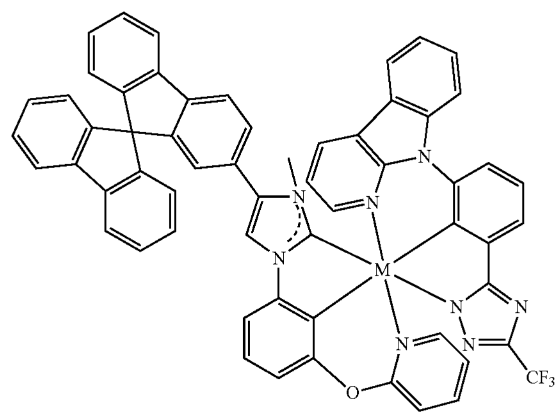
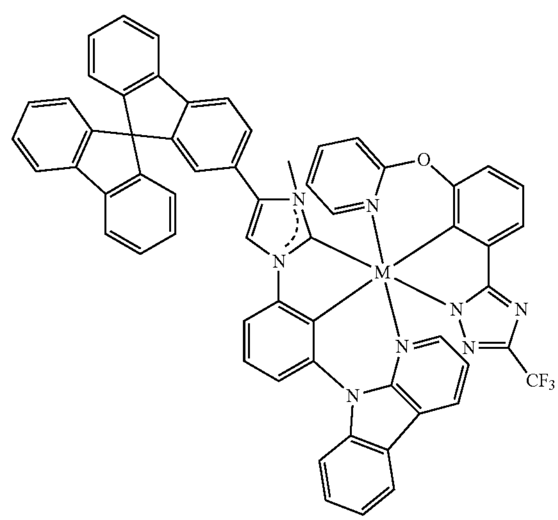

-continued
Structures M-27 (M = Ir, Rh)
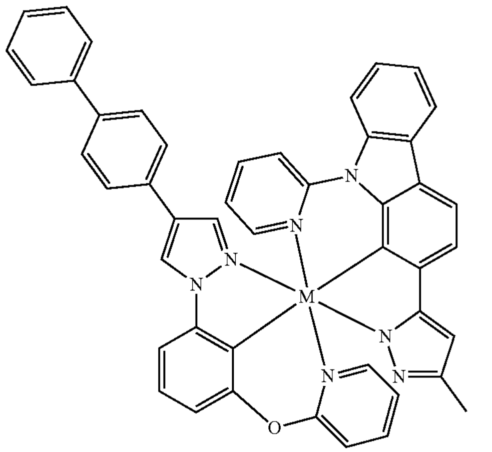
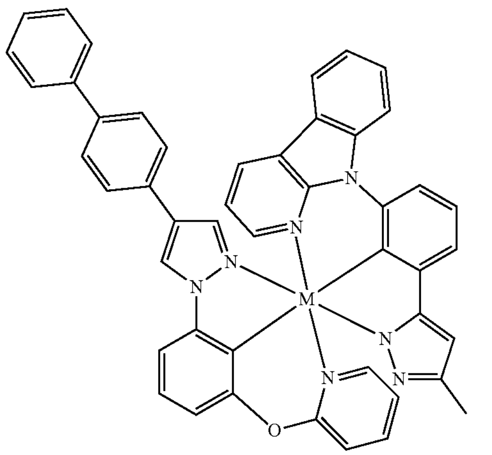
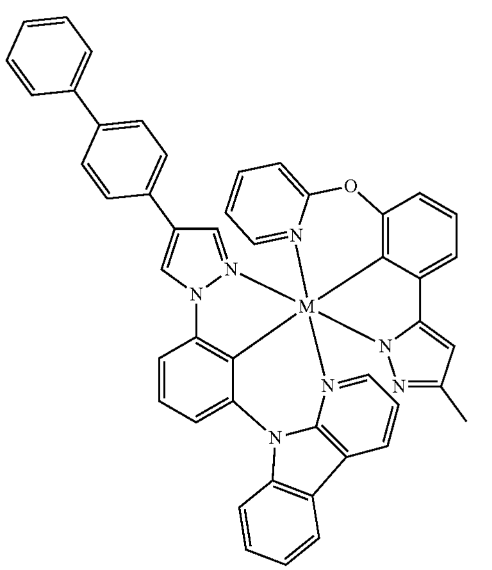
-continued
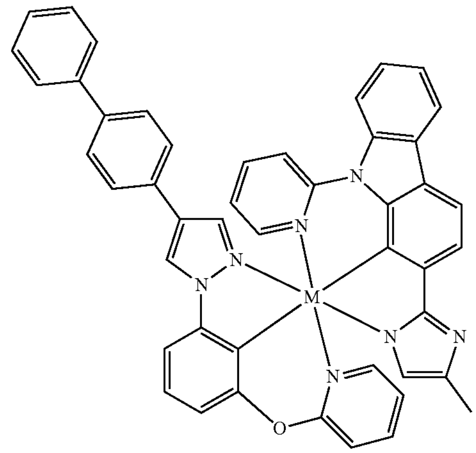
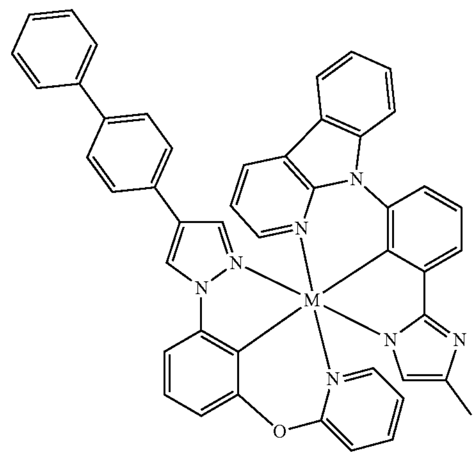
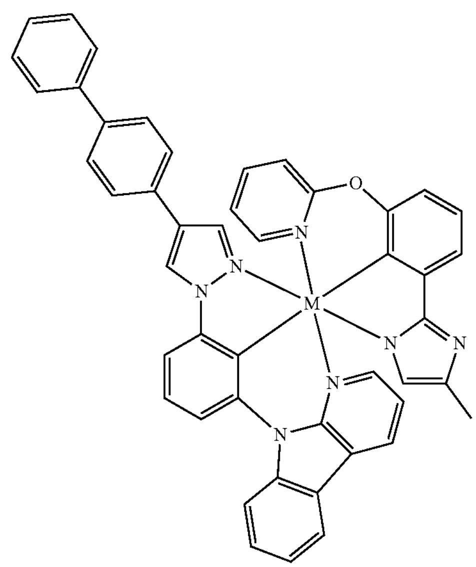

-continued
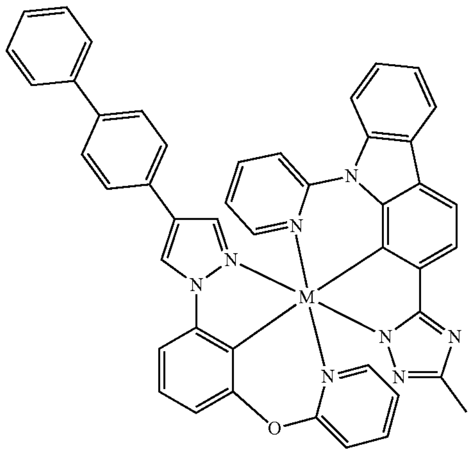
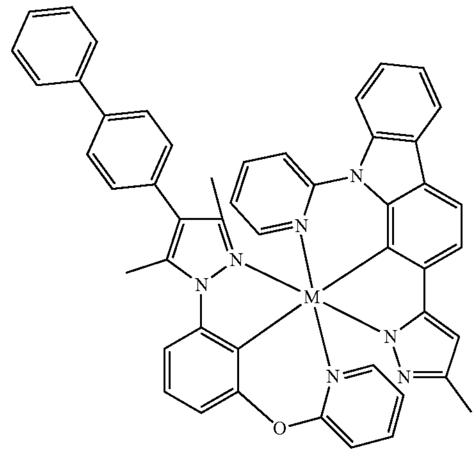
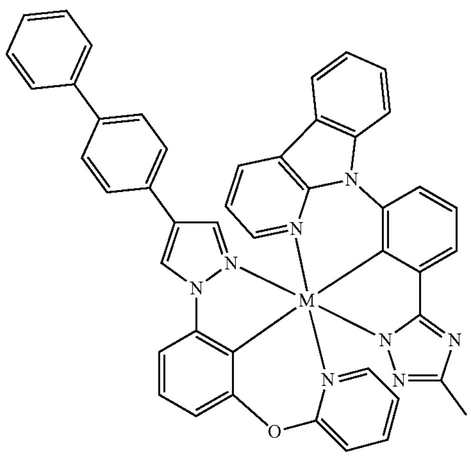
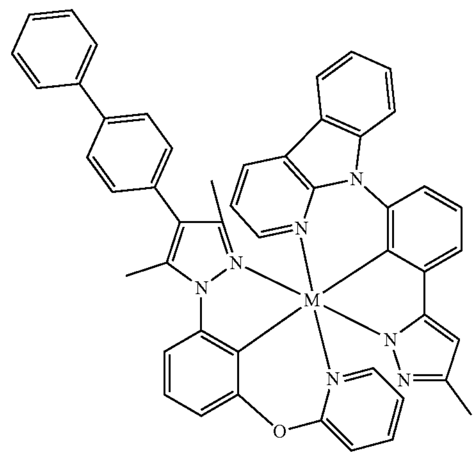
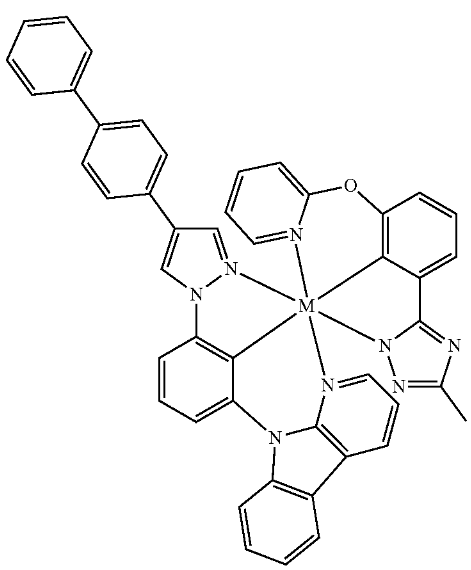
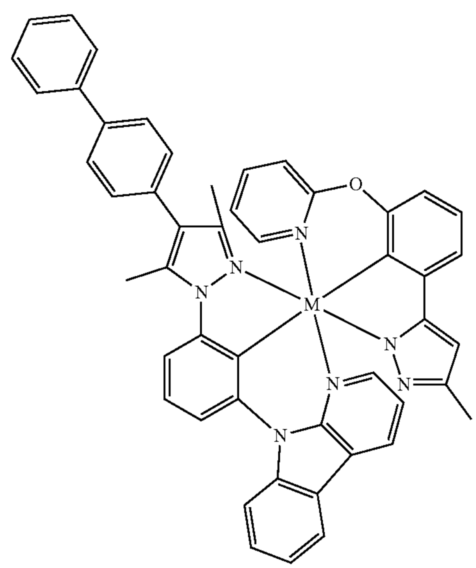
-continued -continued
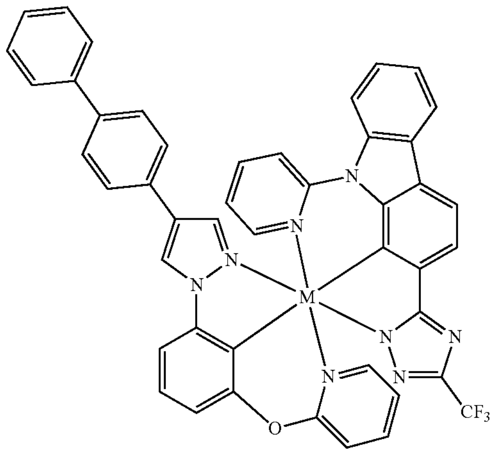
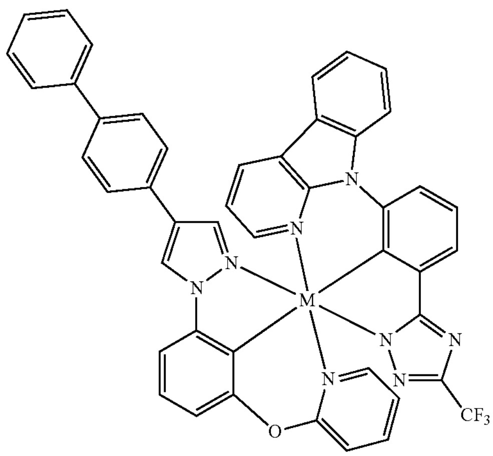
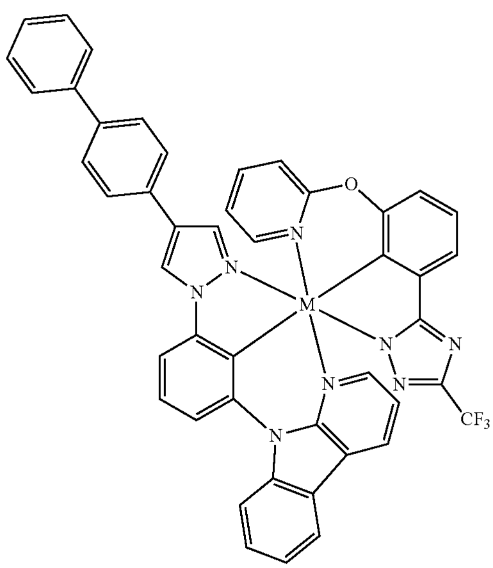
-continued
Structures M-28 (M = Ir, Rh)
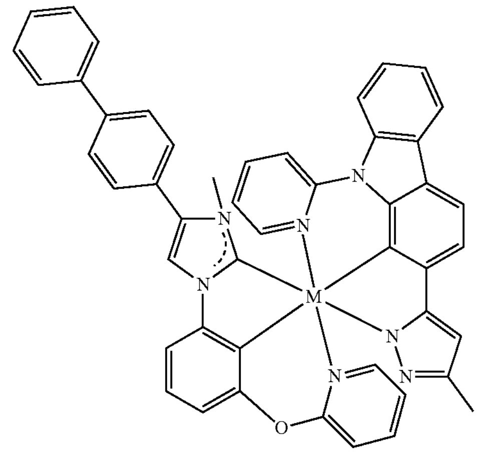
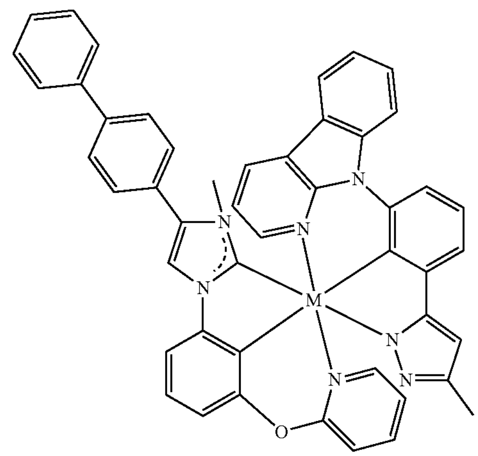
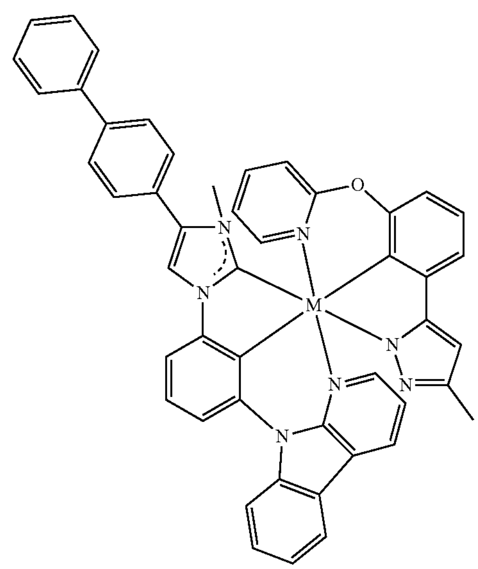

-continued
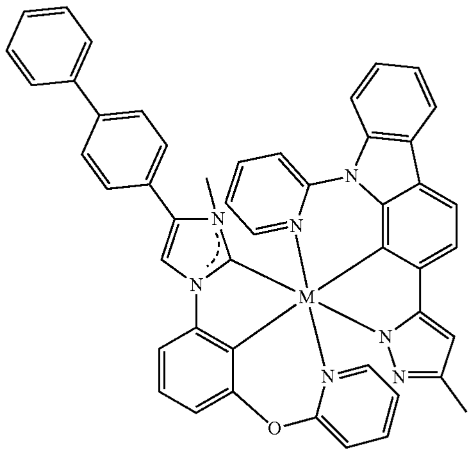
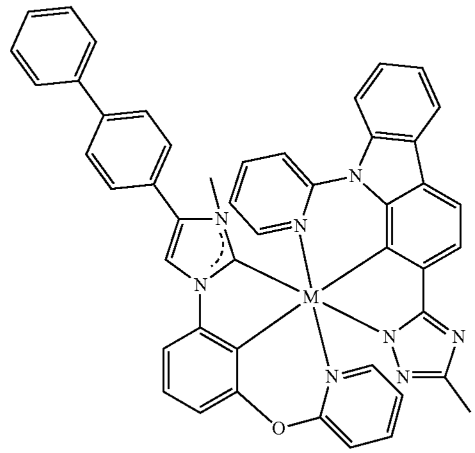
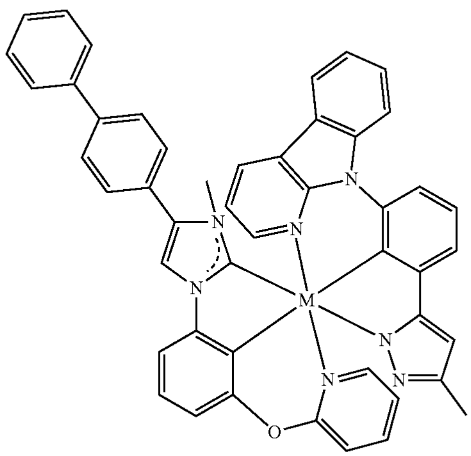
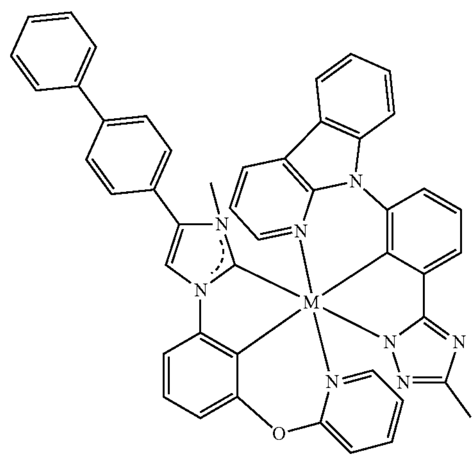
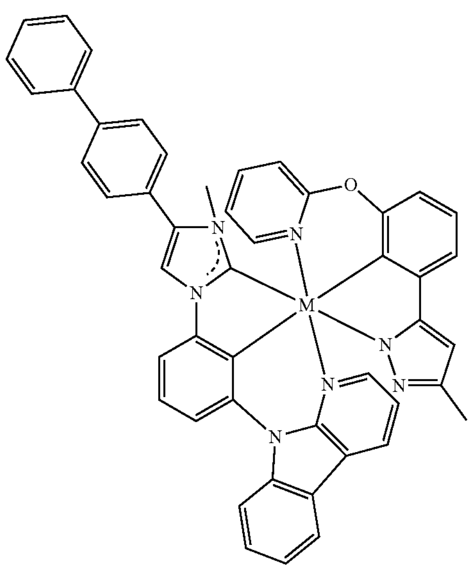
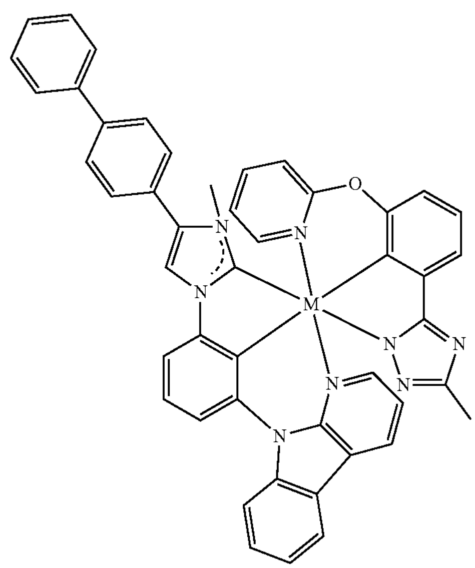
-continued -continued
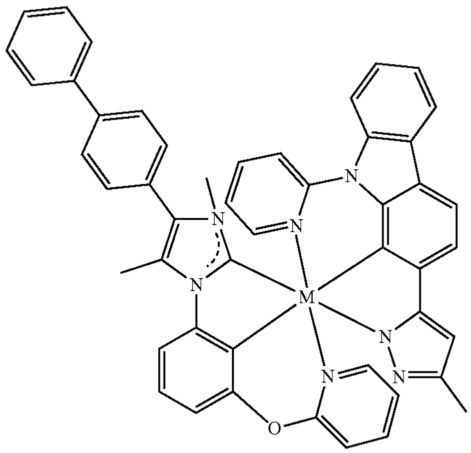
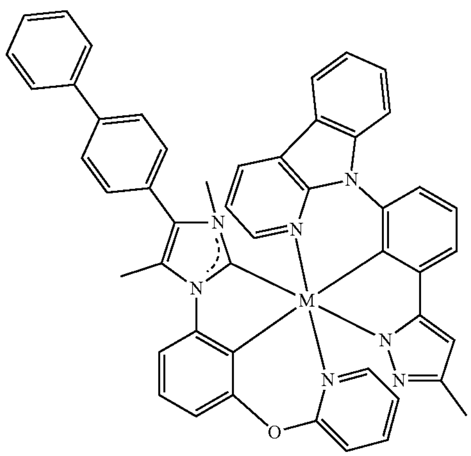
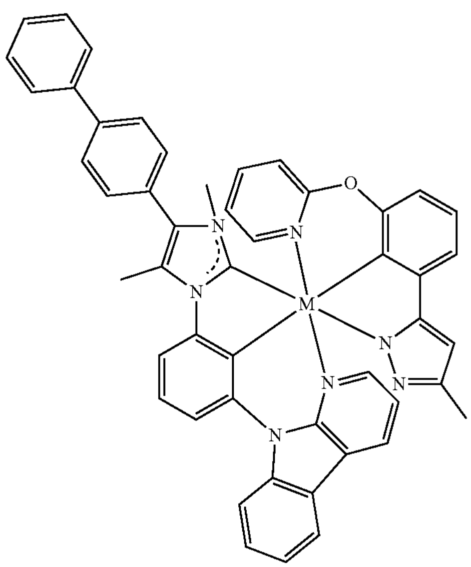
-continued
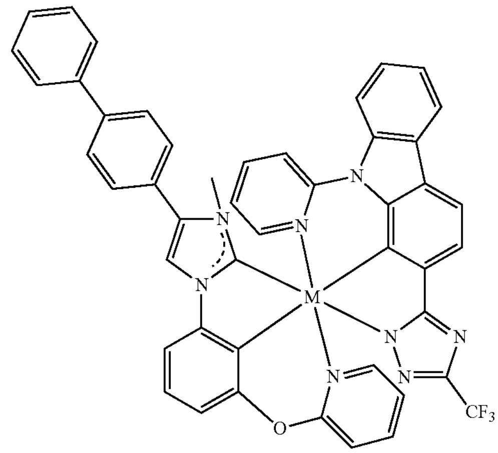
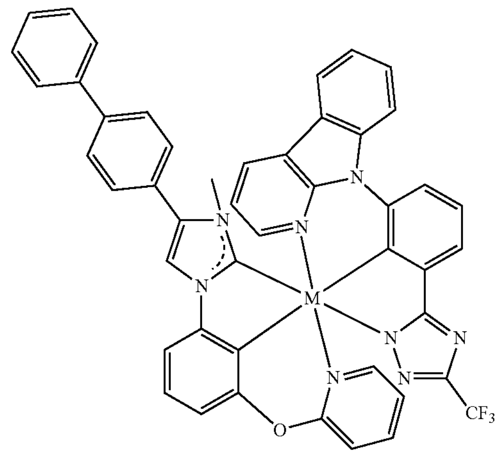
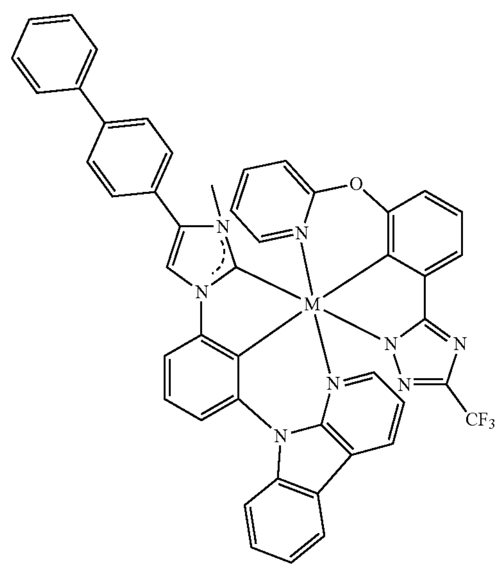

-continued
Structures M-29 (M = Ir, Rh)
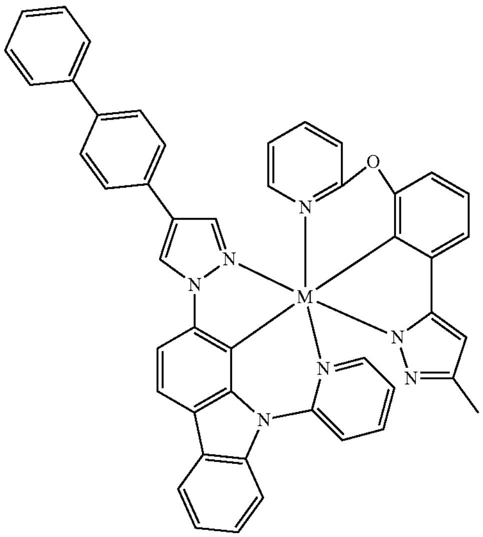
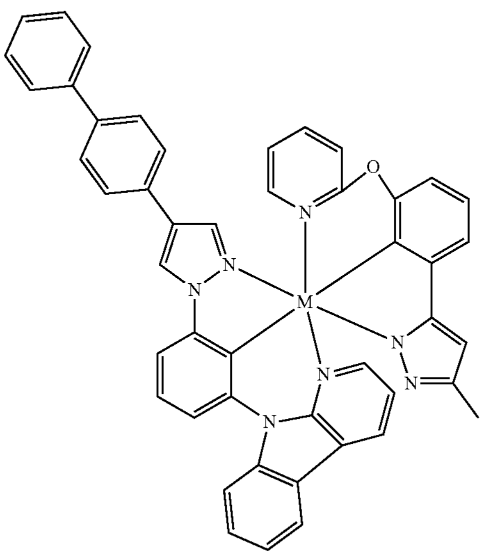
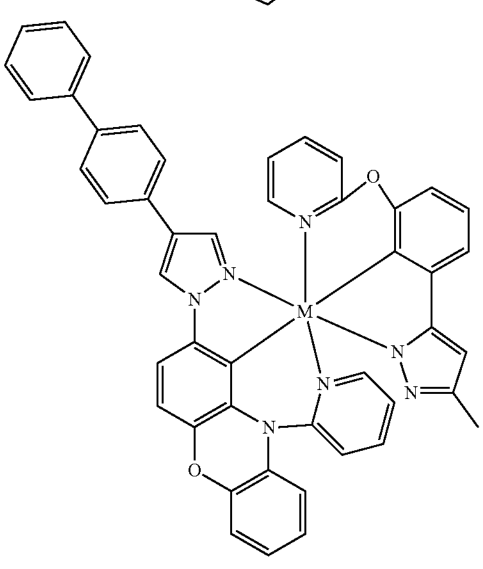
-continued
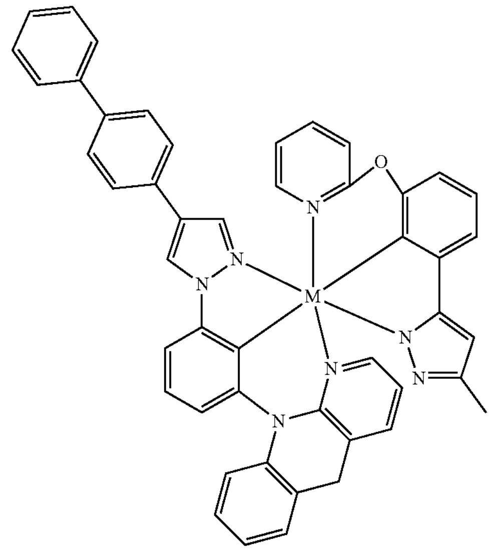
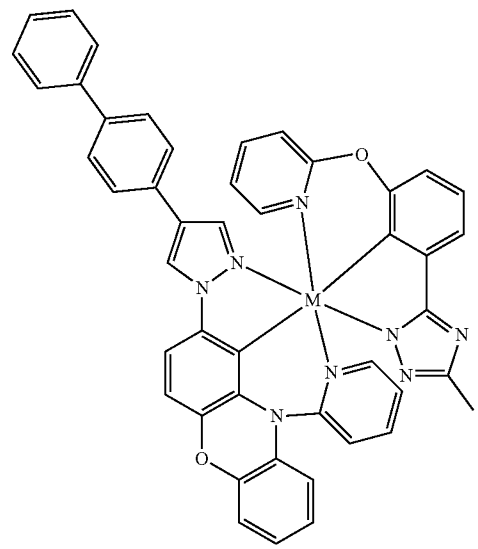
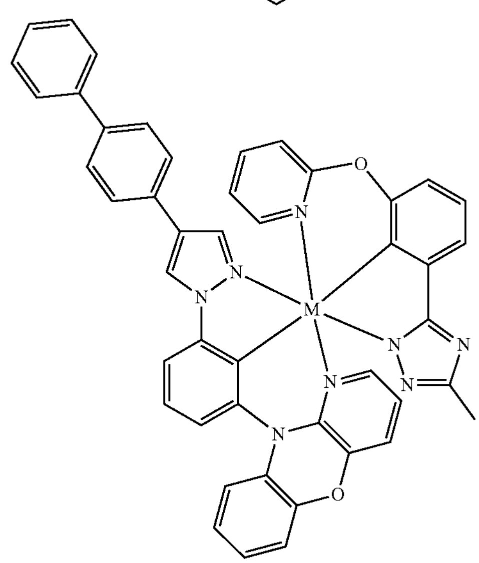

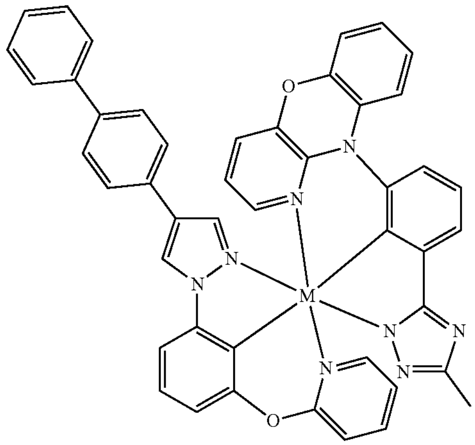
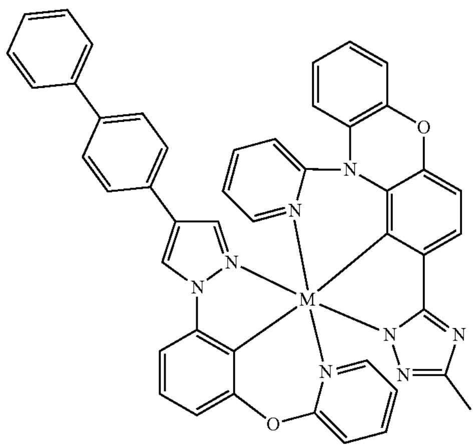
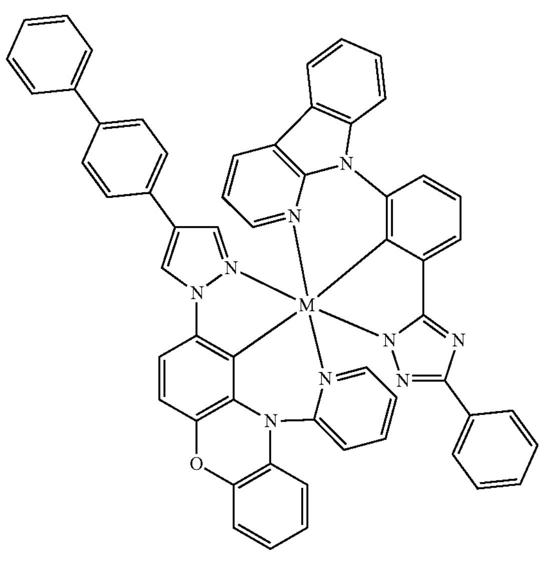
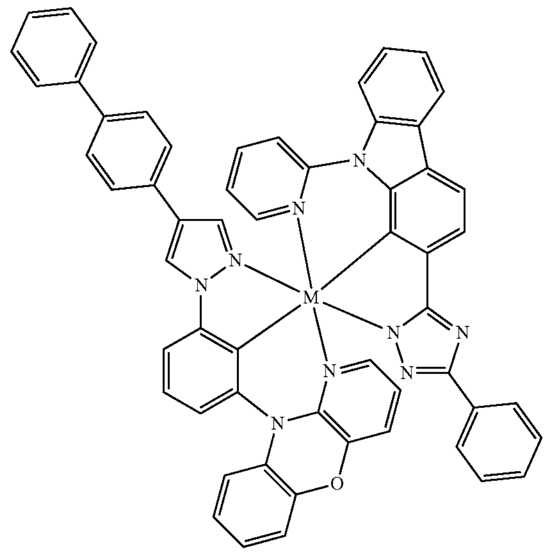
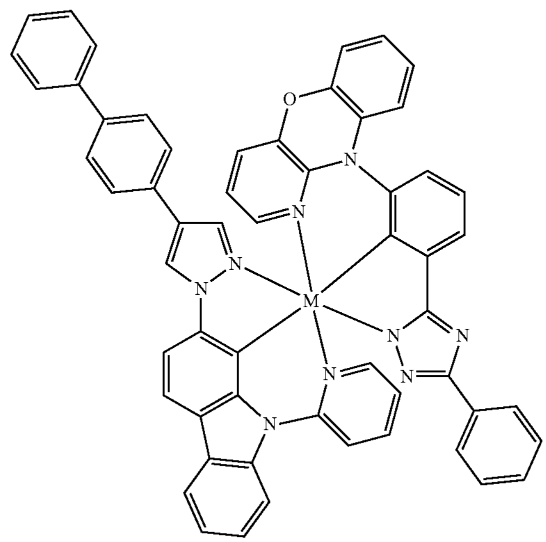
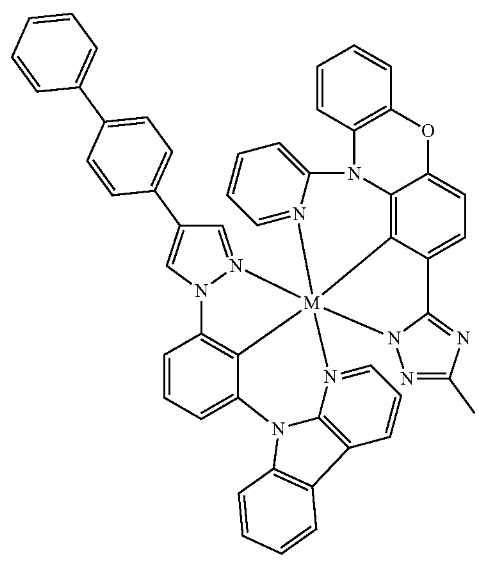

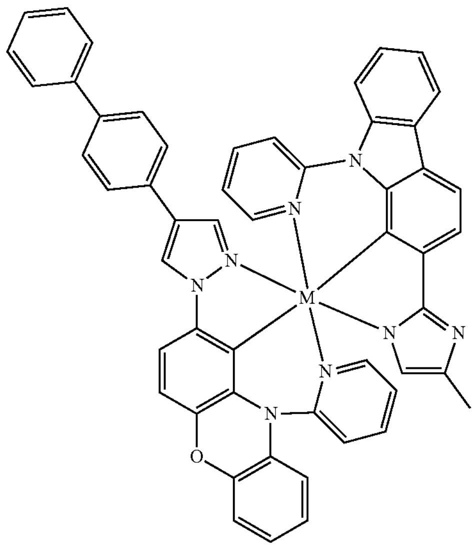
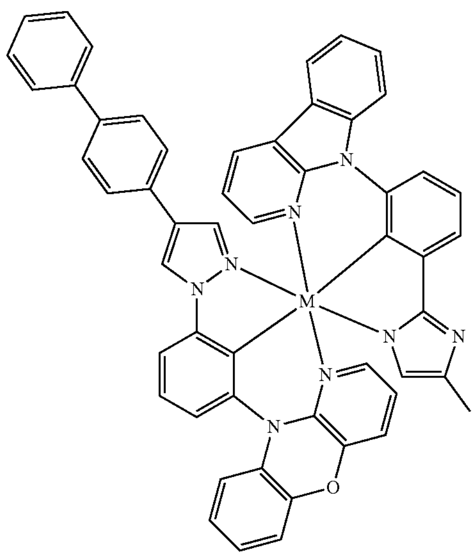
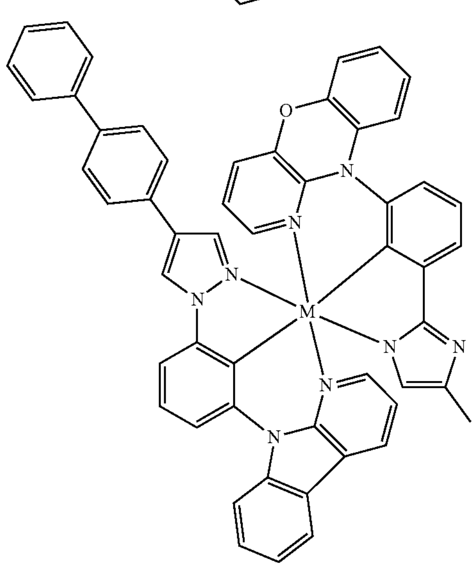
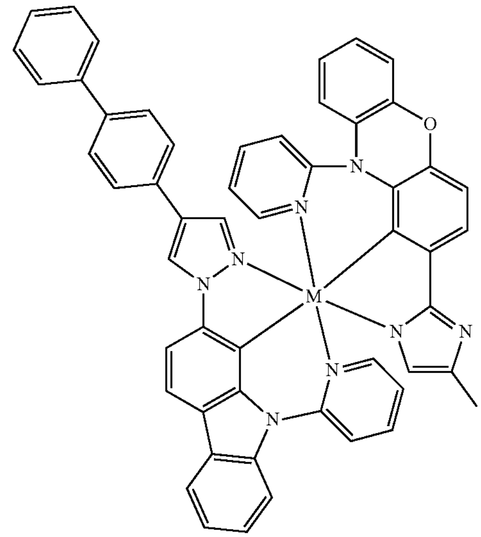
Structures M-30 (M = Ir, Rh)
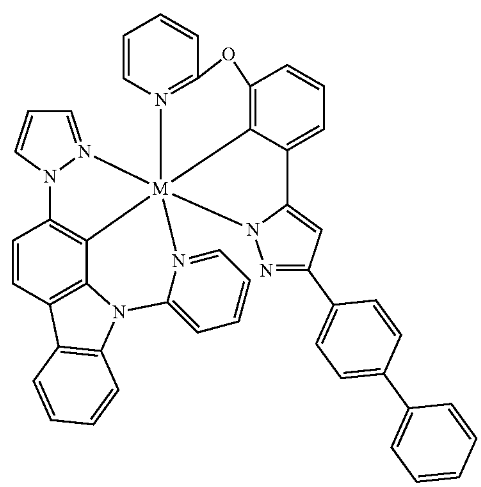
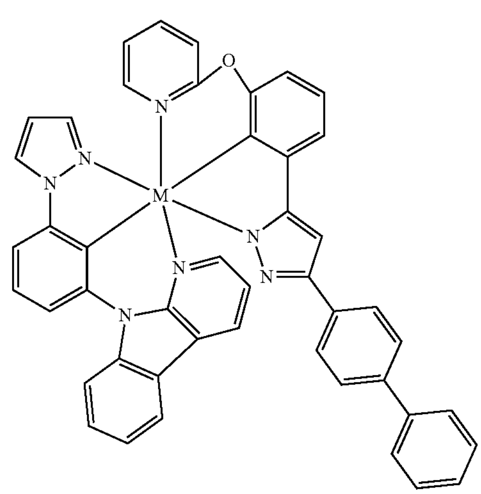

-continued
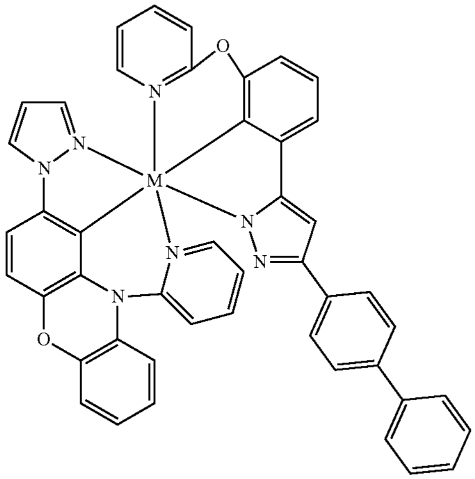
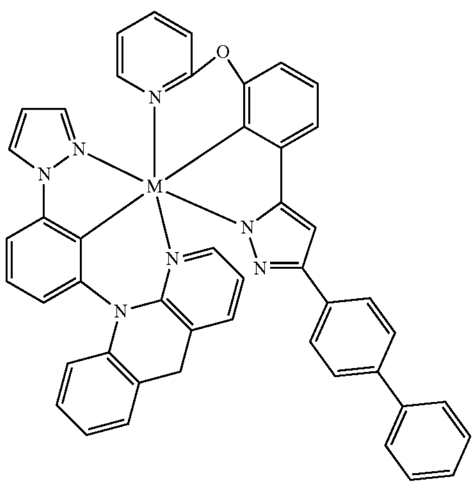
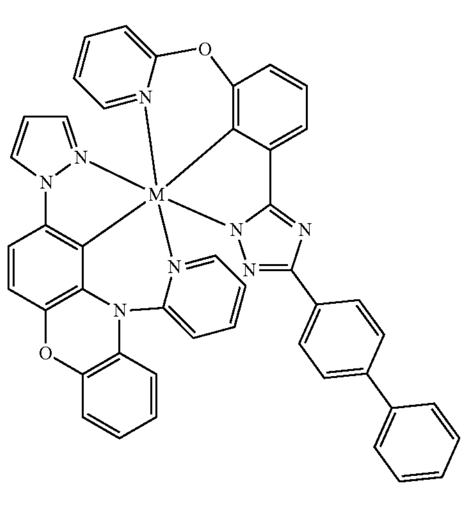
-continued
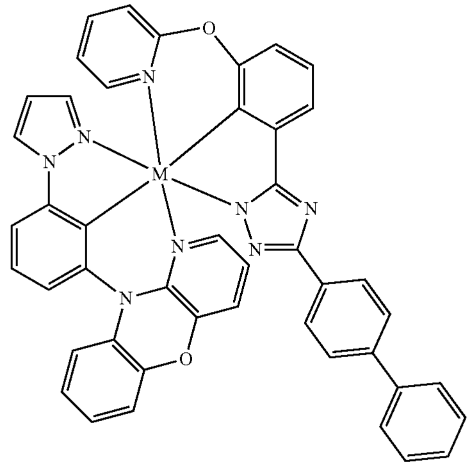
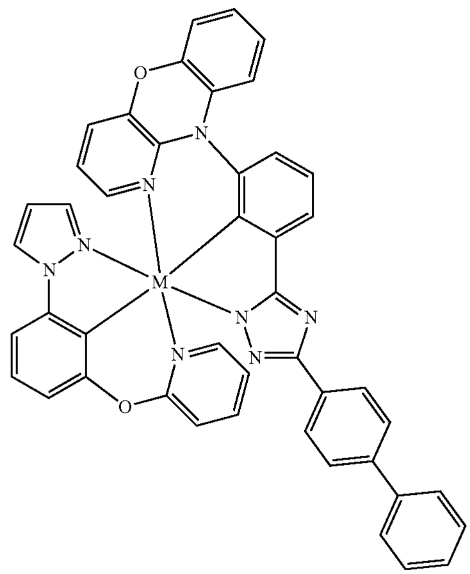
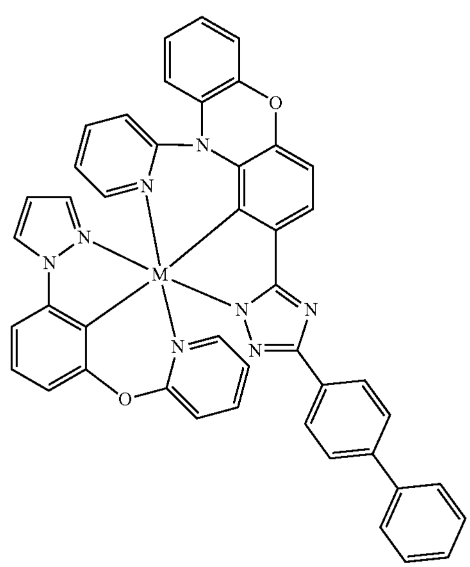

-continued
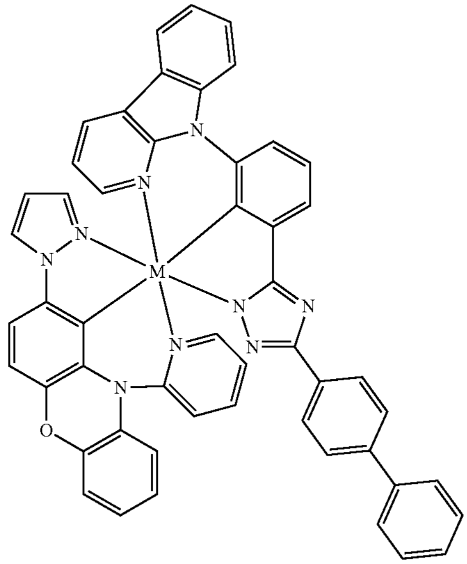
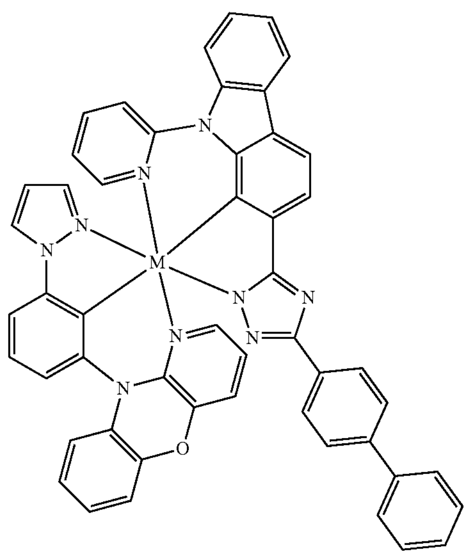
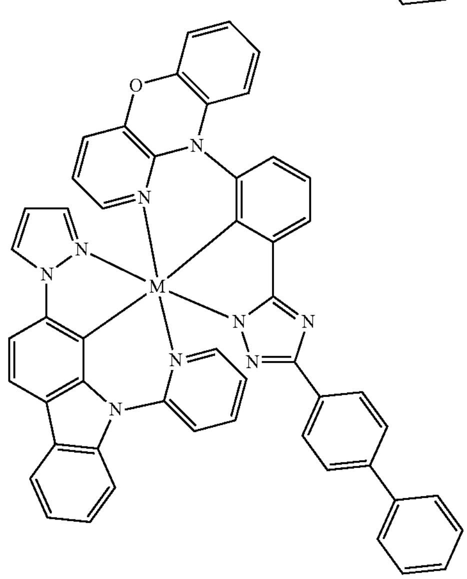
-continued
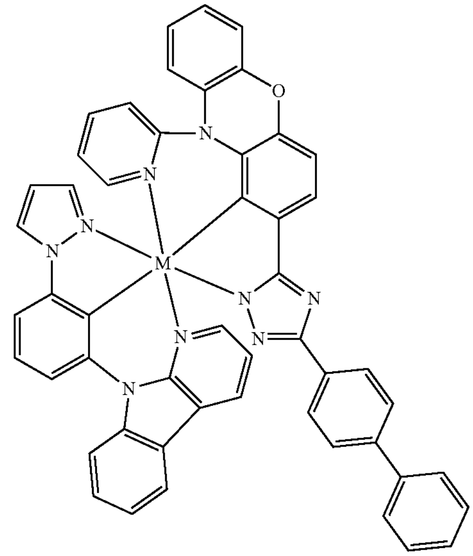
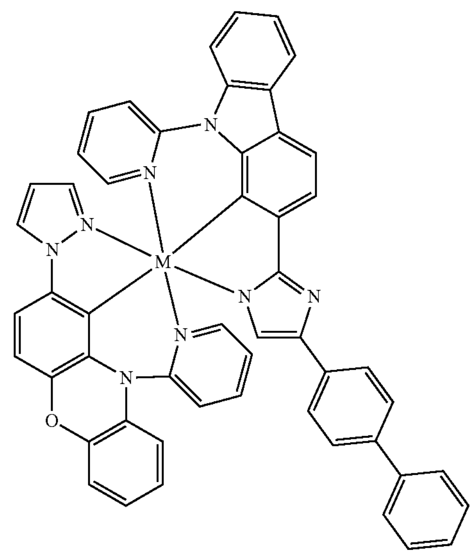
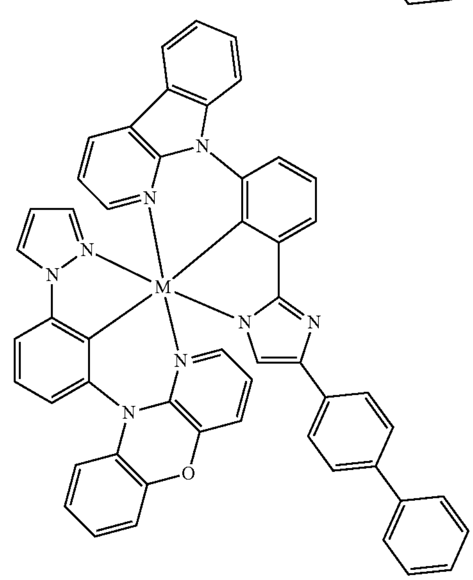

-continued
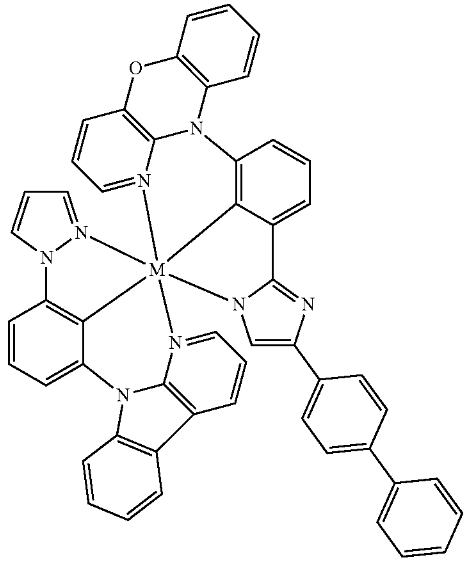
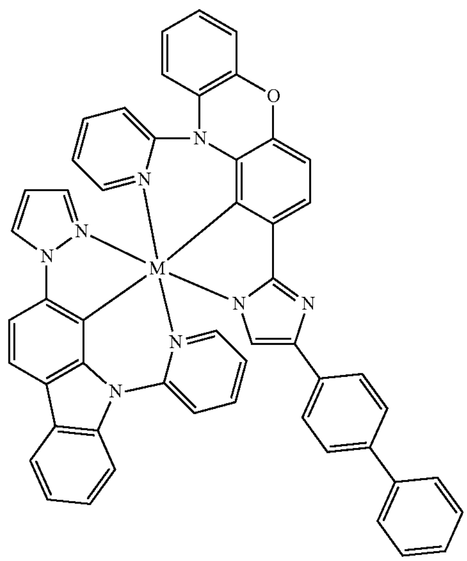
Structures M-31 (M = Ir, Rh)
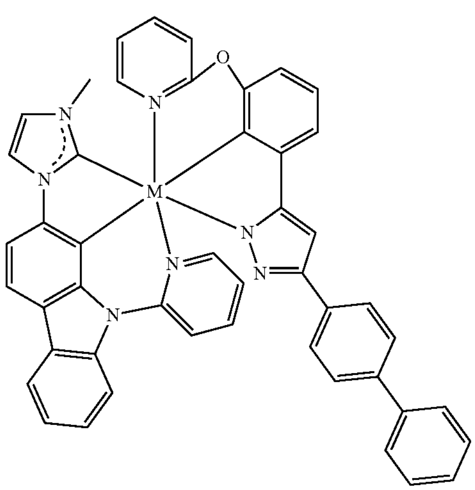
-continued
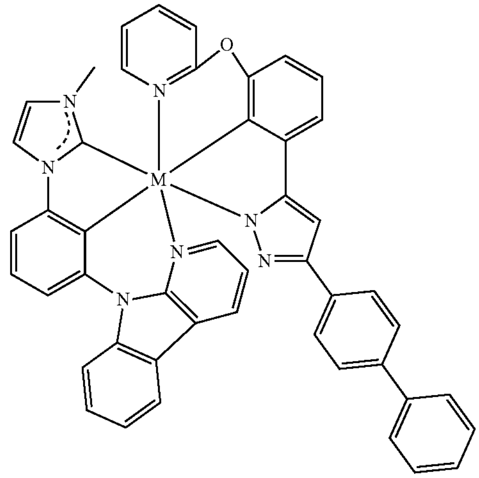
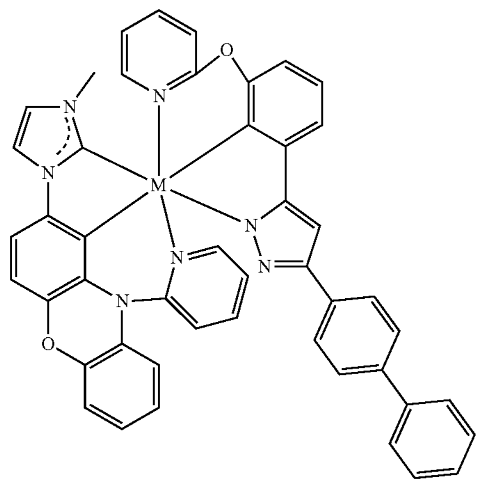
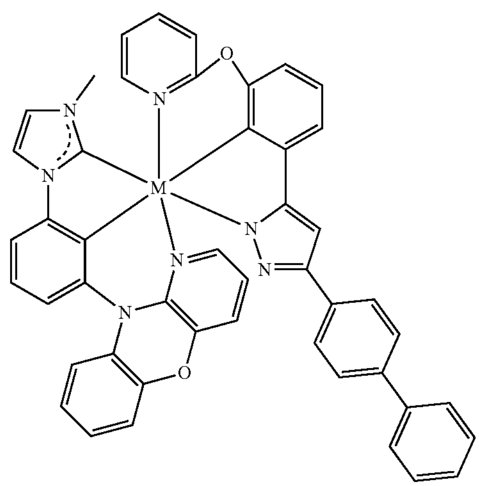

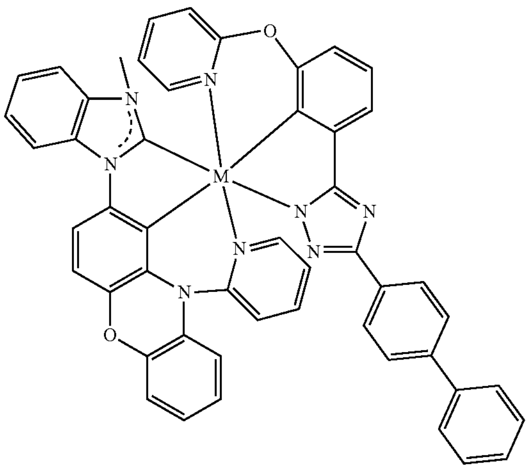
N
N
O
N
M
N
N
N
N
O
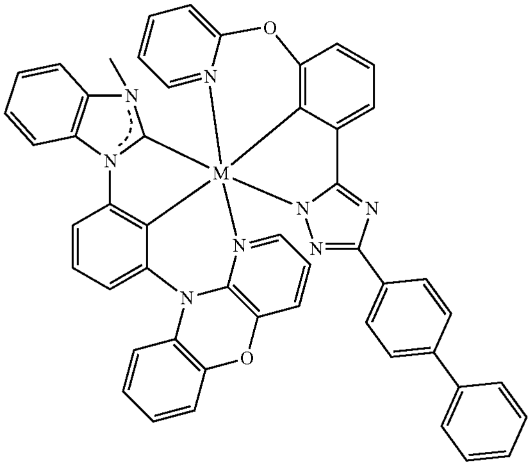
N
N
O
N
M
N
N
N
N
O
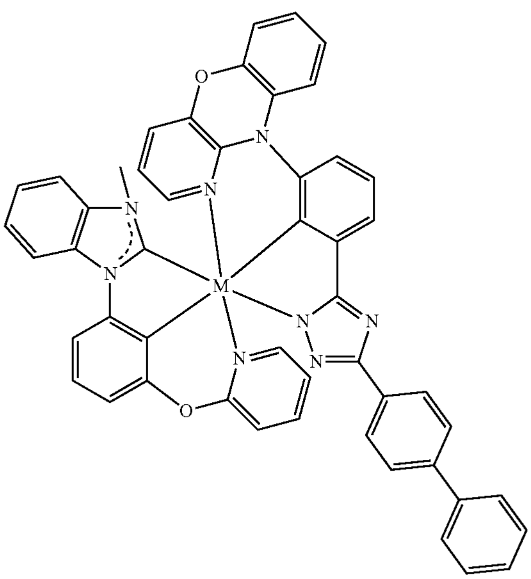
O
N
N
N
N
M
N
N
N
N
O
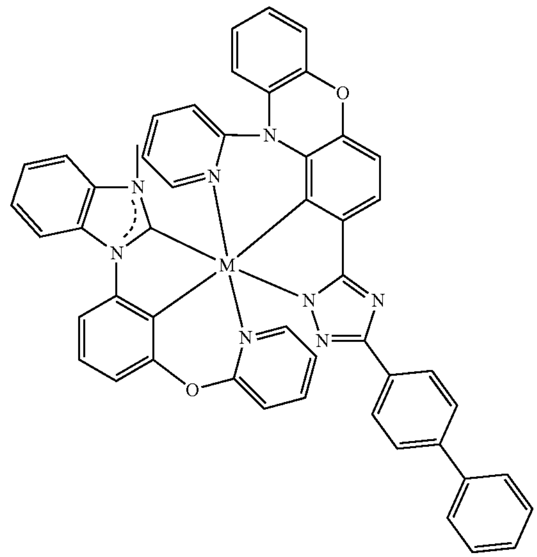
O
N
N
N
N
M
N
N
N
N
O
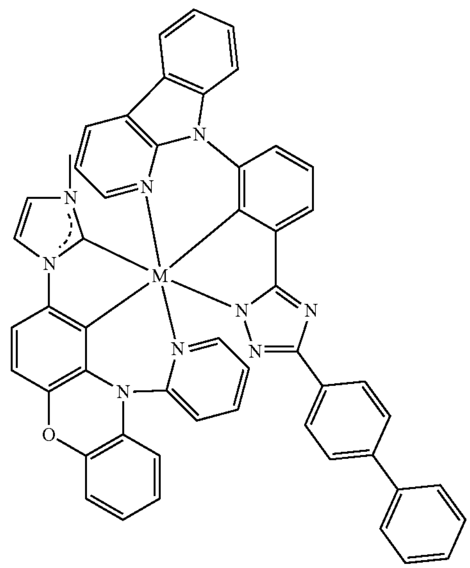
N
N
N
N
M
N
N
N
N
N
O
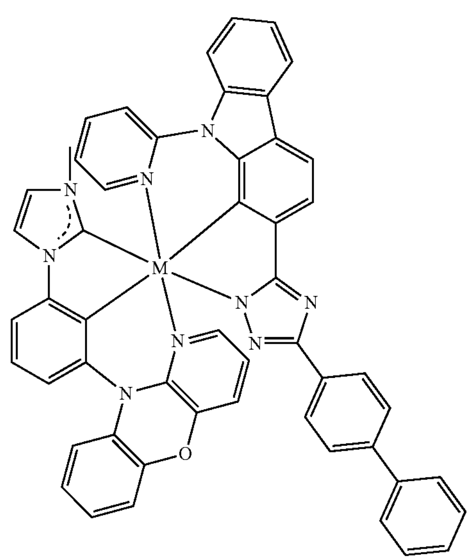
N
N
N
N
M
N
N
N
N
N
O -continued
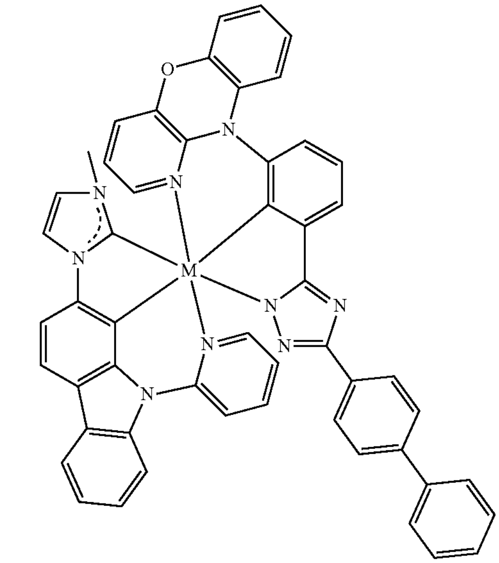
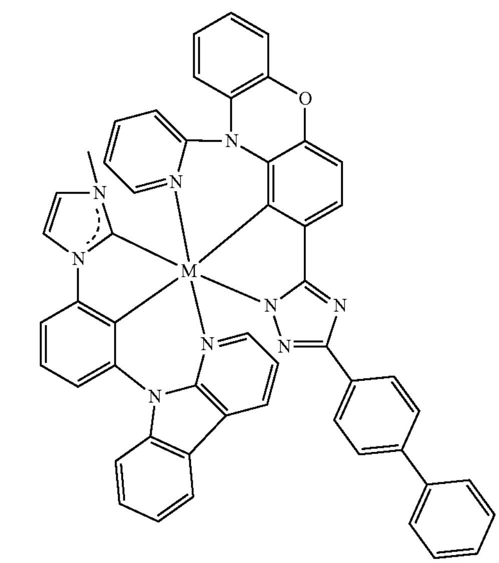
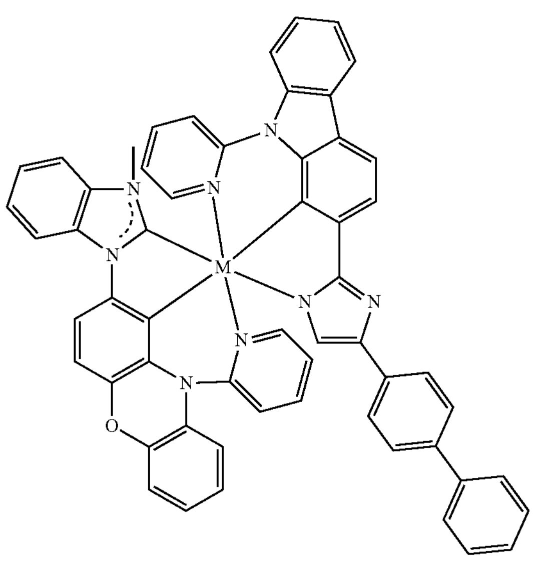
-continued
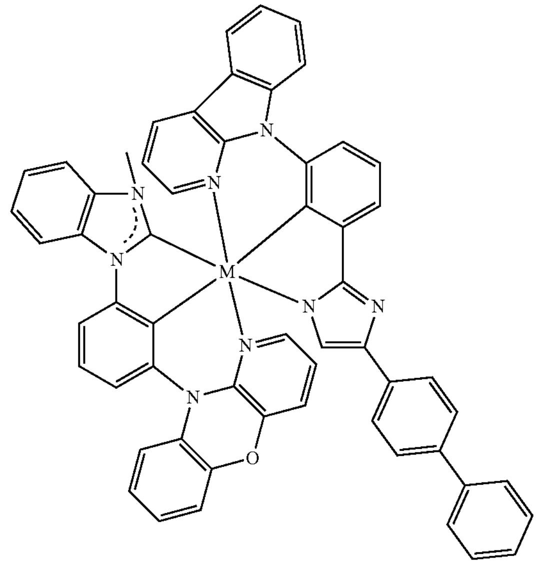
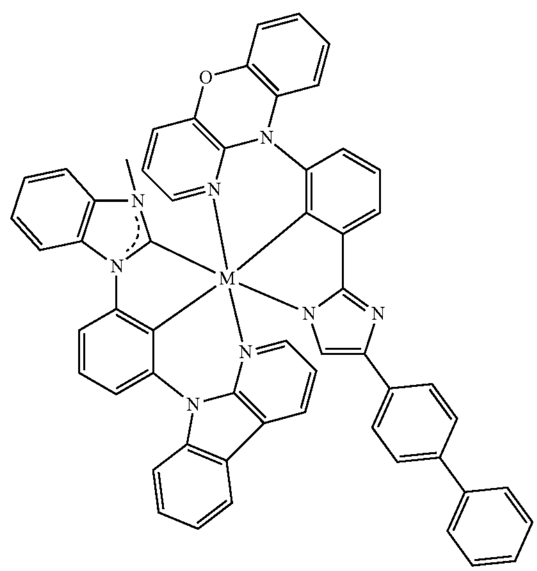
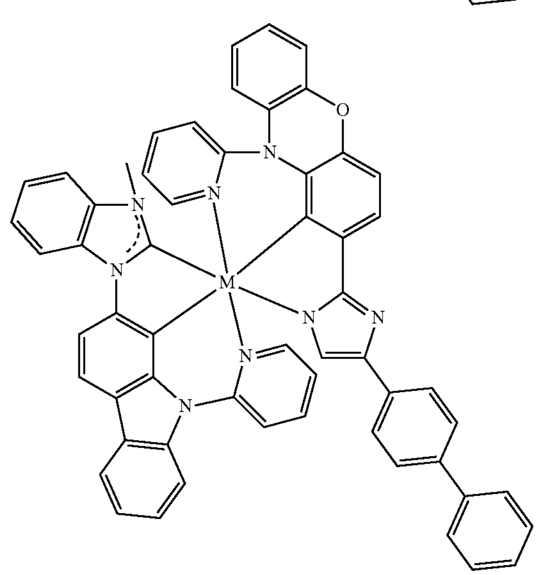

-continued
Structures M-32 (M = Ir, Rh)
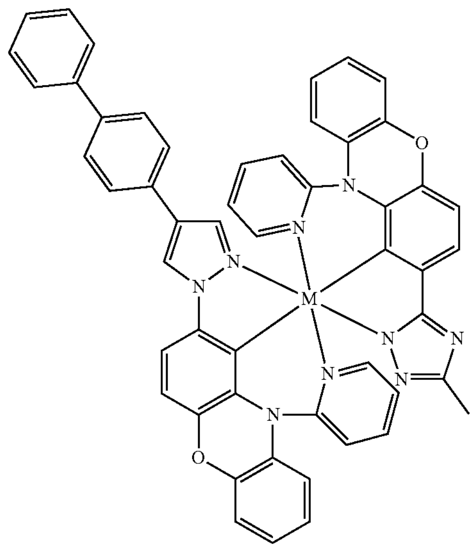
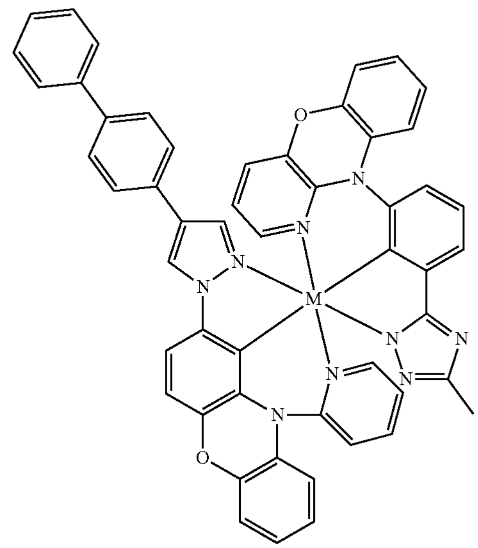
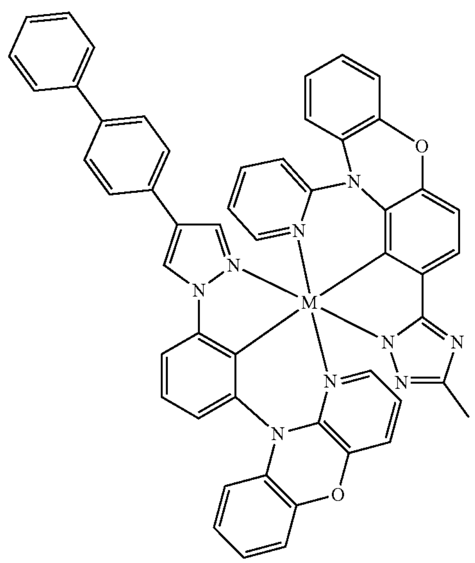
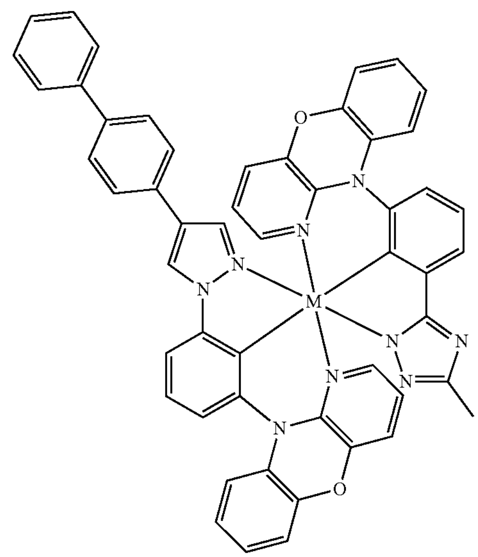
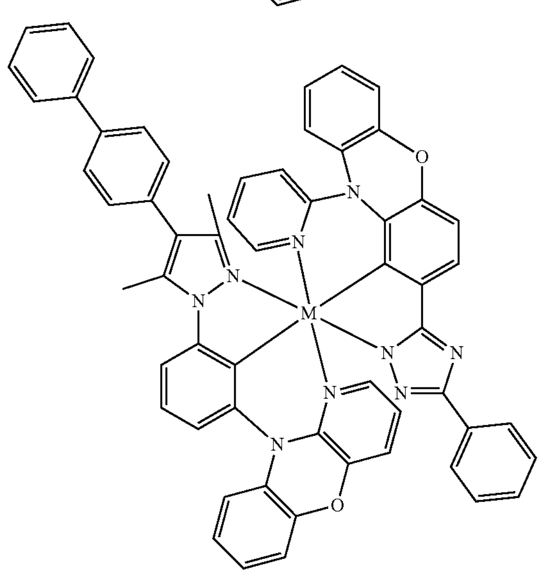
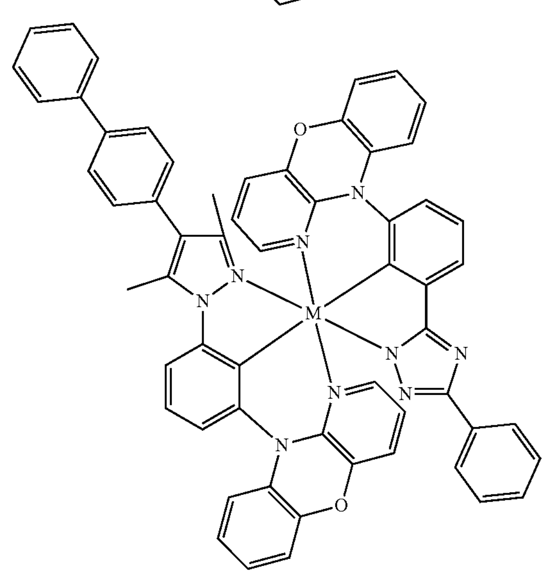
-continued -continued
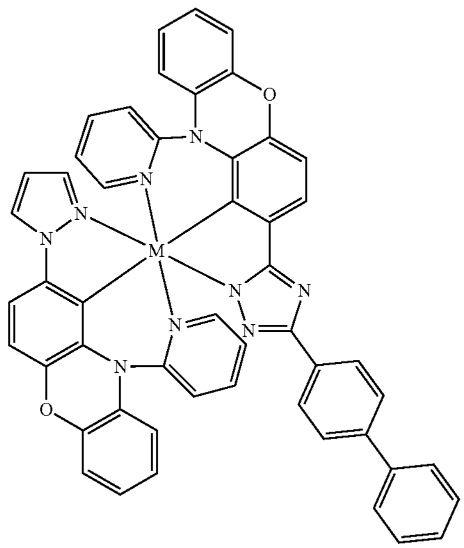
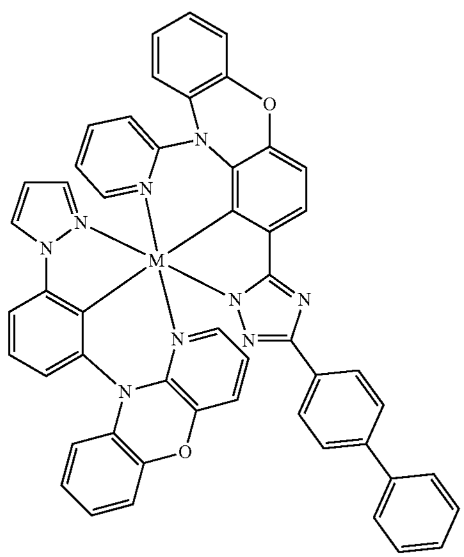
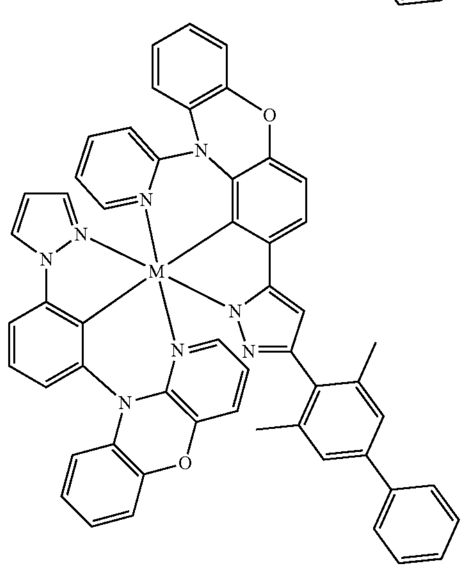
-continued
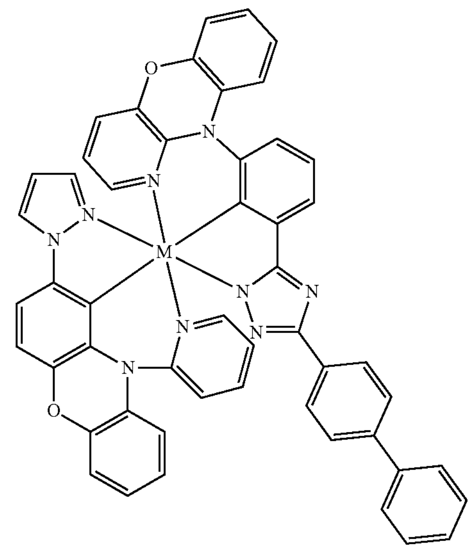
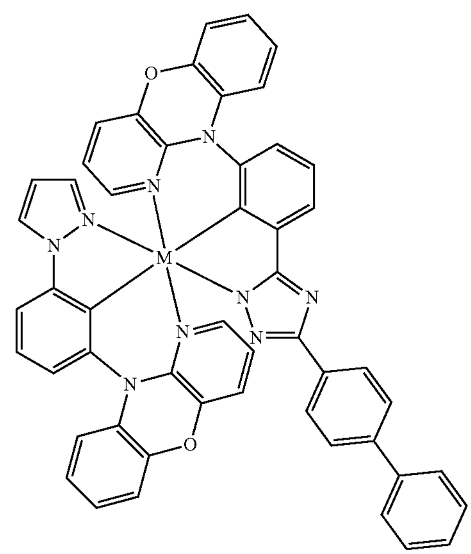
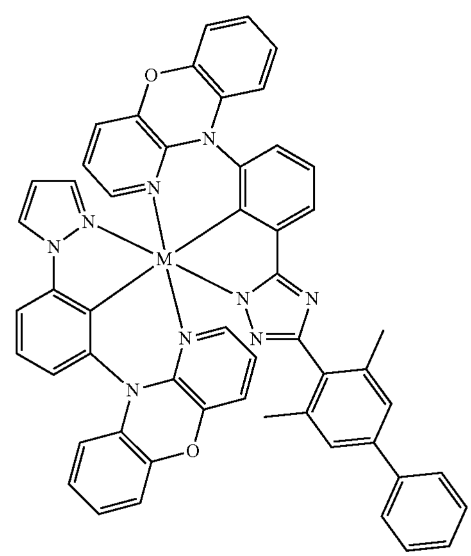

-continued
Structures M-33 (M = Ir, Rh)
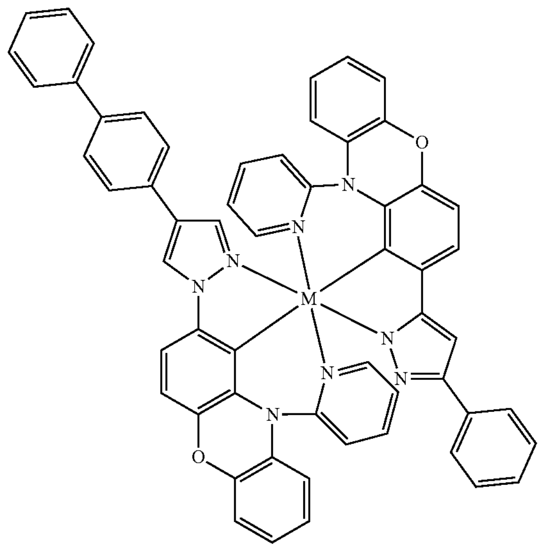
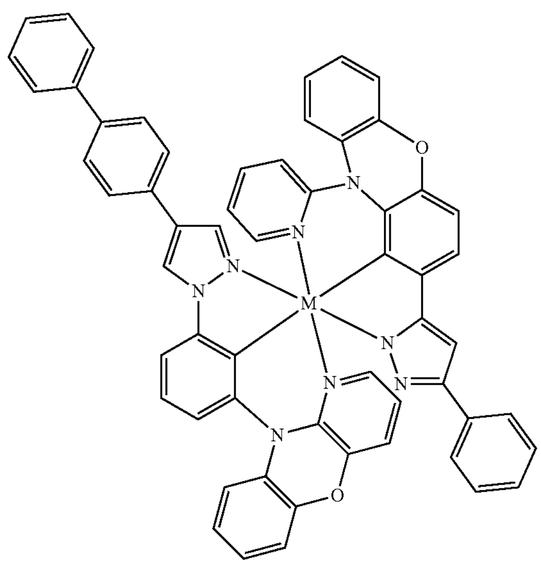
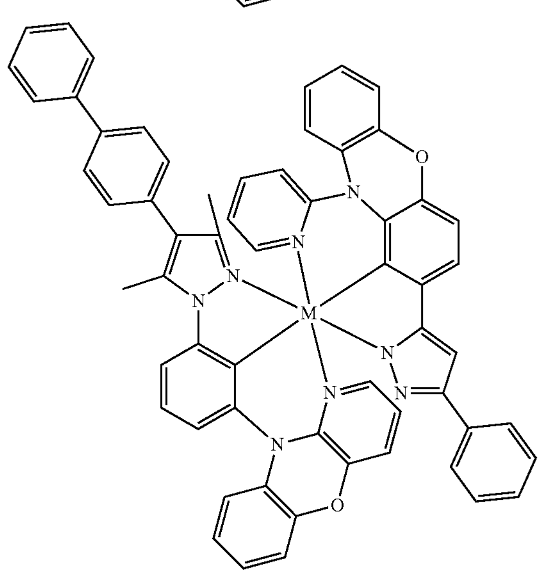
-continued
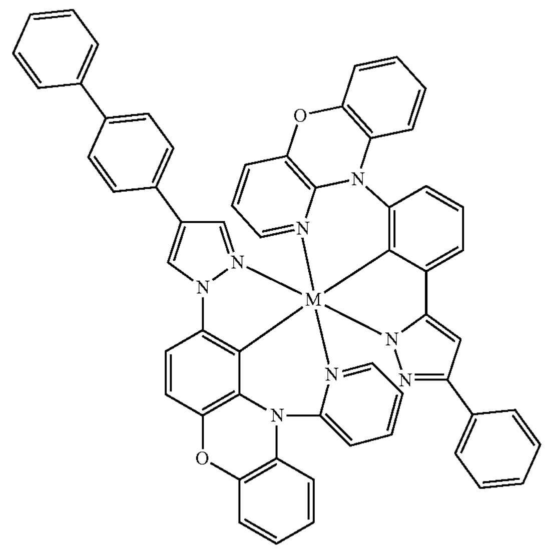
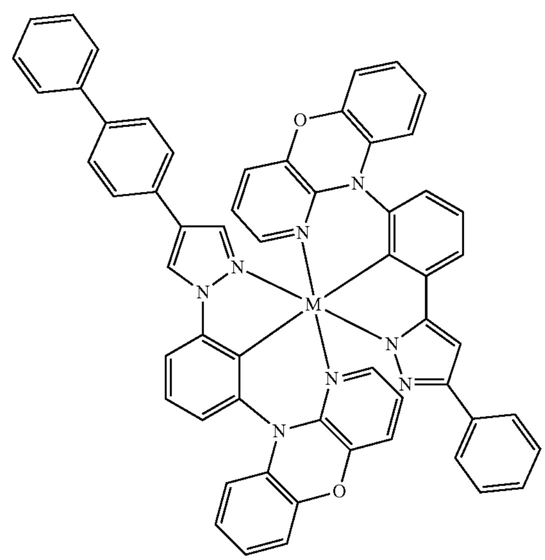
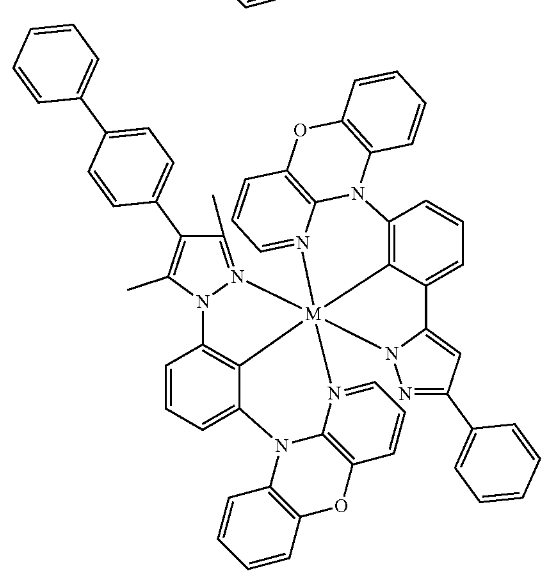

-continued
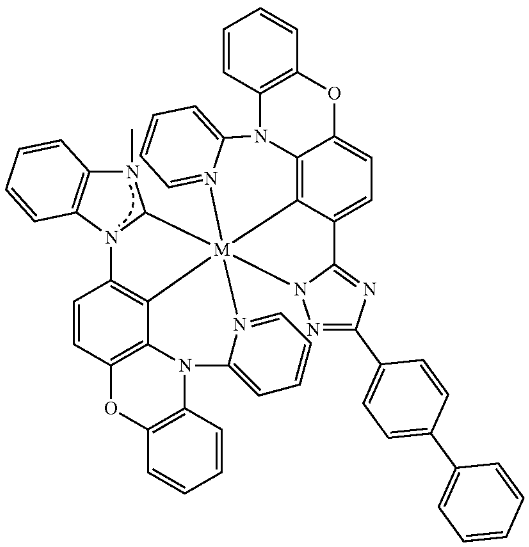
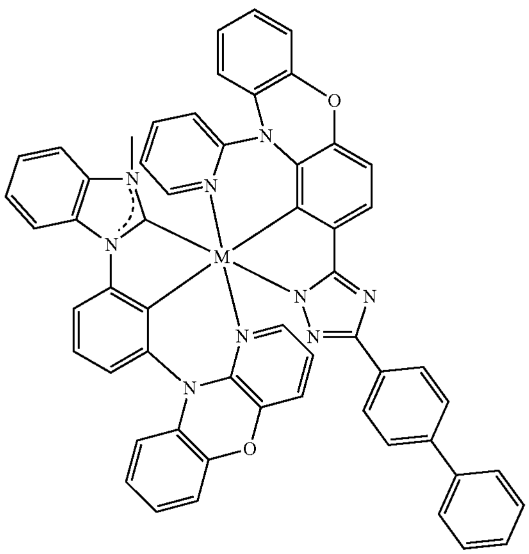
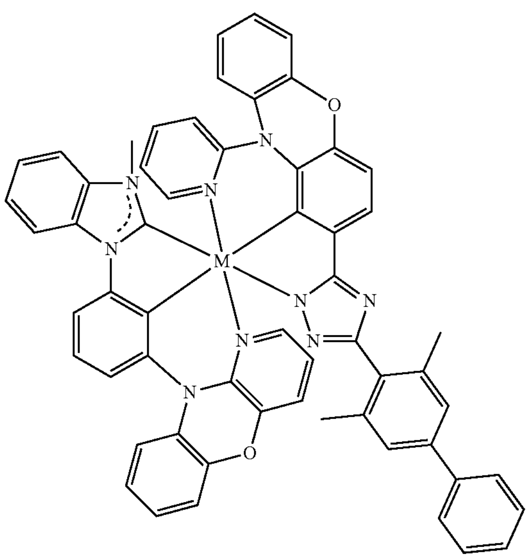
-continued
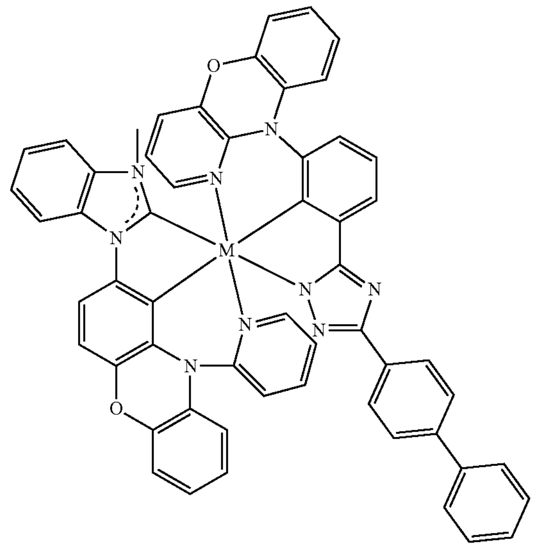
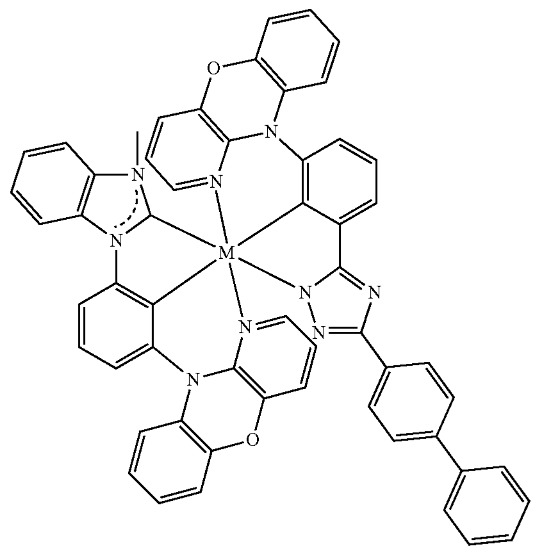
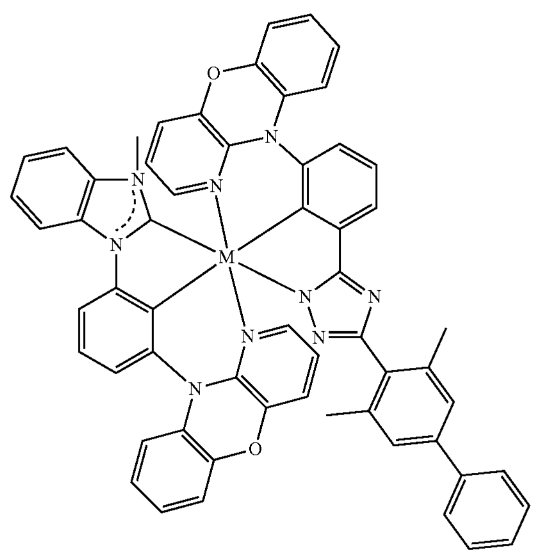

Structures M-34 (M = Ir, Rh)
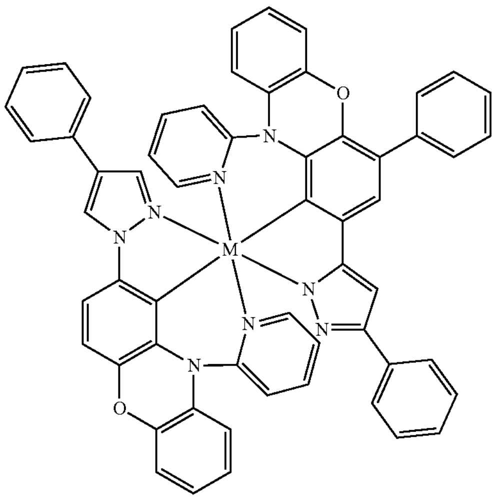
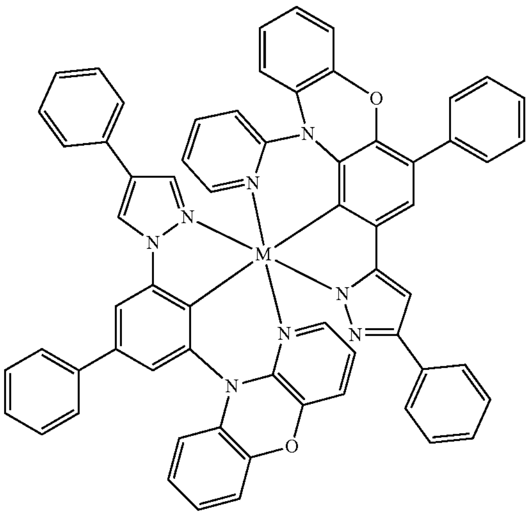
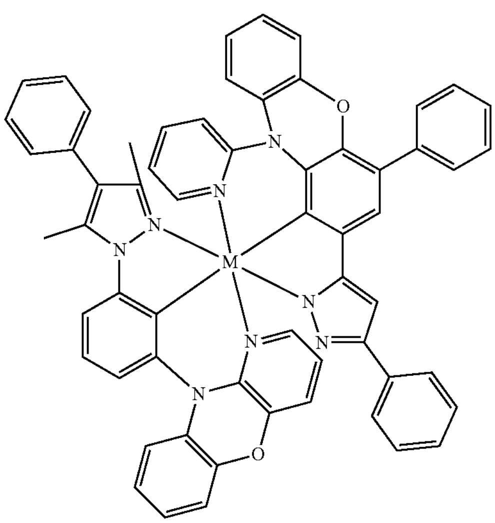
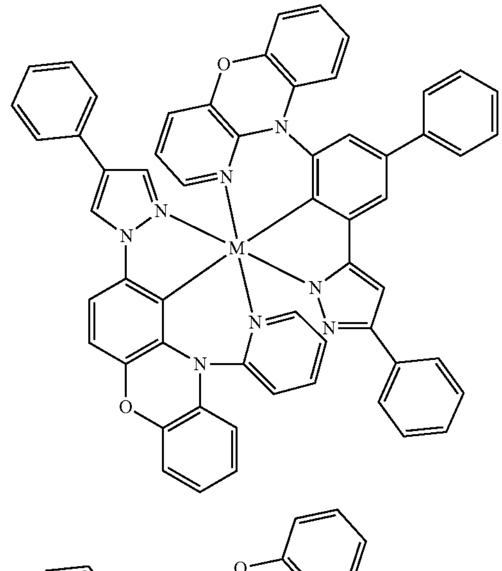
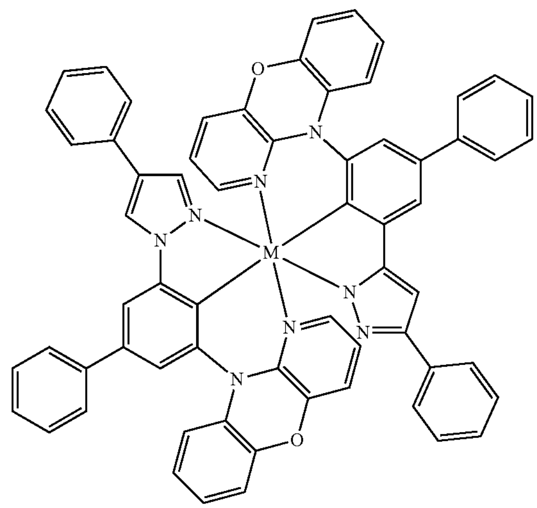
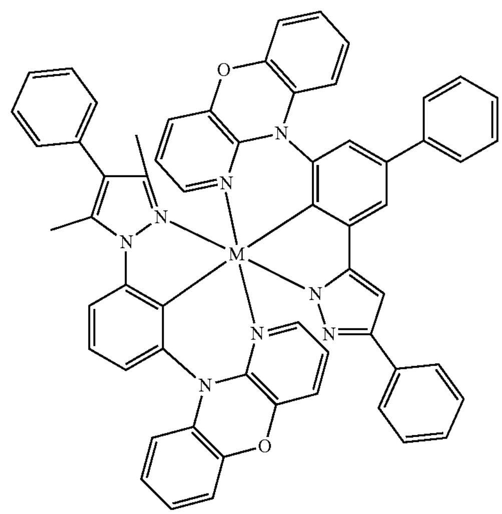

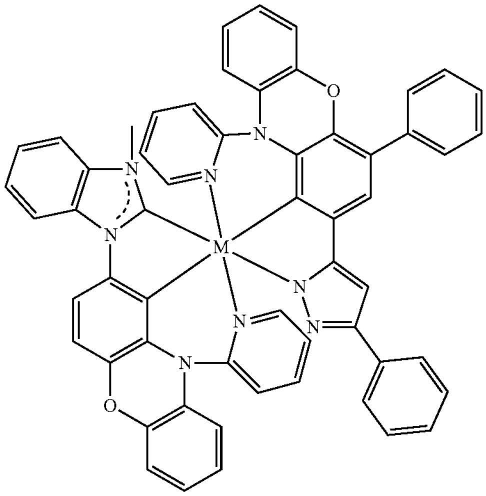
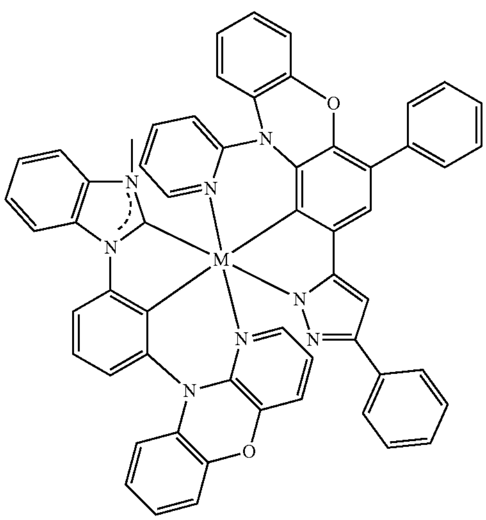
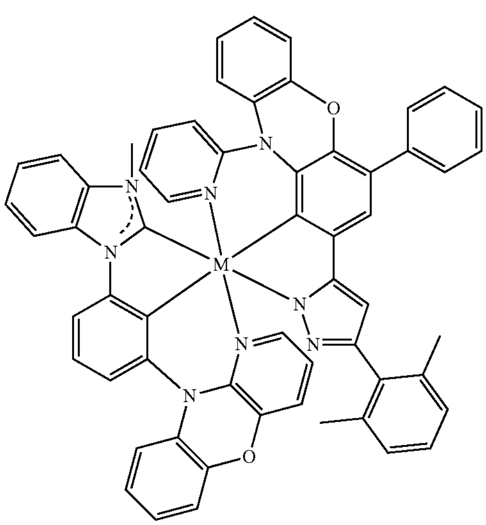
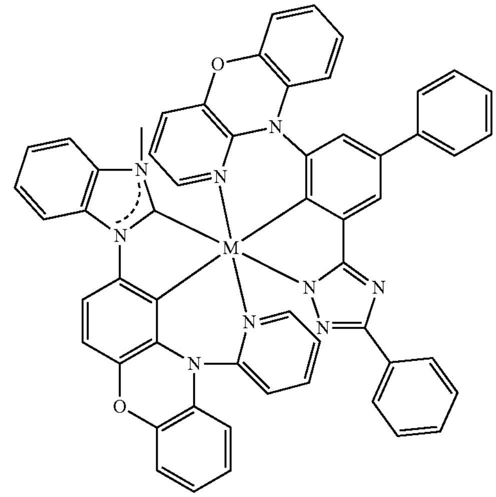
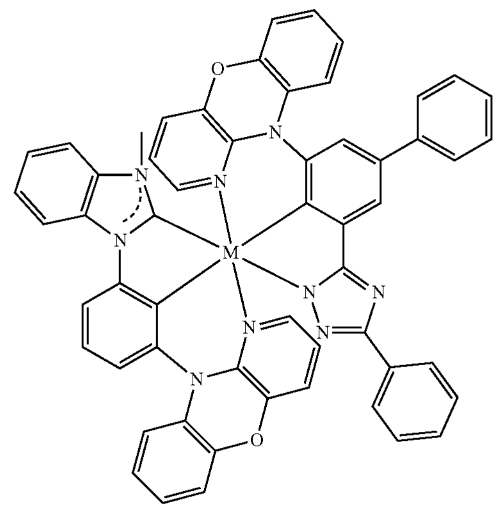
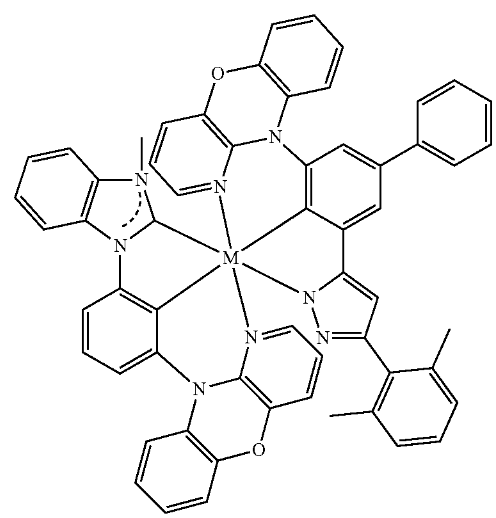

-continued
Structures M-35 (M = Ir, Rh)
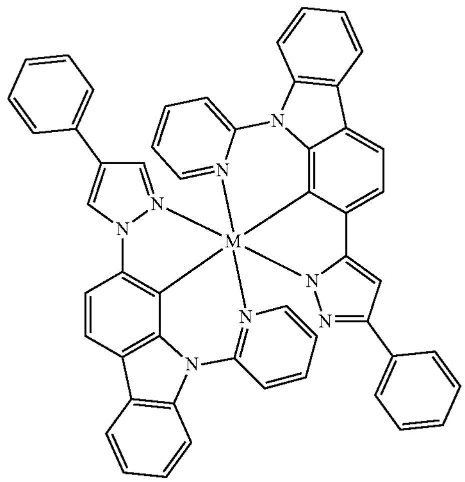
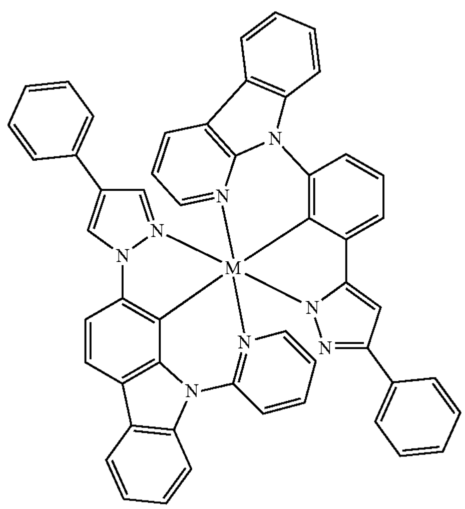
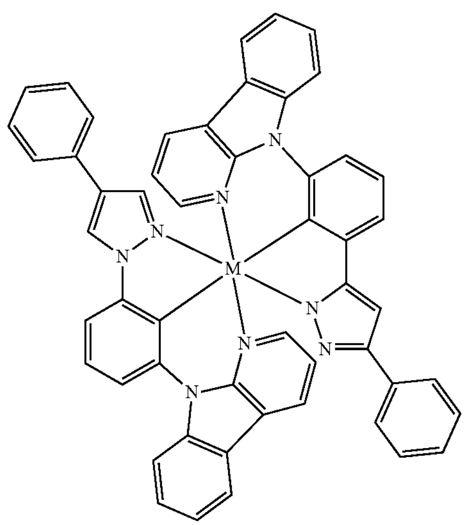
-continued
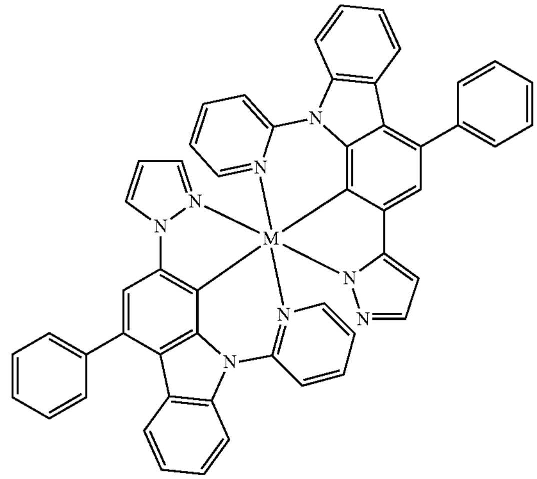
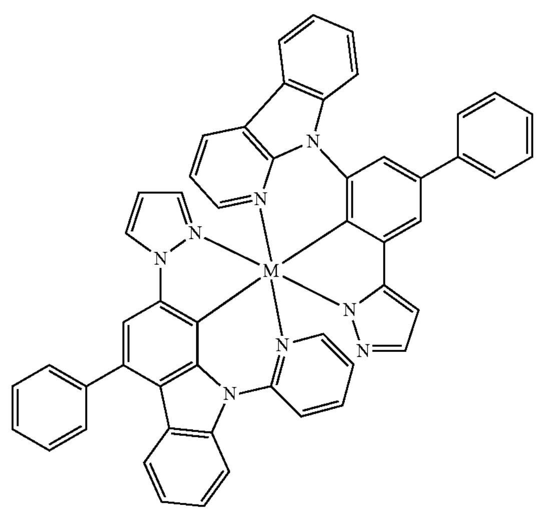
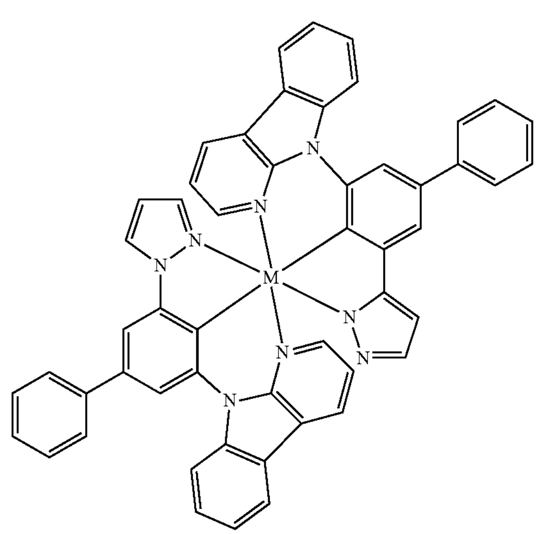

-continued
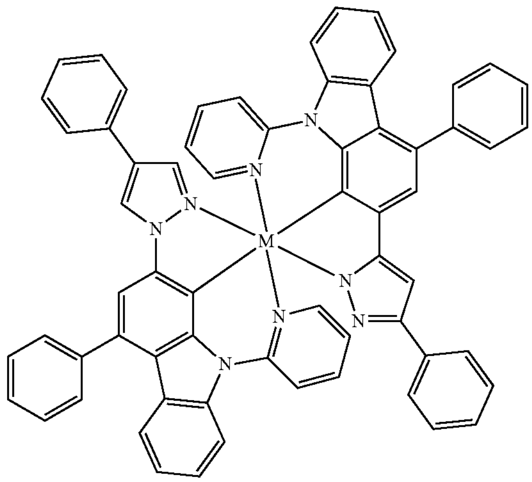
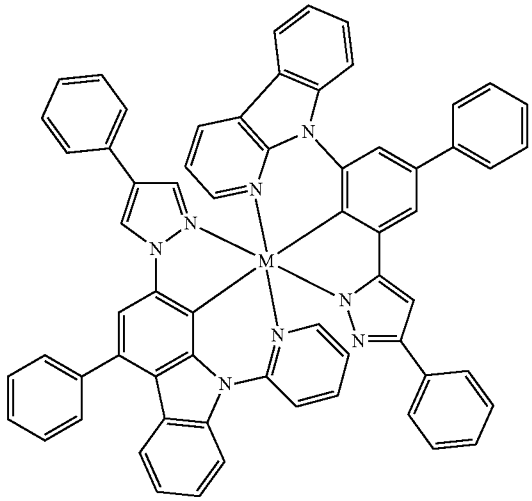
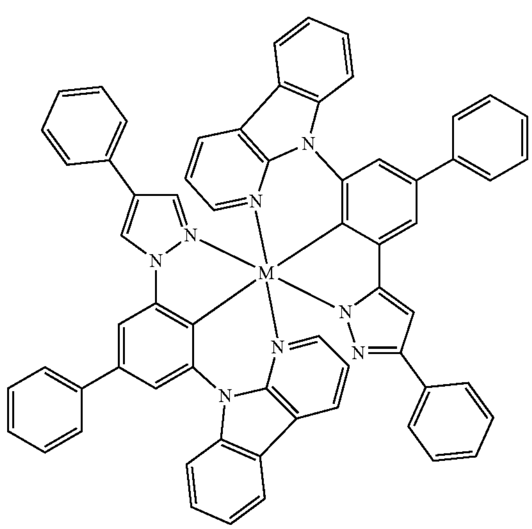
-continued
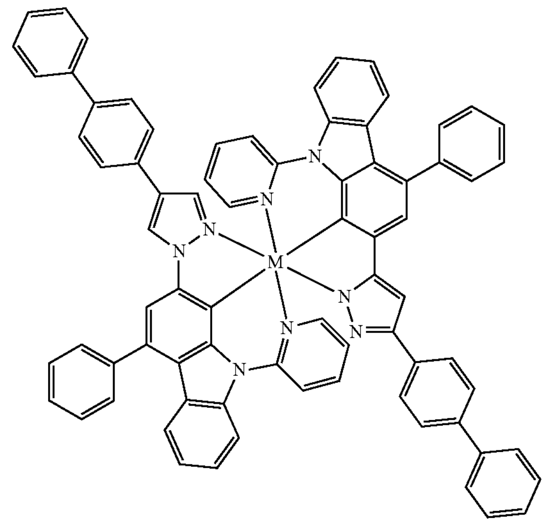
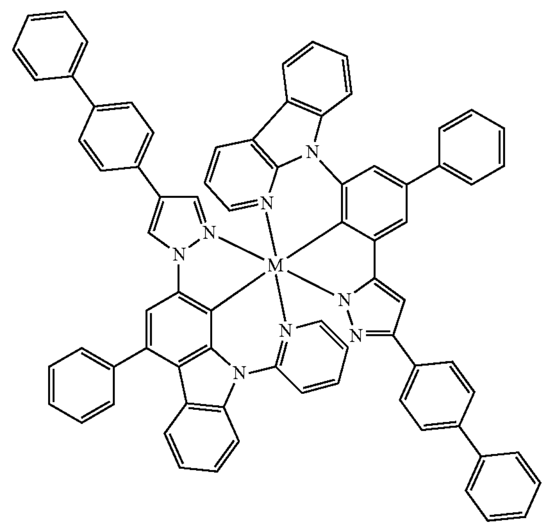
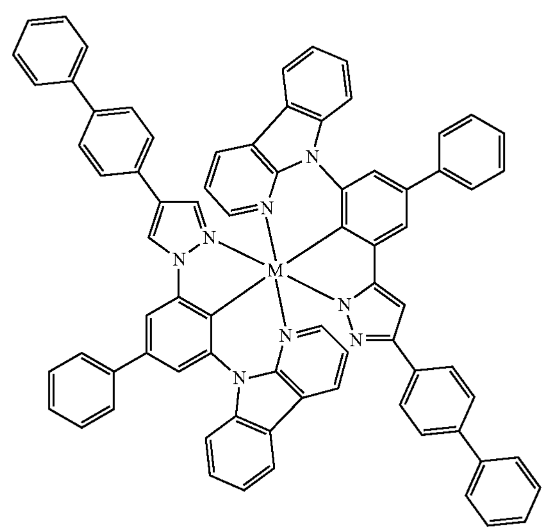

-continued
Structures M-36 (M = Ir, Rh)
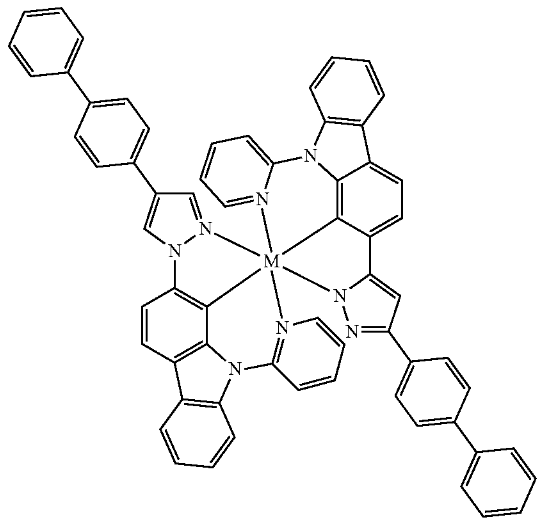
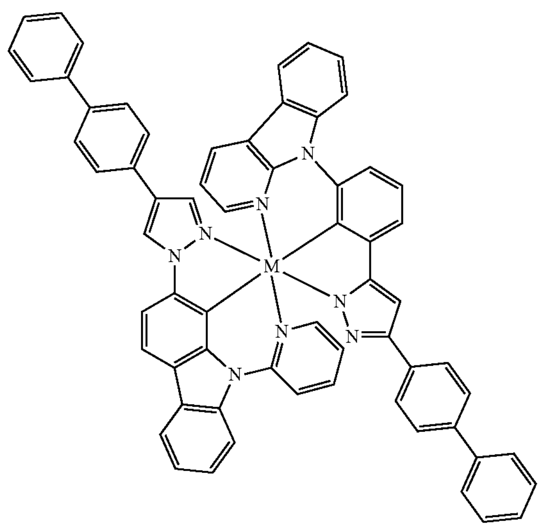
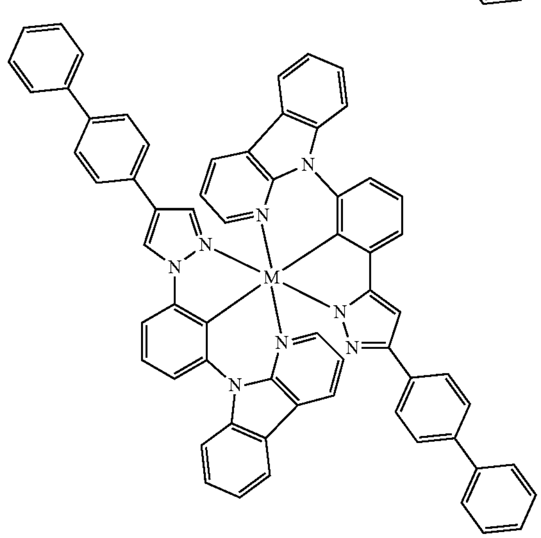
-continued
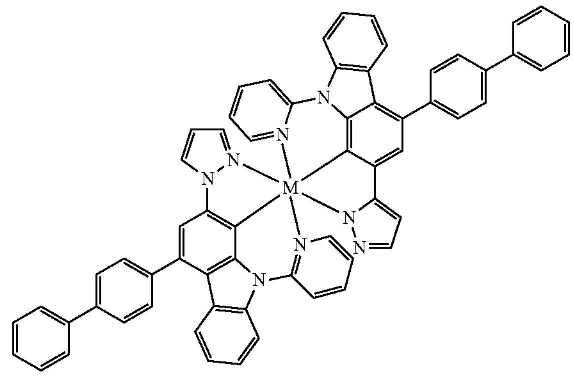
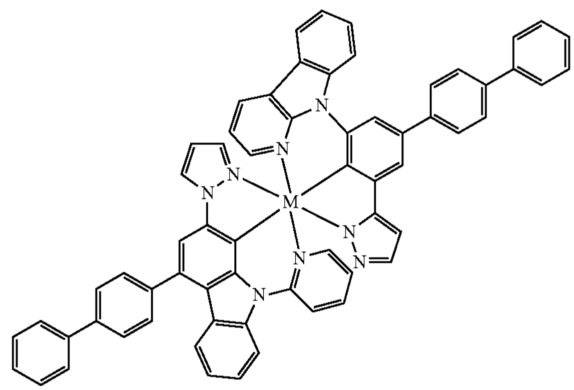
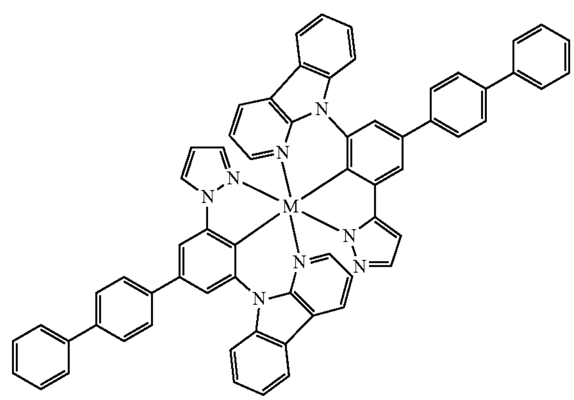
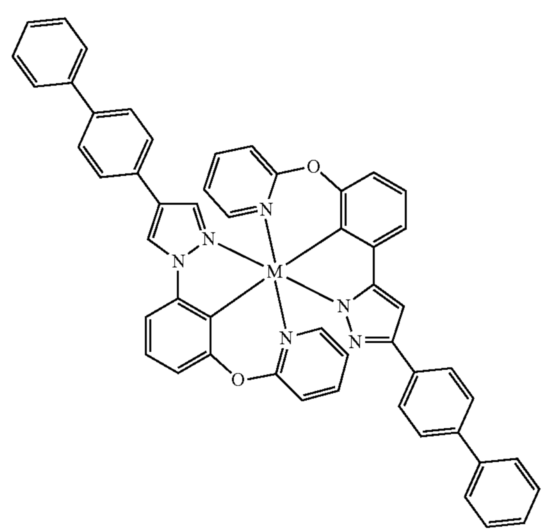

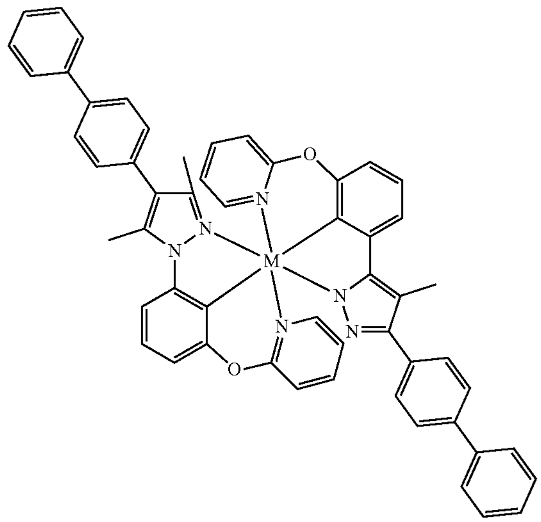
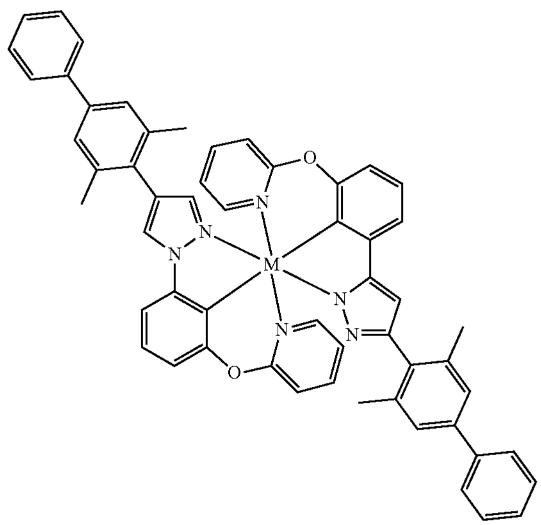
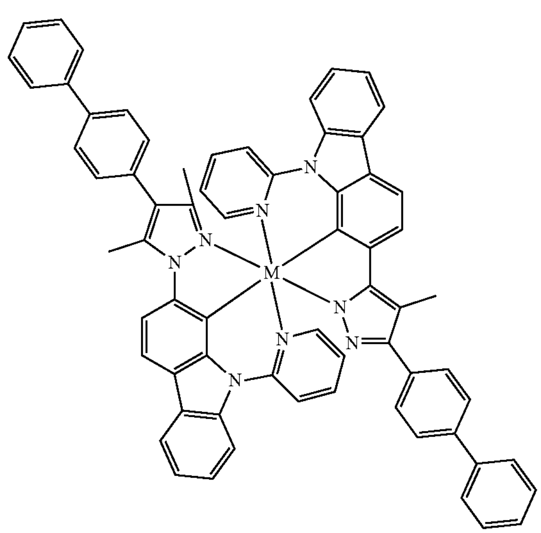
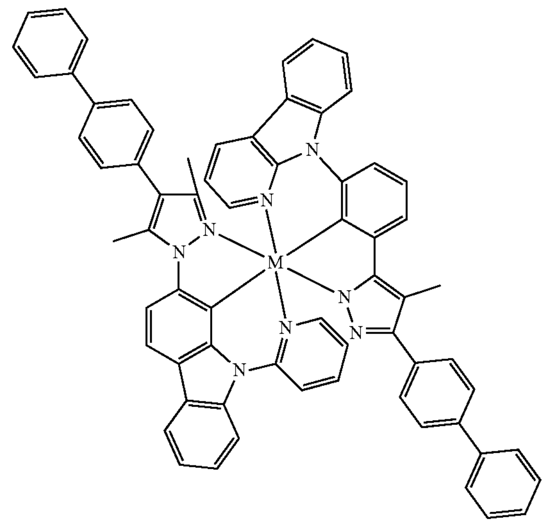
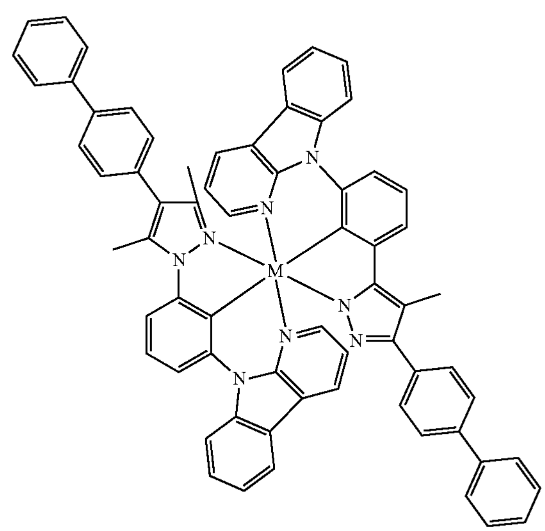
Structures M-37 (M = Ir, Rh)
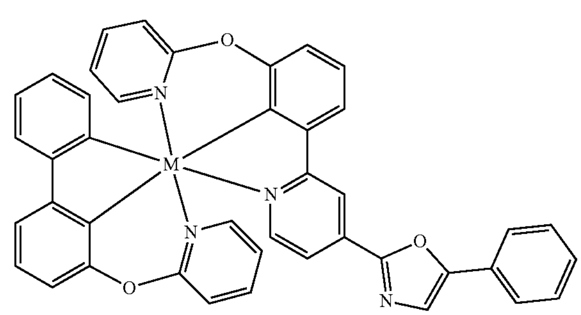

-continued
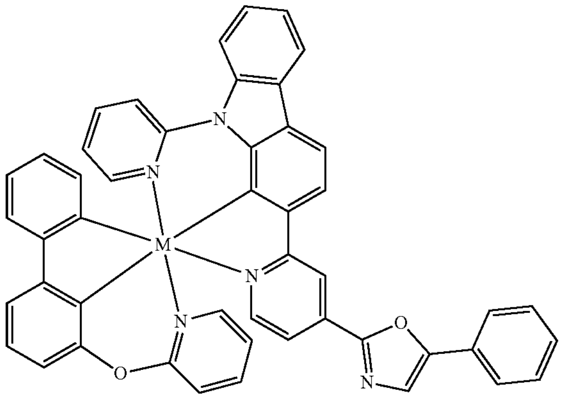
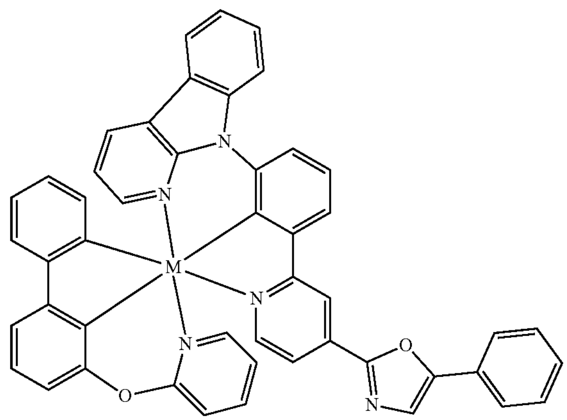
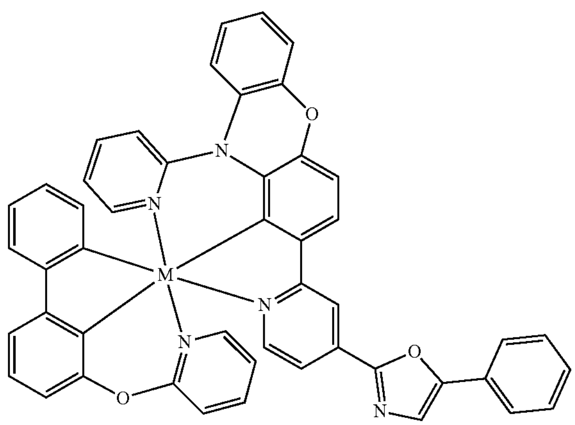
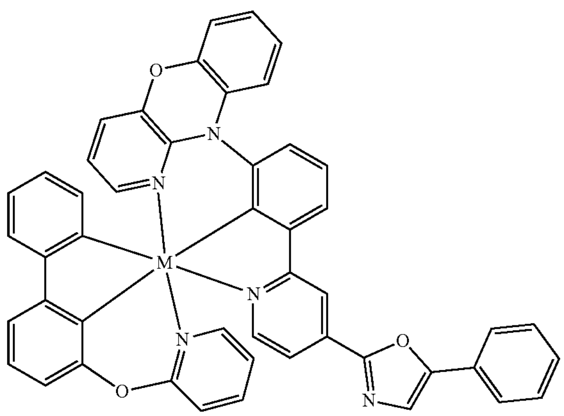
-continued
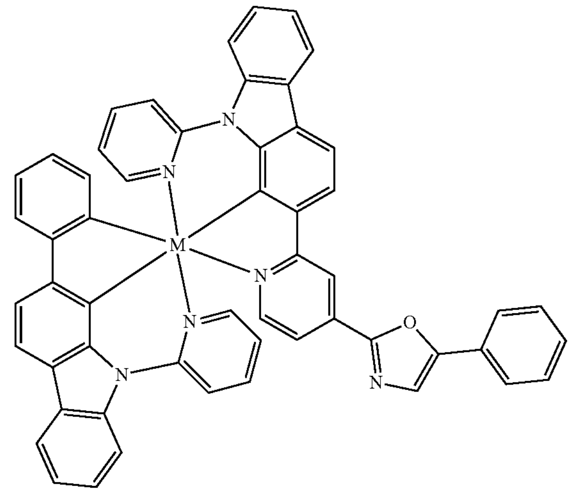
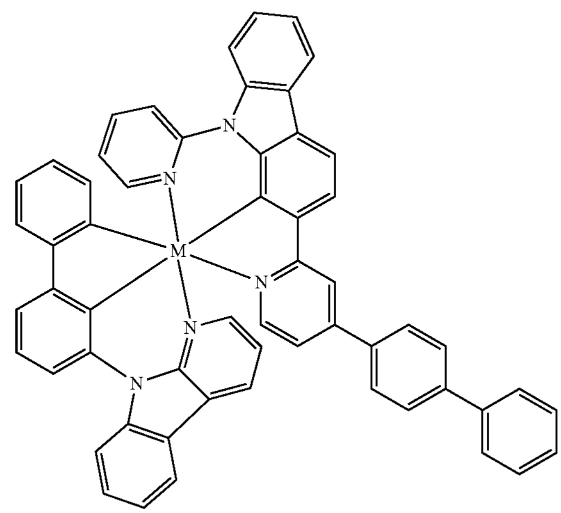
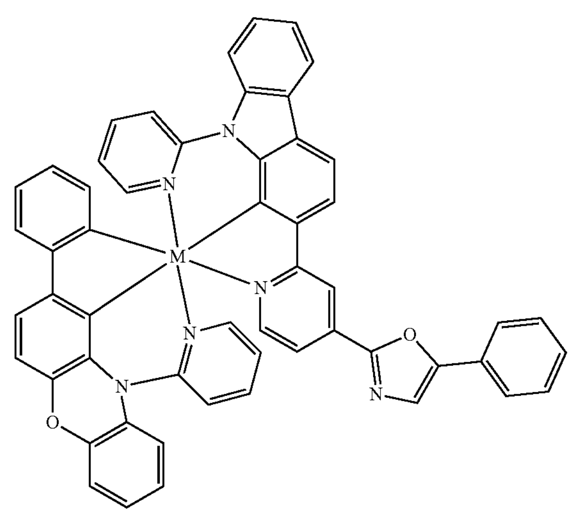

-continued
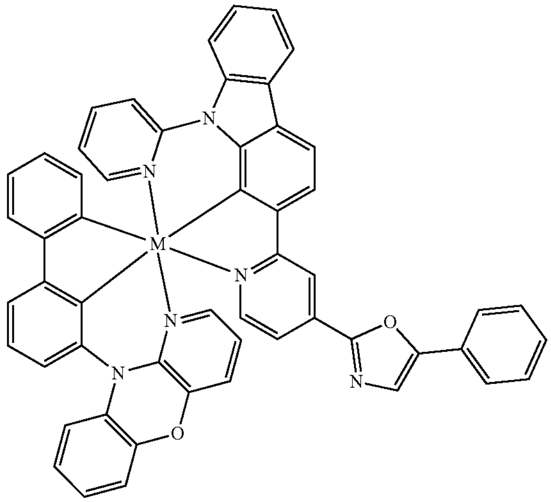
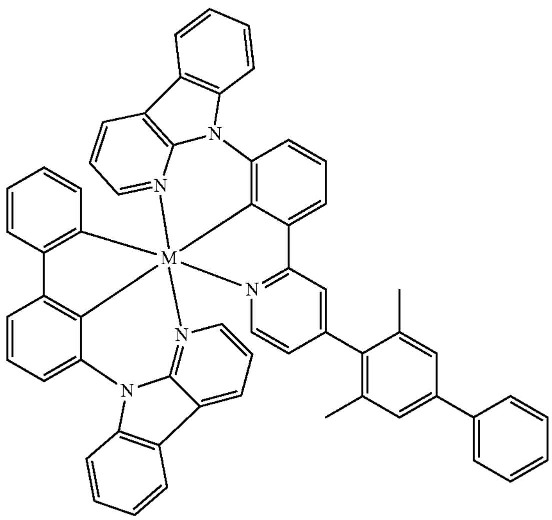
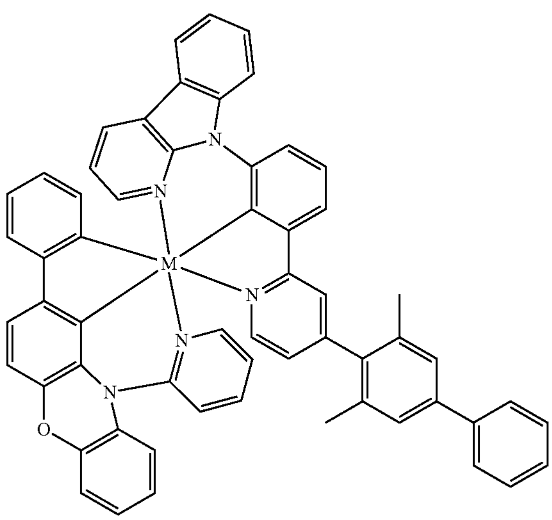
-continued
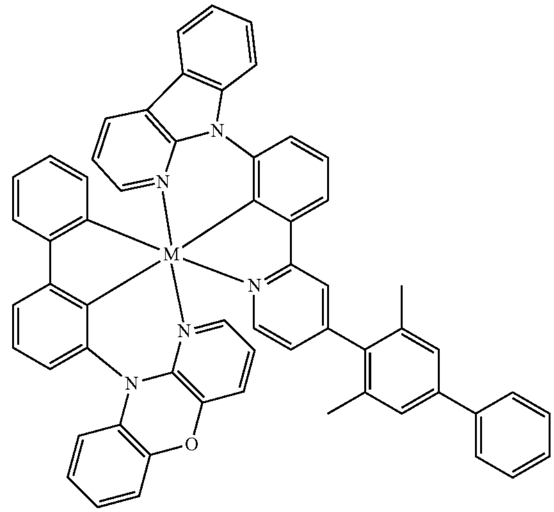
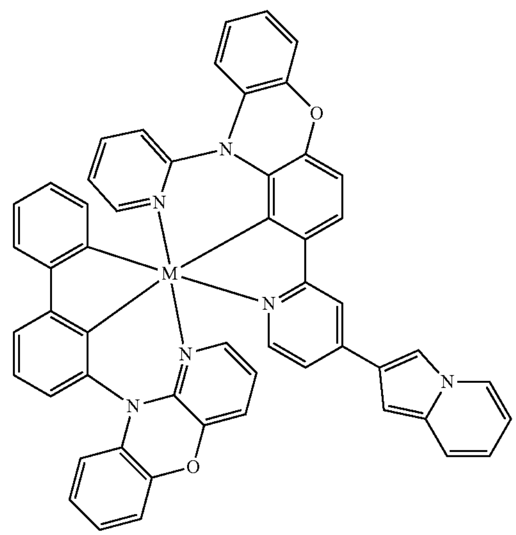
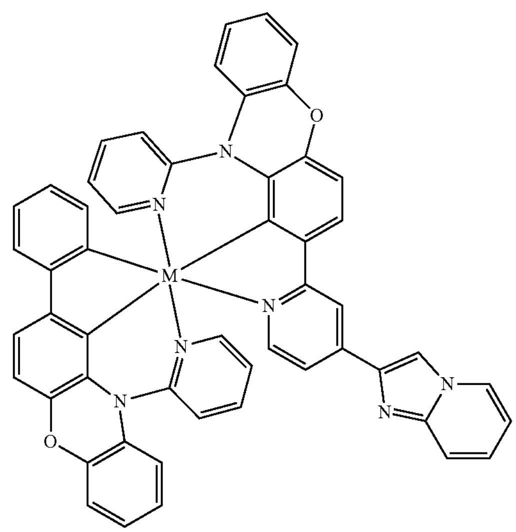

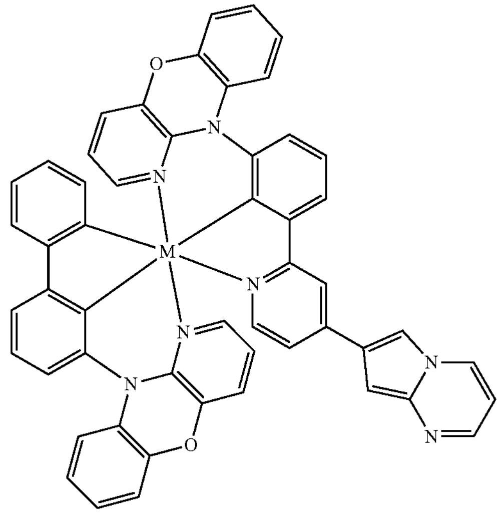
Structures M-38 (M = Ir, Rh)
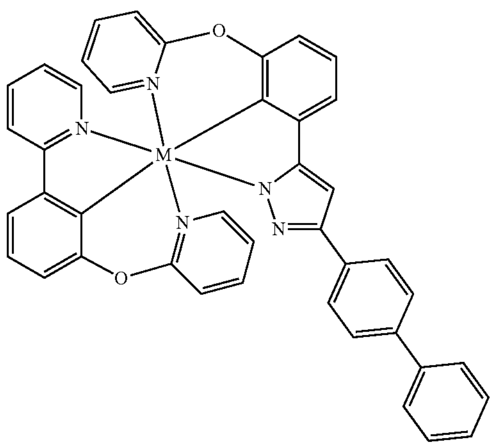
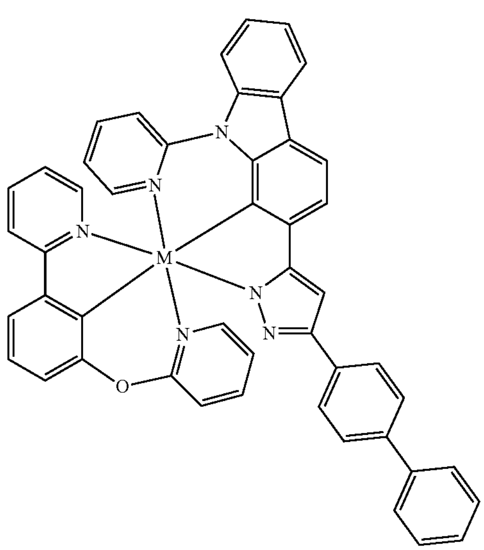
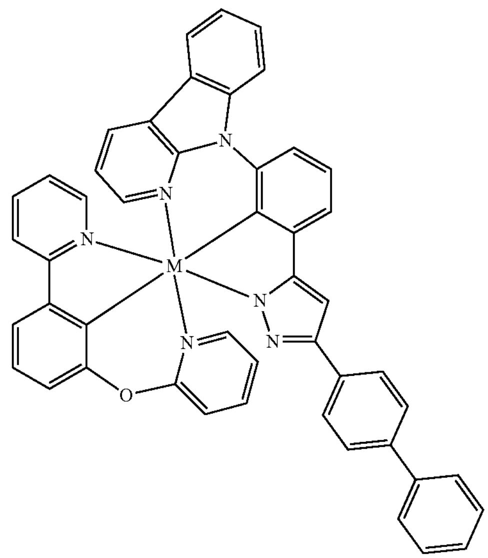
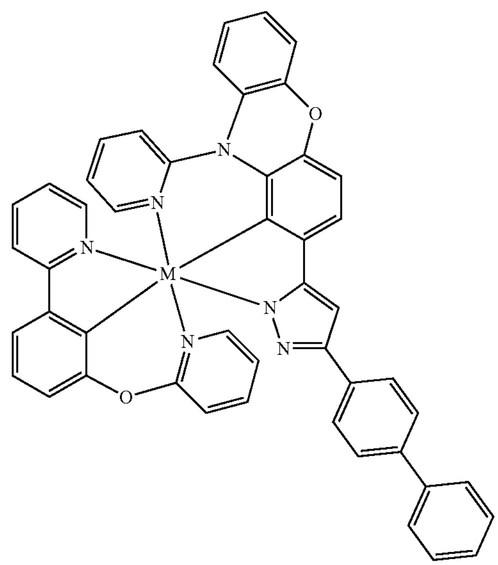
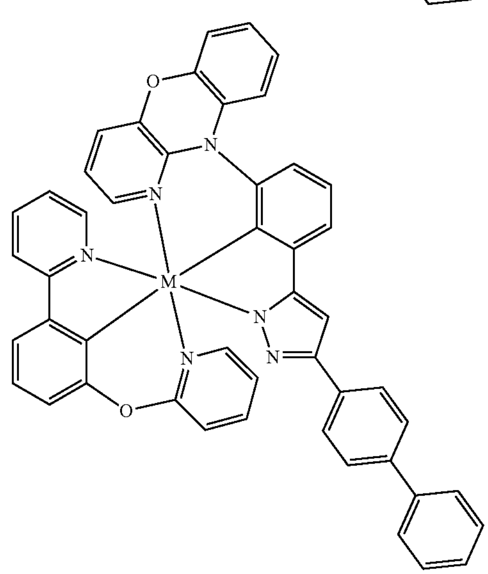

-continued
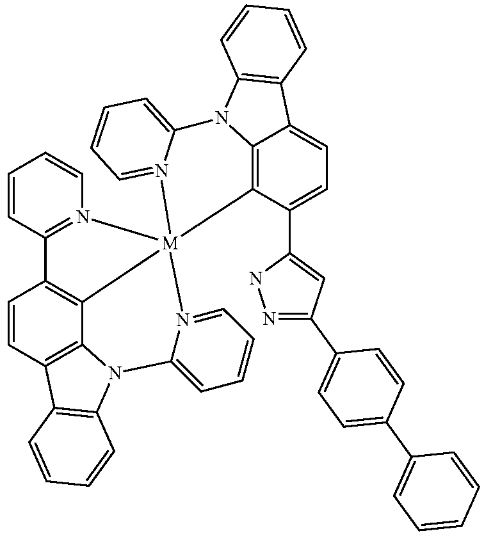
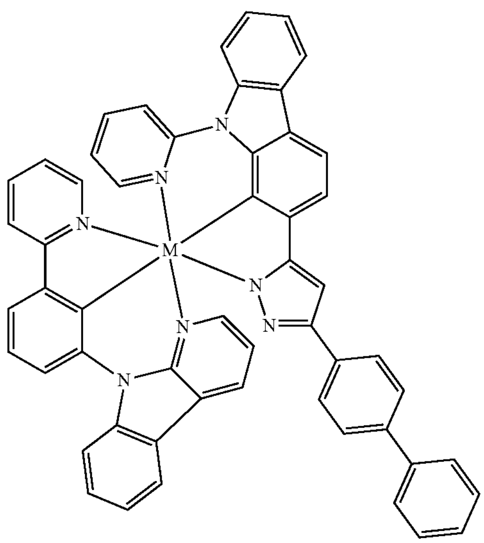
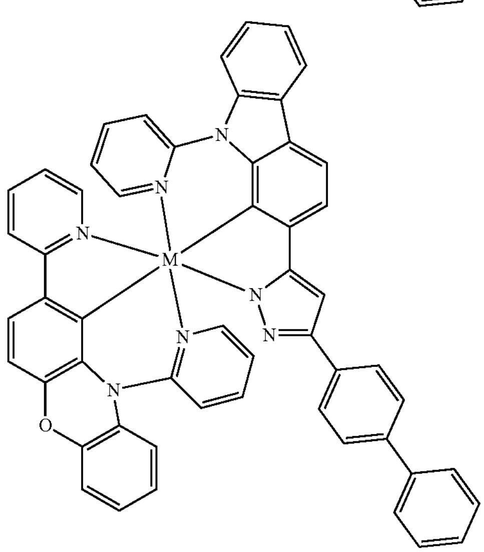
-continued
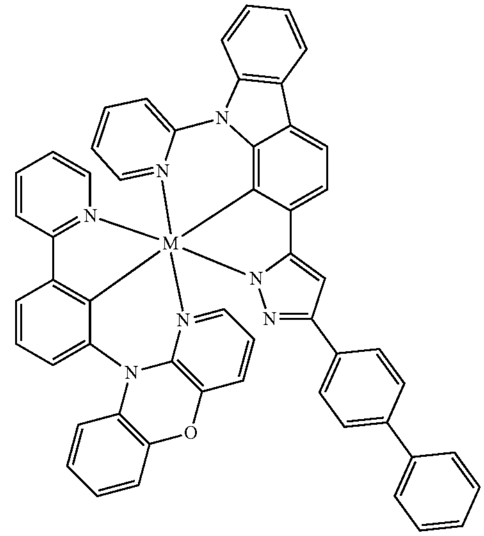
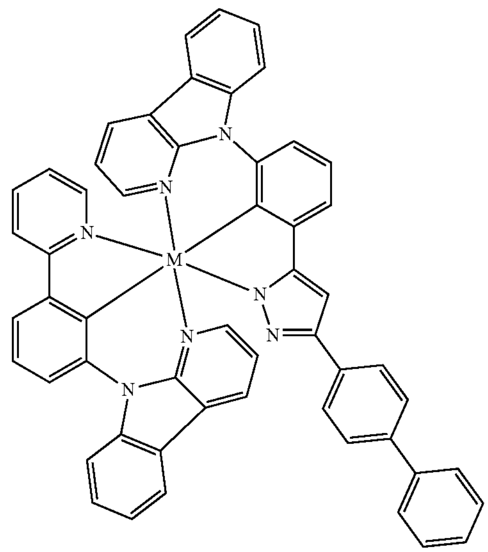
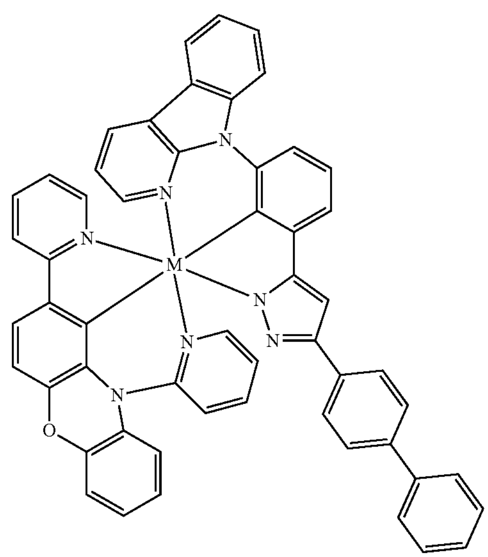

-continued
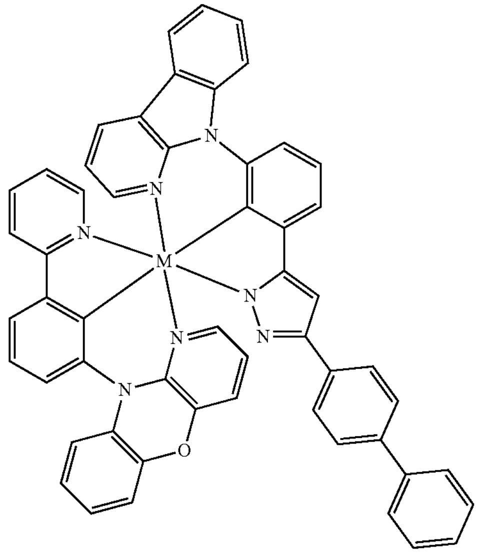
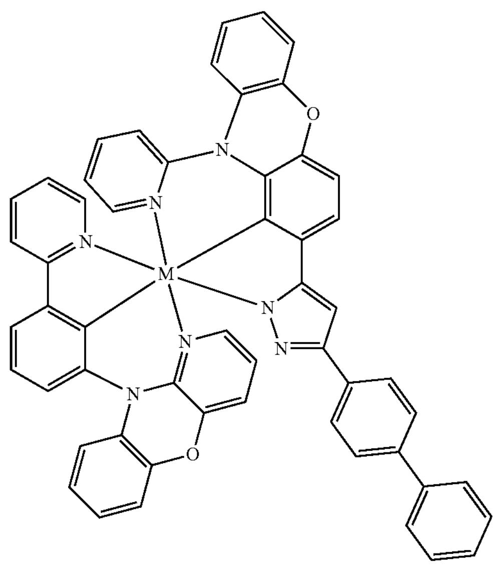
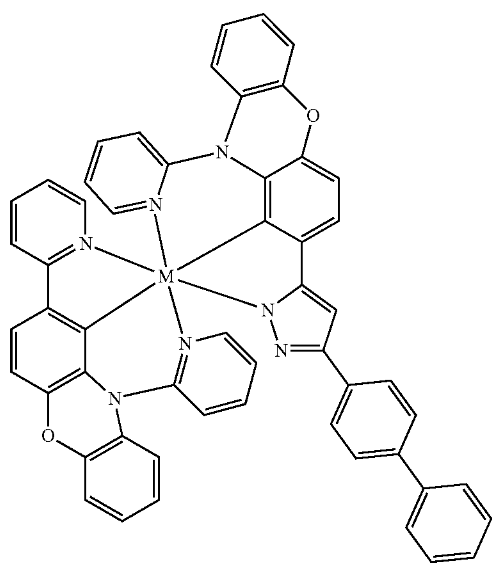
-continued
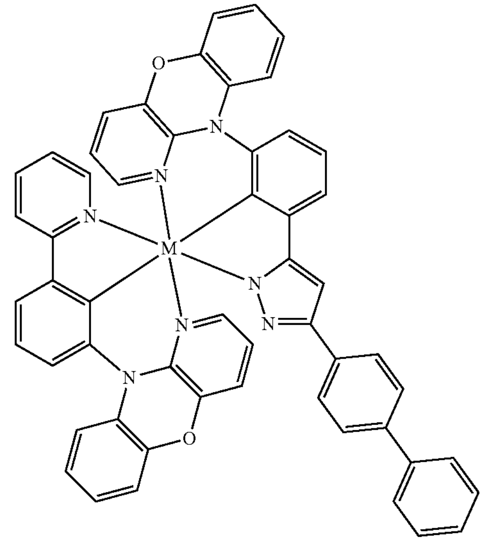
Structures M-39 (M = Ir, Rh)
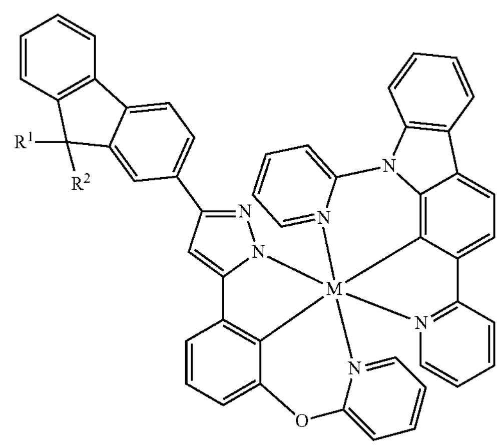
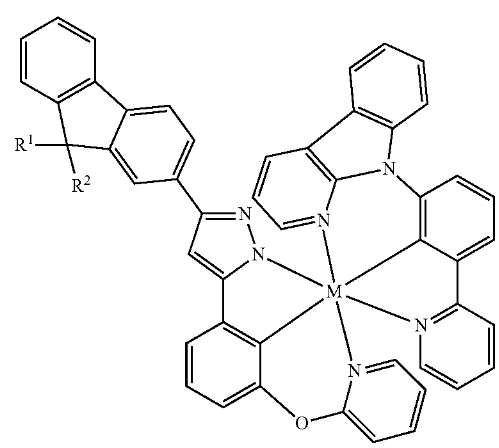

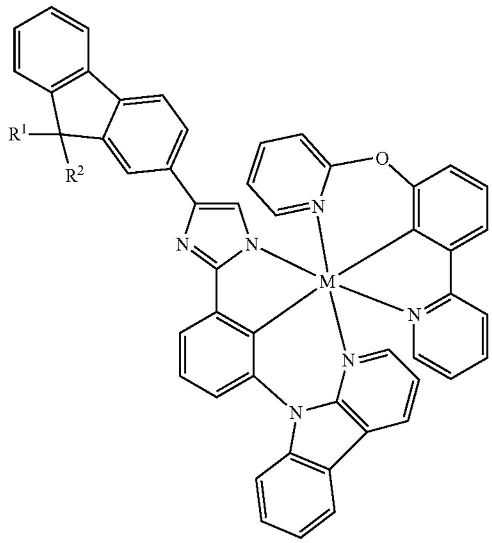
R1
R2
O
N
N
N
M
N
N
N
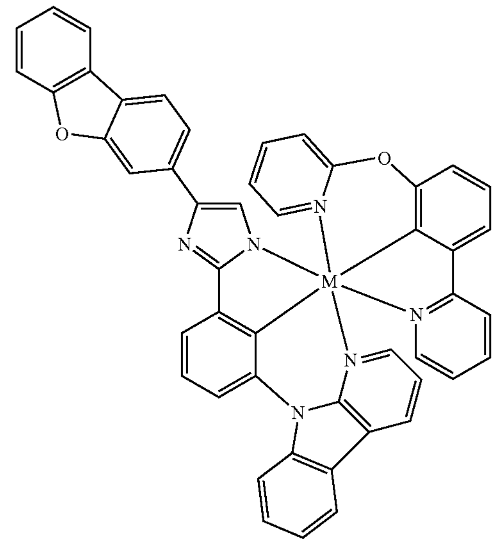
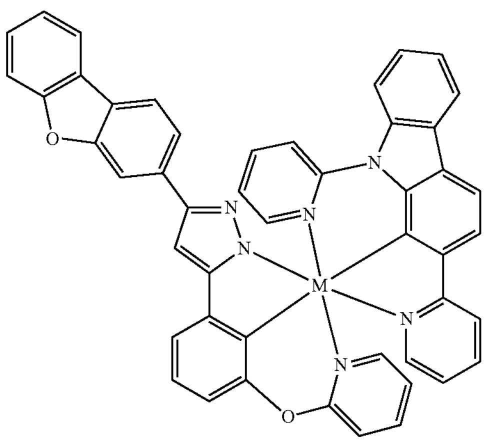
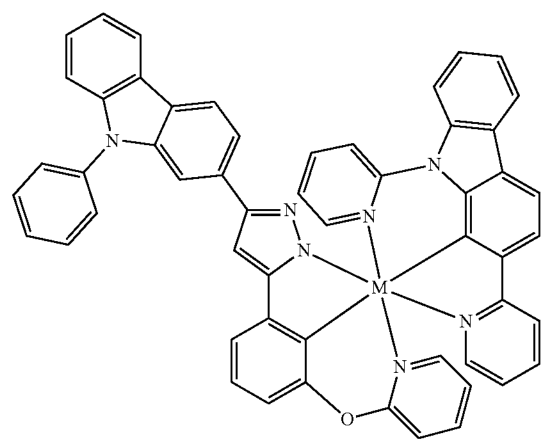
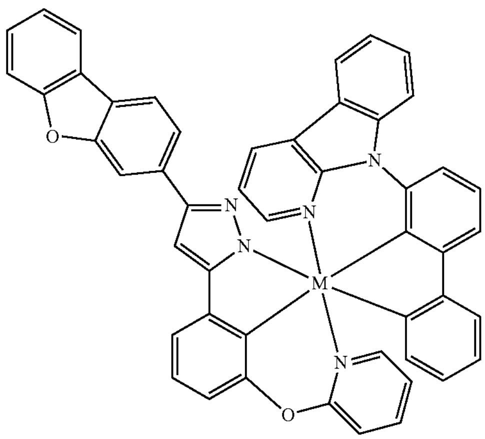
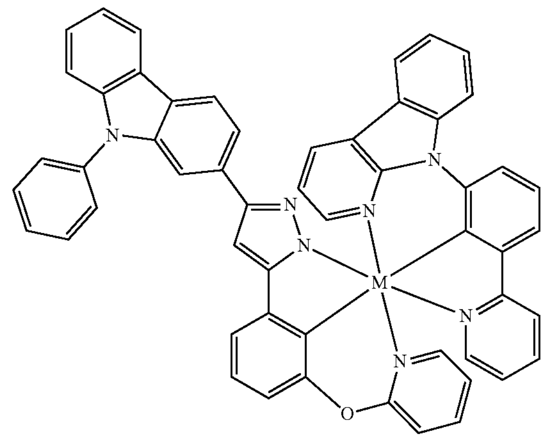

-continued
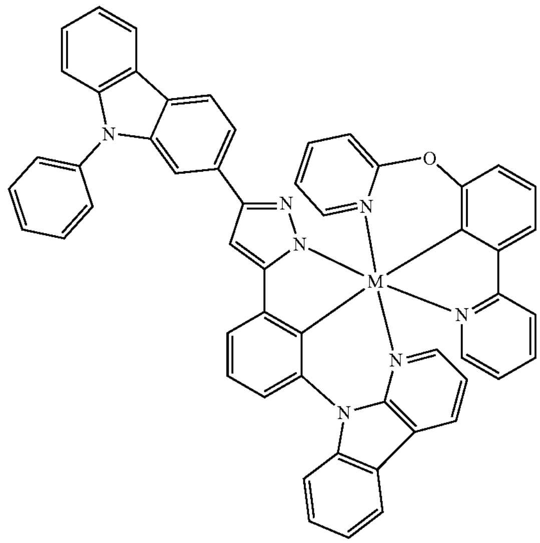
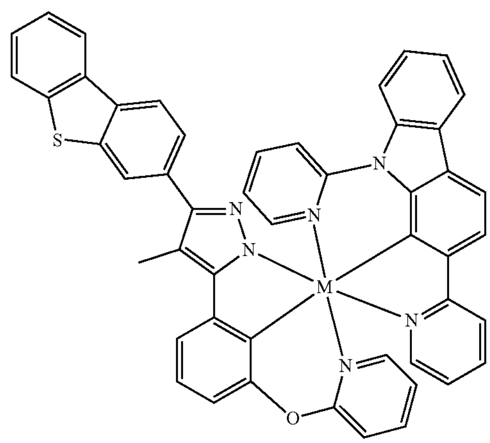
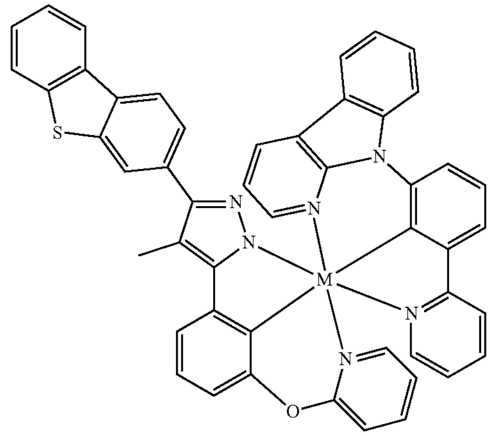
-continued
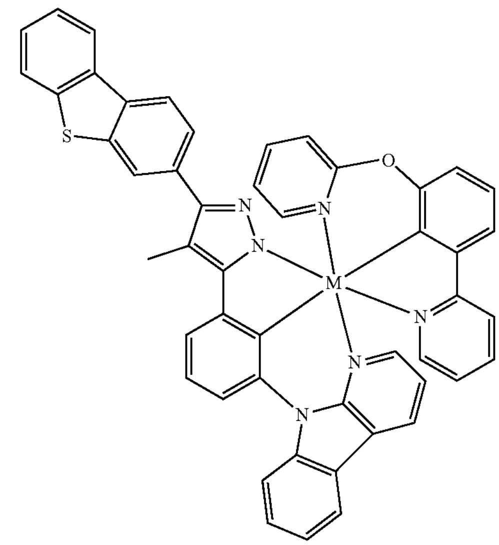
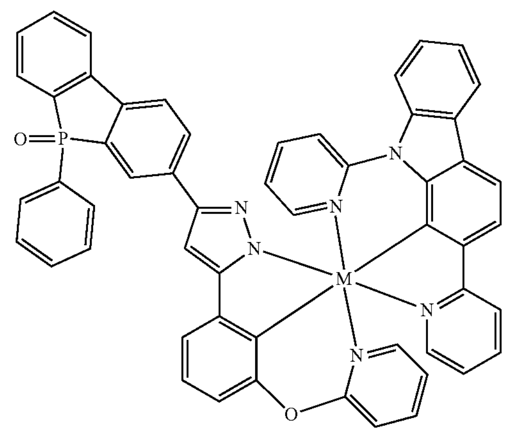
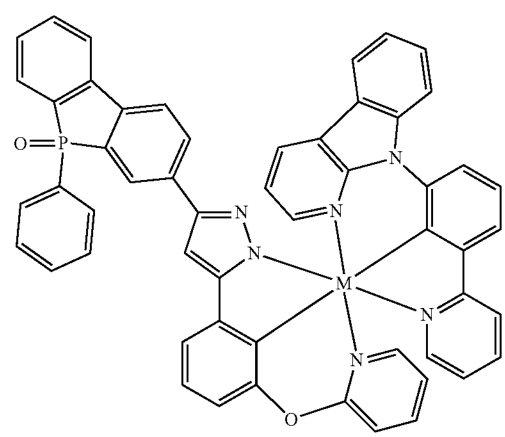

-continued

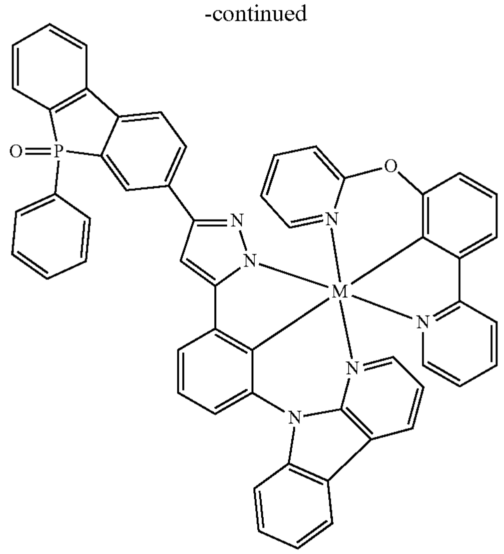

wherein:

each of R, $R^1$, and $R^2$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

Also disclosed herein are compositions including one or more of the compounds disclosed herein. These compositions are suitable for use in a wide variety of optical and electro-optical devices, including, for example, photo-absorbing devices such as solar- and photo-sensitive devices, organic light emitting diodes (OLEDs), photo-emitting devices, or devices capable of both photo-absorption and emission and as markers for bio-applications.

Also disclosed herein are devices including one or more of the compounds or compositions disclosed herein, including, for example, optical and electro-optical devices, including, for example, photo-absorbing devices such as solar- and photo-sensitive devices, organic light emitting diodes (OLEDs), photo-emitting devices, or devices capable of both photo-absorption and emission and as markers for bio-applications.

Figure 2:
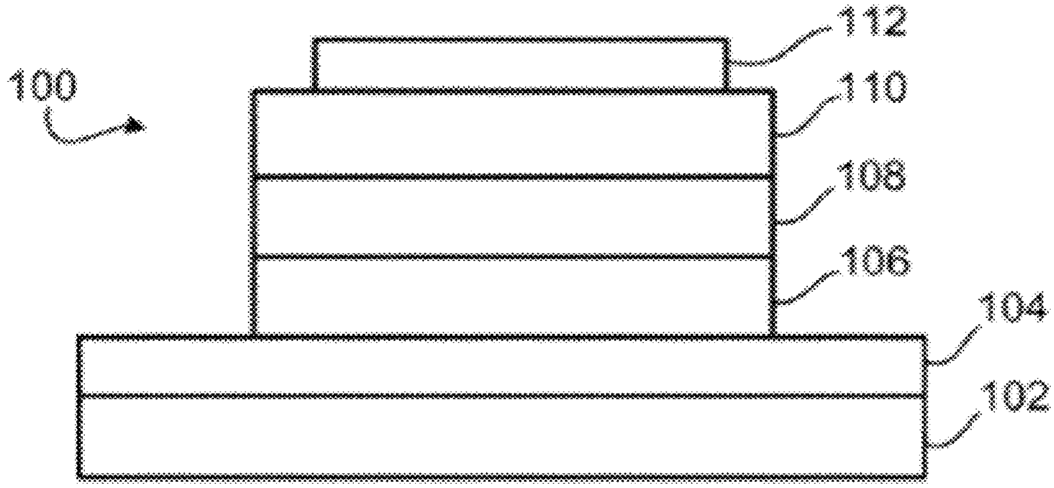
FIG. 2 depicts a cross-sectional view of an exemplary organic light emitting device (OLED).

Compounds described herein can be used in an OLED. FIG. 2 depicts a cross-sectional view of an OLED 100. OLED 100 includes substrate 102, anode 104, hole-transporting material(s) (HTL) 106, light processing material 108, electron-transporting material(s) (ETL) 110, and a metal cathode layer 112. Anode 104 is typically a transparent material, such as indium tin oxide. Light processing material 108 may be an emissive material (EML) including an emitter and a host.

In various aspects, any of the one or more layers depicted in FIG. 2 may include indium tin oxide (ITO), poly(3,4-ethylenedioxythiophene) (PEDOT), polystyrene sulfonate (PSS), N,N'-di-1-naphthyl-N,N-diphenyl-1,1'-biphenyl-4,4'diamine (NPD), 1,1-bis((di-4-tolylamino)phenyl)cyclohexane (TAPC), 2,6-Bis(N-carbazolyl)pyridine (mCpy), 2,8-bis(diphenylphosphoryl)dibenzothiophene (PO15), LiF, Al, or a combination thereof.

Light processing material 108 may include one or more compounds of the present disclosure optionally together with a host material. The host material can be any suitable host material known in the art. The emission color of an OLED is determined by the emission energy (optical energy gap) of the light processing material 108, which can be tuned by tuning the electronic structure of the emitting compounds and/or the host material. Both the hole-transporting material in the HTL layer 106 and the electron-transporting material(s) in the ETL layer 110 may include any suitable hole-transporter known in the art.

Compounds described herein may exhibit phosphorescence. Phosphorescent OLEDs (i.e., OLEDs with phosphorescent emitters) typically have higher device efficiencies than other OLEDs, such as fluorescent OLEDs. Light emitting devices based on electrophosphorescent emitters are described in more detail in WO2000/070655 to Baldo et al., which is incorporated herein by this reference for its teaching of OLEDs, and in particular phosphorescent OLEDs.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the scope of this disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Various methods for the preparation of compounds described herein are recited in the examples. These methods are provided to illustrate various methods of preparation, but are not intended to be limited to any of the methods recited herein. Accordingly, one of skill in the art in possession of this disclosure could readily modify a recited method or utilize a different method to prepare one or more of the compounds described herein. The following aspects are only exemplary and are not intended to be limiting. Temperatures, catalysts, concentrations, reactant compositions, and other process conditions can vary, and one of skill in the art, in possession of this disclosure, could readily select appropriate reactants and conditions for a desired complex.

$^1H$ spectra were recorded at 400 MHz, $^{13}C$ NMR spectra were recorded at 100 MHz on Varian Liquid-State NMR instruments in $CDCl_3$ or DMSO-$d_6$ solutions and chemical shifts were referenced to residual protiated solvent. If $CDCl_3$ was used as solvent, $^1H$ NMR spectra were recorded with tetramethylsilane (δ=0.00 ppm) as internal reference; $^{13}C$ NMR spectra were recorded with $CDCl_3$ (δ=77.00 ppm) as internal reference. If DMSO-$d_6$ was used as solvent, $^1H$ NMR spectra were recorded with residual $H_2O$ (δ=3.33 ppm) as internal reference; $^{13}C$ NMR spectra were recorded with DMSO-$d_6$ (δ=39.52 ppm) as internal reference. The following abbreviations (or combinations thereof) were used to explain $^1H$ NMR ultiplicities: s=singlet, d=doublet, t=triplet, q=quartet, p=quintet, m=multiplet, br=broad.

1. Example 1

Platinum complex Pt1aOpyCl was prepared according to the following scheme:

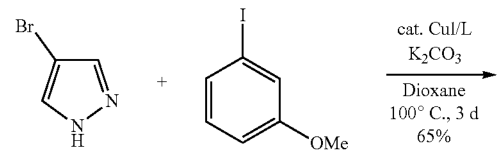
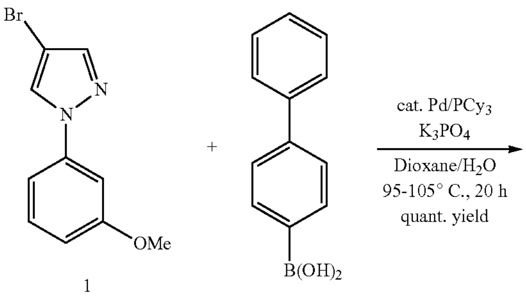
1
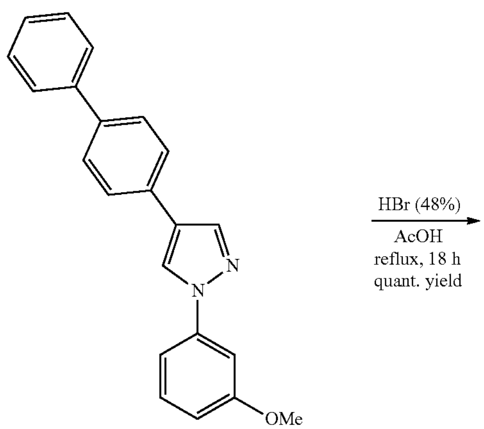
2
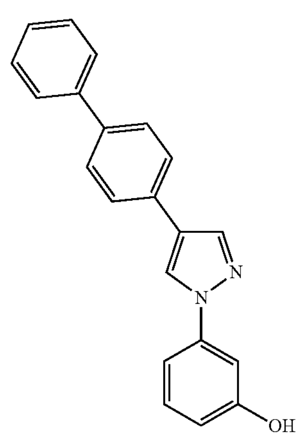
3
-continued
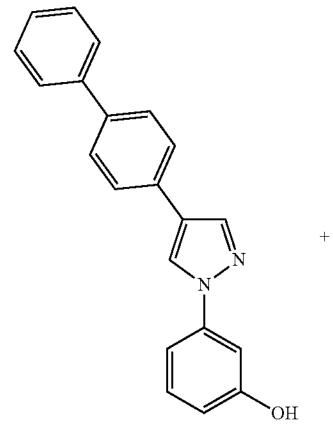
3
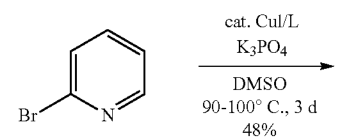
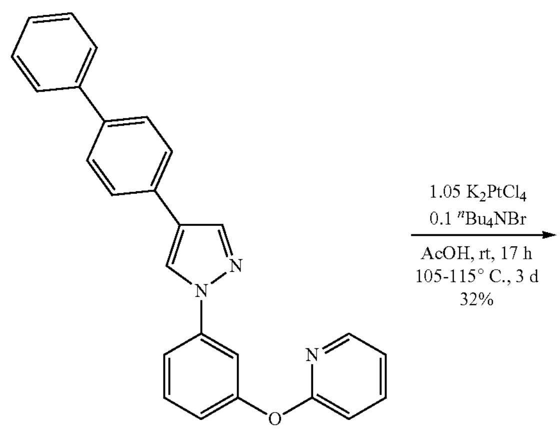
Ligand 1aOpy
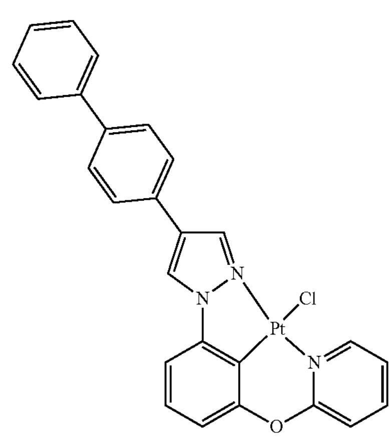
Pt1aOpyCl Synthesis of 4-bromo-1-(3-methoxyphenyl)-1H-pyrazole 1

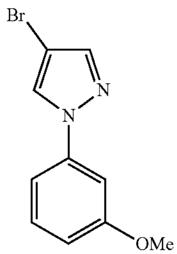 [SMILES: COc1cccc(-n2cc(Br)cn2)c1]

4-Bromo-1H-pyrazole (3.674 g, 25 mmol, 1.0 eq), CuI (95 mg, 0.5 mmol, 0.02 eq) and $K_2CO_3$ (7.256 g, 52.5 mmol, 2.1 eq) were added to a dry pressure tube equipped with a magnetic stir bar. Then trans-1,2-cyclohexanediamine (570 mg, 5 mmol, 0.2 eq), 1-iodo-3-methoxybenzene (3.57 mL, 30 mmol, 1.2 eq) and dioxane (50 mL) were added to a nitrogen-filled glove box. The mixture was bubbled with nitrogen for 5 minutes. The tube was sealed before being taken out of the glove box. The mixture was stirred in an oil bath at a temperature of 100° C. for two days. Then the mixture was cooled down to ambient temperature, filtered and washed with ethyl acetate. The filtrate was concentrated under reduced pressure and the residue was purified through column chromatography on silica gel using hexane and ethyl acetate (20:1-15:1) as eluent to obtain the desired product 4-bromo-1-(3-methoxyphenyl)-1H-pyrazole 1 as a colorless sticky liquid 4.09 g in 65% yield. $^1$H NMR (DMSO-$d_6$, 400 MHz): δ 3.82 (s, 3H), 6.89-6.92 (m, 1H), 7.39-7.41 (m, 3H), 7.86 (s, 1H), 8.81 (s, 1H). $^{13}$C NMR (DMSO-$d_6$, 100 MHz): δ 55.45, 94.92, 104.01, 110.35, 112.54, 128.30, 130.51, 140.26, 141.16, 160.15.

Synthesis of 4-(biphenyl-4-yl)-1-(3-methoxyphenyl)-1H-pyrazole 2

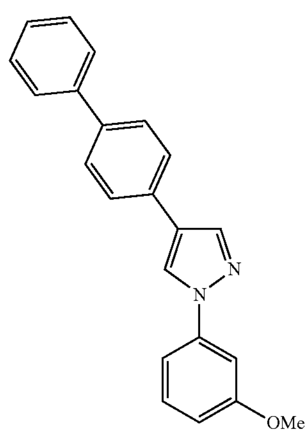 [SMILES: COc1cccc(-n2cc(-c3ccc(-c4ccccc4)cc3)cn2)c1]

To a three-necked flask equipped with a magnetic stir bar and a condenser was added biphenyl-4-ylboronic acid (1012 mg, 5.11 mmol, 1.2 eq), $Pd_2(dba)_3$ (156 mg, 0.17 mmol, 0.04 eq) and tricyclohexylphosphine $PCy_3$ (115 mg, 0.41 mmol, 0.096 eq). The tube was evacuated and backfilled with nitrogen. This evacuation and backfill procedure was repeated for another two cycles. Then a solution of 4-bromo-1-(3-methoxyphenyl)-1H-pyrazole 1 (1.078 g, 4.26 mmol, 1.0 eq) in dioxane (25 mL) and a solution of $K_3PO_4$ (1.537 g, 7.24 mmol, 1.7 eq) in $H_2O$ (10 mL) were added by syringe independently under nitrogen. The mixture was stirred in an oil bath at a temperature of 95-105° C. for 20 hours, cooled down to ambient temperature, filtered, and washed with ethyl acetate. The organic layer of the filtrate was separated, dried over sodium sulfate, filtered, concentrated under reduced pressure, and the residue was purified through column chromatography on silica gel using hexane/ethyl acetate (10:1-5:1-3:1) as eluent to obtain the desired product 4-(biphenyl-4-yl)-1-(3-methoxyphenyl)-1H-pyrazole 2 as a brown solid in quantitative yield. $^1$H NMR (DMSO-$d_6$, 400 MHz): δ 3.85 (s, 3H), 6.90 (dd, J=8.0, 2.4 Hz, 1H), 7.36-7.50 (m, 6H), 7.70-7.73 (m, 4H), 7.82 (d, J=8.4 Hz, 2H), 8.26 (s, 1H), 9.07 (s, 1H).

Synthesis of 3-(4-(biphenyl-4-yl)-1H-pyrazol-1-yl) phenol 3

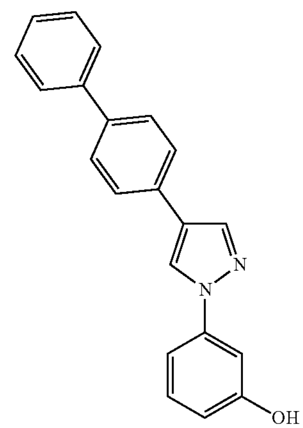 [SMILES: Oc1cccc(-n2cc(-c3ccc(-c4ccccc4)cc3)cn2)c1]

A solution of 4-(biphenyl-4-yl)-1-(3-methoxyphenyl)-1H-pyrazole 2 (4.26 mmol) in a mixture of acetic acid (20 mL) and hydrobromic acid (10 mL, 48%) was refluxed at 120-130° C. for 18 hours at a atmosphere of nitrogen. Then the mixture was cooled to room temperature. After most of the acetic acid was removed under reduced pressure, the residue was neutralized with a solution of $K_2CO_3$ in water until there was no further gas generation. Then the precipitate was filtered and washed with water for several times. The collected solid was dried in air to afford the product 3-(4-(biphenyl-4-yl)-1H-pyrazol-1-yl)phenol 3 as a brown solid in quantitative yield. $^1$H NMR (DMSO-$d_6$, 400 MHz): δ 6.59 (dt, J=6.8, 2.0 Hz, 1H), 7.23-7.28 (m, 3H), 7.32 (t, J=7.6 Hz, 1H), 7.43 (t, J=8.0 Hz, 2H), 7.67 (d, J=8.8 Hz, 4H), 7.77 (d, J=8.4 Hz, 2H), 8.19 (s, 1H), 8.94 (s, 1H), 9.76 (bs, 1H).

Synthesis of 2-(3-(4-(biphenyl-4-yl)-1H-pyrazol-1-yl)phenoxy)pyridine Ligand 1aOpy

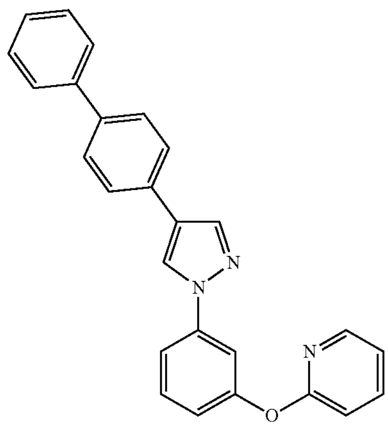

Ligand 1aOpy

To a dry pressure vessel equipped with a magnetic stir bar was added 3-(4-(biphenyl-4-yl)-1H-pyrazol-1-yl)phenol 3 (624 mg, 2.0 mmol, 1.0 eq), 2-bromopyridine (632 mg, 4.0 mmol, 2.0 eq), CuI (38 mg, 0.2 mmol, 0.1 eq), picolinic acid (49 mg, 0.4 mmol, 0.2 eq) and $K_3PO_4$ (849 mg, 4.0 mmol, 2.0 eq). The tube was evacuated and backfilled with nitrogen. This evacuation and backfill procedure was repeated for another two cycles. Then DMSO (12 mL) was added under nitrogen. The mixture was stirred at a temperature of 90-100° C. for 3 days and then cooled down to ambient temperature. Water was added to dissolve the solid. The mixture was extracted with ethyl acetate three times. The combined organic layer was washed with water three times and then dried over sodium sulfate and filtered. The filtrate was concentrated under reduced pressure and the residue was purified through column chromatography on silica gel using hexane/ethyl acetate (10:1) as eluent to obtain the desired product Ligand 1aOpy as a brown solid, 371 mg, 48% yield. $^{1}$H NMR (DMSO-$d_6$, 400 MHz): δ 7.08 (dd, J=8.0, 2.0 Hz, 1H), 7.11 (d, J=8.0 Hz, 1H), 7.15-7.18 (m, 1H), 7.34 (t, J=7.6 Hz, 1H), 7.45 (t, J=7.6 Hz, 2H), 7.55 (t, J=8.0 Hz, 1H), 7.68-7.71 (m, 5H), 7.77-7.81 (m, 3H), 7.86-7.91 (m, 1H), 8.18-8.19 (m, 1H), 8.27 (s, 1H), 9.10 (s, 1H). $^{13}$C NMR (DMSO-$d_6$, 100 MHz): δ 111.16, 111.72, 114.08, 118.89, 119.36, 123.88, 124.82, 125.84, 126.43, 127.10, 127.36, 128.93, 130.72, 130.86, 138.29, 138.90, 139.70, 140.36, 140.68, 147.52, 154.82, 162.80.

Synthesis of 2-(3-(4-(biphenyl-4-yl)-1H-pyrazol-1-yl)phenoxy)pyridine Platinum Complex Pt1aOpyCl

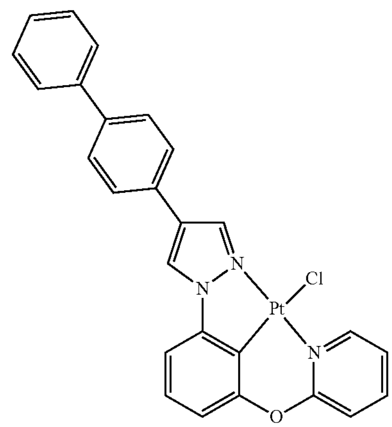

Pt1aOpyCl

Figure 3:
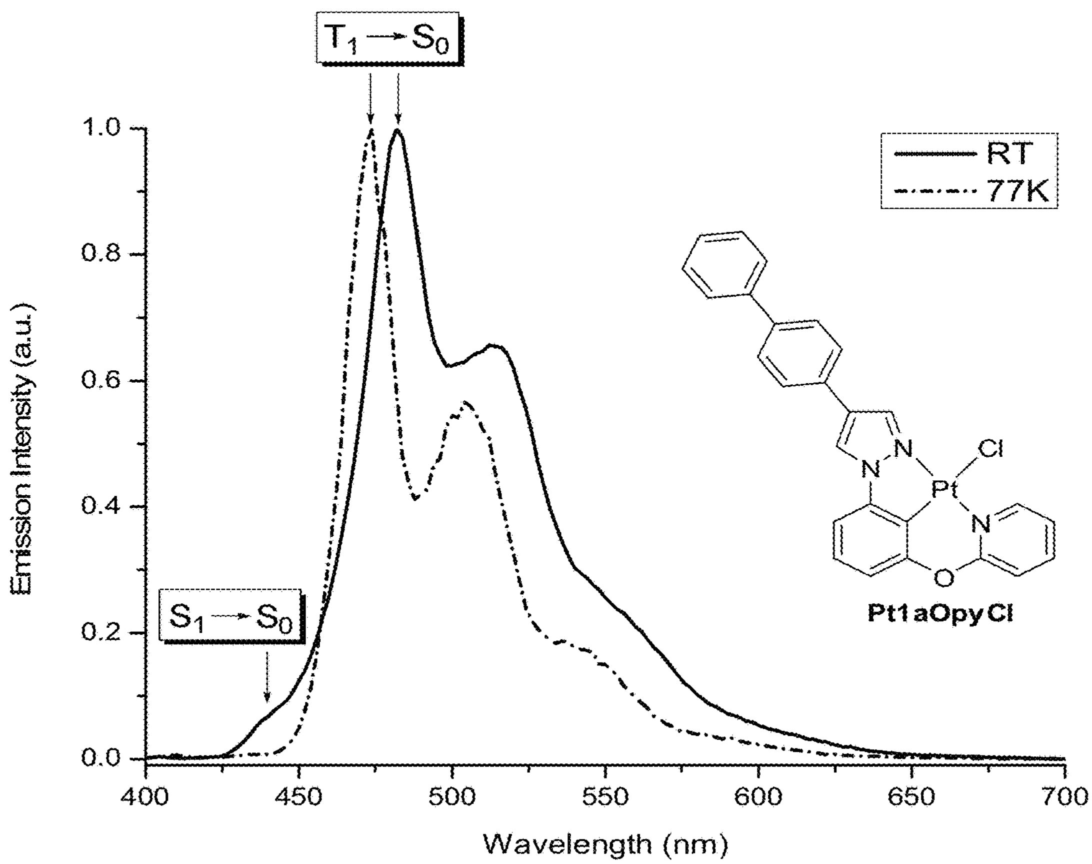
FIG. 3 shows emission spectra of Pt1aOpyCl in $CH_2Cl_2$ at room temperature and in 2-methyltetrahydrofuran at 77K.

To a dry pressure tube equipped with a magnetic stir bar was added 2-(3-(4-(biphenyl-4-yl)-1H-pyrazol-1-yl)phenoxy) pyridine Ligand 1aOpy (335 mg, 0.86 mmol, 1.0 eq), $K_2PtCl_4$ (378 mg, 0.90 mmol, 1.05 eq), $^{n}Bu_4NBr$ (28 mg, 0.086 mmol, 0.1 eq) and solvent acetic acid (52 mL) under nitrogen. After bubbling with nitrogen for 20 minutes, the tube was sealed and the mixture was stirred at room temperature for 17 hours, followed by 105-115° C. for 3 days. The resulting mixture was cooled to room temperature and water (104 mL) was added. The precipitate was filtered and washed with water twice, then washed with ethanol twice. Then the solid was dried in air under reduced pressure to yield a gray solid, 475 mg. The collected solid 314 mg was further purified by recrystallization from DMSO to obtain the platinum complex Pt1aOpyCl 112 mg in 32% total yield. FIG. 3 shows emission spectra of Pt1aOpyCl in $CH_2Cl_2$ at room temperature and in 2-methyltetrahydrofuran at 77K NMR (DMSO-$d_6$, 500 MHz): δ 7.05 (d, J=7.5 Hz, 1H), 7.30-7.33 (m, 1H), 7.38-7.42 (m, 2H), 7.48-7.53 (m, 3H), 7.57 (d, J=7.5 Hz, 1H), 7.74-7.76 (m, 2H), 7.79 (d, J=8.5 Hz, 2H), 7.89 (d, J=8.5 Hz, 2H), 8.21-8.25 (m, 1H), 8.57 (s, 1H), 9.48 (s, 1H), 9.92 (dd, J=6.5, 2.0 Hz, 1H). MS (MALDI) for $C_{26}H_{18}N_3OPt$ $[M-Cl]^+$: calcd 583.11, found 583.29.

2. Example 2

Platinum complex Pt1bOpyCl can be prepared according to the following scheme:

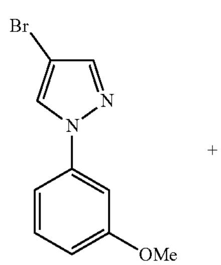

1

-continued
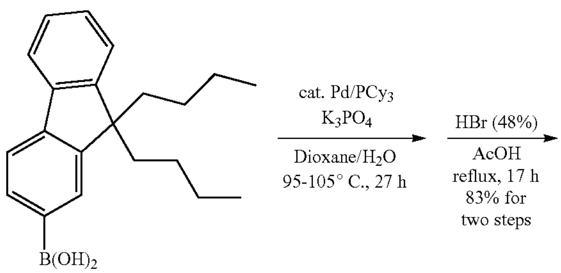
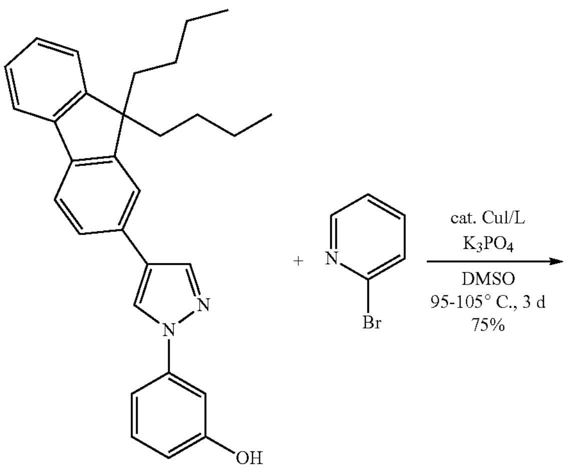
4
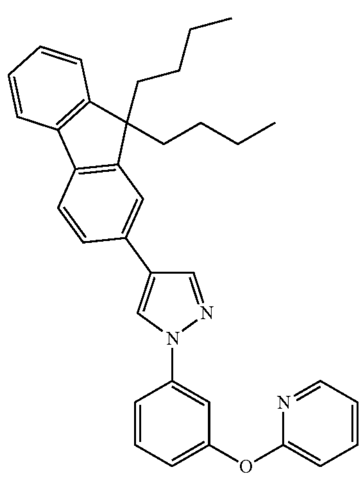
Ligand 1bOpy
-continued
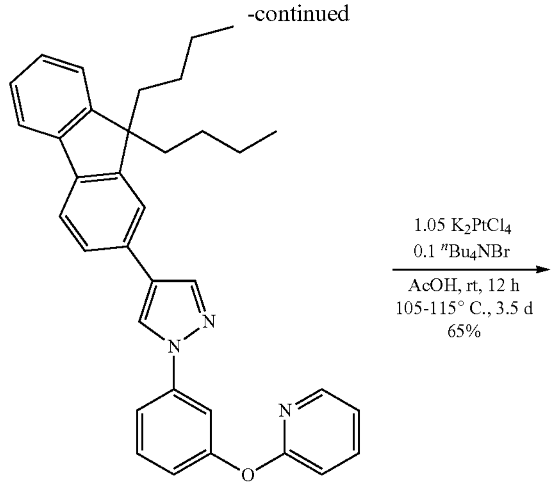
Ligand 1bOpy
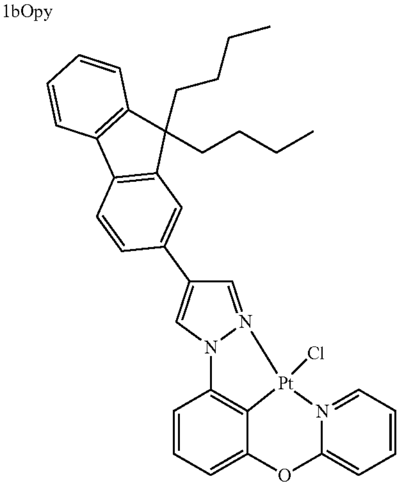
Pt1bOpyCl
Synthesis of 3-(4-(9,9-dibutyl-9H-fluoren-2-yl)-1H-pyrazol-1-yl)phenol 4
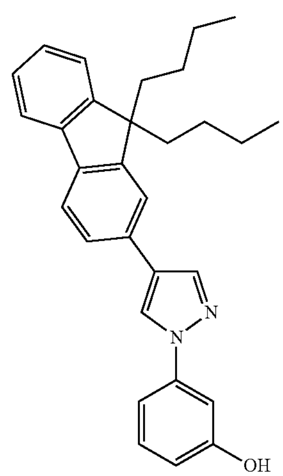 [SMILES: CCCCC1(CCCC)c2ccccc2-c2ccc(-c3cnn(-c4cccc(O)c4)c3)cc21]
To a three-necked flask equipped with a magnetic stir bar and a condenser was added 9,9-dibutyl-9H-fluoren-2-ylboronic acid (1.805 g, 5.60 mmol, 1.4 eq), $Pd_2(dba)_3$ (14 mg, 0.16 mmol, 0.04 eq) and tricyclohexylphosphine $PCy_3$ (108 mg, 0.38 mmol, 0.096 eq). Then the flask was evacuated and backfilled with nitrogen. The evacuation and back fill procedure was repeated for another two cycles. Then a solution of 4-bromo-1-(3-methoxyphenyl)-1H-pyrazole 1 (1.012 g, 4.00 mmol, 1.0 eq) in dioxane (25 mL) and a solution of $K_3PO_4$ (1.443 g, 6.80 mmol, 1.7 eq) in $H_2O$ (10 mL) were added by syringe independently under nitrogen. The mixture was stirred at a temperature of 95-105° C. for 27 hours, cooled down to ambient temperature, filtered, and washed with ethyl acetate. The organic layer of the filtrate was separated, dried over sodium sulfate, filtered, concentrated, and the residue was purified through column chromatography on silica gel using hexane/ethyl acetate (20:1-15) as eluent to obtain a colorless sticky liquid which was used directly for the next step. A solution of the sticky liquid in a mixture of acetic acid (30 mL) and hydrobromic acid (15 mL, 48%) was stirred at a temperature of 125-130° C. for 17 hours under nitrogen. Then the mixture was cooled to room temperature. After most of the acetic acid was removed under reduced pressure, the residue was neutralized with a solution of $K_2CO_3$ in water until there was no further gas generation. Then the precipitate was filtered off and washed with water several times. The collected solid was dried in air to afford the product 3-(4-(9,9-dibutyl-9H-fluoren-2-yl)-1H-pyrazol-1-yl)phenol 4 as a brown solid in 83% total yield for the two steps. $^1$H NMR (DMSO-$d_6$, 400 MHz): δ 0.19-0.32 (m, 4H), 0.37 (t, J=7.2 Hz, 6H), 0.74-0.84 (m, 4H), 1.78 (t, J=7.2 Hz, 4H), 6.48 (dt, J=6.8, 2.0 Hz, 1H), 7.03-7.10 (m, 5H), 7.18 (dd, J=6.4, 2.0 Hz, 1H), 7.44 (dd, J=8.0, 1.6 Hz, 1H), 7.53-7.58 (m, 3H), 8.01 (s, 1H), 8.75 (s, 1H), 9.55 (bs, 1H).

Synthesis of 2-(3-(4-(9,9-dibutyl-9H-fluoren-2-yl)-1H-pyrazol-1-yl)phenoxy)pyridine Ligand 1bOpy

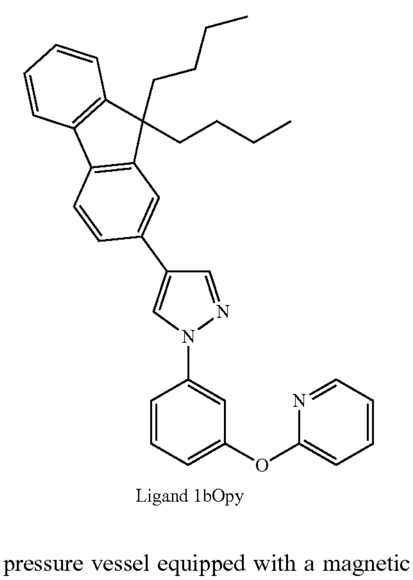

Ligand 1bOpy

To a dry pressure vessel equipped with a magnetic stir bar was added 3-(4-(9,9-dibutyl-9H-fluoren-2-yl)-1H-pyrazol-1-yl)phenol 4 (655 mg, 1.5 mmol, 1.0 eq), 2-bromopyridine (711 mg, 4.5 mmol, 3.0 eq), CuI (29 mg, 0.15 mmol, 0.1 eq), picolinic acid (37 mg, 0.30 mmol, 0.2 eq) and $K_3PO_4$ (637 mg, 3.0 mmol, 2.0 eq). The tube was evacuated and backfilled with nitrogen. This evacuation and backfill procedure was repeated for another two cycles. Then DMSO (9 mL) was added under nitrogen. The mixture was stirred at a temperature of 95-105° C. for 3 days and then cooled down to ambient temperature. Water was added to dissolve the salt. The mixture was extracted with ethyl acetate for three times. The combined organic layer was washed with water for three times and then dried over sodium sulfate and filtered. The filtrate was concentrated under reduced pressure and the residue was purified through column chromatography on silica gel using hexane/ethyl acetate (10:1-5:1-3:1) as eluent to obtain the desired product as a brown solid, 581 mg in 75% yield. $^1$H NMR (DMSO-$d_6$, 400 MHz): δ 0.46-0.58 (m. 4H), 0.62 (t, J=7.6 Hz, 6H), 0.99-1.06 (m, 4H), 2.03 (dd, J=8.4 Hz, 4H), 7.09-7.11 (m, 1H), 7.14 (d, J=8.4 Hz, 1H), 7.17-7.20 (m, 1H), 7.29-7.35 (m, 2H), 7.42-7.44 (m, 1H), 7.58 (t, J=8.0 Hz, 1H), 7.71 (dd, J=7.6, 1.6 Hz, 1H), 7.73 (t, J=2.0 Hz, 1H), 7.79-7.83 (m, 4H), 7.91 (td, J=8.4, 2.0 Hz, 1H), 8.21 (dd, J=5.2, 1.2 Hz, 1H), 8.32 (s, 1H), 9.13 (s, 1H).

Synthesis of 2-(3-(4-(9,9-dibutyl-9H-fluoren-2-yl)-1H-pyrazol-1-yl)phenoxy)pyridine Platinum Complex Pt1bOpyCl

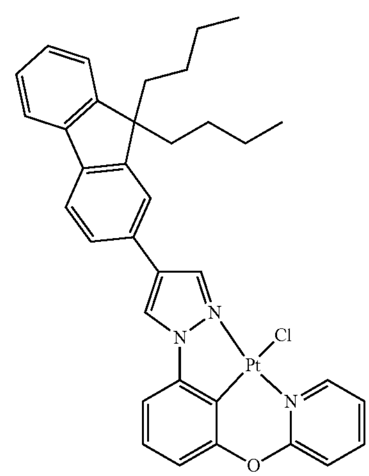

Pt1bOpyCl

Figure 4:
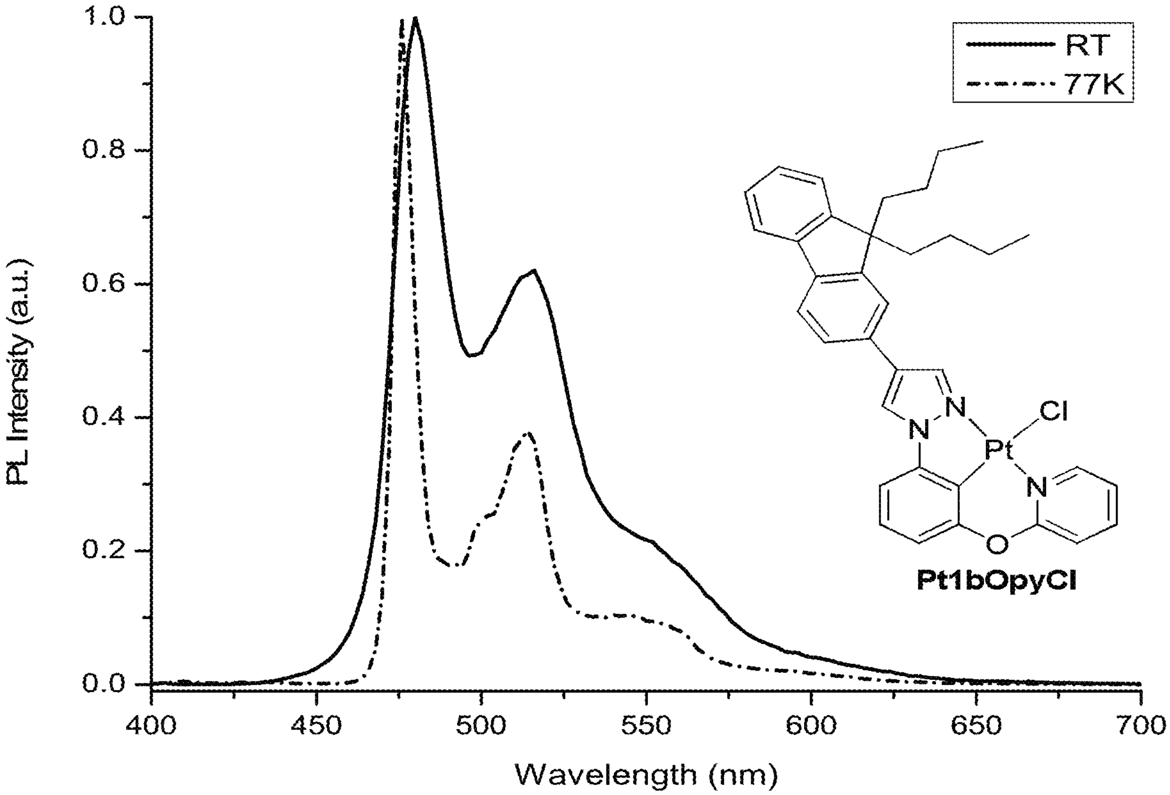
FIG. 4 shows emission spectra of Pt1bOpyCl in $CH_2Cl_2$ at room temperature and in 2-methyltetrahydrofuran at 77K.

To a dry pressure tube equipped with a magnetic stir bar was added 2-(3-(4-(9,9-dibutyl-9H-fluoren-2-yl)-1H-pyrazol-1-yl)phenoxy)pyridine Ligand 1bOpy (280 mg, 0.545 mmol, 1.0 eq), $K_2PtCl_4$ (240 mg, 0.572 mmol, 1.05 eq), $^nBu_4NBr$ (18 mg, 0.0545 mmol, 0.1 eq) and acetic acid (33 mL) under the protection of nitrogen. After bubbling with nitrogen for 20 minutes, the tube was sealed and the mixture was stirred at room temperature for 12 hours, then stirred at 105-115° C. for 3.5 days. The resulting mixture was cooled to room temperature. The precipitate was filtered and washed with water twice, then washed with ethanol twice. Then the solid was dried in air under reduced pressure and further purified by recrystallization in DMSO to obtain the platinum complex Pt1bOpyCl, 263 mg in 65% yield. FIG. 4 shows emission spectra of Pt1bOpyCl in $CH_2Cl_2$ at room temperature and in 2-methyltetrahydrofuran at 77K. $^1$H NMR (DMSO-$d_6$, 400 MHz): δ 0.45-0.57 (m, 4H), 0.64 (t, J=7.6 Hz, 6H), 1.02-1.11 (m, 4H), 2.02-2.16 (m, 4H), 7.04 (d, J=8.0 Hz, 1H), 7.30-7.42 (m, 4H), 7.46-7.48 (m, 1H), 7.52 (d, J=8.8 Hz, 1H), 7.58 (d, J=8.0 Hz, 1H), 7.77 (d, J=7.6 Hz, 1H), 7.84-7.86 (m, 1H), 7.90 (d, J=8.0 Hz, 1H), 7.95 (s, 1H), 8.24 (t, J=7.6 Hz, 1H), 8.63 (s, 1H), 9.47 (s, 1H), 9.94 (dd, J=5.2 Hz, 1H).

3. Example 3

Palladium complex Pd1bOpyAc can be prepared according to the following scheme:

Synthesis of 2-(3-(4-(9,9-dibutyl-9H-fluoren-2-yl)-1H-pyrazol-1-yl)phenoxy)pyridine Palladium Complex Pd1bOpyAc

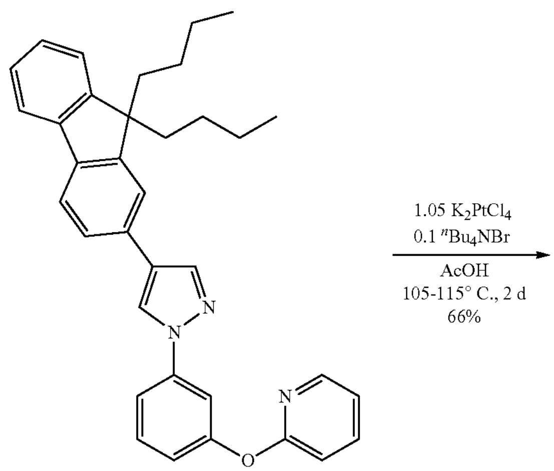

Ligand 1bOpy

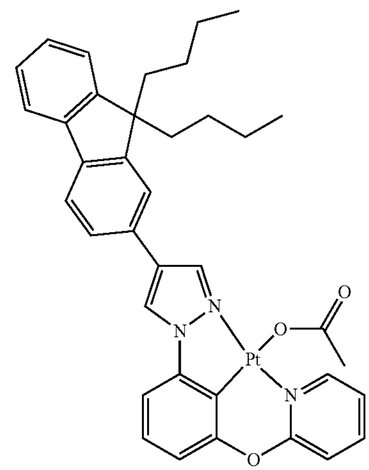

Pt1bOpyAc

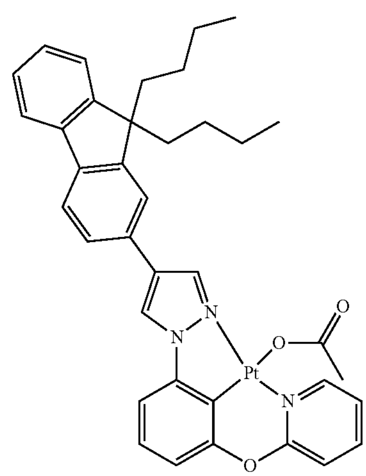

Pd1bOpyAc

Figure 5:
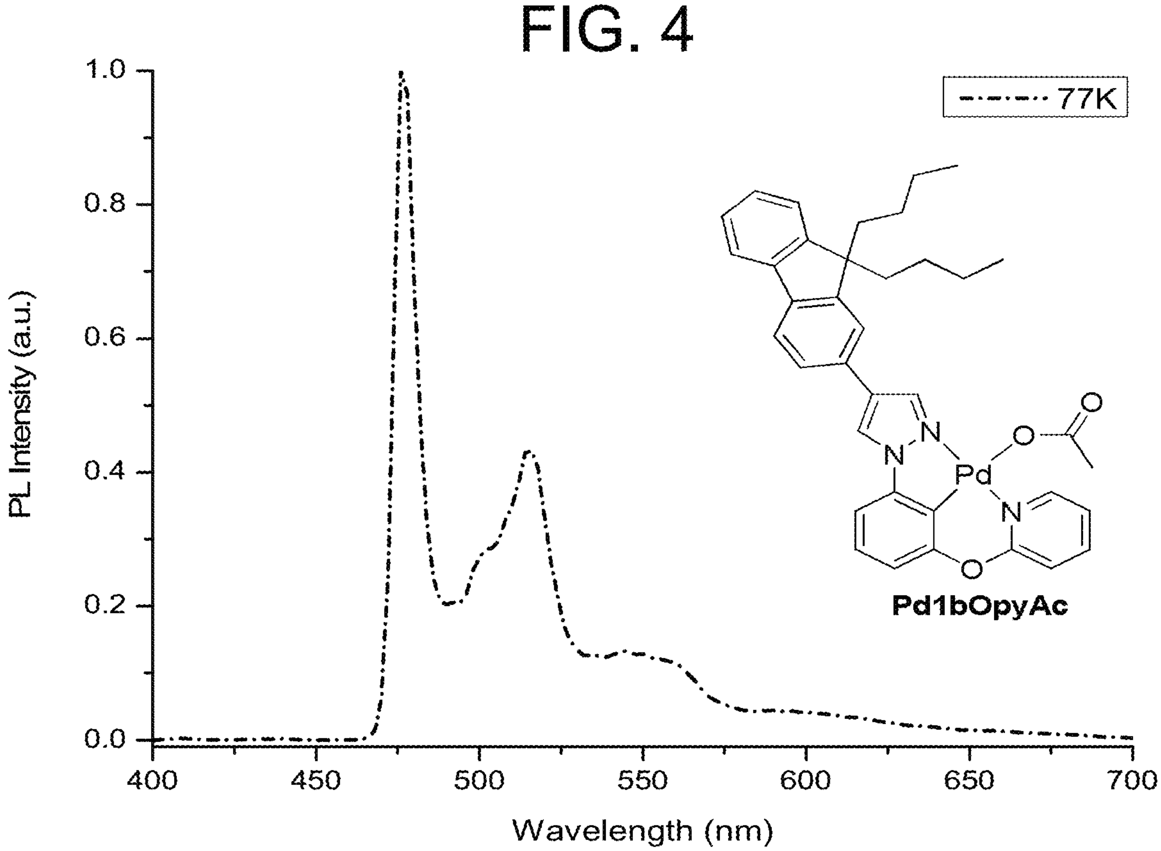
FIG. 5 shows an emission spectrum of Pd1bOpyAc in 2-methyltetrahydrofuran at 77K.

To a dry pressure tube equipped with a magnetic stir bar was added 2-(3-(4-(9,9-dibutyl-9H-fluoren-2-yl)-1H-pyrazol-1-yl)phenoxy)pyridine Ligand 1bOpy (280 mg, 0.545 mmol, 1.0 eq), $Pd(OAc)_2$ (128 mg, 0.572 mmol, 1.05 eq), $^nBu_4NBr$ (18 mg, 0.0545 mmol, 0.1 eq) and acetic acid (33 mL) under nitrogen. The mixture was stirred at 105-115° C. for 3.5 days then cooled to room temperature. The precipitate was filtered, the filtrate was concentrated under reduced pressure, and the resulting residue was diluted with water. The precipitate was filtered off and washed with water twice. Then the solid was dried in air under reduced pressure to obtain the palladium complex Pd1bOpyAc, 245 mg in 66% yield. FIG. 5 shows an emission spectrum of Pt1bOpyAc in 2-methyltetrahydrofuran at 77K. $^1$H NMR (DMSO-$d_6$, 400 MHz): δ 0.49-0.61 (m, 4H), 0.65 (t, J=7.2 Hz, 6H), 1.02-1.10 (m, 4H), 2.08 (t, J=8.0 Hz, 4H), 2.11 (s, 3H), 7.00 (d, J=7.6 Hz, 1H), 7.32-7.37 (m, 3H), 7.41 (t, J=8.0 Hz, 1H), 7.47-7.50 (m, 2H), 7.54 (d, J=7.6 Hz, 1H), 7.74 (d, J=7.6 Hz, 1H), 7.84-7.90 (m, 3H), 8.12 (t, J=7.6 Hz, 1H), 8.20 (bs, 1H), 8.76 (bs, 1H), 9.40 (s, 1H).

A number of embodiments have been described. Nevertheless, it will be understood that various modifications may be made without departing from the spirit and scope of the disclosure. Accordingly, other embodiments are within the scope of the following claims.

What is claimed is:

1. A compound represented by Formula B-I

Formula B-I

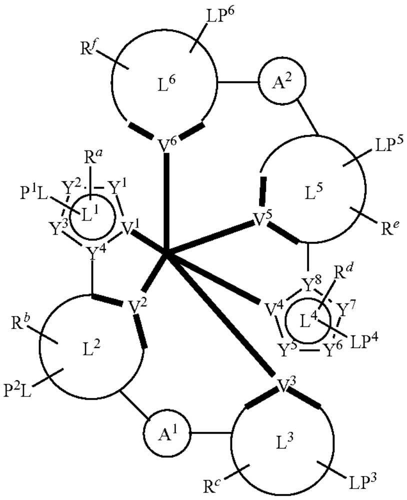

wherein:

M is Ir or Rh, each of $L^1$ and $L^4$ is independently a five-membered heterocyclyl with one, two, or three nitrogen atoms, each of $L^2$ and $L^5$ is independently substituted or unsubstituted phenyl, each of $L^3$ and $L^6$ is independently substituted or unsubstituted pyridine, each of $LP^1$, $LP^2$, $LP^3$, $LP^4$, $LP^5$, and $LP^6$ is independently a fluorescent luminophore, each of $LP^1$, $LP^2$, $LP^3$, $LP^4$, $LP^5$, and $LP^6$ is independently present or absent, and at least one of $LP^1$, $LP^2$, $LP^3$, $LP^4$, $LP^5$, and $LP^6$ is present, $A^1$ and $A^2$ are each independently NH, $NR^3$, or O, and $A^1$ optionally forms more than one bond with $L^2$, $L^3$, or both, thereby forming a ring system with $L^2$, a ring system with $L^3$, or both, and $A^2$ optionally forms more than one bond with $L^5$, $L^6$, or both, thereby forming a ring system with $L^5$, a ring system with $L^6$, or both, each of $V^1$, $V^3$, $V^4$, and $V^6$ is independently N or C, each of $V^2$ and $V^5$ is C, each of $Y^1$, $Y^2$, $Y^3$, $Y^4$, $Y^5$, $Y^6$, $Y^7$, and $Y^8$ is independently C, N, O, or S, each of $R^a$, $R^b$, $R^c$, $R^d$, $R^e$, and $R^f$ is independently present or absent, and if present each of $R^a$, $R^b$, $R^c$, $R^d$, $R^e$, and $R^f$ is independently a mono-, di-, tri- or tetra substitution, and each $R^a$, $R^b$, $R^c$, $R^d$, $R^e$, and $R^f$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, and $R^3$ is hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

2. The compound of claim 1, wherein the compound is represented by one of Formulas B-1 to B-5:

B-1

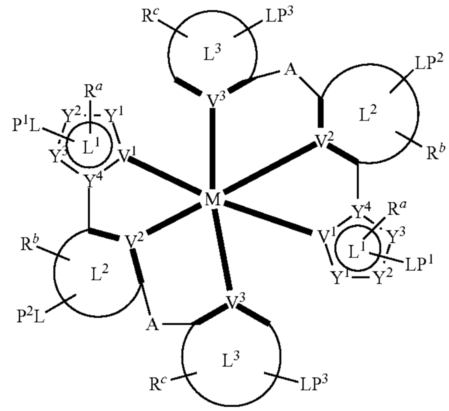

B-2

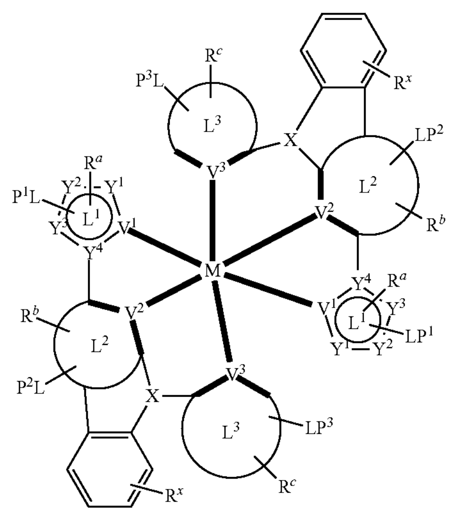

B-3

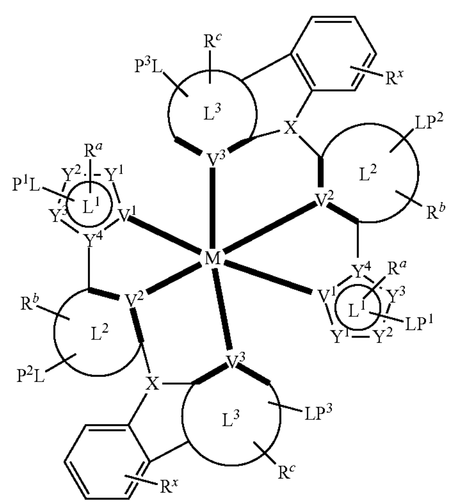

-continued

B-4

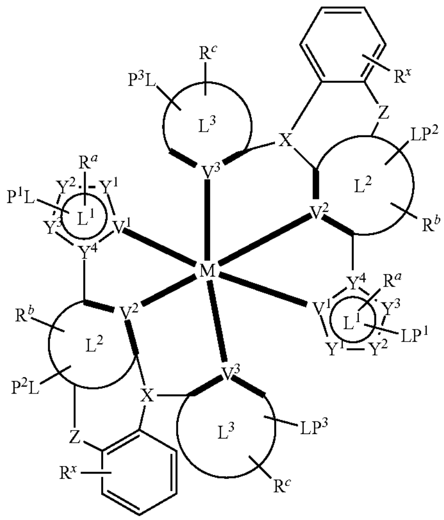

B-5

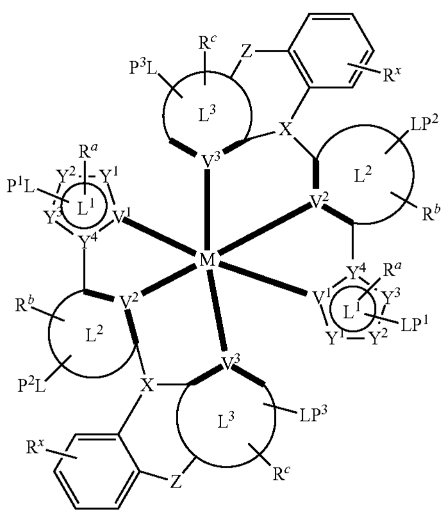

wherein Formulas B-1 through B-5 are symmetrical, and for Formulas B-1 through B-5:

$L^2$ is substituted or unsubstituted phenyl, $L^3$ is substituted or unsubstituted pyridine, each of $LP^1$, $LP^2$, and $LP^3$ is independently a fluorescent luminophore, each of $LP^1$, $LP^2$, and $LP^3$ is independently present or absent, and at least one of $LP^1$, $LP^2$, and $LP^3$ is present, A is NH, $NR^3$, or O, each of $V^1$ and $V^3$ is independently N or C, $V^2$ is C, each of $Y^1$, $Y^2$, $Y^3$, and $Y^4$ is independently C, N, O, or S, each of $R^a$, $R^b$, and $R^c$ is independently present or absent, and if present each of $R^a$, $R^b$, and $R^c$ is independently a mono-, di-, or tri-substitution, and each $R^a$, $R^b$, and $R^c$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, $R^3$ is hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof, X is N, each of Z is a linking atom or linking group, and $R^x$ is present or absent, and if present each $R^x$ is a mono-, di-, tri-, or tetra-substitution, and each $R^x$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

3. The compound of claim 2, wherein each of $LP^1$, $LP^2$, and $LP^3$, if present, is independently selected from the group consisting of:

an aromatic hydrocarbon, an aromatic hydrocarbon derivative, a polyphenyl hydrocarbon, a hydrocarbon with condensed aromatic nuclei, naphthalene, anthracene, phenanthrene, chrysene, pyrene, triphenylene, perylene, acenaphthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, an arylethylene derivative, an arylacetylene derivative, a diarylethylene, a diarylpolyene, a diaryl-substituted vinylbenzene, a distyrylbenzene, a trivinylbenzene, an arylacetylene, a functional substitution product of stilbene, a five-, six- or seven-membered heterocyclic compound derivative, a furan derivative, a thiophene derivative, a pyrrole derivative, an aryl-substituted oxazole, an 1,3,4-oxadiazole, an 1,3,4-thiadiazole, an aryl-substituted 2-pyrazoline, an aryl-substituted pyrazole, a benzazole, 2H-benzotriazole, a substitution product of 2H-benzotriazole, a heterocycle with one, two, or three nitrogen atoms, an oxygen-containing heterocycle, a coumarin, a coumarin derivative, a dye, an acridine dye, a xanthene dye, an oxazine, thiazine, and derivatives thereof.

4. The compound of claim 2, wherein

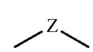

is one of the following:

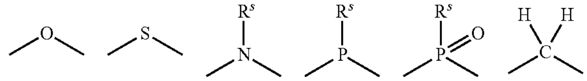

-continued

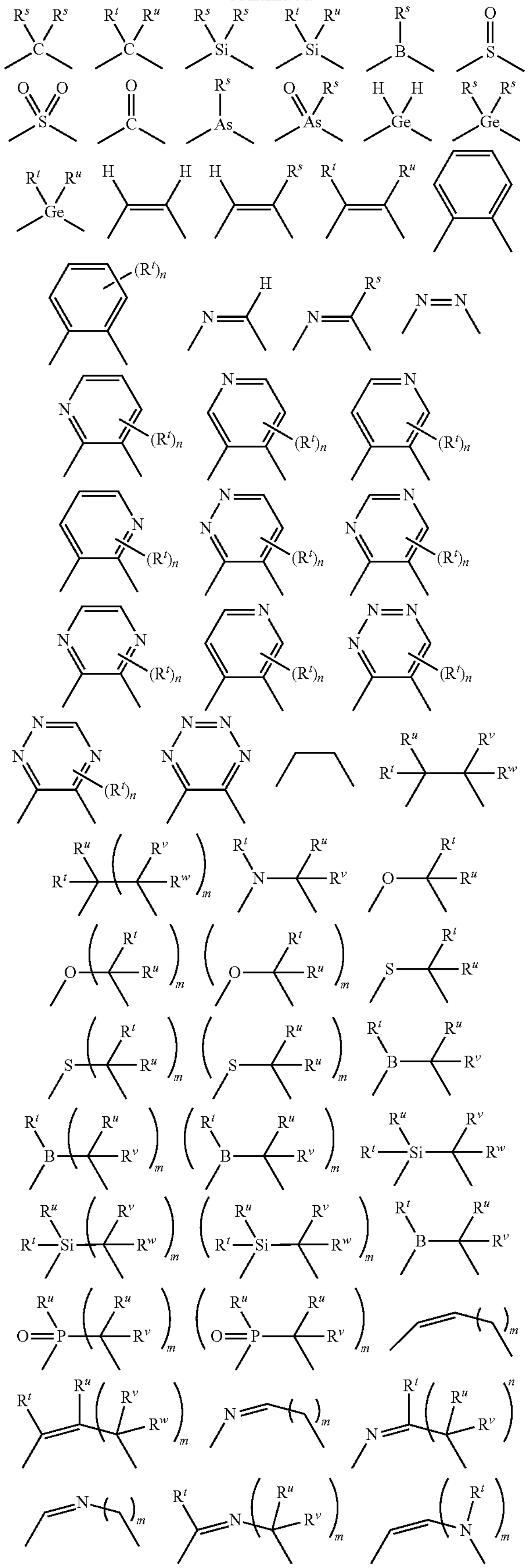

-continued

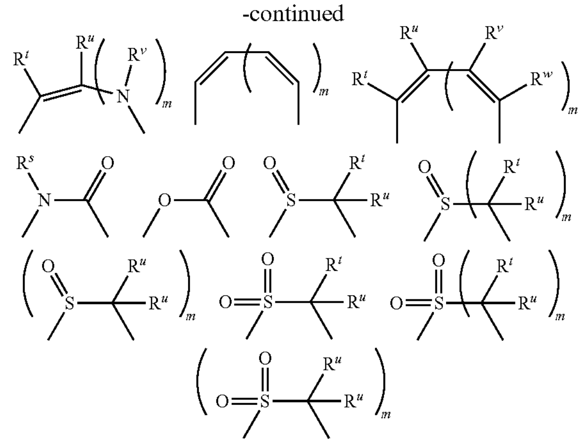

wherein:

n is an integer from 0 to 4, m is an integer from 1 to 3, each of $R^s$, $R^t$, $R^u$, and $R^v$ is hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, and any conjugate or combination thereof.

5. The compound of claim 1, wherein each of

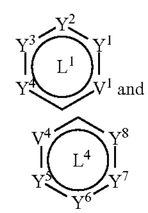

is independently selected from the group consisting of:

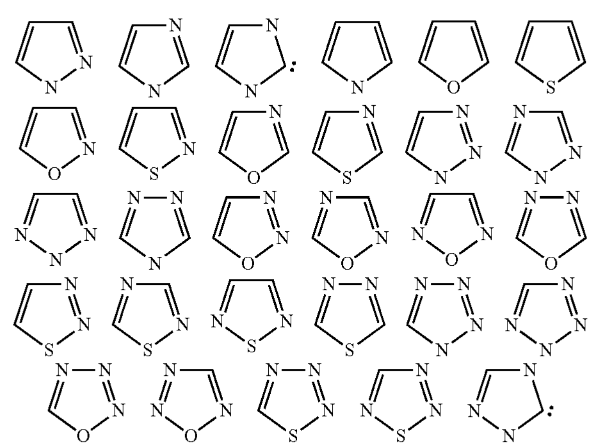

-continued
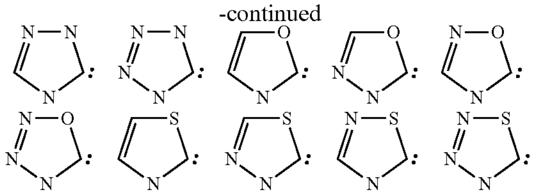
6. The compound of claim 1, wherein: each of
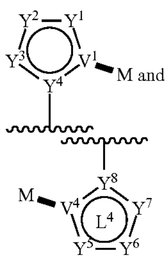
independently represents one of the following structures:
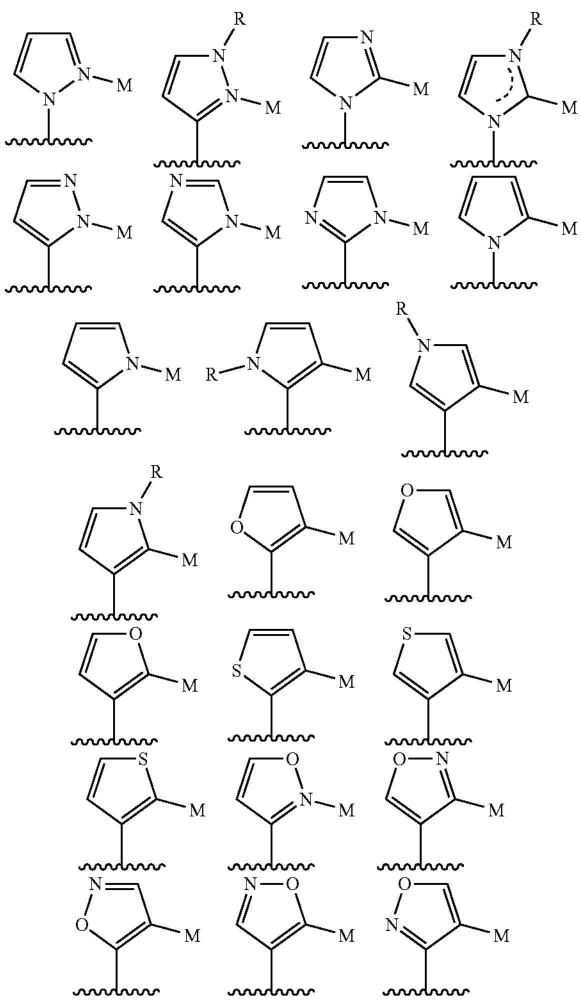
-continued
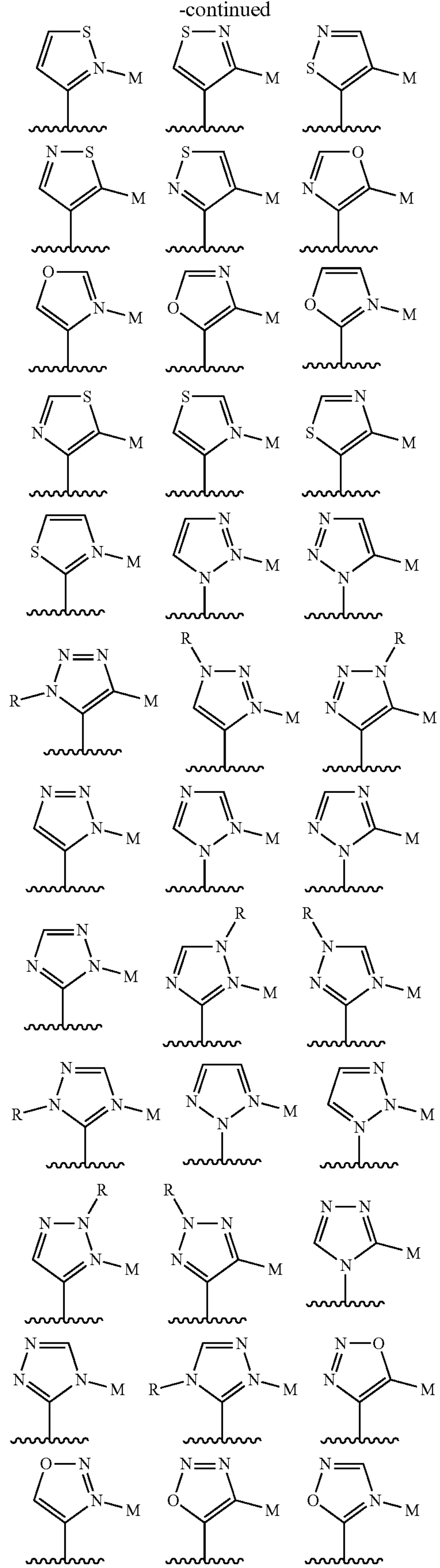

-continued
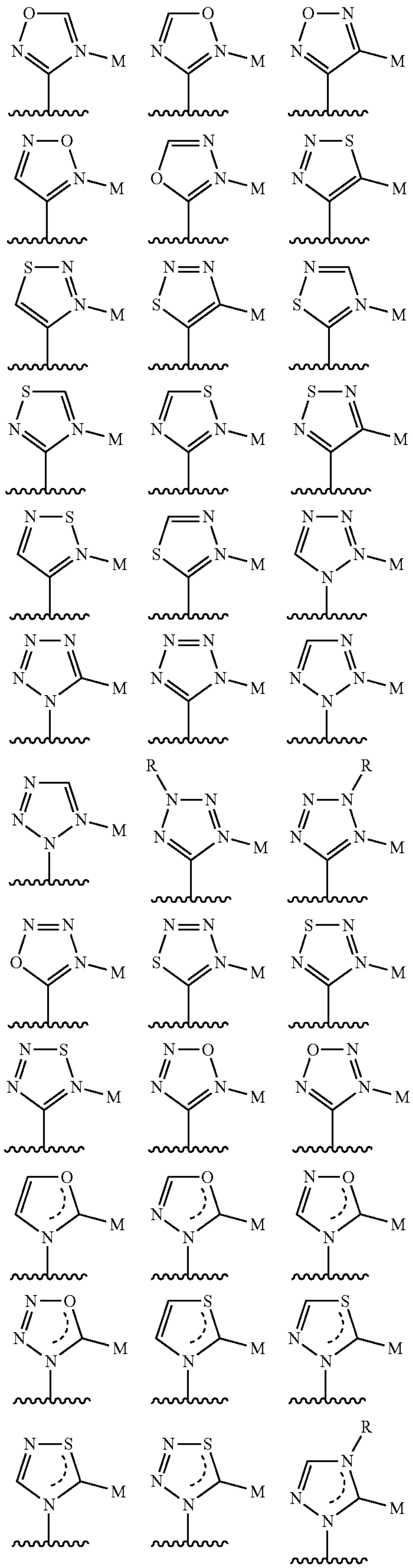
-continued
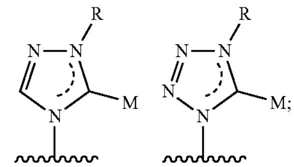
each of
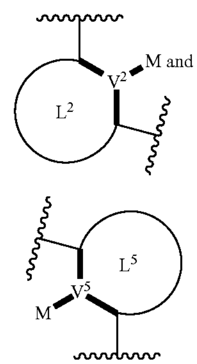
independently represents one of the following structures: and each of
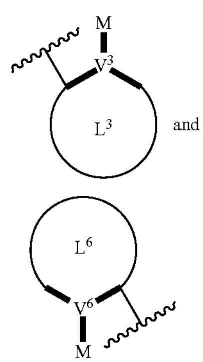
independently represents one of the following structures:
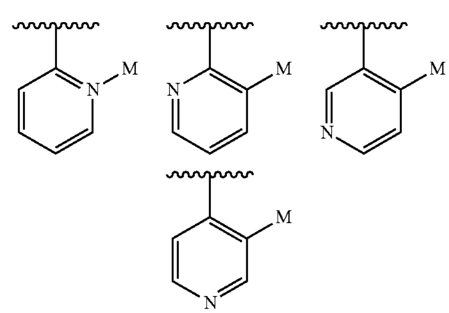

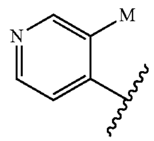
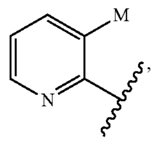

and

R is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, monoalkylamino, dialkylamino, monoarylamino, diarylamino, alkoxy, aryloxy, haloalkyl, aralkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, polymeric, or any conjugate or combination thereof.

7. The compound of claim 2, wherein each of $LP^1$, $LP^2$, and $LP^3$, if present, is independently selected from the group consisting of:

aromatic hydrocarbons selected from the group consisting of:

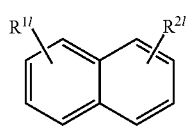
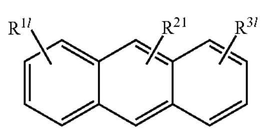
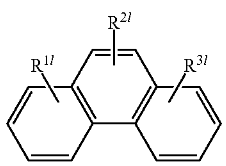
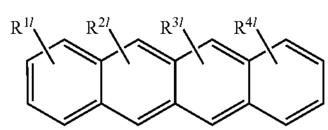
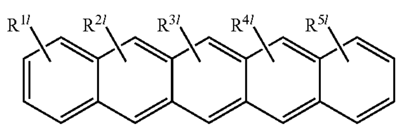
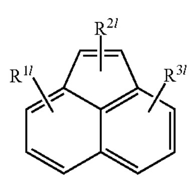
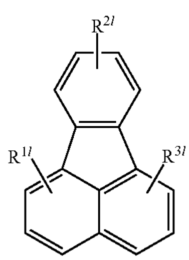
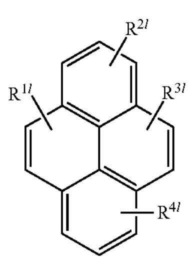
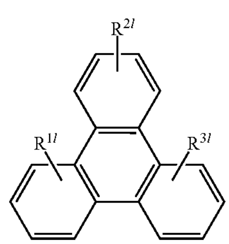

-continued

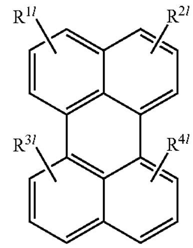
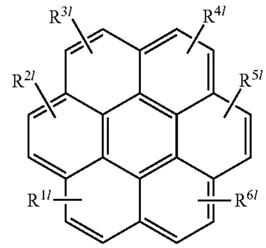
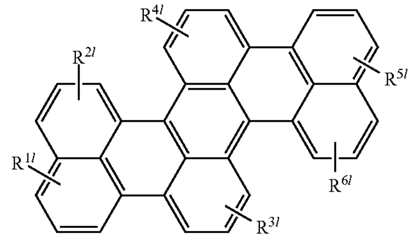
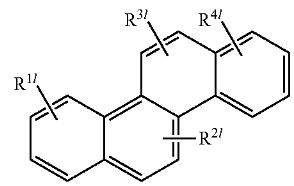
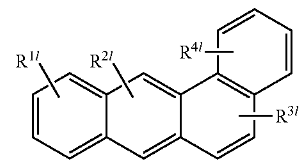
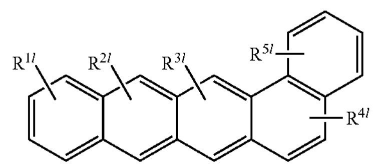
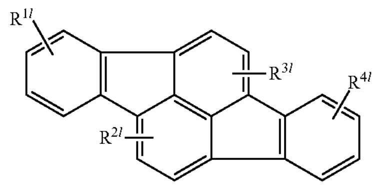
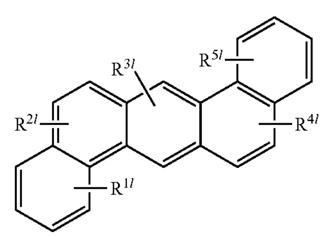
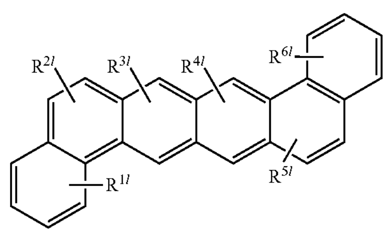
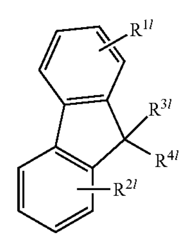

-continued
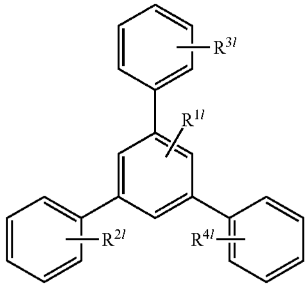
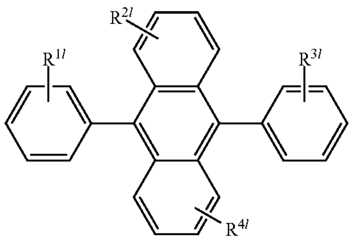
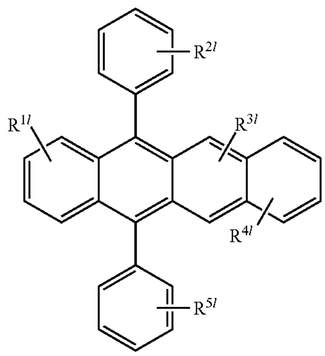
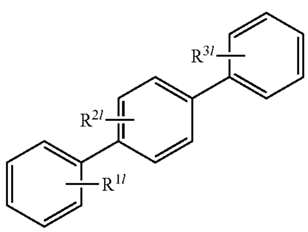
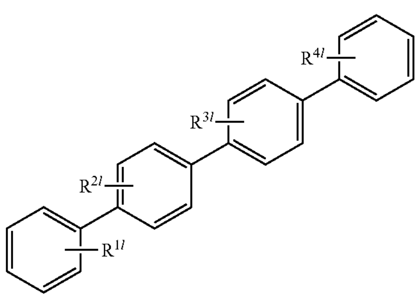
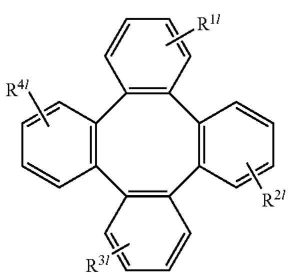
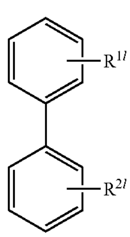
-continued
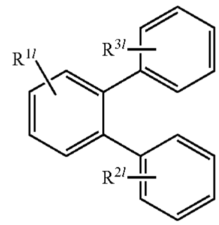
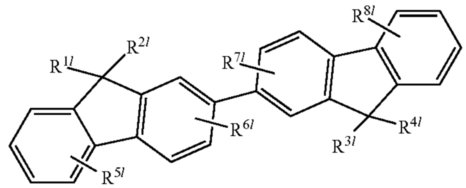
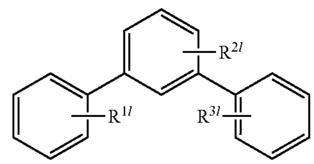
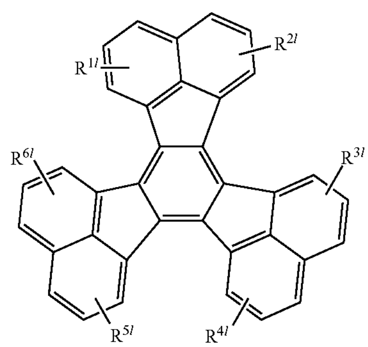
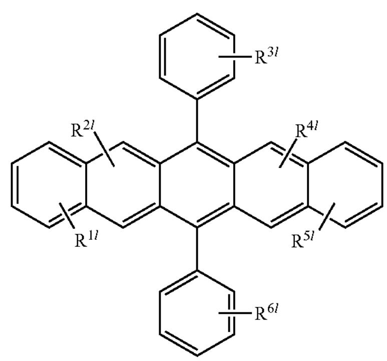
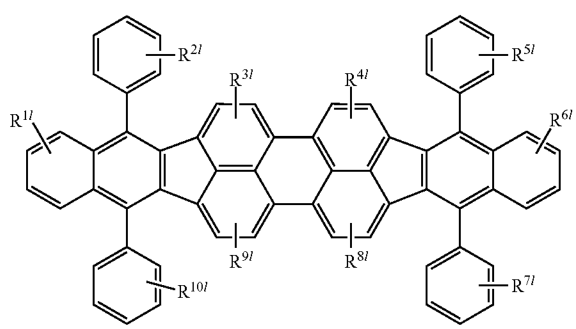

-continued
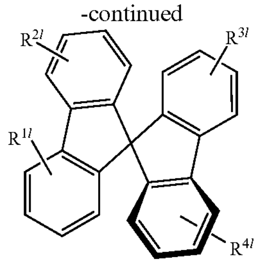
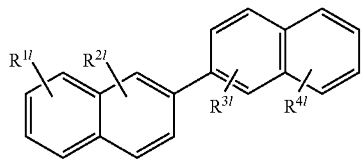
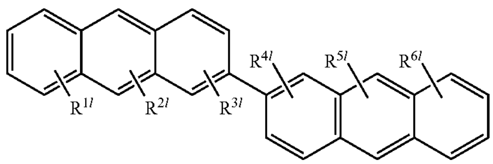
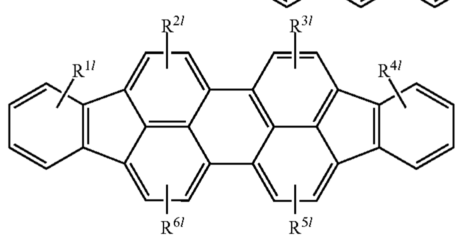
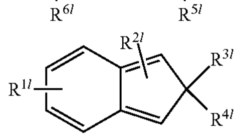
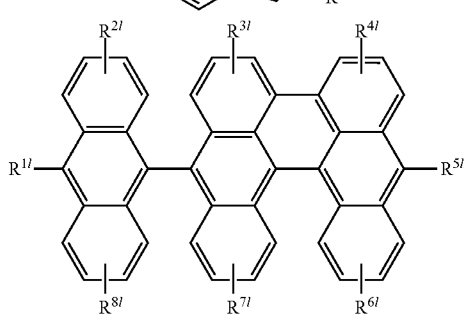
and derivatives thereof,
arylethylenes and arylacetylenes selected from the group consisting of:
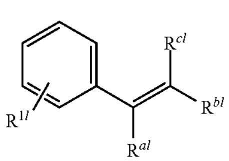
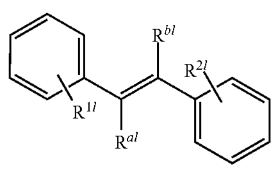
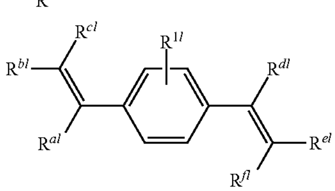
-continued
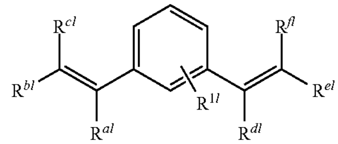
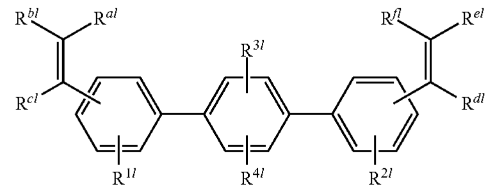
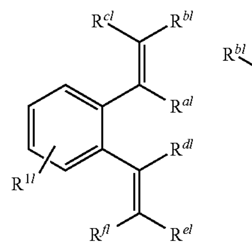
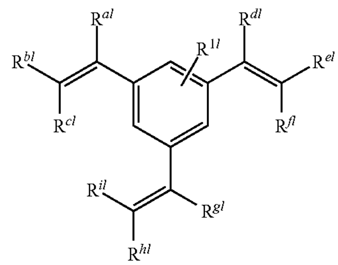
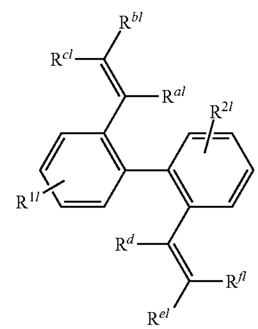
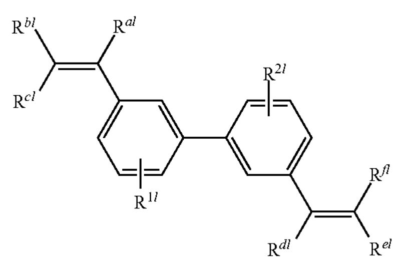
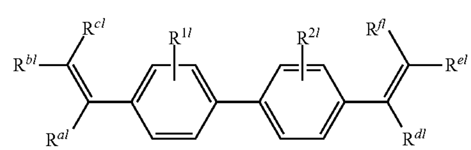
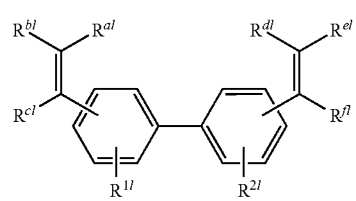

-continued
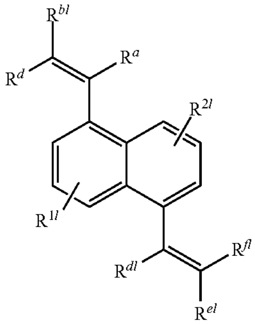
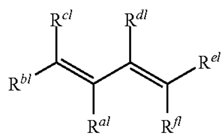
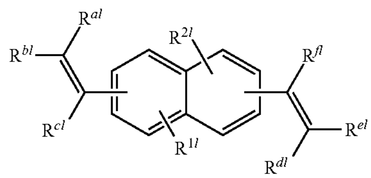
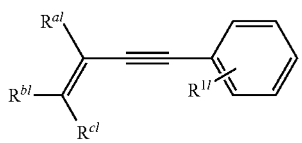
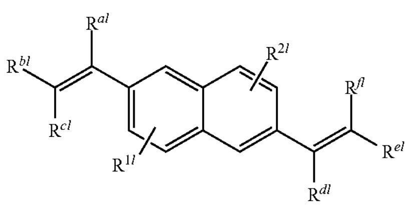
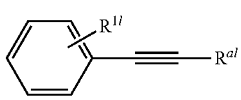
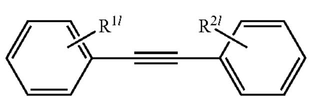
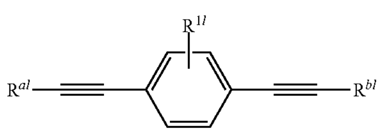
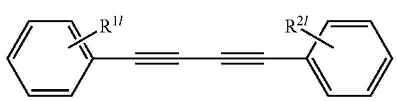
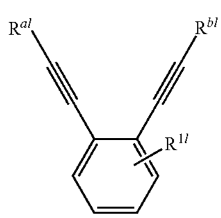
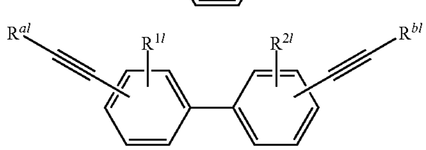
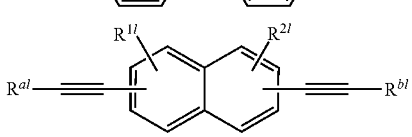
-continued
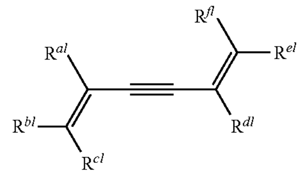
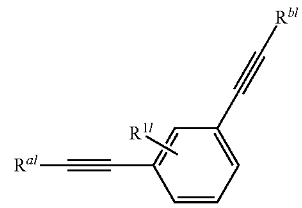
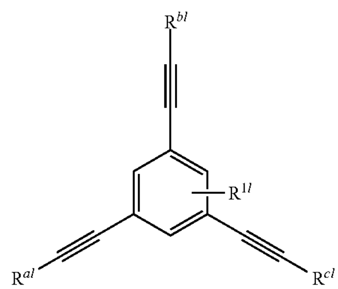
and derivatives thereof,
heterocyclic compounds selected from the group consisting of:
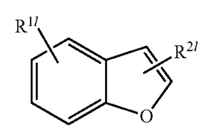
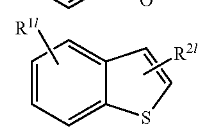
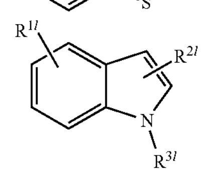
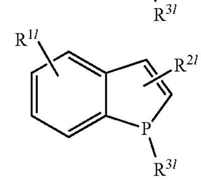
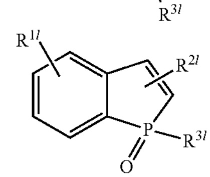
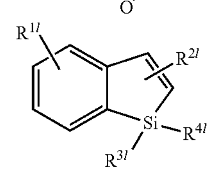

-continued
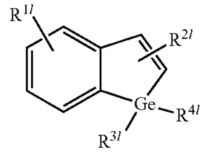
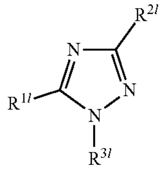
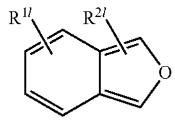
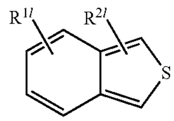
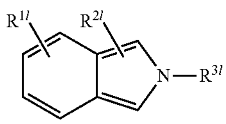
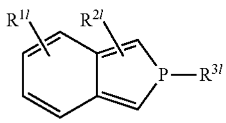
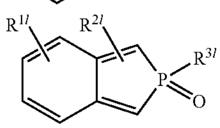
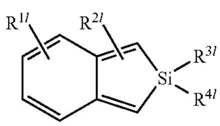
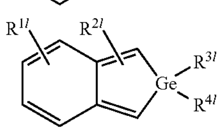
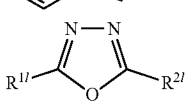
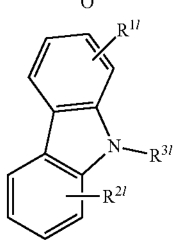
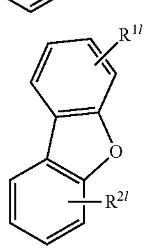
-continued
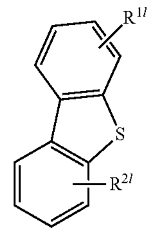
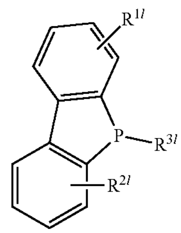
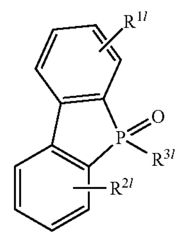
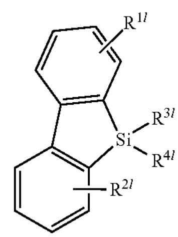
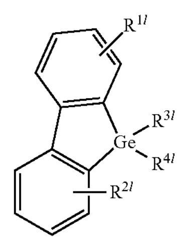
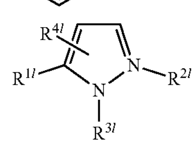
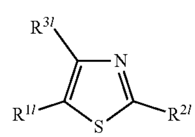
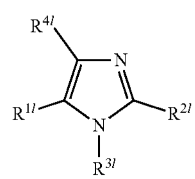
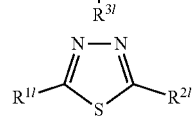

-continued
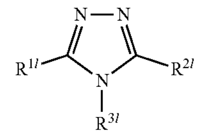
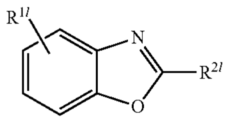
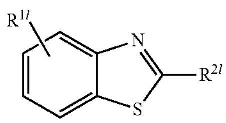
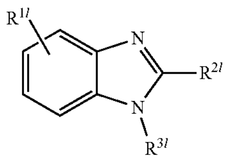
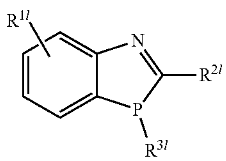
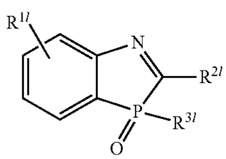
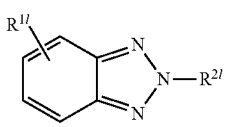
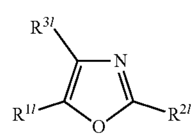
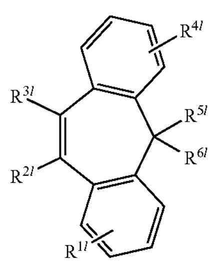
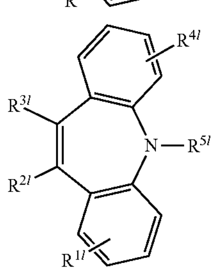
-continued
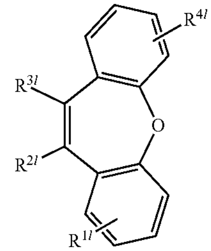
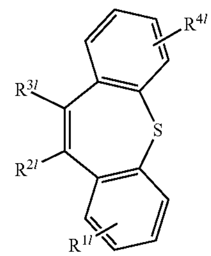
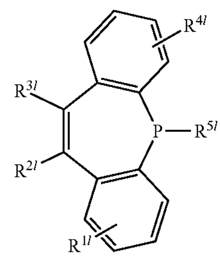
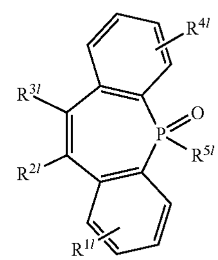
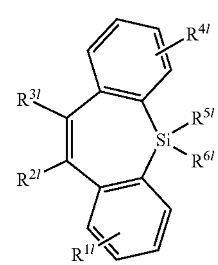
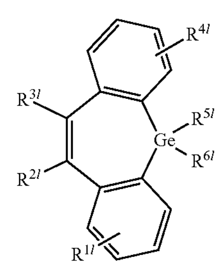

-continued
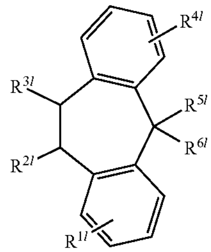
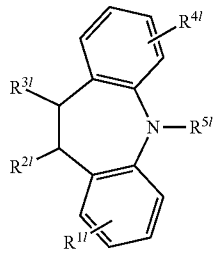
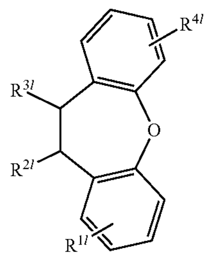
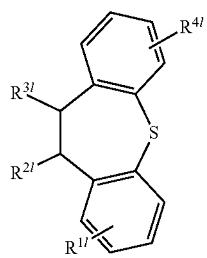
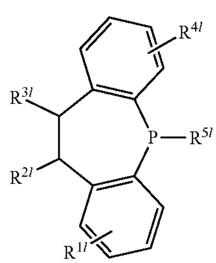
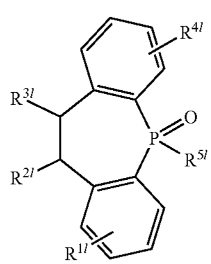
-continued
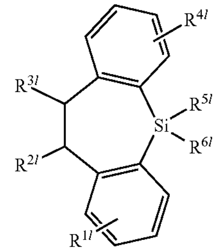
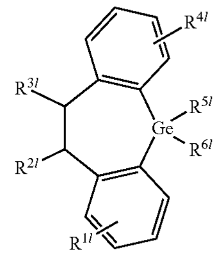
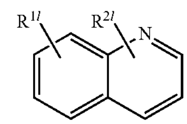
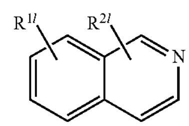
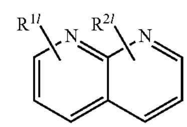
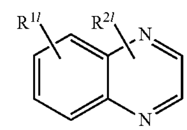
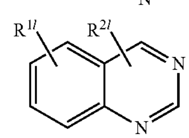
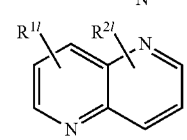
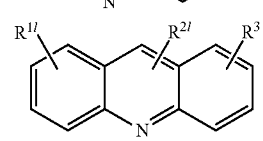
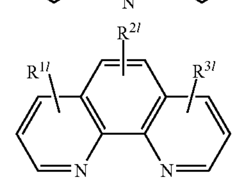
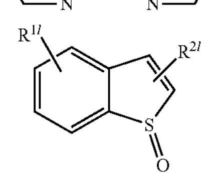

-continued
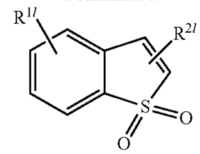
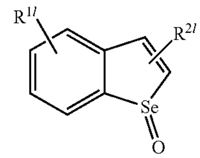
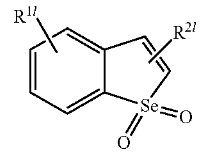
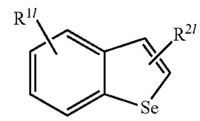
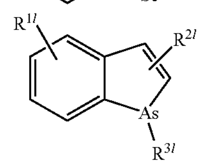
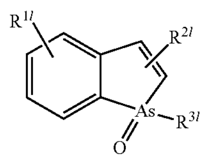
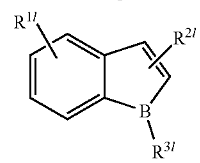
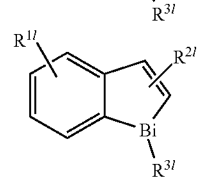
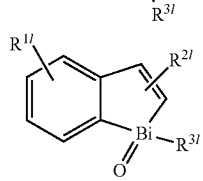
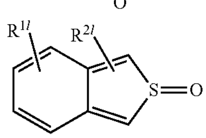
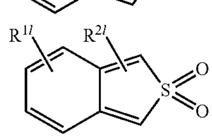
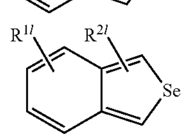
-continued
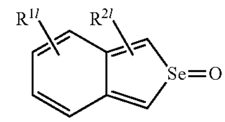
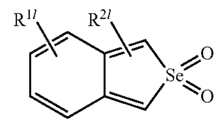
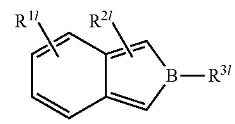
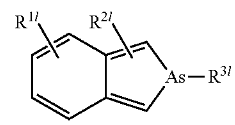
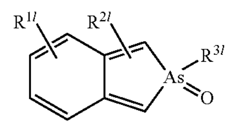
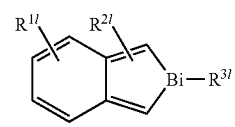
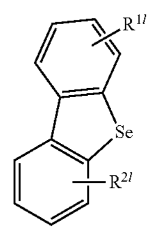
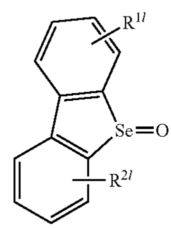
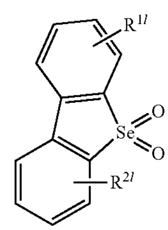
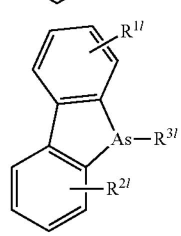

-continued
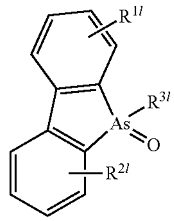
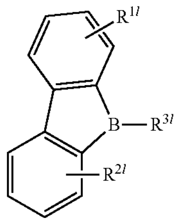
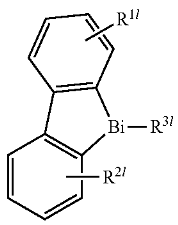
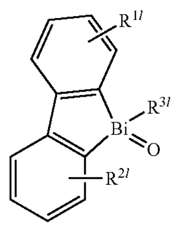
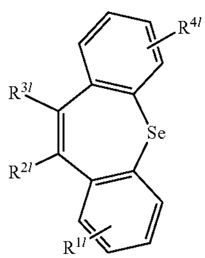
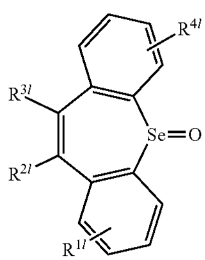
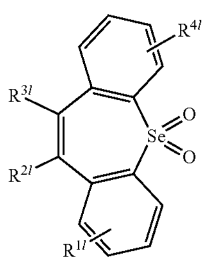
-continued
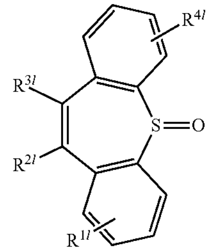
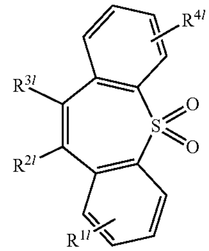
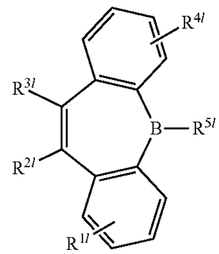
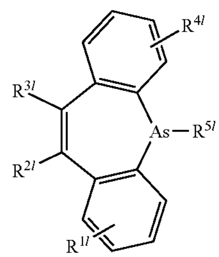
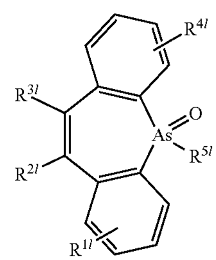
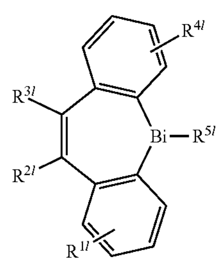

-continued
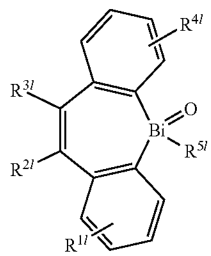
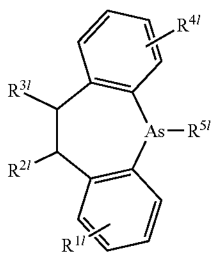
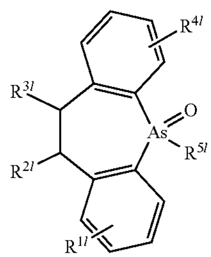
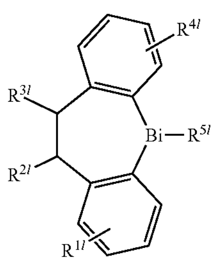
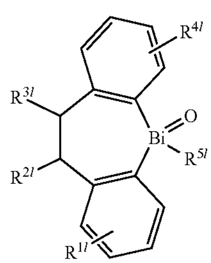
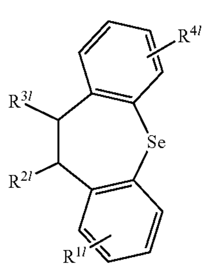
-continued
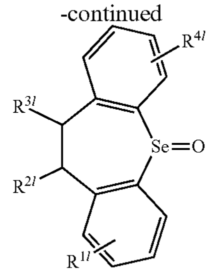
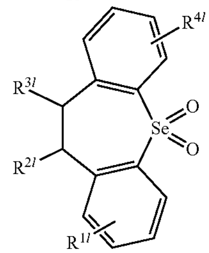
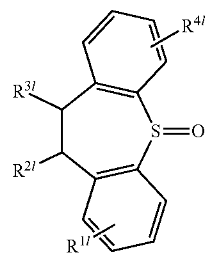
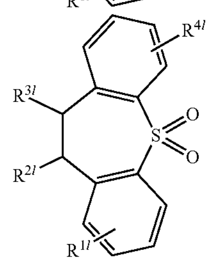
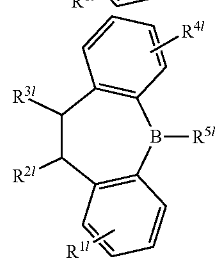
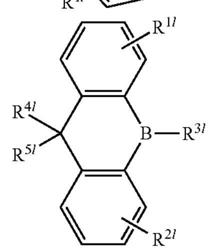
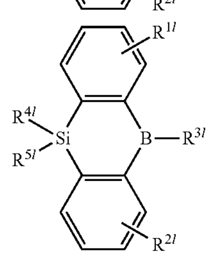

-continued
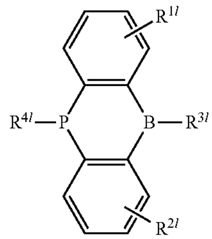
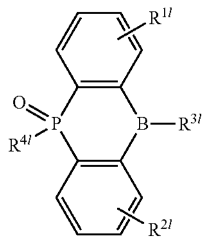
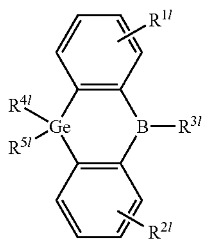
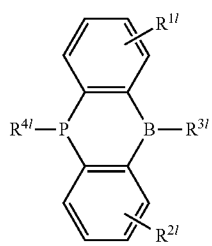
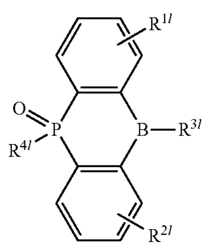
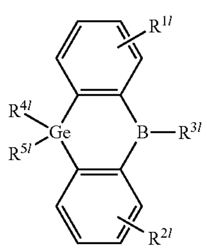
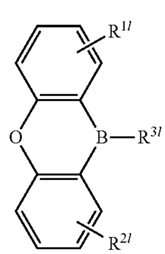
-continued
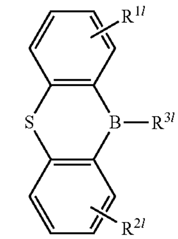
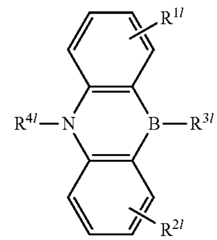
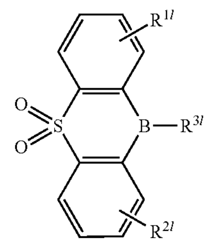
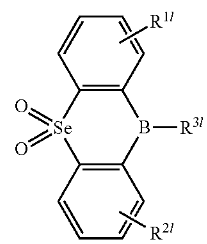
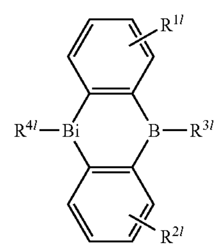
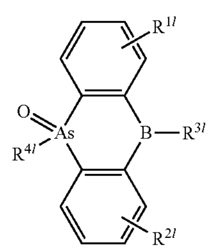
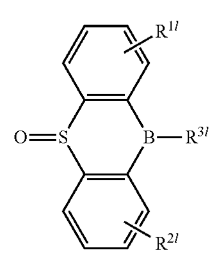

-continued
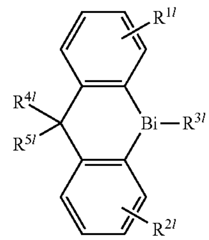
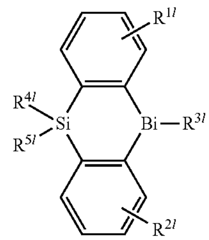
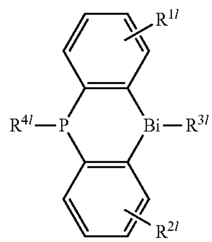
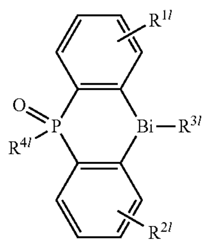
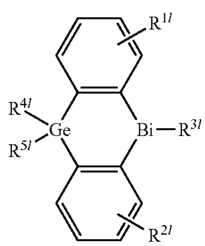
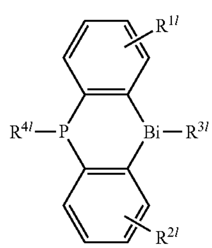
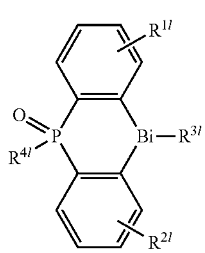
-continued
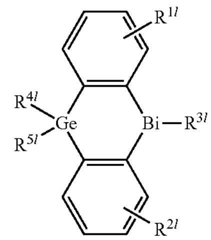
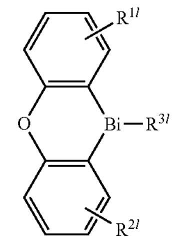
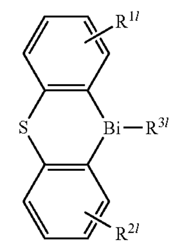
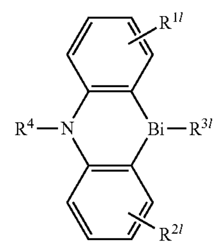
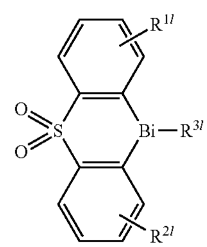
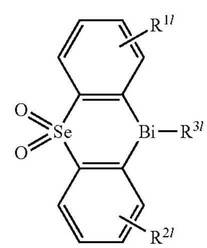
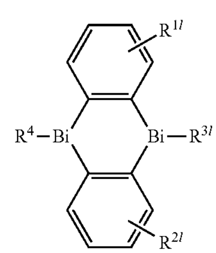

-continued
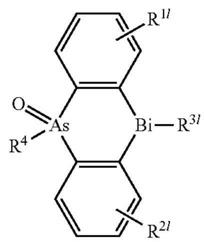
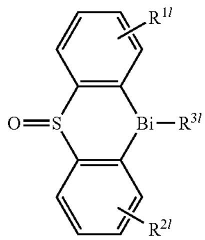
and derivatives thereof, and
other fluorescent luminophores selected from the group consisting of:
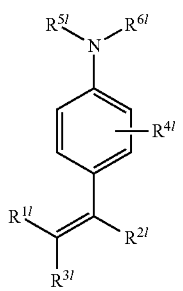
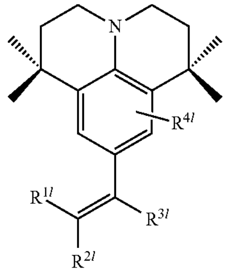
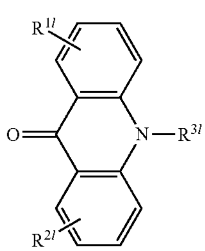
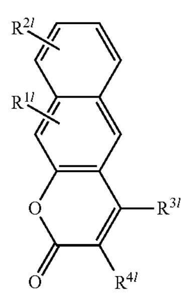
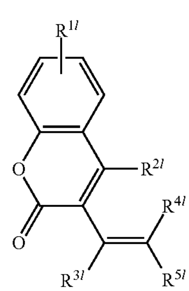
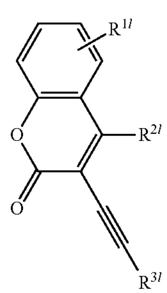
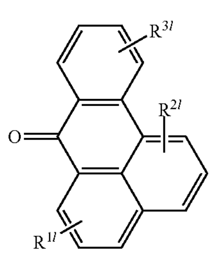
-continued
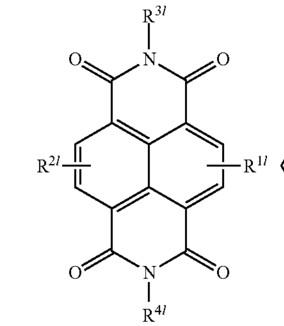
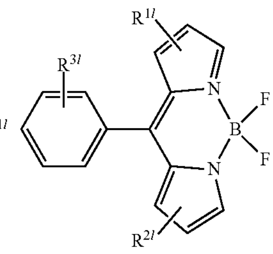
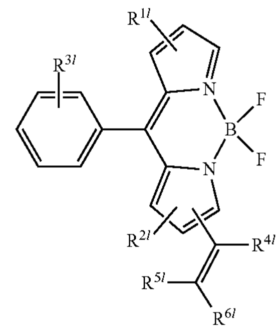
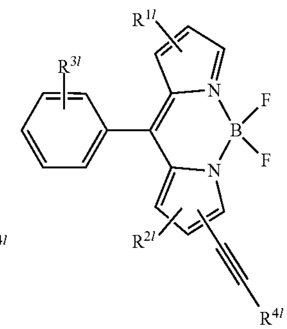
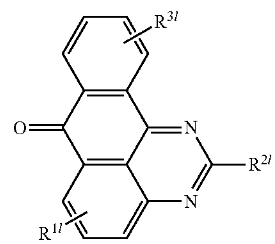
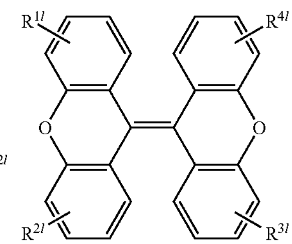
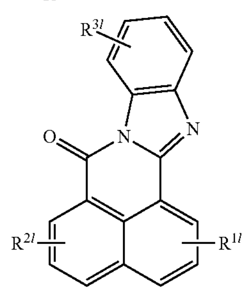
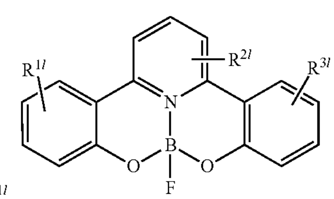
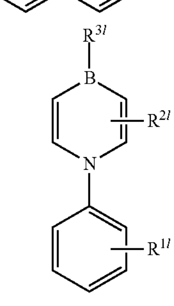
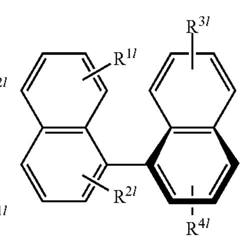
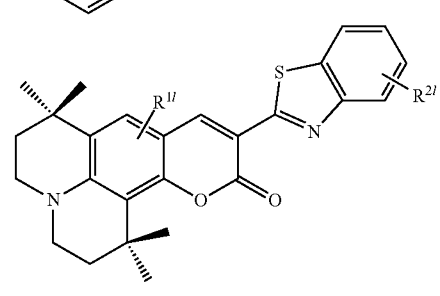

-continued
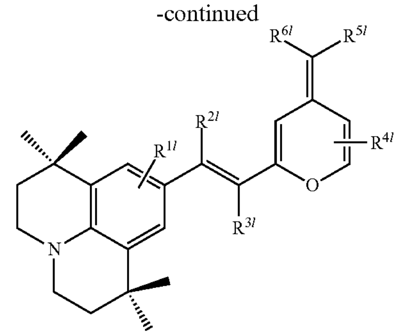
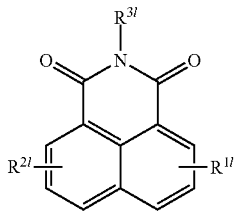
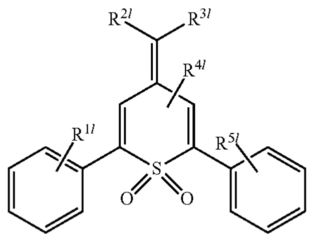
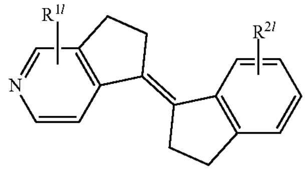
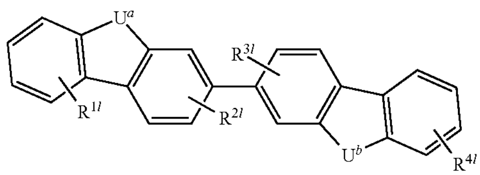
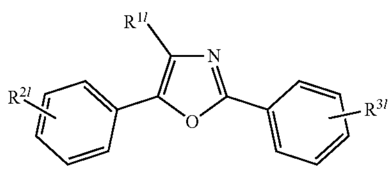
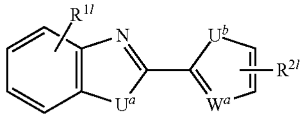
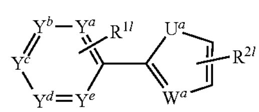
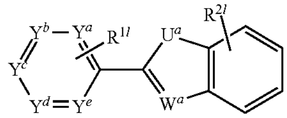
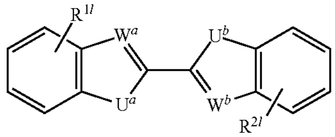
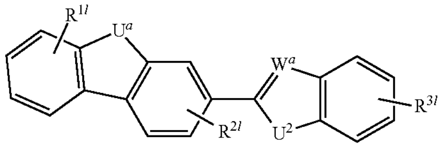
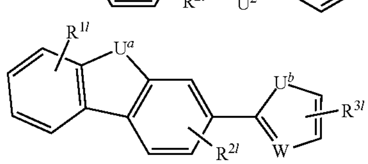
-continued
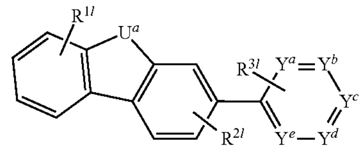
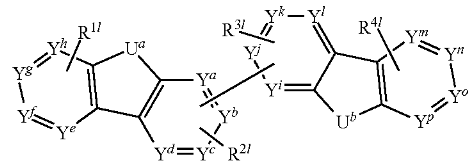
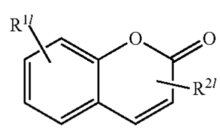
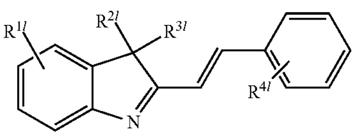
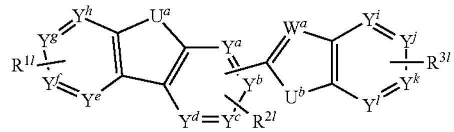
wherein:
each of $R^{a1}$, $R^{b1}$, $R^{c1}$, $R^{d1}$, $R^{e1}$, $R^{f1}$, $R^{g1}$, $R^{h1}$, and $R^{i1}$ independently represents one of the following structures:
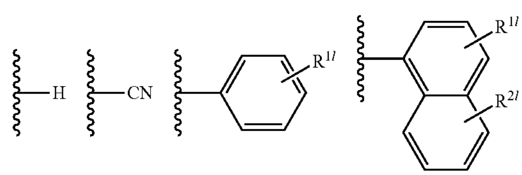
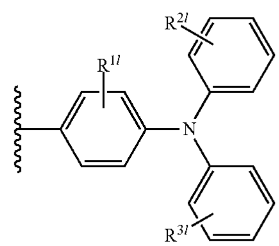
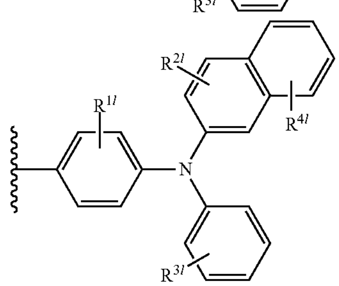
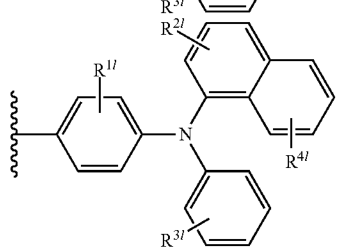

-continued

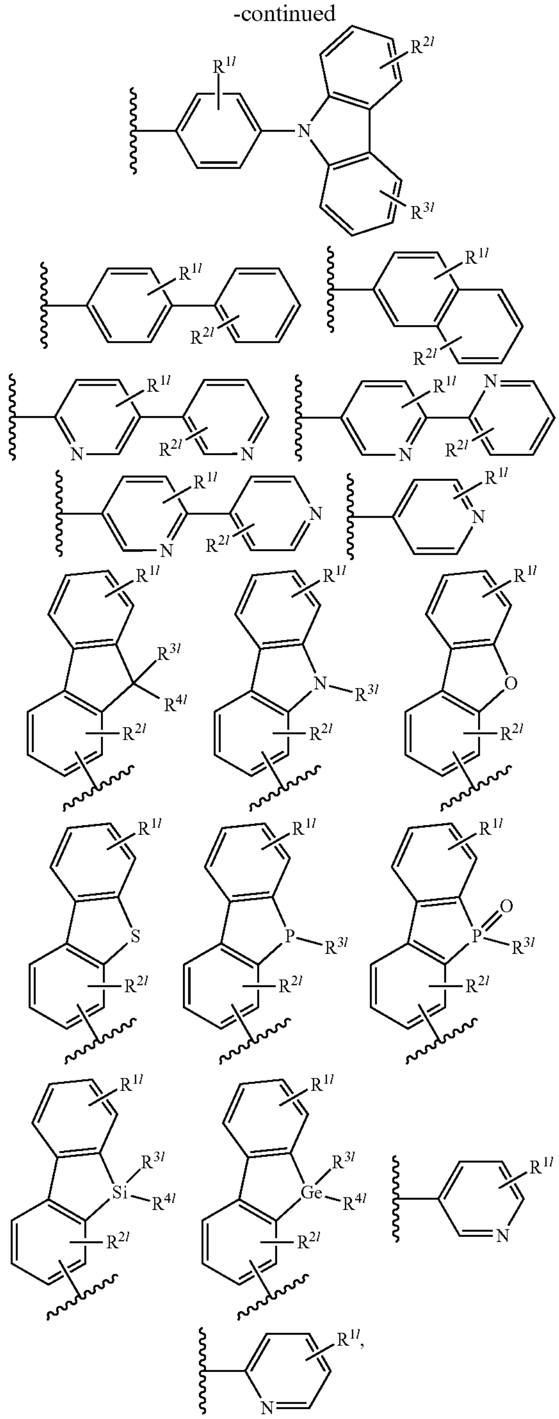

each of $R^{1l}$, $R^{2l}$, $R^{3l}$, $R^{4l}$, $R^{5l}$, $R^{6l}$, $R^{7l}$ and $R^{8l}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof, each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$ and $Y^p$ is independently C, N, or B, each of $U^a$, $U^b$ and $U^2$ is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, and each of $W^a$, $W^b$, and W is independently CH, $CLR^1$, $SiR^1$, GeH, $GeR^1$, N, P, B, Bi, or Bi═O.

8. A device comprising the compound of claim 2, wherein the device is an organic light emitting diode or a full color display.

9. The compound of claim 1, wherein the compound is represented by one of Formulas B-11 through B-25

B-11

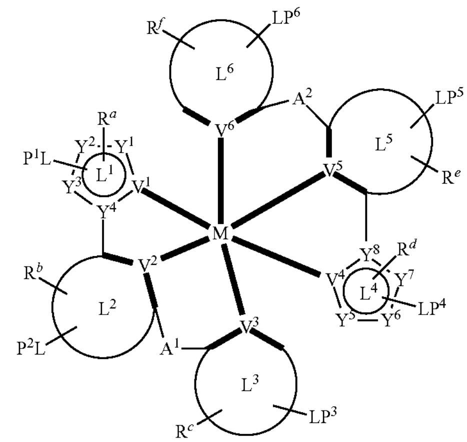

B-12

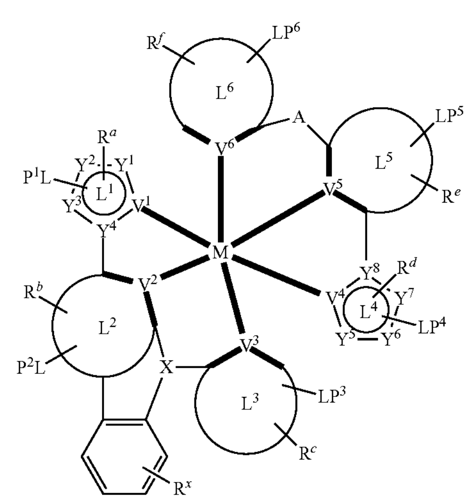

-continued
B-13
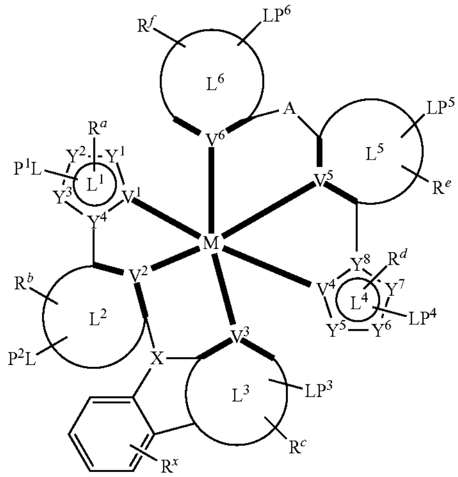
B-14
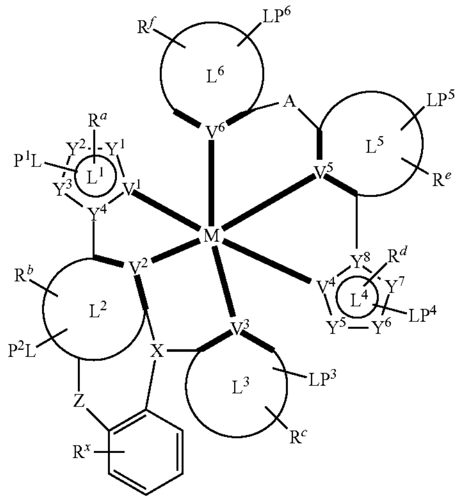
B-15
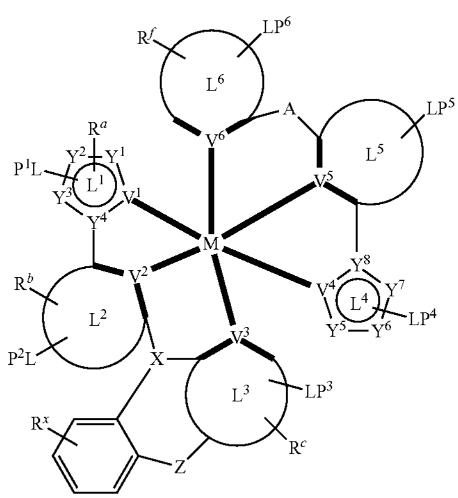
-continued
B-16
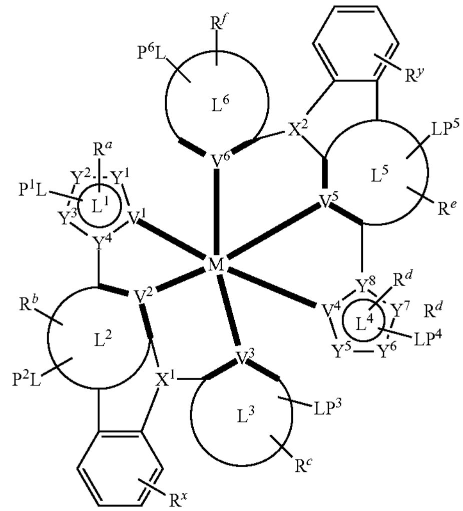
B-17
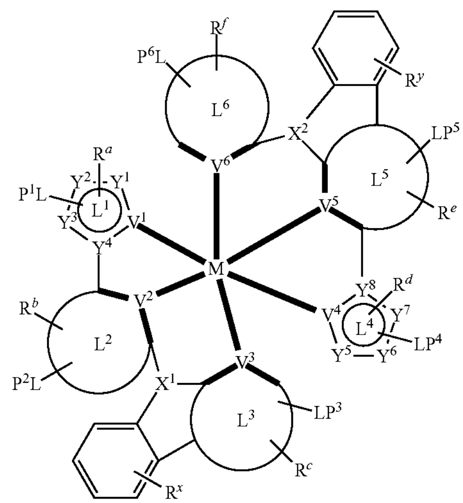
B-18
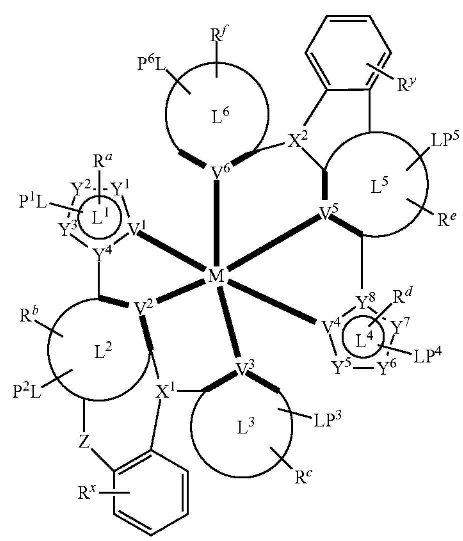

-continued
B-19
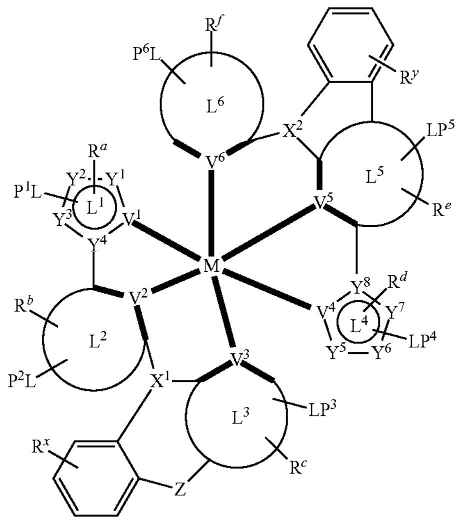
B-20
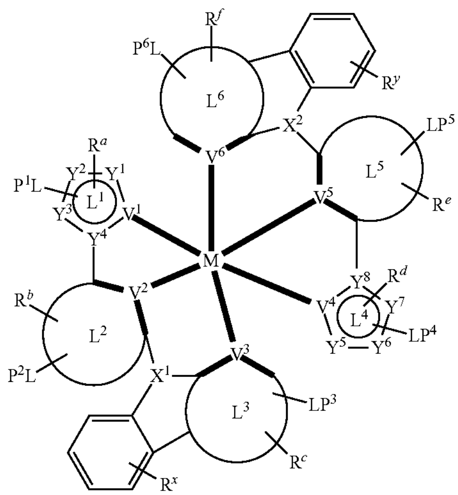
B-21
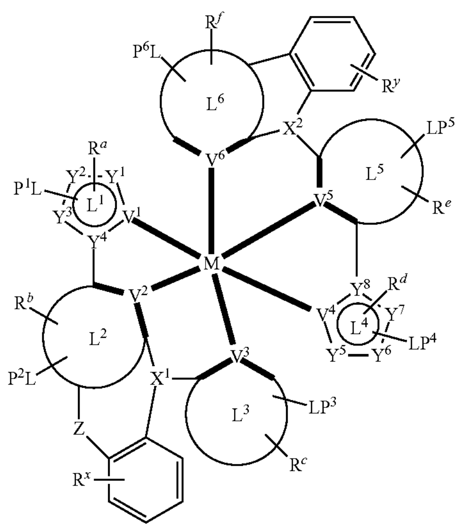
-continued
B-22
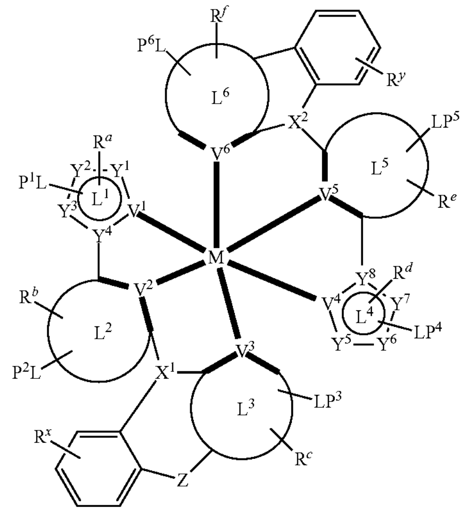
B-23
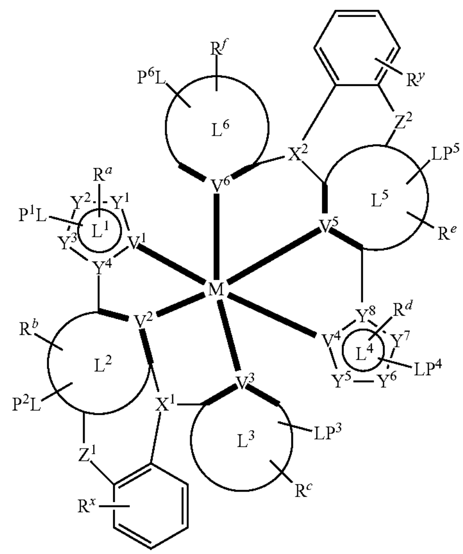
B-24
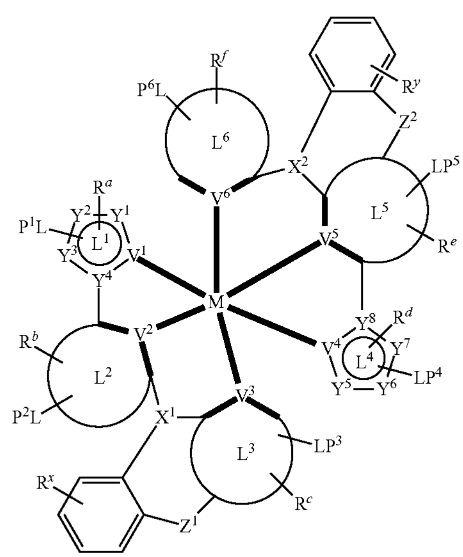

-continued
B-25
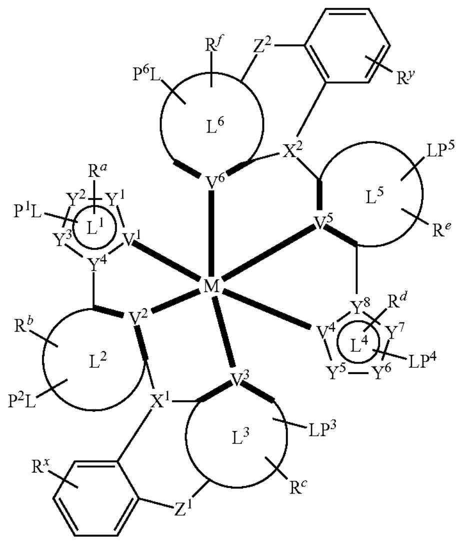
B-26
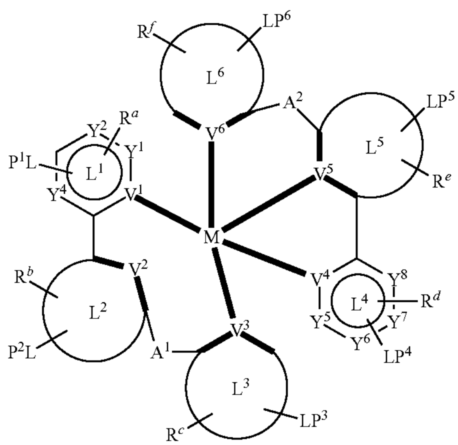
B-27
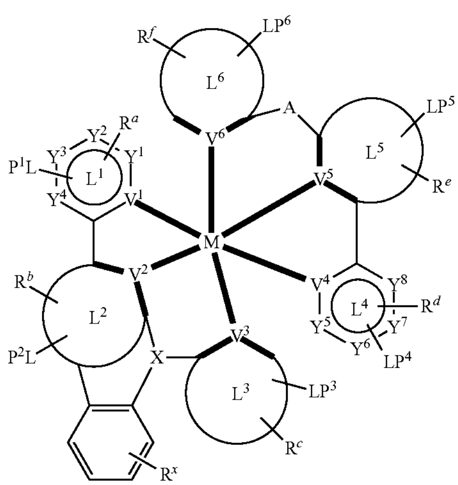
-continued
B-28
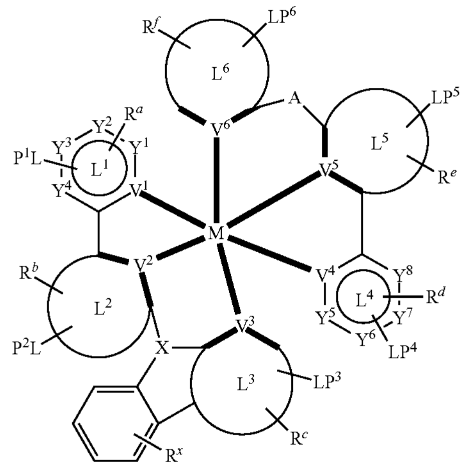
B-29
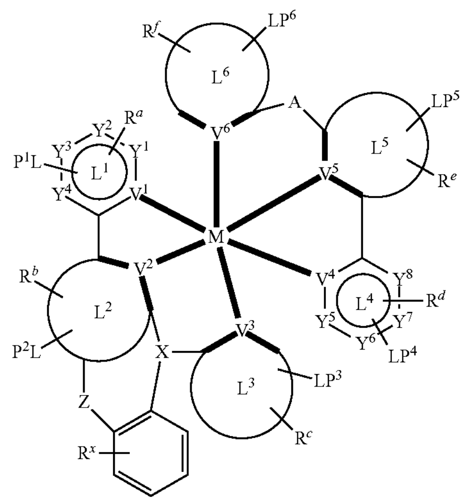
B-30
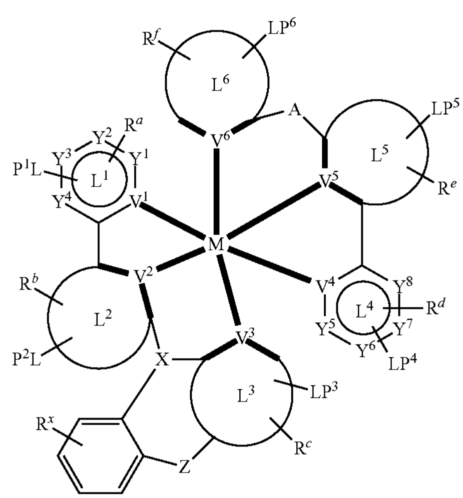

-continued
B-31
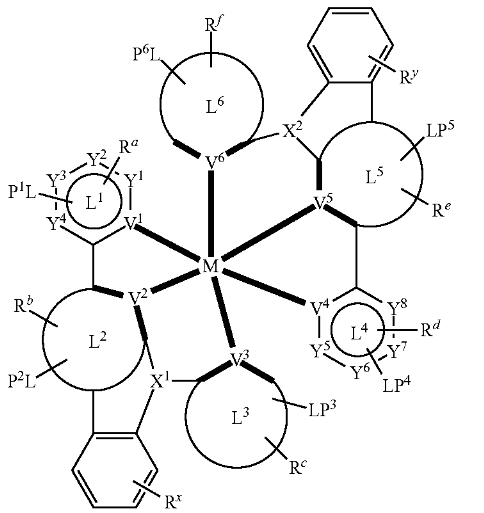
B-32
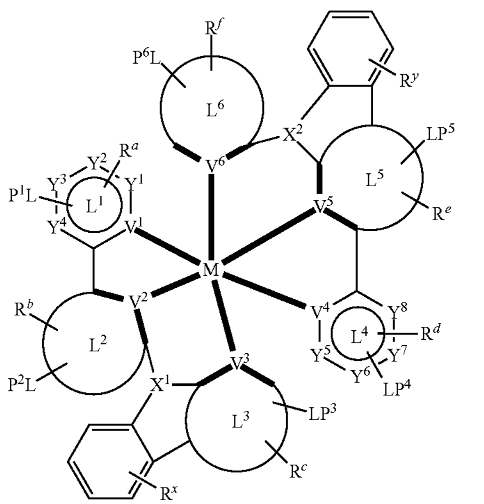
B-33
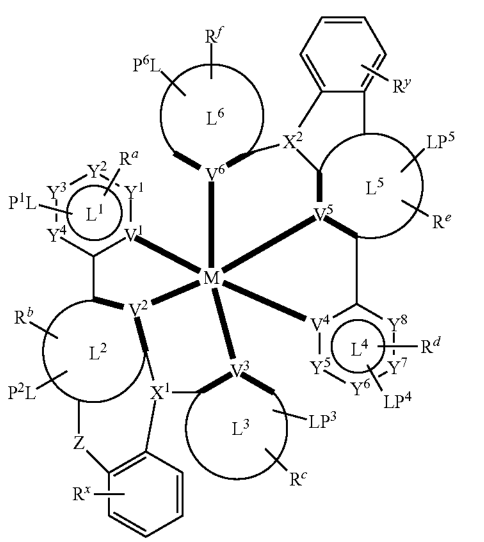
-continued
B-34
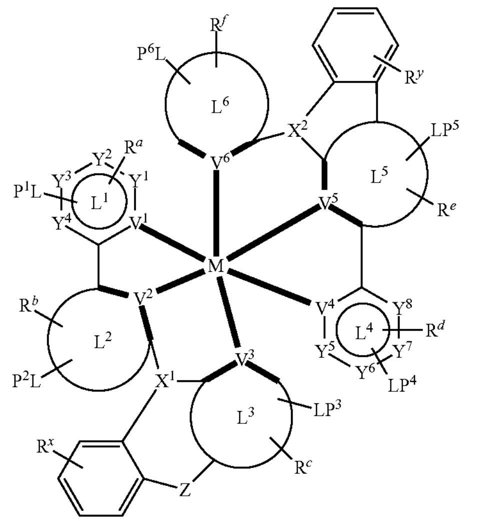
B-35
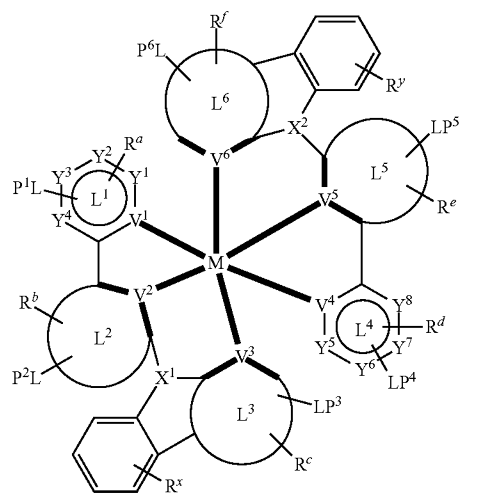
B-36
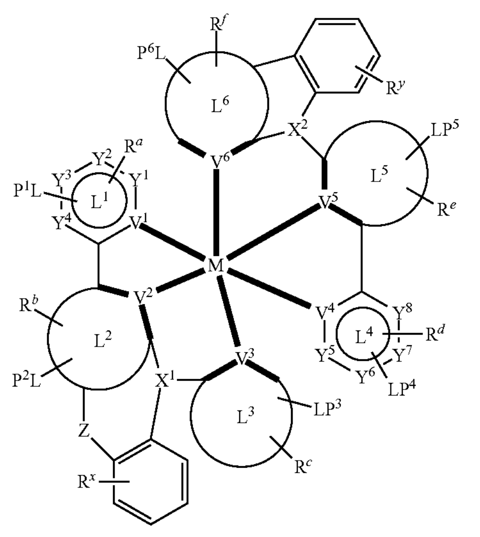

-continued
B-37
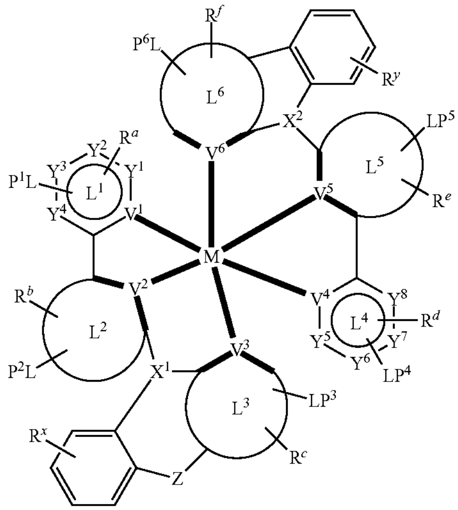
B-38
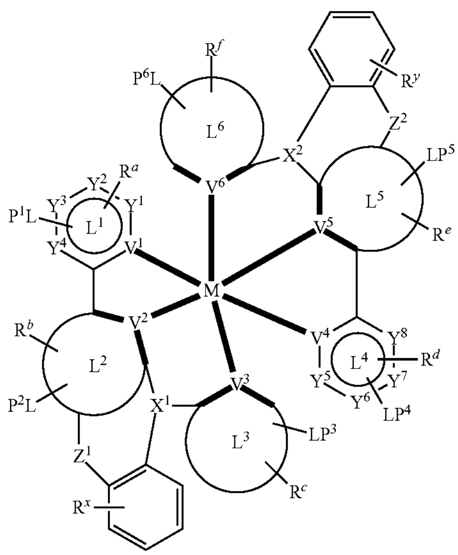
B-39
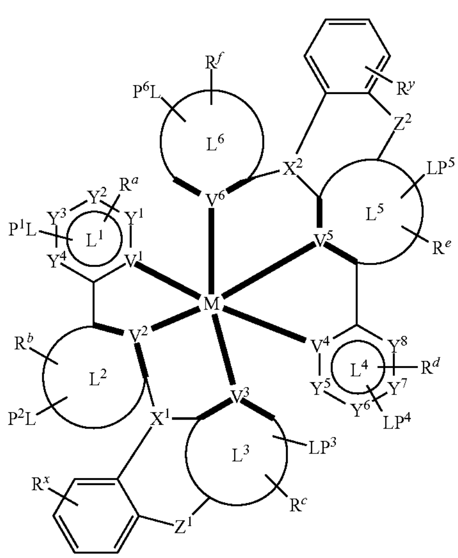
-continued
B-40
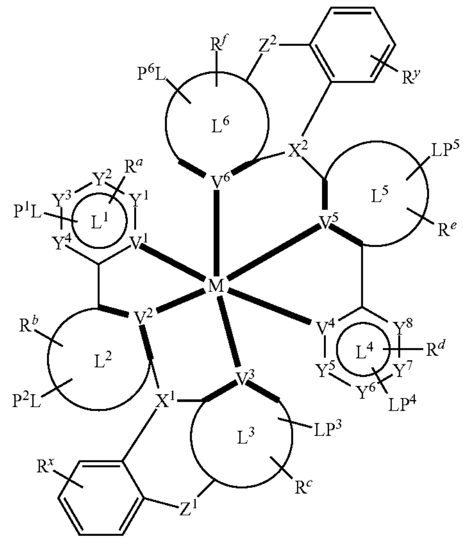
B-41
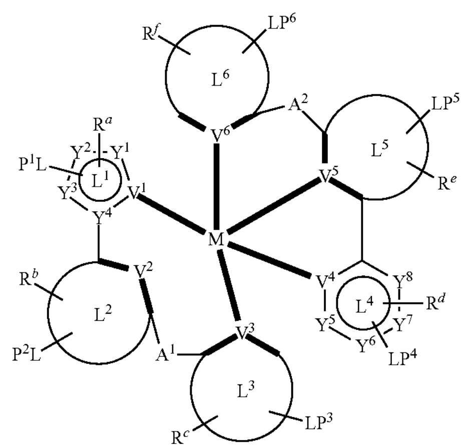
B-42
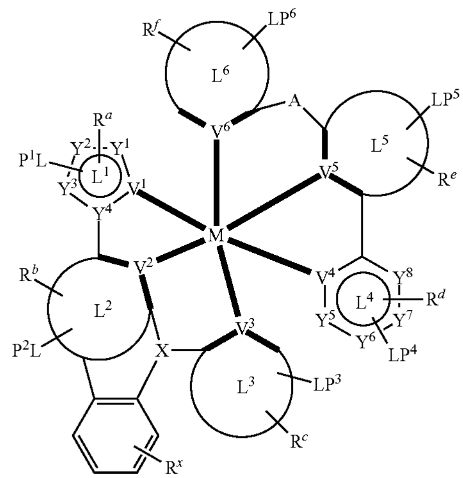

-continued
B-43
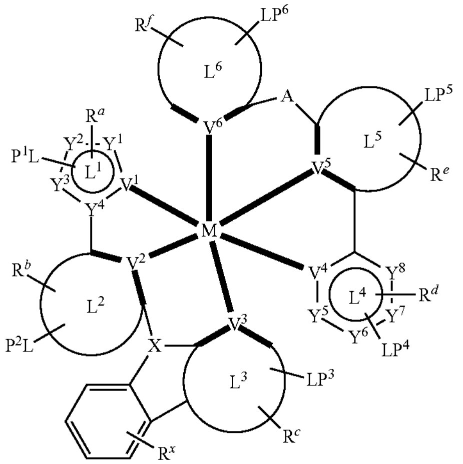
B-44
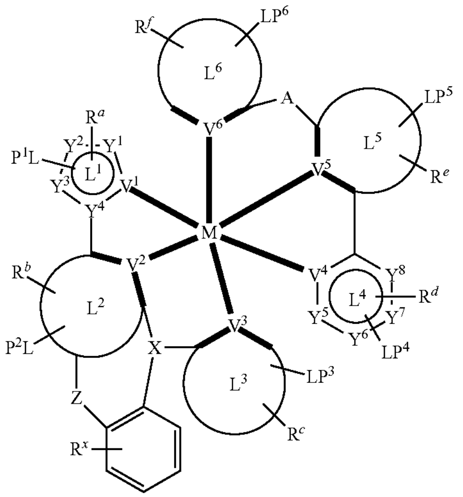
B-45
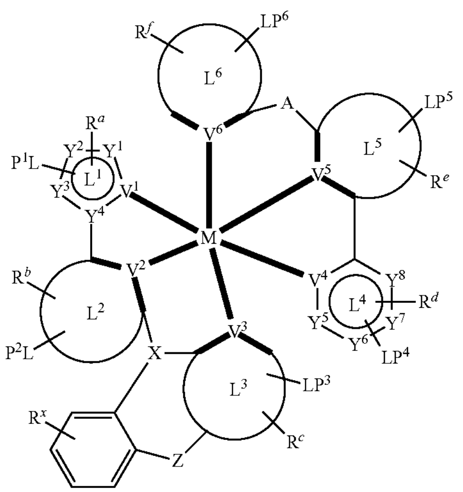
-continued
B-46
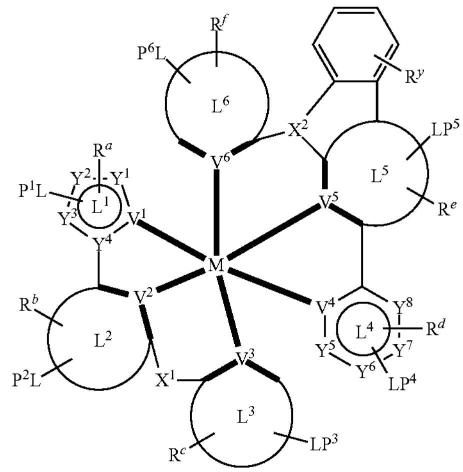
B-47
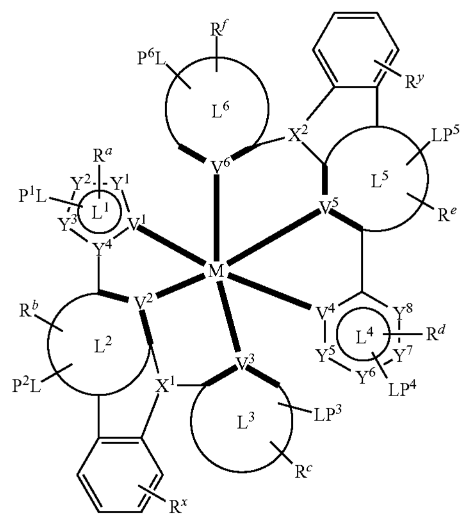
B-48
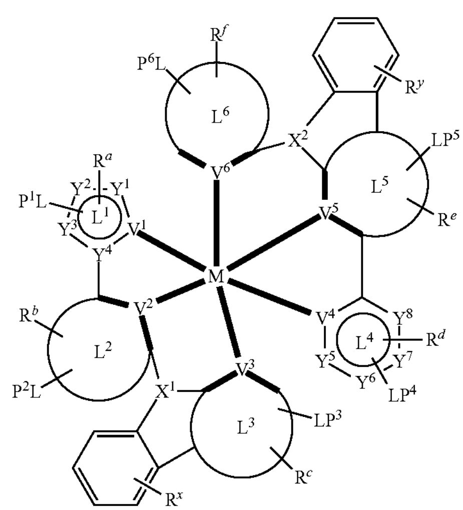

-continued
B-49
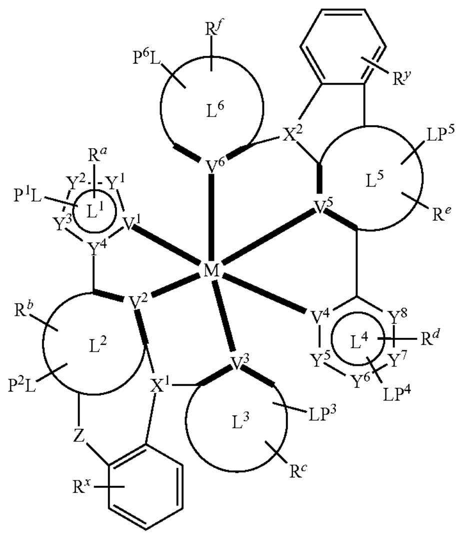
B-50
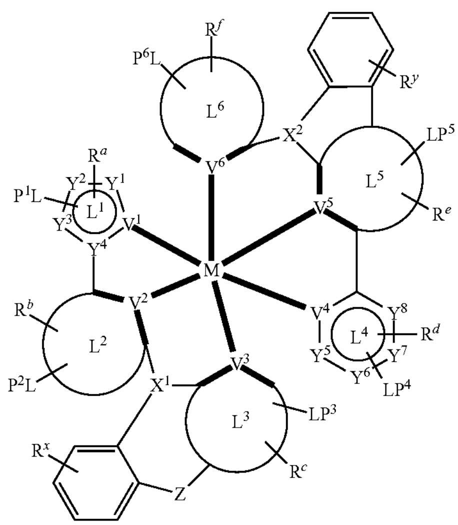
B-51
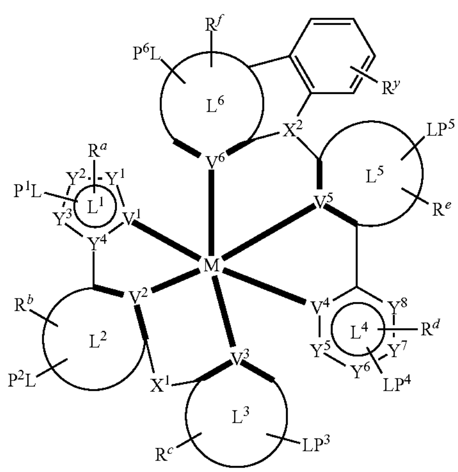
-continued
B-52
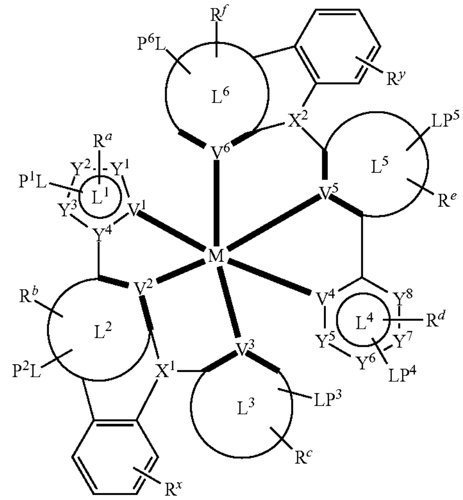
B-53
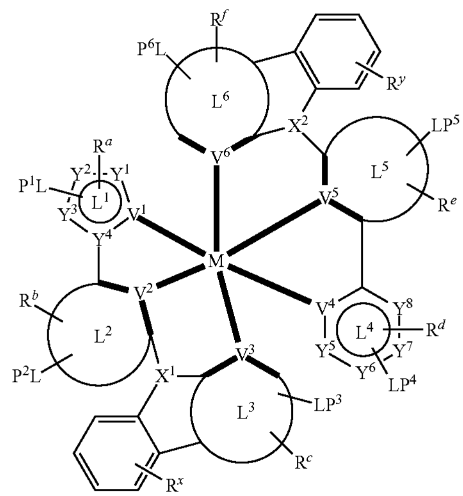
B-54
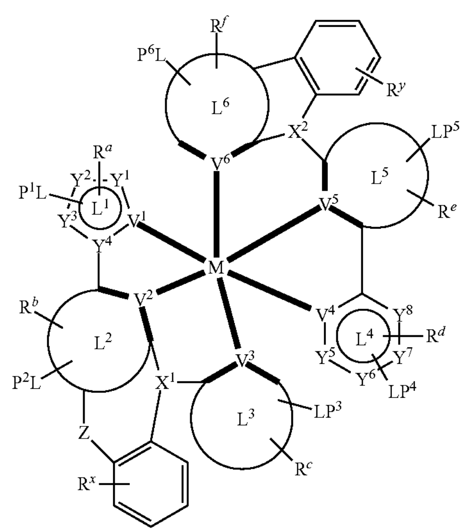

-continued
B-55
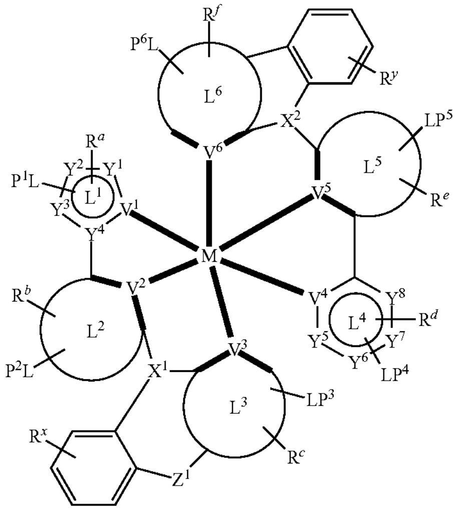
B-56
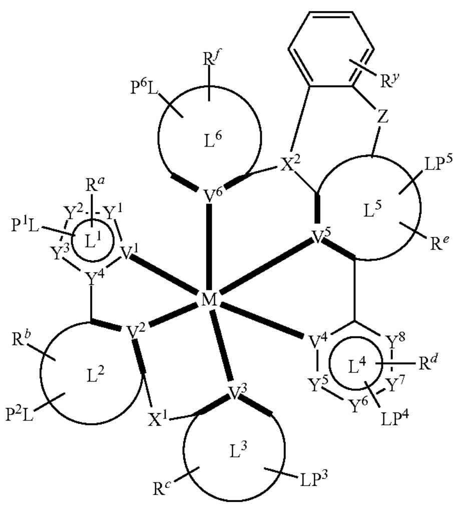
B-57
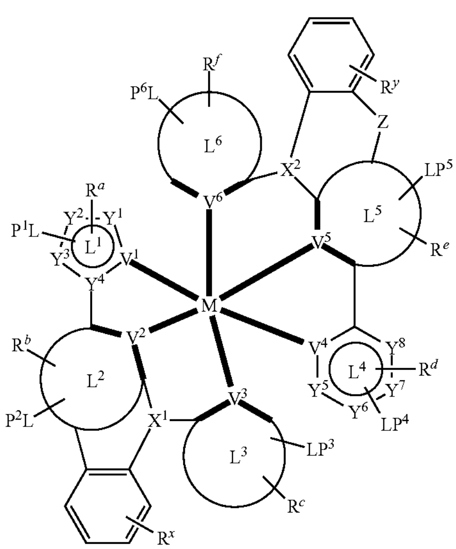
-continued
B-58
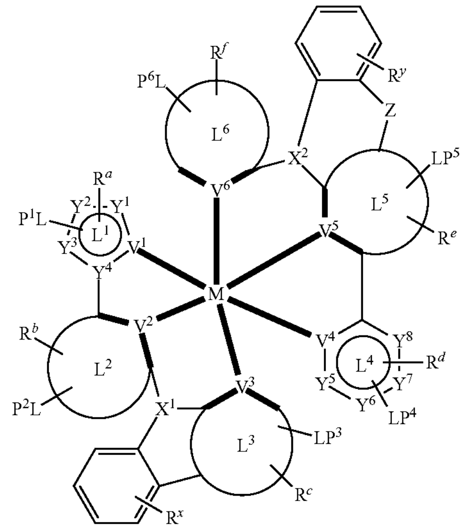
B-59
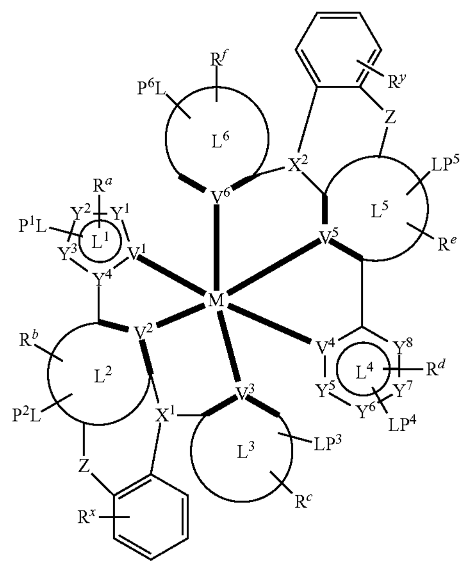
B-60
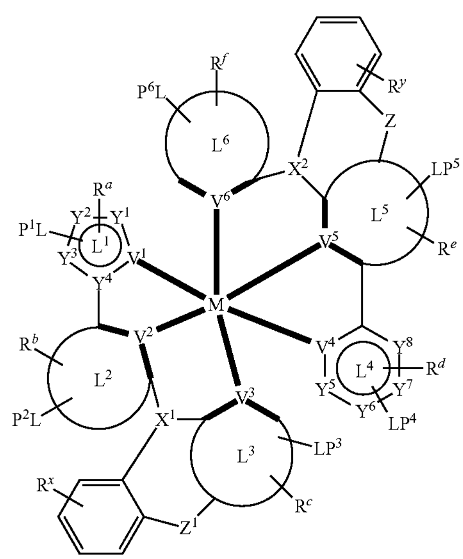

-continued

B-61

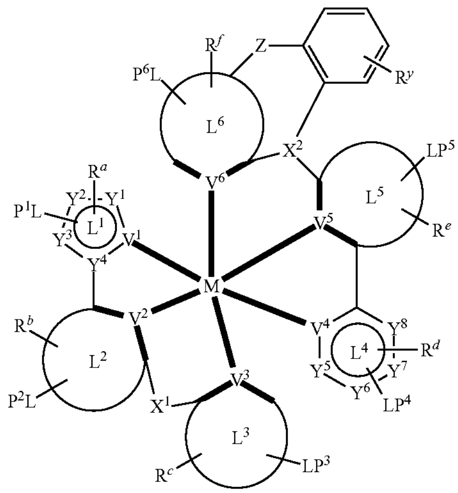

B-62

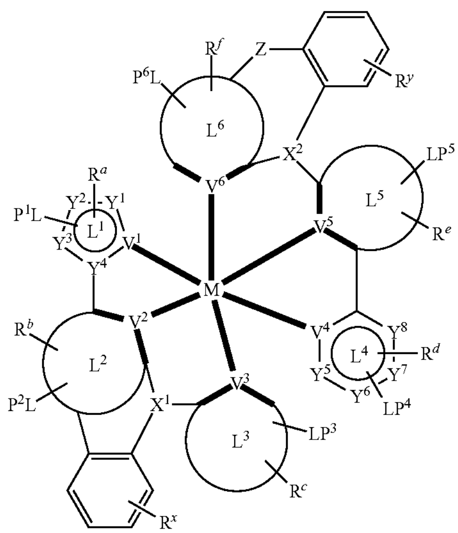

B-63

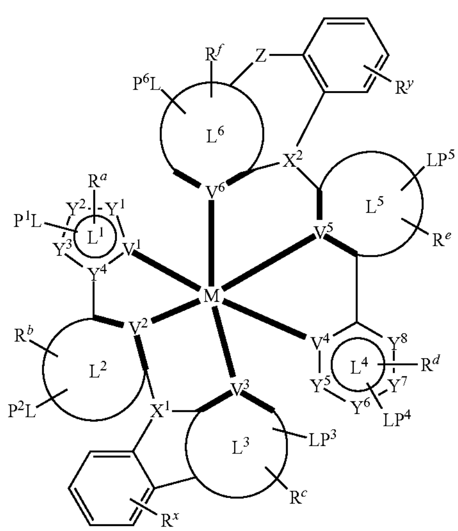

-continued

B-64

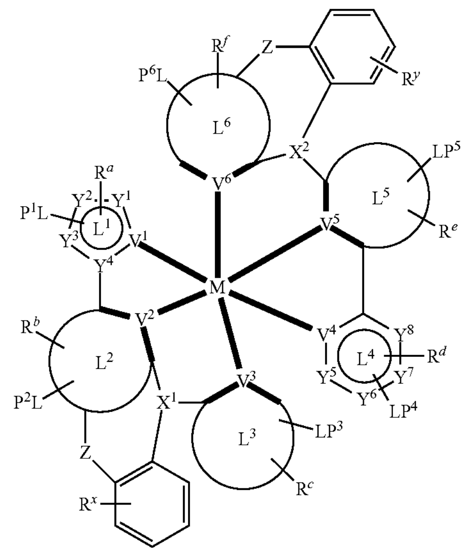

B-65

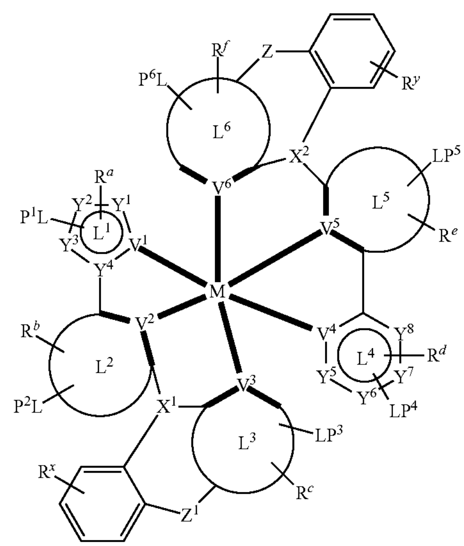

wherein Formulas B-11 through B-25 are asymmetrical, and for Formulas B-11 through B-25:

A is independently NH, $NR^3$, or O, each of X, $X^1$, and $X^2$ is independently N, each of Z, $Z^1$, and $Z^2$ is a linking atom or linking group, and each of $R^x$ and $R^y$ is independently present or absent, and if present each of $R^x$ and $R^y$ is a mono-, di-, tri-, or tetra-substitution, and each $R^x$ and $R^y$ is independently deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric; or any conjugate or combination thereof.

10. The compound of claim 9, wherein each of $LP^1$, $LP^2$, $LP^3$, $LP^4$, $LP^5$ and $LP^6$, if present, is independently selected from the group consisting of:

an aromatic hydrocarbon, an aromatic hydrocarbon derivative, a polyphenyl hydrocarbon, a hydrocarbon with condensed aromatic nuclei, naphthalene, anthracene, phenanthrene, chrysene, pyrene, triphenylene, perylene, acenaphthene, tetracene, pentacene, tetraphene, coronene, fluorene, biphenyl, p-terphenyl, o-diphenylbenzene, m-diphenylbenzene, p-quaterphenyl, benzo[a]tetracene, benzo[k]tetraphene, indeno[1,2,3-cd]fluoranthene, tetrabenzo[de,hi,op,st]pentacene, an arylethylene derivative, an arylacetylene derivative, a diarylethylene, a diarylpolyene, a diaryl-substituted vinylbenzene, a distyrylbenzene, a trivinylbenzene, an arylacetylene, a functional substitution product of stilbene, a five-, six- or seven-membered heterocyclic compound derivative, a furan derivative, a thiophene derivative, a pyrrole derivative, an aryl-substituted oxazole, an 1,3,4-oxadiazole, an 1,3,4-thiadiazole, an aryl-substituted 2-pyrazoline, an aryl-substituted pyrazole, a benzazole, 2H-benzotriazole, a substitution product of 2H-benzotriazole, a heterocycle with one, two, or three nitrogen atoms, an oxygen-containing heterocycle, a coumarin, a coumarin derivative, a dye, an acridine dye, a xanthene dye, an oxazine, thiazine, and derivatives thereof.

11. The compound of claim 9, wherein each of

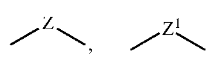

and

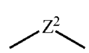

is independently one of the following:

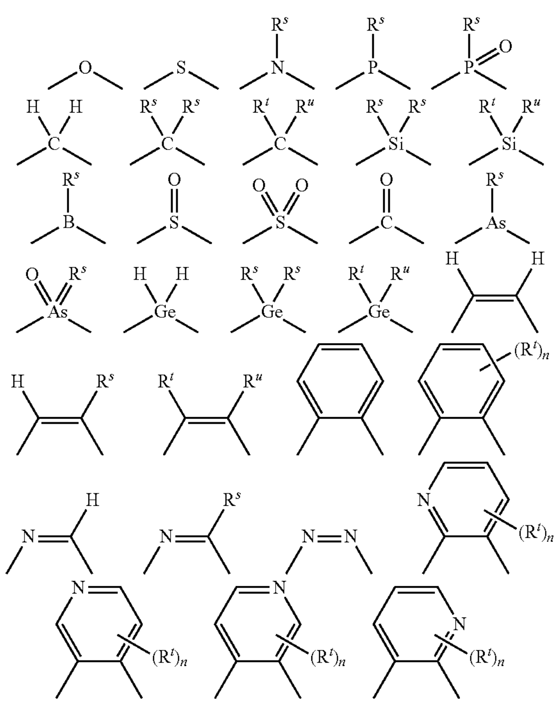

-continued

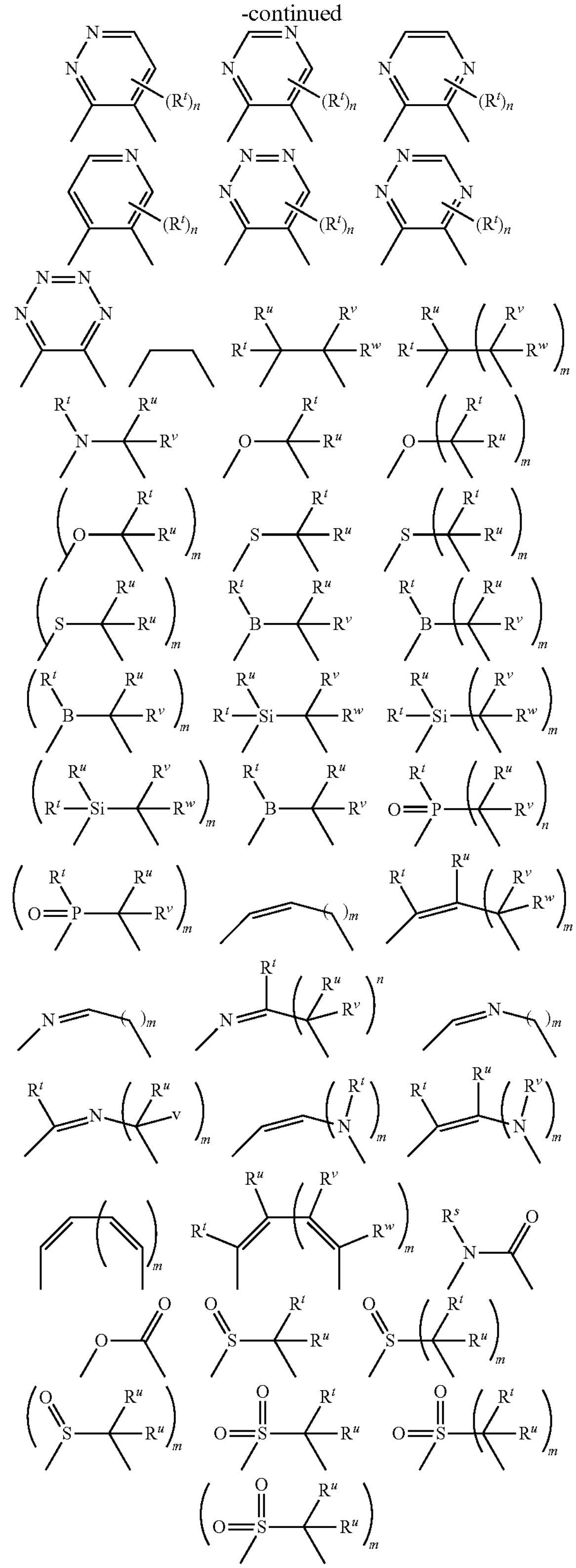

wherein:

n is an integer from 0 to 4, m is an integer from 1 to 3, each of $R^s$, $R^t$, $R^u$, and $R^v$ is hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, and any conjugate or combination thereof.

12. The compound of claim 9, wherein each of

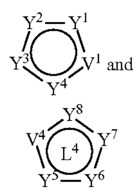

is independently selected from the group consisting of:

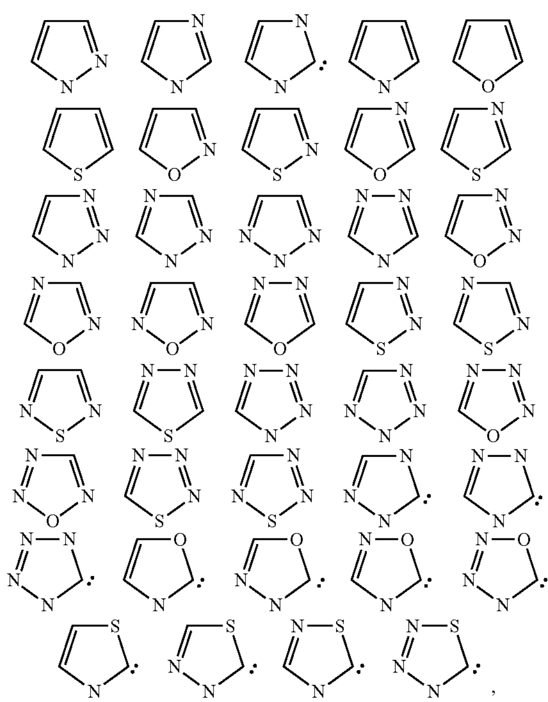

13. The compound of claim 9, wherein: each of

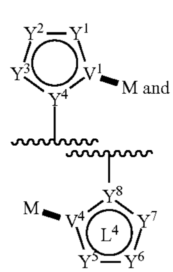

independently represents one of the following structures:

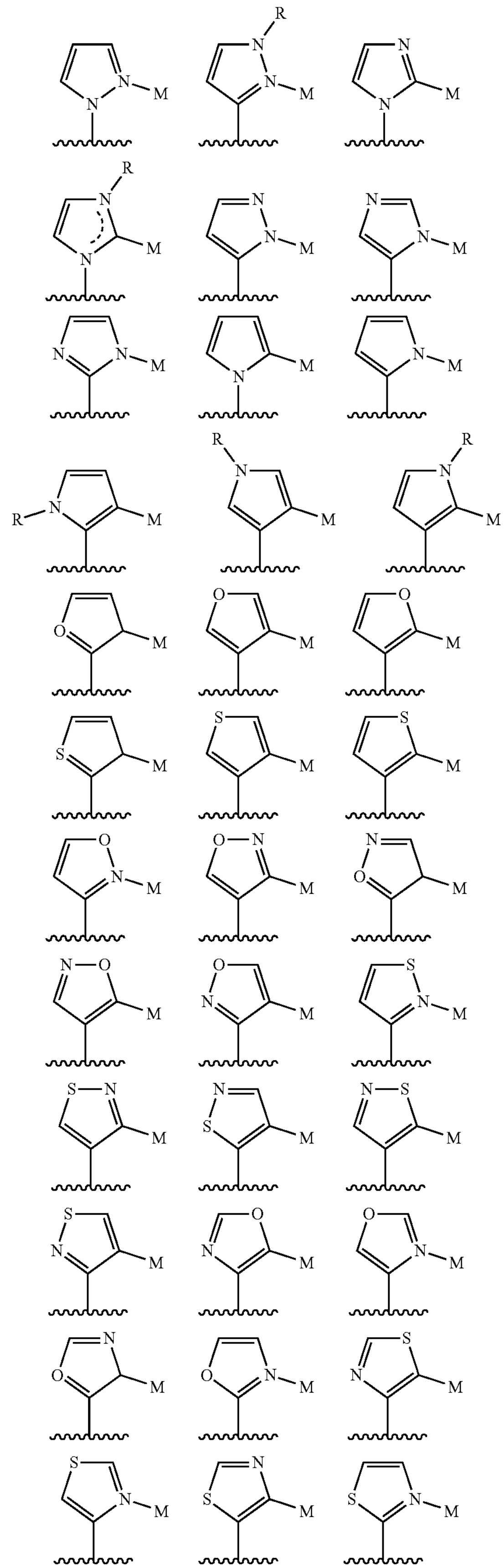

-continued
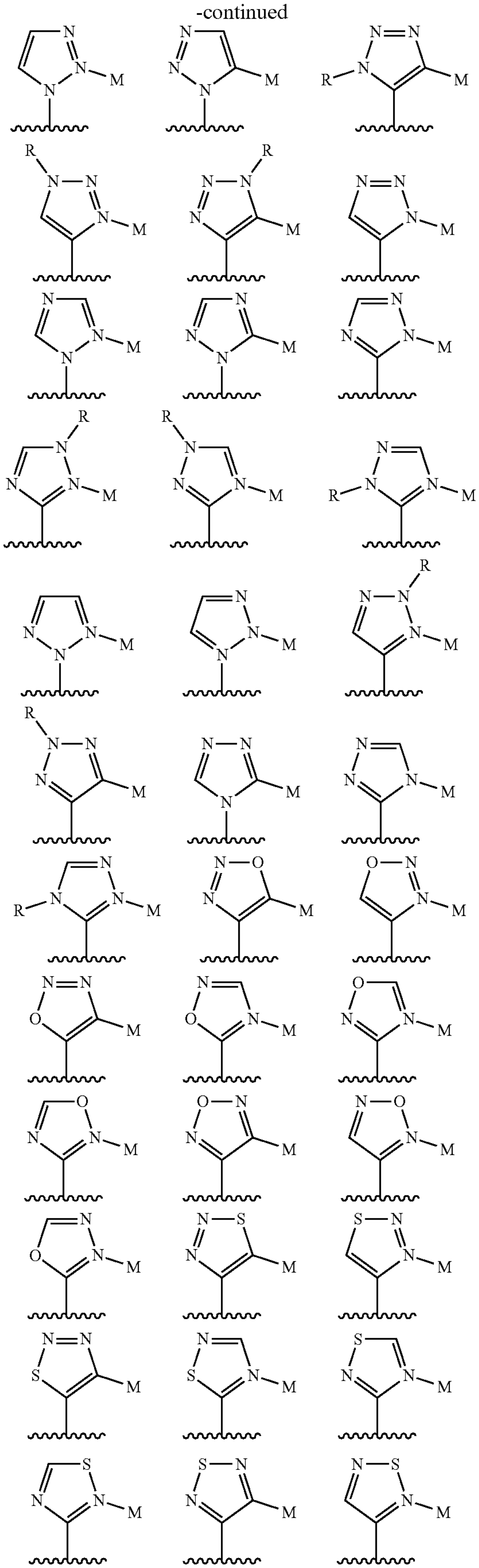
-continued
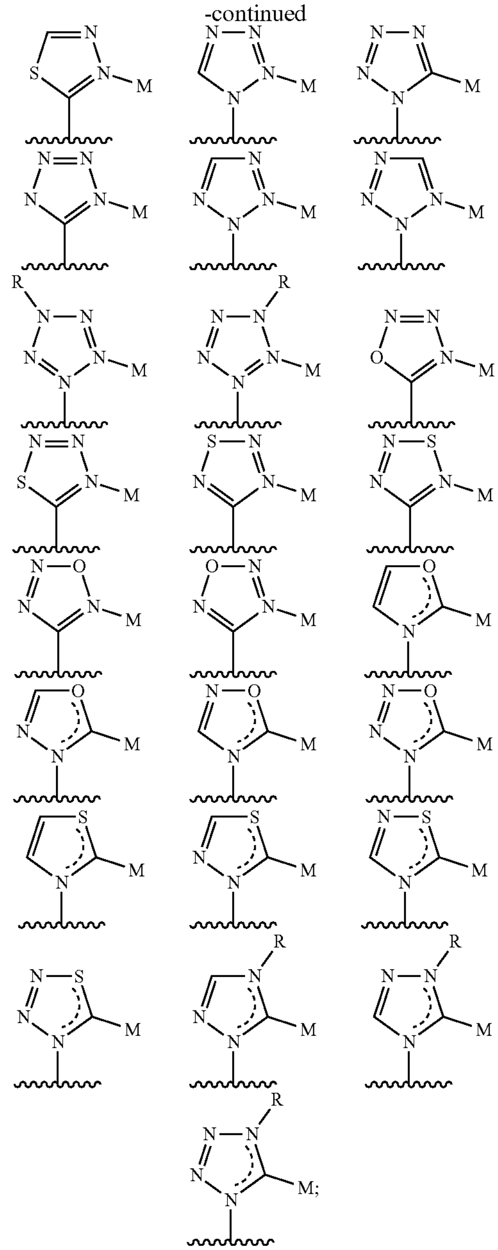
each of
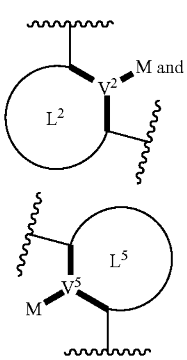

independently represents one of the following structures:

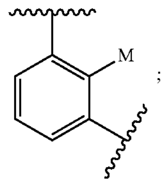

and each of

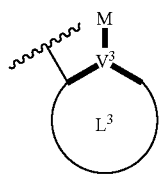

and

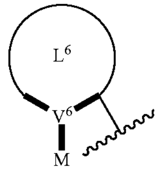

independently represents one of the following structures:

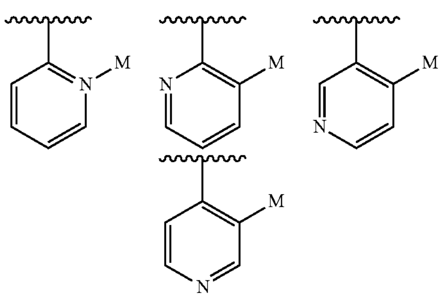

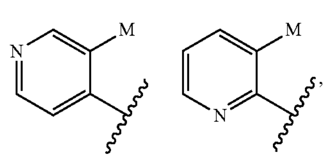

and

R is hydrogen, aryl, cycloalkyl, cycloalkenyl, heterocyclyl, heteroaryl, alkyl, alkenyl, alkynyl, deuterium, halogen, hydroxyl, thiol, nitro, cyano, amino, monoalkylamino, dialkylamino, monoarylamino, diarylamino, alkoxy, aryloxy, haloalkyl, aralkyl, ester, nitrile, isonitrile, heteroaryl, alkoxycarbonyl, acylamino, alkoxycarbonylamino, aryloxycarbonylamino, sulfonylamino, sulfamoyl, carbamoyl, alkylthio, sulfinyl, ureido, phosphoramide, mercapto, sulfo, carboxyl, hydrazino, substituted silyl, polymeric, or any conjugate or combination thereof.

14. The compound of claim 9, wherein each of $LP^1$, $LP^2$, $LP^3$, $LP^4$, $LP^5$ and $LP^6$, if present, is independently selected from the group consisting of:

aromatic hydrocarbons selected from the group consisting of:

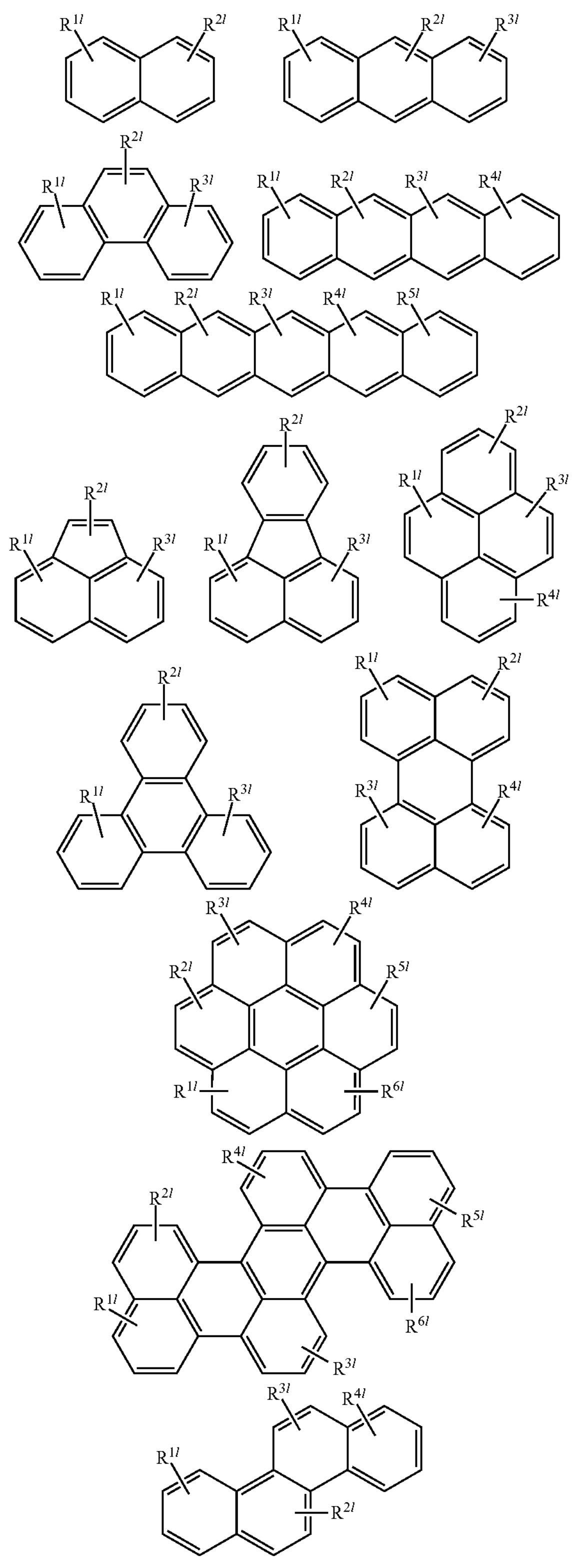

-continued
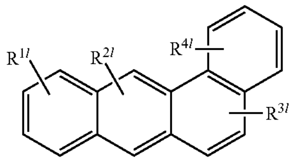
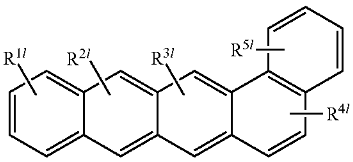
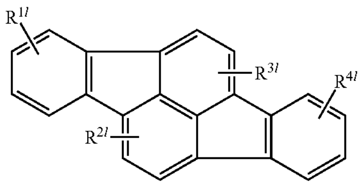
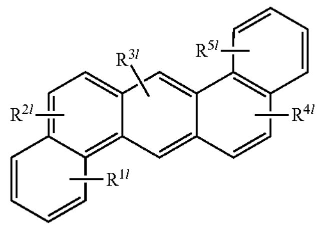
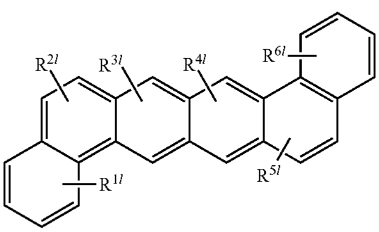
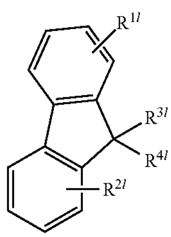
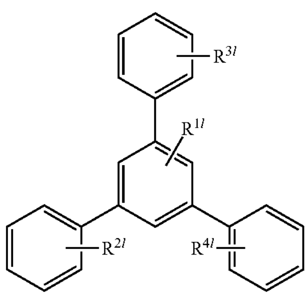
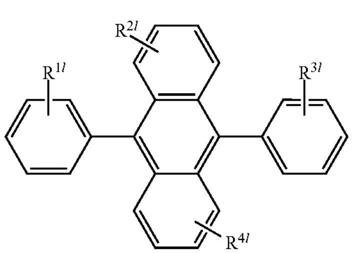
-continued
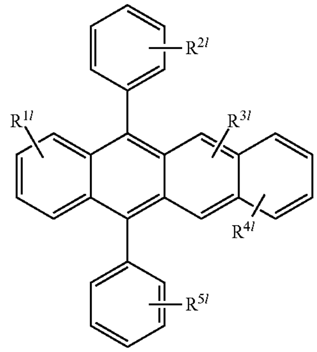
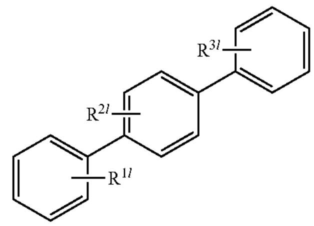
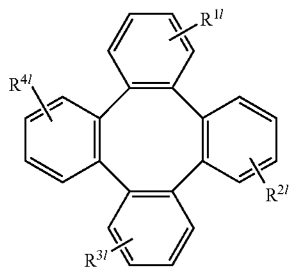
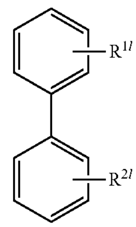
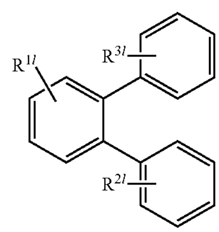
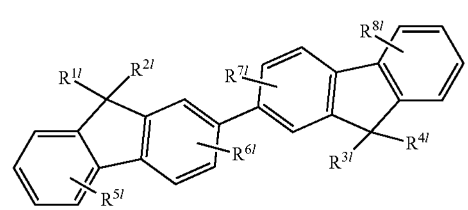
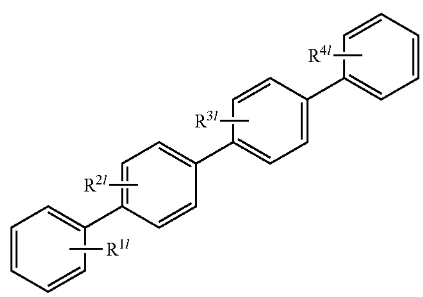

-continued
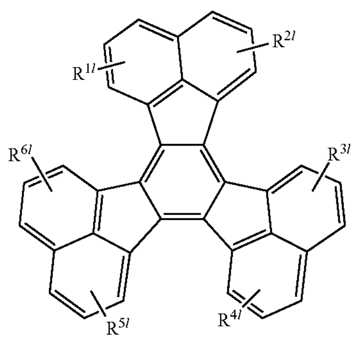
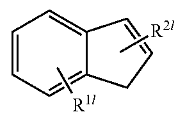
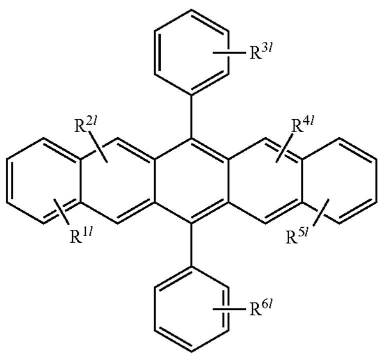
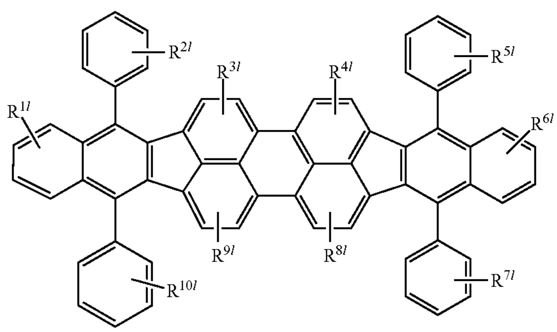
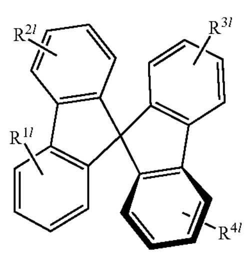
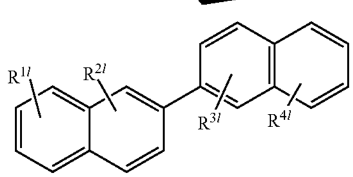
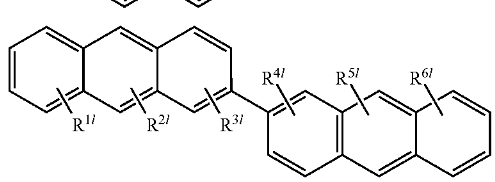
-continued
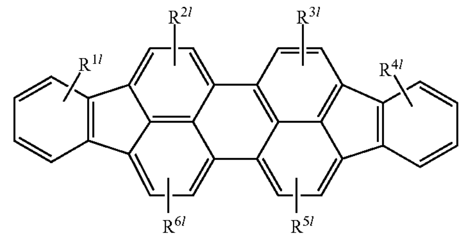
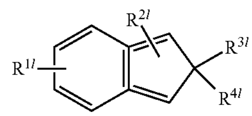
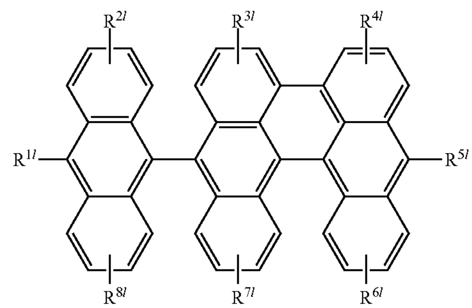
and derivatives thereof,
arylethylenes and arylacetylenes selected from the group consisting of:
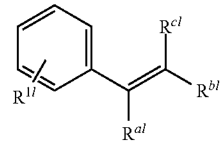
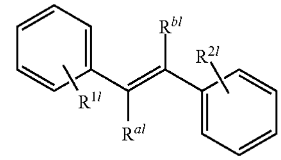
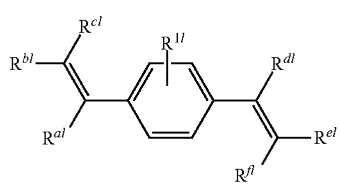
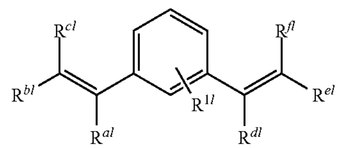
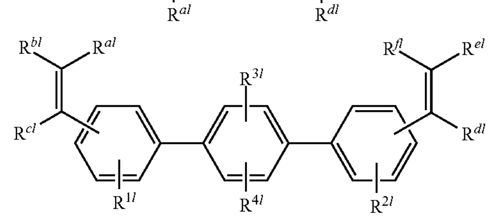

-continued
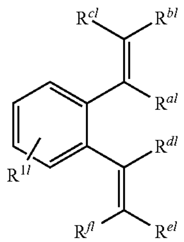
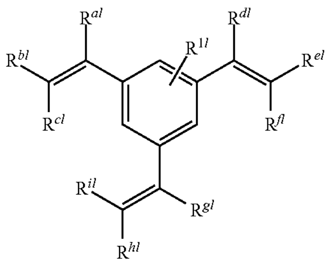
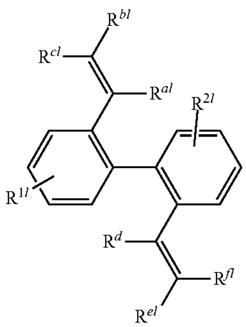
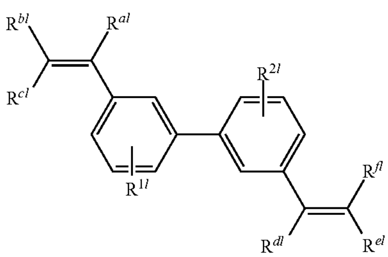
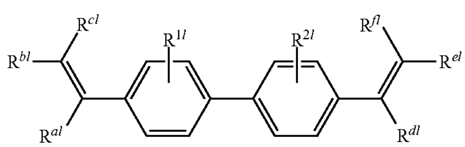
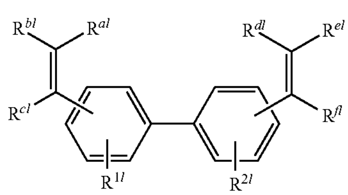
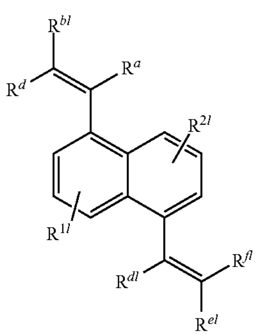
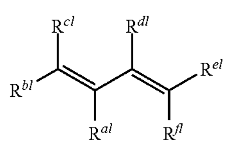
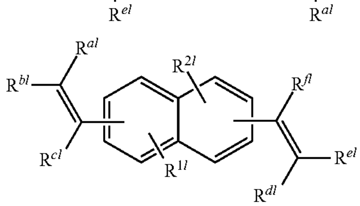
-continued
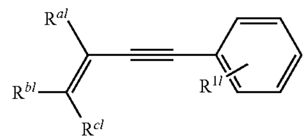
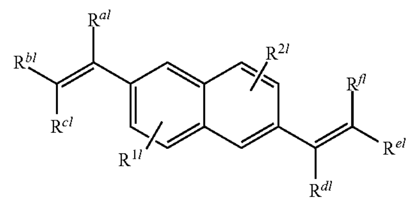
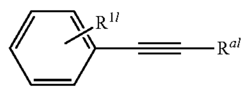
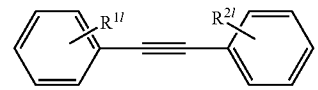
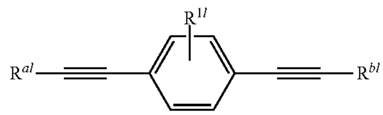
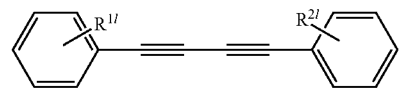
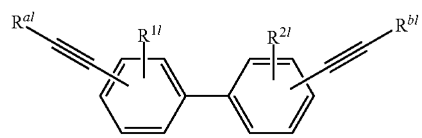
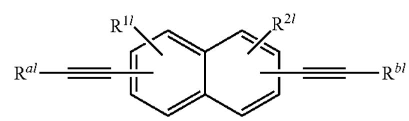
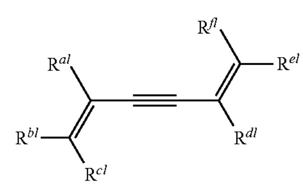
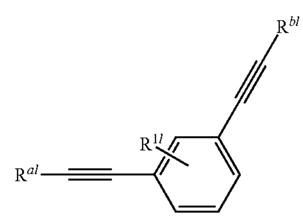
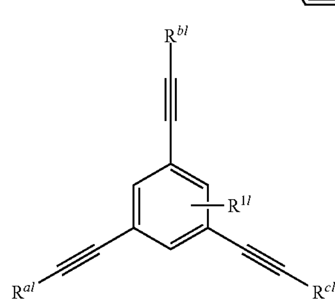
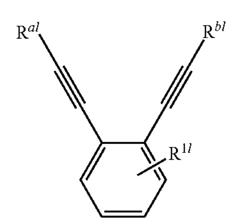
and derivatives thereof,
heterocyclic compounds selected from the group consisting of:

-continued
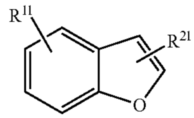
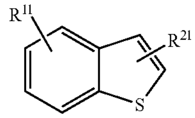
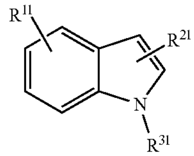
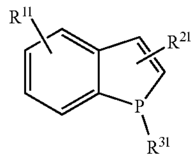
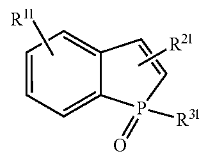
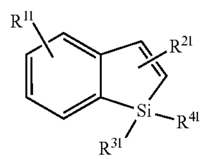
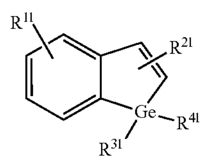
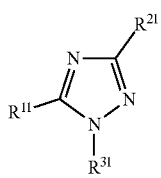
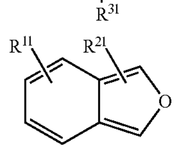
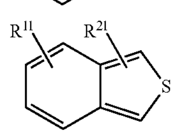
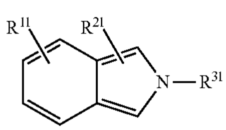
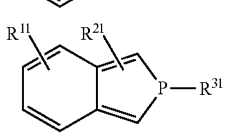
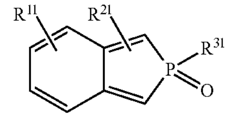
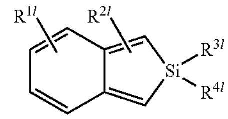
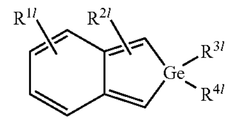
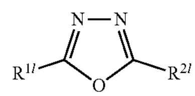
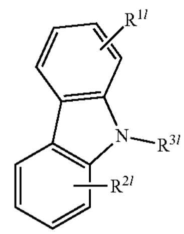
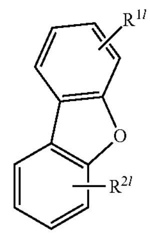
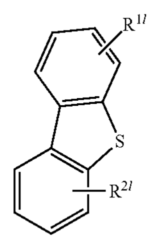
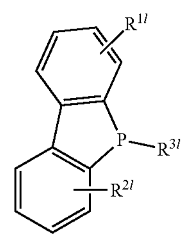
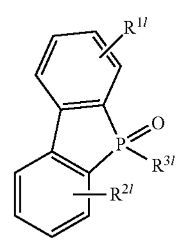

-continued
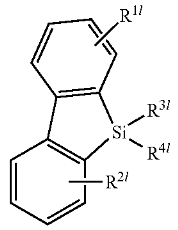
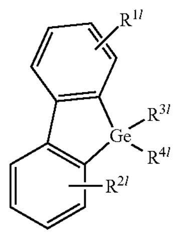
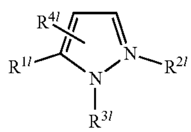
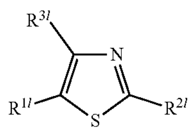
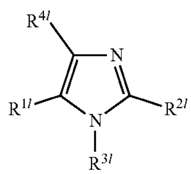
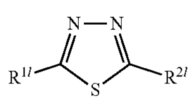
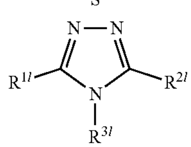
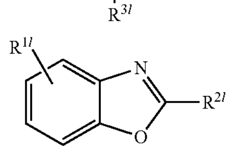
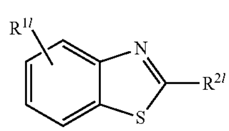
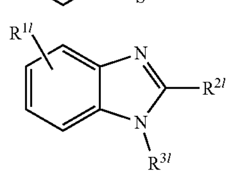
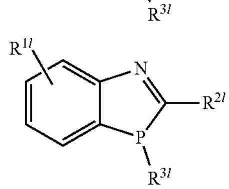
-continued
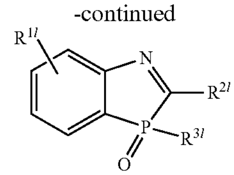
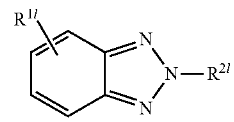
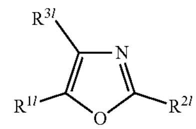
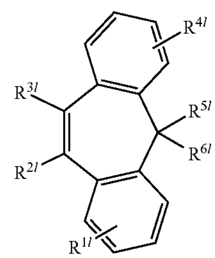
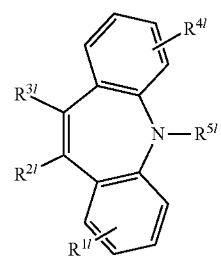
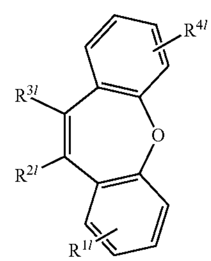
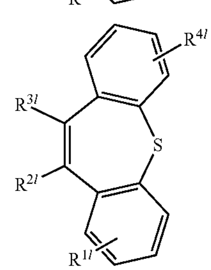
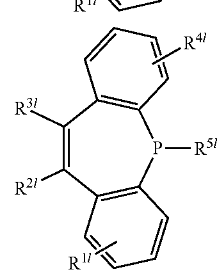

-continued
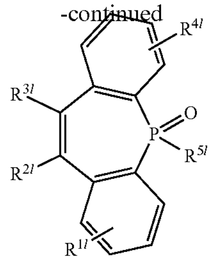
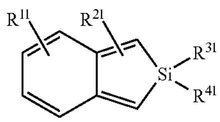
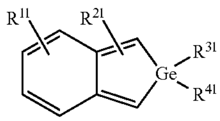
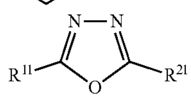
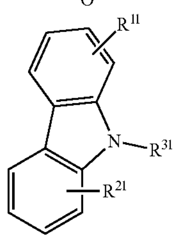
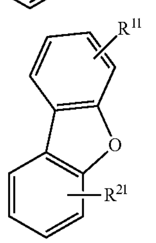
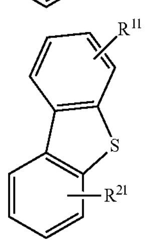
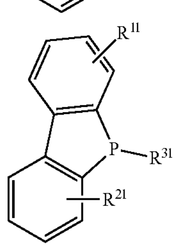
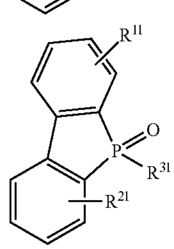
-continued
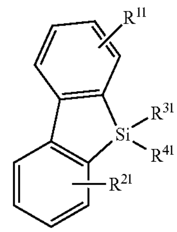
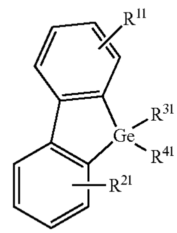
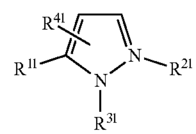
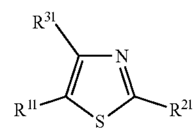
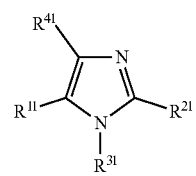
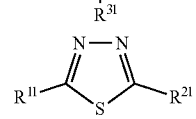
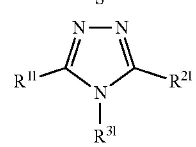
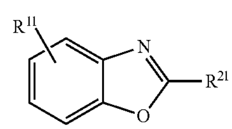
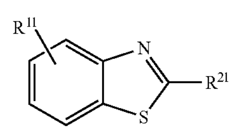
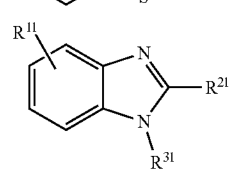
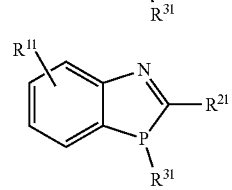

-continued
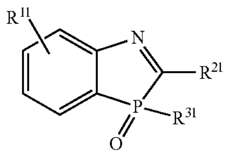
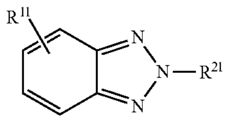
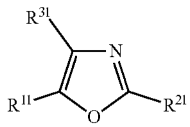
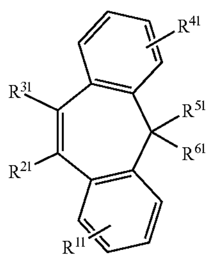
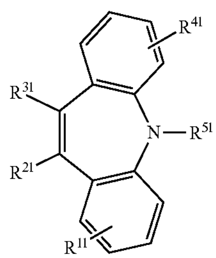
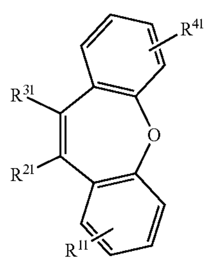
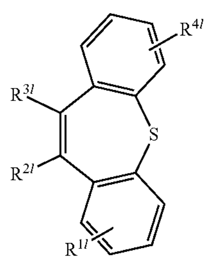
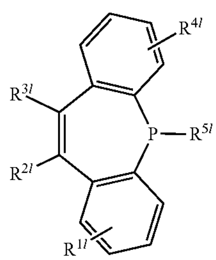
-continued
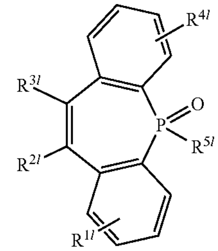
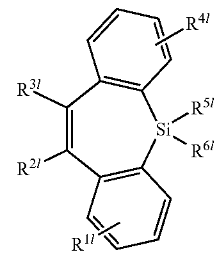
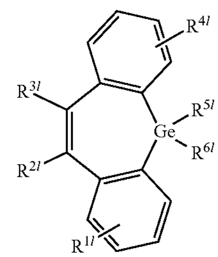
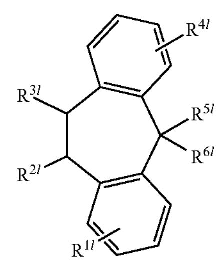
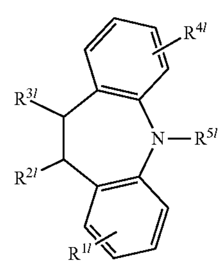
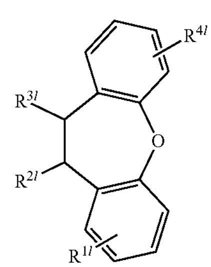

-continued
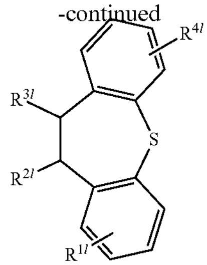
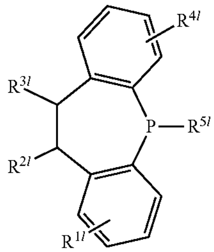
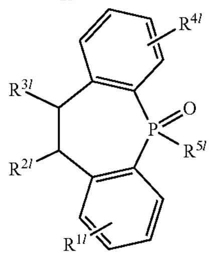
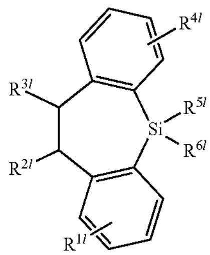
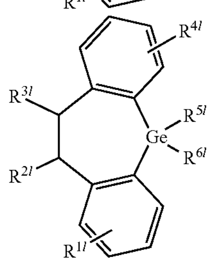
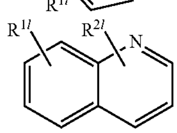
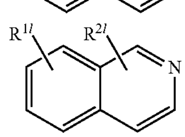
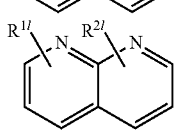
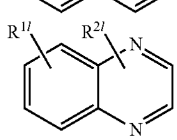
-continued
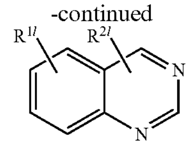
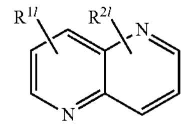
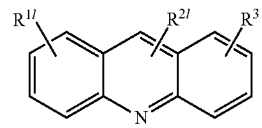
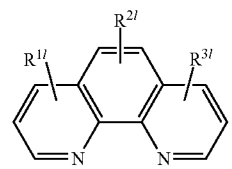
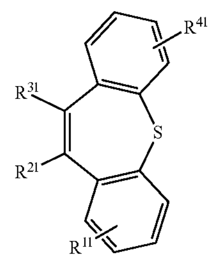
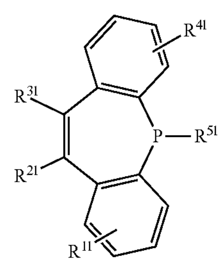
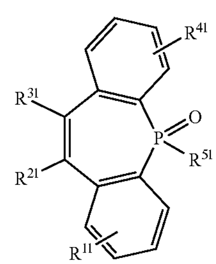
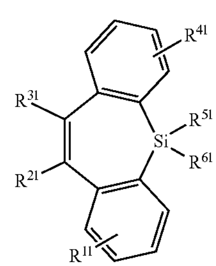

-continued
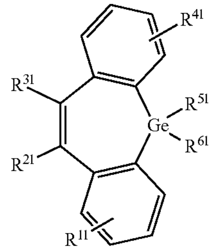
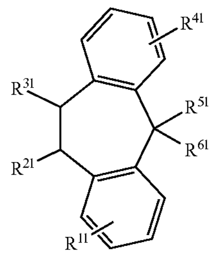
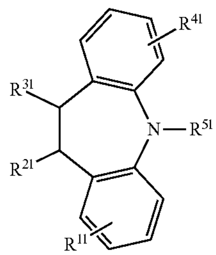
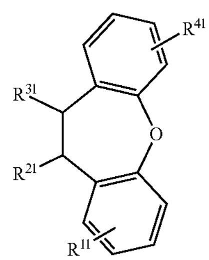
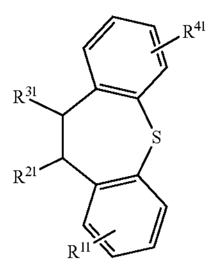
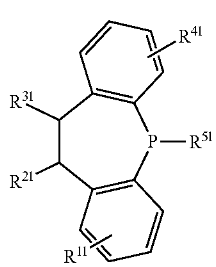
-continued
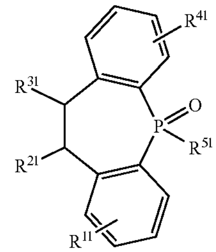
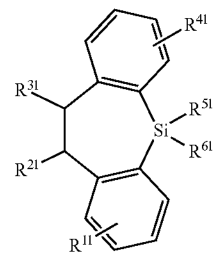
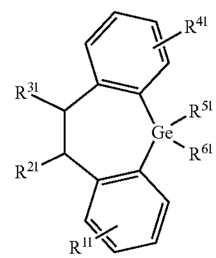
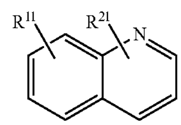
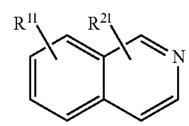
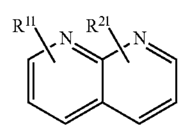
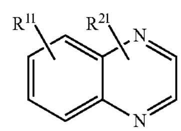
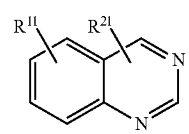
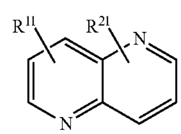
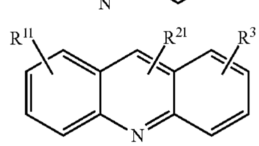

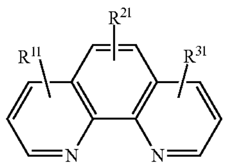
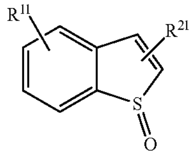
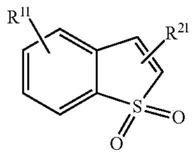
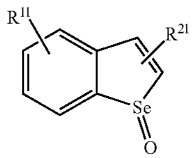
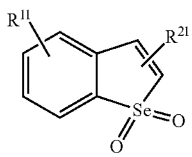
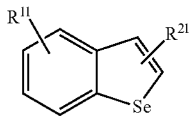
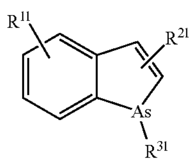
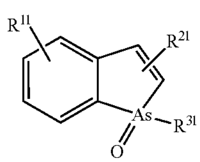
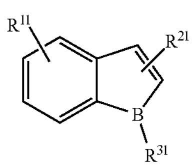
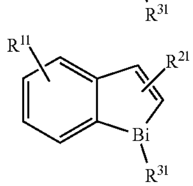
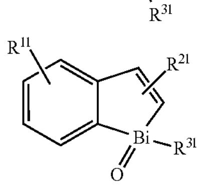
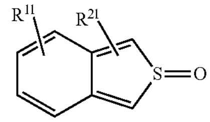
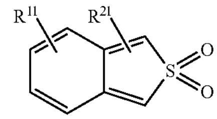
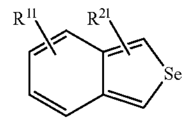
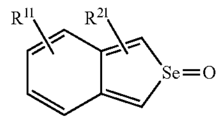
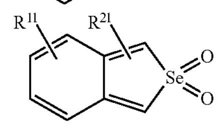
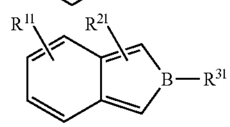
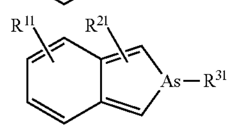
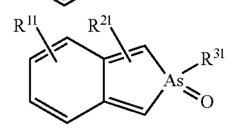
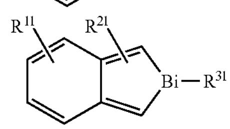
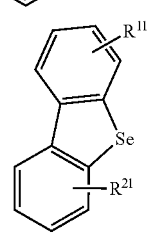
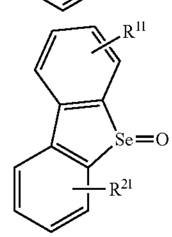
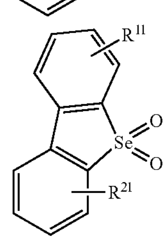

-continued
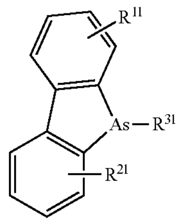
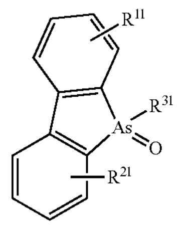
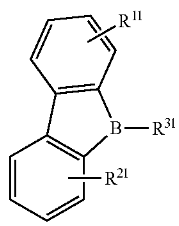
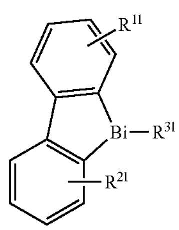
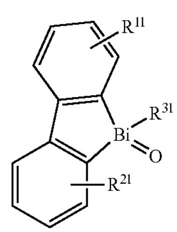
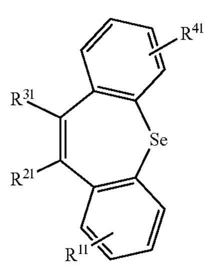
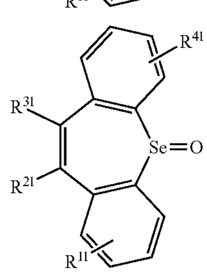
-continued
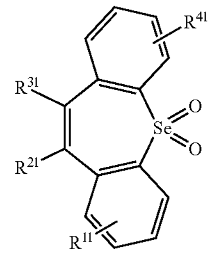
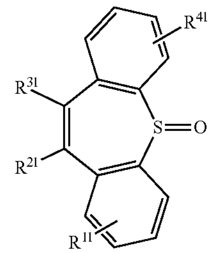
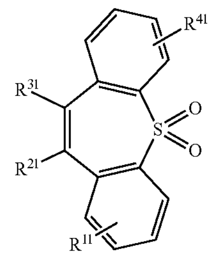
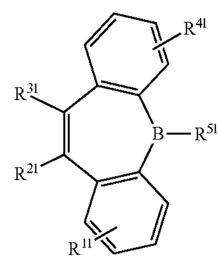
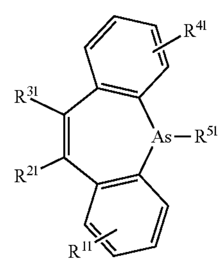
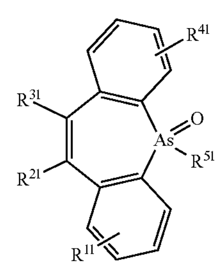

-continued
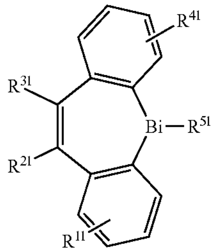
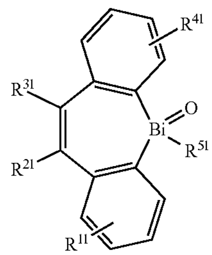
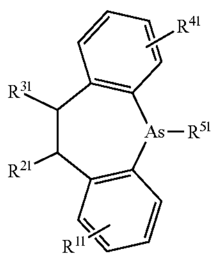
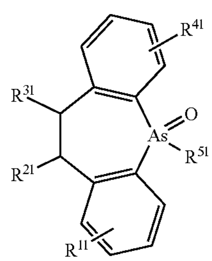
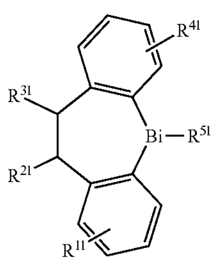
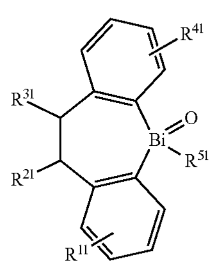
-continued
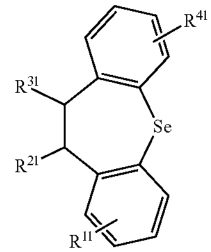
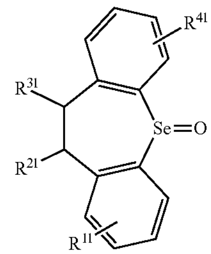
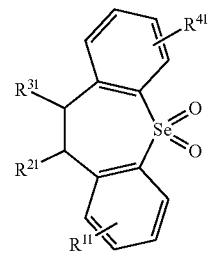
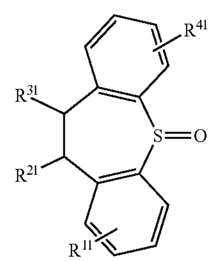
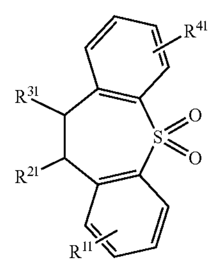
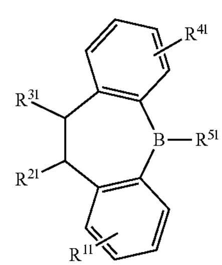

-continued
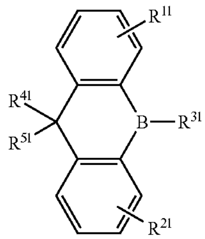
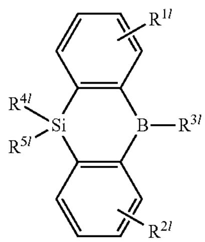
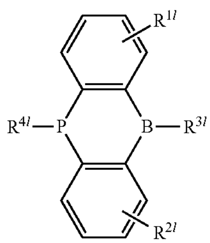
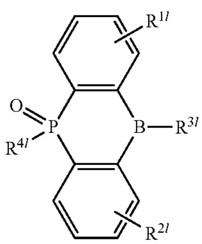
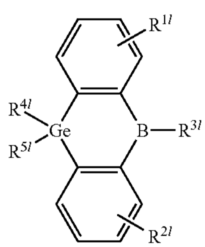
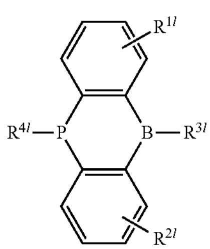
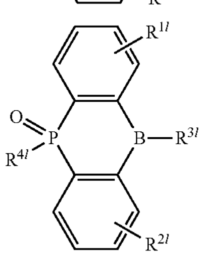
-continued
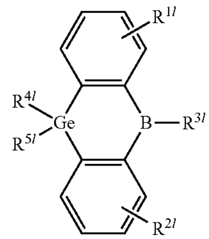
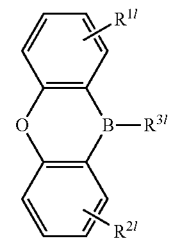
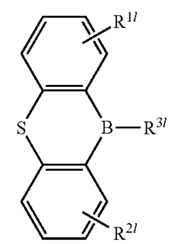
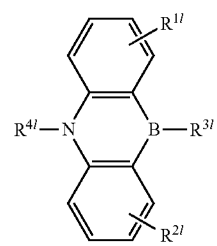
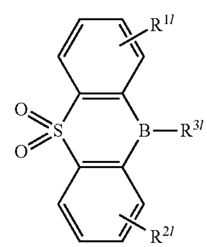
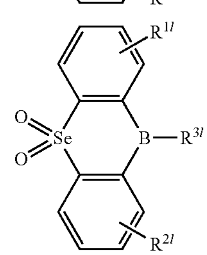
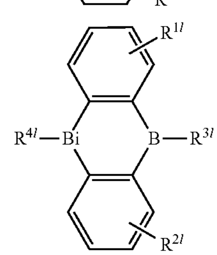

-continued
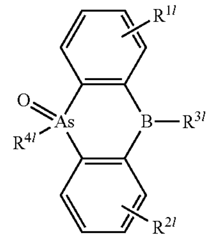
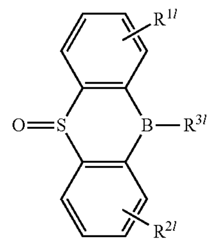
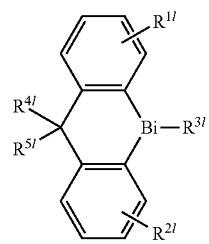
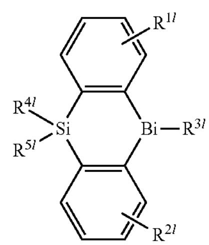
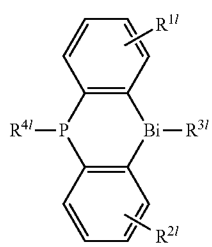
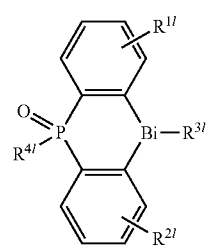
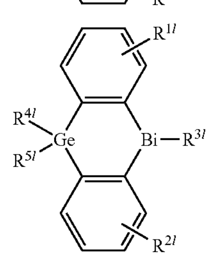
-continued
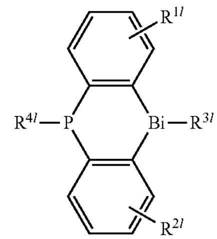
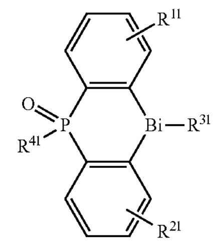
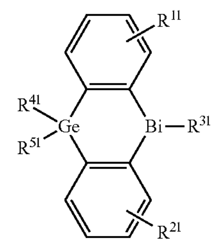
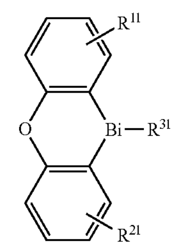
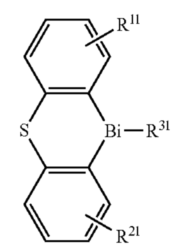
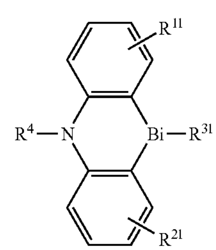
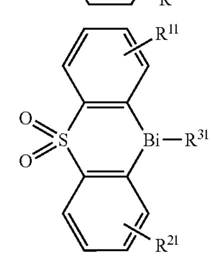

-continued
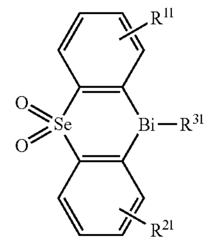
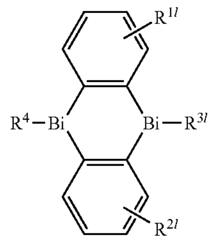
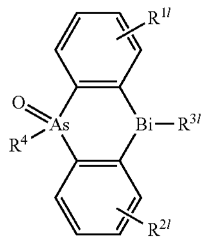
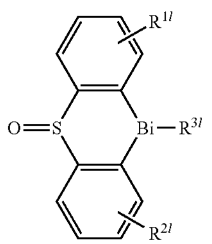
and derivatives thereof, and
other fluorescent luminophores selected from the group consisting of:
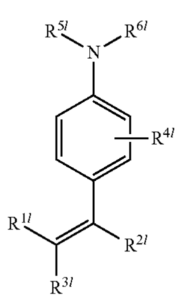
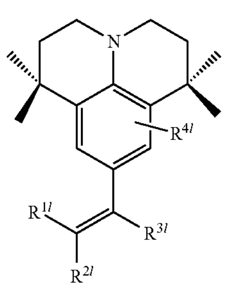
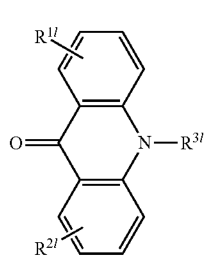
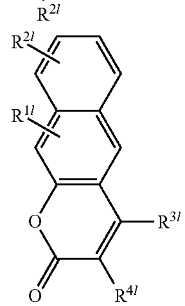
-continued
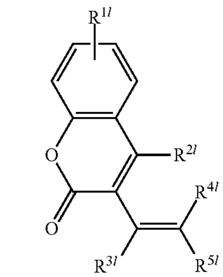
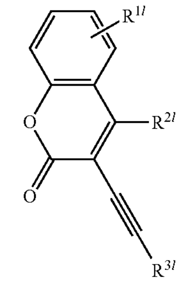
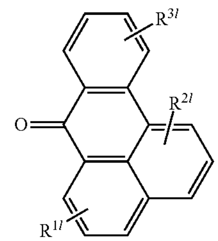
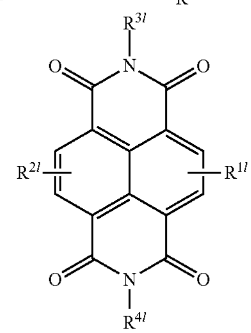
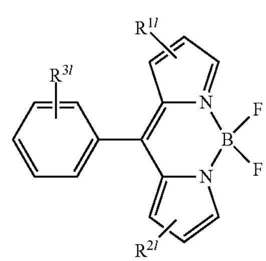
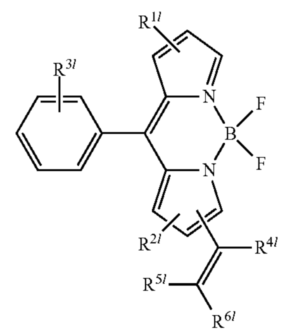
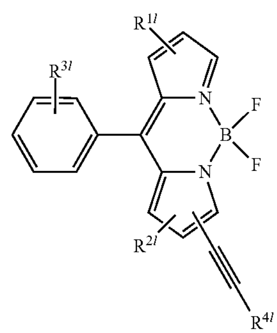
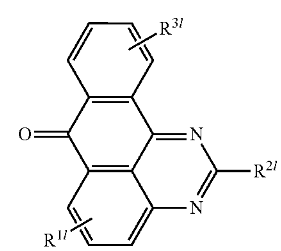
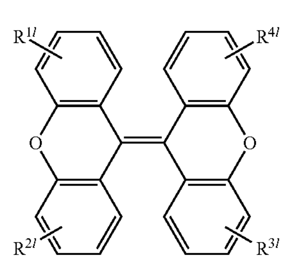
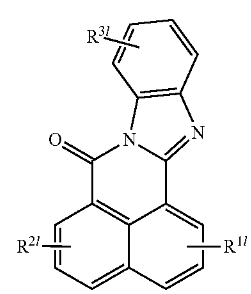
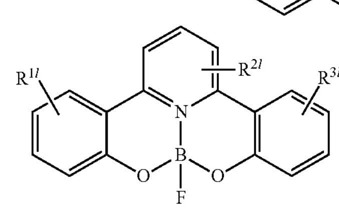

-continued
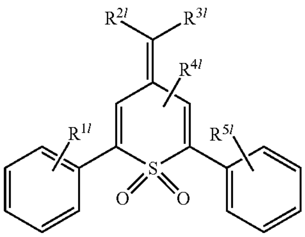
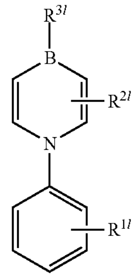
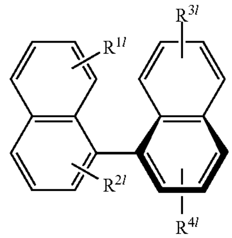
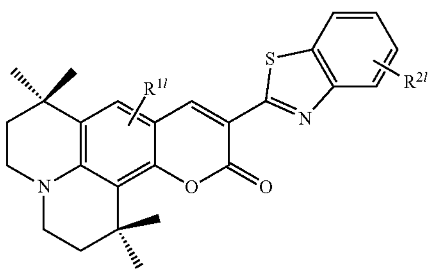
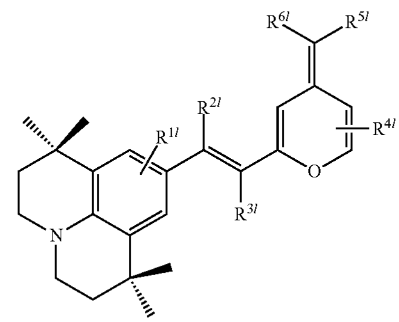
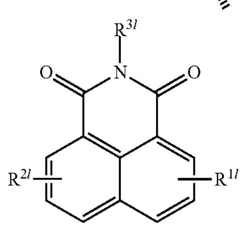
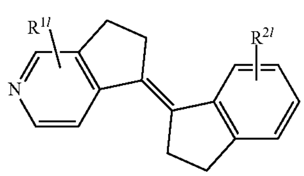
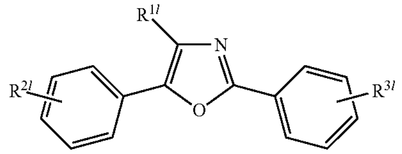
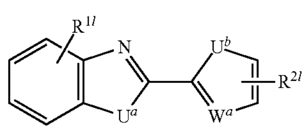
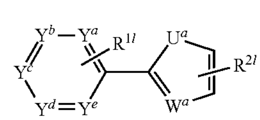
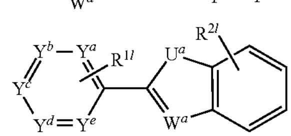
-continued
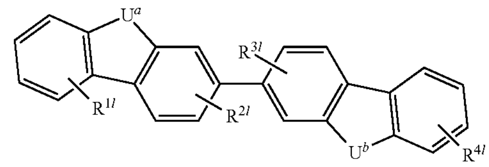
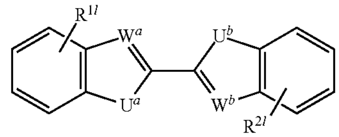
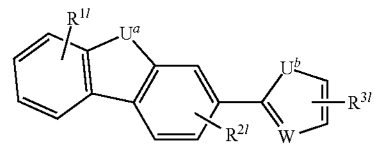
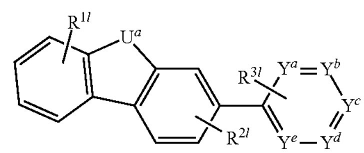
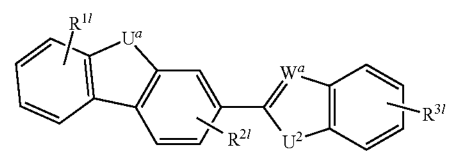
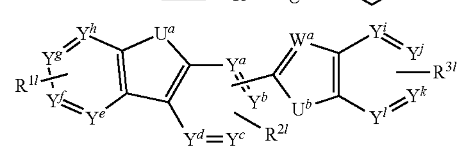
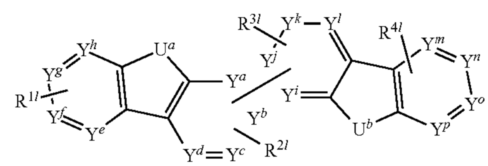
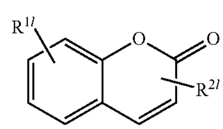
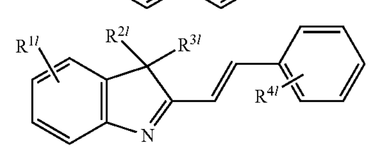
,
wherein:
wherein $R^{al}$, $R^{bl}$, $R^{cl}$, $R^{dl}$, $R^{cl}$, $R^{dl}$, $R^{el}$, $R^{fl}$, $R^{gl}$, $R^{hl}$ and $R^{jl}$ independently represents one of the following structures:
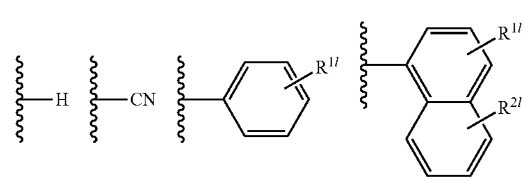

-continued

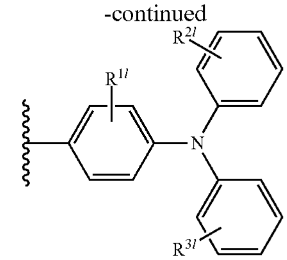
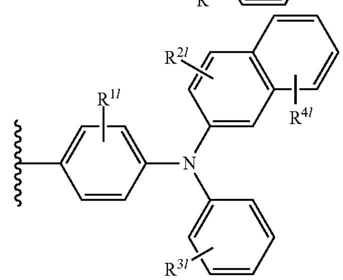
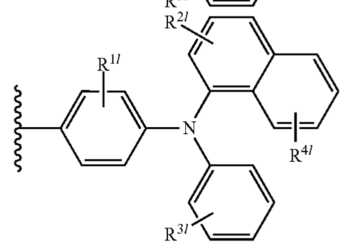
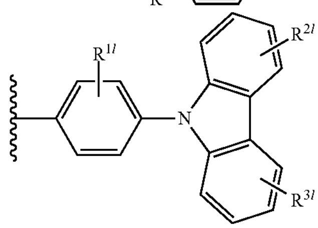
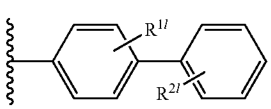
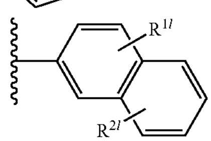
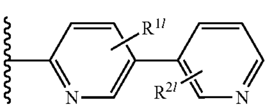
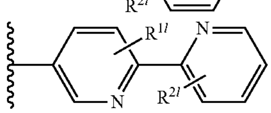
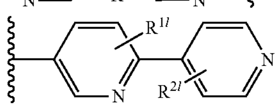
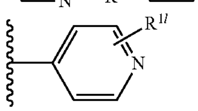
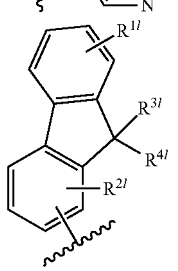
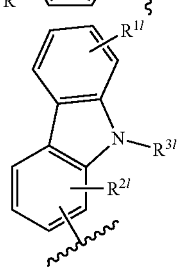
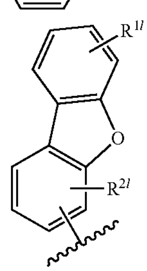

-continued

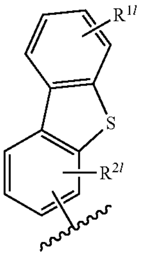
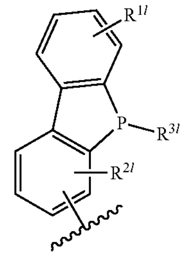
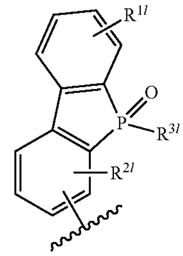
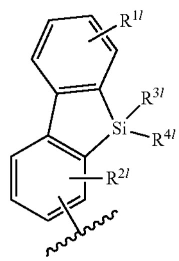
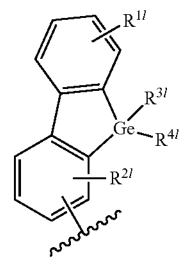
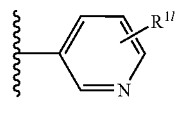
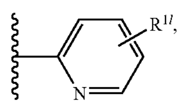

each of $R^{1l}$, $R^{2l}$, $R^{3l}$, $R^{4l}$, $R^{5l}$, $R^{6l}$, $R^{7l}$ and $R^{8l}$ is independently hydrogen, deuterium, halogen, hydroxyl, thiol, nitro, cyano, nitrile, isonitrile, sulfinyl, mercapto, sulfo, carboxyl, hydrazino; substituted or unsubstituted: aryl, cycloalkyl, cycloalkenyl, heterocyclyl, heteroaryl, alkyl, alkenyl, alkynyl, amino, monoalkylamino, dialkylamino, monoarylamino, diarylamino, alkoxy, aryloxy, haloalkyl, aralkyl, ester, alkoxycarbonyl, acylamino, alkoxycarbonylamino, aryloxycarbonylamino, sulfonylamino, sulfamoyl, carbamoyl, alkylthio, ureido, phosphoramide, silyl, polymeric, or any conjugate or combination thereof, each of $Y^a$, $Y^b$, $Y^c$, $Y^d$, $Y^e$, $Y^f$, $Y^g$, $Y^h$, $Y^i$, $Y^j$, $Y^k$, $Y^l$, $Y^m$, $Y^n$, $Y^o$ and $Y^p$ is independently C, N, or B, each of $U^a$, $U^b$ and $U^2$ is independently $CH_2$, $CR^1R^2$, C═O, $CH_2$, $SiR^1R^2$, $GeH_2$, $GeR^1R^2$, NH, $NR^3$, PH, $PR^3$, $R^3P$═O, $AsR^3$, $R^3As$═O, O, S, S═O, $SO_2$, Se, Se═O, $SeO_2$, BH, $BR^3$, $R^3Bi$═O, BiH, or $BiR^3$, and each of $W^a$, $W^b$, and W is independently CH, $CLR^1$, $SiR^1$, GeH, $GeR^1$, N, P, B, Bi, or Bi═O.

15. A device comprising the compound of claim 9, wherein the device is an organic light emitting diode or a full color display.

* * * * *